US008373230B1

(12) United States Patent
Or-Bach et al.

(10) Patent No.: US 8,373,230 B1
(45) Date of Patent: Feb. 12, 2013

(54) METHOD FOR FABRICATION OF A SEMICONDUCTOR DEVICE AND STRUCTURE

(75) Inventors: Zvi Or-Bach, San Jose, CA (US); Brian Cronquist, San Jose, CA (US); Isreal Beinglass, Sunnyvale, CA (US); Jan Lodewijk de Jong, Cupertino, CA (US); Deepak C. Sekar, San Jose, CA (US)

(73) Assignee: Monolithic 3D Inc., San Jose, CA (US)

( * ) Notice: Subject to any disclaimer, the term of this patent is extended or adjusted under 35 U.S.C. 154(b) by 318 days.

(21) Appl. No.: 12/904,114

(22) Filed: Oct. 13, 2010

(51) Int. Cl.
*H01L 27/12* (2006.01)

(52) U.S. Cl. .......... 257/347; 257/67; 257/352; 257/706; 257/720; 257/774

(58) Field of Classification Search .................. 257/368, 257/347, 352, 67, 706, 720, 774
See application file for complete search history.

(56) References Cited

U.S. PATENT DOCUMENTS

| | | | |
|---|---|---|---|
| 3,007,090 | A | 10/1961 | Rutz |
| 3,819,959 | A | 6/1974 | Chang et al. |
| 4,197,555 | A | 4/1980 | Uehara et al. |
| 4,400,715 | A | 8/1983 | Barbee et al. |
| 4,487,635 | A | 12/1984 | Kugimiya et al. |
| 4,522,657 | A | 6/1985 | Rohatgi et al. |
| 4,612,083 | A | 9/1986 | Yasumoto et al. |
| 4,643,950 | A | 2/1987 | Ogura et al. |
| 4,704,785 | A | 11/1987 | Curran |
| 4,711,858 | A | 12/1987 | Harder et al. |
| 4,721,885 | A | 1/1988 | Brodie |
| 4,732,312 | A | 3/1988 | Kennedy et al. |
| 4,733,288 | A | 3/1988 | Sato |
| 4,829,018 | A | 5/1989 | Wahlstrom |
| 4,854,986 | A | 8/1989 | Raby |
| 4,866,304 | A | 9/1989 | Yu |
| 4,939,568 | A | 7/1990 | Kato et al. |
| 4,956,307 | A | 9/1990 | Pollack et al. |
| 5,012,153 | A | 4/1991 | Atkinson et al. |
| 5,032,007 | A | 7/1991 | Silverstein et al. |
| 5,047,979 | A | 9/1991 | Leung |
| 5,087,585 | A | 2/1992 | Hayashi |
| 5,093,704 | A | 3/1992 | Saito et al. |
| 5,106,775 | A | 4/1992 | Kaga et al. |
| 5,152,857 | A | 10/1992 | Ito et al. |
| 5,162,879 | A | 11/1992 | Gill |
| 5,217,916 | A | 6/1993 | Anderson et al. |

(Continued)

FOREIGN PATENT DOCUMENTS

| | | | |
|---|---|---|---|
| EP | 1267594 | A2 | 12/2002 |
| EP | 1909311 | A2 | 4/2008 |

(Continued)

OTHER PUBLICATIONS

U.S. Appl. No. 12/901,890, filed Oct. 11, 2010, Or-Bach et al.

(Continued)

*Primary Examiner* — Long Tran
(74) *Attorney, Agent, or Firm* — Tran & Associates

(57) ABSTRACT

Systems and methods are disclosed for fabricating a semiconductor device, includes implanting one or more regions on a semiconductor wafer; performing a layer transfer onto a carrier; and transferring from said carrier to a target wafer.

28 Claims, 373 Drawing Sheets

U.S. PATENT DOCUMENTS

| | | | |
|---|---|---|---|
| 5,250,460 | A | 10/1993 | Yamagata et al. |
| 5,258,643 | A | 11/1993 | Cohen |
| 5,265,047 | A | 11/1993 | Leung et al. |
| 5,266,511 | A | 11/1993 | Takao |
| 5,277,748 | A | 1/1994 | Sakaguchi et al. |
| 5,286,670 | A | 2/1994 | Kang et al. |
| 5,294,556 | A | 3/1994 | Kawamura |
| 5,308,782 | A | 5/1994 | Mazure et al. |
| 5,312,771 | A | 5/1994 | Yonehara |
| 5,317,236 | A | 5/1994 | Zavracky et al. |
| 5,324,980 | A | 6/1994 | Kusunoki |
| 5,355,022 | A | 10/1994 | Sugahara et al. |
| 5,371,037 | A | 12/1994 | Yonehara |
| 5,374,564 | A | 12/1994 | Bruel |
| 5,374,581 | A | 12/1994 | Ichikawa et al. |
| 5,424,560 | A | 6/1995 | Norman et al. |
| 5,475,280 | A | 12/1995 | Jones et al. |
| 5,478,762 | A | 12/1995 | Chao |
| 5,485,031 | A | 1/1996 | Zhang et al. |
| 5,498,978 | A | 3/1996 | Takahashi et al. |
| 5,527,423 | A | 6/1996 | Neville et al. |
| 5,535,342 | A | 7/1996 | Taylor |
| 5,554,870 | A | 9/1996 | Fitch et al. |
| 5,563,084 | A | 10/1996 | Ramm et al. |
| 5,583,349 | A | 12/1996 | Norman et al. |
| 5,583,350 | A | 12/1996 | Norman et al. |
| 5,594,563 | A | 1/1997 | Larson |
| 5,604,137 | A | 2/1997 | Yamazaki et al. |
| 5,617,991 | A | 4/1997 | Pramanick et al. |
| 5,627,106 | A | 5/1997 | Hsu |
| 5,656,548 | A | 8/1997 | Zavracky et al. |
| 5,670,411 | A | 9/1997 | Yonehara et al. |
| 5,681,756 | A | 10/1997 | Norman et al. |
| 5,695,557 | A | 12/1997 | Yamagata et al. |
| 5,701,027 | A | 12/1997 | Gordon et al. |
| 5,707,745 | A | 1/1998 | Forrest et al. |
| 5,714,395 | A | 2/1998 | Bruel |
| 5,721,160 | A | 2/1998 | Forrest et al. |
| 5,737,748 | A | 4/1998 | Shigeeda |
| 5,739,552 | A | 4/1998 | Kimura et al. |
| 5,744,979 | A | 4/1998 | Goetting |
| 5,748,161 | A | 5/1998 | Lebby et al. |
| 5,757,026 | A | 5/1998 | Forrest et al. |
| 5,770,881 | A | 6/1998 | Pelella et al. |
| 5,781,031 | A | 7/1998 | Bertin et al. |
| 5,829,026 | A | 10/1998 | Leung et al. |
| 5,835,396 | A | 11/1998 | Zhang |
| 5,854,123 | A | 12/1998 | Sato et al. |
| 5,861,929 | A | 1/1999 | Spitzer |
| 5,877,070 | A | 3/1999 | Goesele et al. |
| 5,882,987 | A | 3/1999 | Srikrishnan |
| 5,883,525 | A | 3/1999 | Tavana et al. |
| 5,889,903 | A | 3/1999 | Rao |
| 5,893,721 | A | 4/1999 | Huang et al. |
| 5,915,167 | A | 6/1999 | Leedy |
| 5,937,312 | A | 8/1999 | Iyer et al. |
| 5,943,574 | A | 8/1999 | Tehrani et al. |
| 5,952,680 | A | 9/1999 | Strite |
| 5,952,681 | A | 9/1999 | Chen |
| 5,965,875 | A | 10/1999 | Merrill |
| 5,977,579 | A | 11/1999 | Noble |
| 5,977,961 | A | 11/1999 | Rindal |
| 5,980,633 | A | 11/1999 | Yamagata et al. |
| 5,985,742 | A | 11/1999 | Henley et al. |
| 5,998,808 | A | 12/1999 | Matsushita |
| 6,001,693 | A | 12/1999 | Yeouchung et al. |
| 6,009,496 | A | 12/1999 | Tsai |
| 6,020,252 | A | 2/2000 | Aspar et al. |
| 6,020,263 | A | 2/2000 | Shih et al. |
| 6,027,958 | A | 2/2000 | Vu et al. |
| 6,030,700 | A | 2/2000 | Forrest et al. |
| 6,052,498 | A | 4/2000 | Paniccia |
| 6,057,212 | A | 5/2000 | Chan et al. |
| 6,071,795 | A | 6/2000 | Cheung et al. |
| 6,103,597 | A | 8/2000 | Aspar et al. |
| 6,111,260 | A | 8/2000 | Dawson et al. |
| 6,125,217 | A | 9/2000 | Paniccia et al. |
| 6,153,495 | A | 11/2000 | Kub et al. |
| 6,191,007 | B1 | 2/2001 | Matsui et al. |
| 6,222,203 | B1 | 4/2001 | Ishibashi et al. |
| 6,229,161 | B1 | 5/2001 | Nemati et al. |
| 6,242,324 | B1 | 6/2001 | Kub et al. |
| 6,259,623 | B1 | 7/2001 | Takahashi |
| 6,264,805 | B1 | 7/2001 | Forrest et al. |
| 6,281,102 | B1 | 8/2001 | Cao et al. |
| 6,294,018 | B1 | 9/2001 | Hamm et al. |
| 6,306,705 | B1 | 10/2001 | Parekh et al. |
| 6,321,134 | B1 | 11/2001 | Henley et al. |
| 6,322,903 | B1 | 11/2001 | Siniaguine et al. |
| 6,331,468 | B1 | 12/2001 | Aronowitz et al. |
| 6,331,790 | B1 | 12/2001 | Or-Bach et al. |
| 6,353,492 | B2 | 3/2002 | McClelland et al. |
| 6,355,501 | B1 | 3/2002 | Fung et al. |
| 6,358,631 | B1 | 3/2002 | Forrest et al. |
| 6,365,270 | B2 | 4/2002 | Forrest et al. |
| 6,376,337 | B1 | 4/2002 | Wang et al. |
| 6,380,046 | B1 | 4/2002 | Yamazaki |
| 6,392,253 | B1 | 5/2002 | Saxena |
| 6,417,108 | B1 | 7/2002 | Akino et al. |
| 6,420,215 | B1 | 7/2002 | Knall et al. |
| 6,423,614 | B1 | 7/2002 | Doyle |
| 6,429,481 | B1 | 8/2002 | Mo et al. |
| 6,429,484 | B1 | 8/2002 | Yu |
| 6,430,734 | B1 | 8/2002 | Zahar |
| 6,475,869 | B1 | 11/2002 | Yu |
| 6,476,493 | B2 | 11/2002 | Or-Bach et al. |
| 6,479,821 | B1 | 11/2002 | Hawryluk et al. |
| 6,515,511 | B2 | 2/2003 | Sugibayashi et al. |
| 6,526,559 | B2 | 2/2003 | Schiefele et al. |
| 6,528,391 | B1 | 3/2003 | Henley et al. |
| 6,534,352 | B1 | 3/2003 | Kim |
| 6,534,382 | B1 | 3/2003 | Sakaguchi et al. |
| 6,544,837 | B1 | 4/2003 | Divakauni et al. |
| 6,545,314 | B2 | 4/2003 | Forbes et al. |
| 6,555,901 | B1 | 4/2003 | Yoshihara et al. |
| 6,563,139 | B2 | 5/2003 | Hen |
| 6,580,289 | B2 | 6/2003 | Cox |
| 6,600,173 | B2 | 7/2003 | Tiwari |
| 6,624,046 | B1 | 9/2003 | Zavracky et al. |
| 6,627,518 | B1 | 9/2003 | Inoue et al. |
| 6,630,713 | B2 | 10/2003 | Geusic |
| 6,635,552 | B1 | 10/2003 | Gonzalez |
| 6,635,588 | B1 | 10/2003 | Hawryluk et al. |
| 6,638,834 | B2 | 10/2003 | Gonzalez |
| 6,642,744 | B2 | 11/2003 | Or-Bach et al. |
| 6,653,209 | B1 | 11/2003 | Yamagata |
| 6,661,085 | B2 | 12/2003 | Kellar et al. |
| 6,677,204 | B2 | 1/2004 | Cleeves et al. |
| 6,686,253 | B2 | 2/2004 | Or-Bach |
| 6,703,328 | B2 | 3/2004 | Tanaka et al. |
| 6,756,633 | B2 | 6/2004 | Wang et al. |
| 6,756,811 | B2 | 6/2004 | Or-Bach |
| 6,759,282 | B2 | 7/2004 | Campbell et al. |
| 6,762,076 | B2 | 7/2004 | Kim et al. |
| 6,774,010 | B2 | 8/2004 | Chu et al. |
| 6,805,979 | B2 | 10/2004 | Ogura et al. |
| 6,806,171 | B1 | 10/2004 | Ulyashin et al. |
| 6,809,009 | B2 | 10/2004 | Aspar et al. |
| 6,815,781 | B2 | 11/2004 | Vyvoda et al. |
| 6,819,136 | B2 | 11/2004 | Or-Bach |
| 6,821,826 | B1 | 11/2004 | Chan et al. |
| 6,844,243 | B1 | 1/2005 | Gonzalez |
| 6,864,534 | B2 | 3/2005 | Ipposhi et al. |
| 6,875,671 | B2 | 4/2005 | Faris |
| 6,882,572 | B2 | 4/2005 | Wang et al. |
| 6,888,375 | B2 | 5/2005 | Feng et al. |
| 6,917,219 | B2 | 7/2005 | New |
| 6,930,511 | B2 | 8/2005 | Or-Bach |
| 6,943,067 | B2 | 9/2005 | Greenlaw |
| 6,943,407 | B2 | 9/2005 | Ouyang et al. |
| 6,953,956 | B2 | 10/2005 | Or-Bach et al. |
| 6,967,149 | B2 | 11/2005 | Meyer et al. |
| 6,985,012 | B2 | 1/2006 | Or-Bach |
| 6,989,687 | B2 | 1/2006 | Or-Bach |
| 6,995,430 | B2 | 2/2006 | Langdo et al. |
| 6,995,456 | B2 | 2/2006 | Nowak |
| 7,015,719 | B1 | 3/2006 | Feng et al. |

7,016,569 B2 3/2006 Mule et al.
7,018,875 B2 3/2006 Madurawe
7,019,557 B2 3/2006 Madurawe
7,043,106 B2 5/2006 West et al.
7,052,941 B2 5/2006 Lee
7,064,579 B2 6/2006 Madurawe
7,067,396 B2 6/2006 Aspar et al.
7,068,070 B2 6/2006 Or-Bach
7,068,072 B2 6/2006 New et al.
7,078,739 B1 7/2006 Nemati et al.
7,094,667 B1 8/2006 Bower
7,098,691 B2 8/2006 Or-Bach et al.
7,105,390 B2 9/2006 Brask et al.
7,105,871 B2 9/2006 Or-Bach et al.
7,109,092 B2 9/2006 Tong
7,110,629 B2 9/2006 Bjorkman et al.
7,111,149 B2 9/2006 Eilert
7,115,945 B2 10/2006 Lee et al.
7,115,966 B2 10/2006 Ido et al.
7,141,853 B2 11/2006 Campbell et al.
7,148,119 B1 12/2006 Sakaguchi et al.
7,157,787 B2 1/2007 Kim et al.
7,157,937 B2 1/2007 Apostol et al.
7,166,520 B1 1/2007 Henley
7,170,807 B2 1/2007 Fazan et al.
7,173,369 B2 2/2007 Forrest et al.
7,180,091 B2 2/2007 Yamazaki et al.
7,180,379 B1 2/2007 Hopper et al.
7,189,489 B2 3/2007 Kunimoto et al.
7,205,204 B2 4/2007 Ogawa et al.
7,209,384 B1 4/2007 Kim
7,217,636 B1 5/2007 Atanackovic
7,223,612 B2 5/2007 Sarma
7,242,012 B2 7/2007 Leedy
7,245,002 B2 7/2007 Akino et al.
7,256,104 B2 8/2007 Ito et al.
7,259,091 B2 8/2007 Schuehrer et al.
7,265,421 B2 9/2007 Madurawe
7,271,420 B2 9/2007 Cao
7,282,951 B2 10/2007 Huppenthal et al.
7,296,201 B2 11/2007 Abramovici
7,304,355 B2 12/2007 Zhang
7,312,109 B2 12/2007 Madurawe
7,312,487 B2 12/2007 Alam et al.
7,335,573 B2 2/2008 Takayama et al.
7,337,425 B2 2/2008 Kirk
7,338,884 B2 3/2008 Shimoto et al.
7,351,644 B2 4/2008 Henley
7,358,601 B1 4/2008 Plants et al.
7,369,435 B2 5/2008 Forbes
7,371,660 B2 5/2008 Henley et al.
7,378,702 B2 5/2008 Lee
7,393,722 B1 7/2008 Issaq et al.
7,419,844 B2 9/2008 Lee et al.
7,436,027 B2 10/2008 Ogawa et al.
7,439,773 B2 10/2008 Or-Bach et al.
7,446,563 B2 11/2008 Madurawe
7,459,752 B2 12/2008 Doris et al.
7,459,763 B1 12/2008 Issaq et al.
7,459,772 B2 12/2008 Speers
7,463,062 B2 12/2008 Or-Bach et al.
7,470,142 B2 12/2008 Lee
7,470,598 B2 12/2008 Lee
7,476,939 B2 1/2009 Okhonin et al.
7,477,540 B2 1/2009 Okhonin et al.
7,485,968 B2 2/2009 Enquist et al.
7,486,563 B2 2/2009 Waller et al.
7,488,980 B2 2/2009 Takafuji et al.
7,492,632 B2 2/2009 Carman
7,495,473 B2 2/2009 McCollum et al.
7,498,675 B2 3/2009 Farnworth et al.
7,499,352 B2 3/2009 Singh
7,499,358 B2 3/2009 Bauser
7,508,034 B2 3/2009 Takafuji et al.
7,514,748 B2 4/2009 Fazan et al.
7,541,616 B2 6/2009 Fazan et al.
7,547,589 B2 6/2009 Iriguchi
7,557,367 B2 7/2009 Rogers et al.
7,563,659 B2 7/2009 Kwon et al.
7,566,855 B2 7/2009 Olsen et al.
7,586,778 B2 9/2009 Ho et al.
7,589,375 B2 9/2009 Jang et al.
7,608,848 B2 10/2009 Ho et al.
7,622,367 B1 11/2009 Nuzzo et al.
7,632,738 B2 12/2009 Lee
7,633,162 B2 12/2009 Lee
7,666,723 B2 2/2010 Frank et al.
7,671,371 B2 3/2010 Lee
7,671,460 B2 3/2010 Lauxtermann et al.
7,674,687 B2 3/2010 Henley
7,687,372 B2 3/2010 Jain
7,688,619 B2 3/2010 Lung et al.
7,692,202 B2 4/2010 Bensch
7,692,448 B2 4/2010 Solomon
7,692,944 B2 4/2010 Bernstein et al.
7,697,316 B2 4/2010 Lai et al.
7,709,932 B2 5/2010 Nemoto et al.
7,718,508 B2 5/2010 Lee
7,723,207 B2 5/2010 Alam et al.
7,728,326 B2 6/2010 Yamazaki et al.
7,732,301 B1 6/2010 Pinnington et al.
7,749,884 B2 7/2010 Mathew et al.
7,759,043 B2 7/2010 Tanabe et al.
7,768,115 B2 8/2010 Lee et al.
7,776,715 B2 8/2010 Wells et al.
7,777,330 B2 8/2010 Pelley et al.
7,786,460 B2 8/2010 Lung et al.
7,786,535 B2 8/2010 Abou-Khalil et al.
7,790,524 B2 9/2010 Abadeer et al.
7,795,619 B2 9/2010 Hara
7,799,675 B2 9/2010 Lee
7,800,099 B2 9/2010 Yamazaki et al.
7,800,199 B2 9/2010 Oh et al.
7,846,814 B2 12/2010 Lee
7,867,822 B2 1/2011 Lee
7,888,764 B2 2/2011 Lee
8,014,195 B2 9/2011 Okhonin et al.
8,031,544 B2 10/2011 Kim et al.
8,044,464 B2 10/2011 Yamazaki et al.
8,129,256 B2 3/2012 Farooq et al.
8,158,515 B2 4/2012 Farooq et al.
8,203,187 B2 6/2012 Lung et al.
8,208,279 B2 6/2012 Lue
2001/0000005 A1 3/2001 Forrest et al.
2001/0014391 A1 8/2001 Forrest et al.
2002/0024140 A1 2/2002 Nakajima et al.
2002/0025604 A1 2/2002 Tiwari
2002/0081823 A1 6/2002 Cheung et al.
2002/0141233 A1 10/2002 Hosotani et al.
2002/0153243 A1 10/2002 Forrest et al.
2002/0190232 A1 12/2002 Chason
2002/0199110 A1 12/2002 Kean
2003/0015713 A1 1/2003 Yoo
2003/0059999 A1 3/2003 Gonzalez
2003/0060034 A1 3/2003 Beyne et al.
2003/0067043 A1 4/2003 Zhang
2003/0102079 A1 6/2003 Kalvesten et al.
2003/0113963 A1 6/2003 Wurzer
2003/0119279 A1 6/2003 Enquist
2003/0139011 A1 7/2003 Cleeves et al.
2003/0157748 A1 8/2003 Kim et al.
2003/0213967 A1 11/2003 Forrest et al.
2003/0224582 A1 12/2003 Shimoda et al.
2004/0014299 A1 1/2004 Moriceau et al.
2004/0033676 A1 2/2004 Coronel et al.
2004/0036126 A1 2/2004 Chau et al.
2004/0047539 A1 3/2004 Okubora et al.
2004/0061176 A1 4/2004 Takafuji et al.
2004/0113207 A1 6/2004 Hsu et al.
2004/0152272 A1 8/2004 Fladre et al.
2004/0155301 A1 8/2004 Zhang
2004/0156233 A1 8/2004 Bhattacharyya
2004/0166649 A1 8/2004 Bressot et al.
2004/0178819 A1 9/2004 New
2004/0259312 A1 12/2004 Schlosser et al.
2004/0262635 A1 12/2004 Lee
2004/0262772 A1 12/2004 Ramanathan et al.
2005/0003592 A1 1/2005 Jones

| | | | |
|---|---|---|---|
| 2005/0023656 | A1 | 2/2005 | Leedy |
| 2005/0067620 | A1 | 3/2005 | Chan et al. |
| 2005/0067625 | A1 | 3/2005 | Hata |
| 2005/0073060 | A1 | 4/2005 | Datta et al. |
| 2005/0098822 | A1 | 5/2005 | Mathew |
| 2005/0110041 | A1 | 5/2005 | Boutros et al. |
| 2005/0121676 | A1 | 6/2005 | Fried et al. |
| 2005/0130429 | A1 | 6/2005 | Rayssac et al. |
| 2005/0148137 | A1 | 7/2005 | Brask et al. |
| 2005/0225237 | A1 | 10/2005 | Winters |
| 2005/0280061 | A1 | 12/2005 | Lee |
| 2005/0280090 | A1 | 12/2005 | Anderson et al. |
| 2005/0280154 | A1 | 12/2005 | Lee |
| 2005/0280155 | A1 | 12/2005 | Lee |
| 2005/0280156 | A1 | 12/2005 | Lee |
| 2005/0282019 | A1 | 12/2005 | Fukushima et al. |
| 2006/0014331 | A1 | 1/2006 | Tang et al. |
| 2006/0024923 | A1 | 2/2006 | Sarma et al. |
| 2006/0033110 | A1 | 2/2006 | Alam et al. |
| 2006/0033124 | A1 | 2/2006 | Or-Bach et al. |
| 2006/0067122 | A1 | 3/2006 | Verhoeven |
| 2006/0071322 | A1 | 4/2006 | Kitamura |
| 2006/0071332 | A1 | 4/2006 | Speers |
| 2006/0083280 | A1 | 4/2006 | Tauzin et al. |
| 2006/0113522 | A1 | 6/2006 | Lee et al. |
| 2006/0121690 | A1 | 6/2006 | Pogge et al. |
| 2006/0179417 | A1 | 8/2006 | Madurawe |
| 2006/0181202 | A1 | 8/2006 | Liao et al. |
| 2006/0189095 | A1 | 8/2006 | Ghyselen et al. |
| 2006/0194401 | A1 | 8/2006 | Hu et al. |
| 2006/0195729 | A1 | 8/2006 | Huppenthal et al. |
| 2006/0207087 | A1 | 9/2006 | Jafri et al. |
| 2006/0249859 | A1 | 11/2006 | Eiles et al. |
| 2006/0275962 | A1 | 12/2006 | Lee |
| 2007/0014508 | A1 | 1/2007 | Chen et al. |
| 2007/0035329 | A1 | 2/2007 | Madurawe |
| 2007/0063259 | A1 | 3/2007 | Derderian et al. |
| 2007/0072391 | A1 | 3/2007 | Pocas et al. |
| 2007/0076509 | A1 | 4/2007 | Zhang |
| 2007/0077694 | A1 | 4/2007 | Lee |
| 2007/0077743 | A1 | 4/2007 | Rao et al. |
| 2007/0090416 | A1 | 4/2007 | Doyle et al. |
| 2007/0102737 | A1 | 5/2007 | Kashiwabara et al. |
| 2007/0108523 | A1 | 5/2007 | Ogawa et al. |
| 2007/0111386 | A1 | 5/2007 | Kim et al. |
| 2007/0111406 | A1 | 5/2007 | Joshi et al. |
| 2007/0132049 | A1 | 6/2007 | Stipe |
| 2007/0132369 | A1 | 6/2007 | Forrest et al. |
| 2007/0135013 | A1 | 6/2007 | Faris |
| 2007/0158659 | A1 | 7/2007 | Bensce |
| 2007/0187775 | A1 | 8/2007 | Okhonin et al. |
| 2007/0190746 | A1 | 8/2007 | Ito et al. |
| 2007/0194453 | A1 | 8/2007 | Chakraborty et al. |
| 2007/0210336 | A1 | 9/2007 | Madurawe |
| 2007/0218622 | A1* | 9/2007 | Lee et al. ...................... 438/231 |
| 2007/0228383 | A1 | 10/2007 | Bernstein et al. |
| 2007/0252203 | A1 | 11/2007 | Zhu et al. |
| 2007/0262457 | A1 | 11/2007 | Lin |
| 2007/0275520 | A1 | 11/2007 | Suzuki |
| 2007/0281439 | A1 | 12/2007 | Bedell et al. |
| 2007/0283298 | A1 | 12/2007 | Bernstein et al. |
| 2007/0287224 | A1 | 12/2007 | Alam et al. |
| 2008/0032463 | A1 | 2/2008 | Lee |
| 2008/0038902 | A1 | 2/2008 | Lee |
| 2008/0048327 | A1 | 2/2008 | Lee |
| 2008/0099780 | A1 | 5/2008 | Tran |
| 2008/0124845 | A1 | 5/2008 | Yu et al. |
| 2008/0128745 | A1 | 6/2008 | Mastro et al. |
| 2008/0136455 | A1 | 6/2008 | Diamant et al. |
| 2008/0160431 | A1 | 7/2008 | Scott et al. |
| 2008/0160726 | A1 | 7/2008 | Lim et al. |
| 2008/0179678 | A1 | 7/2008 | Dyer et al. |
| 2008/0191312 | A1 | 8/2008 | Oh et al. |
| 2008/0194068 | A1 | 8/2008 | Temmler et al. |
| 2008/0203452 | A1 | 8/2008 | Moon et al. |
| 2008/0213982 | A1 | 9/2008 | Park et al. |
| 2008/0220558 | A1 | 9/2008 | Zehavi et al. |
| 2008/0220565 | A1 | 9/2008 | Hsu et al. |
| 2008/0224260 | A1 | 9/2008 | Schmit et al. |
| 2008/0237591 | A1 | 10/2008 | Leedy |
| 2008/0251862 | A1 | 10/2008 | Fonash et al. |
| 2008/0254561 | A2 | 10/2008 | Yoo |
| 2008/0254572 | A1 | 10/2008 | Leedy |
| 2008/0261378 | A1 | 10/2008 | Yao et al. |
| 2008/0272492 | A1 | 11/2008 | Tsang |
| 2008/0277778 | A1 | 11/2008 | Furman et al. |
| 2008/0283875 | A1 | 11/2008 | Mukasa et al. |
| 2008/0284611 | A1 | 11/2008 | Leedy |
| 2008/0296681 | A1 | 12/2008 | Georgakos et al. |
| 2008/0315351 | A1 | 12/2008 | Kakehata |
| 2009/0001469 | A1 | 1/2009 | Yoshida et al. |
| 2009/0001504 | A1 | 1/2009 | Takei et al. |
| 2009/0016716 | A1 | 1/2009 | Ishida |
| 2009/0032899 | A1 | 2/2009 | Irie |
| 2009/0039918 | A1 | 2/2009 | Madurawe |
| 2009/0052827 | A1 | 2/2009 | Durfee et al. |
| 2009/0055789 | A1 | 2/2009 | McIlrath |
| 2009/0061572 | A1 | 3/2009 | Hareland et al. |
| 2009/0064058 | A1 | 3/2009 | McIlrath |
| 2009/0066365 | A1 | 3/2009 | Solomon |
| 2009/0066366 | A1 | 3/2009 | Solomon |
| 2009/0070727 | A1 | 3/2009 | Solomon |
| 2009/0079000 | A1 | 3/2009 | Yamazaki et al. |
| 2009/0081848 | A1 | 3/2009 | Erokhin |
| 2009/0087759 | A1 | 4/2009 | Matsumoto et al. |
| 2009/0096009 | A1 | 4/2009 | Dong et al. |
| 2009/0096024 | A1 | 4/2009 | Shingu et al. |
| 2009/0115042 | A1 | 5/2009 | Koyanagi |
| 2009/0128189 | A1 | 5/2009 | Madurawe et al. |
| 2009/0134397 | A1 | 5/2009 | Yokoi et al. |
| 2009/0144669 | A1 | 6/2009 | Bose et al. |
| 2009/0144678 | A1 | 6/2009 | Bose et al. |
| 2009/0146172 | A1 | 6/2009 | Pumyea |
| 2009/0159870 | A1 | 6/2009 | Lin et al. |
| 2009/0160482 | A1 | 6/2009 | Karp et al. |
| 2009/0161401 | A1 | 6/2009 | Bigler et al. |
| 2009/0179268 | A1 | 7/2009 | Abou-Khalil et al. |
| 2009/0194152 | A1 | 8/2009 | Liu et al. |
| 2009/0194768 | A1 | 8/2009 | Leedy |
| 2009/0204933 | A1 | 8/2009 | Rezgui |
| 2009/0212317 | A1 | 8/2009 | Kolodin et al. |
| 2009/0218627 | A1 | 9/2009 | Zhu |
| 2009/0221110 | A1 | 9/2009 | Lee et al. |
| 2009/0224364 | A1 | 9/2009 | Oh et al. |
| 2009/0234331 | A1 | 9/2009 | Langereis et al. |
| 2009/0242893 | A1 | 10/2009 | Tomiyasu |
| 2009/0250686 | A1 | 10/2009 | Sato et al. |
| 2009/0262583 | A1 | 10/2009 | Lue |
| 2009/0263942 | A1 | 10/2009 | Ohnuma et al. |
| 2009/0267233 | A1 | 10/2009 | Lee |
| 2009/0272989 | A1 | 11/2009 | Shum et al. |
| 2009/0290434 | A1 | 11/2009 | Kurjanowicz |
| 2009/0302394 | A1 | 12/2009 | Fujita |
| 2009/0309152 | A1 | 12/2009 | Knoefler et al. |
| 2009/0321830 | A1 | 12/2009 | Maly |
| 2009/0321948 | A1 | 12/2009 | Wang et al. |
| 2009/0325343 | A1 | 12/2009 | Lee |
| 2010/0001282 | A1 | 1/2010 | Mieno |
| 2010/0025766 | A1 | 2/2010 | Nuttinck et al. |
| 2010/0031217 | A1 | 2/2010 | Sinha et al. |
| 2010/0038743 | A1 | 2/2010 | Lee |
| 2010/0052134 | A1 | 3/2010 | Werner et al. |
| 2010/0058580 | A1 | 3/2010 | Yazdani |
| 2010/0081232 | A1 | 4/2010 | Furman et al. |
| 2010/0112753 | A1 | 5/2010 | Lee |
| 2010/0112810 | A1 | 5/2010 | Lee et al. |
| 2010/0123202 | A1 | 5/2010 | Hofmann |
| 2010/0133695 | A1 | 6/2010 | Lee |
| 2010/0133704 | A1 | 6/2010 | Marimuthu et al. |
| 2010/0190334 | A1 | 7/2010 | Lee |
| 2010/0193884 | A1 | 8/2010 | Park et al. |
| 2010/0193964 | A1 | 8/2010 | Farooq et al. |
| 2010/0276662 | A1 | 11/2010 | Colinge |
| 2010/0307572 | A1 | 12/2010 | Bedell et al. |
| 2010/0308211 | A1 | 12/2010 | Cho et al. |
| 2011/0001172 | A1 | 1/2011 | Lee |
| 2011/0003438 | A1 | 1/2011 | Lee |
| 2011/0024724 | A1 | 2/2011 | Frolov et al. |

2011/0026263 A1 2/2011 Xu
2011/0037052 A1 2/2011 Schmidt et al.
2011/0042696 A1 2/2011 Smith et al.
2011/0050125 A1 3/2011 Medendorp et al.
2011/0053332 A1 3/2011 Lee
2011/0101537 A1 5/2011 Barth et al.
2011/0143506 A1 6/2011 Lee
2011/0147791 A1 6/2011 Norman et al.
2011/0221022 A1 9/2011 Toda
2011/0241082 A1 10/2011 Bernstein et al.
2011/0284992 A1 11/2011 Zhu
2011/0286283 A1 11/2011 Lung et al.
2012/0001184 A1 1/2012 Ha et al.
2012/0003815 A1 1/2012 Lee
2012/0074466 A1 3/2012 Setiadi et al.
2012/0181654 A1 7/2012 Lue
2012/0182801 A1 7/2012 Lue

FOREIGN PATENT DOCUMENTS

WO PCT/US2008/063483 5/2008

OTHER PUBLICATIONS

U.S. Appl. No. 12/897,538, filed Oct. 4, 2010, Widjaja, et al.
U.S. Appl. No. 12/900,379, filed Apr. 21, 2011, Or-Bach, et al.
U.S. Appl. No. 12/904,119, filed Oct. 13, 2010, Or-Bach, et al.
U.S. Appl. No. 12/577,532, filed Oct. 12, 2009, Or-Bach et al.
U.S. Appl. No. 12/423,214, filed Apr. 14, 2009, Or-Bach.
U.S. Appl. No. 12/706,520, filed Feb. 16, 2010, Or Bach et al.
U.S. Appl. No. 12/792,673, filed Jun. 2, 2010, Or-Bach et al.
U.S. Appl. No. 12/797,493, filed Jun. 9, 2010, Or-Bach.
U.S. Appl. No. 12/847,911, filed Jun. 30, 2010, Or-Bach et al.
U.S. Appl. No. 12/849,272, filed Aug. 3, 2010, Or-Bach et al.
U.S. Appl. No. 12/859,665, filed Aug. 19, 2010, Or-Bach et al.
U.S. Appl. No. 12/901,902, filed Oct. 11, 2010, Or-Bach et al.
U.S. Appl. No. 12/949,617, filed Nov. 18, 2010, Or-Bach et al.
U.S. Appl. No. 12/970,602, filed Dec. 16, 2010, Or-Bach et al.
U.S. Appl. No. 13/016,313, filed Jan. 28, 2011, Or-Bach et al.
U.S. Appl. No. 13/073,188, filed Mar. 28, 2011, Or-Bach et al.
U.S. Appl. No. 13/073,268, filed Mar. 28, 2011, Or-Bach et al.
U.S. Appl. No. 13/083,802, filed Apr. 11, 2011, Or-Bach et al.
U.S. Appl. No. 12/894,235, filed Sep. 30, 2010, Cronquist et al.
U.S. Appl. No. 12/904,114, filed Oct. 13, 2010, Or-Bach et al.
U.S. Appl. No. 12/963,659, filed Dec. 9, 2010, Or-Bach et al.
U.S. Appl. No. 13/041,404, filed Mar. 6, 2011, Or-Bach et al.
U.S. Appl. No. 12/951,913, filed Nov. 22, 2010, Or-Bach et al.
U.S. Appl. No. 13/099,010, filed May 2, 2011, Or-Bach et al.
U.S. Appl. No. 12/903,862, filed Oct. 13, 2010, Or-Bach et al.
U.S. Appl. No. 12/903,847, filed Oct. 13, 2010, Or-Bach et al.
U.S. Appl. No. 12/904,103, filed Oct. 13, 2010, Or-Bach et al.
U.S. Appl. No. 12/894,252, filed Sep. 30, 2010, Or-Bach et al.
U.S. Appl. No. 12/904,108, filed Oct. 13, 2010, Or-Bach et al.
U.S. Appl. No. 12/941,073, filed Nov. 7, 2010, Or-Bach.
U.S. Appl. No. 12/941,074, filed Nov. 7, 2010, Or-Bach et al.
U.S. Appl. No. 12/941,075, filed Nov. 7, 2010, Or-Bach.
U.S. Appl. No. 12/951,924, filed Nov. 22, 2010, Or-Bach et al.
U.S. Appl. No. 13/041,406, filed Mar. 6, 2011, Or-Bach et al.
U.S. Appl. No. 13/098,997, filed May 2, 2011, Or-Bach et al.
U.S. Appl. No. 12/904,124, filed Oct. 13, 2010, Or-Bach et al.
U.S. Appl. No. 13/041,405, filed Mar. 6, 2011, Or-Bach et al.
Colinge, J. P., et al, "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11- 12, Jun. 10-12, 2003.
Kim, J.Y., et al., "The excellent scalability of the RCAT (recess-channel-arraytransistor) technology for sub-70nm DRAM feature size and beyond," 2005 IEEE VLSI-TSA International Symposium, pp. 33- 34, Apr. 25-27, 2005.
Abramovici, Breuer and Friedman, Digital Systems Testing and Testable Design, Computer Science Press, 1990, pp. 432-447.
Topol, A.W., et al., "Enabling SOI-Based Assembly Technology for Three-Dimensional (3D) Integrated Circuits (ICs)," IEDM Tech. Digest, Dec. 5, 2005, pp. 363-366.
DeMeester, P. et al., "Epitaxial lift-off and its applications," Semicond. Sci. Technol., 1993, pp. 1124-1135, vol. 8.
Moon, J., et al., "GaAs Photovoltaics and optoelectronics using releasable multilayer epitaxial assemblies", Nature, vol. 465, May 20, 2010, pp. 329-334.
Yonehara, T., et al., "Eltran: SOI-Epi Wafer by Epitaxial Layer transfer from porous Silicon", the 198th Electrochemical Society Meeting, abstract No. 438 (2000).
Yonehara, T. et al., "Eltran®, Novel S01 Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International , vol., No., pp. 297-300, Dec. 7-9, 2009.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.
Burr, G. W., et al., "Overview of candidate device technologies for storage-class memory," IBM Journal of Research and Development , vol. 52, No. 4.5, pp. 449-464, Jul. 2008.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Bez, R., et al., "Introduction to Flash memory," Proceedings IEEE, 91(4), 489-502 (2003).
Kim, W., et al., "Multi-layered Vertical Gate NAND Flash overcoming stacking limit for terabit density storage", Symposium on VLSI Technology Digest of Technical Papers, 2009, pp. 188-189.
Auth, C., et al., "45nm High-k + Metal Gate Strain-Enhanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et al., "NiSi Salicide Technology for Scaled CMOS," Microelectronic Engineering, 60 (2002), pp. 157-169.
Froment, B., et al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, ctr_024377.
Davis, J.A., et al., "Interconnect Limits on Gigascale Integration(GSI) in the 21st Century", Proc. IEEE, vol. 89, No. 3, pp. 305-324, Mar. 2001.
DiCioccio, L., et al., "Direct bonding for wafer level 3D integration", ICICDT 2010, pp. 110-113.
Shino, T., et al., "Floating Body RAM Technology and its Scalability to 32nm Node and Beyond," Electron Devices Meeting, 2006, IEDM '06, International , vol., No., pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RRAM", Electron Devices Meeting, 2007. IEDM 2007. IEEE International, pp. 925-928, Dec. 10-12, 2007.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K. et al., "Frontiers of silicon-on-insulator," J. App. Phys., May 1, 2003, pp. 4955-4978, vol. 93, No. 9.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "functionless multigate field-effect transistor," Applied Physics Letters, vol. 94, pp. 053511-1 to -2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.V., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for Mems fabrication", Proc. SPIE, vol. 6589, 65890T (2007).
Rajendran, B., et al., "Electrical Integrity of MOS Devices in Laser Annealed 3D IC Structures", proceedings VMIC 2004.
Rajendran, B., "Sequential 3D IC Fabrication: Challenges and Prospects", Proceedings of VMIC 2006.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers. 2004 Symposium on , vol., No., pp. 228-229, Jun. 15-17, 2004.
Vengurlekar, A., et al., "Mechanism of Dopant Activation Enhancement in Shallow Junctions by Hydrogen", Proceedings of the Materials Research Society, vol. 864, Spring 2005, E9.28.1-6.
Hui, K. N., et al., "Design of vertically-stacked polychromatic light-emitting diodes," Optics Express, Jun. 8, 2009, pp. 9873-9878, vol. 17, No. 12.
Yamada, M. et al., "Phosphor Free High-Luminous-Efficiency White Light-Emitting Diodes Composed of InGaN Multi-Quantum Well," Japanese Journal of Applied Physics, 2002, pp. 1246-L248, vol. 41.
Guo, X. et al, "Cascade single-chip phosphor-free white light emitting diodes," Applied Physics Letters, 2008, pp. 013507-1-013507-3, vol. 92.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Flamand, G. et al., "Towards Highly Efficient 4-Terminal Mechanical Photovoltaic Stacks," III-Vs Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Wierer, J.J. et al., "High-power AlGaInN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on 501 Substrate," IEEE Electron Device Letters, vol. 25, No. 9, Sep. 2004, pp. 661-663.
Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D. et al., "Design and CAD for 3D Integrated Circuits," 45th ACM/IEEE Design, Automation Conference (DAC), Jun. 8-13, 2008, pp. 668-673.
Brebner, G., "Tooling up for Reconfigurable System Design," IEE Colloquium on Reconfigurable Systems, 1999, Ref. No. 1999/061, pp. 2/1-2/4.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," pp. 407-410.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kada, M., "Updated results of R&D on functionally innovative 3D-integrated circuit (dream chip) technology in FY2009", (2010) International Microsystems Packaging Assembly and Circuits Technology Conference, Impact 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Sellathamby, C.V., et al., "Non-contact wafer probe using wireless probe cards", (2005) Proceedings—International Test Conference, 2005, pp. 447-452.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "*CELONCEL: Effective Design Technique for 3-D Monolithic Integration targeting High Performance Integrated Circuits*", Asia *pacific DAC 2011*, paper 4A-4.
Choudhury, D., "3D Integration Technologies for Emerging Microsystems", IEEE IMS 2010.
Lee, Y.-J., et. al, "3D 65nm CMOS with 320° C. Microwave Dopant Activation", IEDM 2010.
Crnogorac, F., et al., "Semiconductor crystal islands for three-dimensional integration", J. Vac. Sci. Technol. B 28(6), Nov./Dec. 2010, C6P53-58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Jung, S.-M., et al., "Highly Area Efficient and Cost Effective Double Stacked S3( Stacked Single-crystal Si) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Meindl, J. D., "Beyond Moore's Law: The Interconnect ERA", IEEE Computing in Science & Engineering, Jan./Feb. 2003, pp. 20-24.
Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "Three Dimensionally Stacked Nand Flash Memory Technology Using Stacking Single Crystal Si Layers on ILD and TANOS Structure for Beyond 30nm Node", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221 for 512M bit density SRAM, IEDM 2003, pp. 265-268.
Steen, S.E., et al., "Overlay as the key to drive wafer scale 3D integration", Microelectronic Engineering 84 (2007) 1412-1415.
Maeda, N., et al., "Development of Sub 10-gm Ultra-Thinning Technology using Device Wafers for 3D Manufacturing of Terabit Memory", 2010 Symposium on VLSI Technology Digest of Technical Papers, pp. 105-106.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", VMIC 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D Ic Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional Ic Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.

Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, Jul. 19, 2006, San Francisco.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS Mantech Conference, May 14-17, 2007 Austin, Texas, pp. 33-36.
Golshani, N., et al., "Monolithic 3D Integration of Sram and Image Sensor Using Two Layers of Single Grain Silicon", 2010 IEEE International 3D Systems Integration Conference (3DIC), Nov. 16-18, 2010, pp. 1-4.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Rajendran, B., et al., "Thermal Simulation of laser Annealing for 3D Integration", Proceedings VMIC 2003.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, dtco-25-04-aust.3d.
Borkar, S., "Designing Reliable Systems from Unreliable Components: the Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with DopantSegregated Schottky-Barrier (DSSB) Sonos Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk Cmos Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET Sonos Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter" -cut approach to low temperature silicon layer transfer", Applied Physics Letters, vol. 72, No. 1, Jan. 5, 1998, pp. 49-51.
Sadaka, M., et al., "Building Blocks for wafer level 3D integration", electroiq Aug. 18, 2010.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded Ic" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional ICs, Having Four Stacked Active Device Layers," IEDM 1989, paper 34.6, pp. 837-840.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Gaillardon, P-E., et al., "Can We Go Towards True 3-D Architectures?," DAC 2011, paper 58, pp. 282-283.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional Nand Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Miller, D.A.B., "Optical interconnects to electronic chips," Applied Optics, vol. 49, No. 25, Sep. 1, 2010, pp. F59-F70.
Yun, C. H., et al., "Transfer of patterned ion-cut silicon layers", Applied Physics Letters, vol. 73, No. 19, Nov. 1998, pp. 2772-2774.
En, W. G., et al., "The Genesis Process: A New SOI wafer fabrication method", Proceedings 1998 IEEE International SOI Conference, Oct. 1998, pp. 163-164.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 17481754, Oct. 2002.
Ahn, J., et al., "High-quality MOSFET's with ultrathin LPCVD gate SIO2," IEEE Electron Device Lett., vol. 13, No. 4, pp. 186-188, Apr. 1992.

* cited by examiner $V_D$ = drain voltage

Single Gated N+ Resistor with P+ gate, Gate-ox = 10nm, Channel Length = 1um; D (Depth) = 20nm p-RCAT n-RCAT

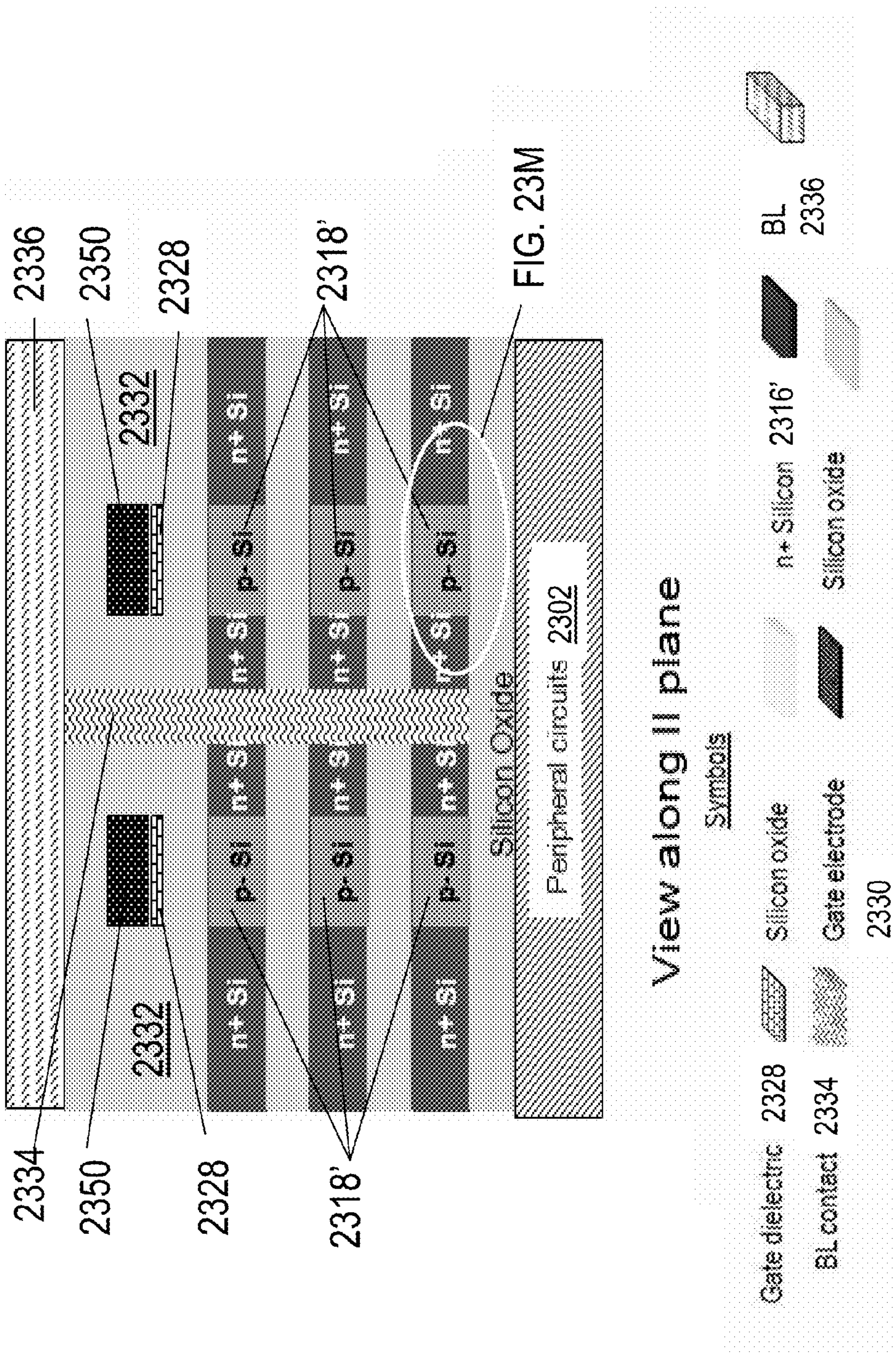
FIG. 23L1

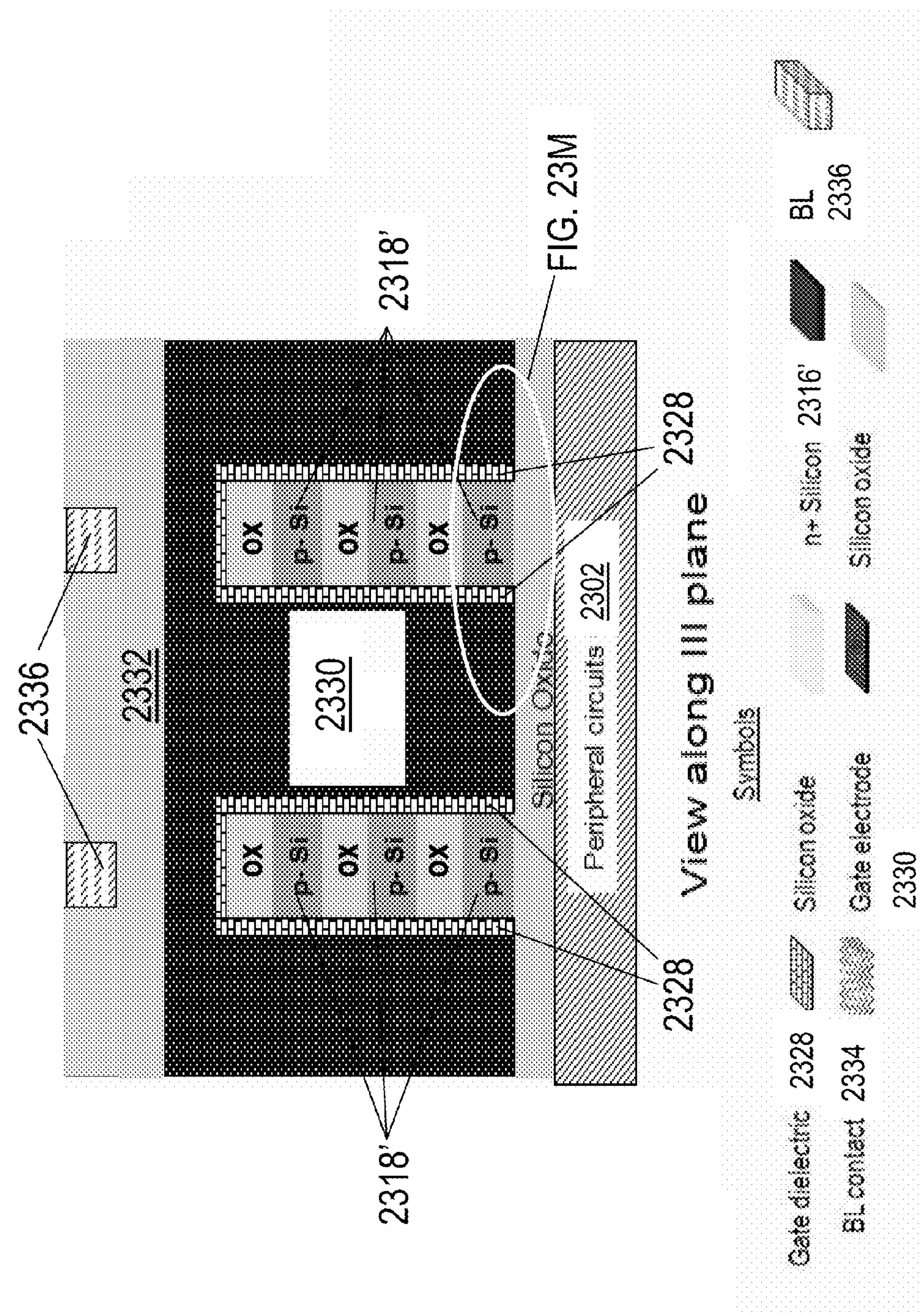
FIG. 23L2

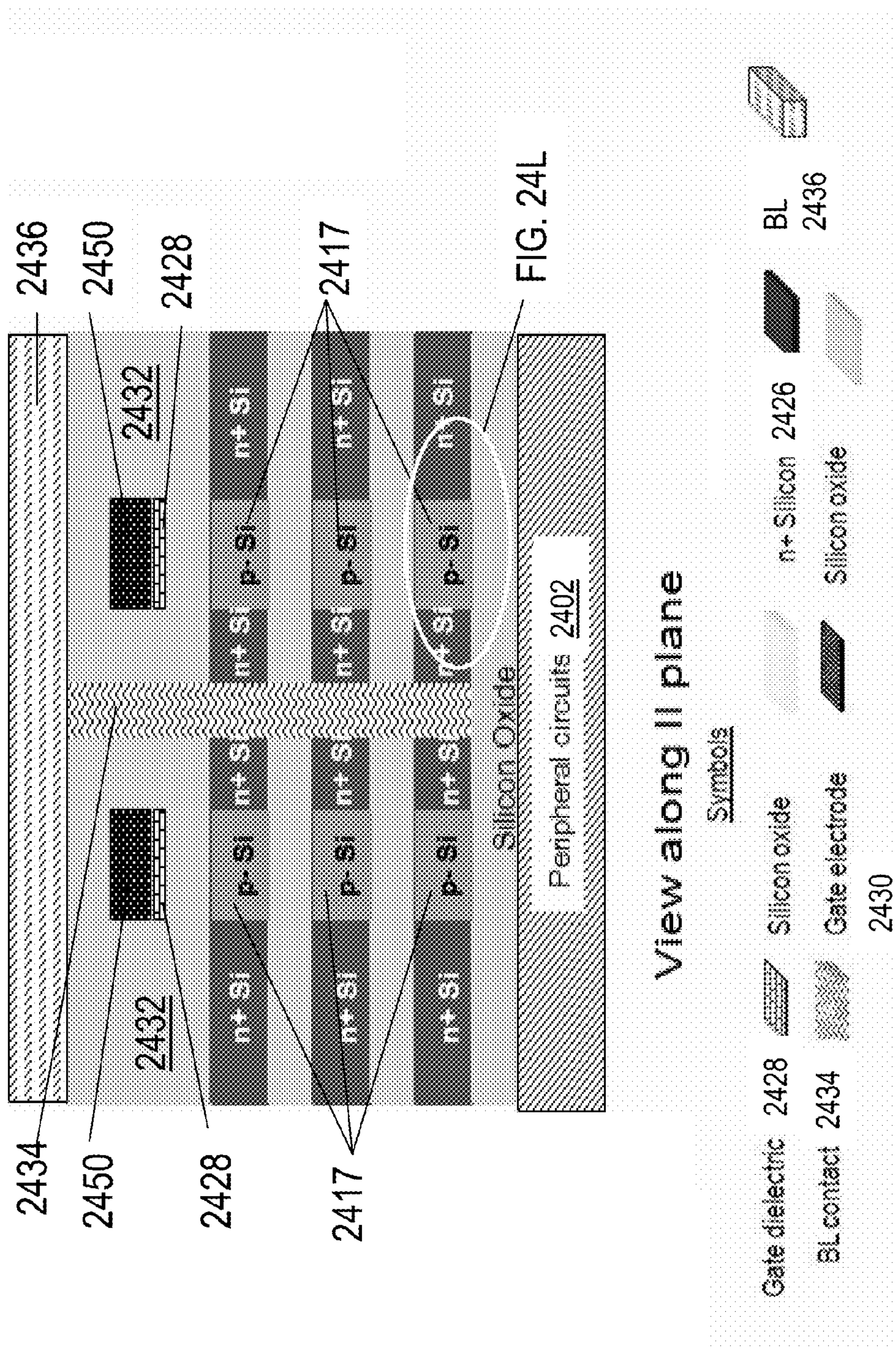
FIG. 24K1

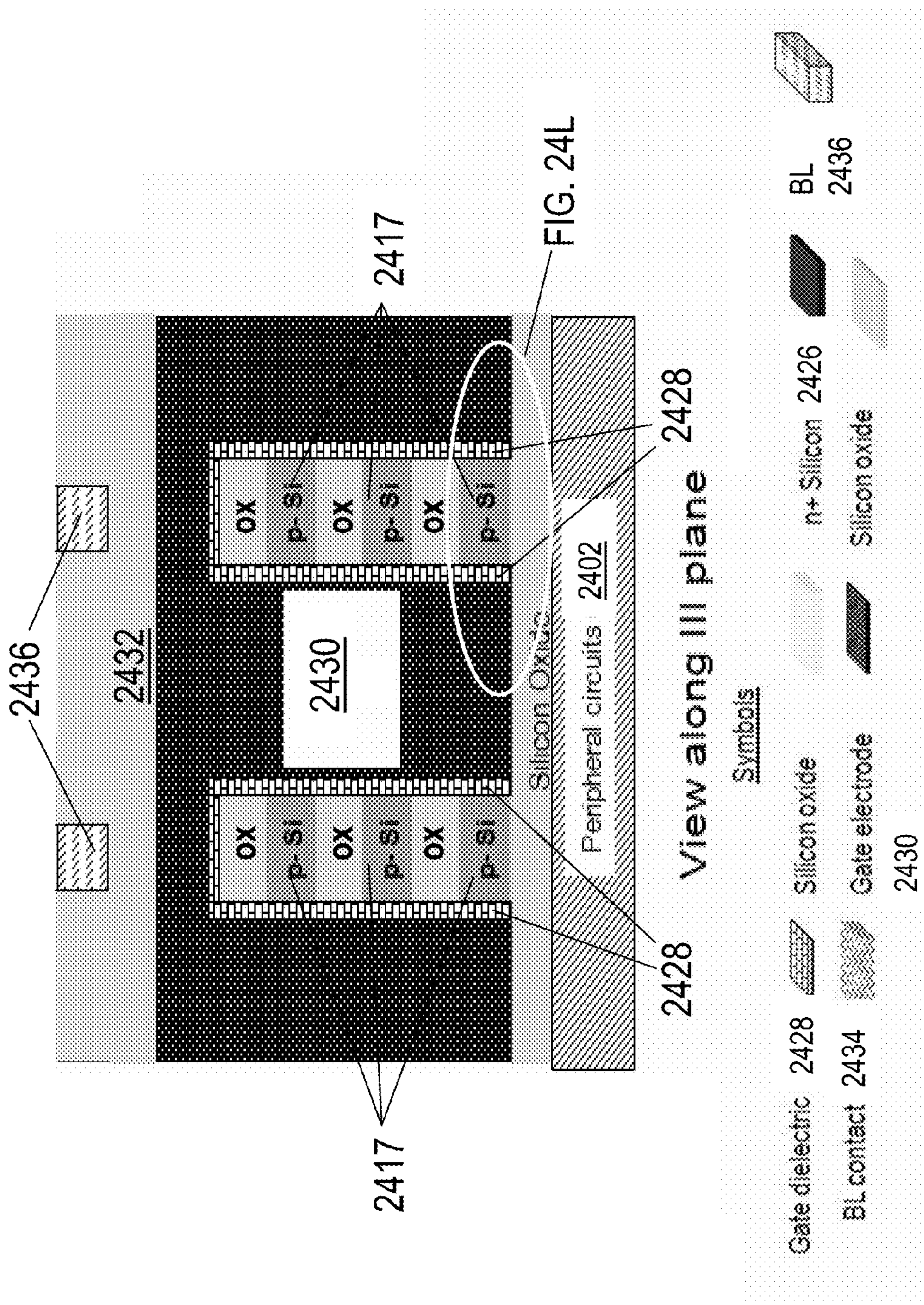
FIG. 24K2

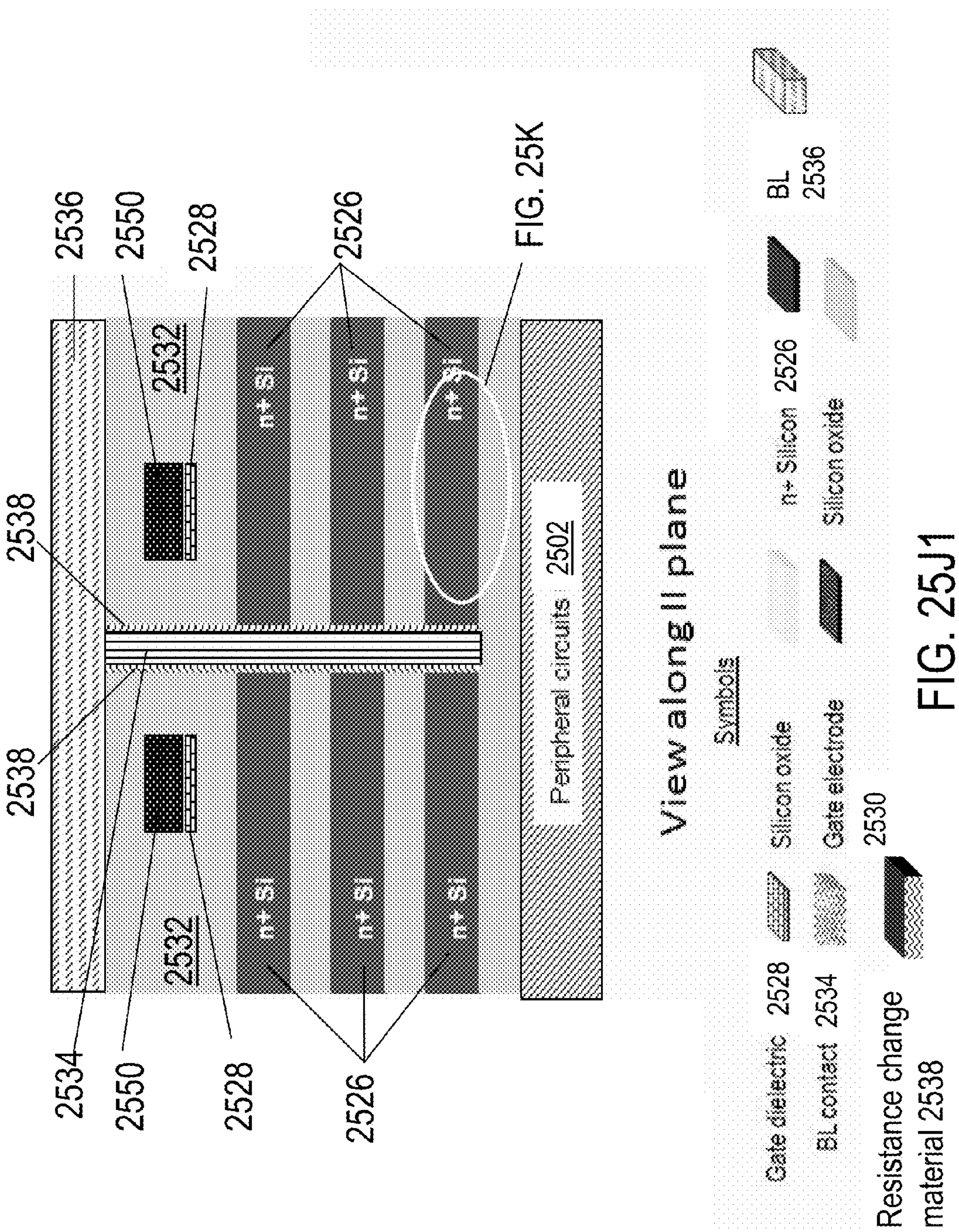
FIG. 25J1

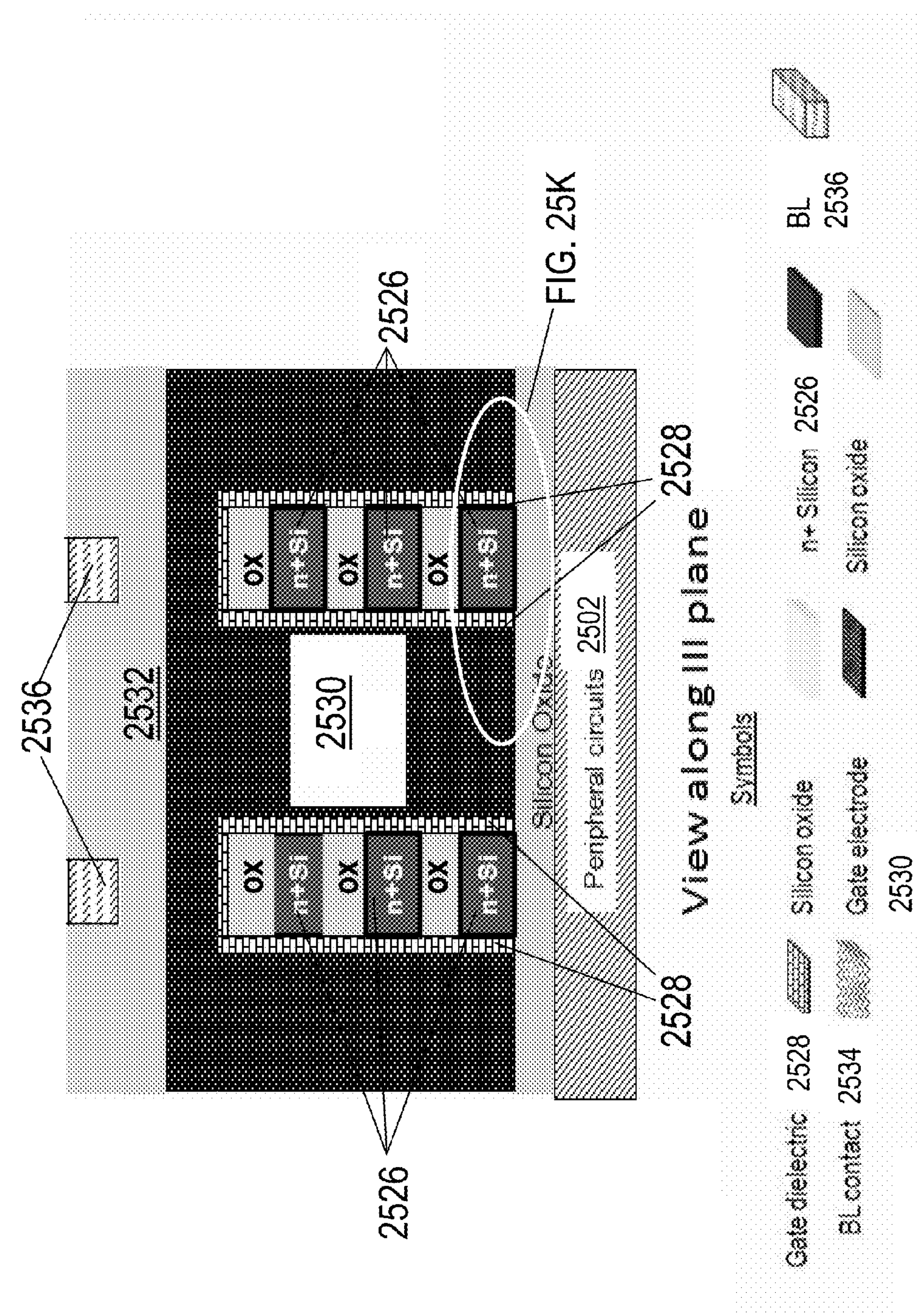
FIG. 25J2

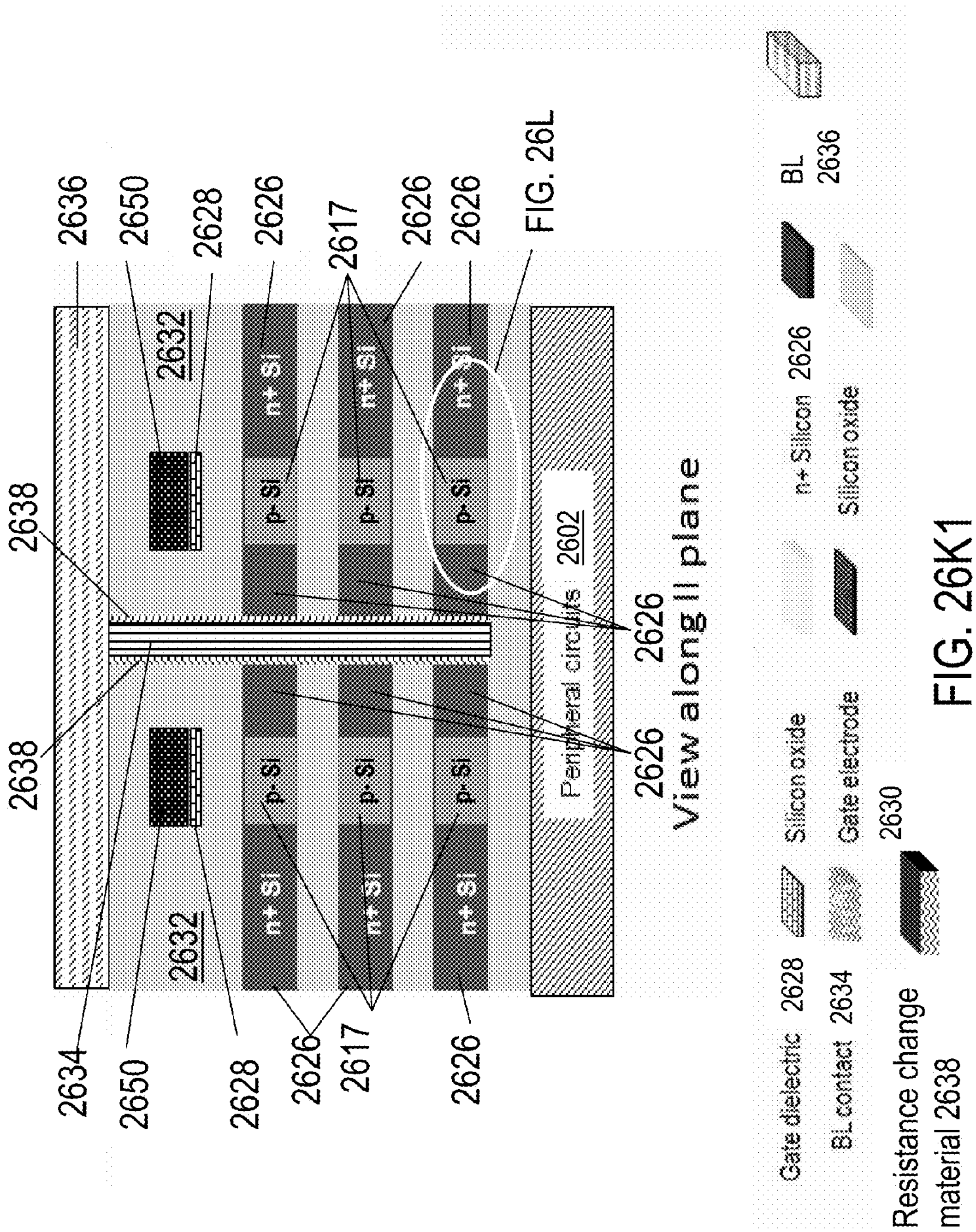
FIG. 26K1

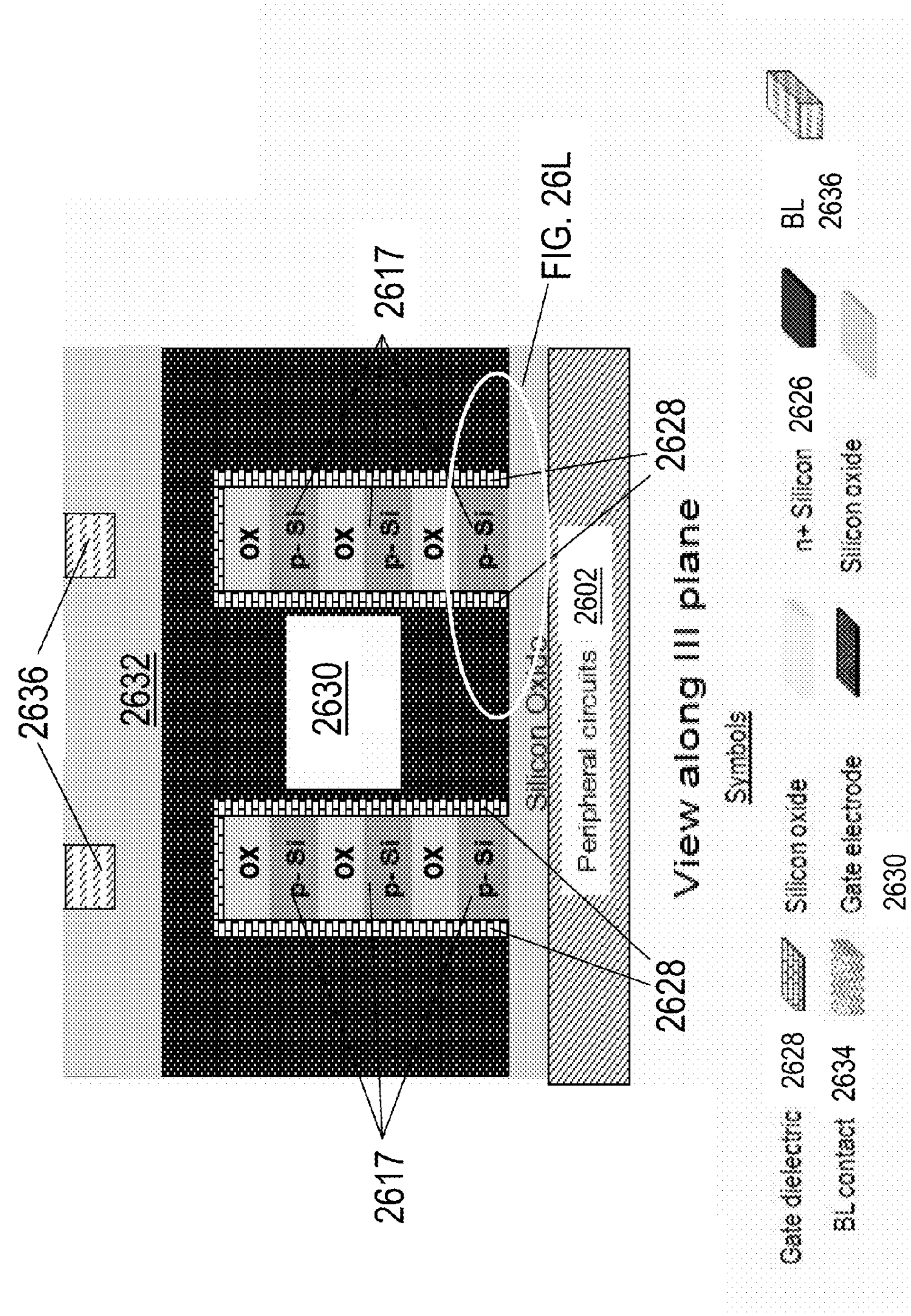
FIG. 26K2

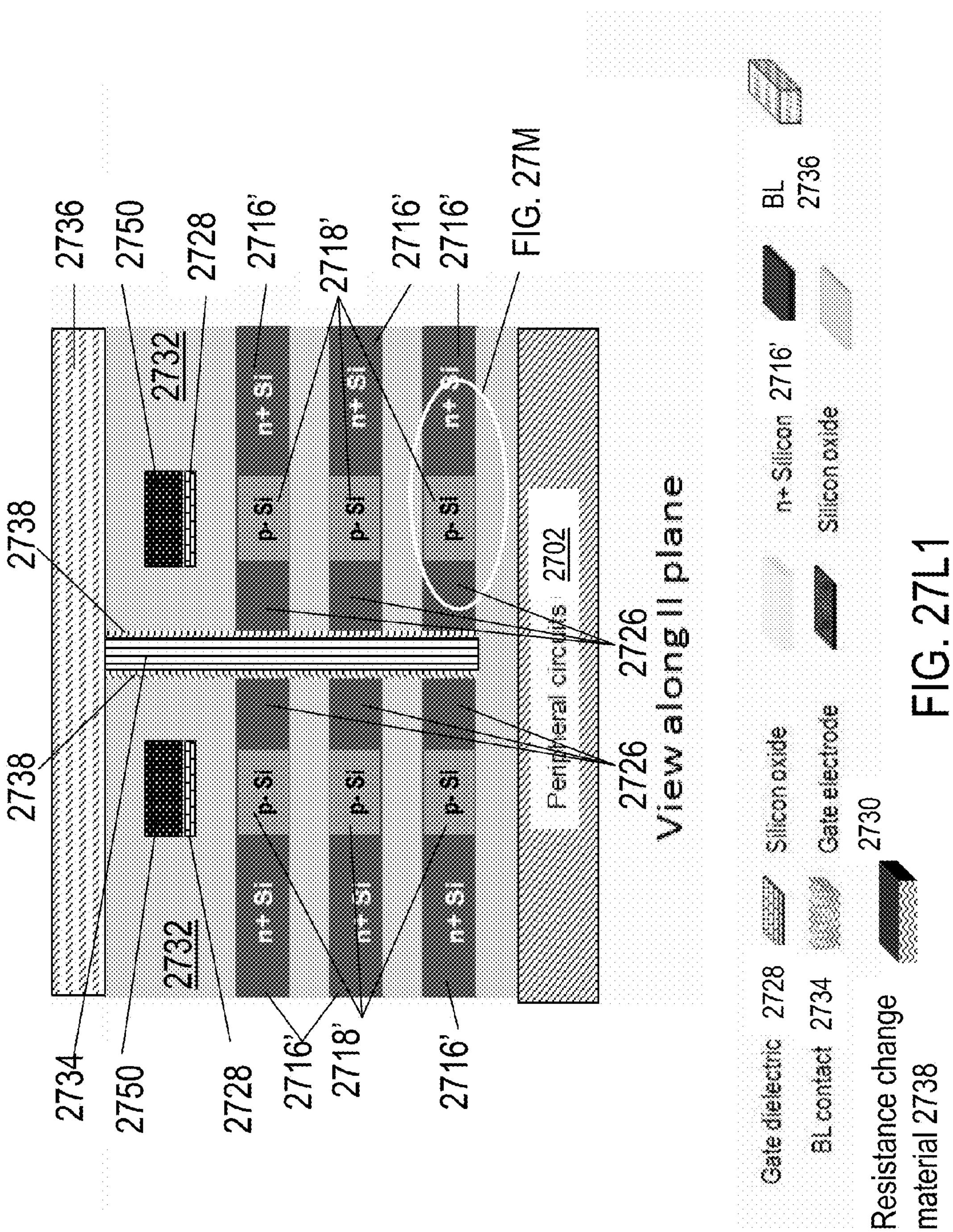
FIG. 27L1

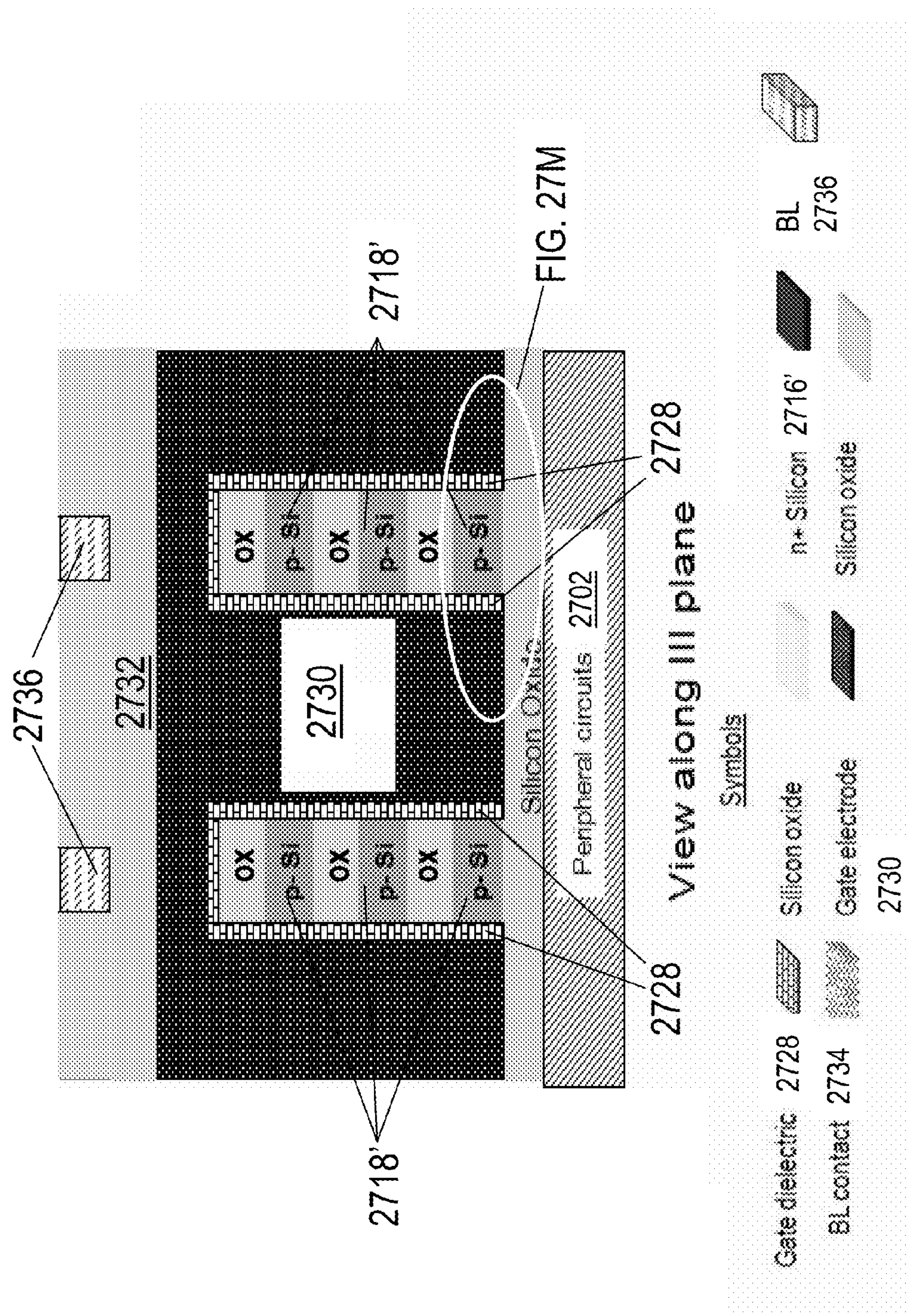
FIG. 27L2

Prior Art

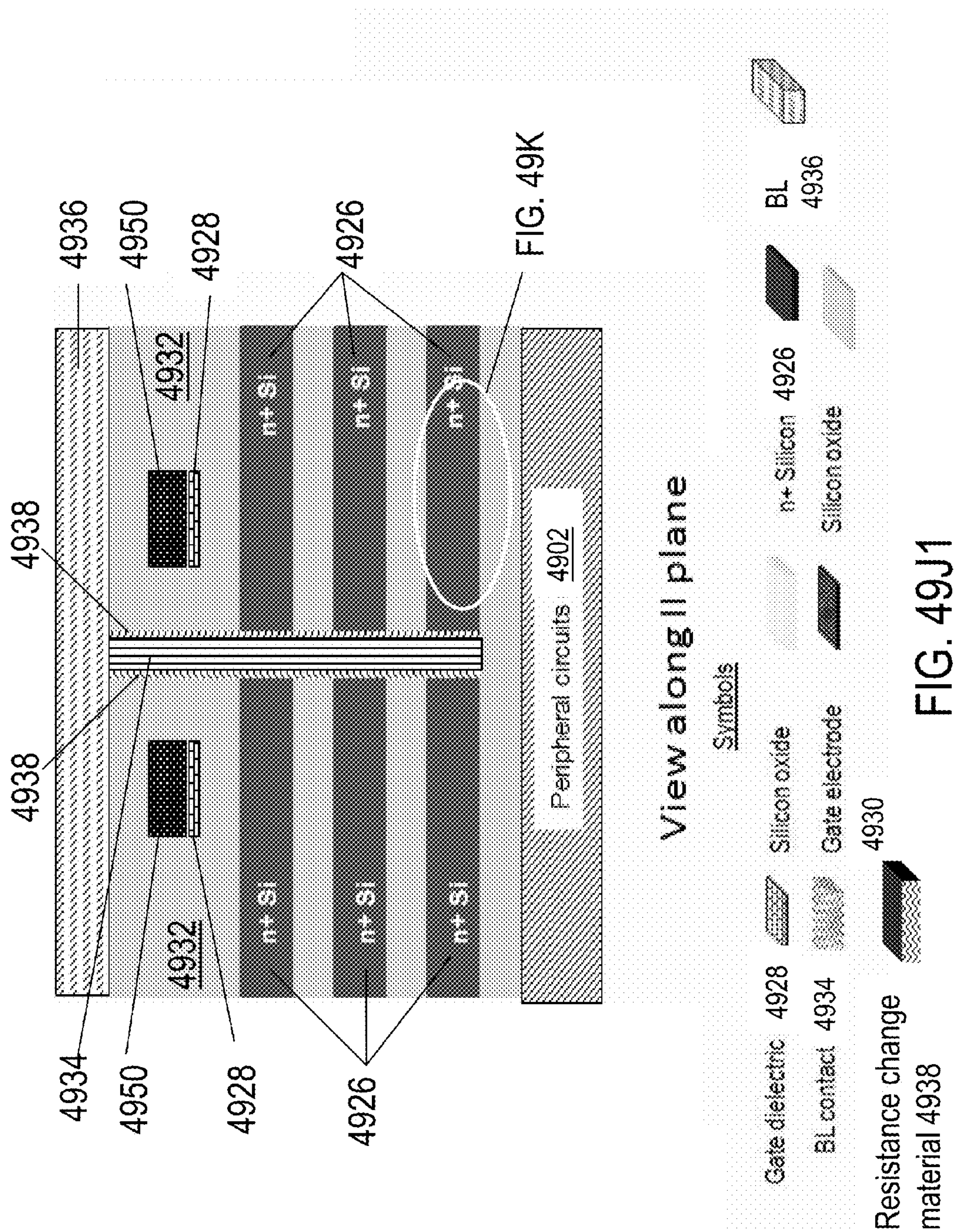
FIG. 49J1

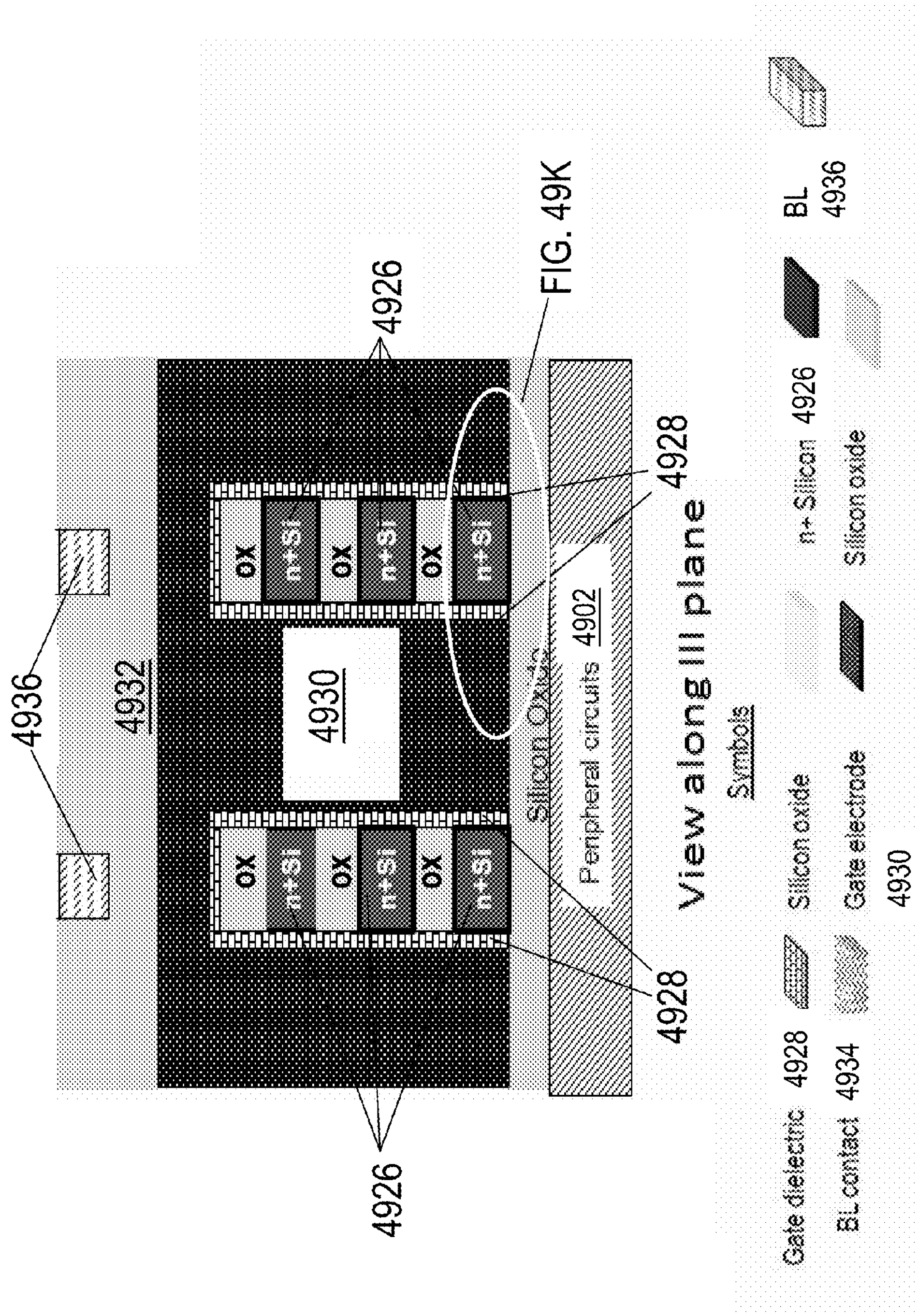
FIG. 49J2

METHOD FOR FABRICATION OF A SEMICONDUCTOR DEVICE AND STRUCTURE

BACKGROUND OF THE INVENTION

1. Field of the Invention

The invention relates to multilayer or Three Dimensional Integrated Circuit (3D IC) devices, structures, and fabrication methods.

2. Discussion of Background Art

Performance enhancements and cost reductions in generations of electronic device technology has generally been achieved by reducing the size of the device, resulting in an enhancement in device speed and a reduction in the area of the device, and hence, its cost. This is generally referred to as 'device scaling'. The dominant electronic device technology in use today is the Metal-Oxide-Semiconductor field effect transistor (MOSFET) technology.

Performance and cost are driven by transistor scaling and the interconnection, or wiring, between those transistors. As the dimensions of the device elements have approached the nanometer scale, the interconnection wiring now dominates the performance, power, and density of integrated circuit devices as described in J. A. Davis, et. al., Proc. IEEE, vol 89, no. 3, pp. 305-324, March 2001 (Davis).

Davis further teaches that three dimensional integrated circuits (3D ICs), i.e. electronic chips in which active layers of transistors are stacked one above the other, separated by insulating oxides and connected to each other by metal interconnect wires, may be the best way to continue Moore's Law, especially as device scaling slows, stops, or becomes too costly to continue. 3D integration would provide shorter interconnect wiring and hence improved performance, lower power consumption, and higher density devices.

One approach to a practical implementation of a 3D IC independently processes two fully interconnected integrated circuits complete with transistors and wiring, thins one of the wafers, bonds the two wafers together, and then makes electrical connections between the bonded wafers with Thru Silicon Vias (TSV) that are fabricated prior to or after the bonding. This approach is less than satisfactory as the density of TSVs is limited, because they require large landing pads for the TSVs to overcome the poor wafer to wafer alignment and to allow for the large (one to ten micron) diameter of the TSVs due to the thickness of the wafers bonded together. Additionally, handling and processing thinned silicon wafers is very difficult and prone to yield loss. Current prototypes of this approach only obtain TSV densities of 10,000s per chip, in comparison to the millions of interconnections currently obtainable within a single chip.

By utilizing Silicon On Insulator (SOI) wafers and glass handle wafers, A. W. Topol, et. al., in the IEDM Tech Digest, p363-5 (2005), describe attaining TSVs of tenths of microns. The TSV density is still limited due to misalignment issues resulting from pre-forming the random circuitry on both wafers prior to wafer bonding. In addition, SOI wafers are more costly than bulk silicon wafers.

Another approach is to monolithically build transistors on top of a wafer of interconnected transistors. The utility of this approach is limited by the requirement to maintain the reliability of the high performance lower layer interconnect metallization, such as, for example, aluminum and copper, and hence limits the allowable temperature exposure to below approximately 400° C. Some of the processing steps to create useful transistor elements require temperatures above 700° C., such as activating semiconductor doping or crystallization of a previously deposited amorphous material such as silicon to create a poly-crystalline silicon (polysilicon or poly) layer. It is very difficult to achieve high performance transistors with only low temperature processing and without mono-crystalline silicon channels. However, this approach may be useful to construct memory devices where the transistor performance is not critical.

Bakir and Meindl in the textbook "Integrated Interconnect Technologies for 3D Nanosystems", Artech House, 2009, show a 3D stacked Dynamic Random Access Memory (DRAM) where the silicon for the stacked transistors is produced using selective epitaxy technology or laser recrystallization. This concept is unsatisfactory as the silicon processed in this manner has a higher defect density when compared to single crystal silicon and hence suffers in performance, stability, and control. It also requires higher temperatures than the underlying metallization could be exposed to without reliability concerns. Sang-Yun Lee in U.S. Pat. No. 7,052,941 discloses methods to construct vertical transistors by preprocessing a single crystal silicon wafer with doping layers activated at high temperature, layer transferring the wafer to another wafer with preprocessed circuitry and metallization, and then forming vertical transistors from those doping layers with low temperature processing, such as etching silicon. This is less than satisfactory as the semiconductor devices in the market today utilize horizontal or horizontally oriented transistors and it would be very difficult to convince the industry to move away from the horizontal. Additionally, the transistor performance is less than satisfactory due to large parasitic capacitances and resistances in the vertical structures, and the lack of self-alignment of the transistor gate.

A key technology for 3D IC construction is layer transfer, whereby a thin layer of a silicon wafer, called the donor wafer, is transferred to another wafer, called the acceptor wafer, or target wafer. As described by L. DiCioccio, et. al., at ICICDT 2010 pg 110, the transfer of a thin (tens of microns to tens of nanometers) layer of mono-crystalline silicon at low temperatures (below approximately 400° C.) may be performed with low temperature direct oxide-oxide bonding, wafer thinning, and surface conditioning. This process is called "Smart Stacking" by Soitec (Crolles, France). In addition, the "SmartCut" process is a well understood technology used for fabrication of SOI wafers. The "SmartCut" process employs a hydrogen implant to enable cleaving of the donor wafer after the layer transfer. These processes with some variations and under different names are also commercially available from SiGen (Silicon Genesis Corporation, San Jose, Calif.). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer.

SUMMARY

The present invention is directed to multilayer or Three Dimensional Integrated Circuit (3D IC) devices and fabrication methods.

In one aspect, a method to fabricate a semiconductor device includes implanting one or more regions on a semiconductor wafer; performing a layer transfer onto a carrier; and transferring from said carrier to a target wafer.

Implementations of the above aspect may include one or more of the following. The carrier is a wafer and said performing a transfer comprises performing an ion-cut operation. The method includes forming first transistors and metal layers providing interconnection between said first transistors, wherein said metal layers comprise primarily copper or aluminum covered by an isolating layer. Gates can be replaced. The method includes forming a first mono-crystallized semiconductor layer having first transistors and metal layers providing interconnection between said first transistors, wherein said metal layers comprise primarily copper or aluminum covered by an isolating layer; and forming a second mono-crystallized semiconductor layer above or below the first mono-crystallized semiconductor layer having second transistors, wherein said second transistors comprise horizontally oriented transistors. P type and N type transistors can be formed above or below said target wafer.

In another aspect, one or more regions can be implanted in a semiconductor wafer to form a first type of transistors, and then the process can perform a layer transfer onto a holder wafer; and implant one or more regions in the semiconductor wafer to form a second type of transistors, wherein the first type is an N-type transistor and second type is a P-type transistor, or vice versa. The layer can be transferred from a holder wafer above or below of a target wafer. The layer transferring can include an ion-cut.

Implementations of the above aspect may include one or more of the following. Gate replacement can be done. The method can include forming a first mono-crystallized semiconductor layer including first transistors and metal layers providing interconnection between said first transistors, wherein said metal layers comprise primarily copper or aluminum covered by an isolating layer; and forming a second mono-crystallized semiconductor layer above or below the first mono-crystallized semiconductor layer having second transistors, wherein said second transistors are horizontally oriented transistors and may form a repeating pattern. A holder wafer can be formed on a first layer of mono-crystallized silicon including first transistors and metal layers providing interconnection between said first transistors, wherein said metal layers comprise primarily copper or aluminum and covered by an isolating layer.

In another aspect, a method to fabricate a 3D semiconductor device includes forming a first layer of mono-crystallized silicon having first transistors and plurality of metal layers providing interconnection between said first transistors, said metal layers comprising primarily copper or aluminum and covered by an isolating layer, transferring a semiconductor layer comprising a first type of semiconductor layer above or below a second type of semiconductor layer, wherein the first type is an N-type and the second type is a P-type or vice versa, and etching one or more regions in the said first type layer to define one or more second transistors gate locations.

Implementations of the above aspect may include one or more of the following. Ion-cutting can be used. The second transistors are horizontally oriented transistors. The second transistors can be P type and N type transistors. The transistors can form a repeating pattern. The second transistors can form a memory.

In yet another aspect, an integrated circuit includes a first layer of mono-crystallized silicon having first transistors and plurality of metal layers providing interconnection between said first transistors, said metal layers comprising primarily copper or aluminum and covered by an isolating layer, a semiconductor layer comprising a first type of semiconductor layer above or below a second type of semiconductor layer, wherein the first type is an N-type and the second type is a P-type or vice versa, and one or more regions etched in the said first type layer to define one or more second transistors gate locations.

Implementations of the above aspect may include one or more forming one or more memory cells in the IC. In yet another aspect, a semiconductor device includes a first single crystal silicon layer comprising first transistors and at least one metal layer overlying the first single crystal silicon layer, wherein at least one metal layer comprises copper or aluminum; and a second single crystal silicon layer overlying the at least one metal layers; wherein the second single crystal silicon layer comprises second transistors arranged in substantially parallel bands wherein each band comprises a set of the second transistors along an axis in a repeating pattern.

In another aspect, an Integrated Circuit device includes a first layer of single crystal including a multiplicity of first transistors; a plurality of metal layers providing interconnection between said first transistors, wherein said metal layers comprise copper or aluminum; and a second layer of less than 2 micron thin single crystal with a multiplicity of second transistors; wherein said second transistors comprise self-aligned gates.

In yet another aspect, an Integrated Circuit device includes a first layer of single crystal including a multiplicity of first transistors; and a plurality of metal layers providing interconnection between said first transistors, wherein said metal layers comprises copper or aluminum; and a second layer of less than 2 micron thin single crystal including a multiplicity of second transistors transistor overlaid by a multiplicity of third transistors; wherein the second transistors comprise an N type and the third transistors comprise a P type, or vice versa where the second transistors comprise a P type and the third transistors comprise an N type.

In yet another aspect, an Integrated Circuit device includes a first layer of single crystal comprising a multiplicity of first transistors; and plurality of metal layers providing interconnection between said first transistors, wherein said metal layers comprise copper or aluminum; a second layer of a single crystal comprising a multiplicity of second transistors; and a layer of heat spreader in between said first layer and said second layer.

Advantages of the preferred embodiments may include one or more of the following. A 3DIC device with horizontal or horizontally oriented transistors and devices in mono-crystalline silicon can be built at low temperatures. The 3D IC construction of partially preformed layers of transistors provides a high density of layer to layer interconnect.

The 3D ICs offer many significant benefits, including a small footprint—more functionality fits into a small space. This extends Moore's Law and enables a new generation of tiny but powerfuldevices. The 3D ICs have improved speed—The average wire length becomes much shorter. Because propagation delay is proportional to the square of the wire length, overall performance increases. The 3D ICs consume low power—Keeping a signal on-chip reduces its power consumption by ten to a hundred times. Shorter wires also reduce power consumption by producing less parasitic capacitance. Reducing the power budget leads to less heat generation, extended battery life, and lower cost of operation. The vertical dimension adds a higher order of connectivity and opens a world of new design possibilities. Partitioning a large chip to be multiple smaller dies with 3D stacking could potentially improve the yield and reduce the fabrication cost. Heterogeneous integration—Circuit layers can be built with different processes, or even on different types of wafers. This means that components can be optimized to a much greater degree than if they were built together on a single wafer. Even more interesting, components with completely incompatible manufacturing could be combined in a single device. The stacked structure hinders attempts to reverse engineer the circuitry. Sensitive circuits may also be divided among the layers in such a way as to obscure the function of each layer.

3D integration allows large numbers of vertical vias between the layers. This allows construction of wide bandwidth buses between functional blocks in different layers. A typical example would be a processor and memory 3D stack, with the cache memory stacked on top of the processor. This arrangement allows a bus much wider than the typical 128 or 256 bits between the cache and processor. Wide buses in turn alleviate the memory wall problem.

BRIEF DESCRIPTION OF THE DRAWINGS

Various embodiments of the present invention will be understood and appreciated more fully from the following detailed description, taken in conjunction with the drawings in which.

DESCRIPTION

Figure 1:
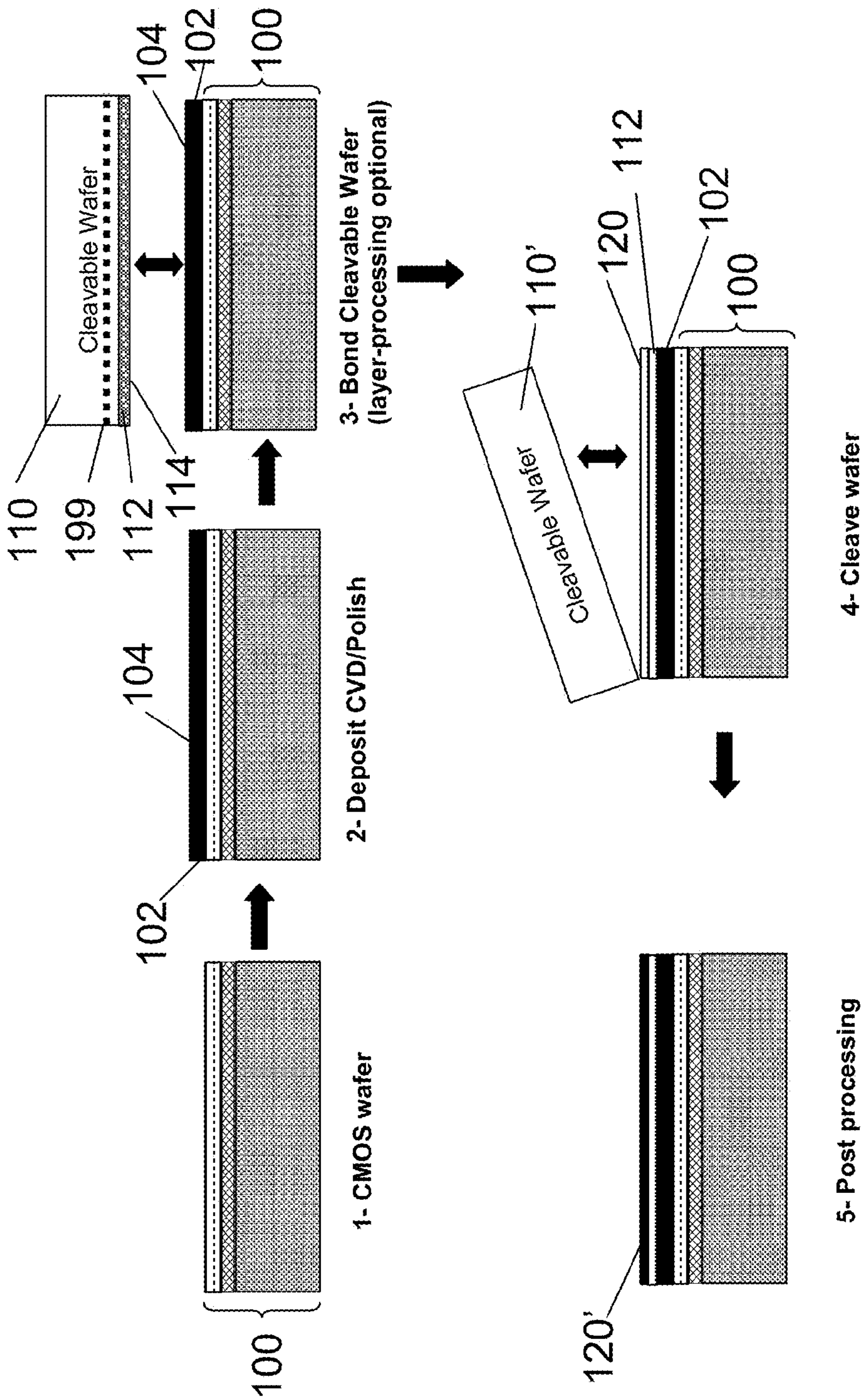
FIG. 1 is an exemplary drawing illustration of a layer transfer process flow.

Embodiments of the present invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Many figures describe process flows for building devices. These process flows, which are essentially a sequence of steps for building a device, have many structures, numeric and other labels that are common between two or more adjacent steps. In such cases, some of the numeric and other labels in the structures used for a certain step's figure may have been described in previous steps' figures.

As illustrated in FIG. 1, a generalized single layer transfer procedure that utilizes the above techniques may begin with acceptor substrate 100, which may be a preprocessed CMOS silicon wafer, or a partially processed CMOS, or other prepared silicon or semiconductor substrate. The acceptor substrate may also be called target wafer. The acceptor substrate 100 may be prepared for oxide to oxide wafer bonding by a deposition of an oxide 102, and the surface 104 may be made ready for low temperature bonding by various surface treatments, such as, for example, an RCA pre-clean that may include dilute ammonium hydroxide or hydrochloric acid, and may include plasma surface preparations to lower the bonding energy. In addition, polishes may be employed to achieve satisfactory flatness.

A donor wafer 110 may be prepared for cleaving by an implant or implants of atomic species, such as, for example, Hydrogen and Helium, to form a layer transfer demarcation plane 199, shown as a dashed line. Plane 199 may be formed before or after other processing on the donor wafer 110. The donor wafer or substrate 110 may be prepared for oxide to oxide wafer bonding by a deposition of an oxide 112, and the surface 114 may be made ready for low temperature bonding by various surface treatments, such as, for example, an RCA pre-clean that may include dilute ammonium hydroxide or hydrochloric acid, and may include plasma surface preparations to lower the bonding energy. In addition, polishes may be employed to achieve satisfactory flatness. The donor wafer 110 may have prefabricated layers, structures, transistors or circuits.

Donor wafer 110 may be bonded to acceptor substrate 100, or target wafer, by bringing the donor wafer surface 114 in physical contact with acceptor substrate surface 104, and then applying mechanical force and/or thermal annealing to strengthen the oxide to oxide bond. Alignment of the donor wafer 110 with the acceptor substrate 100 may be performed immediately prior to the wafer bonding. Acceptable bond strengths may be obtained with bonding thermal cycles that do not exceed approximately 400° C.

The donor wafer 110 is then cleaved at or near the layer transfer demarcation plane 199 and removed leaving transferred layer 120 bonded and attached to acceptor substrate 100, or target wafer. The cleaving may be accomplished by various applications of energy to the layer transfer demarcation plane, such as, for example, a mechanical strike by a knife or jet of liquid or jet of air, or by local laser heating, or other suitable methods. The transferred layer 120 may be polished chemically and mechanically to provide a suitable surface for further processing. The transferred layer 120 may be of thickness approximately 200 nm or less to enable formation of nanometer sized thru layer vias and create a high density of interconnects between the donor wafer and acceptor wafer.

Transferred layer 120 may then be further processed to create a monolithic layer of interconnected devices 120' and the formation of thru layer vias (TLVs) to electrically couple donor wafer circuitry with acceptor wafer circuitry. The use of an implanted atomic species, such as, for example, Hydrogen or Helium or a combination, to create a cleaving plane, such as, for example, layer transfer demarcation plane 199, and the subsequent cleaving at or near the cleaving plane as described above may be referred to in this document as "ion-cut", and is the preferred and generally illustrated layer transfer method utilized.

Persons of ordinary skill in the art will appreciate that the illustrations in FIG. 1 are exemplary only and are not drawn to scale. Such skilled persons will further appreciate that many variations are possible such as, for example, a heavily doped (greater than 1e20 atoms/$cm^3$) boron layer or silicon germanium (SiGe) layer may be utilized as an etch stop layer either within the ion-cut process flow, wherein the layer transfer demarcation plane may be placed within the etch stop layer or into the substrate material below, or the etch stop layers may be utilized without an implant cleave or ion-cut process and the donor wafer may be preferentially etched away until the etch stop layer is reached. Such skilled persons will further appreciate that the oxide layer within an SOI or GeOI donor wafer may serve as the etch stop layer. Many other modifications within the scope of the invention will suggest themselves to such skilled persons after reading this specification. Thus the invention is to be limited only by the appended claims.

Alternatively, other technologies and techniques may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer is subsequently aligned and low-temperature oxide-to-oxide bonded to the acceptor wafer topside. A low temperature release of the glass handle wafer from the thinned donor wafer is next performed, and then thru layer via (or layer to layer) connections are made.

Additionally, the present inventors contemplate that other technology can be used. For example, an epitaxial liftoff (ELO) technology as shown by P. Demeester, et. al, of IMEC in Semiconductor Science Technology 1993 may be utilized for layer transfer. ELO makes use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, silicon oxide in SOI or AlAs. After liftoff, the transferred layer is then aligned and bonded to the desired acceptor substrate or wafer. The manufacturability of the ELO process for multilayer layer transfer use was recently improved by J. Yoon, et. al., of the University of Illinois at Urbana-Champaign as described in Nature May 20, 2010.

Canon developed a layer transfer technology called ELTRAN—Epitaxial Layer TRANsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores are treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 2A:
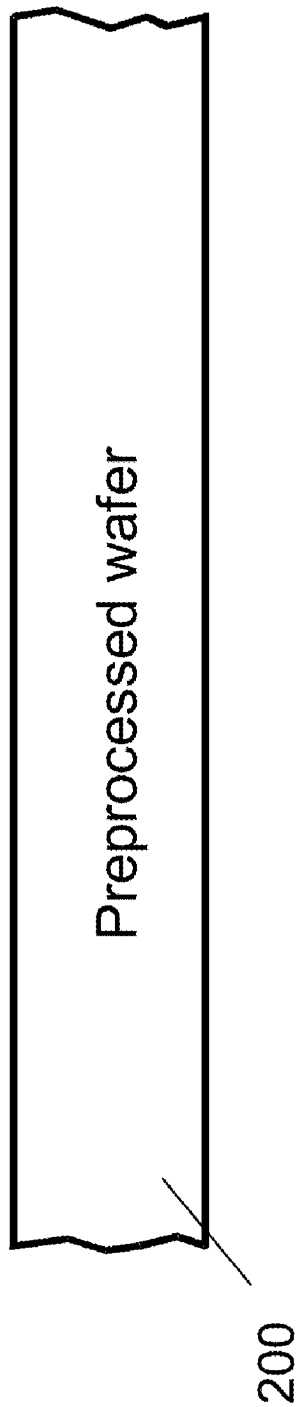
FIGS. 2A-2H are exemplary drawing illustrations of the preprocessed wafers and layers and generalized layer transfer.

FIG. 2A is a drawing illustration of a generalized preprocessed wafer or layer 200. The wafer or layer 200 may have preprocessed circuitry, such as, for example, logic circuitry, microprocessors, circuitry comprising transistors of various types, and other types of digital or analog circuitry including, but not limited to, the various embodiments described herein. Preprocessed wafer or layer 200 may have preprocessed metal interconnects, such as, for example, of copper or aluminum. The preprocessed metal interconnects may be designed and prepared for layer transfer and electrical coupling from preprocessed wafer or layer 200 to the layer or layers to be transferred.

Figure 2B:
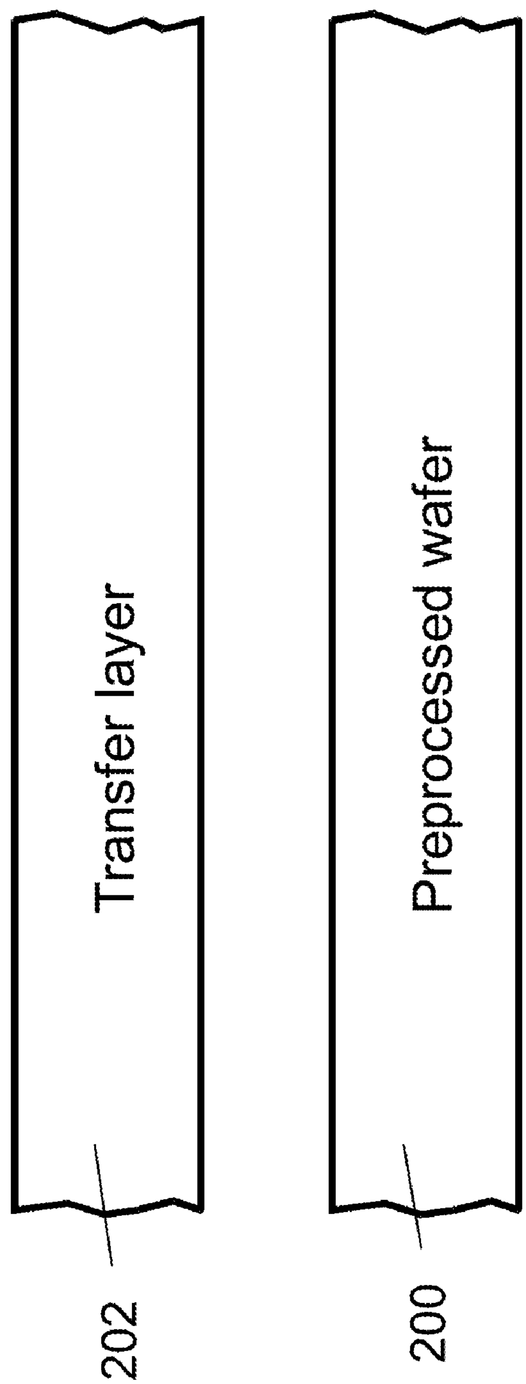

FIG. 2B is a drawing illustration of a generalized transfer layer 202 prior to being attached to preprocessed wafer or layer 200. Preprocessed wafer or layer 200 may be called a target wafer or acceptor substrate. Transfer layer 202 may be attached to a carrier wafer or substrate during layer transfer. Transfer layer 202 may have metal interconnects designed and prepared for layer transfer and electrical coupling to preprocessed wafer or layer 200. Transfer layer 202 may include mono-crystalline silicon, or doped mono-crystalline silicon layer or layers, or other semiconductor, metal, and insulator materials, layers; or multiple regions of single crystal silicon, or mono-crystalline silicon, or dope mono-crystalline silicon, or other semiconductor, metal, or insulator materials. A preprocessed wafer that can withstand subsequent processing of transistors on top at high temperatures may be a called the "Foundation" or a foundation wafer, layer or circuitry. The terms 'mono-crystalline silicon' and 'single crystal silicon' may be used interchangeably.

Figure 2C:
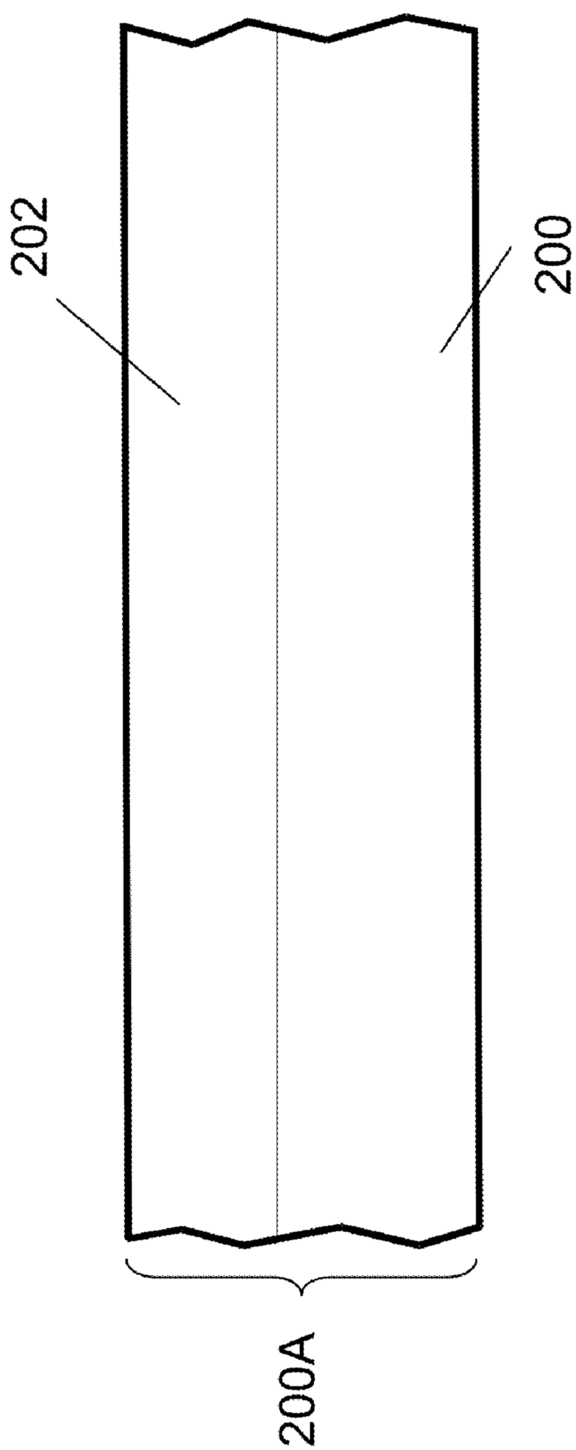

FIG. 2C is a drawing illustration of a preprocessed wafer or layer 200A created by the layer transfer of transfer layer 202 on top of preprocessed wafer or layer 200. The top of preprocessed wafer or layer 200A may be further processed with metal interconnects designed and prepared for layer transfer and electrical coupling from preprocessed wafer or layer 200A to the next layer or layers to be transferred.

Figure 2D:
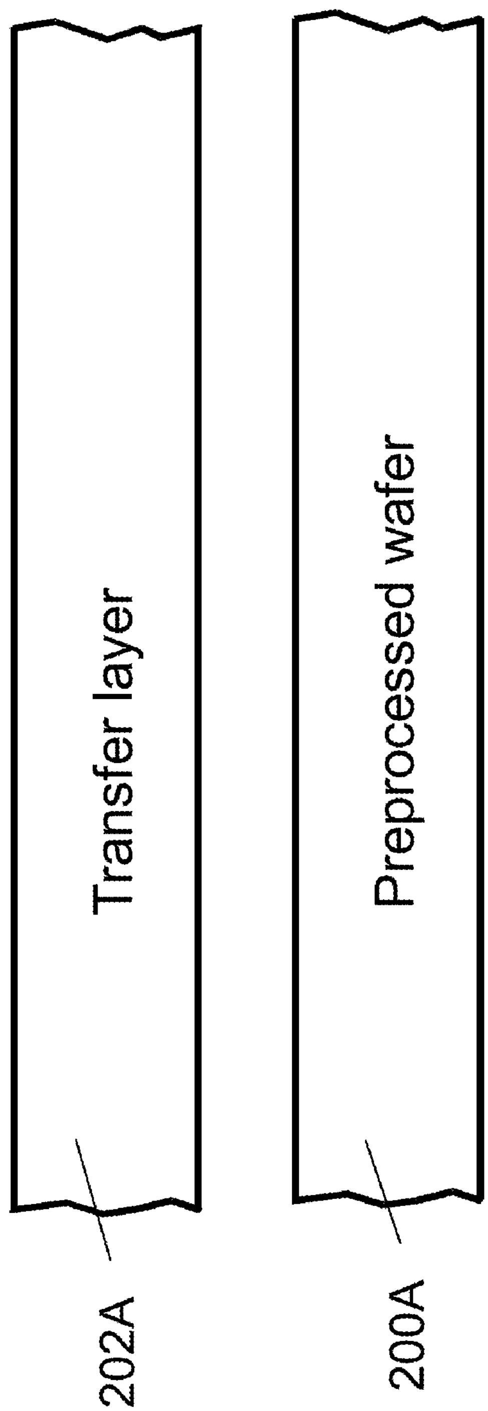

FIG. 2D is a drawing illustration of a generalized transfer layer 202A prior to being attached to preprocessed wafer or layer 200A. Transfer layer 202A may be attached to a carrier wafer or substrate during layer transfer. Transfer layer 202A may have metal interconnects designed and prepared for layer transfer and electrical coupling to preprocessed wafer or layer 200A.

Figure 2E:
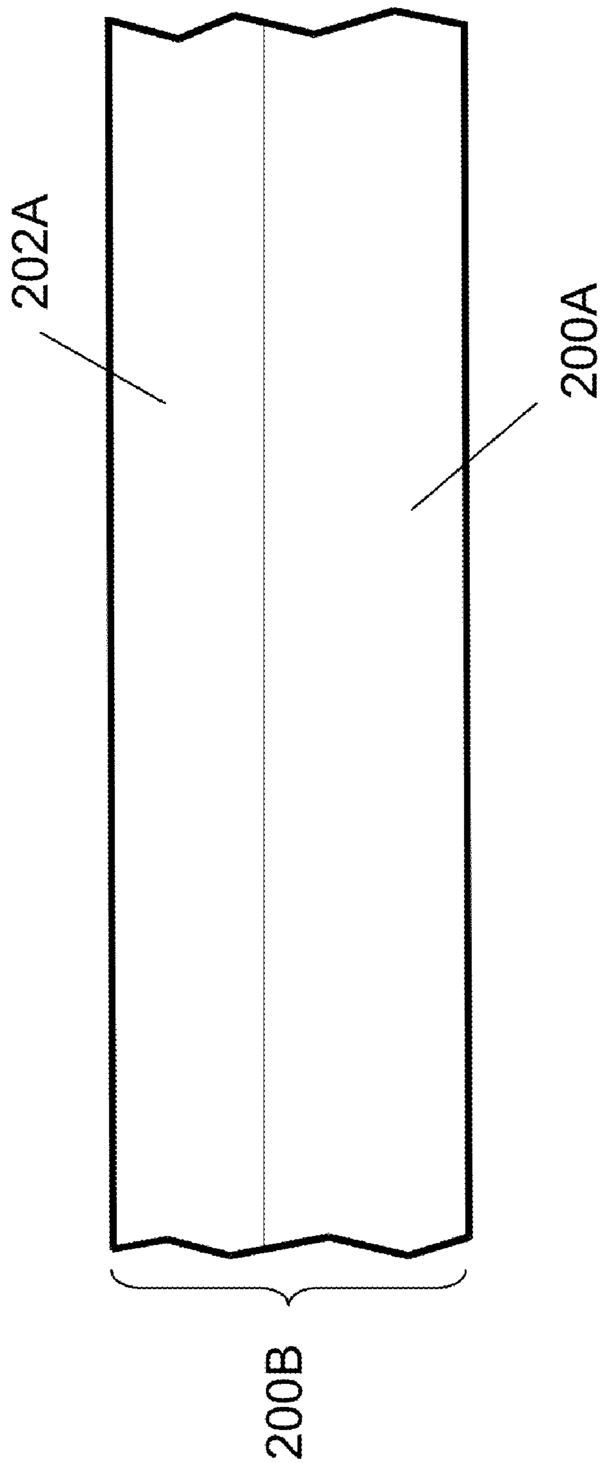

FIG. 2E is a drawing illustration of a preprocessed wafer or layer 200B created by the layer transfer of transfer layer 202A on top of preprocessed wafer or layer 200A. The top of preprocessed wafer or layer 200B may be further processed with metal interconnects designed and prepared for layer transfer and electrical coupling from preprocessed wafer or layer 200B to the next layer or layers to be transferred.

Figure 2F:
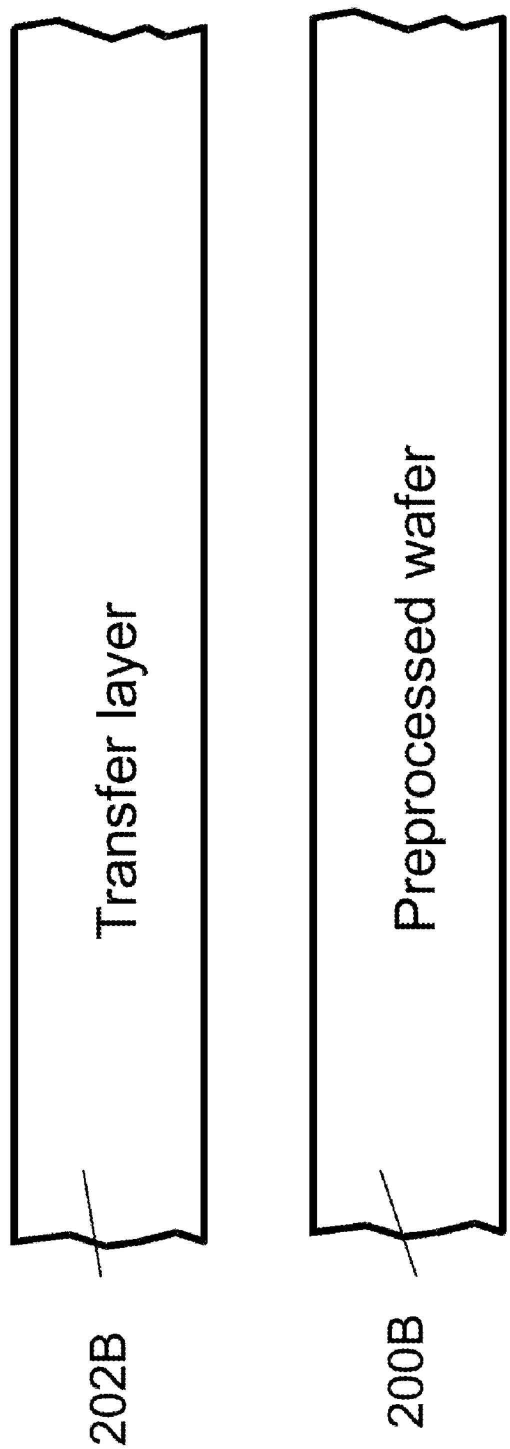

FIG. 2F is a drawing illustration of a generalized transfer layer 202B prior to being attached to preprocessed wafer or layer 200B. Transfer layer 202B may be attached to a carrier wafer or substrate during layer transfer. Transfer layer 202B may have metal interconnects designed and prepared for layer transfer and electrical coupling to preprocessed wafer or layer 200B.

Figure 2G:
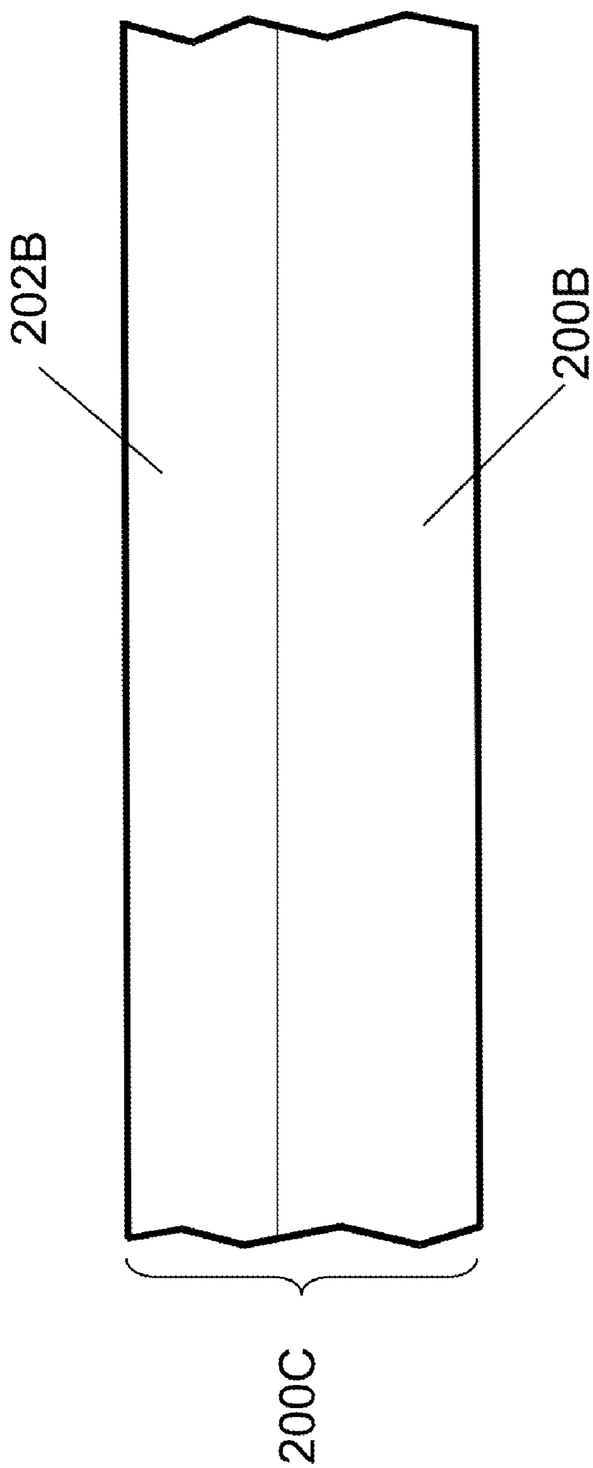

FIG. 2G is a drawing illustration of preprocessed wafer layer 200C created by the layer transfer of transfer layer 202B on top of preprocessed wafer or layer 200B. The top of preprocessed wafer or layer 200C may be further processed with metal interconnect designed and prepared for layer transfer and electrical coupling from preprocessed wafer or layer 200C to the next layer or layers to be transferred.

Figure 2H:
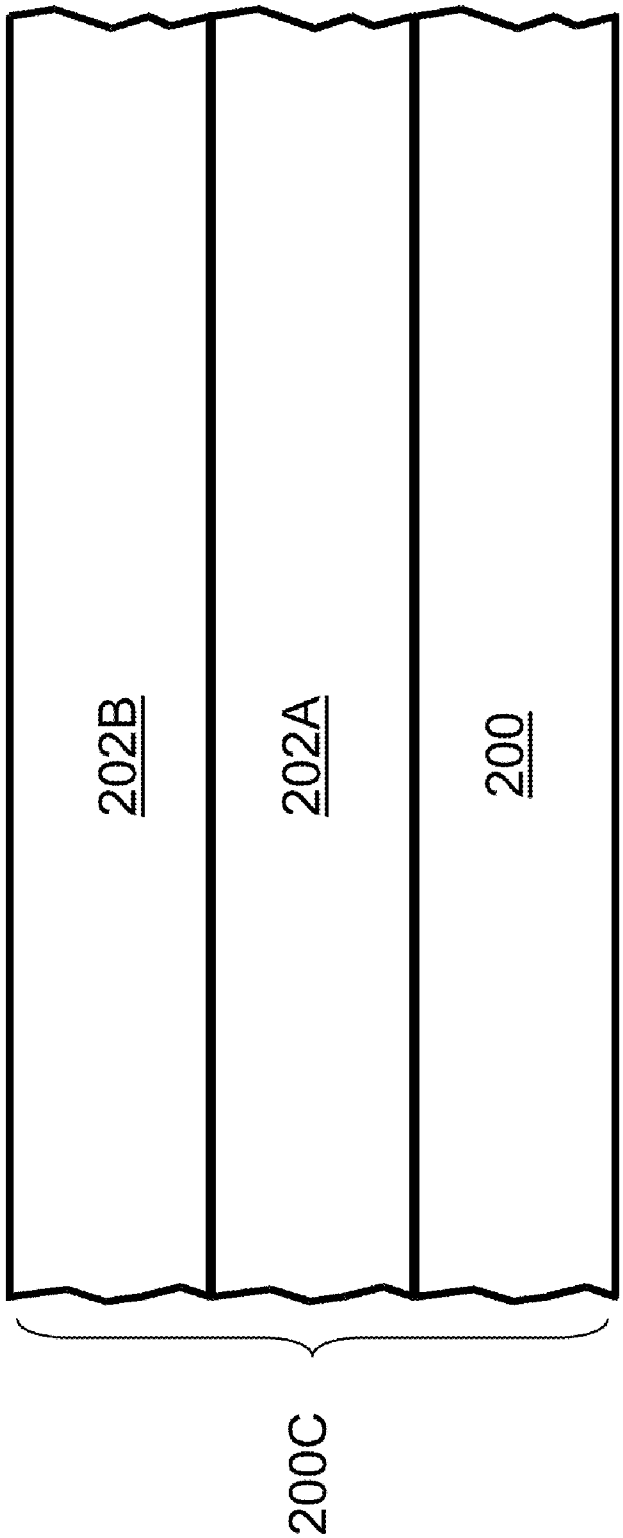

FIG. 2H is a drawing illustration of preprocessed wafer or layer 200C, a 3D IC stack, which may comprise transferred layers 202A and 202B on top of the original preprocessed wafer or layer 200. Transferred layers 202A and 202B and the original preprocessed wafer or layer 200 may comprise transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be junction-less transistors or recessed channel transistors. Transferred layers 202A and 202B and the original preprocessed wafer or layer 200 may further include semiconductor devices such as, for example, resistors and capacitors and inductors, one or more programmable interconnects, memory structures and devices, sensors, radio frequency devices, or optical interconnect with associated transceivers. The terms carrier wafer or carrier substrate may also be called holder wafer or holder substrate.

This layer transfer process can be repeated many times, thereby creating preprocessed wafers comprising many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

Persons of ordinary skill in the art will appreciate that the illustrations in FIGS. 2A through 2H are exemplary only and are not drawn to scale. Such skilled persons will further appreciate that many variations are possible such as, for example, the preprocessed wafer or layer 200 may act as a base or substrate layer in a wafer transfer flow, or as a preprocessed or partially preprocessed circuitry acceptor wafer in a wafer transfer process flow. Many other modifications within the scope of the invention will suggest themselves to such skilled persons after reading this specification. Thus the invention is to be limited only by the appended claims.

One industry method to form a low temperature gate stack is called a high-k metal gate (HKMG) and will be referred to in later discussions. The high-k metal gate structure may be formed as follows. Following an industry standard HF/SC1/SC2 cleaning to create an atomically smooth surface, a high-k dielectric is deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal is critical for the device to perform properly. A metal replacing N' poly as the gate electrode needs to have a work function of approximately 4.2 eV for the device to operate properly and at the right threshold voltage. Alternatively, a metal replacing $P^+$ poly as the gate electrode needs to have a work function of approximately 5.2 eV to operate properly. The TiAl and TiAlN based family of metals, for example, could be used to tune the work function of the metal from 4.2 eV to 5.2 eV.

Alternatively, a low temperature gate stack may be formed with a gate oxide formed by a microwave oxidation technique, such as, for example, the TEL SPA (Tokyo Electron Limited Slot Plane Antenna) oxygen radical plasma, that grows or deposits a low temperature Gate Dielectric to serve as the MOSFET gate oxide, or an atomic layer deposition (ALD) technique may be utilized. A metal gate, such as, for example, aluminum or tungsten, or low temperature doped amorphous silicon gate electrode may then be deposited.

Transistors constructed in this description can be considered "planar transistors" when the current flow in the transistor channel is substantially in the horizontal direction. These transistors can also be referred to as horizontal transistors, horizontally oriented transistors, or lateral transistors. In some embodiments of the current invention the transistor is constructed in a two-dimensional plane where the source and the drain are in the same two dimensional plane.

The Following Sections Discuss Embodiments to the Invention Wherein Wafer Sized Doped Layers are Transferred and then Processed to Create 3D ICs.

An embodiment of this invention is to pre-process a donor wafer by forming wafer sized layers of various materials without a process temperature restriction, then layer transferring the pre-processed donor wafer to the acceptor wafer, and processing at either low temperature (below approximately 400° C.) or high temperature (greater than approximately 400° C.) after the layer transfer to form device structures, such as, for example, transistors, on or in the donor wafer that may be physically aligned and may be electrically coupled or connected to the acceptor wafer. A wafer sized layer denotes a continuous layer of material or combination of materials that extends across the wafer to the full extent of the wafer edges and may be approximately uniform in thickness. If the wafer sized layer compromises dopants, then the dopant concentration may be substantially the same in the x and y direction across the wafer, but can vary in the z direction perpendicular to the wafer surface.

Figure 3A:
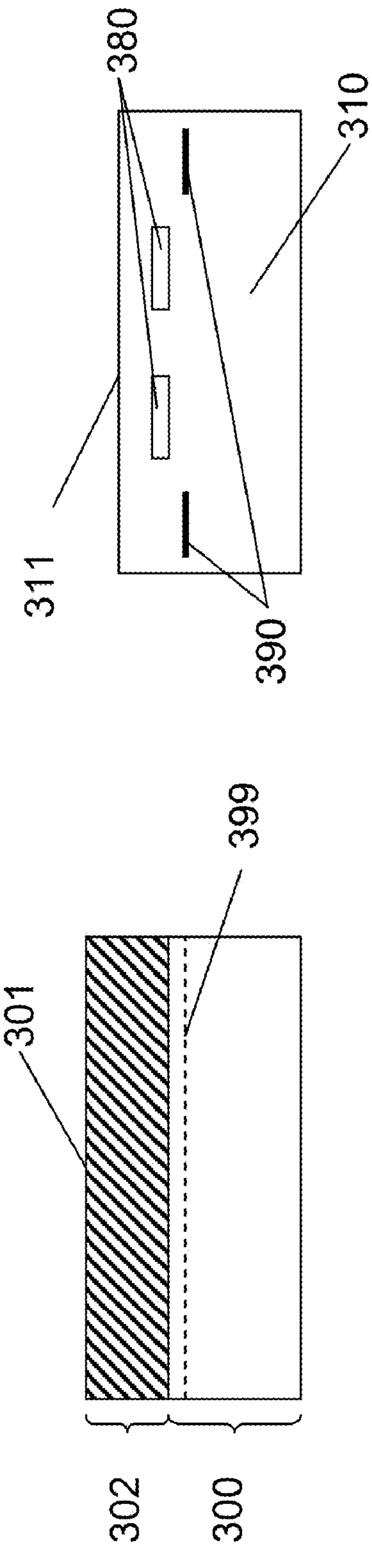
FIGS. 3A-D are exemplary drawing illustrations of a generalized layer transfer process flow.
Figure 3B:
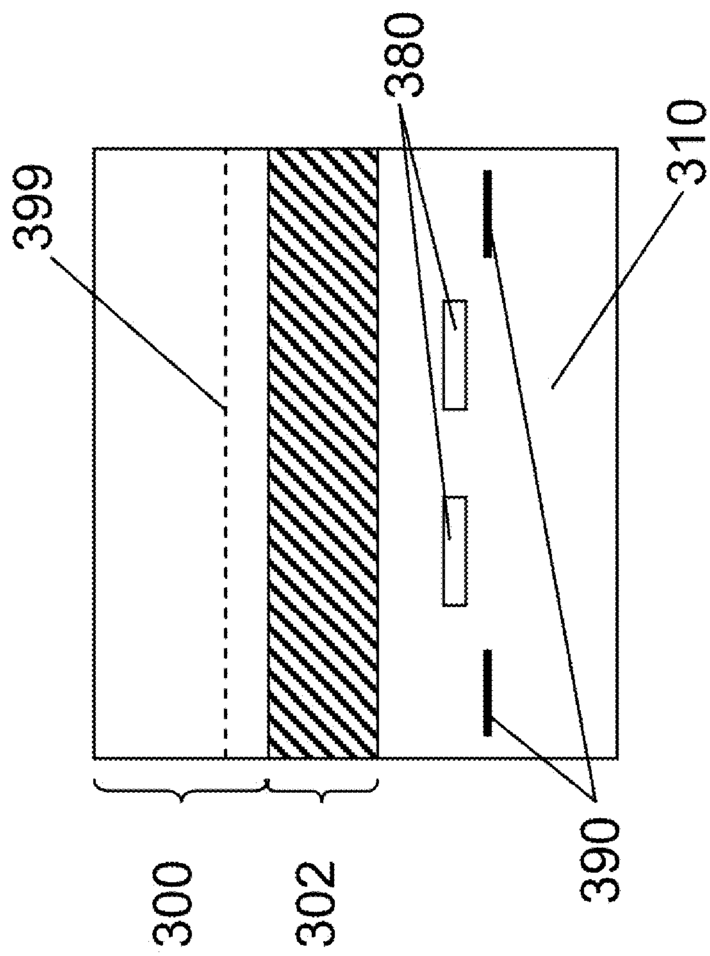

As illustrated in FIG. 3A, a generalized process flow may begin with a donor wafer 300 that is preprocessed with wafer sized layers 302 of conducting, semi-conducting or insulating materials that may be formed by deposition, ion implantation and anneal, oxidation, epitaxial growth, combinations of above, or other semiconductor processing steps and methods. The donor wafer 300 may also be preprocessed with a layer transfer demarcation plane (shown as dashed line) 399, such as, for example, a hydrogen implant cleave plane, before or after layers 302 are formed. Acceptor wafer 310 may be a preprocessed wafer that has fully functional circuitry or may be a wafer with previously transferred layers, or may be a blank carrier or holder wafer, or other kinds of substrates. Acceptor wafer 310 may have alignment marks 390 and metal connect pads or strips 380. Acceptor wafer 310 and the donor wafer 300 may be a bulk mono-crystalline silicon wafer or a Silicon On Insulator (SOI) wafer or a Germanium on Insulator (GeOI) wafer. Both bonding surfaces 301 and 311 may be prepared for wafer bonding by depositions, polishes, plasma, or wet chemistry treatments to facilitate successful wafer to wafer bonding. As illustrated in FIG. 3B, the donor wafer 300 with layers 302 and layer transfer demarcation plane 399 may then be flipped over, aligned, and bonded to the acceptor wafer 310. The acceptor wafer 310 may have alignment marks 390 and metal connect pads or strips 380.

Figure 3C:
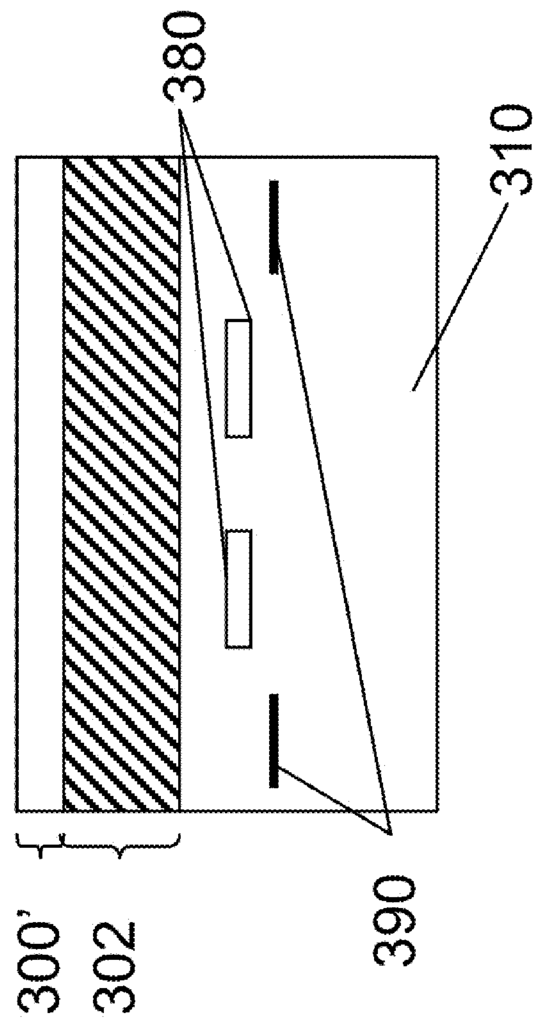

As illustrated in FIG. 3C, the donor wafer 300 may be cleaved at or thinned to the layer transfer demarcation plane 399, leaving a portion of the donor wafer 300' and the pre-processed layers 302 bonded to the acceptor wafer 310, such as, for example, ion-cut or other methods.

Figure 3D:
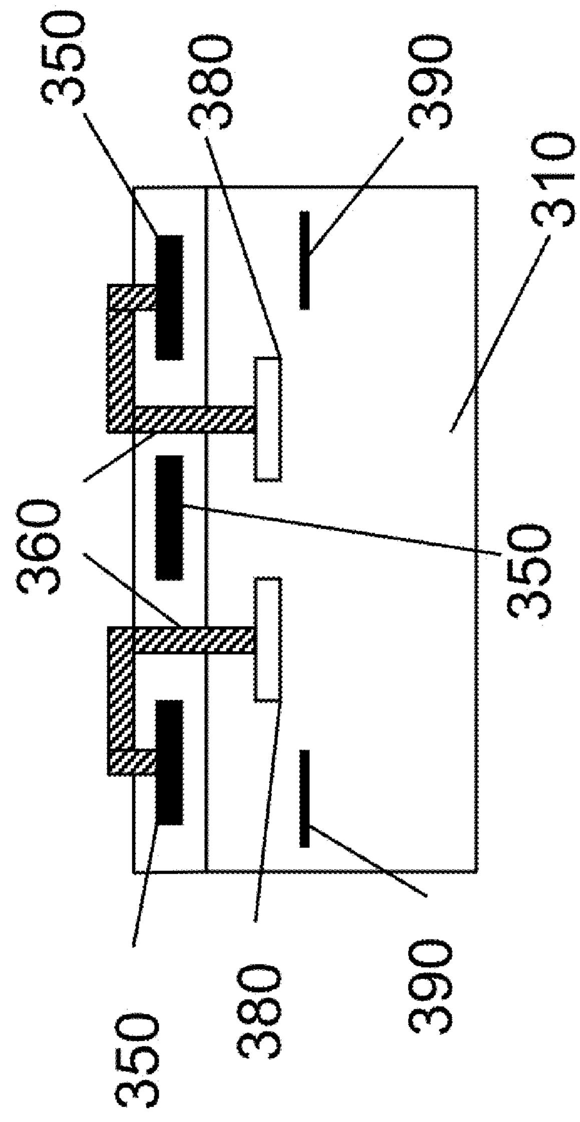

As illustrated in FIG. 3D, the remaining donor wafer portion 300' may be removed by polishing or etching and the transferred layers 302 may be further processed to create donor wafer device structures 350 that are precisely aligned to the acceptor wafer alignment marks 390. These donor wafer device structures 350 may utilize thru layer vias (TLVs) 360 to electrically couple the donor wafer device structures 350 to the acceptor wafer metal connect pads or strips 380. As the transferred layers 302 are thin, on the order of 200 nm or less in thickness, the TLVs may be easily manufactured as a normal metal to metal via may be, and said TLV may have state of the art diameters such as nanometers or tens of nanometers.

There are multiple methods by which a transistor or other devices may be formed to enable a 3D IC.

Figure 4A:
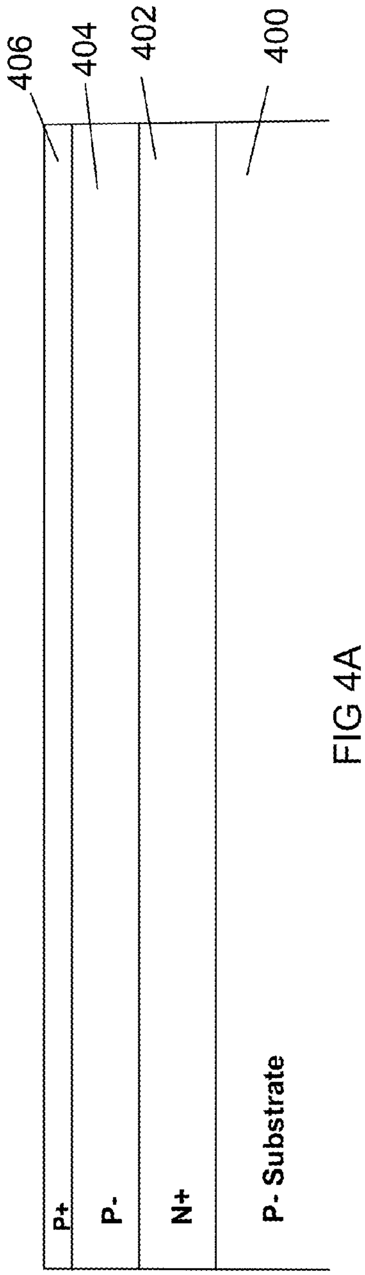
FIGS. 4A-4J are exemplary drawing illustrations of formations of top planar transistors.

A planar V-groove NMOS transistor may be formed as follows. As illustrated in FIG. 4A, a P− substrate donor wafer 400 may be processed to comprise wafer sized layers of N+ doping 402, P− doping 404, and P+ doping 406. The N+ doping layer 402 and P+ doping layer 406 may be formed by ion implantation and thermal anneal. The layer stack may alternatively be formed by successive epitaxially deposited doped silicon layers of N+ 402, P− 404, and P+ 406 or by a combination of epitaxy and implantation. The shallow P+ doped layer 406 may be doped by Plasma Assisted Doping (PLAD) techniques. In addition, P− layer 404 may have additional ion implantation and anneal processing to provide a different dopant level than P− substrate 400. P− layer 404 may also have a graded P− doping to mitigate transistor performance issues, such as, for example, short channel effects, after the NMOS transistor is formed.

Figure 4B:
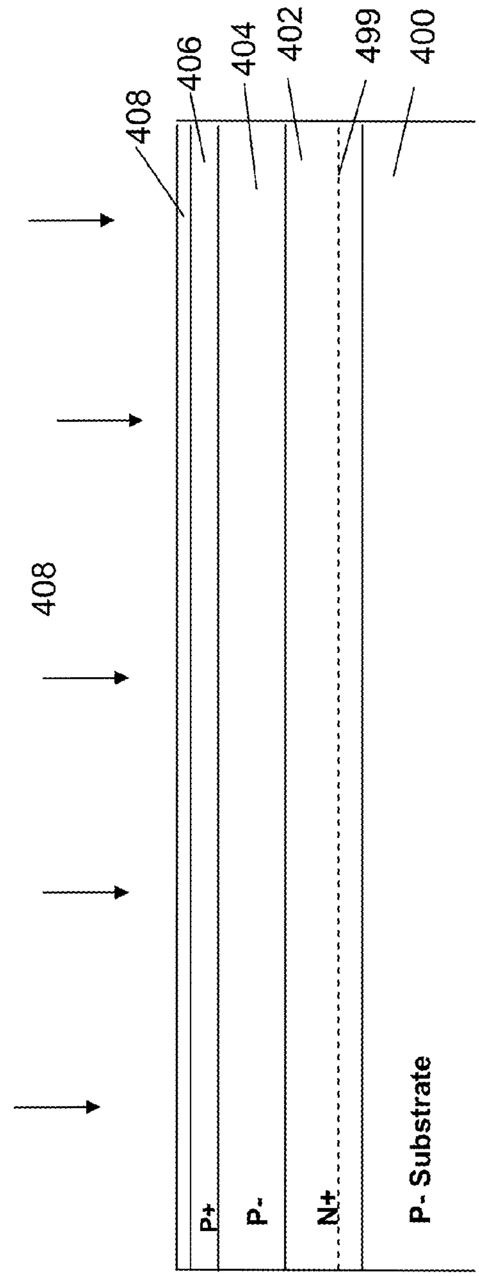

As illustrated in FIG. 4B, the top surface of donor wafer 400 may be prepared for oxide wafer bonding with a deposition of an oxide 408 or by thermal oxidation of P+ layer 406 to form oxide layer 408. A layer transfer demarcation plane (shown as dashed line) 499 may be formed by hydrogen implantation or other methods as previously described. Both the donor wafer 400 and acceptor wafer 410 may be prepared for wafer bonding as previously described and then low temperature (less than approximately 400° C.) bonded. The portion of the N+ layer 402 and the P− donor wafer substrate 400 that are above the layer transfer demarcation plane 499 may be removed by cleaving or other low temperature processes as previously described, such as, for example, ion-cut or other methods.

Figure 4C:
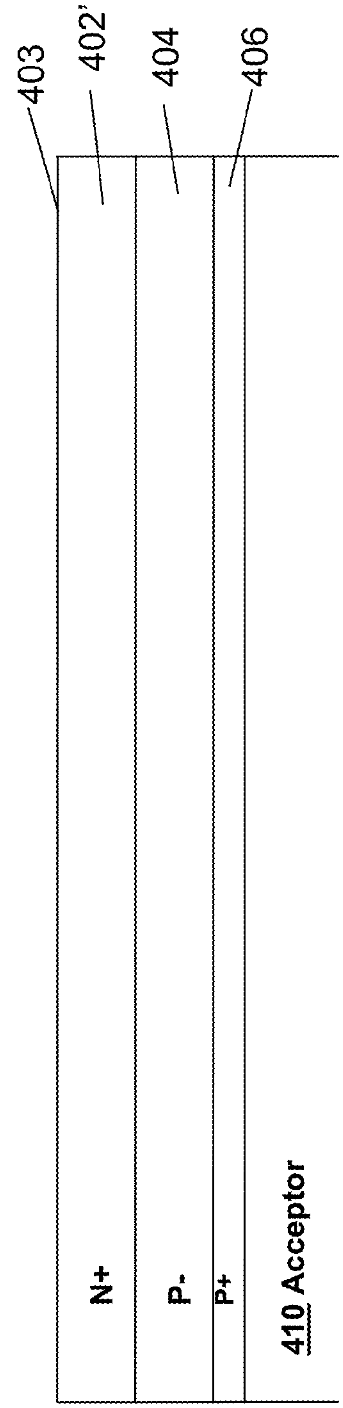

As illustrated in FIG. 4C, the P+ layer 406, P− layer 404, and remaining N+ layer 402' have been layer transferred to acceptor wafer 410. The top surface 403 of N+ layer 402' may be chemically or mechanically polished. Now transistors are formed with low temperature (less than approximately 400° C.) processing and aligned to the acceptor wafer 410 alignment marks (not shown). For illustration clarity, the oxide layers used to facilitate the wafer to wafer bond are not shown.

Figure 4D:
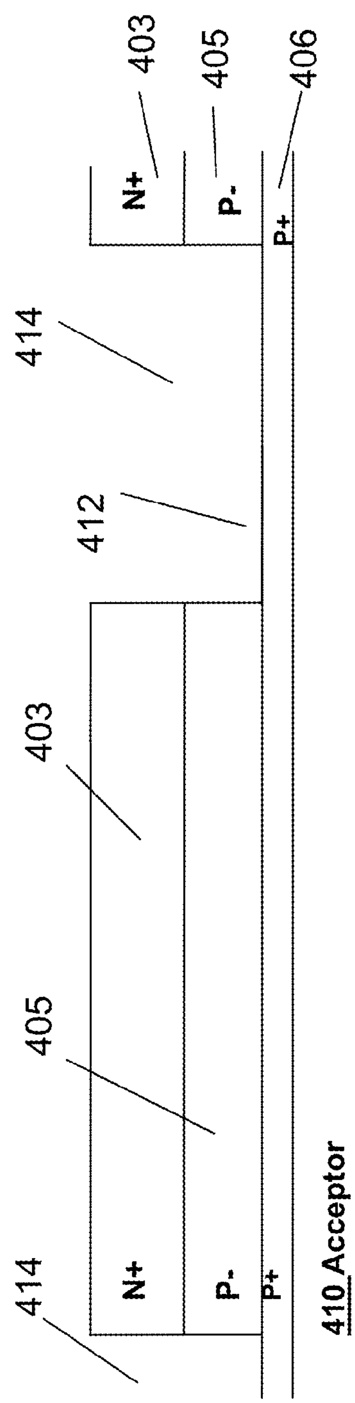

As illustrated in FIG. 4D, the substrate P+ body tie 412 contact opening and transistor isolation 414 may be soft or hard mask defined and then etched. Thus N+ 403 and P− 405 doped regions are formed.

Figure 4E:
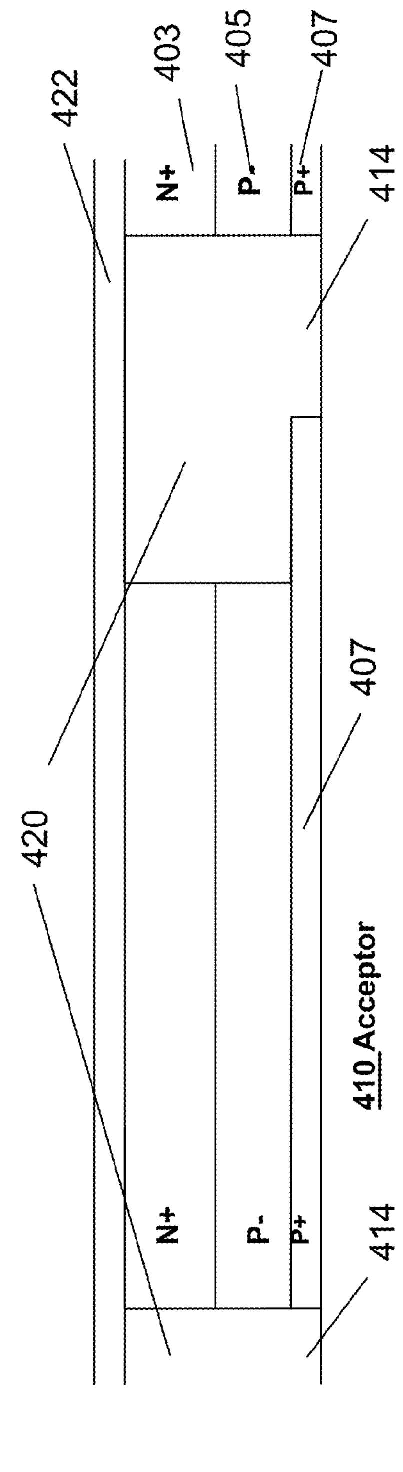

As illustrated in FIG. 4E, the transistor isolation 414 may be completed by mask defining and then etching P+ layer 406 to the top of acceptor wafer 410, forming P+ regions 407. Then a low-temperature gap fill oxide 420 may be deposited and chemically mechanically polished. A thin polish stop layer 422 such as, for example, low temperature silicon nitride may then be deposited.

Figure 4F:
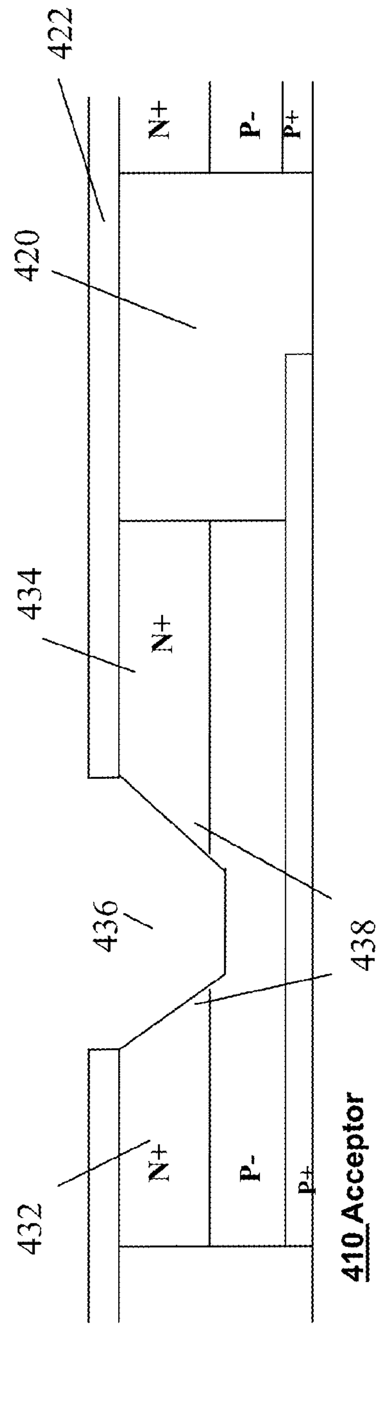

As illustrated in FIG. 4F, source 432, drain 434 and self-aligned gate 436 may be defined by masking and etching the thin polish stop layer 422 and then followed by a sloped N+ etch of N+ region 403 and may continue into P− region 405. The sloped (30-90 degrees, 45 is shown) etch or etches may be accomplished with wet chemistry or plasma or Reactive Ion Etching (RIE) techniques. This process forms angular source and drain extensions 438.

Figure 4G:
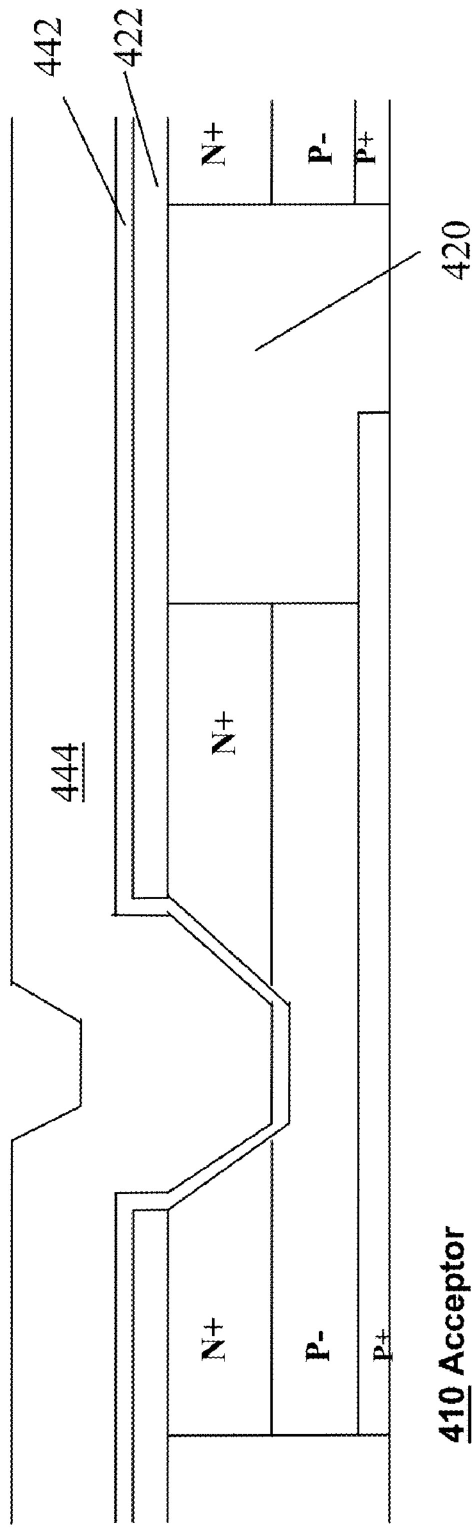

As illustrated in FIG. 4G, a gate oxide 442 may be formed and a gate metal material 444 may be deposited. The gate oxide 442 may be an atomic layer deposited (ALD) gate dielectric that is paired with a work function specific gate metal 444 in the industry standard high k metal gate process schemes described previously. Or the gate oxide 442 may be formed with a low temperature oxide deposition or low temperature microwave plasma oxidation of the silicon surfaces and then a gate material 444 such as, for example, tungsten or aluminum may be deposited.

Figure 4H:
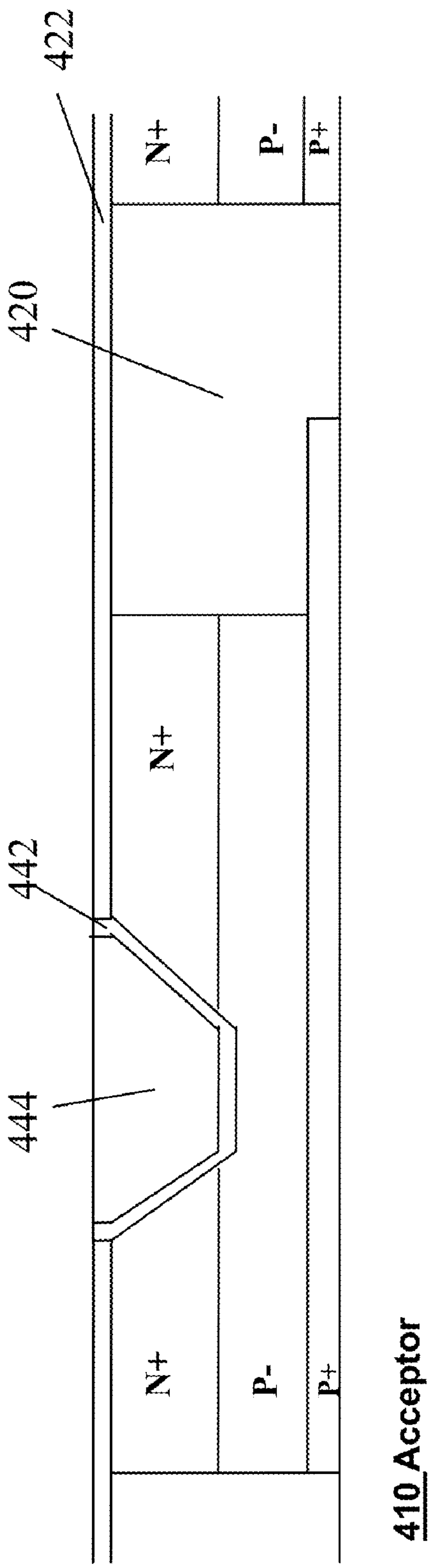

As illustrated in FIG. 4H, the gate material 444 and gate oxide 442 are chemically mechanically polished with the polish stop in the polish stop layer 422. The gate material 444 and gate oxide 442 are thus remaining in the intended V-groove. Alternatively, the gate could be defined by a photolithography masking and etching process with minimum overlaps outside the V-groove.

Figure 4I:
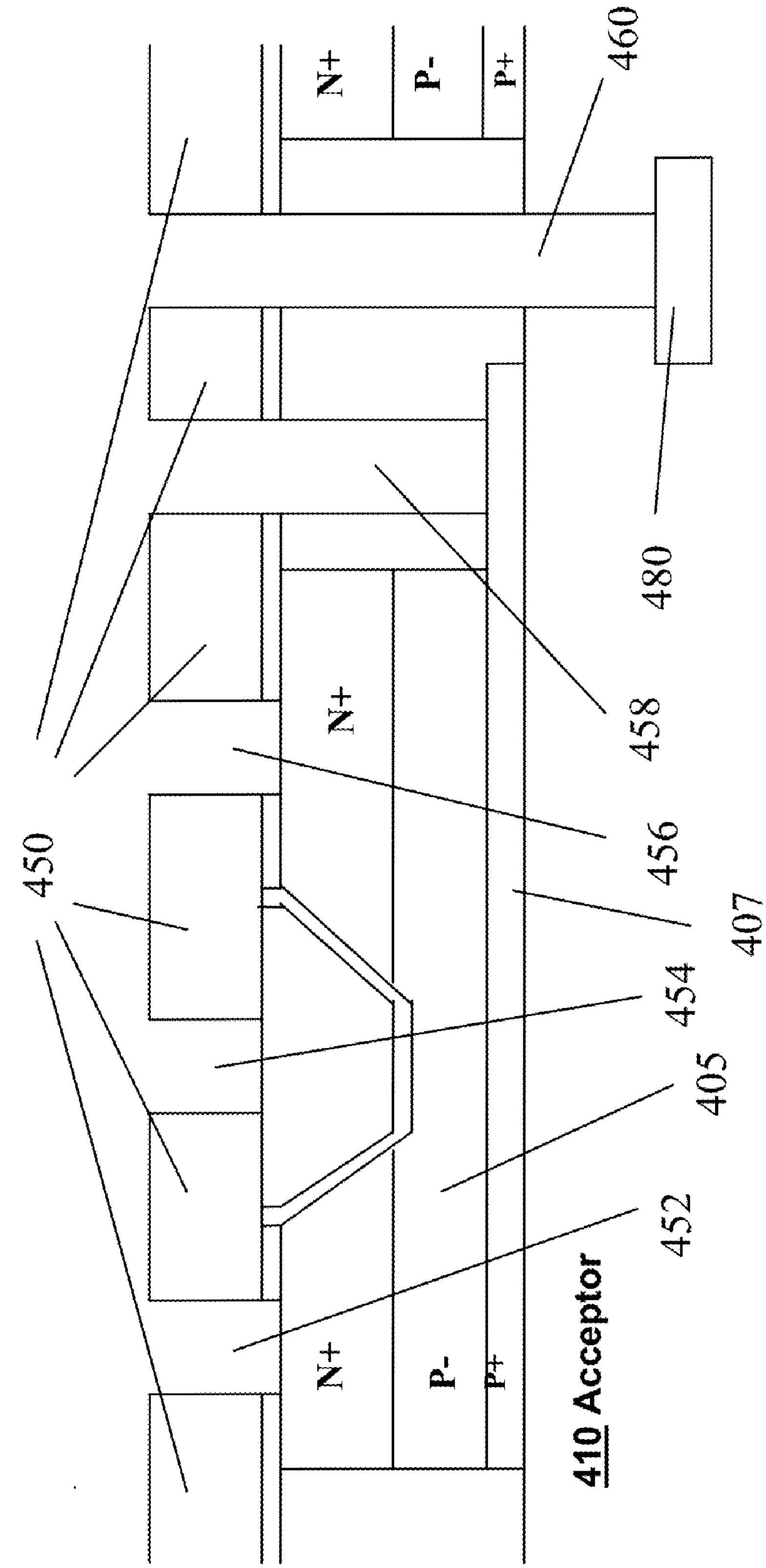

As illustrated in FIG. 4I, a low temperature thick oxide 450 is deposited and source contact 452, gate contact 454, drain contact 456, substrate P+ body tie 458, and thru layer via 460 openings are masked and etched preparing the transistors to be connected via metallization. The thru layer via 460 provides electrical coupling between the donor wafer transistors and the acceptor wafer metal connect pads 480.

A planar V-groove PMOS transistor may be constructed via the above process flow by changing the initial P− donor wafer 400 or epi-formed P− on N+ layer 402 to an N− wafer or an N− on P+ epi layer; and the N+ layer 402 to a P+ layer. Similarly, layer 406 would change from P+ to N+ if the substrate body tie option was used. Proper work function gate metals 444 would also be employed.

Additionally, a planar accumulation mode V-groove MOSFET transistor may be constructed via the above process flow by changing the initial P− donor wafer 400 or epi-formed P− on N+ layer 402 to an N− wafer or an N− epi layer on N+. Proper work function gate metals 444 would also be employed.

Figure 4J:
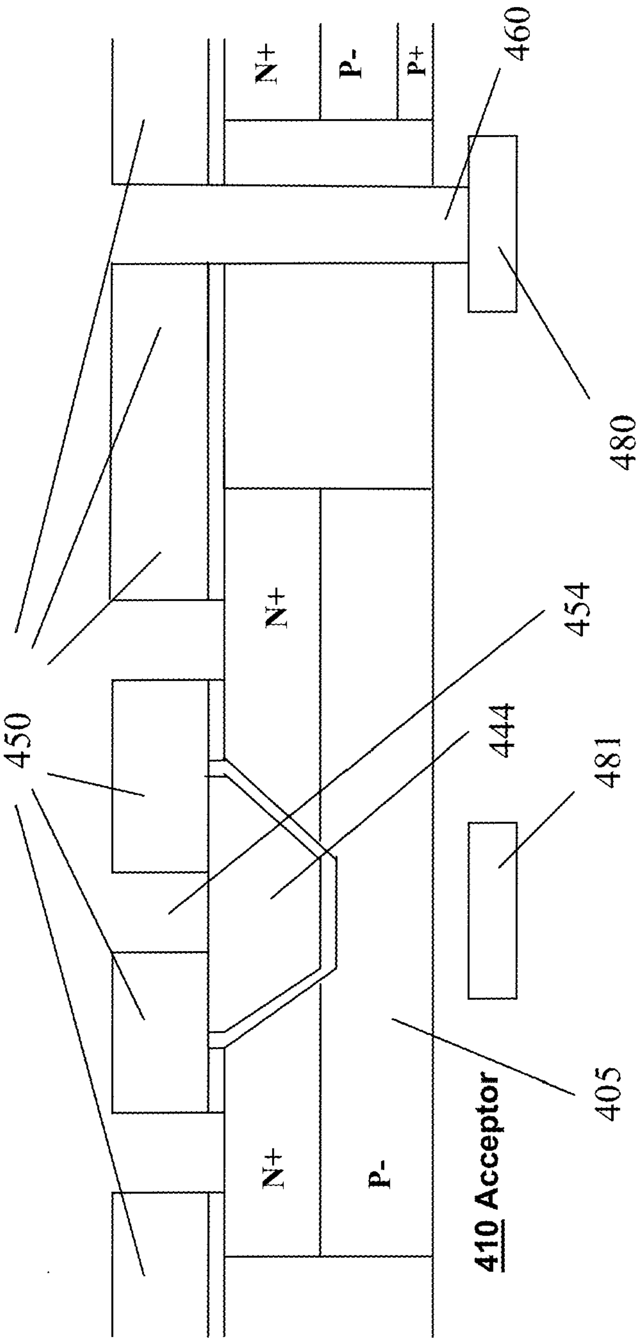

Additionally, a planar double gate V-groove MOSFET transistor may be constructed as illustrated in FIG. 4J. Acceptor wafer metal 481 may be positioned beneath the top gate 444 and electrically coupled through top gate contact 454, donor wafer metal interconnect, TLV 460 to acceptor wafer metal interconnect pads 480, which may be coupled to acceptor wafer metal 481 forming a bottom gate. The acceptor and donor wafer bonding oxides may be constructed of thin layers to allow the bottom gate 481 control over a portion of the transistor channel. Note that the P+ regions 407 and substrate P+ body tie 458 of FIG. 4I, the body tie option, is not a part of the double-gate construction illustrated in FIG. 4J.

Figure 5:
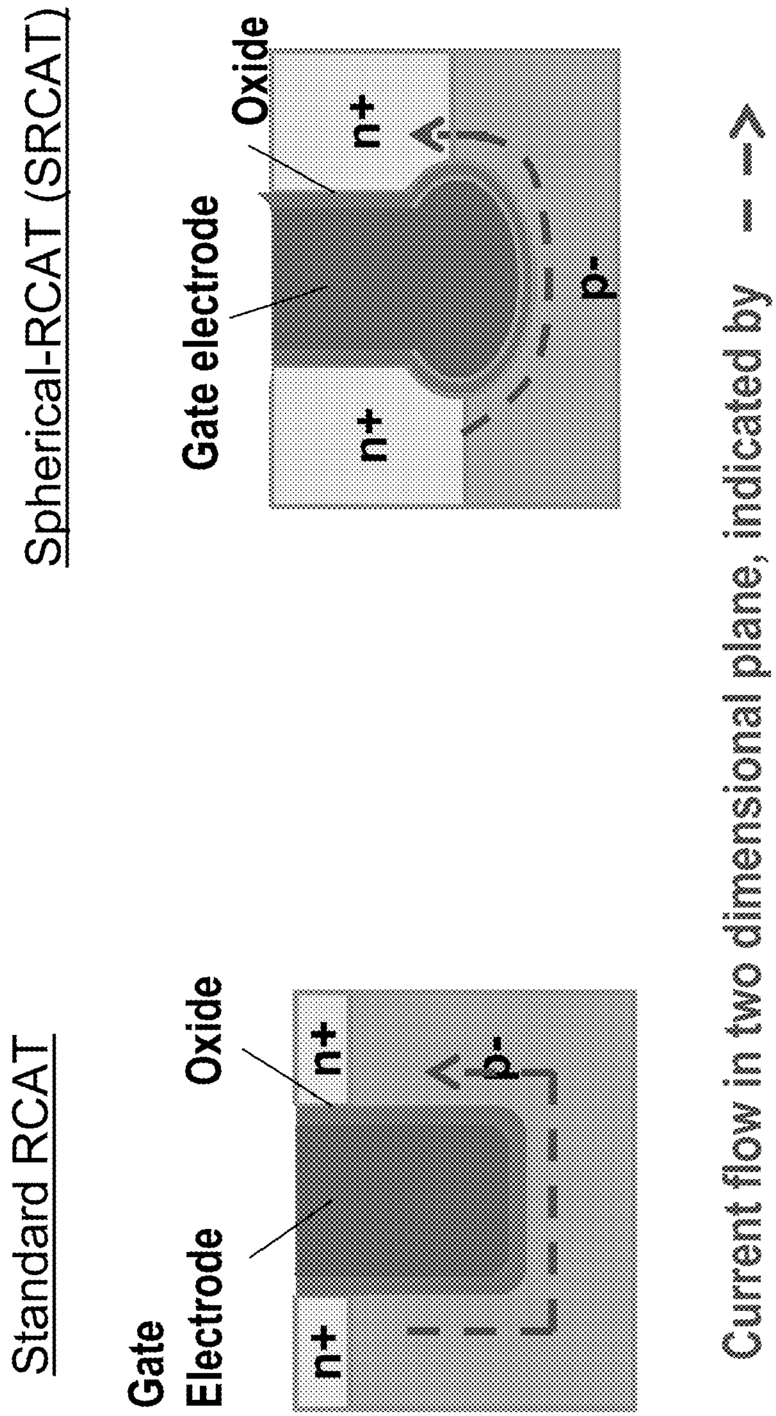
FIG. 5 are exemplary drawing illustrations of recessed channel array transistors.

Recessed Channel Array Transistors (RCATs) may be another transistor family which may utilize layer transfer and the definition-by-etch process to construct a low-temperature monolithic 3D IC. Two types of RCAT (RCAT and SRCAT) device structures are shown in FIG. 5. These were described by J. Kim, et al. at the Symposium on VLSI Technology, in 2003 and 2005. Kim, et al. teaches construction of a single layer of transistors and did not utilize any layer transfer techniques. Their work also used high-temperature processes such as, for example, source-drain activation anneals, wherein the temperatures were above 400° C.

Figure 6A:
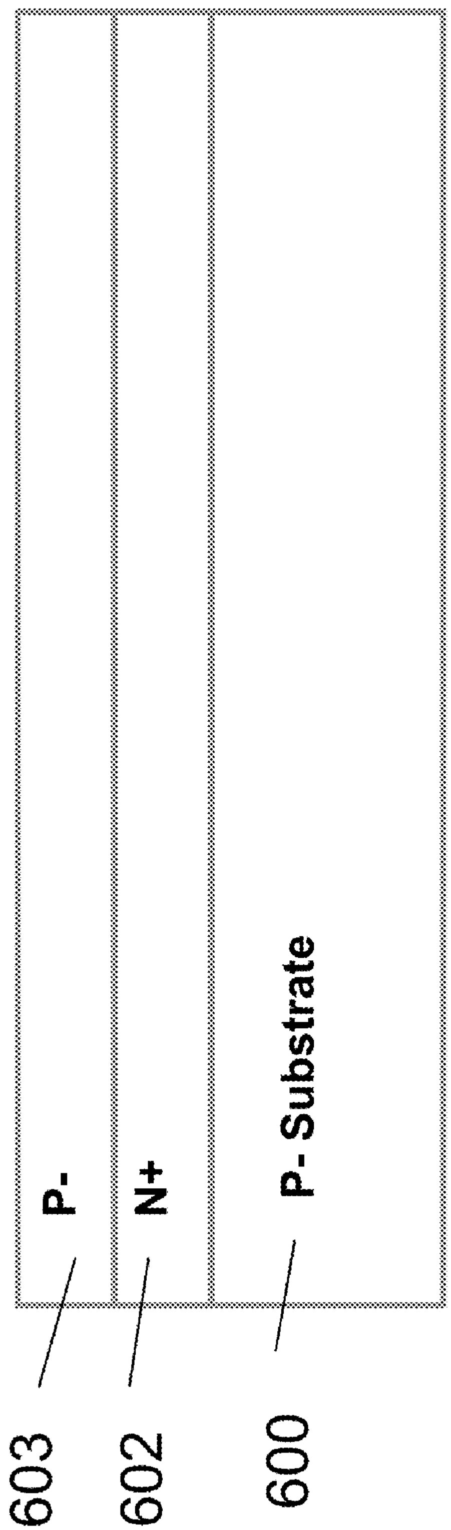
FIGS. 6A-G are exemplary drawing illustrations of formation of a recessed channel array transistor.

A planar n-channel Recessed Channel Array Transistor (RCAT) suitable for a 3D IC may be constructed as follows. As illustrated in FIG. 6A, a P− substrate donor wafer 600 may be processed to comprise wafer sized layers of N+ doping 602, and P− doping 603 across the wafer. The N+ doping layer 602 may be formed by ion implantation and thermal anneal. In addition, P− layer 603 may have additional ion implantation and anneal processing to provide a different dopant level than P− substrate 600. P-layer 603 may also have graded P− doping to mitigate transistor performance issues, such as, for example, short channel effects, after the RCAT is formed. The layer stack may alternatively be formed by successive epitaxially deposited doped silicon layers of N+ 602 and P− 603, or by a combination of epitaxy and implantation.

Figure 6B:
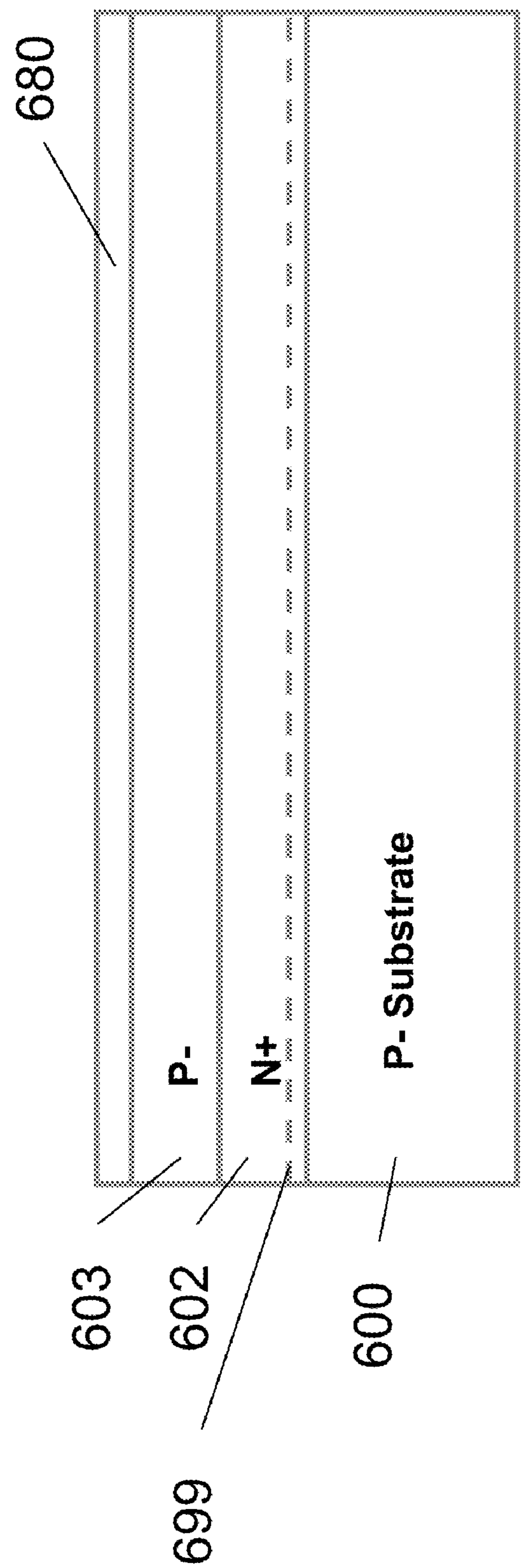

As illustrated in FIG. 6B, the top surface of donor wafer 600 may be prepared for oxide wafer bonding with a deposition of an oxide 680 or by thermal oxidation of P− layer 603 to form oxide layer 680. A layer transfer demarcation plane (shown as dashed line) 699 may be formed by hydrogen implantation or other methods as previously described. Both the donor wafer 600 and acceptor wafer 610 may be prepared for wafer bonding as previously described and then low temperature (less than approximately 400° C.) bonded. The portion of the N+ layer 602 and the P− donor wafer substrate 600 that are above the layer transfer demarcation plane 699 may be removed by cleaving or other low temperature processes as previously described, such as, for example, ion-cut or other methods.

Figure 6C:
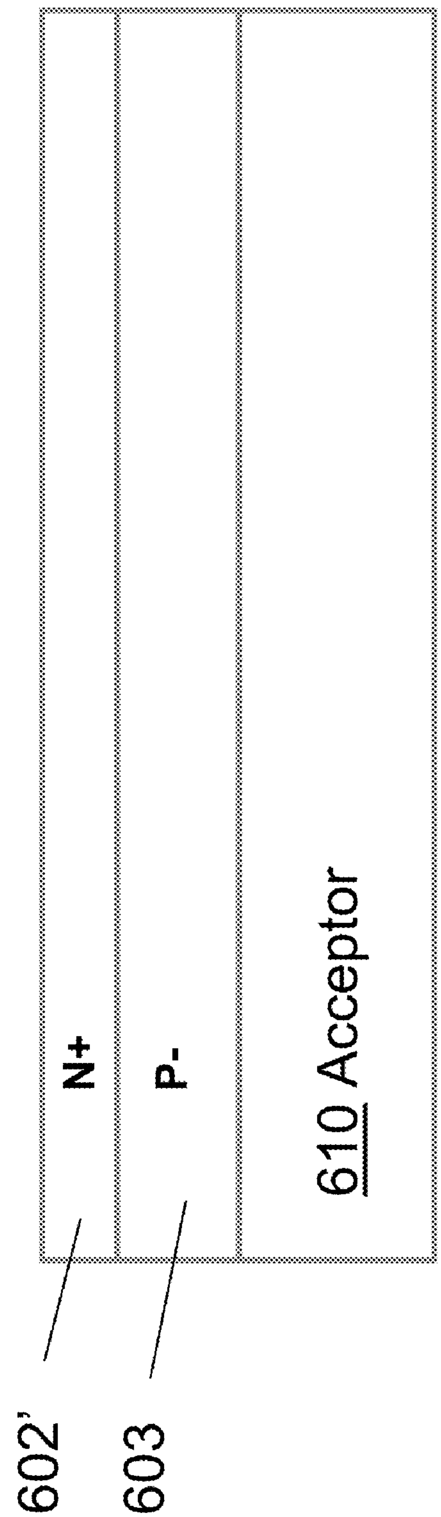

As illustrated in FIG. 6C, P− layer 603, and remaining N+ layer 602' have been layer transferred to acceptor wafer 610. The top surface of N+ layer 602' may be chemically or mechanically polished. Now transistors are formed with low temperature (less than approximately 400° C.) processing and aligned to the acceptor wafer 610 alignment marks (not shown). For illustration clarity, the oxide layers used to facilitate the wafer to wafer bond are not shown.

Figure 6D:
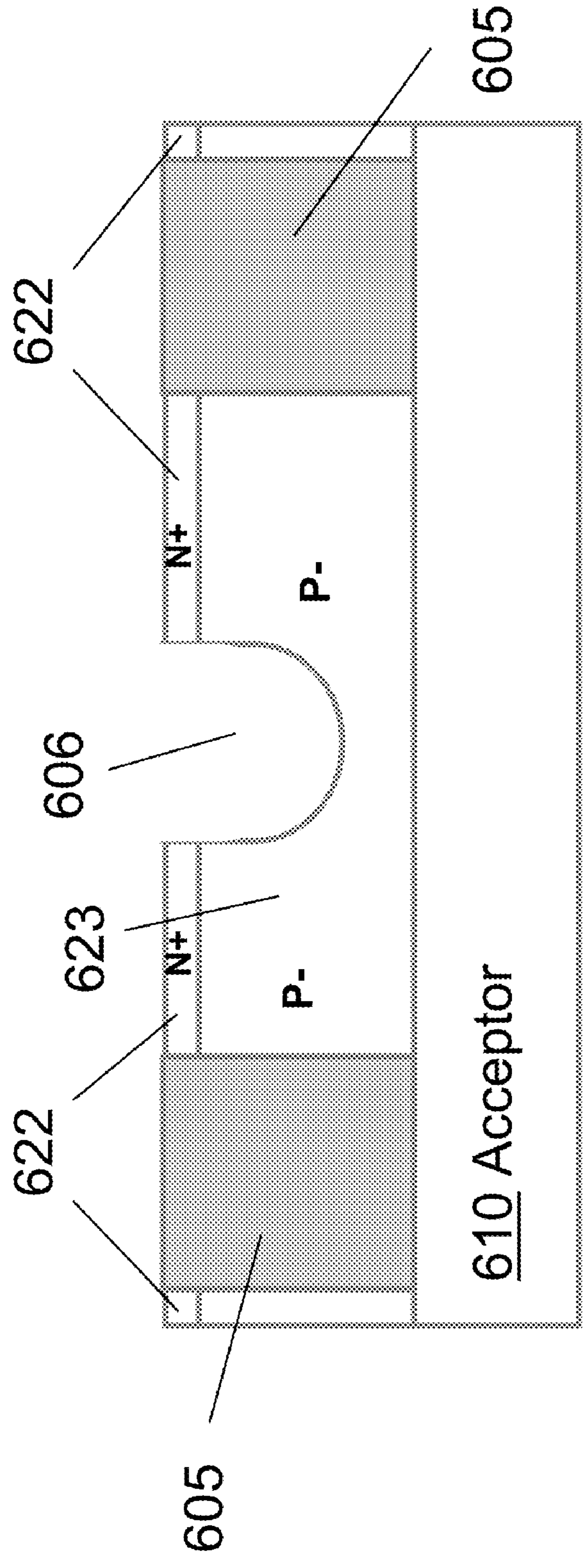

As illustrated in FIG. 6D, the transistor isolation regions 605 may be formed by mask defining and then etching N+ layer 602' and P− layer 603 to the top of acceptor wafer 610. Then a low-temperature gap fill oxide may be deposited and chemically mechanically polished, the oxide remaining in isolation regions 605. Then the recessed channel 606 may be mask defined and etched. The recessed channel surfaces and edges may be smoothed by wet chemical or plasma/RIE etching techniques to mitigate high field effects. These process steps form N+ source and drain regions 622 and P− channel region 623.

Figure 6E:
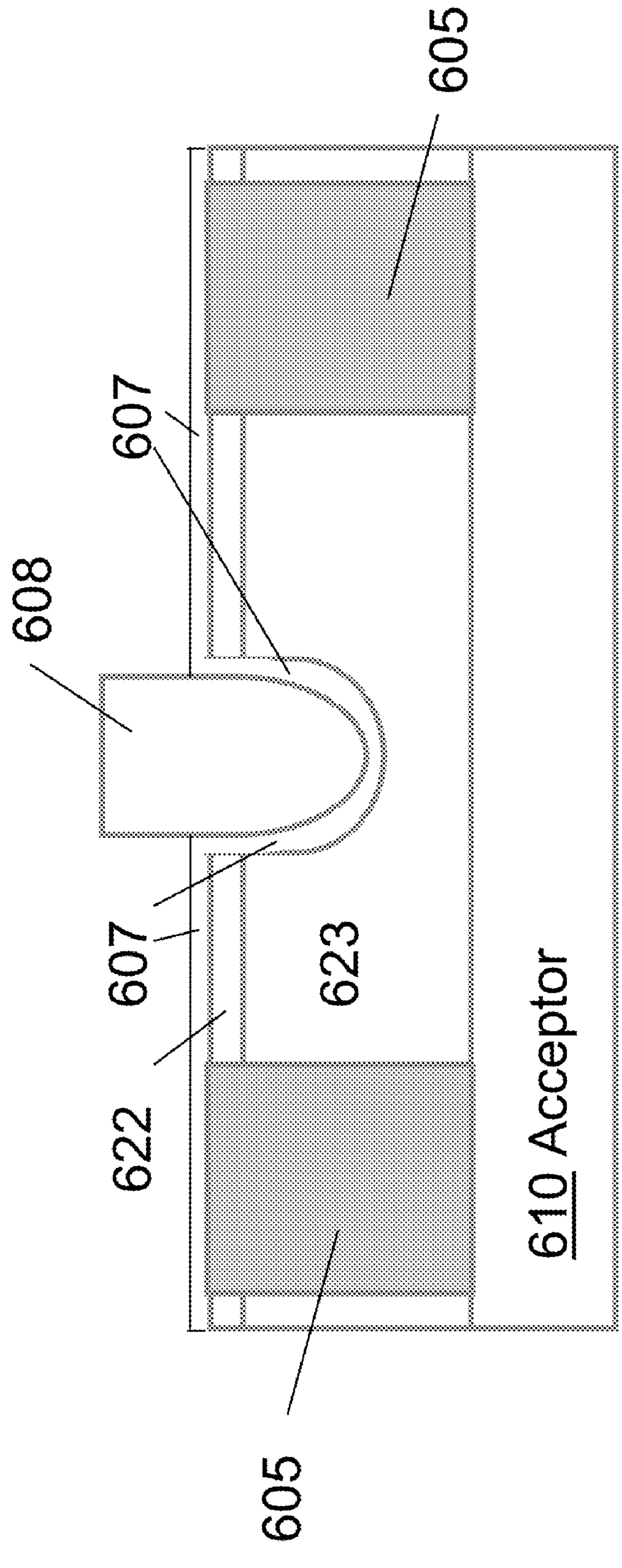

As illustrated in FIG. 6E, a gate oxide 607 may be formed and a gate metal material 608 may be deposited. The gate oxide 607 may be an atomic layer deposited (ALD) gate dielectric that is paired with a work function specific gate metal 608 in the industry standard high k metal gate process schemes described previously. Or the gate oxide 607 may be formed with a low temperature oxide deposition or low temperature microwave plasma oxidation of the silicon surfaces and then a gate material 608 such as, for example, tungsten or aluminum may be deposited. Then the gate material 608 may be chemically mechanically polished, and the gate area defined by masking and etching.

Figure 6F:
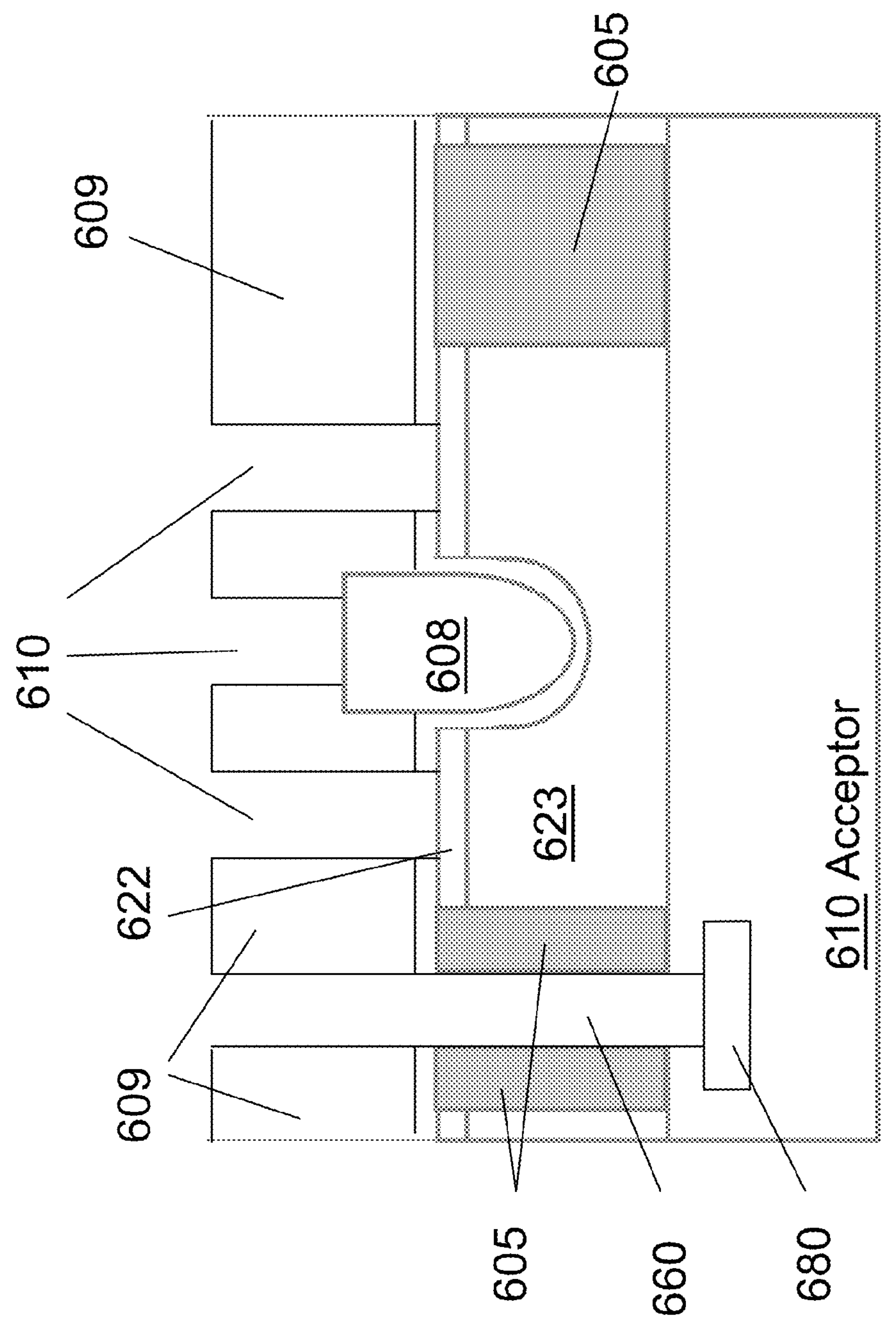

As illustrated in FIG. 6F, a low temperature thick oxide 609 is deposited and source, gate, and drain contacts 615, and thru layer via 660 openings are masked and etched preparing the transistors to be connected via metallization. The thru layer via 660 provides electrical coupling between the donor wafer transistors and the acceptor wafer metal connect pads 680.

A planar PMOS RCAT transistor may be constructed via the above process flow by changing the initial P− donor wafer 600 or epi-formed P− on N+ layer 603 to an N− wafer or an N− on P+ epi layer; and the N+ layer 602 to a P+ layer. Proper work function gate metals 608 would also be employed.

Additionally, a planar accumulation mode RCAT transistor may be constructed via the above process flow by changing the initial P− donor wafer 600 or epi-formed P− on N+ layer 603 to an N− wafer or an N− epi layer on N+. Proper work function gate metals 608 would also be employed.

Figure 6G:
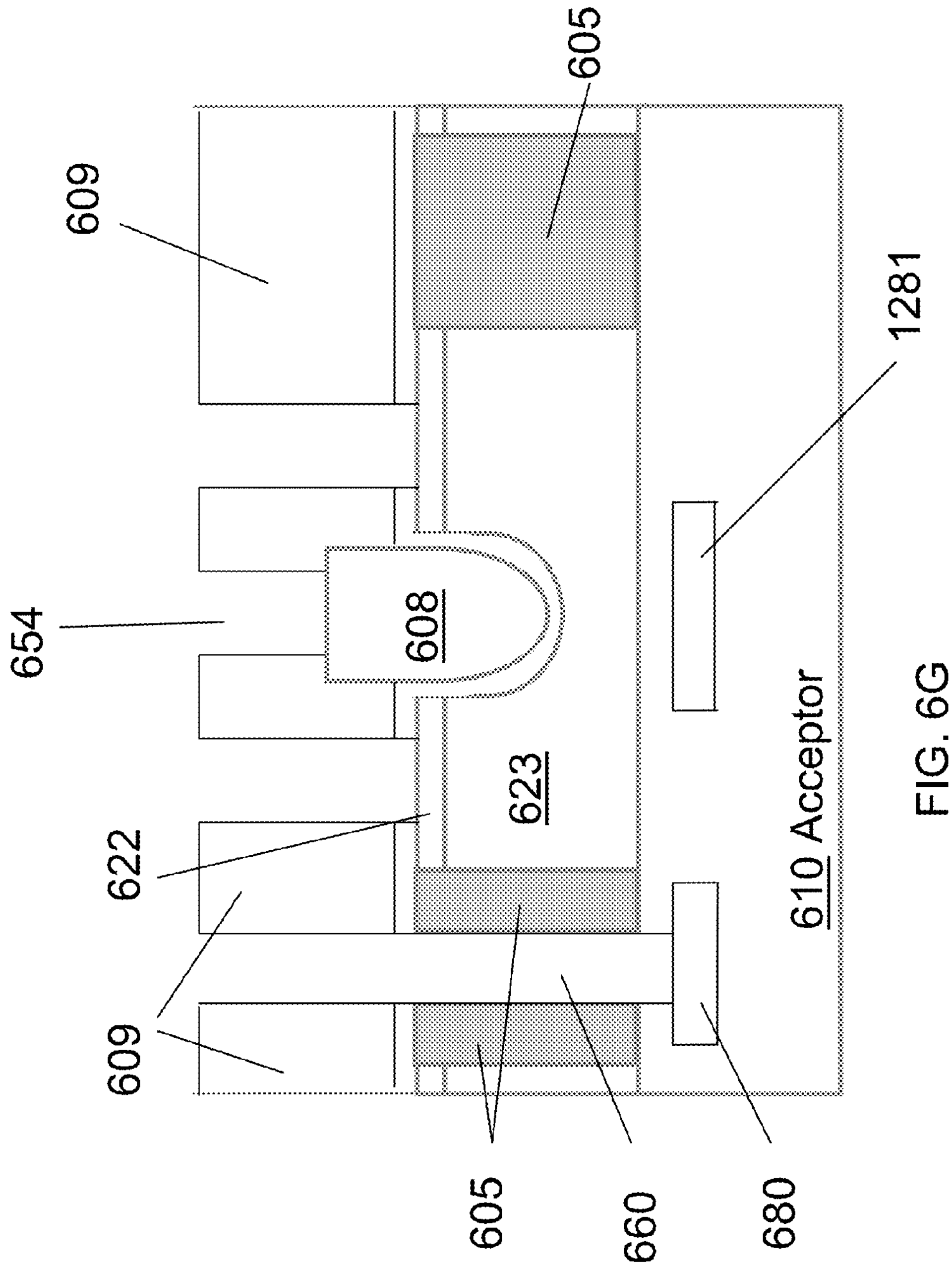
Figure 7A:
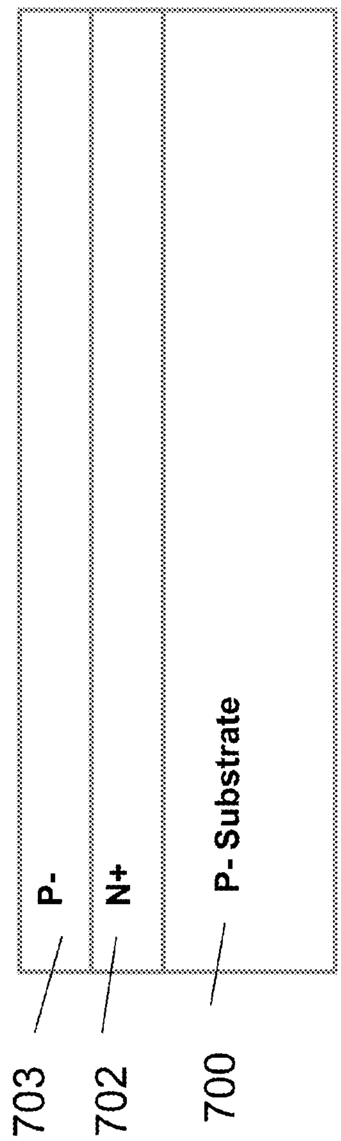
FIGS. 7A-G are exemplary drawing illustrations of formation of a spherical recessed channel array transistor.

Additionally, a planar partial double gate RCAT transistor may be constructed as illustrated in FIG. 6G. Acceptor wafer metal 681 may be positioned beneath the top gate 608 and electrically coupled through the top gate contact 654, donor wafer metal interconnect, TLV 660 to acceptor wafer metal interconnect pads 680, which may be coupled to acceptor wafer metal 681 forming a bottom gate. The acceptor and donor wafer bonding oxides may be constructed of thin layers to allow bottom gate 681 control over a portion of the transistor channel. A planar n-channel Spherical Recessed Channel Array Transistor (S-RCAT) may be constructed as follows. As illustrated in FIG. 7A, a P− substrate donor wafer 700 may be processed to comprise wafer sized layers of N+ doping 702, and P− doping 703. The N+ doping layer 702 may be formed by ion implantation and thermal anneal. In addition, P− layer 703 may have additional ion implantation and anneal processing to provide a different dopant level than P− substrate 700. P-layer 703 may also have graded P− doping to mitigate transistor performance issues, such as, for example, short channel effects, after the S-RCAT is formed. The layer stack may alternatively be formed by successive epitaxially deposited doped silicon layers of N+ 702 and P− 703, or by a combination of epitaxy and implantation.

Figure 7B:
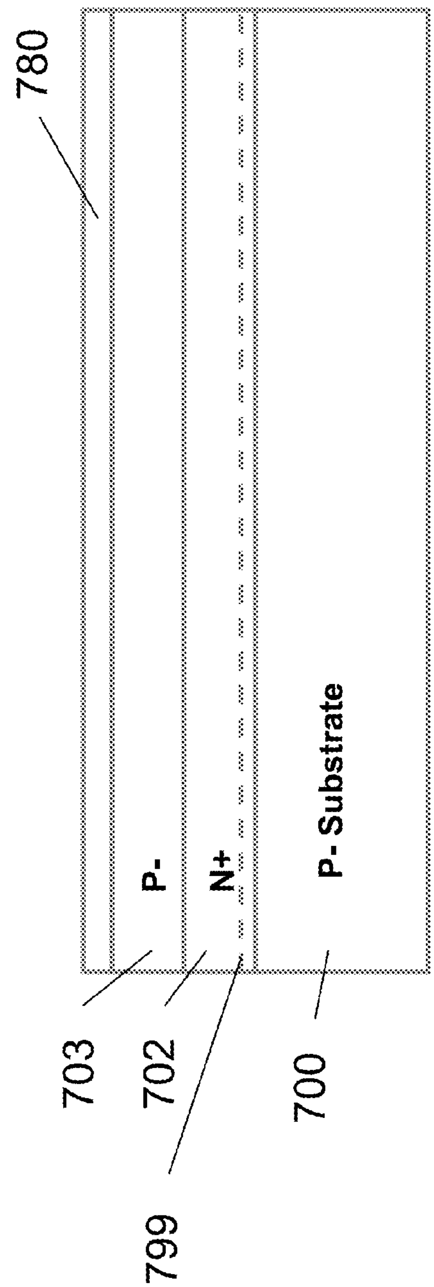

As illustrated in FIG. 7B, the top surface of donor wafer 700 may be prepared for oxide wafer bonding with a deposition of an oxide 780 or by thermal oxidation of P− layer 703 to form oxide layer 780. A layer transfer demarcation plane (shown as a dashed line) 799 may be formed by hydrogen implantation or other methods as previously described. Both the donor wafer 700 and acceptor wafer 710 may be prepared for wafer bonding as previously described and then low temperature (less than approximately 400° C.) bonded. The portion of the N+ layer 702 and the P− donor wafer substrate 700 that are above the layer transfer demarcation plane 799 may be removed by cleaving or other low temperature processes as previously described, such as, for example, ion-cut or other methods.

Figure 7C:
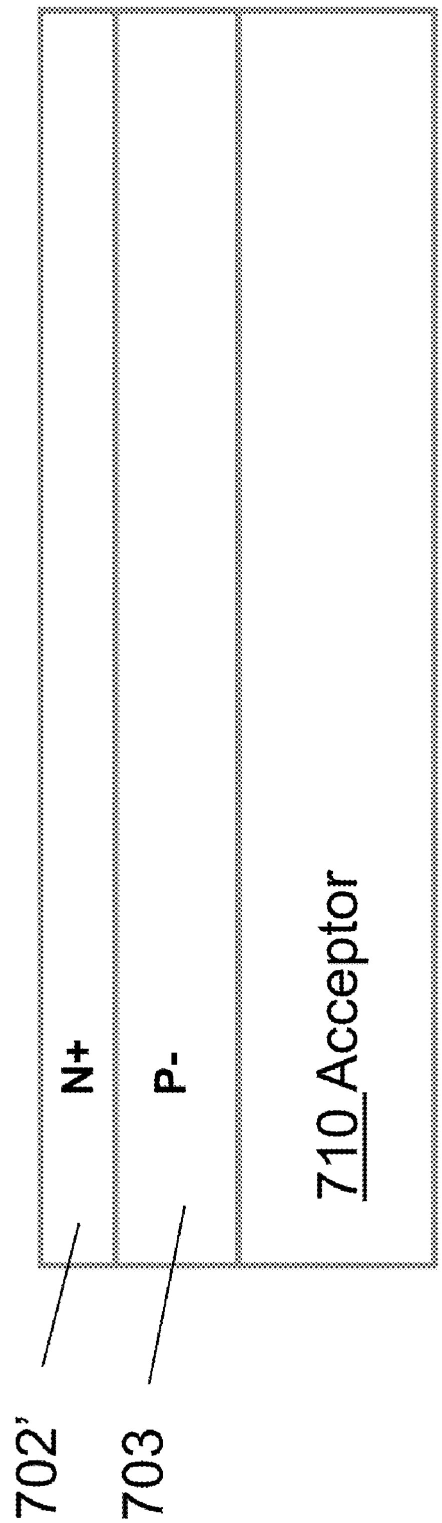

As illustrated in FIG. 7C, P− layer 703, and remaining N+ layer 702' have been layer transferred to acceptor wafer 710. The top surface of N+ layer 702' may be chemically or mechanically polished. Now transistors are formed with low temperature (less than approximately 400° C.) processing and aligned to the acceptor wafer 710 alignment marks (not shown). For illustration clarity, the oxide layers used to facilitate the wafer to wafer bond are not shown.

Figure 7D:
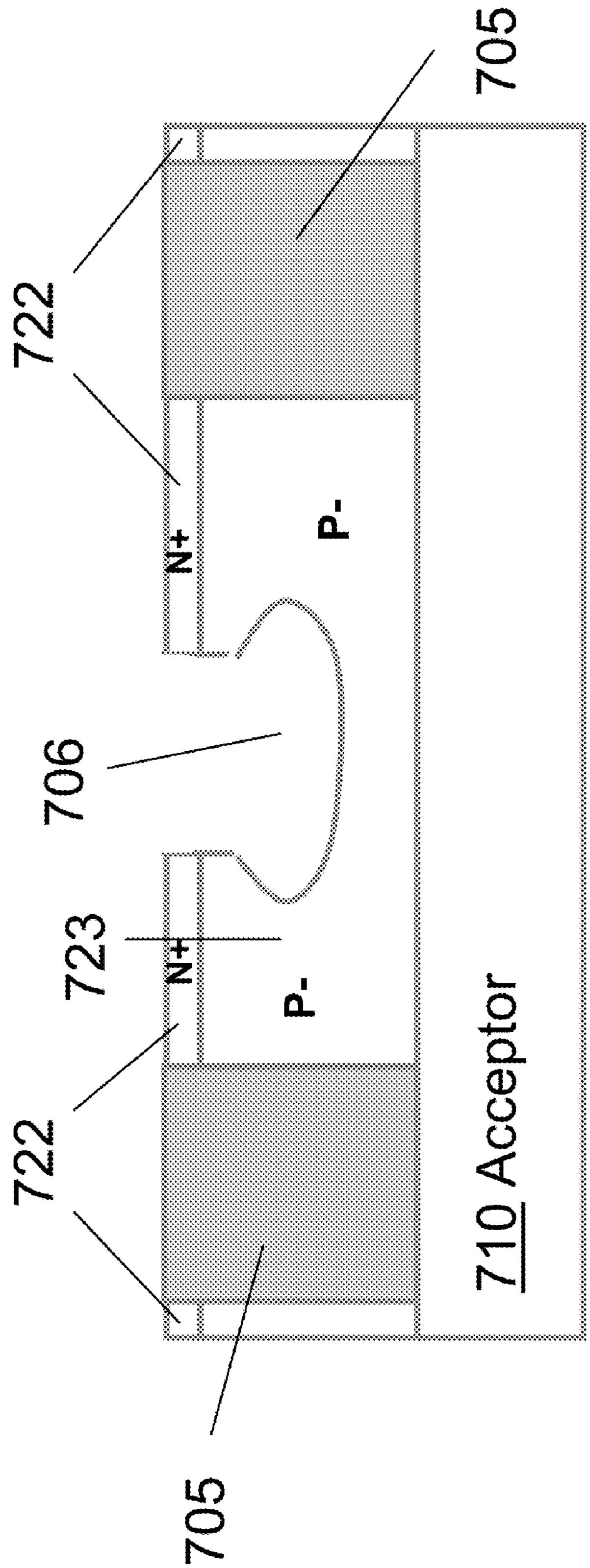

As illustrated in FIG. 7D, the transistor isolation areas 705 may be formed by mask defining and then etching N+ layer 702' and P− layer 703 to the top of acceptor wafer 710. Then a low-temperature gap fill oxide may be deposited and chemically mechanically polished, remaining in isolation areas 705. Then the spherical recessed channel 706 may be mask defined and etched in at least four etching steps (not shown). In the first step, the eventual gate electrode recessed channel may be partially etched, and a spacer deposition may be performed with a conformal low temperature deposition such as, for example, silicon oxide or silicon nitride or a combination.

Figure 7E:
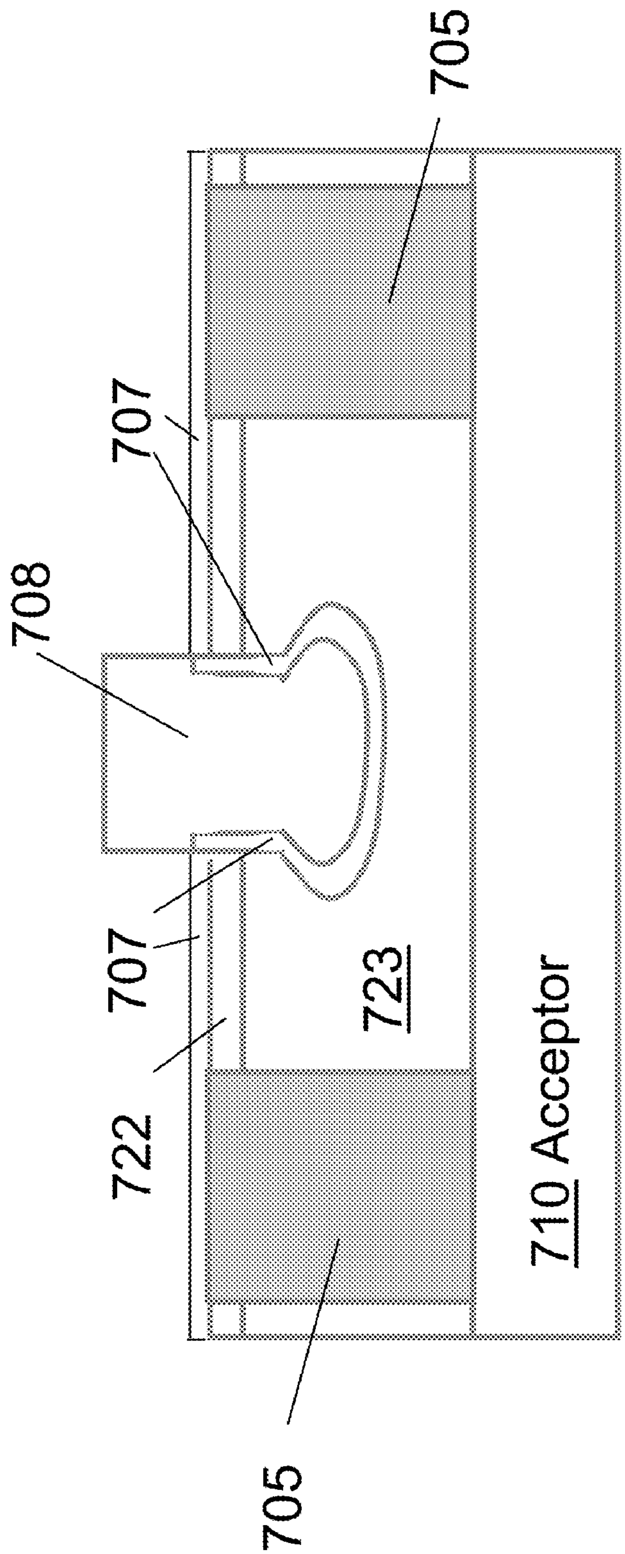

In the second step, an anisotropic etch of the spacer may be performed to leave the spacer material only on the vertical sidewalls of the recessed gate channel opening. In the third step, an isotropic silicon etch may be conducted to form the spherical recess 706. In the fourth step, the spacer on the sidewall may be removed with a selective etch. The recessed channel surfaces and edges may be smoothed by wet chemical or plasma/RIE etching techniques to mitigate high field effects. These process steps form N+ source and drain regions 722 and P− channel region 723. As illustrated in FIG. 7E, a gate oxide 707 may be formed and a gate metal material 708 may be deposited. The gate oxide 707 may be an atomic layer deposited (ALD) gate dielectric that is paired with a work function specific gate metal 708 in the industry standard high k metal gate process schemes described previously. Or the gate oxide 707 may be formed with a low temperature oxide deposition or low temperature microwave plasma oxidation of the silicon surfaces and then a gate material 708 such as, for example, tungsten or aluminum may be deposited. Then the gate material 708 may be chemically mechanically polished, and the gate area defined by masking and etching.

Figure 7F:
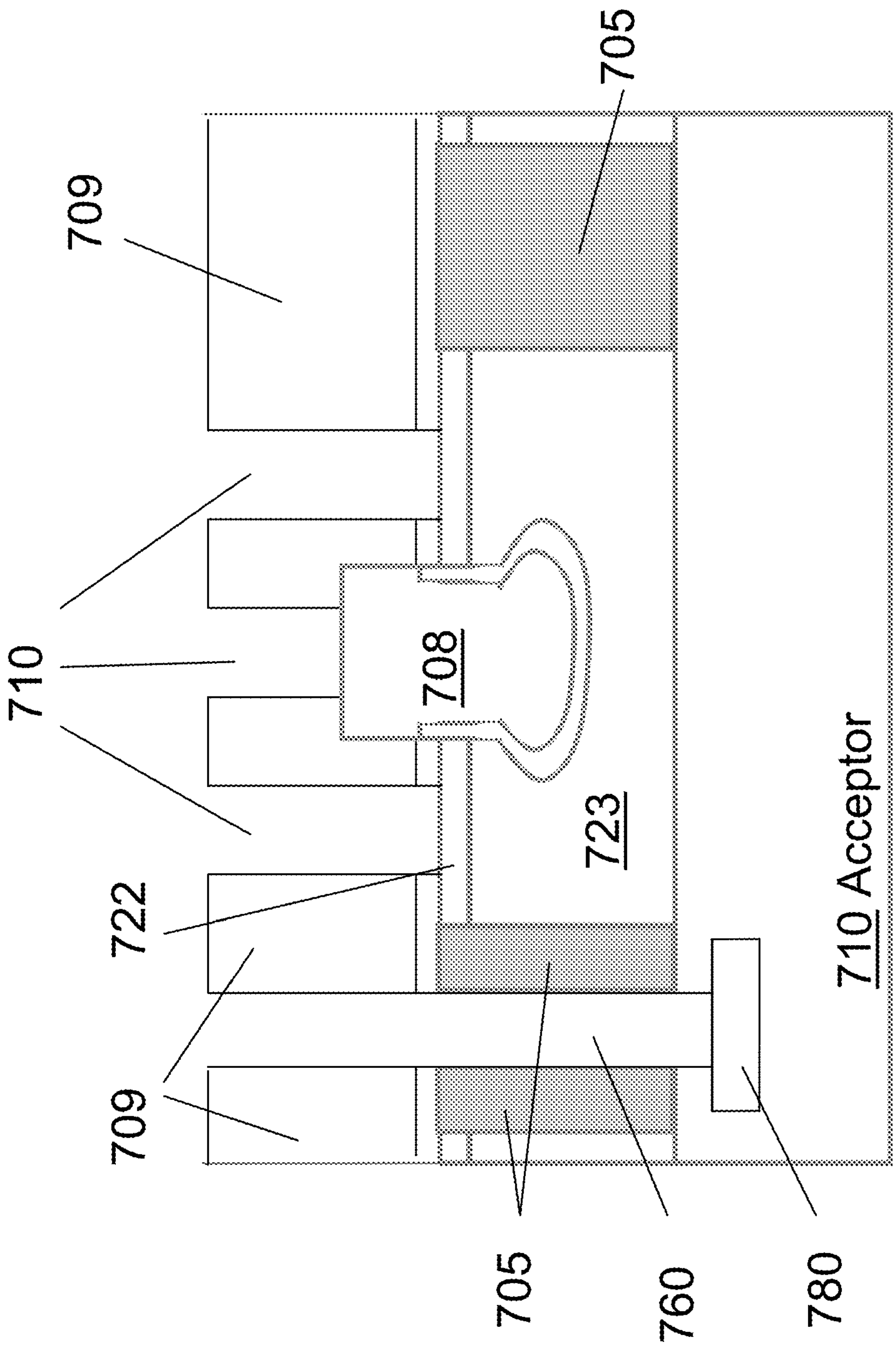

As illustrated in FIG. 7F, a low temperature thick oxide 709 is deposited and source, gate, and drain contacts 715, and thru layer vias 760 are masked and etched preparing the transistors to be connected. The thru layer via 760 provides electrical coupling between the donor wafer transistors or signal wiring and the acceptor wafer metal connect pads 780.

A planar PMOS S-RCAT transistor may be constructed via the above process flow by changing the initial P− donor wafer 700 or epi-formed P− on N+ layer 703 to an N− wafer or an N− on P+ epi layer; and the N+ layer 702 to a P+ layer. Proper work function gate metals 708 would also be employed.

Additionally, a planar accumulation mode S-RCAT transistor may be constructed via the above process flow by changing the initial P− donor wafer 700 or epi-formed P− on N+ layer 703 to an N− wafer or an N− epi layer on N+. Proper work function gate metals 708 would also be employed.

Figure 7G:
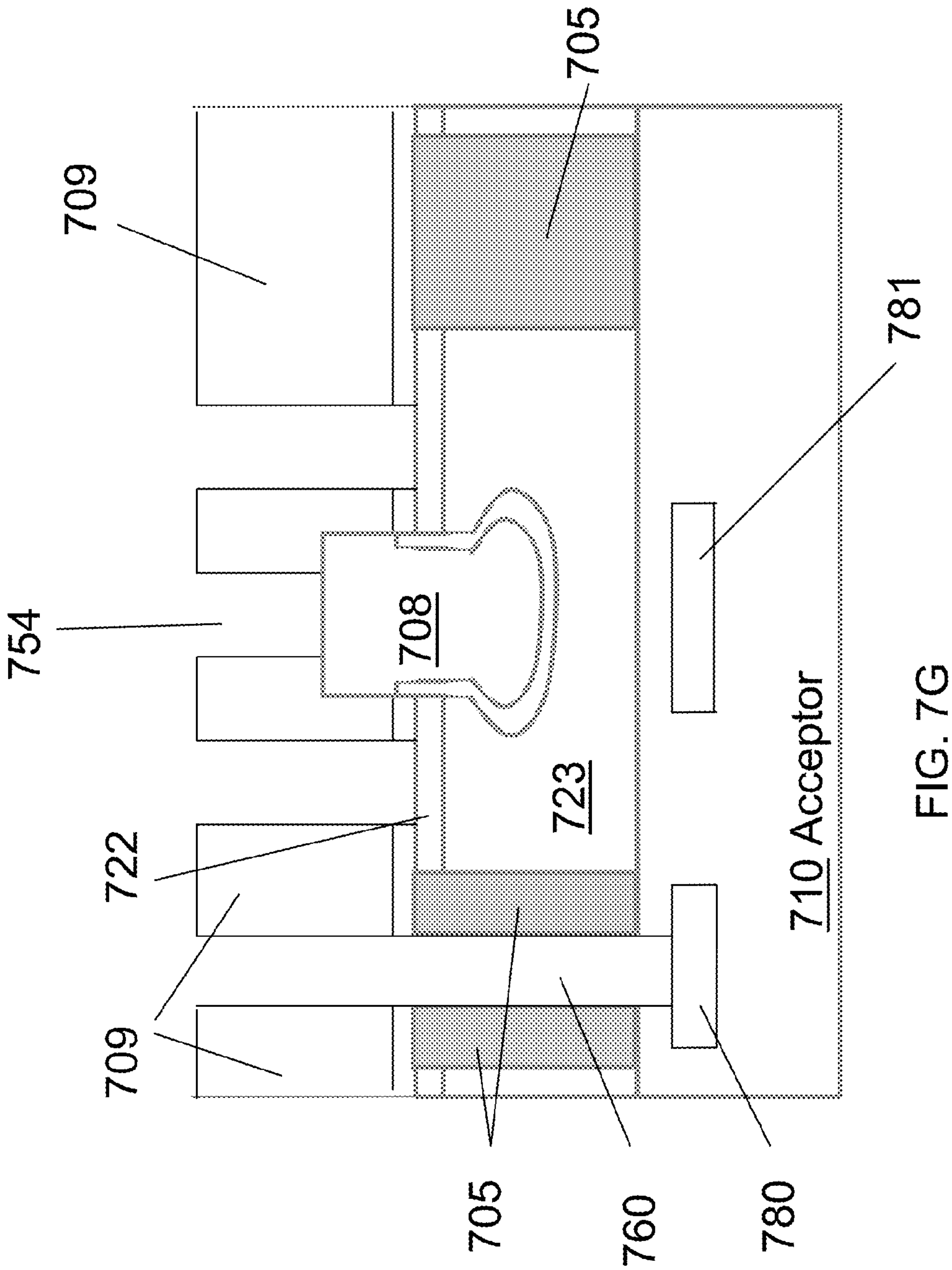

Additionally, a planar partial double gate S-RCAT transistor may be constructed as illustrated in FIG. 7G. Acceptor wafer metal 781 may be positioned beneath the top gate 708 and electrically coupled through the top gate contact 754, donor wafer metal interconnect, TLV 760 to acceptor wafer metal interconnect pads 780, which may be coupled to acceptor wafer metal 781 forming a bottom gate. The acceptor and donor wafer bonding oxides may be constructed of thin layers to allow bottom gate 781 control over a portion of the transistor channel.

SRAM, DRAM or other memory circuits may be constructed with RCAT or S-RCAT devices and may have different trench depths compared to logic circuits. The RCAT and S-RCAT devices may be utilized to form BiCMOS inverters and other mixed circuitry when the acceptor wafer comprises conventional Bipolar Junction Transistors and the transferred layer or layers may be utilized to form the RCAT devices.

Junction-less Transistors (JLTs) comprise another transistor family that may utilize layer transfer and etch definition to construct a low-temperature monolithic 3D IC. The junction-less transistor structure avoids the increasingly sharply graded junctions necessary for sufficient separation between source and drain regions as silicon technology scales. This allows the JLT to have a thicker gate oxide than a conventional MOSFET for an equivalent performance. The junction-less transistor is also known as a nanowire transistor without junctions, or gated resistor, or nanowire transistor as described in a paper by Jean-Pierre Colinge, et. al., (Colinge) published in Nature Nanotechnology on Feb. 21, 2010.

Figure 8:
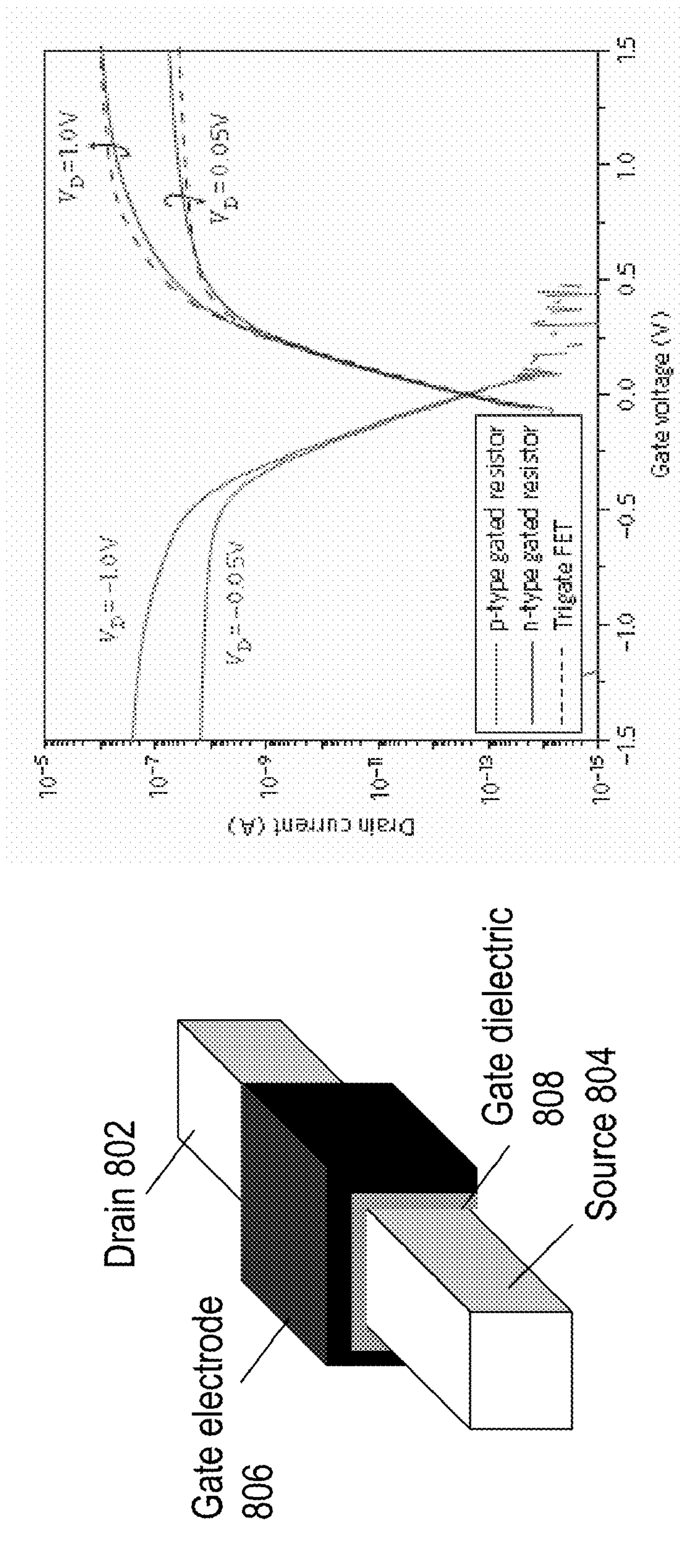
FIG. 8 is a exemplary drawing illustration and a transistor characteristic graph of a junction-less transistor (prior art)

As illustrated in FIG. 8 the junction-less transistor may be constructed whereby the transistor channel is a thin solid piece of evenly and heavily doped single crystal silicon. Single crystal silicon may also be referred to as mono-crystalline silicon. The doping concentration of the channel underneath the gate 806 and gate dielectric 808 may be identical to that of the source 804 and drain 802. Due to the high channel doping, the channel must be thin and narrow enough to allow for full depletion of the carriers when the device is turned off. Additionally, the channel doping must be high enough to allow a reasonable current to flow when the device is on. It is advantageous to have a multi-sided gate to control the channel. The JLT has a very small channel area (typically less than 20 nm on one or more sides), so the gate can deplete the channel of charge carriers at approximately 0V and turn the source to drain current substantially off. I-V curves from Colinge of n channel and p channel junction-less transistors are shown in FIG. 8. This shows that the JLT can obtain comparable performance to the tri-gate transistor (junctioned) that is commonly researched and reported by transistor developers.

Figure 9A:
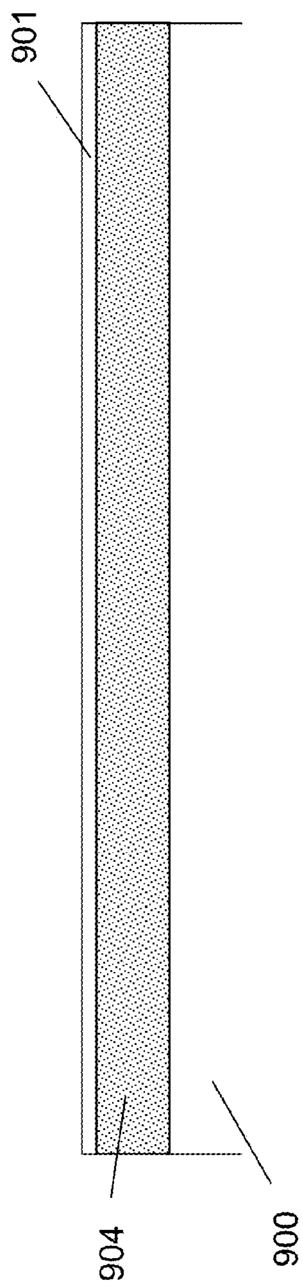
FIGS. 9A-H are exemplary drawing illustrations of the formation of a junction-less transistor.

As illustrated in FIGS. 9A to 9G, an n-channel 3-sided gated junction-less transistor (JLT) may be constructed that is suitable for 3D IC manufacturing. As illustrated in FIG. 9A, an N− substrate donor wafer 900 may be processed to comprise a wafer sized layer of N+ doping 904. The N+ doping layer 904 may be formed by ion implantation and thermal anneal. A screen oxide 901 may be grown before the implant to protect the silicon from implant contamination and to provide an oxide surface for later wafer to wafer bonding. The N+ layer 904 may alternatively be formed by epitaxial growth of a doped silicon layer of N+ or may be a deposited layer of heavily N+ doped polysilicon that may be optically annealed to form large grains. The N+ doped layer 904 may be formed by doping the N− substrate wafer 900 by Plasma Assisted Doping (PLAD) techniques. These processes may be done at temperatures above 400° C. as the layer transfer to the processed substrate with metal interconnects has yet to be done.

Figure 9B:
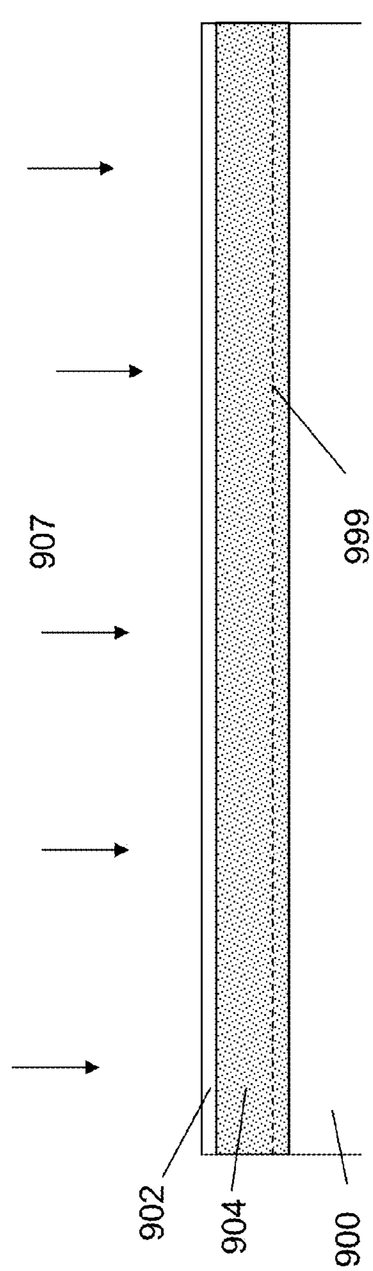

As illustrated in FIG. 9B, the top surface of donor wafer 900 may be prepared for oxide wafer bonding with a deposition of an oxide 902 or by thermal oxidation of the N+ layer 904 to form oxide layer 902, or a re-oxidation of implant screen oxide 901. A layer transfer demarcation plane 999 (shown as a dashed line) may be formed in donor wafer 900 or N+ layer 904 (shown) by hydrogen implantation 907 or other methods as previously described. Both the donor wafer 900 and acceptor wafer 910 may be prepared for wafer bonding as previously described and then low temperature (less than approximately 400° C.) bonded. The portion of the N+ layer 904 and the N− donor wafer substrate 900 that are above the layer transfer demarcation plane 999 may be removed by cleaving and polishing, or other low temperature processes as previously described, such as, for example, ion-cut or other methods.

Figure 9C:
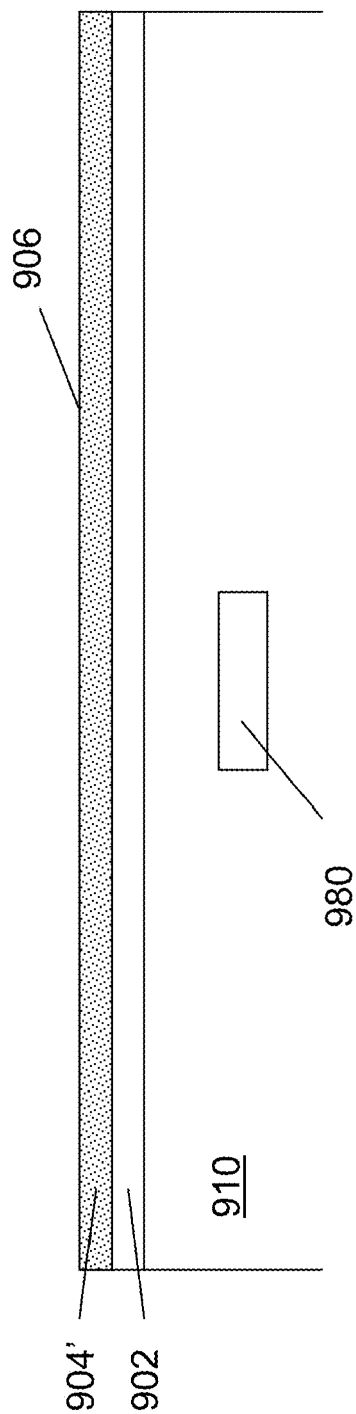

As illustrated in FIG. 9C, the remaining N+ layer 904' has been layer transferred to acceptor wafer 910. The top surface 906 of N+ layer 904' may be chemically or mechanically polished. Now junction-less transistors may be formed with low temperature (less than approximately 400° C.) processing and aligned to the acceptor wafer 910 alignment marks (not shown). The acceptor wafer metal connect pad 980 is also illustrated. For illustration clarity, the oxide layers used to facilitate the wafer to wafer bond are not shown.

Figure 9D:
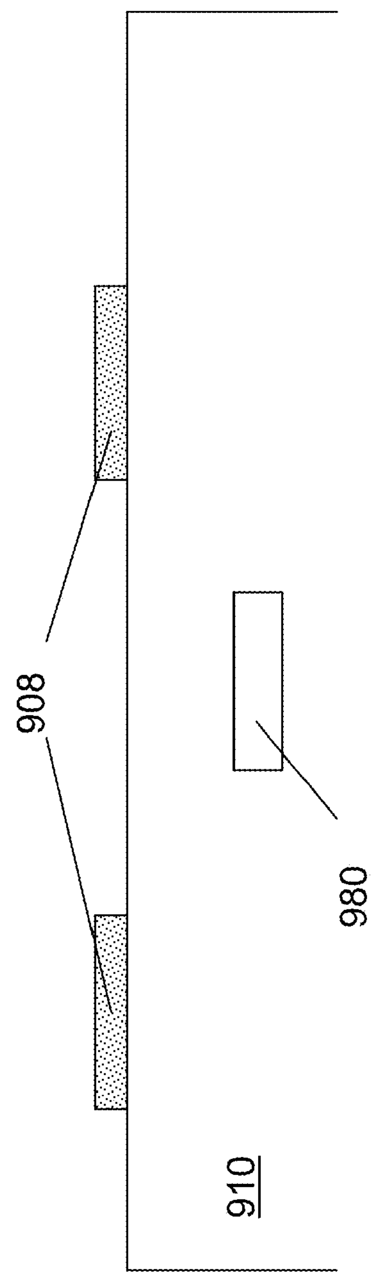

As illustrated in FIG. 9D a low temperature thin oxide (not shown) may be grown or deposited, or formed by liquid oxidants such as, for example, 120° C. sulfuric peroxide to protect the thin transistor N+ silicon layer 904' top from contamination, and then the N+ layer 904' may be masked and etched and the photoresist subsequently removed. Thus the transistor channel elements 908 are formed. The thin protective oxide is striped in a dilute HF solution.

Figure 9E:
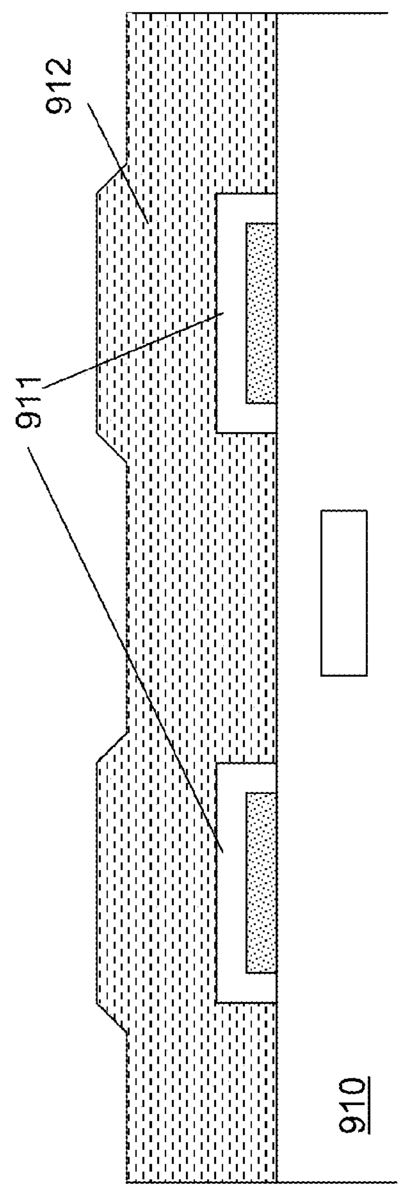

As illustrated in FIG. 9E a low temperature based Gate Dielectric may be deposited and densified to serve as the junction-less transistor gate oxide 911. Alternatively, a low temperature microwave plasma oxidation of the transistor channel element 908 silicon surfaces may serve as the JLT gate oxide 911 or an atomic layer deposition (ALD) technique may be utilized to form the HKMG gate oxide as previously described. Then deposition of a low temperature gate material 912, such as, for example, P+ doped amorphous silicon, may be performed. Alternatively, a HKMG gate structure may be formed as described previously.

Figure 9F:
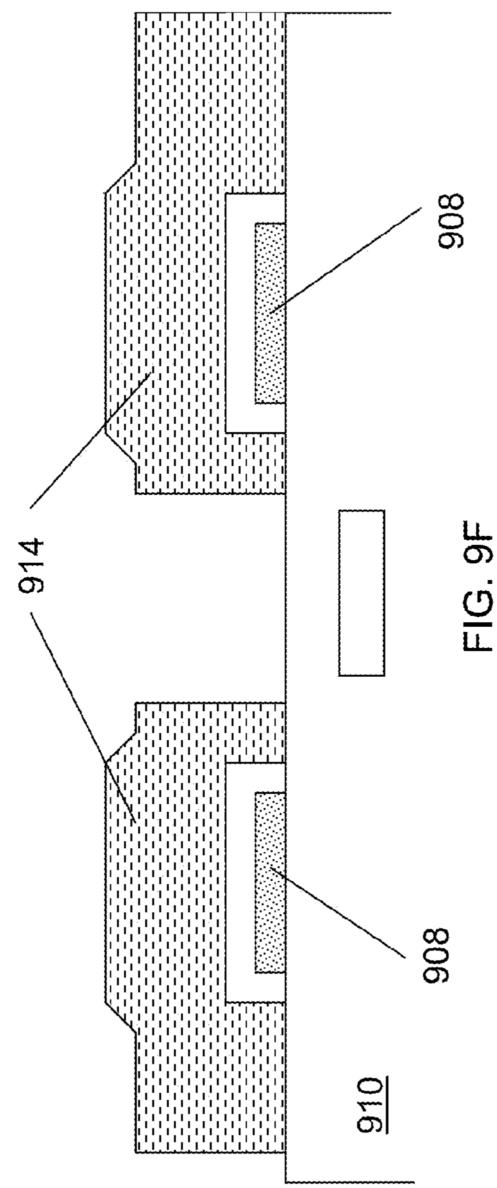

As illustrated in FIG. 9F the gate material 912 may be masked and etched to define the three sided (top and two side) gate electrode 914 that is in an overlapping crossing manner, generally orthogonal, with respect to the transistor channel 908.

Figure 9G:
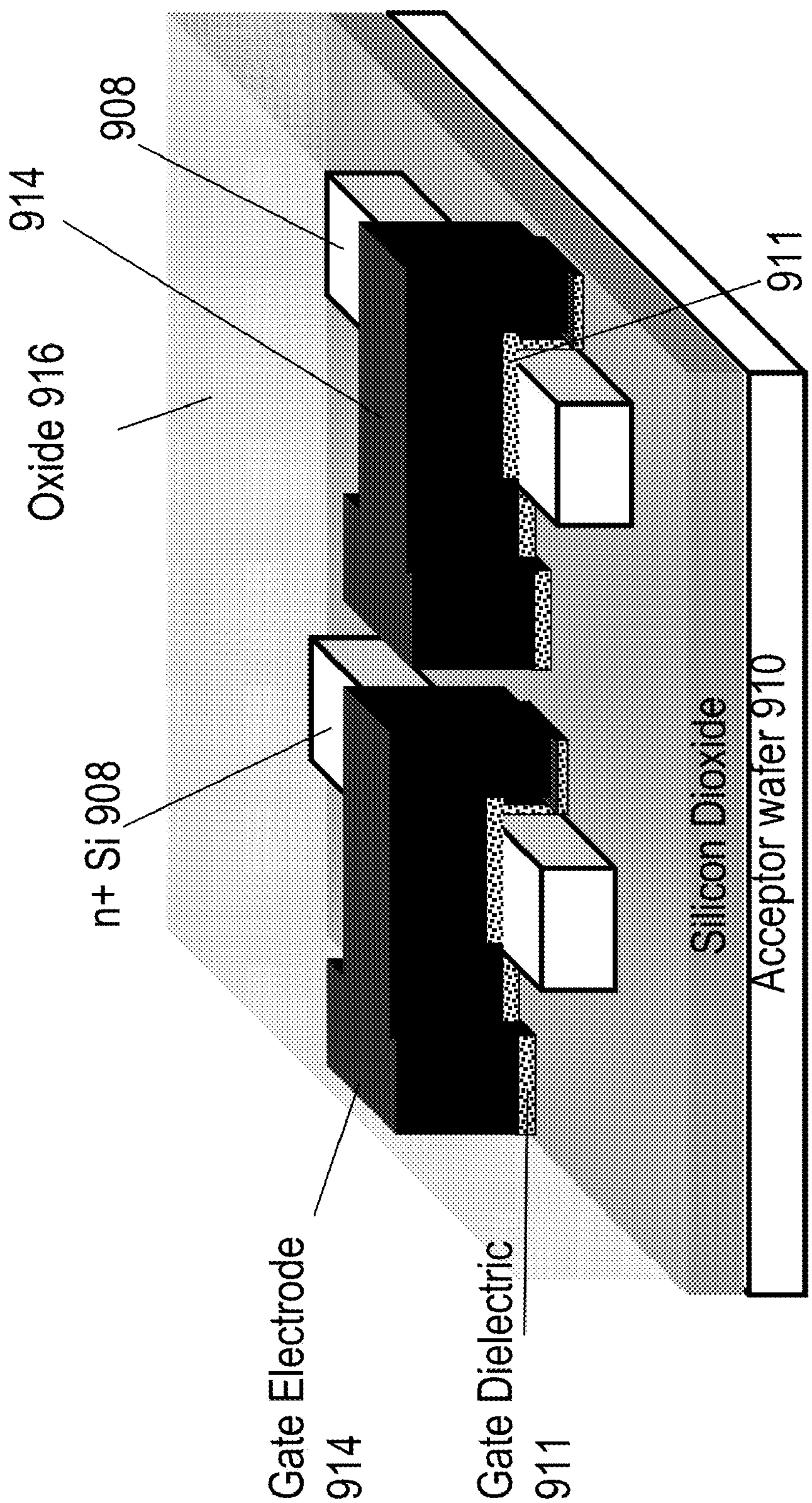

As illustrated in 3D projection FIG. 9G, the entire structure may be substantially covered with a Low Temperature Oxide 916, which may be planarized with chemical mechanical polishing. The three sided gate electrode 914, N+ transistor channel 908, gate dielectric 911, and acceptor substrate 910 are shown.

Figure 9H:
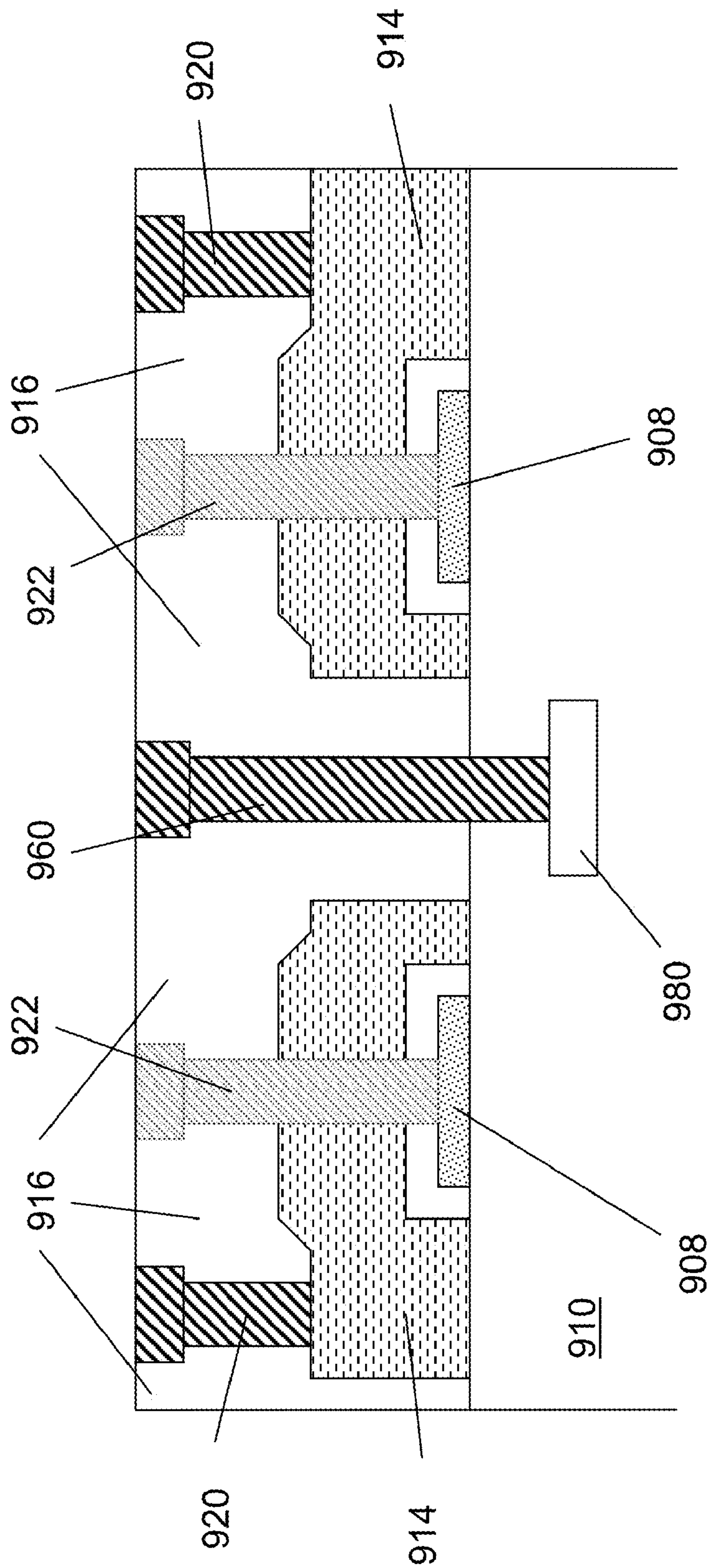

As illustrated in FIG. 9H, then the contacts and thru layer vias may be formed. The gate contact 920 connects to the gate 914. The two transistor channel terminal contacts (source and drain) 922 independently connect to the transistor channel element 908 on each side of the gate 914. The thru layer via 960 electrically couples the transistor layer metallization on the donor wafer to the acceptor wafer metal connect pad 980 in acceptor substrate 910. This process flow enables the formation of a mono-crystalline silicon channel 3-sided gated junction-less transistor which may be formed and connected to the underlying multi-metal layer semiconductor device without exposing the underlying devices to a high temperature.

A p channel 3-sided gated JLT may be constructed as above with the N+ layer 904 formed as P+ doped, and the gate metal 912 is of appropriate work function to shutoff the p channel at a gate voltage of approximately zero.

Figure 10A:
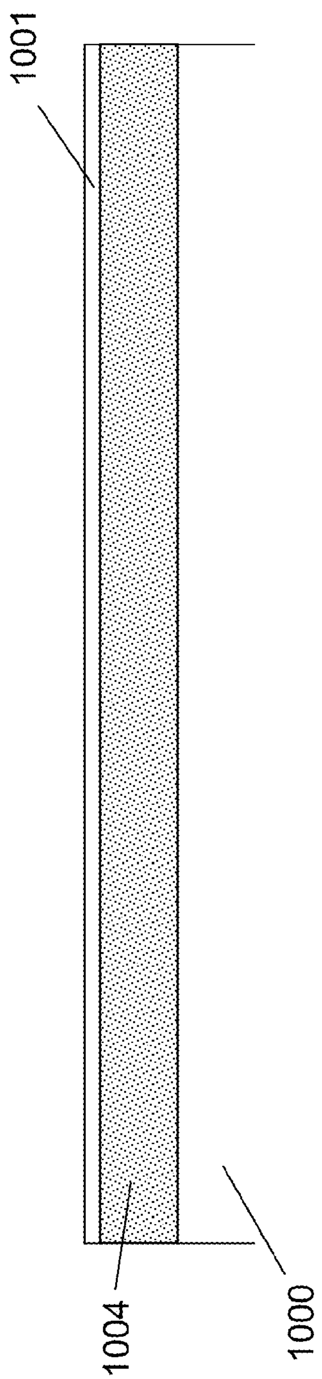
FIGS. 10A-H are exemplary drawing illustrations of the formation of a junction-less transistor.

As illustrated in FIGS. 10A to 10H, an n-channel 2-sided gated junction-less transistor (JLT) may be constructed that is suitable for 3D IC manufacturing. As illustrated in FIG. 10A, an N− (shown) or P− substrate donor wafer 1000 may be processed to comprise a wafer sized layer of N+ doping 1004. The N+ doping layer 1004 may be formed by ion implantation and thermal anneal. A screen oxide 1001 may be grown before the implant to protect the silicon from implant contamination and to provide an oxide surface for later wafer to wafer bonding. The N+ layer 1004 may alternatively be formed by epitaxial growth of a doped silicon layer of N+ or may be a deposited layer of heavily N+ doped amorphous or poly-crystalline silicon that may be optically annealed to form large grains. The N+ doped layer 1004 may be formed by doping the N− substrate wafer 1000 by Plasma Assisted Doping (PLAD) techniques. These processes may be done at temperatures above 400° C. as the layer transfer to the processed substrate with metal interconnects has yet to be done.

Figure 10B:
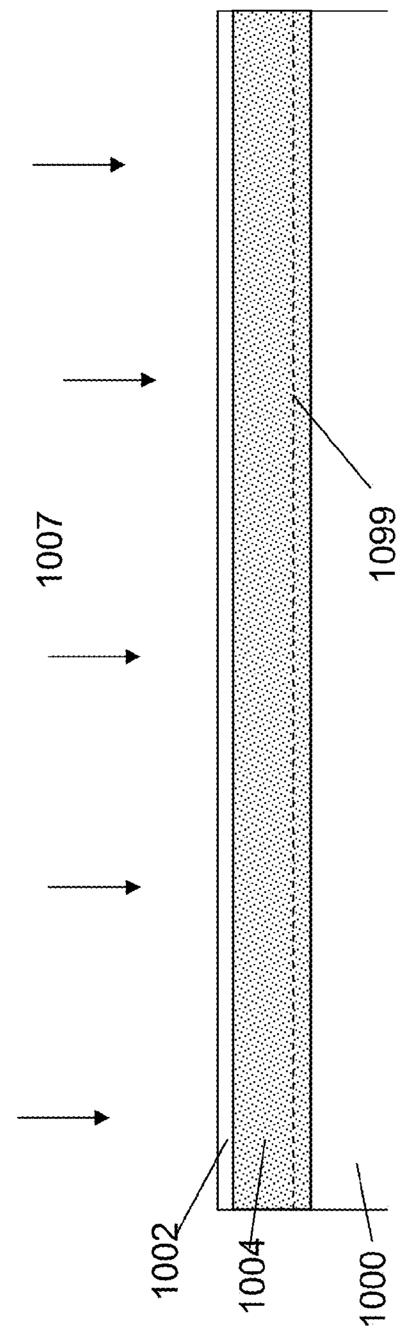

As illustrated in FIG. 10B, the top surface of donor wafer 1000 may be prepared for oxide wafer bonding with a deposition of an oxide 1002 or by thermal oxidation of the N+ layer 1004 to form oxide layer 1002, or a re-oxidation of implant screen oxide 1001 to form oxide layer 1002. A layer transfer demarcation plane 1099 (shown as a dashed line) may be formed in donor wafer 1000 or N+ layer 1004 (shown) by hydrogen implantation 1007 or other methods as previously described. Both the donor wafer 1000 and acceptor wafer 1010 may be prepared for wafer bonding as previously described and then low temperature (less than approximately 400° C.) bonded. The portion of the N+ layer 1004 and the N− donor wafer substrate 1000 that are above the layer transfer demarcation plane 1099 may be removed by cleaving and polishing, or other low temperature processes as previously described, such as, for example, ion-cut or other methods. If the layer transfer demarcation plane 1099 is optionally placed below the N+ layer 1004 and into the donor wafer substrate 1000, the remaining N− or P− layer could be removed by etch or mechanical polishing after the cleaving process. This could be done selectively to the N+ layer 1004.

Figure 10C:
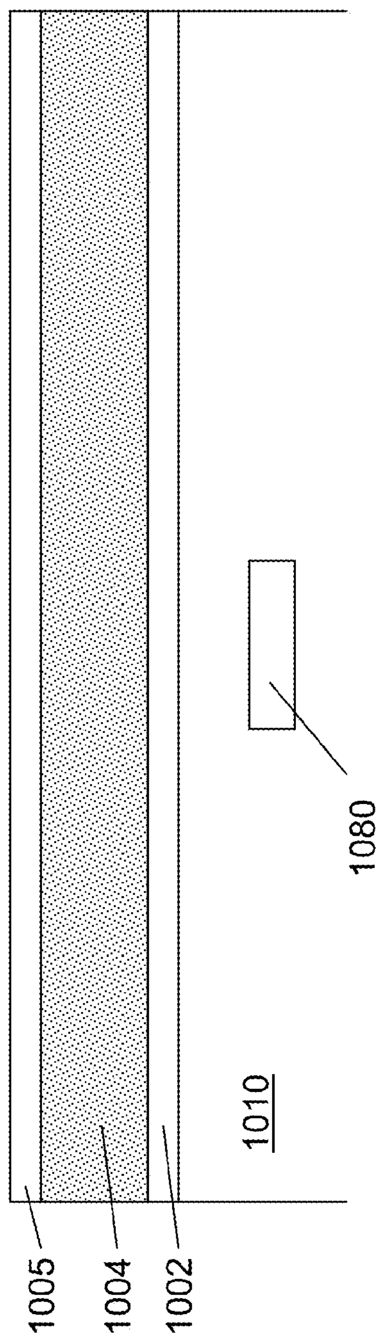

As illustrated in FIG. 10C, the remaining N+ layer 1004' has been layer transferred to acceptor wafer 1010. The top surface of N+ layer 1004' may be chemically or mechanically polished or etched to the desired thickness. Now transistors may be formed with low temperature (less than approximately 400° C.) processing and aligned to the acceptor wafer 1010 alignment marks (not shown). A low temperature CMP and plasma/RIE etch stop layer 1005, such as, for example, low temperature silicon nitride (SiN) on silicon oxide, may be deposited on top of N+ layer 1004'. The acceptor wafer metal connect pad 1080 is also illustrated. For illustration clarity, the oxide layers used to facilitate the wafer to wafer bond are not shown.

Figure 10D:
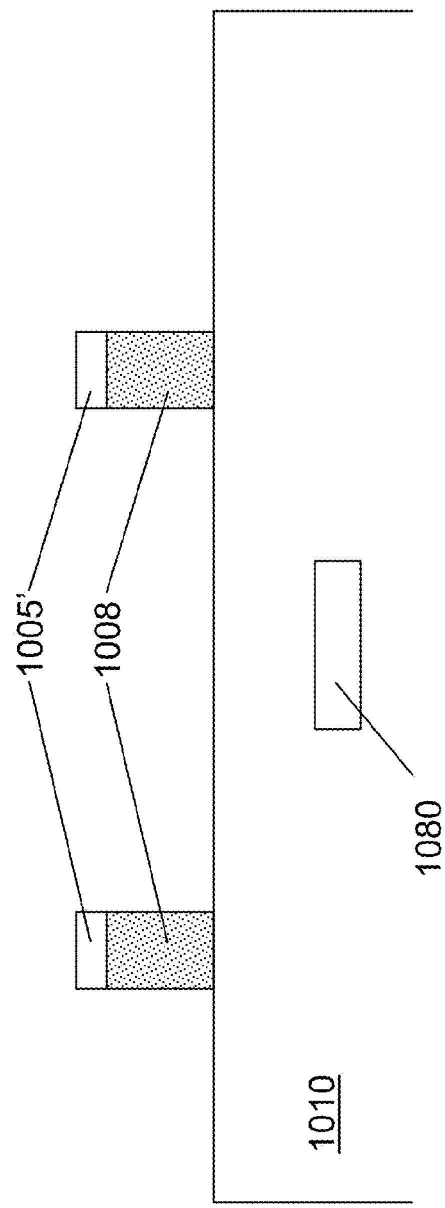

As illustrated in FIG. 10D the CMP & plasma/RIE etch stop layer 1005 and N+ layer 1004' may be masked and etched, and the photoresist subsequently removed. The transistor channel elements 1008 with associated CMP & plasma/RIE etch stop layer 1005' are formed.

Figure 10E:
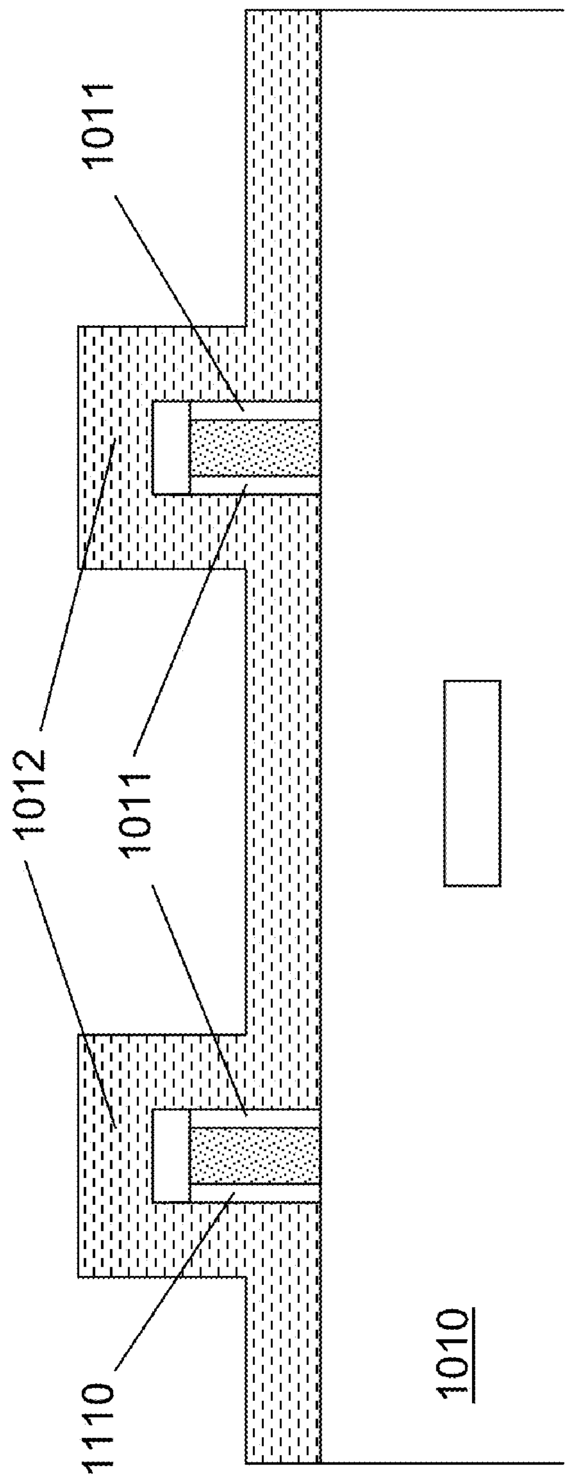

As illustrated in FIG. 10E a low temperature based Gate Dielectric may be deposited and densified to serve as the junction-less transistor gate oxide 1011. Alternatively, a low temperature microwave plasma oxidation of the transistor channel element 1008 silicon surfaces may serve as the JLT gate oxide 1011 or an atomic layer deposition (ALD) technique may be utilized to form the HKMG gate oxide as previously described. Then deposition of a low temperature gate material 1012, such as, for example, P+ doped amorphous silicon, may be performed. Alternatively, a HKMG gate structure may be formed as described previously.

Figure 10F:
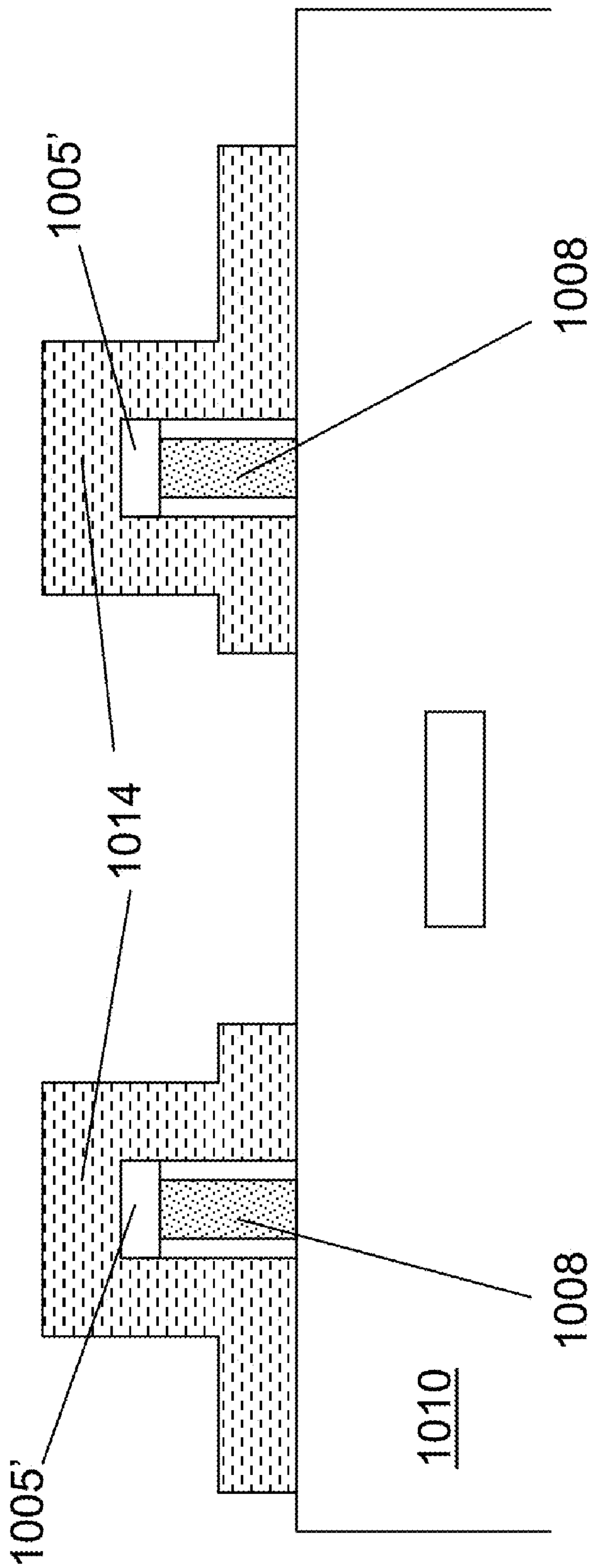

As illustrated in FIG. 10F the gate material 1012 may be masked and etched to define the two sided gate electrodes 1014 that is in an overlapping crossing manner, generally orthogonal, with respect to the transistor channel 1008.

Figure 10G:
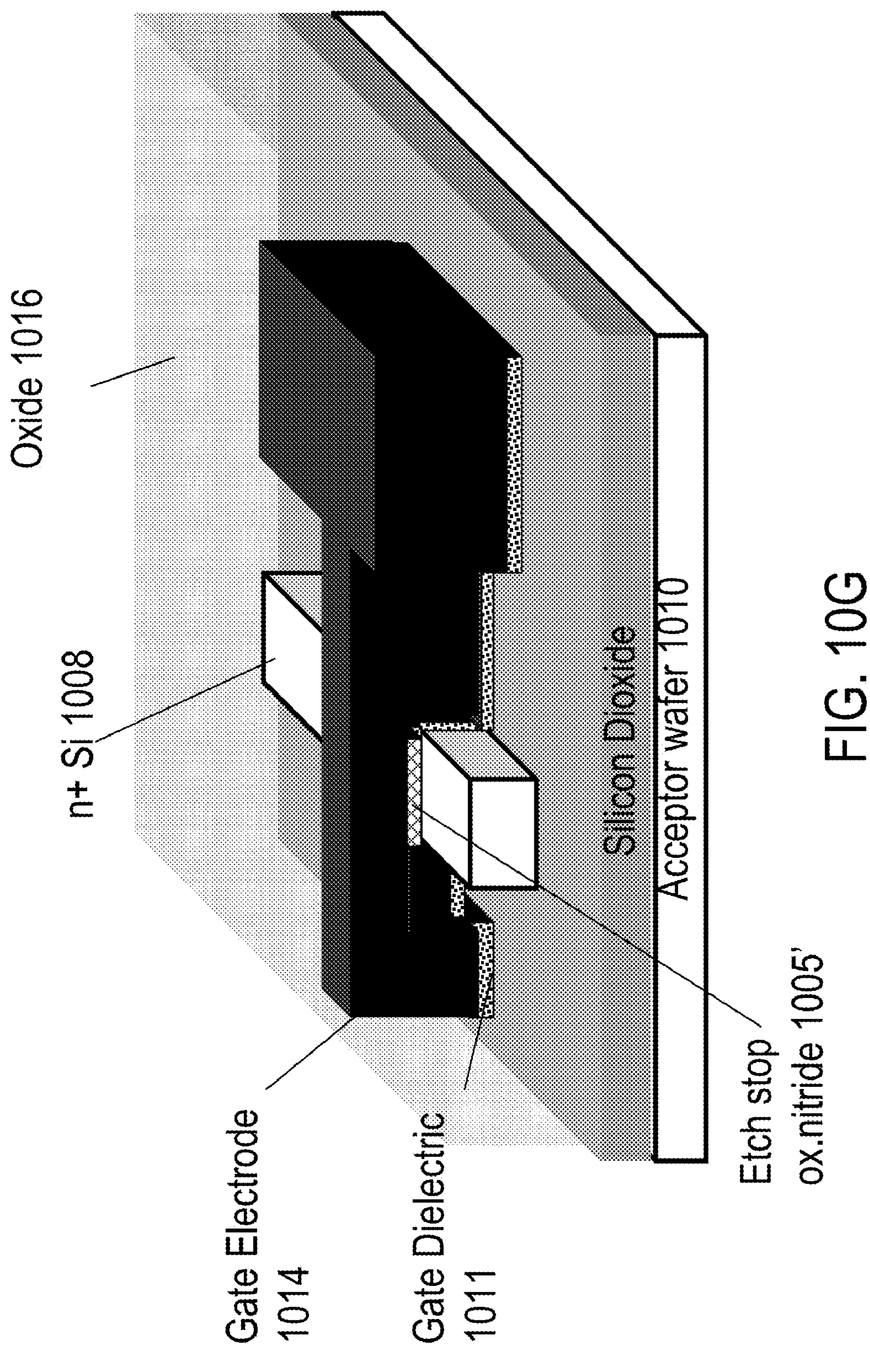

As illustrated in 3D projection FIG. 10G, the entire structure may be substantially covered with a Low Temperature Oxide 1016, which may be planarized with chemical mechanical polishing. The three sided gate electrode 1014, N+ transistor channel 1008, gate dielectric 1011, and acceptor substrate 1010 are shown.

Figure 10H:
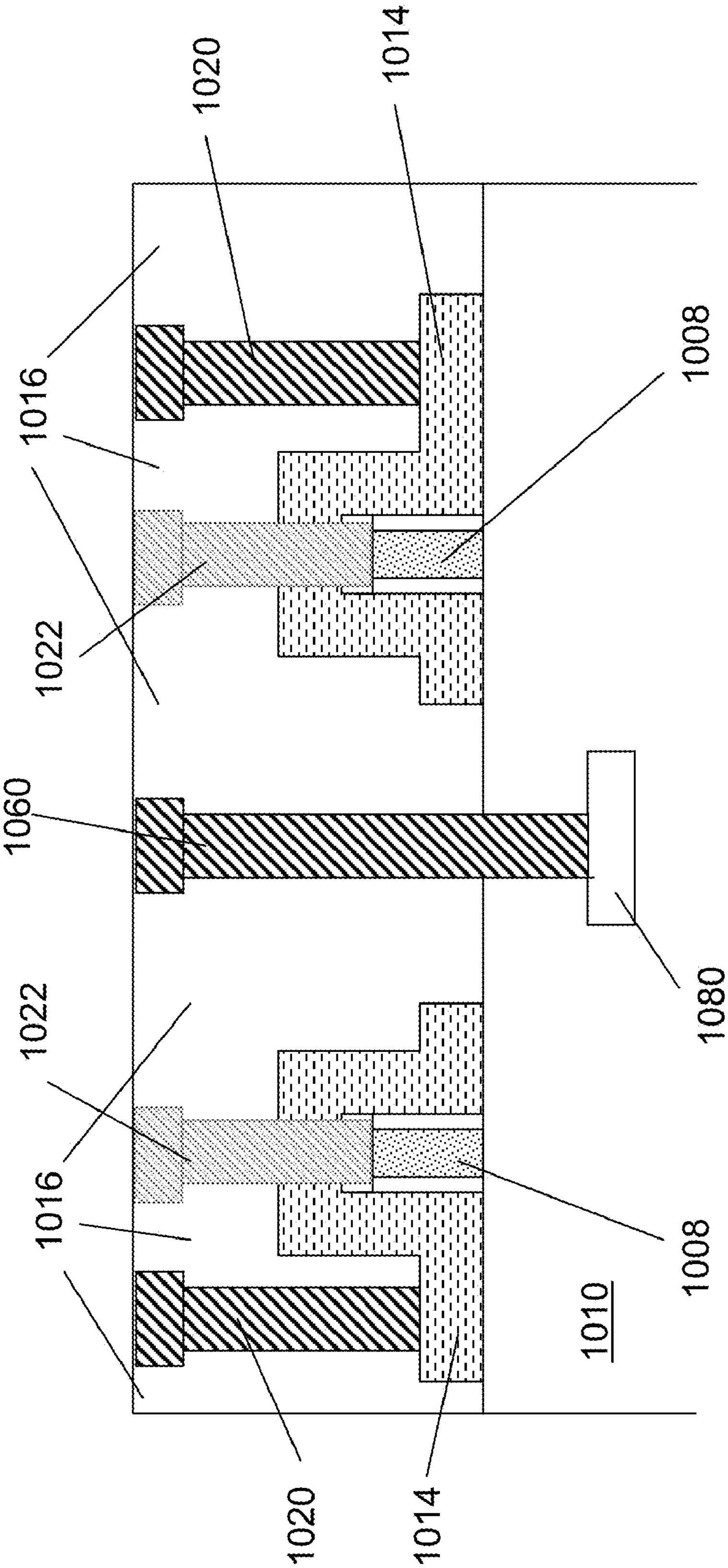

As illustrated in FIG. 10H, then the contacts and metal interconnects may be formed. The gate contact 1020 connects to the gate 1014. The two transistor channel terminal contacts (source and drain) 1022 independently connect to the transistor channel element 1008 on each side of the gate 1014. The thru layer via 1060 electrically couples the transistor layer metallization to the acceptor substrate 1010 at acceptor wafer metal connect pad 1080. This flow enables the formation of a mono-crystalline silicon channel 2-sided gated junction-less transistor which may be formed and connected to the underlying multi-metal layer semiconductor device without exposing the underlying devices to a high temperature.

A p channel 2-sided gated JLT may be constructed as above with the N+ layer 1004 formed as P+ doped, and the gate metal 1012 is of appropriate work function to shutoff the p channel at a gate voltage of zero.

FIG. 10 is drawn to illustrate a thin-side-up junction-less transistor (JLT). A thin-side-up JLT may have the thinnest dimension of the channel cross-section facing up (oriented horizontally), with that face being parallel to the silicon base substrate surface. Previously and subsequently described junction-less transistors may have the thinnest dimension of the channel cross section oriented vertically and perpendicular to the silicon base substrate surface, or may be constructed in the thin-side-up manner.

Figure 11A:
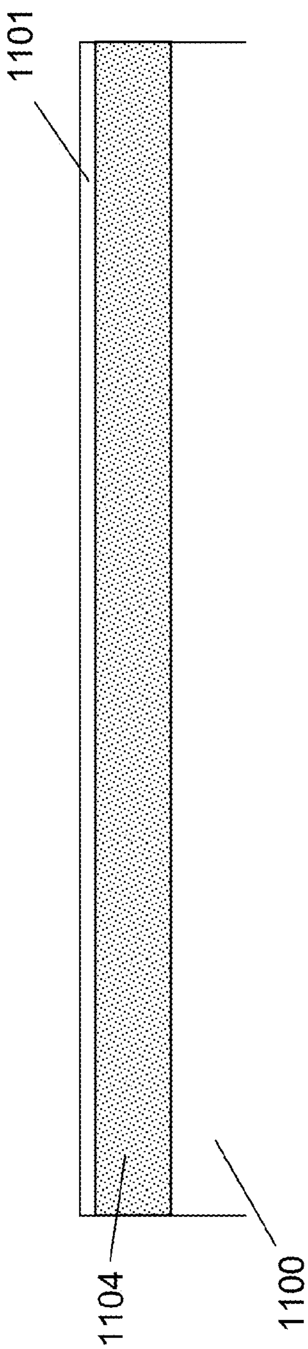
FIGS. 11A-H are exemplary drawing illustrations of the formation of a junction-less transistor.

As illustrated in FIGS. 11A to 11H, an n-channel 1-sided gated junction-less transistor (JLT) may be constructed that is suitable for 3D IC manufacturing. As illustrated in FIG. 11A, an N− substrate donor wafer 1100 may be processed to comprise a wafer sized layer of N+ doping 1104. The N+ doping layer 1104 may be formed by ion implantation and thermal anneal. A screen oxide 1101 may be grown before the implant to protect the silicon from implant contamination and to provide an oxide surface for later wafer to wafer bonding. The N+ layer 1104 may alternatively be formed by epitaxial growth of a doped silicon layer of N+ or may be a deposited layer of heavily N+ doped amorphous or poly-crystalline silicon that may be optically annealed to form large grains. The N+ doped layer 1104 may be formed by doping the N− substrate wafer 1100 by Plasma Assisted Doping (PLAD) techniques. These processes may be done at temperatures above 400° C. as the layer transfer to the processed substrate with metal interconnects has yet to be done.

Figure 11B:
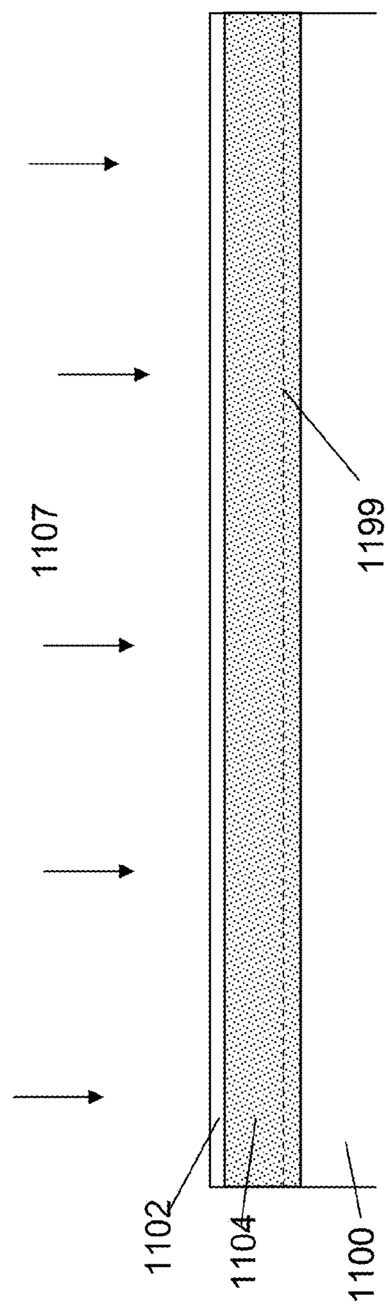

As illustrated in FIG. 11B, the top surface of donor wafer 1100 may be prepared for oxide wafer bonding with a deposition of an oxide 1102 or by thermal oxidation of the N+ layer 1104 to form oxide layer 1102, or a re-oxidation of implant screen oxide 1101 to form oxide layer 1102. A layer transfer demarcation plane 1199 (shown as a dashed line) may be formed in donor wafer 1100 or N+ layer 1104 (shown) by hydrogen implantation 1107 or other methods as previously described. Both the donor wafer 1100 and acceptor wafer 1111 may be prepared for wafer bonding as previously described and then low temperature (less than approximately 400° C.) bonded. The portion of the N+ layer 1104 and the N− donor wafer substrate 1100 that are above the layer transfer demarcation plane 1199 may be removed by cleaving and polishing, or other low temperature processes as previously described, such as, for example, ion-cut or other methods.

Figure 11C:
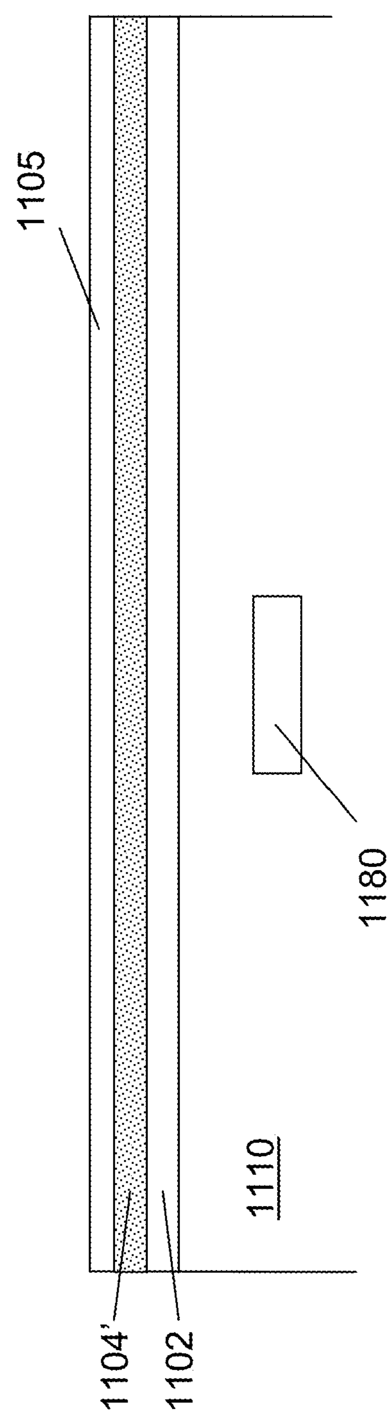

As illustrated in FIG. 11C, the remaining N+ layer 1104' has been layer transferred to acceptor wafer 1110. The top surface of N+ layer 1104' may be chemically or mechanically polished or etched to the desired thickness. Now transistors may be formed with low temperature (less than approximately 400° C.) processing and aligned to the acceptor wafer 1110 alignment marks (not shown). A low temperature CMP and plasma/RIE etch stop layer 1105, such as, for example, low temperature silicon nitride (SiN) on silicon oxide, may be deposited on top of N+ layer 1104'. The acceptor wafer metal connect pad 1180 is also illustrated. For illustration clarity, the oxide layers used to facilitate the wafer to wafer bond are not shown.

Figure 11D:
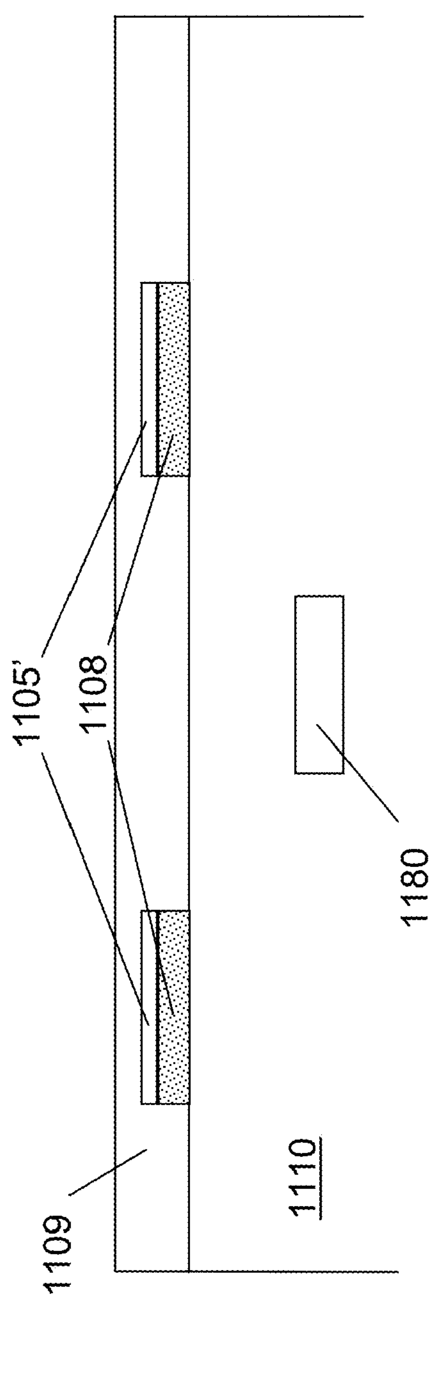

As illustrated in FIG. 11D the CMP & plasma/RIE etch stop layer 1105 and N+ layer 1104' may be masked and etched, and the photoresist subsequently removed. The transistor channel elements 1108 with associated CMP & plasma/RIE etch stop layer 1105' are formed. A low temperature oxide layer 1109 may be deposited.

Figure 11E:
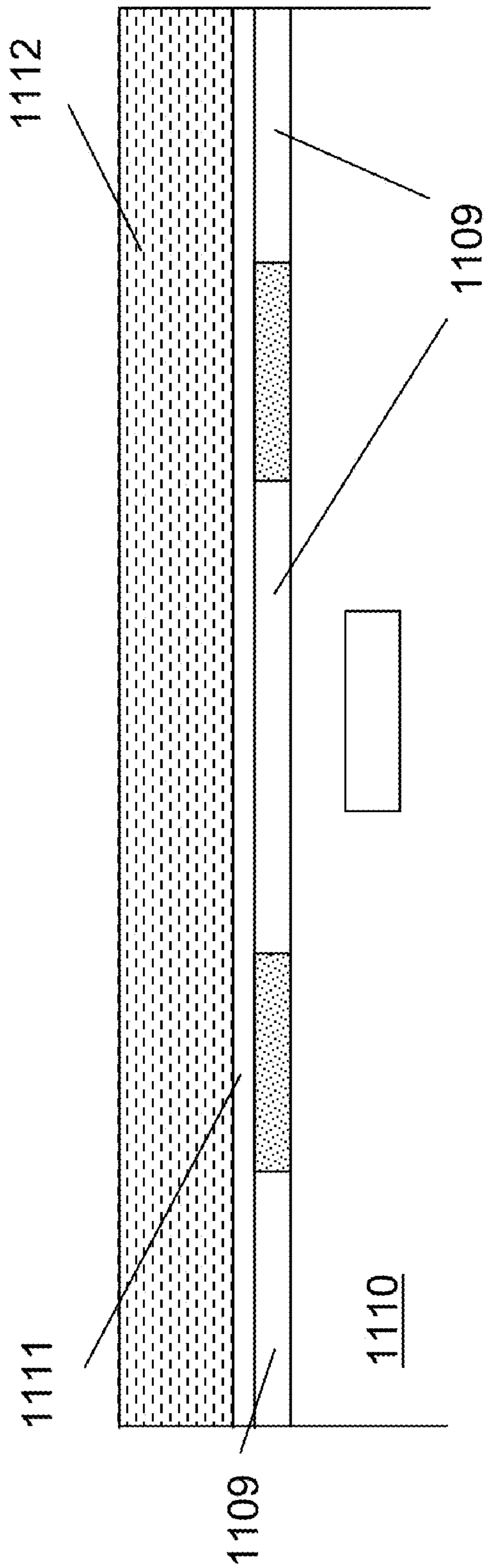

As illustrated in FIG. 11E a chemical mechanical polish (CMP) step may be performed to polish the oxide layer 1109 to the level of the CMP stop layer 1105'. Then the CMP stop layer 1105' may be removed with selective wet or dry chemistry to not harm the top surface of transistor channel elements 1108. A low temperature based Gate Dielectric may be deposited and densified to serve as the junction-less transistor gate oxide 1111. Alternatively, a low temperature microwave plasma oxidation of the transistor channel element 1108 silicon surfaces may serve as the JLT gate oxide 1111 or an atomic layer deposition (ALD) technique may be utilized to form the HKMG gate oxide as previously described. Then deposition of a low temperature gate material 1112, such as, for example, P+ doped amorphous silicon, may be performed. Alternatively, a HKMG gate structure may be formed as described previously.

Figure 11F:
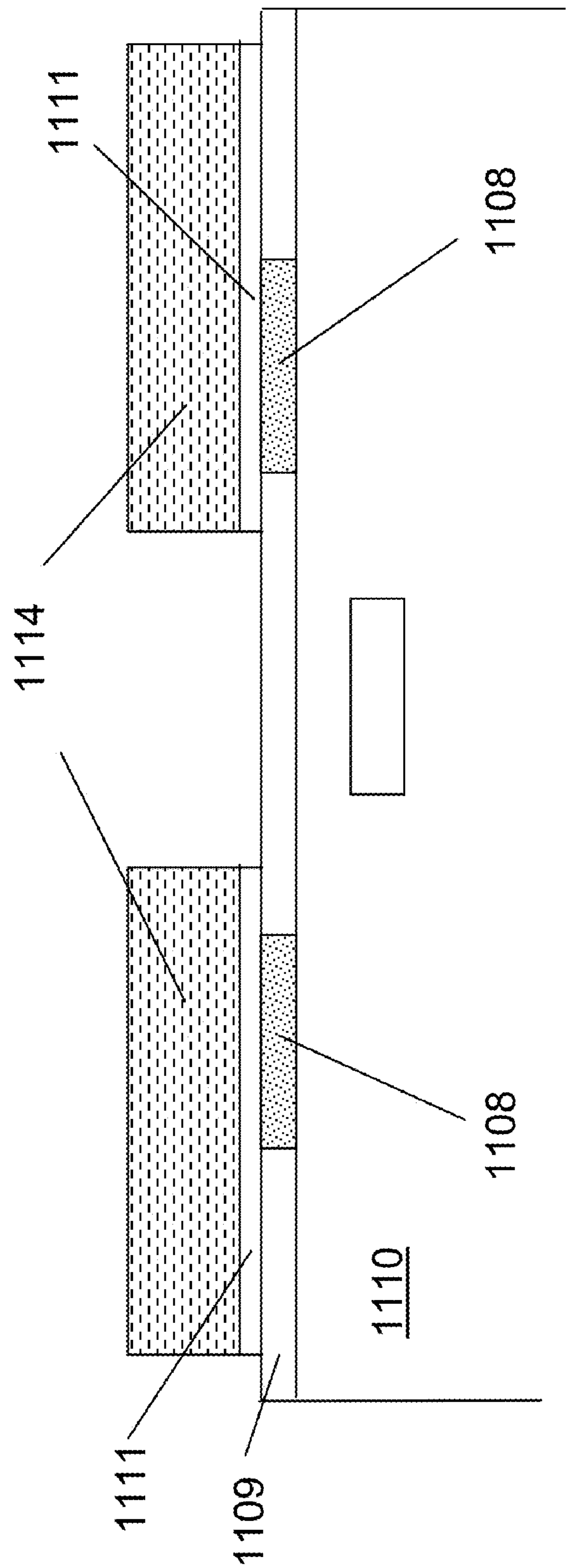

As illustrated in FIG. 11F the gate material 1112 may be masked and etched to define the gate electrode 1114 that is in an overlapping crossing manner, generally orthogonal, with respect to the transistor channel 1108.

Figure 11G:
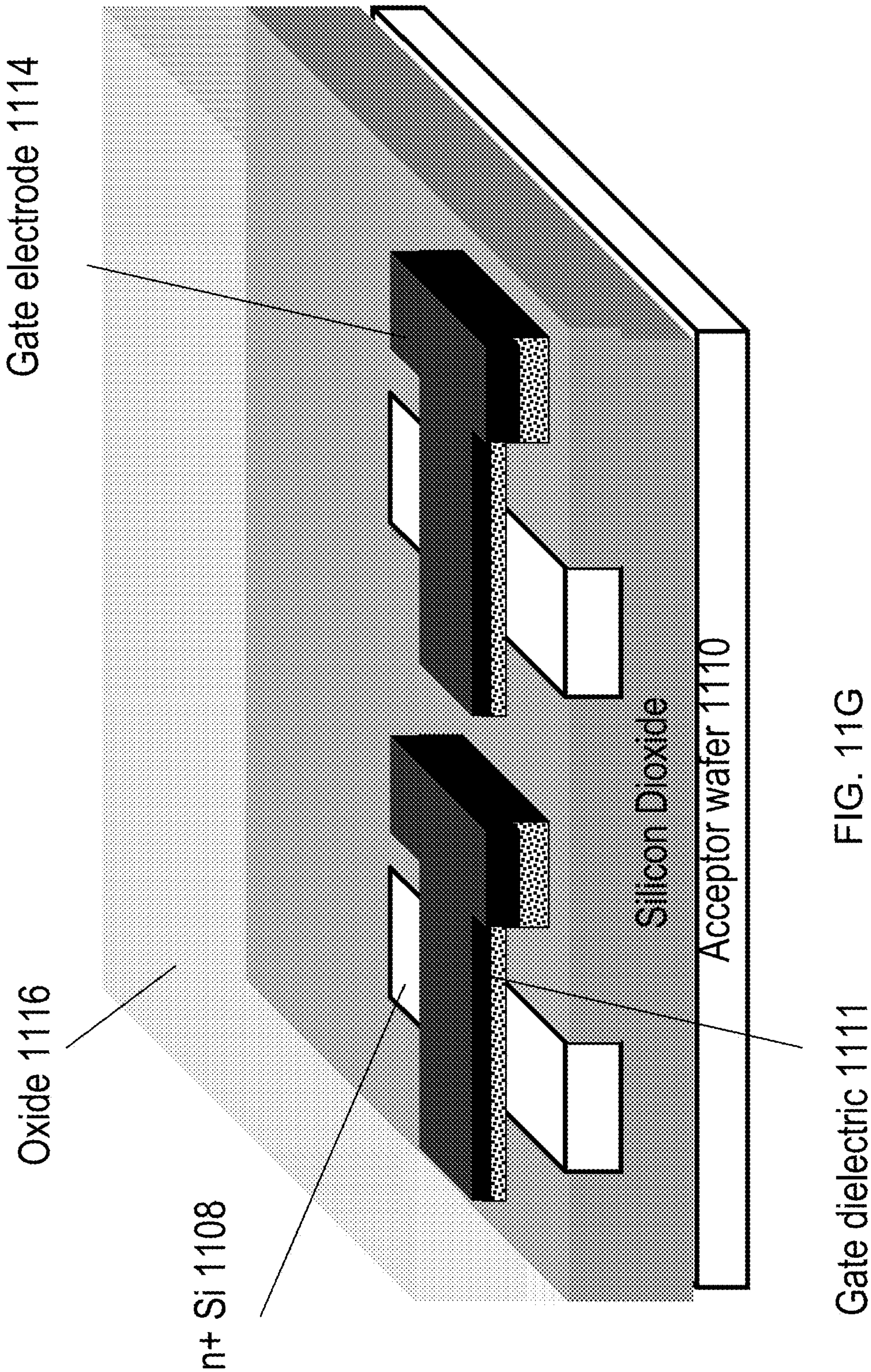

As illustrated in 3D projection FIG. 11G, the entire structure may be substantially covered with a Low Temperature Oxide 1116, which may be planarized with chemical mechanical polishing. The three sided gate electrode 1114, N+ transistor channel 1108, gate dielectric 1111, and acceptor substrate 1110 are shown.

Figure 11H:
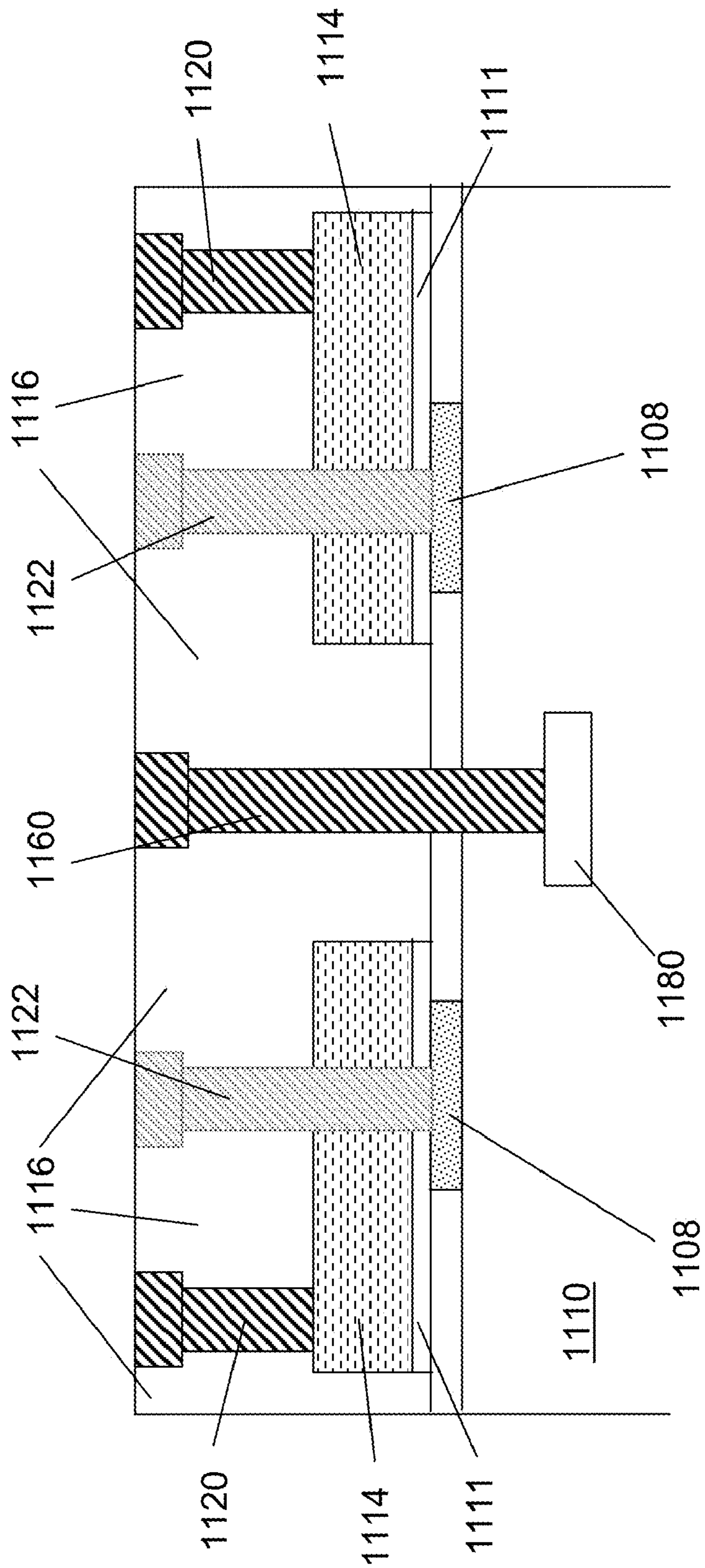

As illustrated in FIG. 11H, then the contacts and metal interconnects may be formed. The gate contact 1120 connects to the gate 1114. The two transistor channel terminal contacts (source and drain) 1122 independently connect to the transistor channel element 1108 on each side of the gate 1114. The thru layer via 1160 electrically couples the transistor layer metallization to the acceptor substrate 1110 at acceptor wafer metal connect pad 1180. This flow enables the formation of a mono-crystalline silicon channel 1-sided gated junction-less transistor that may be formed and connected to the underlying multi-metal layer semiconductor device without exposing the underlying devices to a high temperature.

A p channel 1-sided gated JLT may be constructed as above with the N+ layer 1104 formed as P+ doped, and the gate metal 1112 is of appropriate work function to substantially shutoff the p channel at a gate voltage of approximately zero.

As illustrated in FIGS. 12A to 12J, an n-channel 4-sided gated junction-less transistor (JLT) may be constructed that is suitable for 3D IC manufacturing. 4-sided gated JLTs can also be referred to as gate-all around JLTs or silicon nanowire JLTs.

Figure 12A:
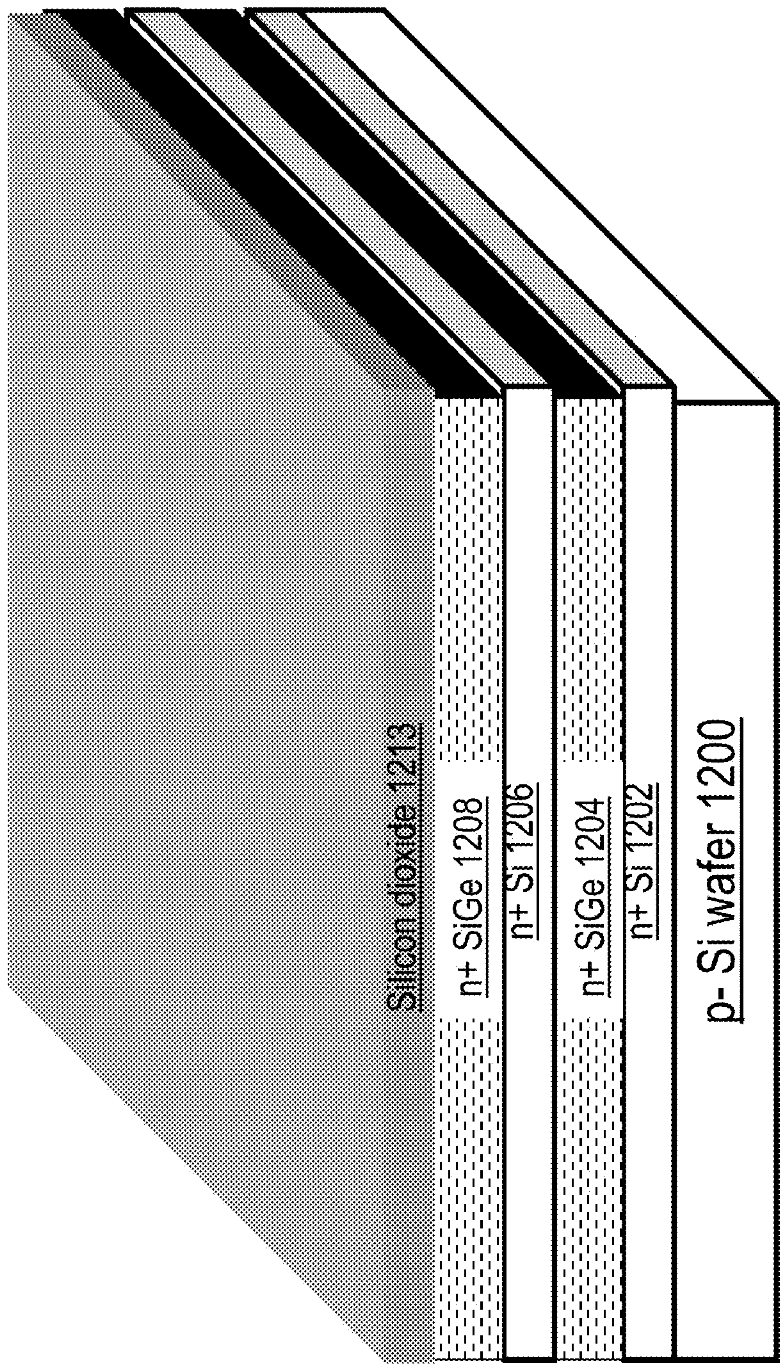
FIGS. 12A-J are exemplary drawing illustrations of the formation of a junction-less transistor.

As illustrated in FIG. 12A, a P− (shown) or N− substrate donor wafer 1200 may be processed to comprise wafer sized layers of N+ doped silicon 1202 and 1206, and wafer sized layers of n+ SiGe 1204 and 1208. Layers 1202, 1204, 1206, and 1208 may be grown epitaxially and are carefully engineered in terms of thickness and stoichiometry to keep the defect density due to the lattice mismatch between Si and SiGe low. The stoichiometry of the SiGe may be unique to each SiGe layer to provide for different etch rates as will be described later. Some techniques for achieving this include keeping the thickness of the SiGe layers below the critical thickness for forming defects. The top surface of donor wafer 1200 may be prepared for oxide wafer bonding with a deposition of an oxide 1213. These processes may be done at temperatures above approximately 400° C. as the layer transfer to the processed substrate with metal interconnects has yet to be done.

Figure 12B:
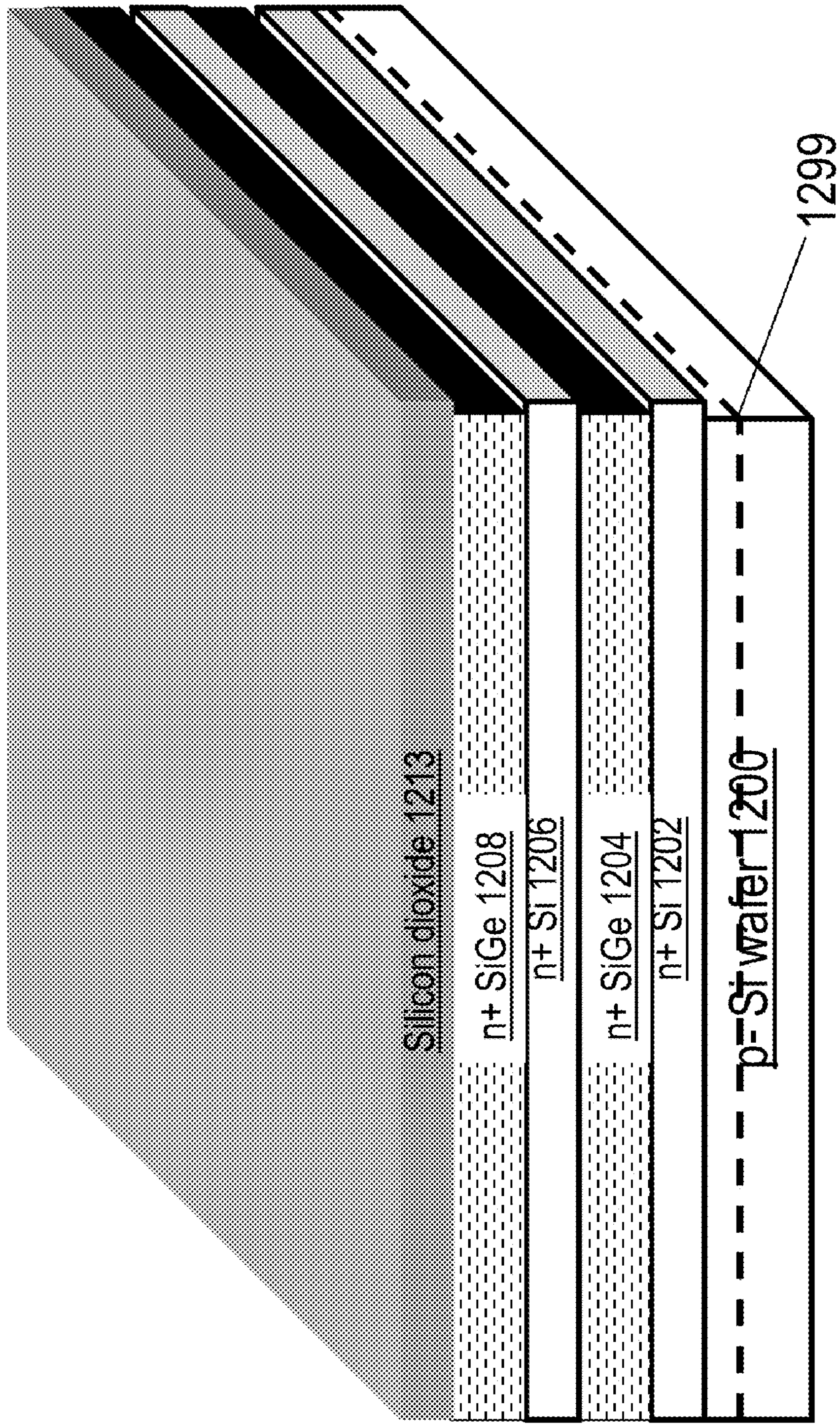

As illustrated in FIG. 12B, a layer transfer demarcation plane 1299 (shown as a dashed line) may be formed in donor wafer 1200 by hydrogen implantation or other methods as previously described.

Figure 12C:
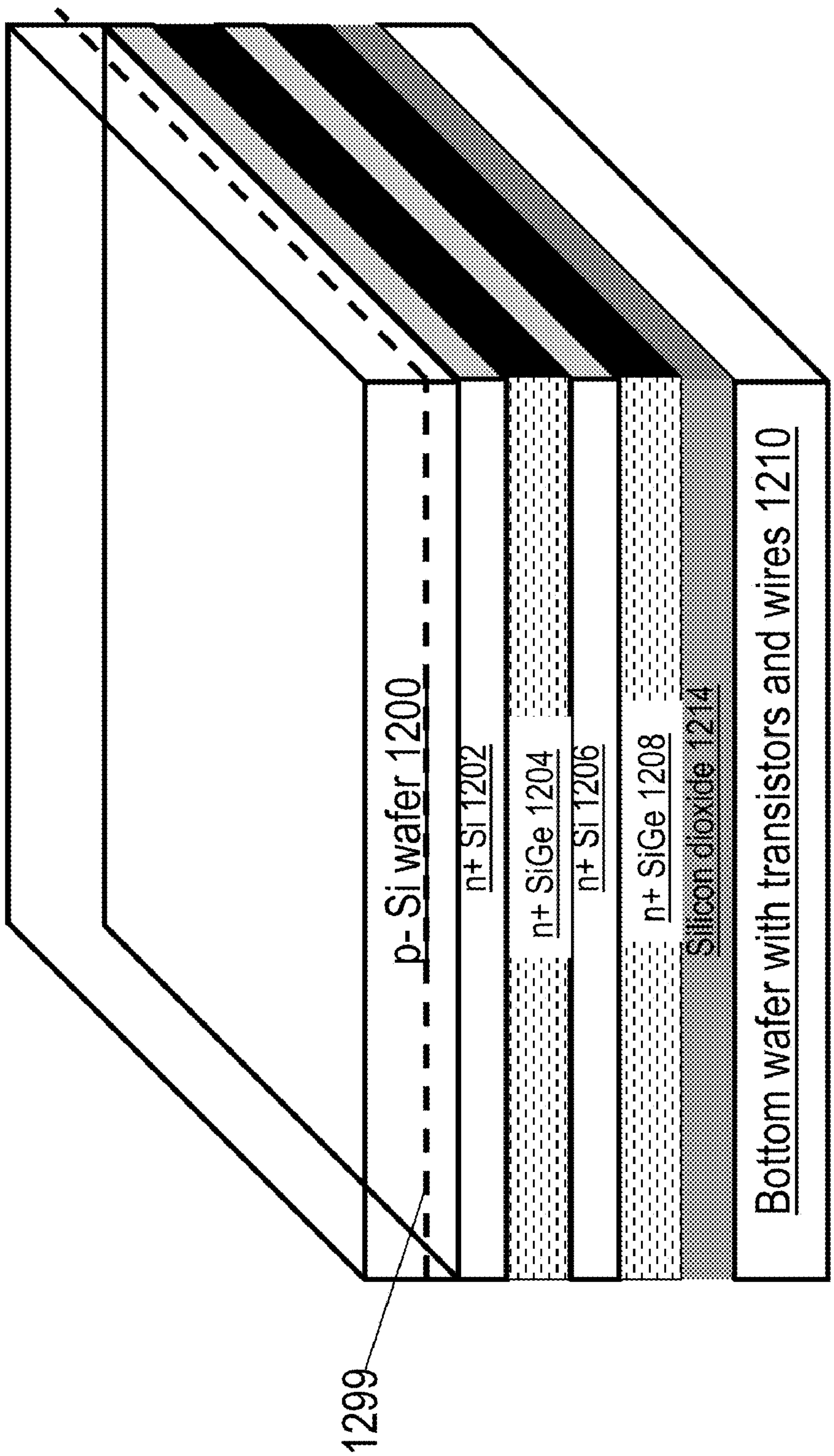

As illustrated in FIG. 12C, both the donor wafer 1200 and acceptor wafer 1210 top layers and surfaces may be prepared for wafer bonding as previously described and then donor wafer 1200 is flipped over, aligned to the acceptor wafer 1210 alignment marks (not shown) and bonded together at a low temperature (less than approximately 400° C.). Oxide 1213 from the donor wafer and the oxide of the surface of the acceptor wafer 1210 are thus atomically bonded together are designated as oxide 1214.

Figure 12D:
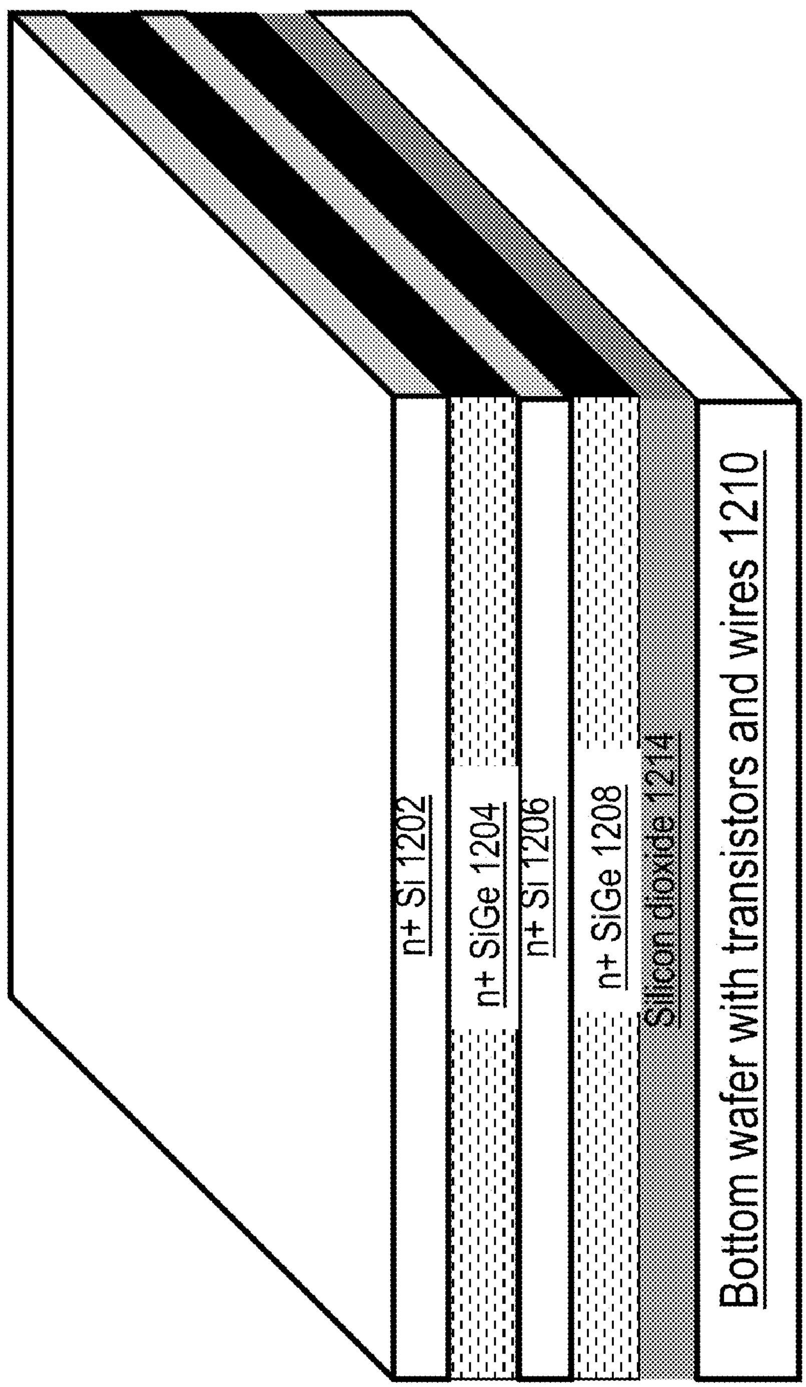

As illustrated in FIG. 12D, the portion of the P− donor wafer substrate 1200 that is above the layer transfer demarcation plane 1299 may be removed by cleaving and polishing, or other low temperature processes as previously described, such as, for example, ion-cut or other methods. A CMP process may be used to remove the remaining P− layer until the N+ silicon layer 1202 is reached.

Figure 12E:
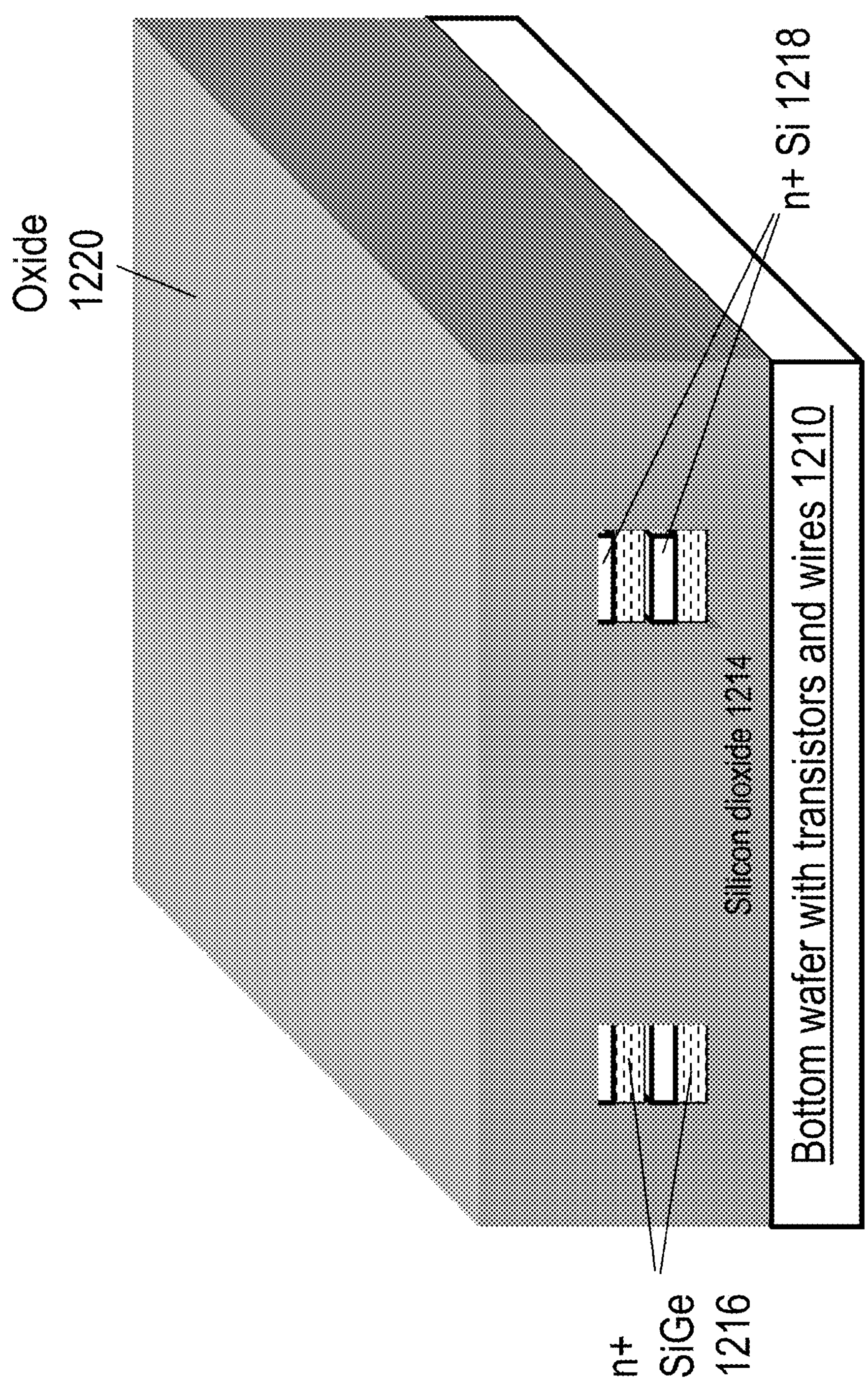

As illustrated in FIG. 12E, stacks of N+ silicon and n+ SiGe regions that will become transistor channels and gate areas may be formed by lithographic definition and plasma/RIE etching of N+ silicon layers 1202 & 1206 and n+ SiGe layers 1204 & 1208. The result is stacks of n+ SiGe 1216 and N+ silicon 1218 regions. The isolation between stacks may be filled with a low temperature gap fill oxide 1220 and chemically and mechanically polished (CMP'ed) flat. This will fully isolate the transistors from each other. The stack ends are exposed in the illustration for clarity of understanding.

Figure 12F:
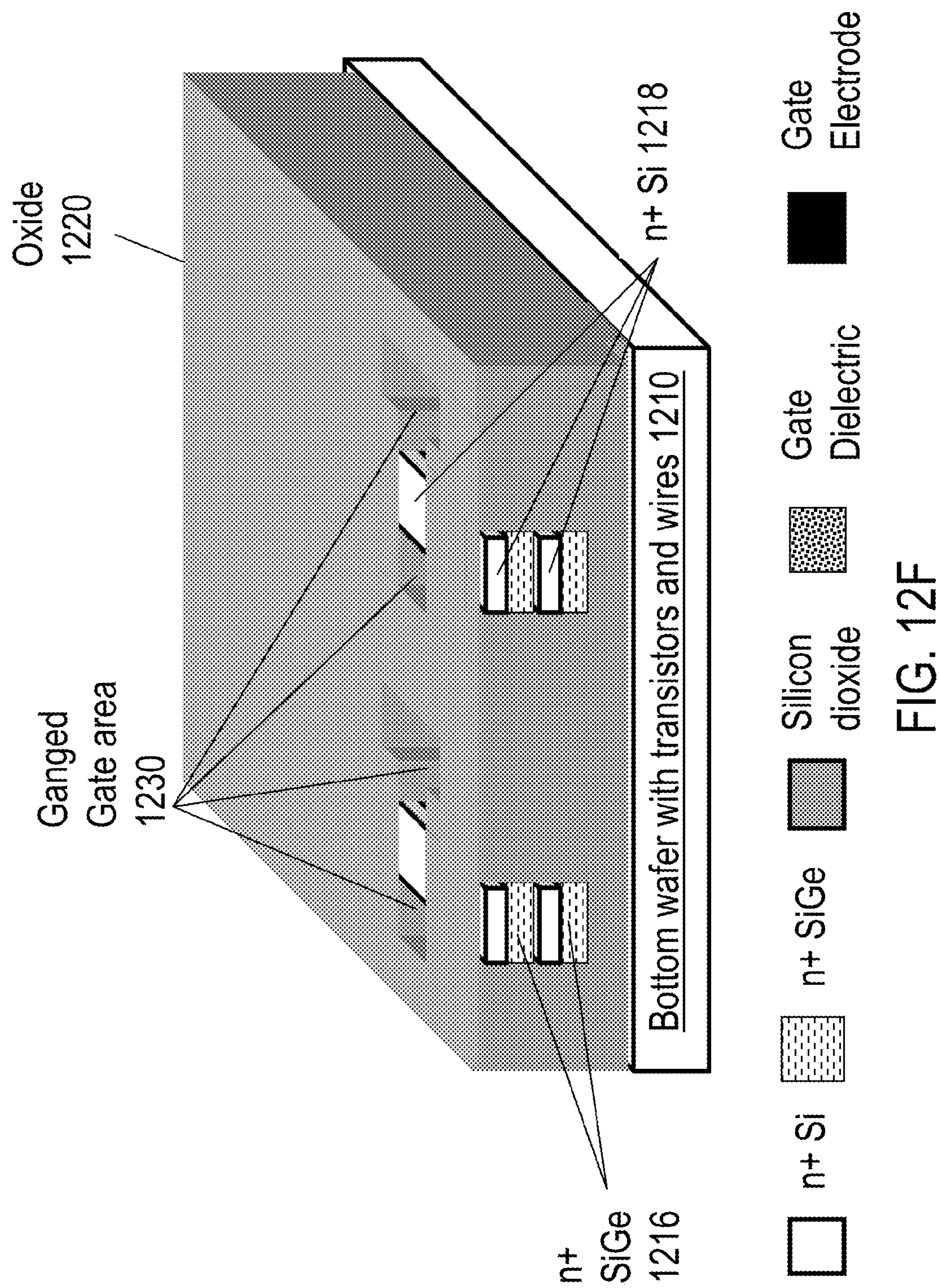

As illustrated in FIG. 12F, eventual ganged or common gate area 1230 may be lithographically defined and oxide etched. This will expose the transistor channels and gate area stack sidewalls of alternating N+ silicon 1218 and n+ SiGe 1216 regions to the eventual ganged or common gate area 1230. The stack ends are exposed in the illustration for clarity of understanding.

Figure 12G:
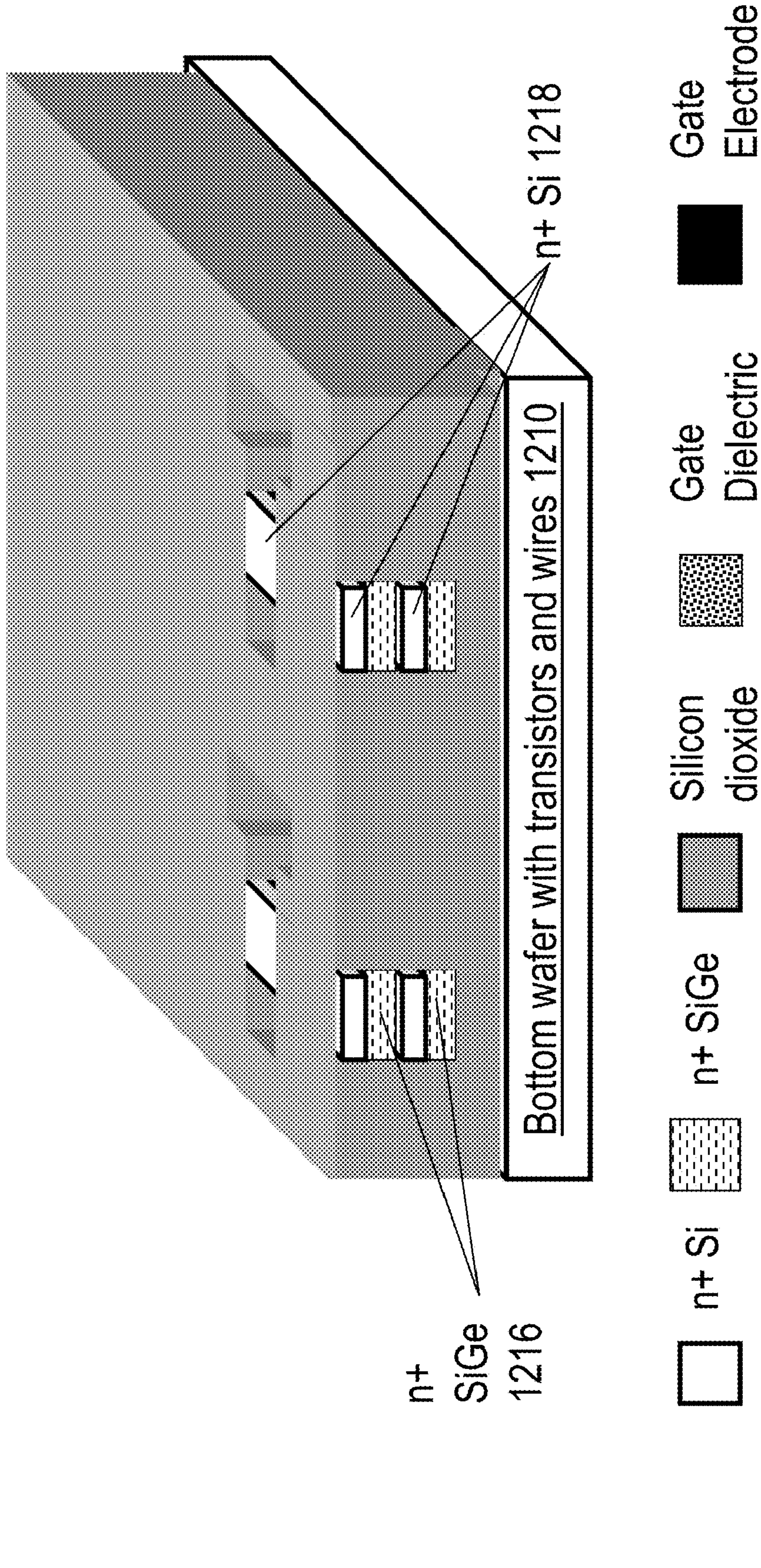

As illustrated in FIG. 12G, the exposed n+ SiGe regions 1216 may be removed by a selective etch recipe that does not attack the N+ silicon regions 1218. This creates air gaps between the N+ silicon regions 1218 in the eventual ganged or common gate area 1230. Such etching recipes are described in "High performance 5 nm radius twin silicon nanowire MOSFET(TSNWFET): Fabrication on bulk Si wafer, characteristics, and reliability," in *Proc. IEDMTech. Dig.,* 2005, pp. 717-720 by S. D. Suk, et. al. The n+ SiGe layers farthest from the top edge may be stoichiometrically crafted such that the etch rate of the layer (now region) farthest from the top (such as n+ SiGe layer 1208) may etch slightly faster than the layer (now region) closer to the top (such as n+ SiGe layer 1204), thereby equalizing the eventual gate lengths of the two stacked transistors. The stack ends are exposed in the illustration for clarity of understanding.

Figure 12H:
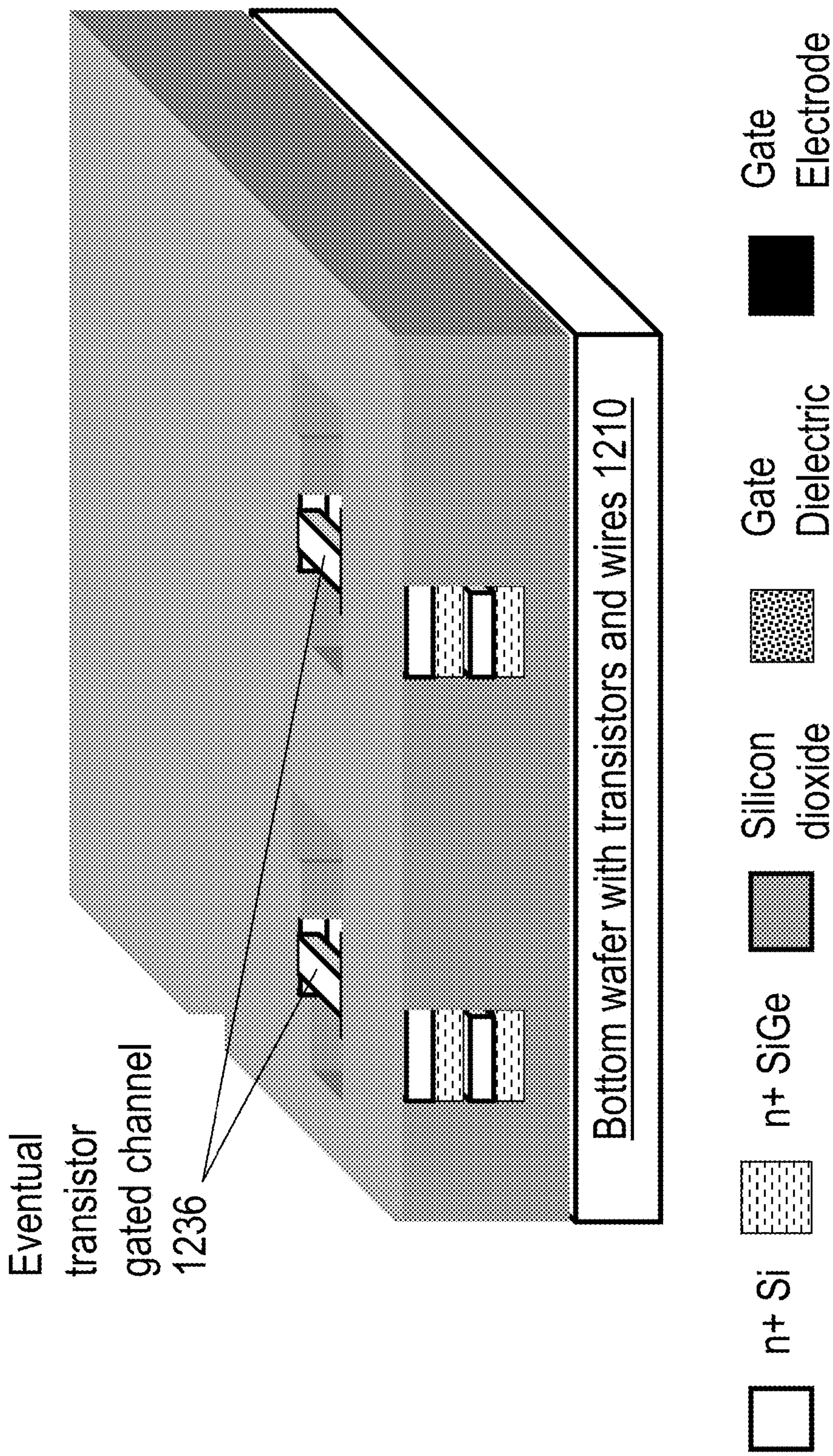

As illustrated in FIG. 12H, an optional step of reducing the surface roughness, rounding the edges, and thinning the diameter of the N+ silicon regions 1218 that are exposed in the ganged or common gate area may utilize a low temperature oxidation and subsequent HF etch removal of the oxide just formed. This may be repeated multiple times. Hydrogen may be added to the oxidation or separately utilized atomically as a plasma treatment to the exposed N+ silicon surfaces. The result may be a rounded silicon nanowire-like structure to form the eventual transistor gated channel 1236. The stack ends are exposed in the illustration for clarity of understanding.

Figure 12I:
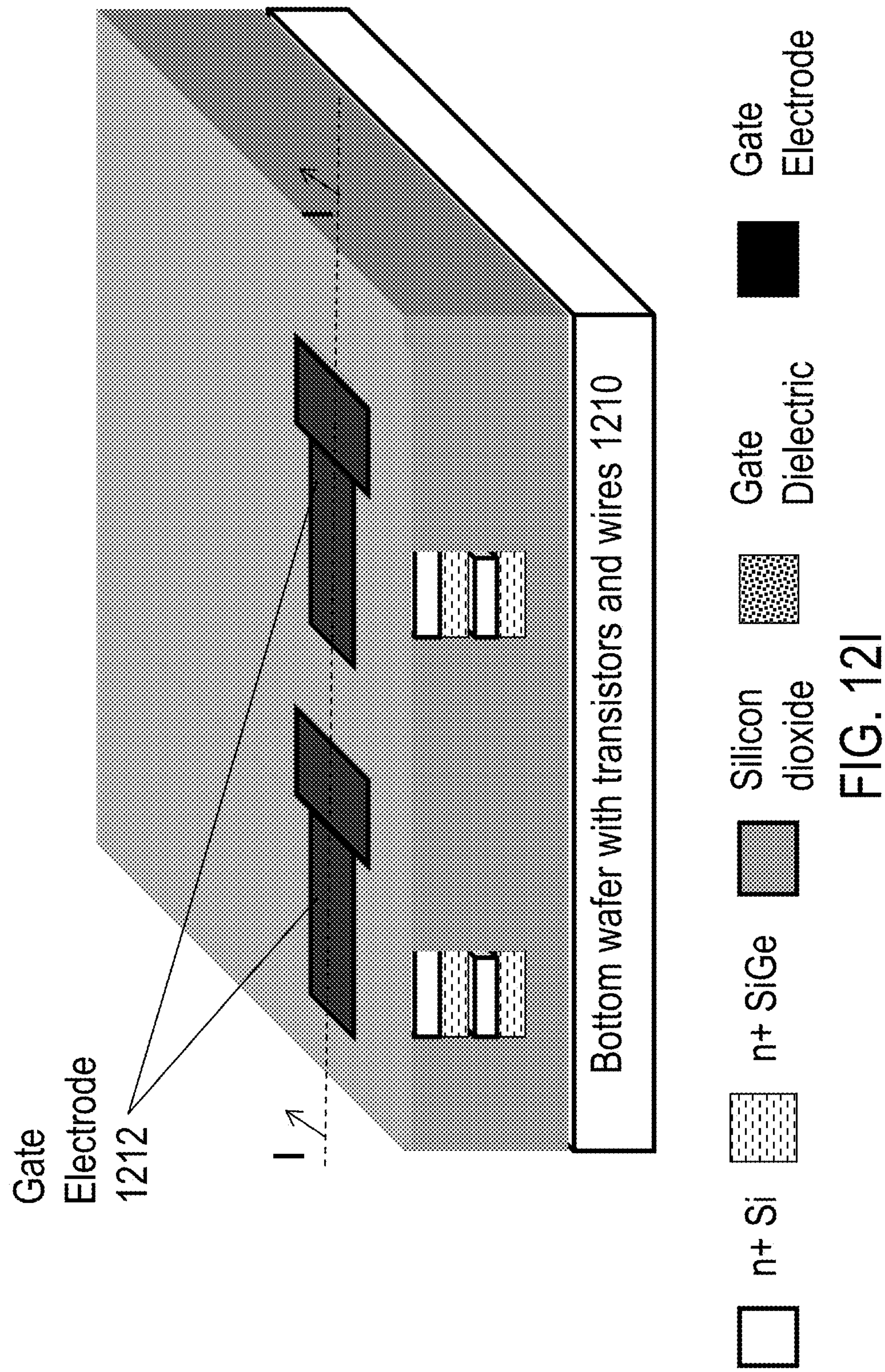

As illustrated in FIG. 12I a low temperature based Gate Dielectric may be deposited and densified to serve as the junction-less transistor gate oxide. Alternatively, a low temperature microwave plasma oxidation of the eventual transistor gated channel 1236 silicon surfaces may serve as the JLT gate oxide or an atomic layer deposition (ALD) technique may be utilized to form the HKMG gate oxide as previously described. Then deposition of a low temperature gate material 1212, such as, for example, P+ doped amorphous silicon, may be performed. Alternatively, a HKMG gate structure may be formed as described previously. A CMP is performed after the gate material deposition. The stack ends are exposed in the illustration for clarity of understanding.

Figure 12J:
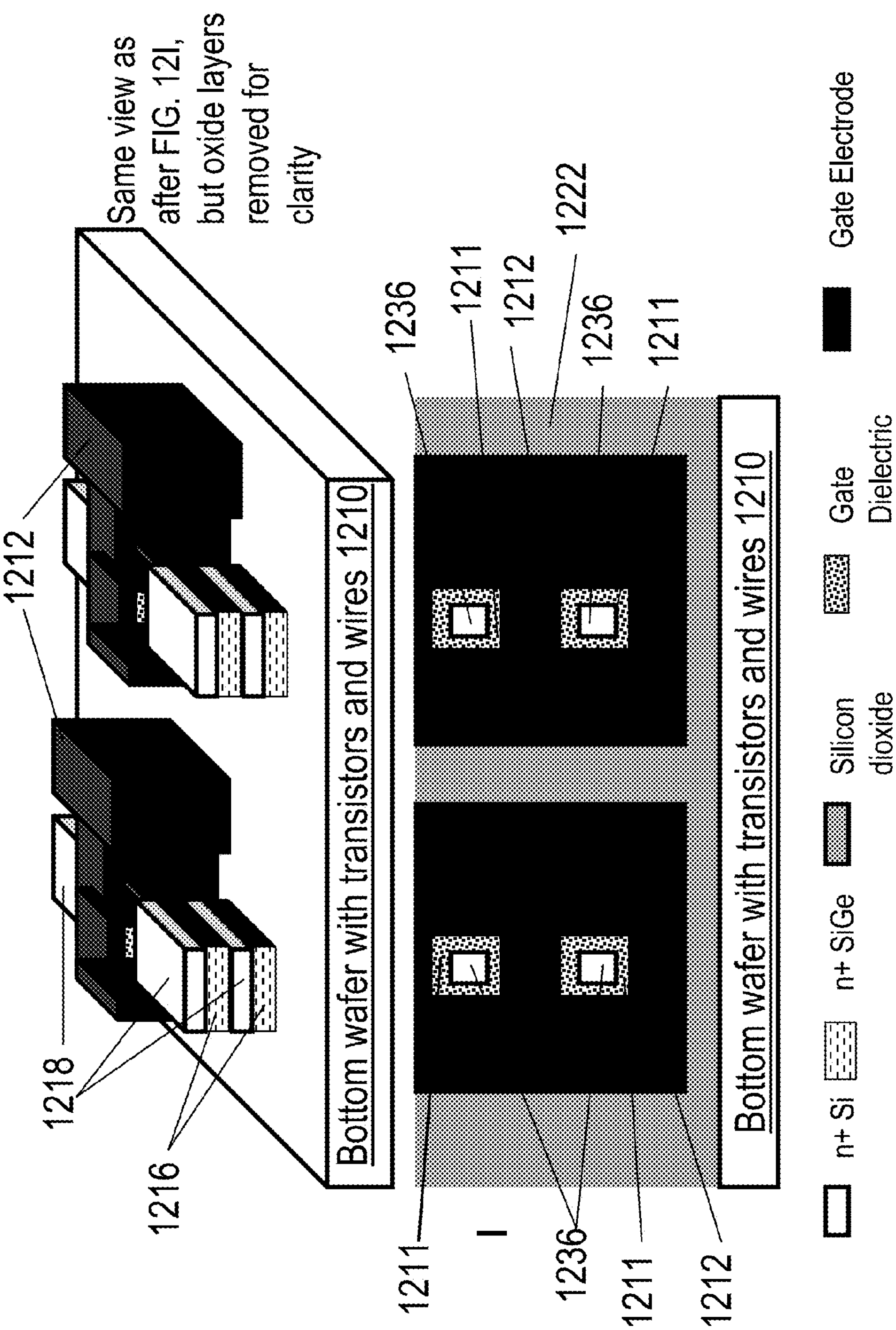

FIG. 12J shows the complete JLT transistor stack formed in FIG. 12I with the oxide removed for clarity of viewing, and a cross-sectional cut I of FIG. 12I. Gate 1212 surrounds the transistor gated channel 1236 and each ganged or common transistor stack is isolated from one another by oxide 1222. The source and drain connections of the transistor stacks can be made to the N+ Silicon 1218 and n+ SiGe 1216 regions that are not covered by the gate 1212.

Contacts to the 4-sided gated JLT source, drain, and gate may be made with conventional Back end of Line (BEOL) processing as described previously and coupling from the formed JLTs to the acceptor wafer may be accomplished with formation of a thru layer via connection to an acceptor wafer metal interconnect pad also described previously. This flow enables the formation of a mono-crystalline silicon channel 4-sided gated junction-less transistor that may be formed and connected to the underlying multi-metal layer semiconductor device without exposing the underlying devices to a high temperature.

A p channel 4-sided gated JLT may be constructed as above with the N+ silicon layers 1202 and 1208 formed as P+ doped, and the gate metals 1212 are of appropriate work function to shutoff the p channel at a gate voltage of zero.

While the process flow shown in FIGS. 12A-J illustrates the key steps involved in forming a four-sided gated JLT with 3D stacked components, it is conceivable to one skilled in the art that changes to the process can be made. For example, process steps and additional materials/regions to add strain to JLTs may be added. Additionally, N+ SiGe layers 1204 and 1208 may instead be comprised of p+ SiGe or undoped SiGe and the selective etchant formula adjusted. Furthermore, more than two layers of chips or circuits can be 3D stacked. Also, there are many methods to construct silicon nanowire transistors. These are described in "High performance and highly uniform gate-all-around silicon nanowire MOSFETs with wire size dependent scaling," Electron Devices Meeting (IEDM), 2009 *IEEE International*, vol., no., pp. 1-4, 7-9 Dec. 2009 by Bangsaruntip, S.; Cohen, G. M.; Majumdar, A.; et al. ("Bangsaruntip") and in "High performance 5 nm radius twin silicon nanowire MOSFET(TSNWFET): Fabrication on bulk Si wafer, characteristics, and reliability," in *Proc. IEDMTech. Dig.,* 2005, pp. 717-720 by S. D. Suk, S.-Y. Lee, S.-M. Kim, et al. ("Suk"). Contents of these publications are incorporated in this document by reference. The techniques described in these publications can be utilized for fabricating four-sided gated JLTs.

Turning the channel off with minimal leakage at an approximately zero gate bias is a major challenge for a junction-less transistor device. To enhance gate control over the transistor channel, the channel may be doped unevenly; whereby the heaviest doping is closest to the gate or gates and the channel doping is lighter farther away from the gate electrode. For example, the cross-sectional center of a 2, 3, or 4 gate sided junction-less transistor channel is more lightly doped than the edges. This may enable much lower transistor off currents for the same gate work function and control.

Figure 13B:
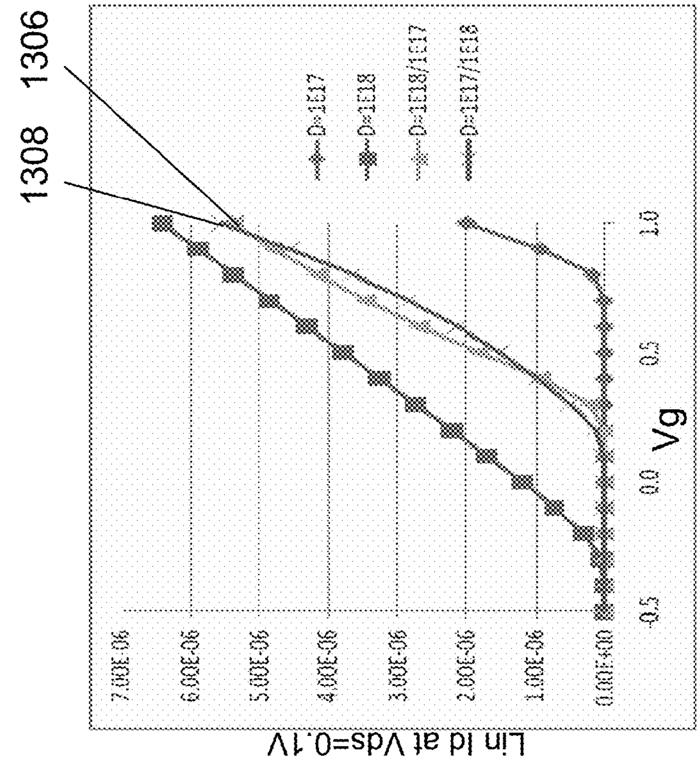
FIG. 13A, 13B are exemplary device simulations of a junction-less transistor.
Figure 13A:
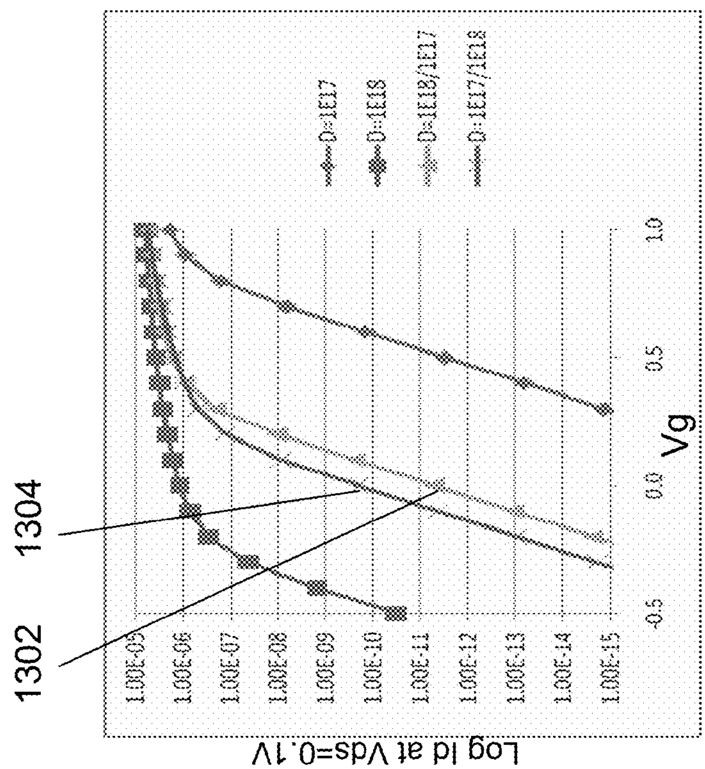

As illustrated in FIGS. 13A and 13B, drain to source current (Ids) as a function of the gate voltage (Vg) for various junction-less transistor channel doping levels is simulated where the total thickness of the n-type channel is 20 nm. The y-axis of FIG. 13A is plotted as logarithmic and FIG. 13B as linear. Two of the four curves in each figure correspond to evenly doping the nm channel thickness to 1E17 and 1E18 atoms/cm3, respectively. The remaining two curves show simulation results where the 20 nm channel has two layers of 10 nm thickness each. In the legend denotations for the remaining two curves, the first number corresponds to the 10 nm portion of the channel that is the closest to the gate electrode. For example, the curve D=1E18/1E17 shows the simulated results where the 10 nm channel portion doped at 1E18 is closest to the gate electrode while the 10 nm channel portion doped at 1E17 is farthest away from the gate electrode. In FIG. 13A, curves 1302 and 1304 correspond to doping patterns of D=1E18/1E17 and D=1E17/1E18, respectively. According to FIG. 13A, at a Vg of 0 volts, the off current for the doping pattern of D=1E18/1E17 is approximately 50 times lower than that of the reversed doping pattern of D=1E17/1E18. Likewise, in FIG. 13B, curves 1306 and 1308 correspond to doping patterns of D=1E18/1E17 and D=1E17/1E18, respectively. FIG. 13B shows that at a Vg of 1 volt, the Ids of both doping patterns are within a few percent of each other.

The junction-less transistor channel may be constructed with even, graded, or discrete layers of doping. The channel may be constructed with materials other than doped mono-crystalline silicon, such as, for example, poly-crystalline silicon, or other semi-conducting, insulating, or conducting material, such as, for example, graphene or other graphitic material, and may be in combination with other layers of similar or different material. For example, the center of the channel may include a layer of oxide, or of lightly doped silicon, and the edges more heavily doped single crystal silicon. This may enhance the gate control effectiveness for the off state of the resistor, and may also increase the on-current due to strain effects on the other layer or layers in the channel. Strain techniques may also be employed from covering and insulator material above, below, and surrounding the transistor channel and gate. Lattice modifiers may also be employed to strain the silicon, such as, for example, an embedded SiGe implantation and anneal. The cross section of the transistor channel may be rectangular, circular, or oval shaped, to enhance the gate control of the channel. Alternatively, to optimize the mobility of the P-channel junction-less transistor in the 3D layer transfer method, the donor wafer may be rotated with respect to the acceptor wafer prior to bonding to facilitate the creation of the P-channel in the <110> silicon plane direction.

As illustrated in FIGS. 14A to 14I, an n-channel 3-sided gated junction-less transistor (JLT) may be constructed that is suitable for 3D IC manufacturing. This structure may improve the source and drain contact resistance by providing for a higher doping at the metal contact surface than in the transistor channel. Additionally, this structure may be utilized to create a two layer channel wherein the layer closest to the gate is more highly doped.

Figures 14A, 14B:
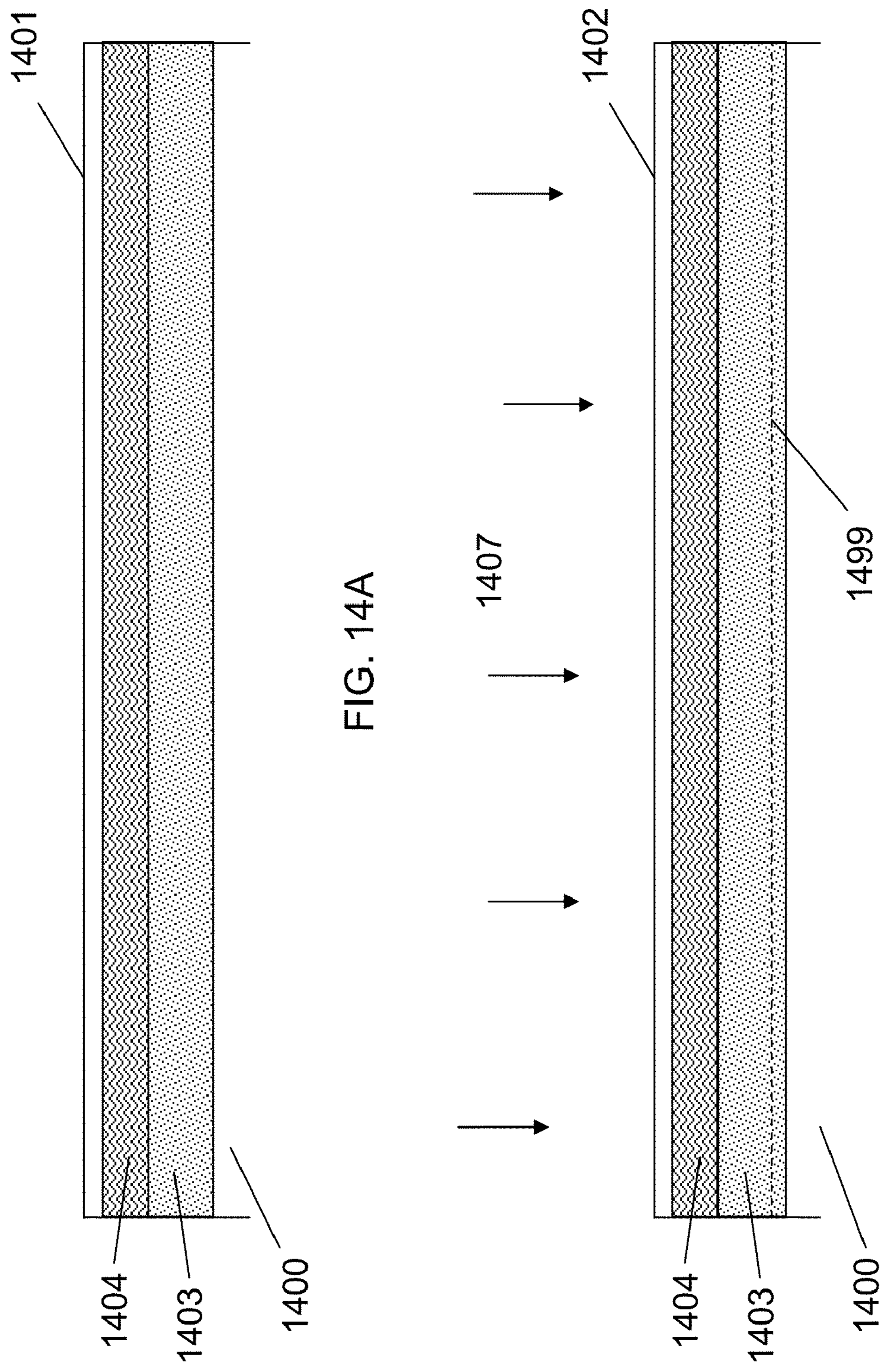
FIGS. 14A-I are exemplary drawing illustrations of the formation of a junction-less transistor.

As illustrated in FIG. 14A, an N− substrate donor wafer 1400 may be processed to comprise two wafer sized layers of N+ doping 1403 and 1404. The top N+ layer 1404 has a lower doping concentration than the bottom N+ doping layer 1403. The N+ doping layers 1403 and 1404 may be formed by ion implantation and thermal anneal. The layer stack may alternatively be formed by successive epitaxially deposited doped silicon layers of N+ silicon with differing dopant concentrations or by a combination of epitaxy and implantation. A screen oxide 1401 may be grown or deposited before the implants to protect the silicon from implant contamination and to provide an oxide surface for later wafer to wafer bonding. The N+ layer 1404 may alternatively be a deposited layer of heavily N+ doped polysilicon that may be optically annealed to form large grains, or the structures may be formed by one or more depositions of in-situ doped amorphous silicon to create the various dopant layers or gradients. The N+ doped layer 1404 may be formed by doping the N− substrate wafer 1400 by Plasma Assisted Doping (PLAD) techniques. These processes may be done at temperatures above 400° C. as the layer transfer to the processed substrate with metal interconnects has yet to be done.

As illustrated in FIG. 14B, the top surface of donor wafer 1400 may be prepared for oxide wafer bonding with a deposition of an oxide 1402 or by thermal oxidation of the N+ layer 1404 to form oxide layer 1402, or a re-oxidation of implant screen oxide 1401. A layer transfer demarcation plane 1499 (shown as a dashed line) may be formed in donor wafer 1400 or in the N+ layer 1404 (as shown) by hydrogen implantation 1407 or other methods as previously described. Both the donor wafer 1400 and acceptor wafer 1410 may be prepared for wafer bonding as previously described and then low temperature (less than approximately 400° C.) bonded. The portion of the N+ layer 1403 and the N− donor wafer substrate 1400 that are above the layer transfer demarcation plane 1499 may be removed by cleaving and polishing, or other low temperature processes as previously described, such as, for example, ion-cut or other methods.

Figure 14C:
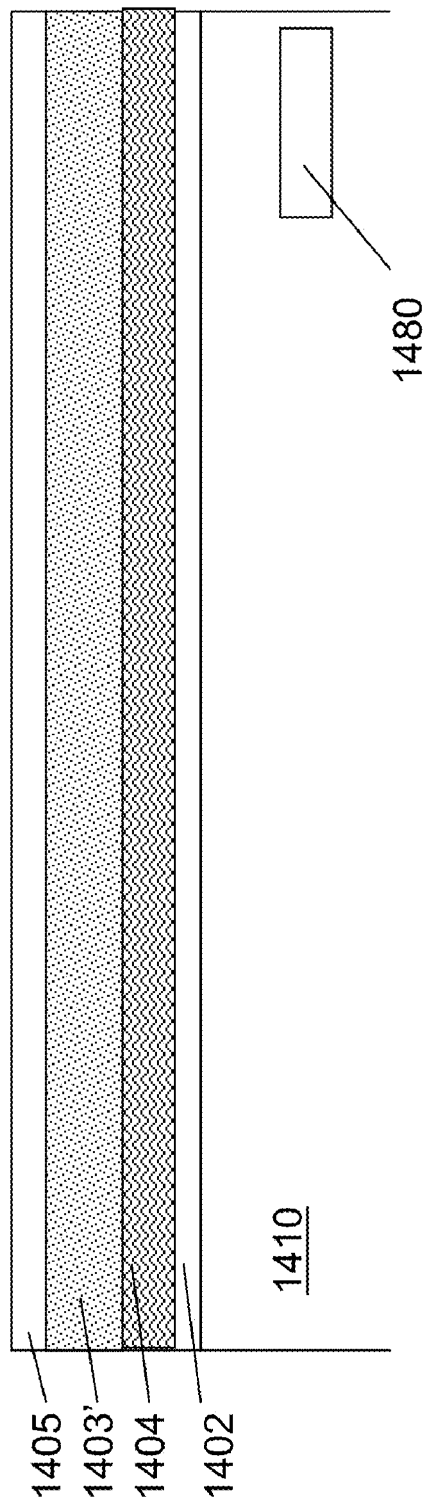

As illustrated in FIG. 14C, the remaining N+ layer 1403', lighter N+ doped layer 1404, and oxide layer 1402 have been layer transferred to acceptor wafer 1410. The top surface of N+ layer 1403' may be chemically or mechanically polished and an etch hard mask layer of low temperature silicon nitride 1405 may be deposited on the surface of N+ doped layer 1403', including a thin oxide stress buffer layer. Now transistors may be formed with low temperature (less than approximately 400° C.) processing and aligned to the acceptor wafer 1410 alignment marks (not shown). The acceptor wafer metal connect pad 1480 is also illustrated. For illustration clarity, the oxide layers used to facilitate the wafer to wafer bond are not shown in subsequent drawings.

Figure 14D:
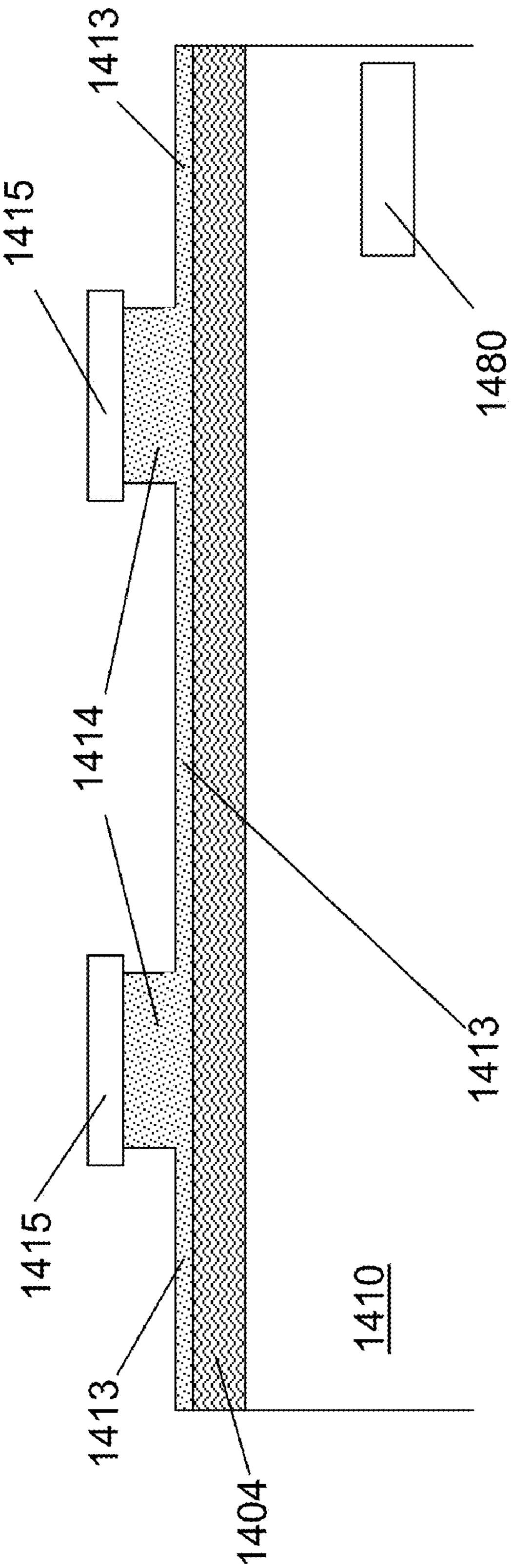

As illustrated in FIG. 14D the source and drain connection areas may be lithographically defined, the silicon nitride etch hard mask 1405 layer may be etched, and the photoresist may be removed, leaving regions 1415 of etch hard mask. A partial or full silicon plasma/RIE etch may be performed to thin or remove N+ doped layer 1403'. Alternatively, one or more a low temperature oxidations coupled with a Hydrofluoric Acid etch of the formed oxide may be utilized to thin N+ doped layer 1403'. This results in a two-layer channel, as described and simulated above in conjunction with FIGS. 13A and 13B, formed by thinning layer 1403' with the above etch process to almost complete removal, leaving some of layer 1403' remaining (now labeled 1413) on top of the lighter N+ doped 1404 layer and the full thickness of 1403' (now labeled 1414) still remaining underneath the etch hard mask 1415. A complete removal of the top channel layer 1403' in the areas not underneath 1415 may also be performed. This etch process may also be utilized to adjust for post layer transfer cleave wafer-to-wafer CMP variations of the remaining donor wafer layers, such as 1400 and 1403' and provide less variability in the final channel thickness.

Figure 14E:
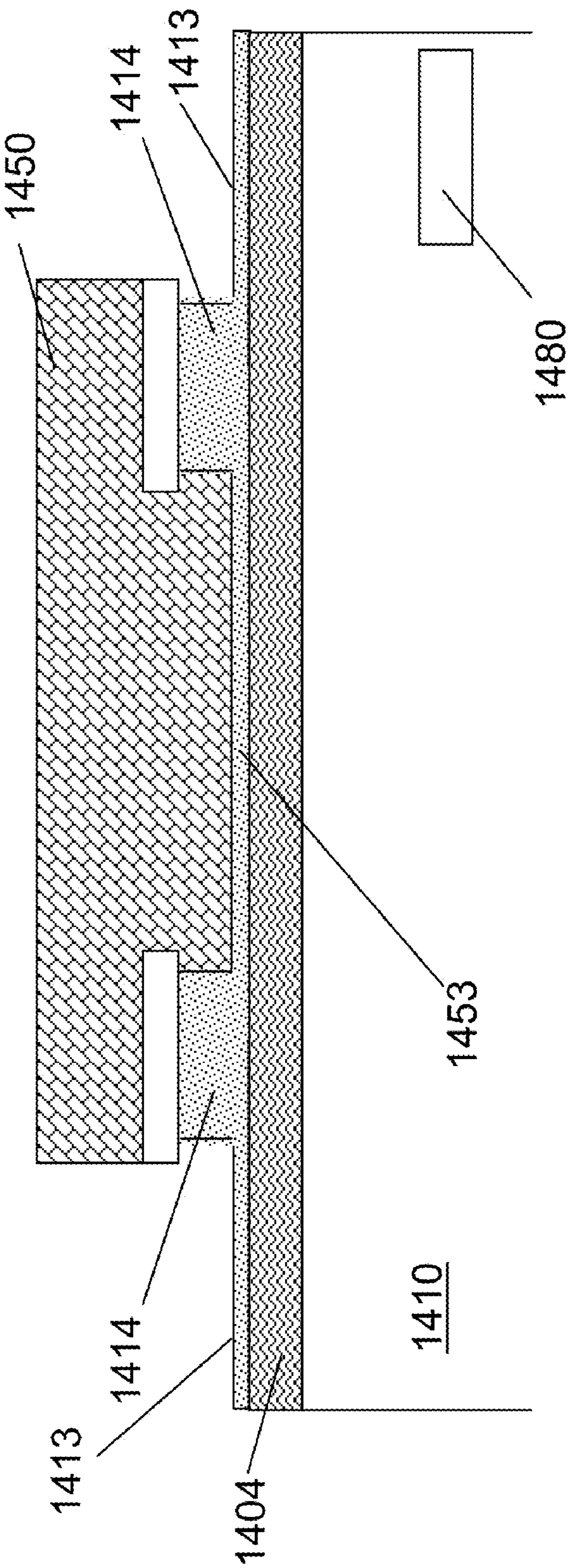

As illustrated in FIG. 14E photoresist 1450 may be lithographically defined to substantially cover the source and drain connection areas 1414 and the heavier N+ doped transistor channel layer region 1453, previously a portion of thinned N+ doped layer 1413.

Figure 14F:
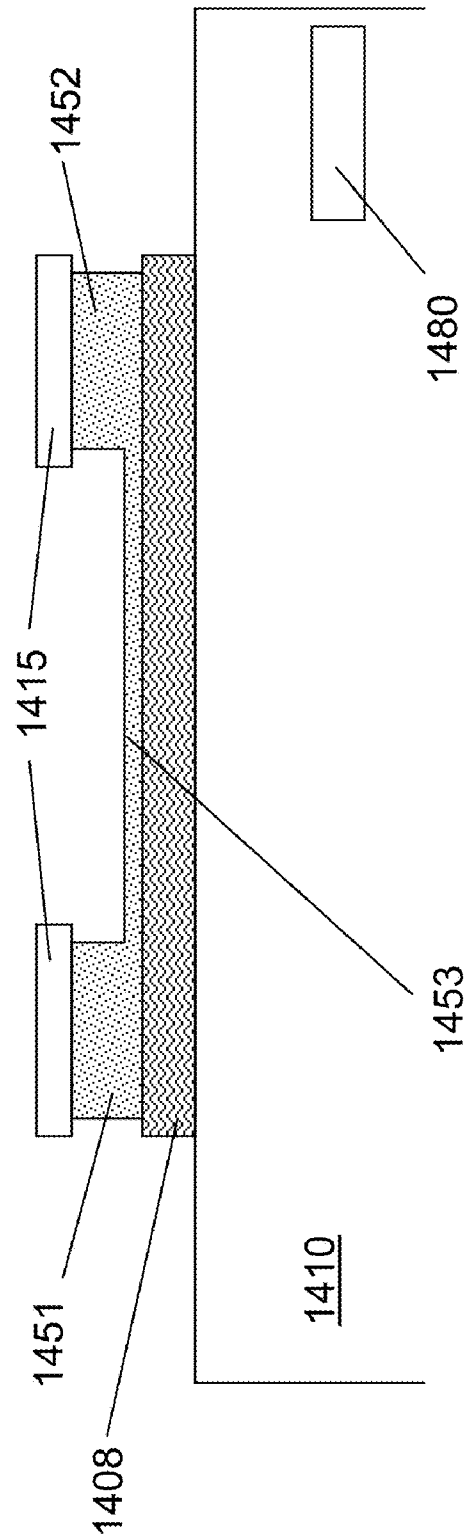

As illustrated in FIG. 14F the exposed portions of thinned N+ doped layer 1413 and the lighter N+ doped layer 1404 may be plasma/RIE etched and the photoresist 1450 removed. The etch forms source connection area 1451 and drain connection area 1352, provides isolation between transistors, and defines the width of the JLT channel composed of lighter doped layer region 1408 and thinned heavier N+ doped layer region 1453.

Figure 14G:
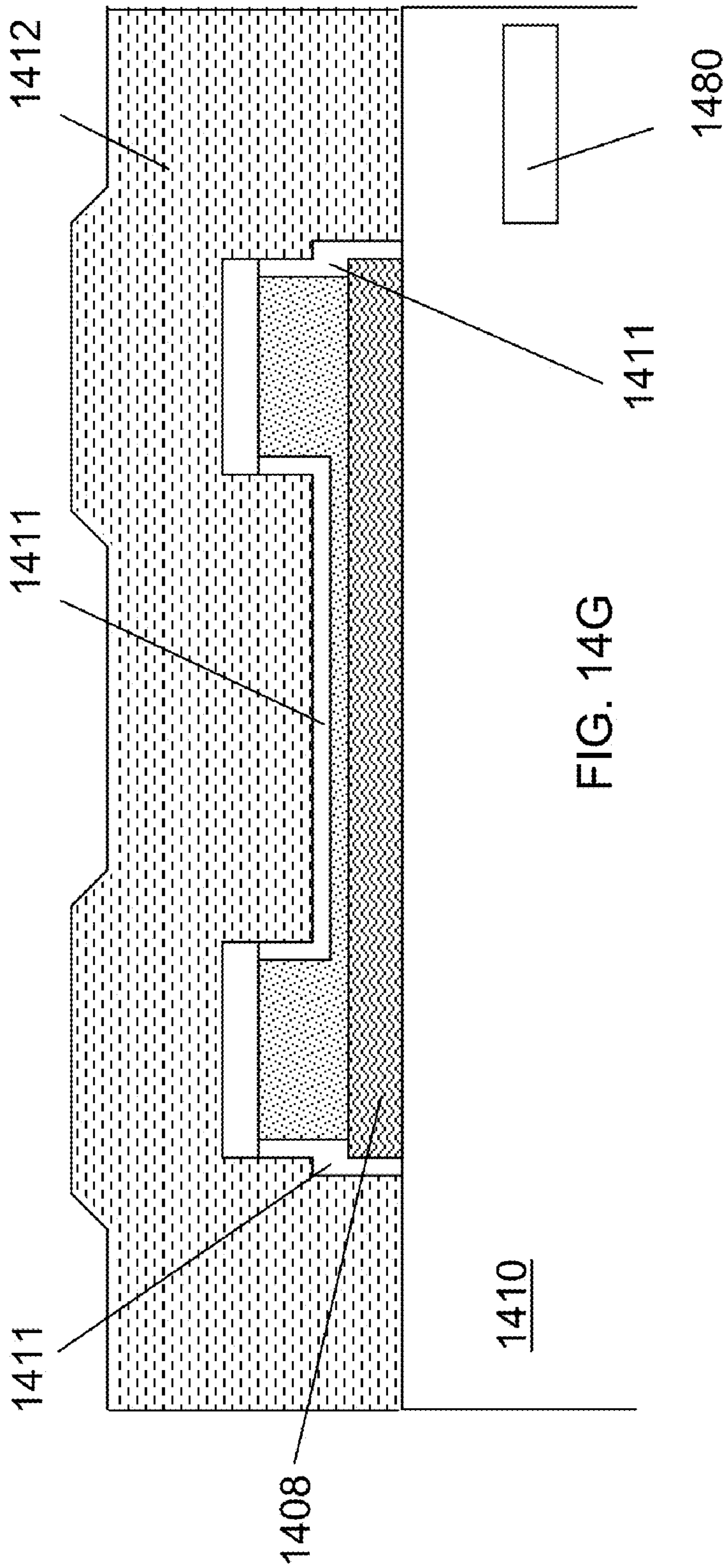

As illustrated in FIG. 14G, a low temperature based Gate Dielectric may be deposited and densified to serve as the gate oxide 1411 for the junction-less transistor. Alternatively, a low temperature microwave plasma oxidation of the transistor channel element 1408 silicon surfaces may serve as the JLT gate oxide 1411 or an atomic layer deposition (ALD) technique may be utilized to form the HKMG gate oxide as previously described. Then deposition of a low temperature gate material 1412, such as, for example, P+ doped amorphous silicon, may be performed. Alternatively, a HKMG gate structure may be formed as described previously.

Figure 14H:
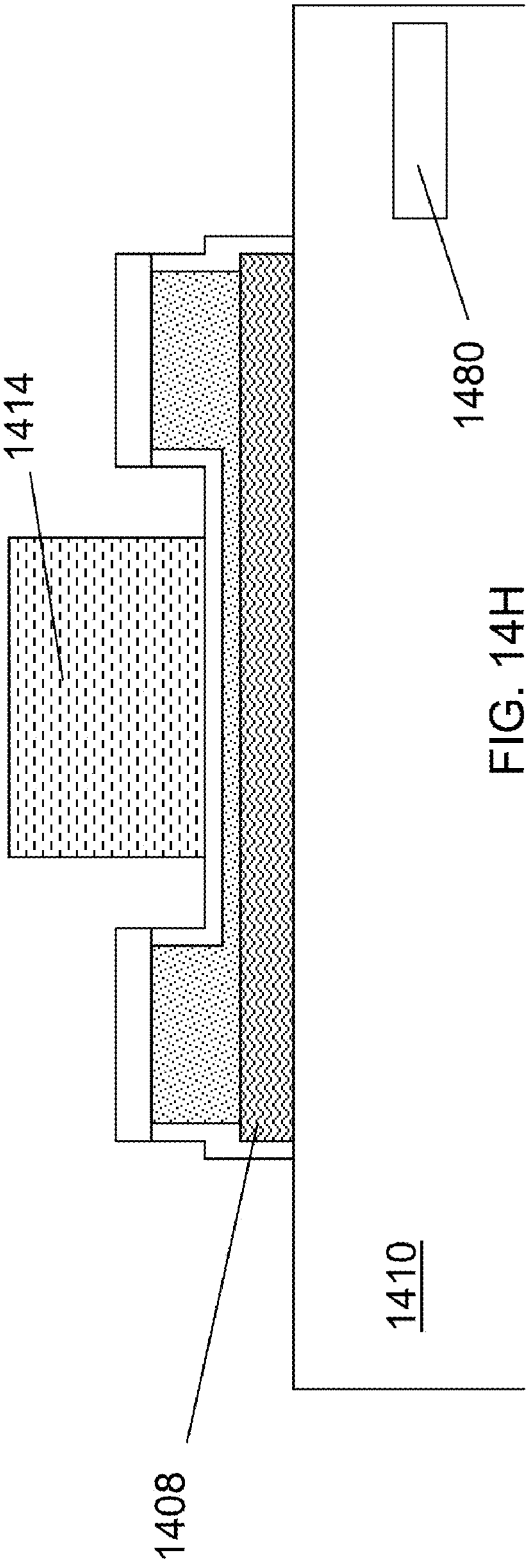
Figure 14I:
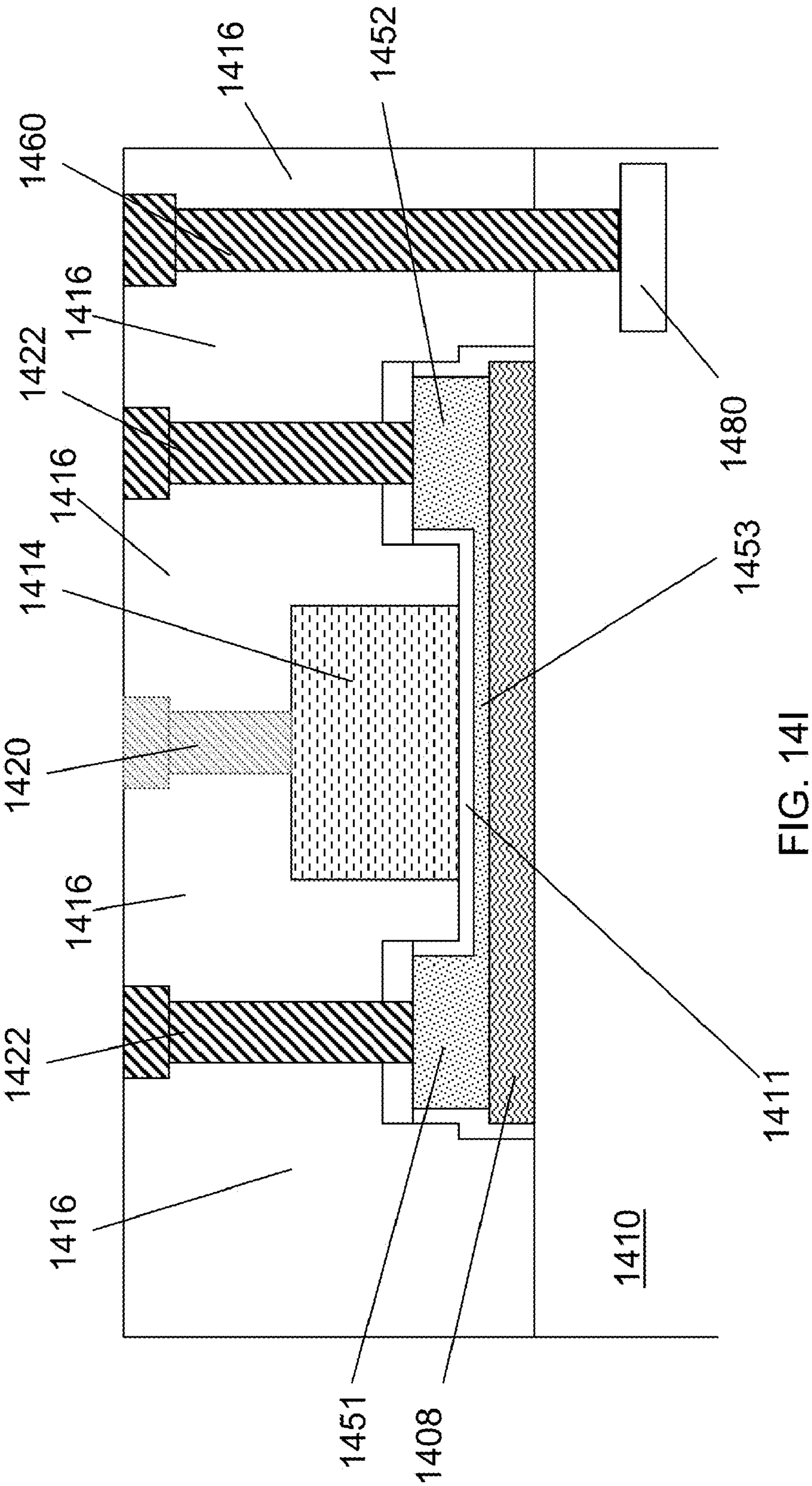

As illustrated in FIG. 14H, the gate material 1412 may be masked and etched to define the three sided (top and two side) gate electrode 1414 that is in an overlapping crossing manner, generally orthogonal, with respect to the transistor channel 1408.

As illustrated in 14I, the entire structure may be substantially covered with a Low Temperature Oxide 1416, which may be planarized with chemical mechanical polishing. The three sided gate electrode 1414, N+ transistor channel composed of lighter N+ doped silicon 1408 and heaver doped N+ silicon region 1453, gate dielectric 1411, source connection region 1351, and drain connection region 1452 are shown. Contacts and metal interconnects may be formed. The gate contact 1420 connects to the gate 1414. The two transistor channel terminal contacts (source and drain) 1422 independently connect to the transistor channel element 1408 on each side of the gate 1414. The layer via 1460 electrically couples the transistor layer metallization to the acceptor substrate 1410 at acceptor wafer metal connect pad 1480. This flow enables the formation of a mono-crystalline silicon channel with 1, 2, or 3-sided gated junction-less transistor with uniform, graded, or multiple layers of dopant levels in the transistor channel, which may be formed and connected to the underlying multi-metal layer semiconductor device without exposing the underlying devices to a high temperature processing step.

A p channel 1, 2, or 3-sided gated JLT may be constructed as above with the N+ layers 1404 and 1403 formed as P+ doped, and the gate metal 1412 is of appropriate work function to shutoff the p channel at a gate voltage of approximately zero.

As illustrated in FIGS. 15A to 15I, an n-channel planar Junction Field Effect Transistor (JFET) may be constructed that is suitable for 3D IC manufacturing.

Figure 15A:
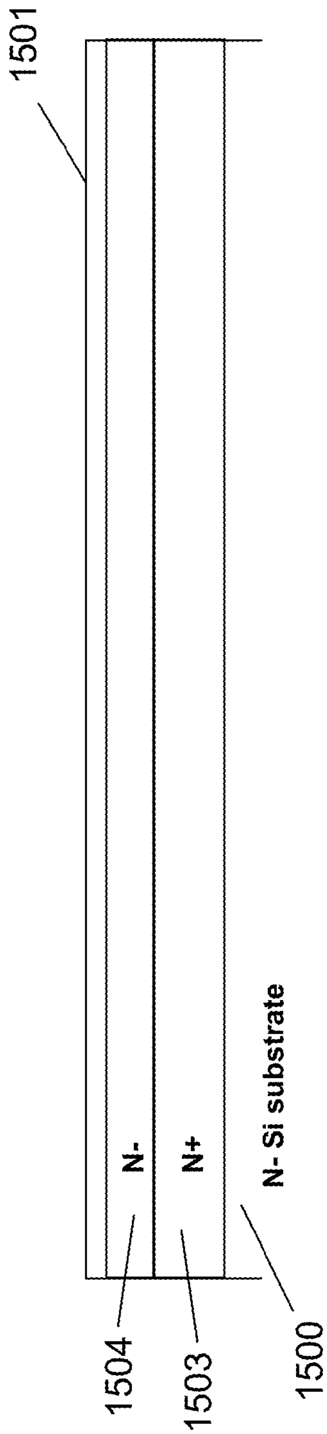
FIGS. 15A-I are exemplary drawing illustrations of the formation of a JFET transistor.

As illustrated in FIG. 15A, an N− substrate donor wafer 1500 may be processed to comprise two wafer sized layers of N+ doping 1503 and N− doping layer 1504. The N− layer 1504 may have the same or different dopant concentration than the N− substrate 1500. The N+ doping layer 1503 and N− doping layer 1504 may be formed by ion implantation and thermal anneal. The layer stack may alternatively be formed by successive epitaxially deposited doped silicon layers of N+ silicon then N− silicon or by a combination of epitaxy and implantation. A screen oxide 1501 may be grown before an implant to protect the silicon from implant contamination and to provide an oxide surface for later wafer to wafer bonding. These processes may be done at temperatures above 400° C. as the layer transfer to the processed substrate with metal interconnects has yet to be done.

Figure 15B:
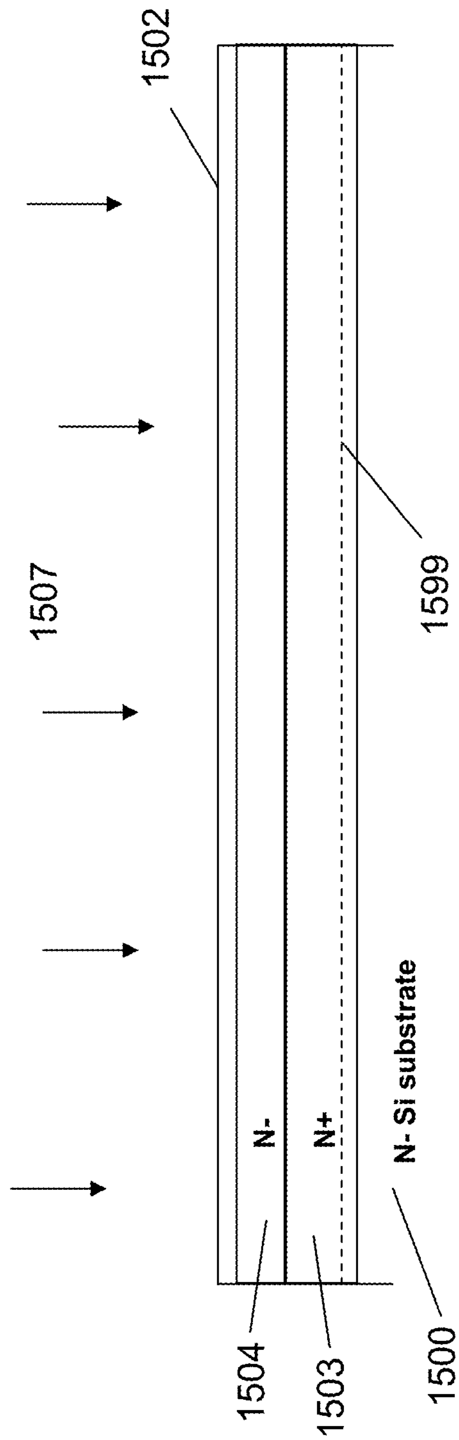

As illustrated in FIG. 15B, the top surface of donor wafer 1500 may be prepared for oxide wafer bonding with a deposition of an oxide 1502 or by thermal oxidation of the N− layer 1504 to form oxide layer 1502, or a re-oxidation of implant screen oxide 1501. A layer transfer demarcation plane 1599 (shown as a dashed line) may be formed in donor wafer 1500 or N+ layer 1503 (shown) by hydrogen implantation 1507 or other methods as previously described. Both the donor wafer 1500 and acceptor wafer 1510 may be prepared for wafer bonding as previously described and then low temperature (less than approximately 400° C.) bonded. The portion of the N+ layer 1503 and the N− donor wafer substrate 1500 that are above the layer transfer demarcation plane 1599 may be removed by cleaving and polishing, or other low temperature processes as previously described, such as, for example, ion-cut or other methods.

Figure 15C:
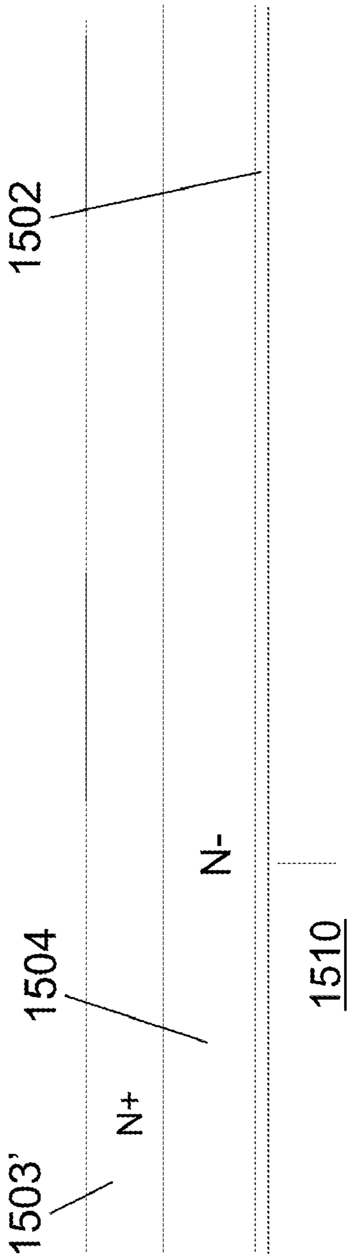

As illustrated in FIG. 15C, the remaining N+ layer 1503', N− doped layer 1504, and oxide layer 1502 have been layer transferred to acceptor wafer 1510. The top surface of N+ layer 1503' may be chemically or mechanically polished smooth and flat. Now transistors may be formed with low temperature (less than approximately 400° C.) processing and aligned to the acceptor wafer 1510 alignment marks (not shown). For illustration clarity, the oxide layers, such as, for example, 1502, used to facilitate the wafer to wafer bond are not shown in subsequent drawings.

Figure 15D:
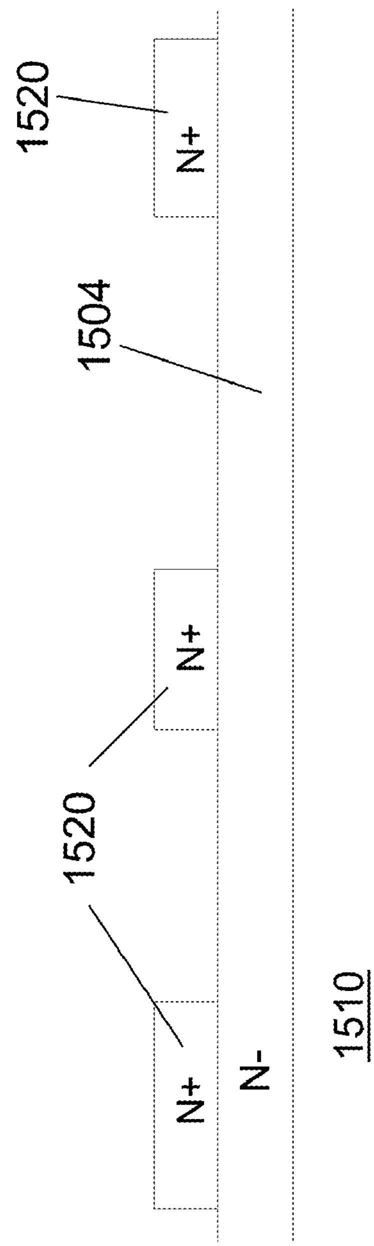

As illustrated in FIG. 15D the source and drain regions 1520 may be lithographically defined and then formed by etching away portions of N+ doped silicon layer 1503' down to at least the level of the N− layer 1504.

Figure 15E:
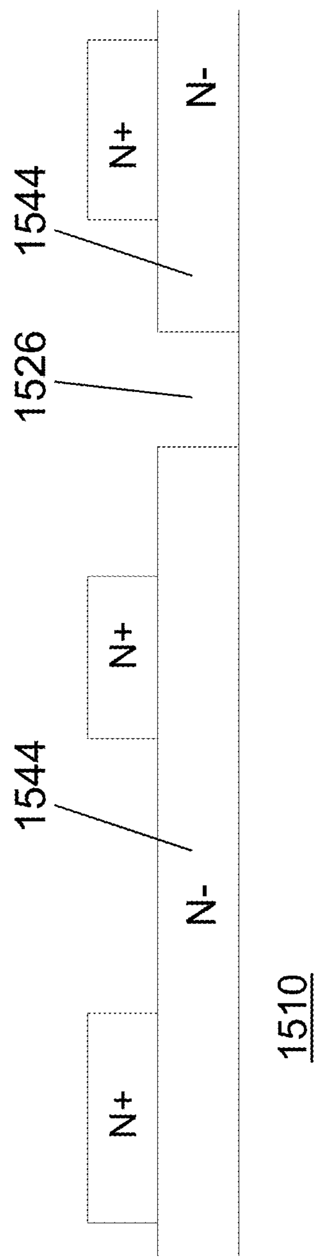

As illustrated in FIG. 15E transistor to transistor isolation regions 1526 may be lithographically defined and the N− doped layer 1504 plasma/RIE etched to form regions of JFET transistor channel 1544.

Figure 15F:
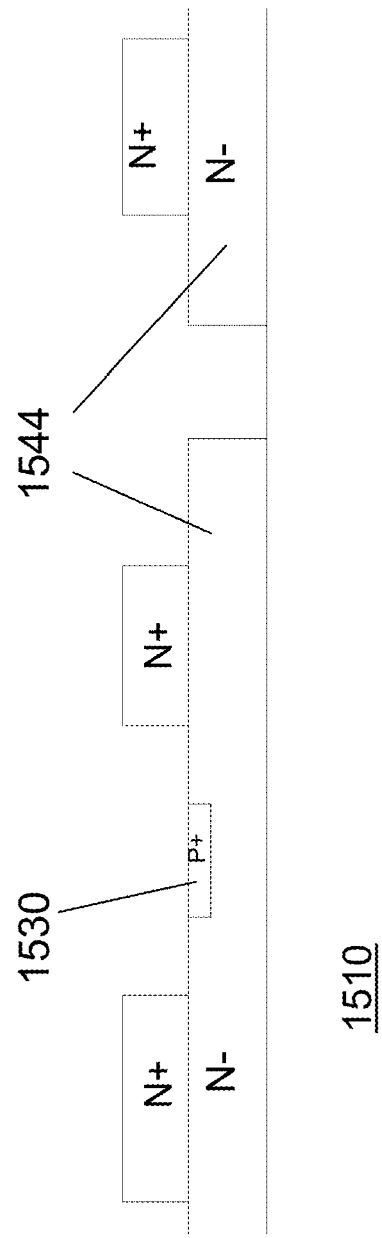

As illustrated in FIG. 15F, an optional formation of a shallow P+ region 1530 may be performed to create a JFET gate by utilizing a mask defined implant of P+ dopant, such as, for example, Boron. In this option there might be a need for laser or other method of optical annealing to activate the P+ implanted dopant.

Figure 15G:
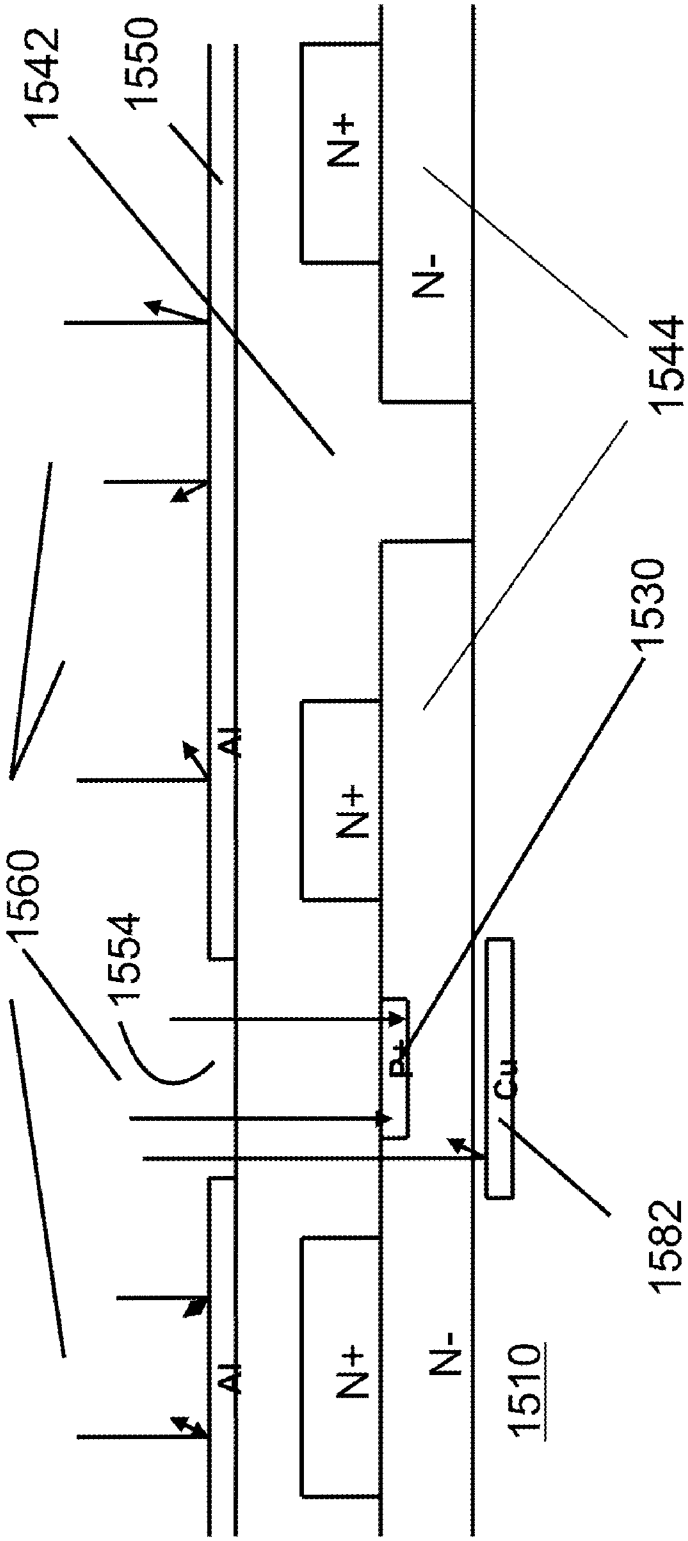

As illustrated in FIG. 15G, after a deposition and planarization of thick oxide 1542, a layer of a light reflecting material 1550, such as, for example, aluminum may be deposited if the P+ gate implant option is chosen. An opening 1554 in the reflective layer 1550 may be masked and etched, allowing the laser light or optical anneal radiation 1560 to heat the shallow P+ region 1530, and reflecting the majority of the laser or optical anneal energy 1560 away from acceptor wafer substrate 1510. Normally, the opening 1554 area is less than 10% of the total wafer area, thus greatly reducing the thermal stress on the underlying metal layers contained in acceptor substrate 1510. Additionally, a barrier metal clad copper layer 1582, or, alternatively, a reflective Aluminum layer or other reflective material, may be formed in the acceptor wafer substrate 1510 pre-processing and advantageously positioned under the reflective layer opening 1554 such that it will reflect any of the unwanted laser or optical anneal energy 1560 that might travel to the acceptor wafer substrate 1510. Acceptor substrate metal layer 1582 may also be utilized as a back-gate or back-bias source for the JFET transistor above it. In addition, absorptive materials may, alone or in combination with reflective materials, also be utilized in the above laser or other methods of optical annealing techniques.

Figure 15H:
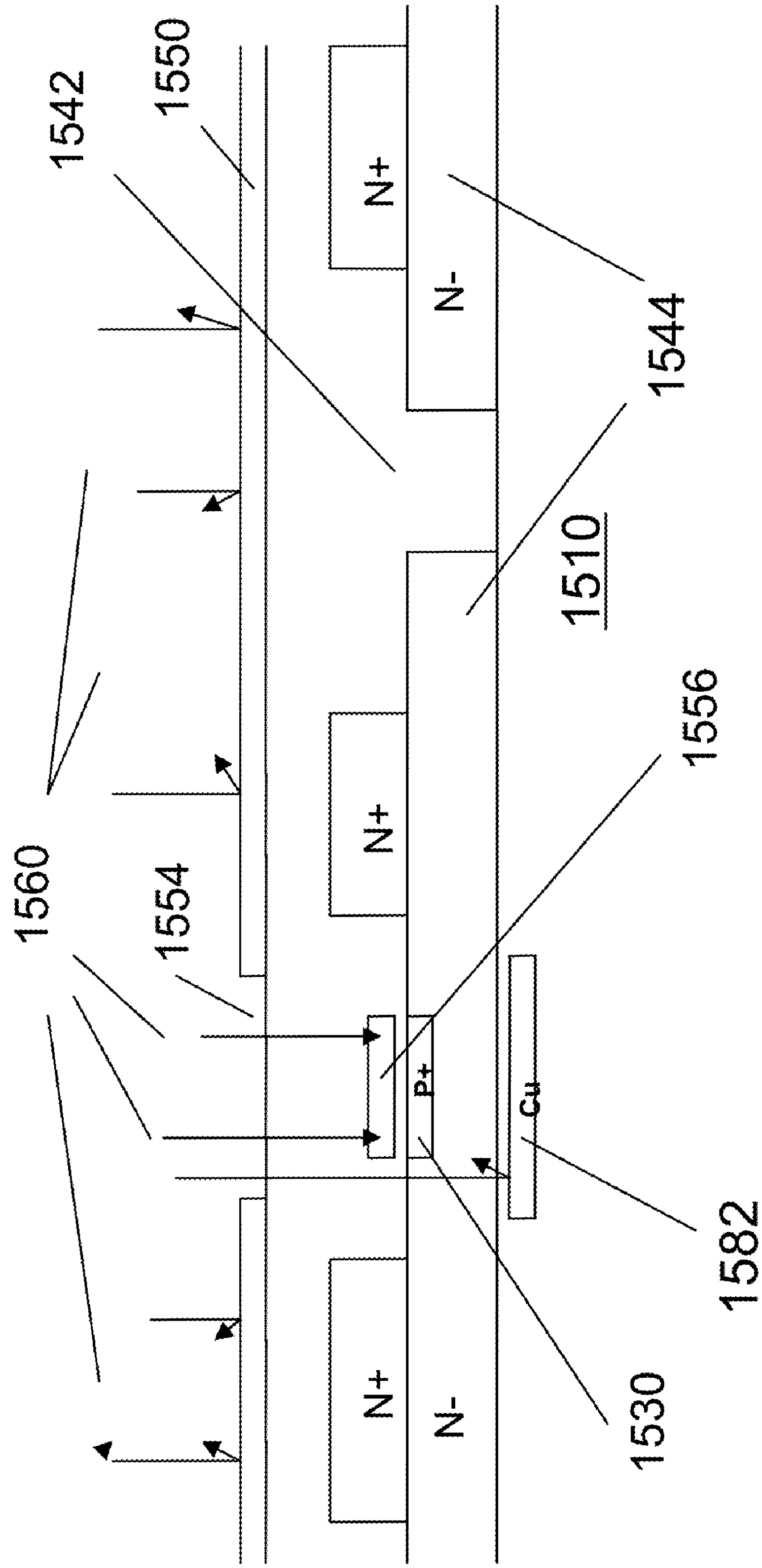

As illustrated in FIG. 15H, an optical energy absorptive region 1556, comprised of a material such as, for example, amorphous carbon, may be formed by low temperature deposition or sputtering and subsequent lithographic definition and plasma/RIE etching. This allows the minimum laser or other optical energy to be employed that effectively heats the implanted area to be activated, and thereby minimizes the heat stress on the reflective layers 1550 and 1582 and the acceptor substrate 1510 metallization.

Figure 15I:
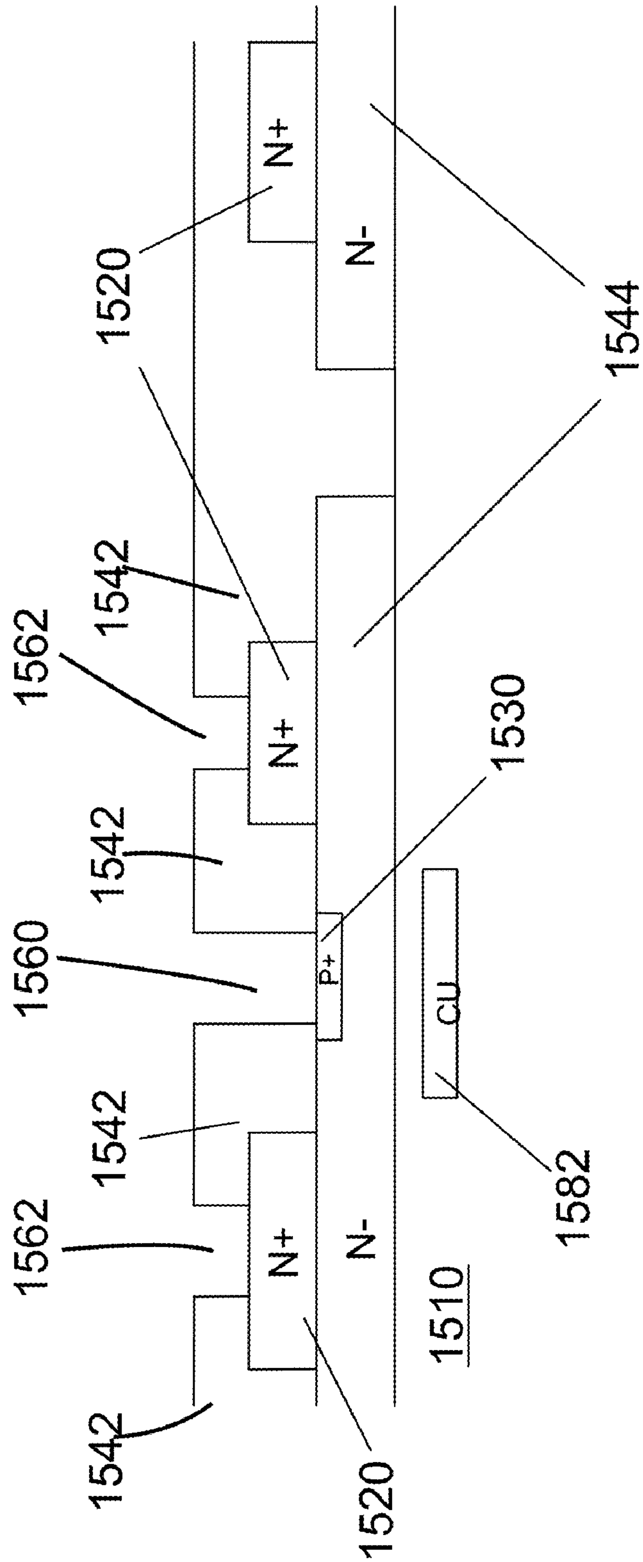

As illustrated in FIG. 15I, the reflective material 1550, if utilized, is removed, and the gate contact 1560 is masked and etched open thru oxide 1542 to shallow P+ region 1530 or transistor channel N− region 1544. Then deposition and partial etch-back (or Chemical Mechanical Polishing (CMP)) of aluminum (or other metal to obtain an optimal Schottky or ohmic gate contact 1560 to either transistor channel N+ 1544 or shallow P+ gate region 1530 respectively) may be performed. N+ contacts 1562 may be masked and etched open and metal may be deposited to create ohmic connections to the N+ regions 1520. Interconnect metallization may then be conventionally formed. The thru layer via 1560 (not shown) may be formed to electrically couple the JFET transistor layer metallization to the acceptor substrate 1510 at acceptor wafer metal connect pad 1580 (not shown). This flow enables the formation of a mono-crystalline silicon channel JFET that may be formed and connected to the underlying multi-metal layer semiconductor device without exposing the underlying devices to a high temperature.

A p channel JFET may be constructed as above with the N− layer 1504 and N+ layer 1503 formed as P− and P+ doped respectively, and the shallow P+ gate region 1530 formed as N+, and gate metal is of appropriate work function to create a proper Schottky barrier.

As illustrated in FIGS. 16A to 16G, an n-channel planar Junction Field Effect Transistor (JFET) with integrated bottom gate junction may be constructed that is suitable for 3D IC manufacturing.

Figure 16A:
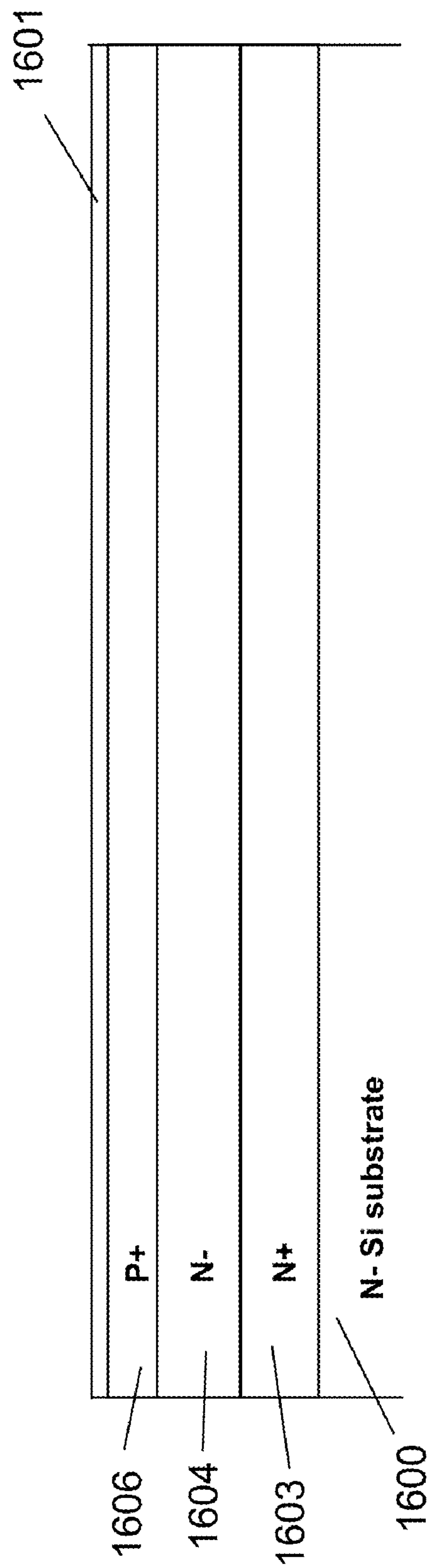
FIGS. 16A-G are exemplary drawing illustrations of the formation of a JFET transistor.

As illustrated in FIG. 16A, an N− substrate donor wafer 1600 may be processed to comprise three wafer sized layers of N+ doping 1603, N− doping 1604, and P+ doping 1606. The N− layer 1604 may have the same or a different dopant concentration than the N− substrate 1600. The N+ doping layer 1603, N− doping layer 1604, and P+ doping layer 1606 may be formed by ion implantation and thermal anneal. The layer stack may alternatively be formed by successive epitaxially deposited doped silicon layers of N+ silicon then N− silicon then P+ silicon or by a combination of epitaxy and implantation. The P+ doped layer 1606 may be formed by doping the top layer by Plasma Assisted Doping (PLAD) techniques. A screen oxide 1601 may be grown before an implant to protect the silicon from implant contamination and to provide an oxide surface for later wafer to wafer bonding. These processes may be done at temperatures above 400° C. as the layer transfer to the processed substrate with metal interconnects has yet to be done.

Figure 16B:
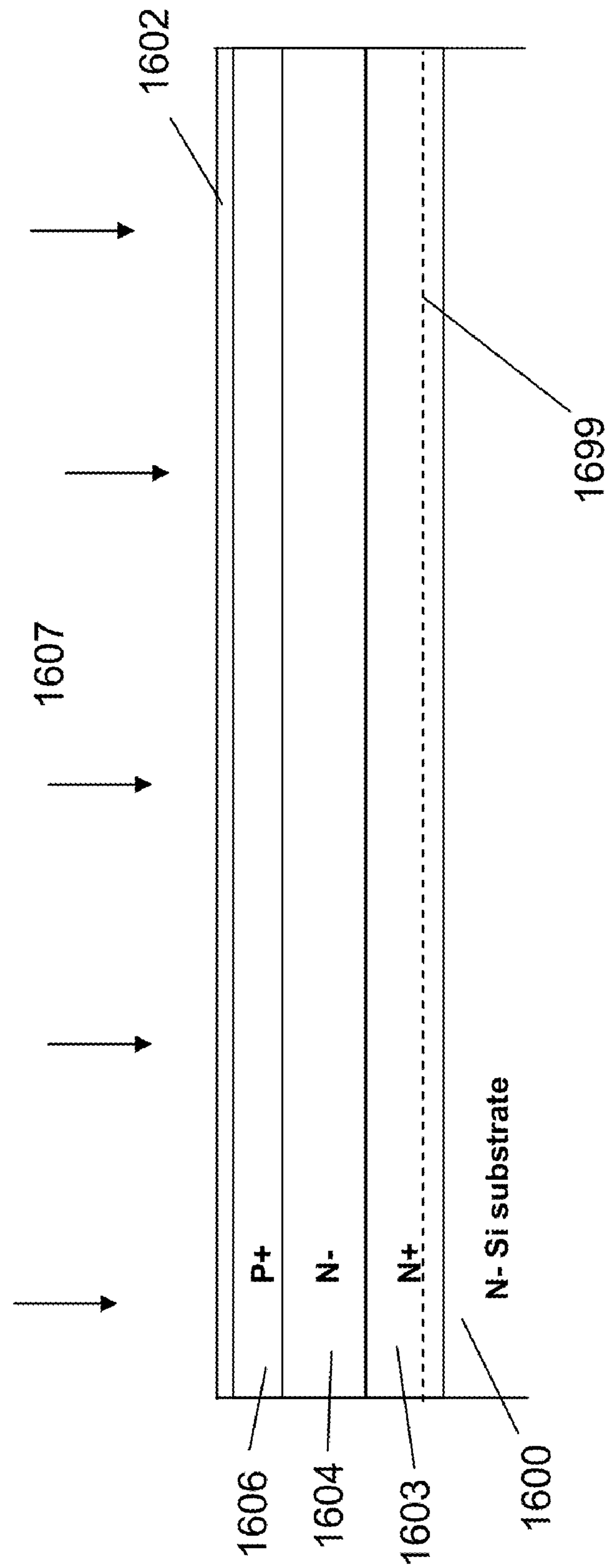

As illustrated in FIG. 16B, the top surface of donor wafer 1600 may be prepared for oxide wafer bonding with a deposition of an oxide 1602 or by thermal oxidation of the P+ layer 1606 to form oxide layer 1602, or a re-oxidation of implant screen oxide 1601. A layer transfer demarcation plane 1699 (shown as a dashed line) may be formed in donor wafer 1600 or N+ layer 1603 (shown) by hydrogen implantation 1607 or other methods as previously described. Both the donor wafer 1600 and acceptor wafer 1610 may be prepared for wafer bonding as previously described and then low temperature (less than approximately 400° C.) bonded. The portion of the N+ layer 1603 and the N− donor wafer substrate 1600 that are above the layer transfer demarcation plane 1699 may be removed by cleaving and polishing, or other low temperature processes as previously described, such as, for example, ion-cut or other methods.

Figure 16C:
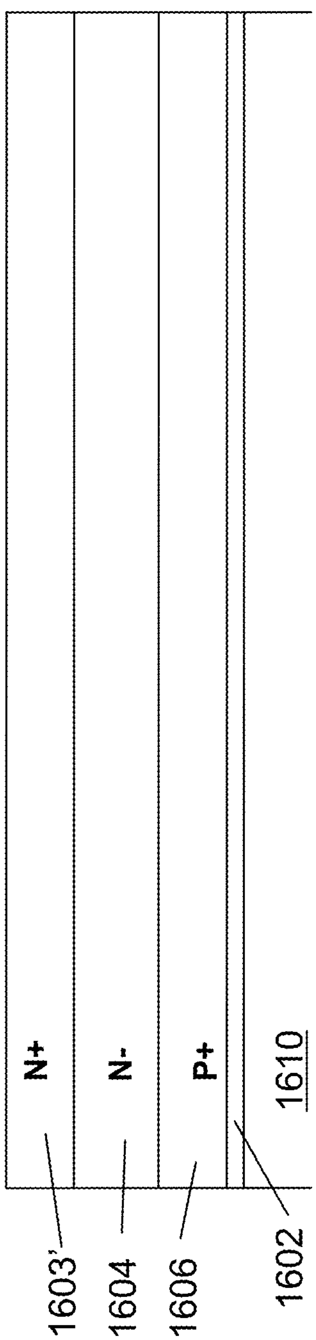

As illustrated in FIG. 16C, the remaining N+ layer 1603', N− doped layer 1604, P+ doped layer 1606, and oxide layer 1602 have been layer transferred to acceptor wafer 1610. The top surface of N+ layer 1603' may be chemically or mechanically polished smooth and flat. Now transistors may be formed with low temperature (less than approximately 400° C.) processing and aligned to the acceptor wafer 1610 alignment marks (not shown). For illustration clarity, the oxide layers, such as 1602, used to facilitate the wafer to wafer bond are not shown in subsequent drawings.

Figure 16D:
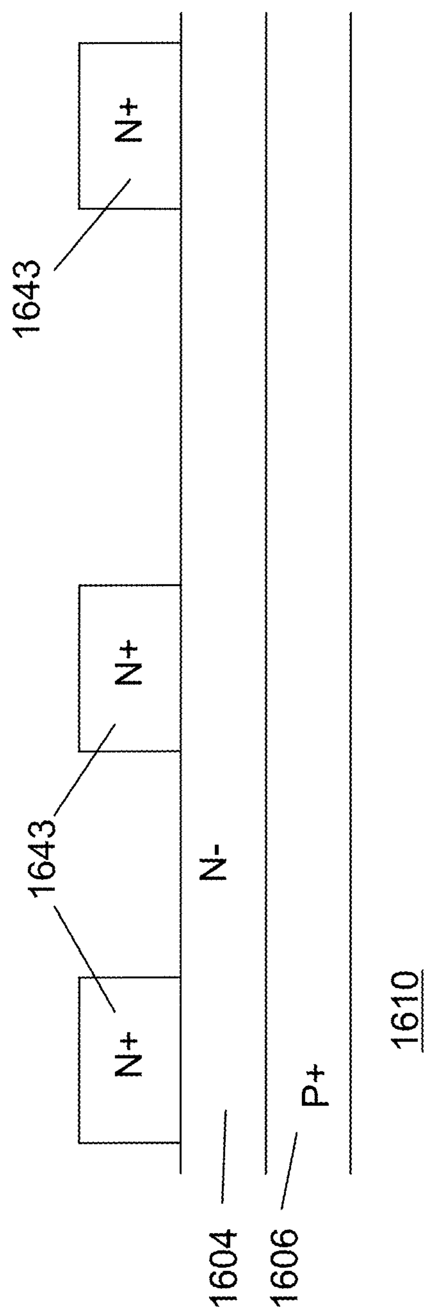

As illustrated in FIG. 16D the source and drain regions 1643 may be lithographically defined and then formed by etching away portions of N+ doped silicon layer 1603' down to at least the level of the N− layer 1604.

Figure 16E:
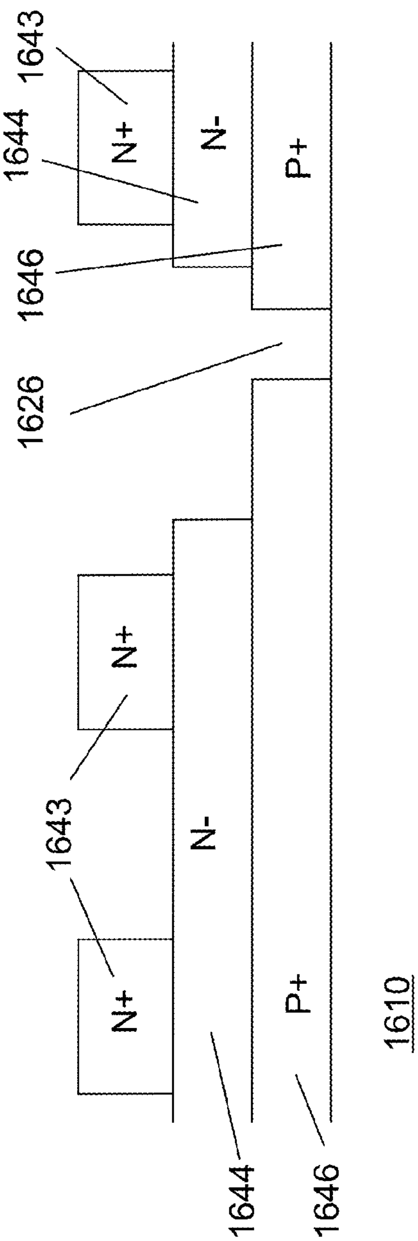

As illustrated in FIG. 16E transistor channel regions may be lithographically defined and the N− doped layer 1604 plasma/RIE etched to form regions of JFET transistor channel 1644. Then transistor to transistor isolation 1626 may be lithographically defined and the P+ doped layer 1606 plasma/RIE etched to form the P+ bottom gate junction regions 1646.

Figure 16F:
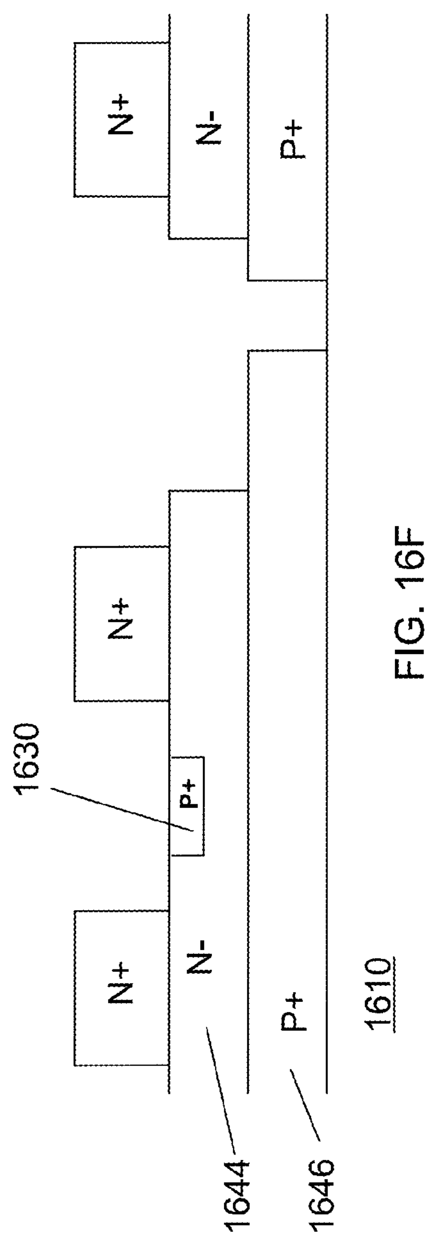

As illustrated in FIG. 16F, an optional formation of a shallow P+ region 1630 may be performed to create a JFET gate junction by utilizing a mask defined implant of P+ dopant, such as, for example, Boron. In this option there might be a need for laser or other method of optical annealing to activate the P+ implanted dopant without damaging the underlying layers using reflective and/or absorbing layers as described previously.

Figure 16G:
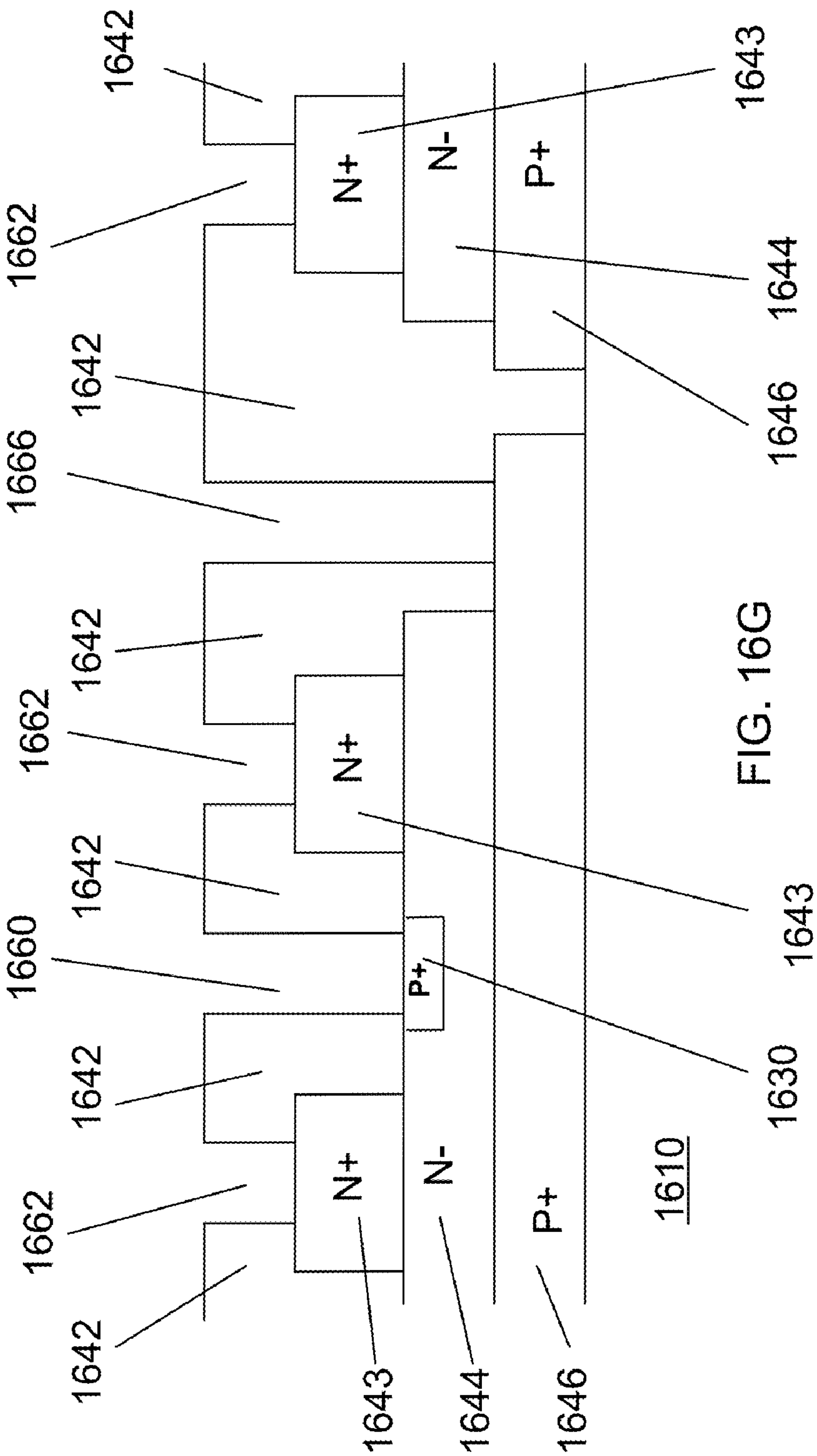

As illustrated in FIG. 16G, after the deposition and planarization of thick oxide 1642 the gate contact 1660 may be masked and etched open thru oxide 1642 to shallow P+ region 1630 (option) or transistor channel N− region 1644. Then deposition and partial etch-back (or Chemical Mechanical Polishing (CMP)) of aluminum (or other metal to obtain an optimal Schottky or ohmic gate contact 1660 to either transistor channel N− 1644 or shallow P+ gate region 1630 respectively) may be performed. N+ contacts 1662 may be masked and etched open and metal may be deposited to create ohmic connections to the N+ regions 1643. P+ bottom gate junction contacts 1666 may be masked and etched open and metal may be deposited to create ohmic connections to the P+ regions 1646. Interconnect metallization may then be conventionally formed. The layer via 1660 (not shown) may be formed to electrically couple the JFET transistor layer metallization to the acceptor substrate 1610 at acceptor wafer metal connect pad 1680 (not shown). This flow enables the formation of a mono-crystalline silicon channel JFET with integrated bottom gate junction that may be formed and connected to the underlying multi-metal layer semiconductor device without exposing the underlying devices to a high temperature.

A p channel JFET with integrated bottom gate junction may be constructed as above with the N− layer 1604 and N+ layer 1603 formed as P− and P+ doped respectively, the P+ bottom gate junction layer 1060 formed as N+ doped, and the shallow P+ gate region 1630 formed as N+, and gate metal is of appropriate work function to create a proper Schottky barrier.

As illustrated in FIGS. 17A to 17G, an NPN bipolar junction transistor may be constructed that is suitable for 3D IC manufacturing.

Figure 17A:
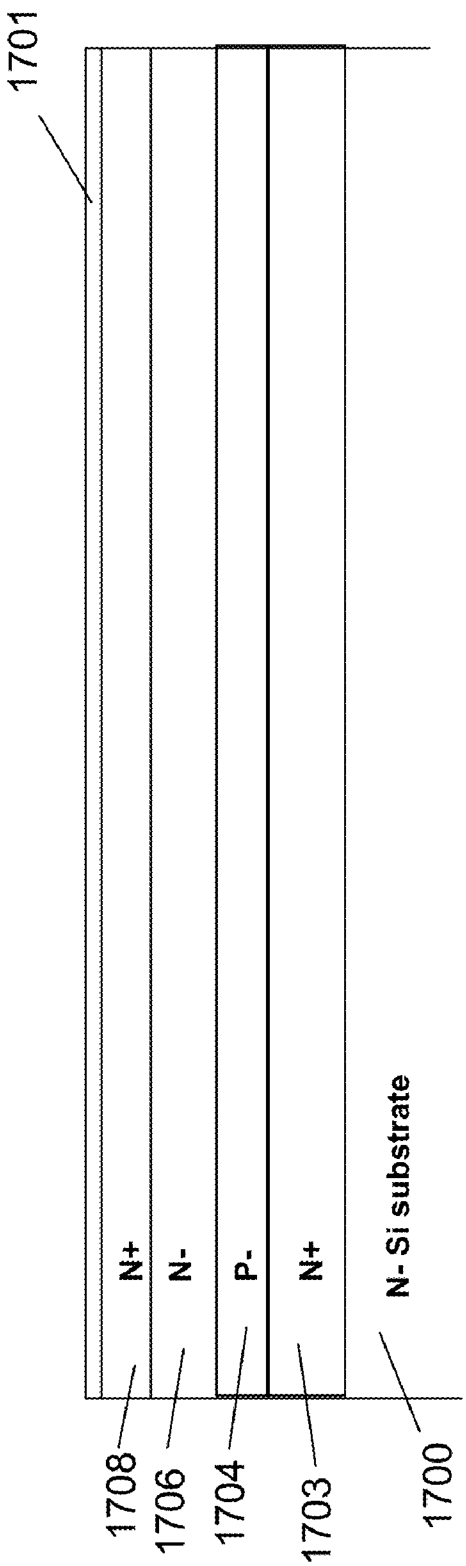
FIGS. 17A-G are exemplary drawing illustrations of the formation of a bipolar transistor.

As illustrated in FIG. 17A, an N− substrate donor wafer 1700 may be processed to comprise four wafer sized layers of N+ doping 1703, P− doping 1704, N− doping 1706, and N+ doping 1708. The N− layer 1706 may have the same or different dopant concentration than the N− substrate 1700. The four doped layers 1703, 1704, 1706, and 1708 may be formed by ion implantation and thermal anneal. The layer stack may alternatively be formed by successive epitaxially deposited doped silicon layers or by a combination of epitaxy and implantation and anneals. A screen oxide 1701 may be grown before an implant to protect the silicon from implant contamination and to provide an oxide surface for later wafer to wafer bonding. These processes may be done at temperatures above 400° C. as the layer transfer to the processed substrate with metal interconnects has yet to be done.

Figure 17B:
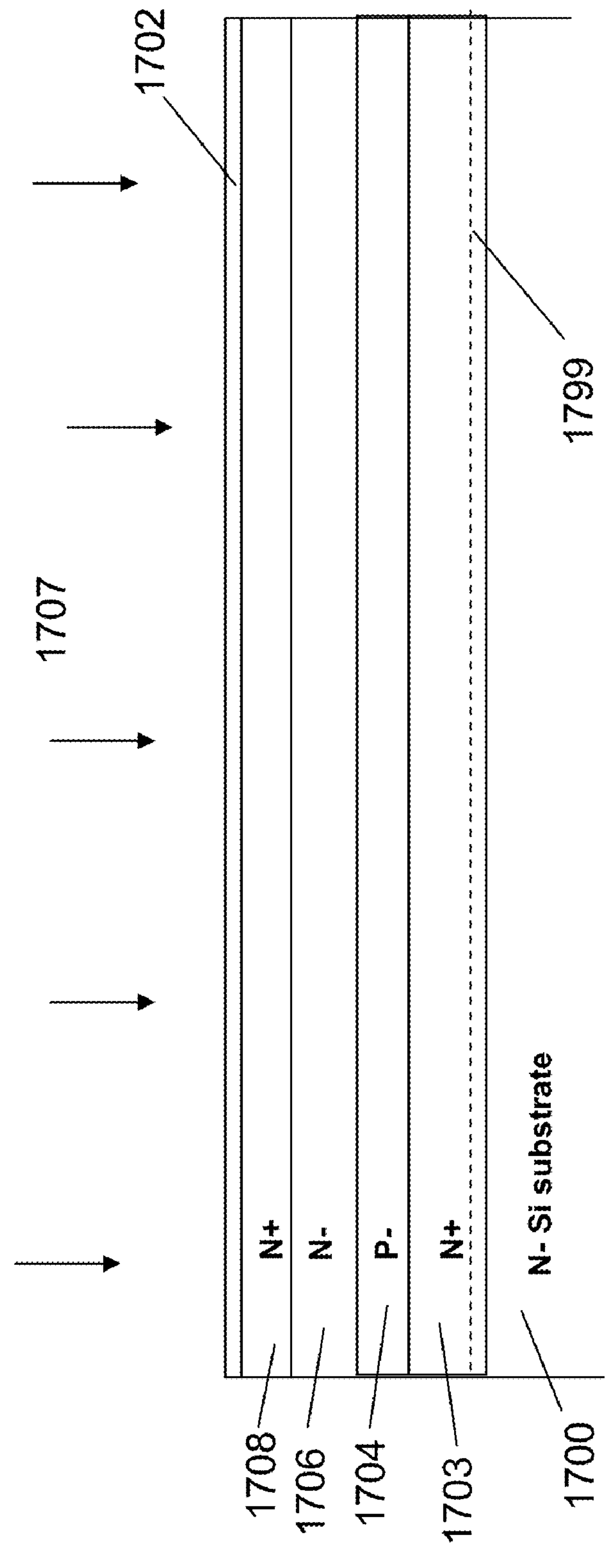

As illustrated in FIG. 17B, the top surface of donor wafer 1700 may be prepared for oxide wafer bonding with a deposition of an oxide 1702 or by thermal oxidation of the N+ layer 1708 to form oxide layer 1702, or a re-oxidation of implant screen oxide 1701. A layer transfer demarcation plane 1799 (shown as a dashed line) may be formed in donor wafer 1700 or N+ layer 1703 (shown) by hydrogen implantation 1707 or other methods as previously described. Both the donor wafer 1700 and acceptor wafer 1710 may be prepared for wafer bonding as previously described and then low temperature (less than approximately 400° C.) bonded. The portion of the N+ layer 1703 and the N− donor wafer substrate 1700 that are above the layer transfer demarcation plane 1799 may be removed by cleaving and polishing, or other low temperature processes as previously described, such as, for example, ion-cut or other methods. Effectively at this point there is a giant npn or bipolar transistor overlaying the entire wafer.

Figure 17C:
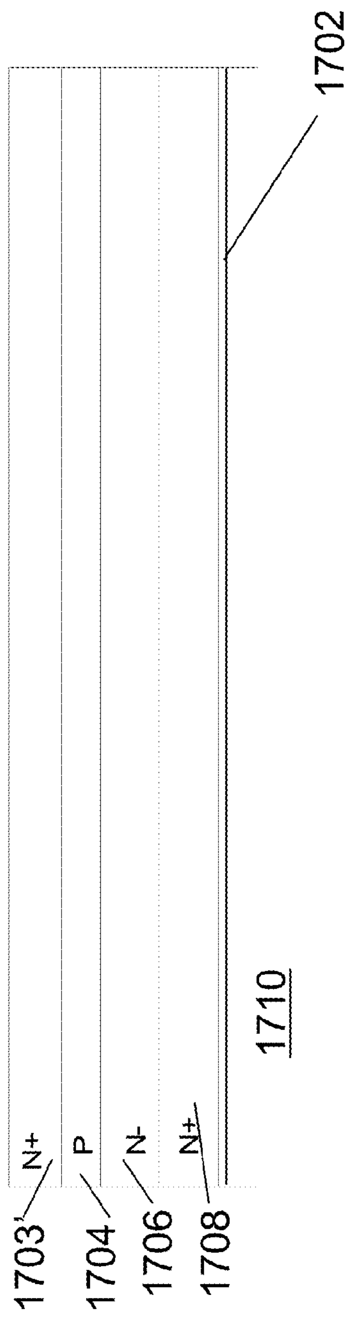

As illustrated in FIG. 17C, the remaining N+ layer 1703', P− doped layer 1704, N− doped layer 1706, N+ doped layer 1708, and oxide layer 1702 have been layer transferred to acceptor wafer 1710. The top surface of N+ layer 1703' may be chemically or mechanically polished smooth and flat. Now multiple transistors may be formed with low temperature (less than approximately 400° C.) processing and aligned to the acceptor wafer 1710 alignment marks (not shown). For illustration clarity, the oxide layers, such as 1702, used to facilitate the wafer to wafer bond are not shown in subsequent drawings.

Figure 17D:
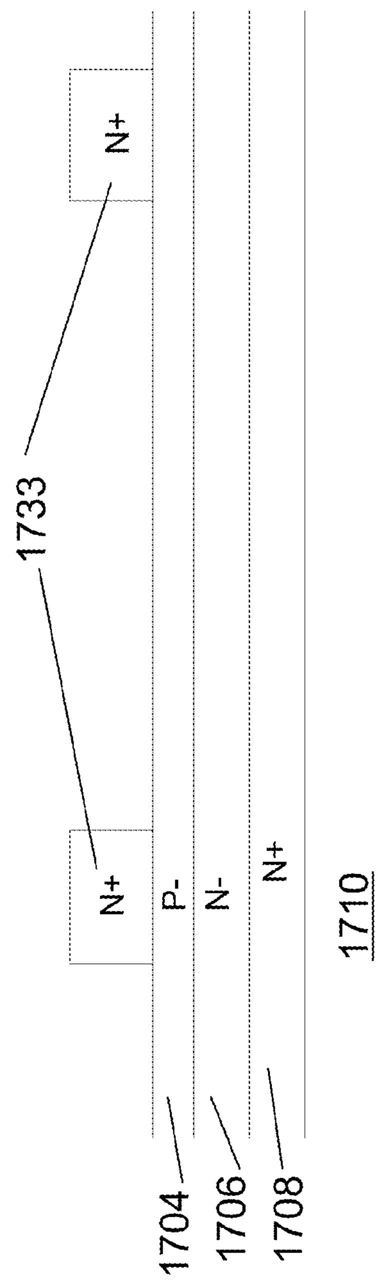

As illustrated in FIG. 17D the emitter regions 1733 may be lithographically defined and then formed by plasma/RIE etch removal of portions of N+ doped silicon layer 1703' down to at least the level of the P− layer 1704.

Figure 17E:
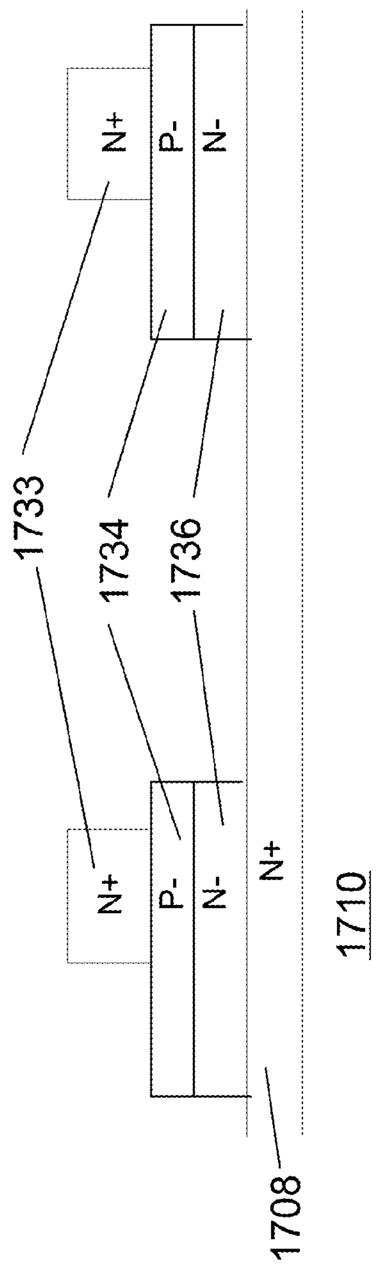

As illustrated in FIG. 17E the base 1734 and collector 1736 regions may be lithographically defined and the formed by plasma/RIE etch removal of portions of P− doped layer 1704 and N− doped layer 1706 down to at least the level of the N+ layer 1708.

Figure 17F:
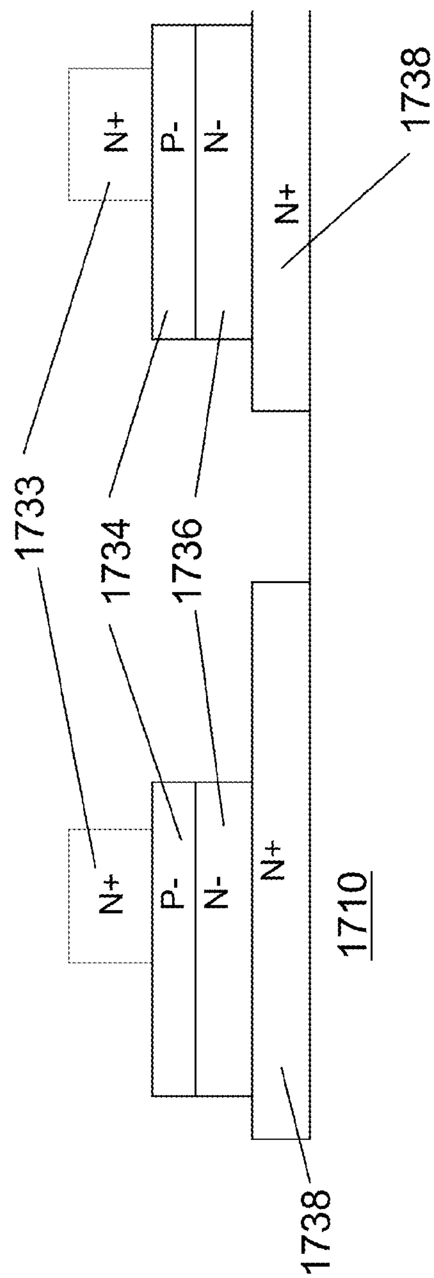
Figure 17G:
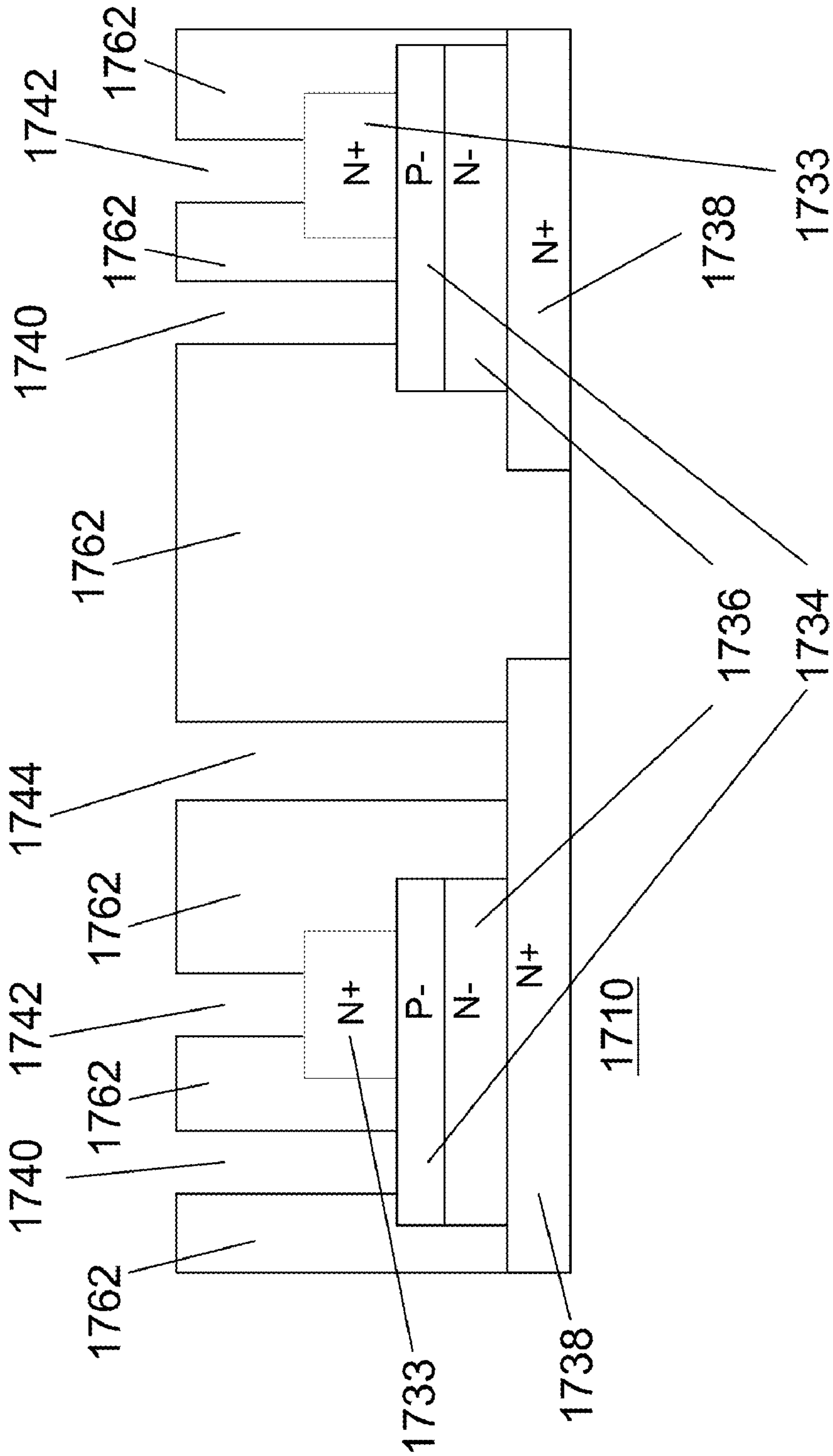

As illustrated in FIG. 17F the collector connection region 1738 may be lithographically defined and formed by plasma/RIE etch removal of portions of N+ doped layer 1708 down to at least the level of the top oxide of acceptor wafer 1710. This also creates electrical isolation between transistors.

As illustrated in FIG. 17I, the entire structure may be substantially covered with a Low Temperature Oxide 1762, which may be planarized with chemical mechanical polishing. The emitter region 1733, the base region 1734, the collector region 1736, the collector connection region 1738, and the acceptor wafer 1710 are shown. Contacts and metal interconnects may be formed by lithography and plasma/RIE etch. The emitter contact 1742 connects to the emitter region 1733. The base contact 1740 connects to the base region 1734, and the collector contact 1744 connects to the collector connection region 1738. Interconnect metallization may then be conventionally formed. The thru layer via 1760 (not shown) may be formed to electrically couple the NPN bipolar transistor layer metallization to the acceptor substrate 1710 at acceptor wafer metal connect pad 1780 (not shown). This flow enables the formation of a mono-crystalline silicon NPN bipolar junction transistor that may be formed and connected to the underlying multi-metal layer semiconductor device without exposing the underlying devices to a high temperature.

A PNP bipolar junction transistor may be constructed as above with the N− layer 1706 and N+ layers 170 and 1708 formed as P− and P+ doped respectively, and the P− layer 1704 formed as N−.

The bipolar transistors formed with reference to FIG. 17 may be utilized to form analog or digital BiCMOS circuits where the CMOS transistors are on the acceptor substrate 1710 and the bipolar transistors may be formed in the transferred top layers.

As illustrated in FIGS. 18A to 18J, an n-channel raised source and drain extension transistor may be constructed that is suitable for 3D IC manufacturing.

Figure 18A:
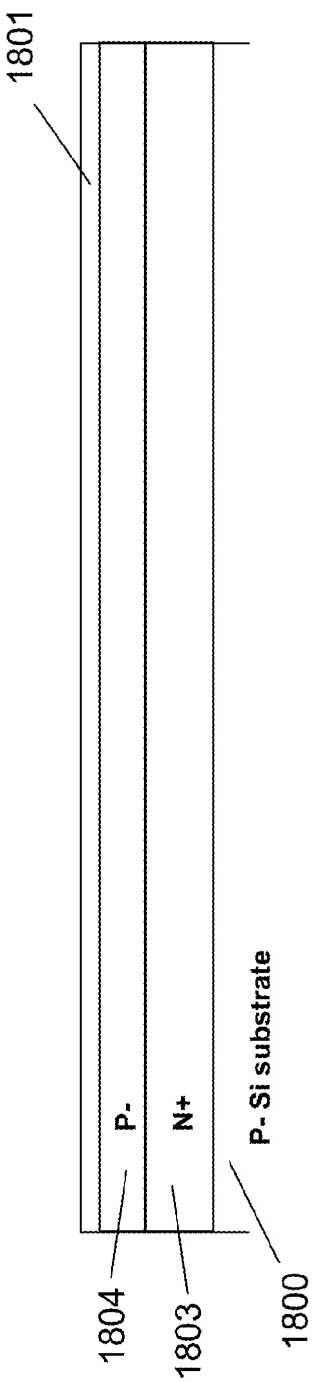
FIGS. 18A-J are exemplary drawing illustrations of the formation of a raised source and drain extension transistor.

As illustrated in FIG. 18A, a P− substrate donor wafer 1800 may be processed to comprise two wafer sized layers of N+ doping 1803 and P− doping 1804. The P− layer 1804 may have the same or a different dopant concentration than the P− substrate 1800. The N+ doping layer 1803 and P− doping layer 1804 may be formed by ion implantation and thermal anneal. The layer stack may alternatively be formed by successive epitaxially deposited doped silicon layers of N+ silicon then P− silicon or by a combination of epitaxy and implantation. A screen oxide 1801 may be grown before an implant to protect the silicon from implant contamination and to provide an oxide surface for later wafer to wafer bonding. These processes may be done at temperatures above 400° C. as the layer transfer to the processed substrate with metal interconnects has yet to be done.

Figure 18B:
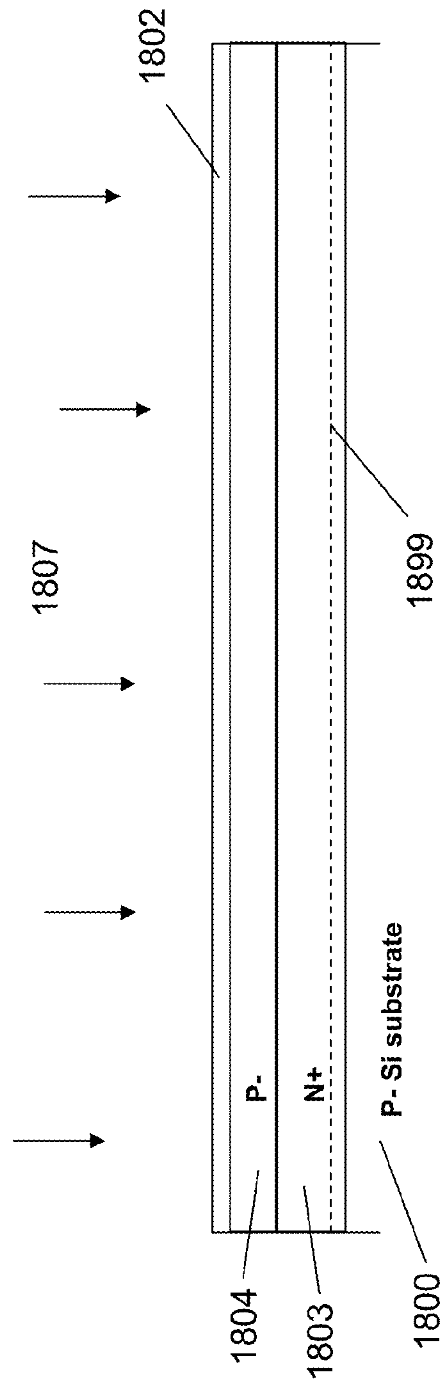

As illustrated in FIG. 18B, the top surface of donor wafer 1800 may be prepared for oxide wafer bonding with a deposition of an oxide 1802 or by thermal oxidation of the P− layer 1804 to form oxide layer 1802, or a re-oxidation of implant screen oxide 1801. A layer transfer demarcation plane 1899 (shown as a dashed line) may be formed in donor wafer 1800 or N+ layer 1803 (shown) by hydrogen implantation 1807 or other methods as previously described. Both the donor wafer 1800 and acceptor wafer 1810 may be prepared for wafer bonding as previously described and then low temperature (less than approximately 400° C.) bonded. The portion of the N+ layer 1803 and the P− donor wafer substrate 1800 that are above the layer transfer demarcation plane 1899 may be removed by cleaving and polishing, or other low temperature processes as previously described, such as, for example, ion-cut or other methods.

Figure 18C:
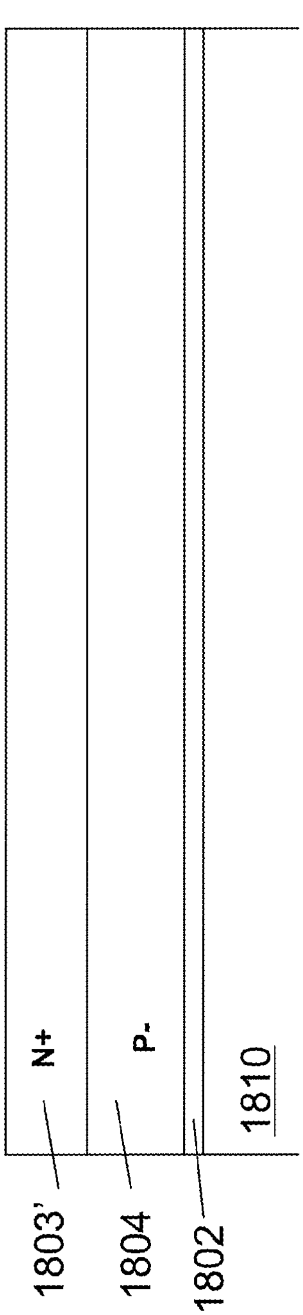

As illustrated in FIG. 18C, the remaining N+ layer 1803', P− doped layer 1804, and oxide layer 1802 have been layer transferred to acceptor wafer 1810. The top surface of N+ layer 1803' may be chemically or mechanically polished smooth and flat. Now transistors may be formed with low temperature (less than approximately 400° C.) processing and aligned to the acceptor wafer 1810 alignment marks (not shown). For illustration clarity, the oxide layers, such as 1802, used to facilitate the wafer to wafer bond are not shown in subsequent drawings.

Figure 18D:
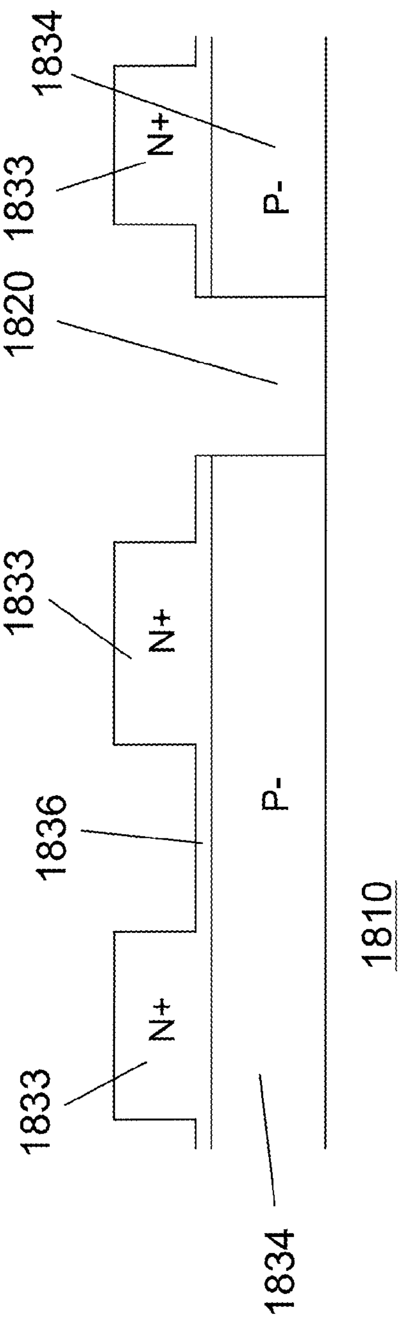

As illustrated in FIG. 18D the raised source and drain regions 1833 may be lithographically defined and then formed by etching away portions of N+ doped silicon layer 1803' to form a thin more lightly doped N+ layer 1836 for the future source and drain extensions. Then transistor to transistor isolation regions 1820 may be lithographically defined and the thin more lightly doped N+ layer 1836 and the P− doped layer 1804 may be plasma/RIE etched down to at least the level of the top oxide of acceptor wafer 1810 and thus form electrically isolated regions of P− doped transistor channels 1834.

Figure 18E:
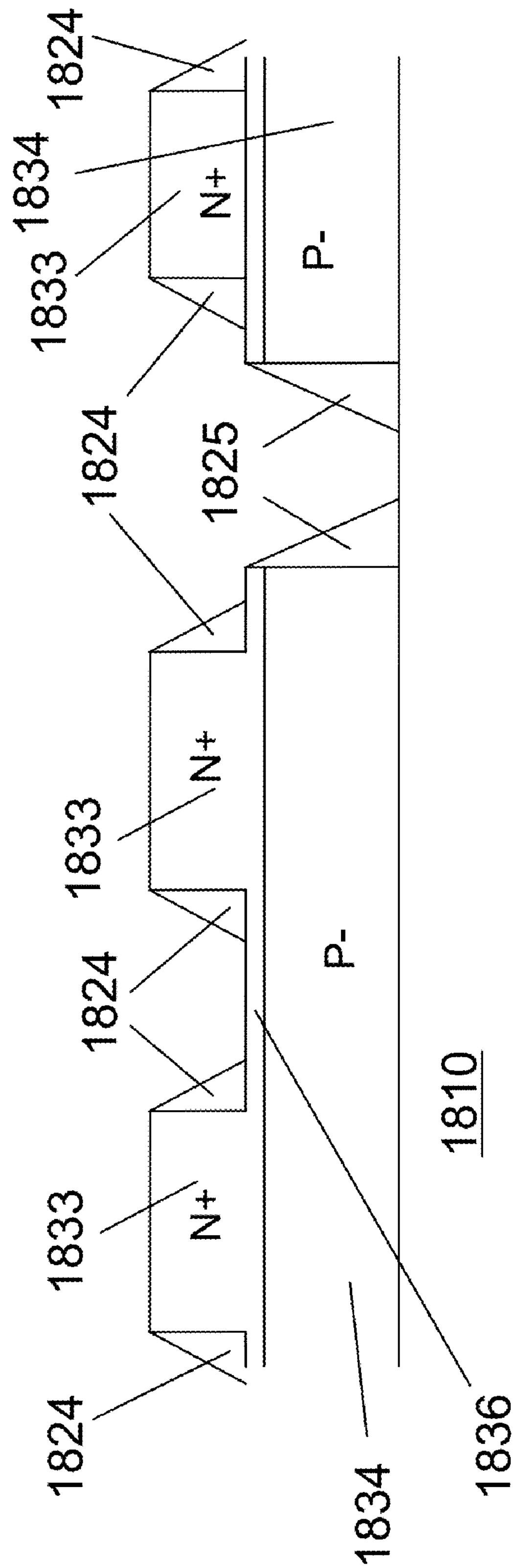

As illustrated in FIG. 18E a highly conformal low-temperature oxide or Oxide/Nitride stack may be deposited and plasma/RIE etched to form N+ sidewall spacers 1824 and P− sidewalls spacers 1825.

Figure 18F:
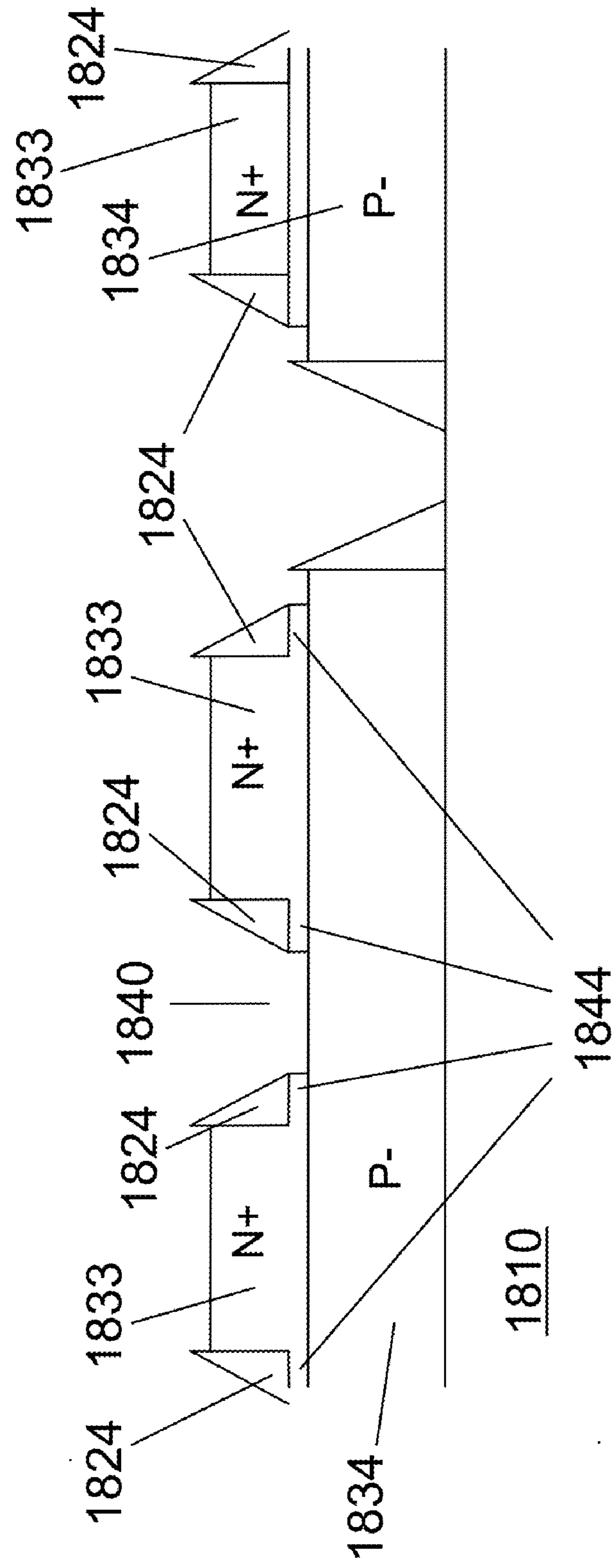

As illustrated in FIG. 18F, a self aligned plasma/RIE silicon etch may be performed to create source drain extensions 1844 from the thin lightly doped N+ layer 1836.

Figure 18G:
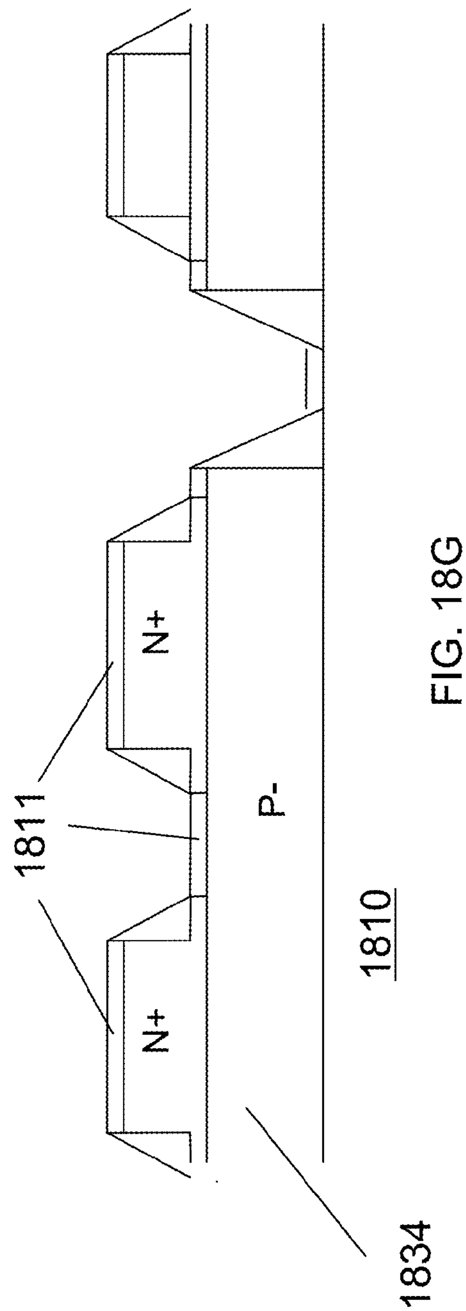

As illustrated in FIG. 18G, a low temperature based Gate Dielectric may be deposited and densified to serve as the gate oxide 1811. Alternatively, a low temperature microwave plasma oxidation of the exposed transistor P− doped channel 1834 silicon surfaces may serve as the gate oxide 1811 or an atomic layer deposition (ALD) technique may be utilized to form the HKMG gate oxide as previously described.

Figure 18H:
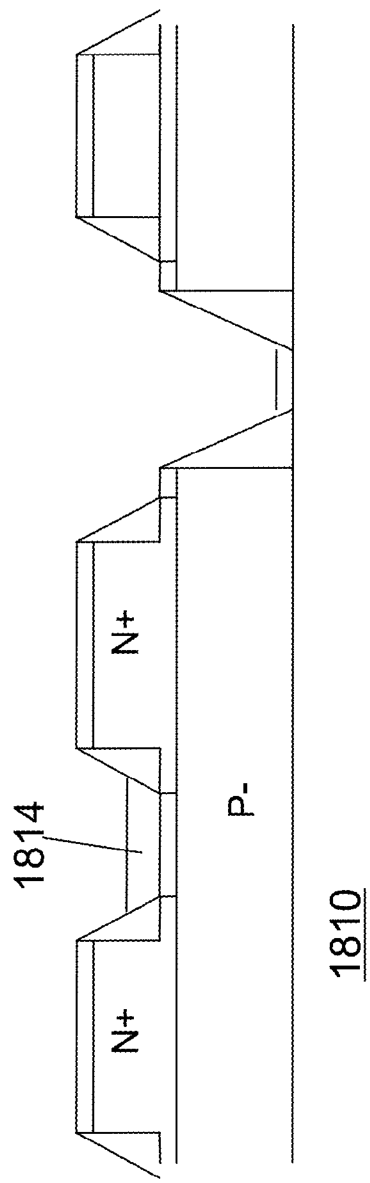

As illustrated in FIG. 18H, a deposition of a low temperature gate material, such as, for example, N+ doped amorphous silicon, may be performed, and etched back to form self aligned transistor gate 1814. Alternatively, a HKMG gate structure may be formed as described previously.

Figure 18I:
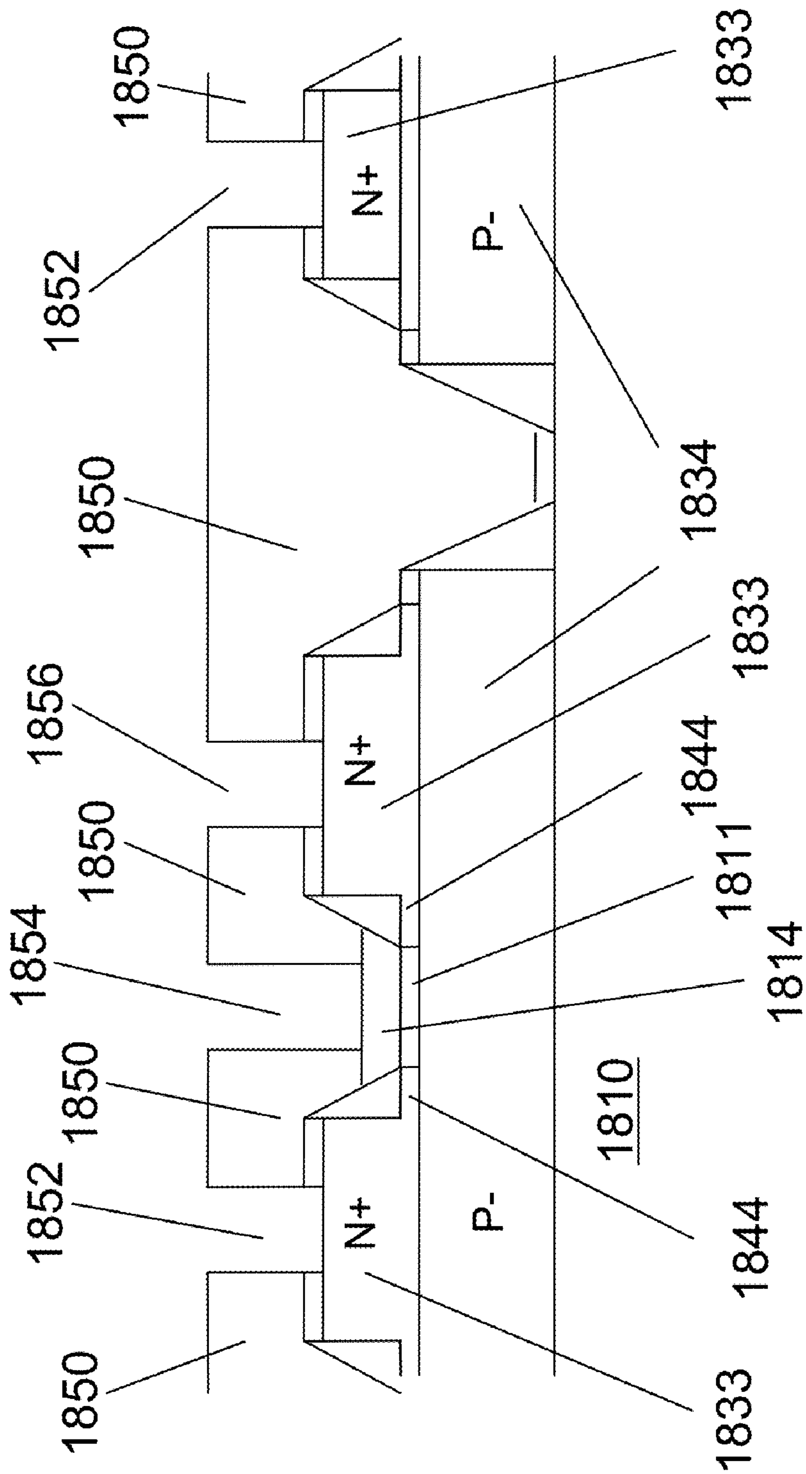

As illustrated in FIG. 18I, the entire structure may be substantially covered with a Low Temperature Oxide 1850, which may be planarized with chemical mechanical polishing. The raised source and drain regions 1833, source drain extensions 1844, P− doped transistor channels 1834, gate oxide 1811, transistor gate 1814, and acceptor substrate 1810 are shown. Contacts and metal interconnects may be formed with lithography and plasma/RIE etch. The gate contact 1854 connects to the gate 1814. The two transistor channel terminal contacts (source 1852 and drain 1856) independently connect to the raised N+ source and drain regions 1833. Interconnect metallization may then be conventionally formed. The thru layer via 1860 (not shown) electrically couples the transistor layer metallization to the acceptor substrate 1810 at acceptor wafer metal connect pad 1880 (not shown). This flow enables the formation of a mono-crystalline n-channel transistor with raised source and drain extensions, which may be formed and connected to the underlying multi-metal layer semiconductor device without exposing the underlying devices to a high temperature.

Figure 18J:
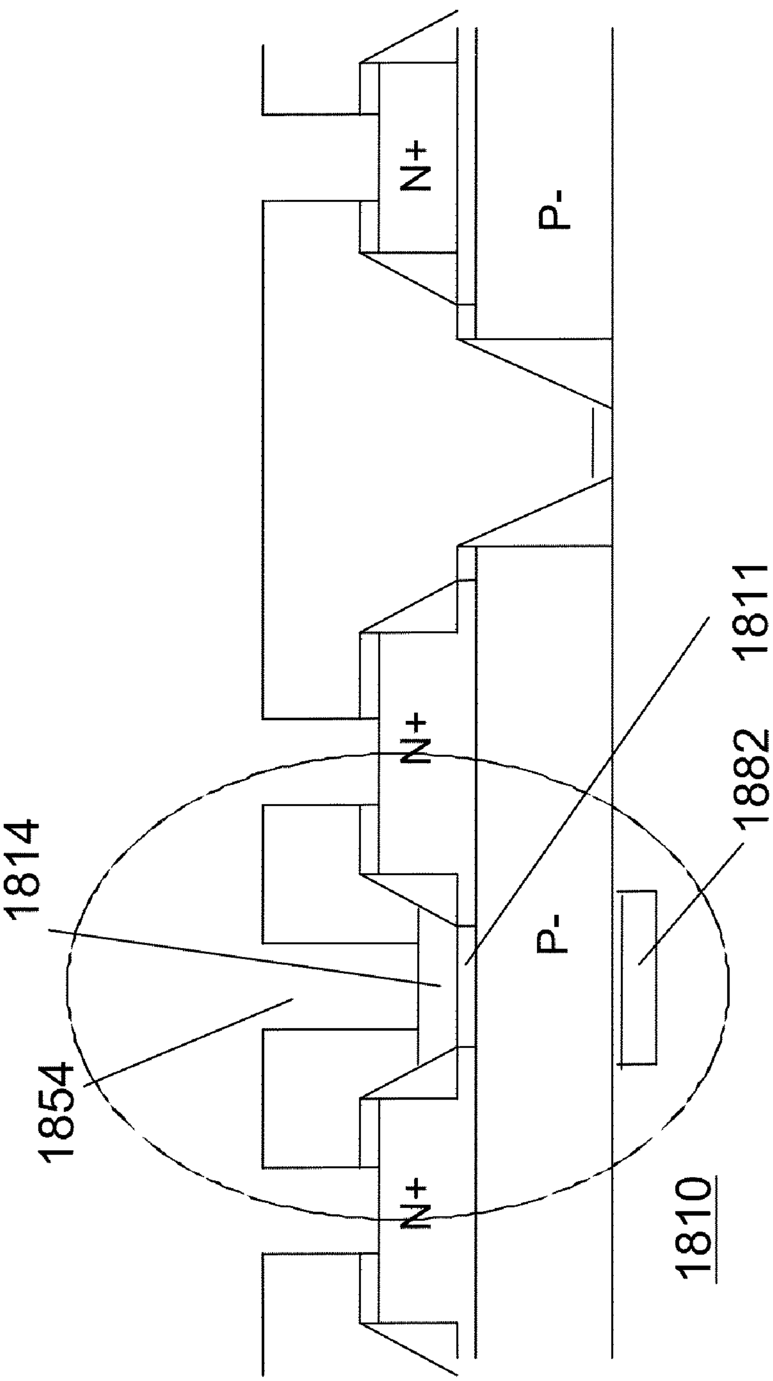

As illustrated in FIG. 18J, the top layer of the acceptor substrate 1810 may include a 'back-gate' 1882 whereby gate 1814 may be aligned & formed directly on top of the back-gate 1882. The back-gate 1882 may be formed from the top metal layer of the acceptor substrate 1810, or alternatively be composed of doped amorphous silicon, and may utilize the oxide layer deposited on top of the metal layer for the wafer bonding (not shown) to act as a gate oxide for the back-gate 1882.

A p-channel raised source and drain extension transistor may be constructed as above with the P− layer 1804 and N+ layer 1803 formed as N− and P+ doped respectively, and gate metal is of appropriate work function to shutoff the p channel at the desired gate voltage.

A single type (n or p) of transistor formed in the transferred prefabricated layers could be sufficient for some uses, such as, for example, programming transistors for a Field Programmable Gate Array (FPGA). However, for logic circuitry two complementing (n and p) transistors would be helpful to create CMOS type logic. Accordingly the above described various single- or mono-type transistor flows could be performed twice (with reference to the FIG. 2 discussion). First perform substantially all the steps to build the 'n-channel' type, and then perform an additional layer transfer to build the 'pi-channel' type on top of it. Subsequently, electrically couple together the mono-type devices of one layer with the other layer utilizing the available dense interconnects as the layers transferred are less than approximately 200 nm in thickness.

Alternatively, full CMOS devices may be constructed with a single layer transfer of wafer sized doped layers. This process flow will be described below for the case of n-RCATs and p-RCATs, but may apply to any of the above devices constructed out of wafer sized transferred doped layers.

As illustrated in FIGS. 19A to 19I, an n-RCAT and p-RCAT may be constructed in a single layer transfer of wafer sized doped layers with a process flow that is suitable for 3D IC manufacturing.

Figure 19A:
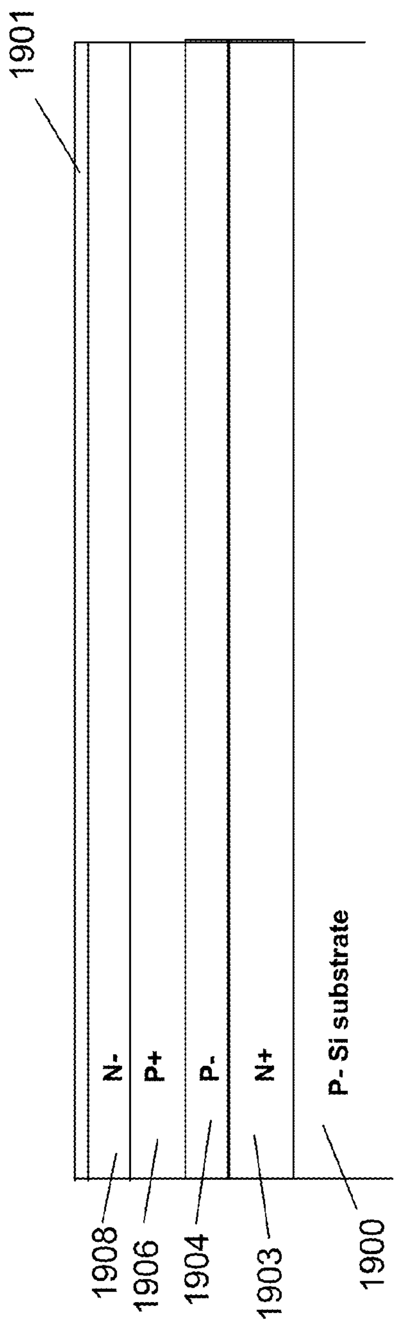
FIGS. 19A-J are exemplary drawing illustrations of formation of CMOS recessed channel array transistors.

As illustrated in FIG. 19A, a P− substrate donor wafer 1900 may be processed to comprise four wafer sized layers of N+ doping 1903, P− doping 1904, P+ doping 1906, and N− doping 1908. The P− layer 1904 may have the same or a different dopant concentration than the P− substrate 1900. The four doped layers 1903, 1904, 1906, and 1908 may be formed by ion implantation and thermal anneal. The layer stack may alternatively be formed by successive epitaxially deposited doped silicon layers or by a combination of epitaxy and implantation and anneals. P− layer 1904 and N− layer 1908 may also have graded doping to mitigate transistor performance issues, such as, for example, short channel effects. A screen oxide 1901 may be grown before an implant to protect the silicon from implant contamination and to provide an oxide surface for later wafer to wafer bonding. These processes may be done at temperatures above 400° C. as the layer transfer to the processed substrate with metal interconnects has yet to be done.

Figure 19B:
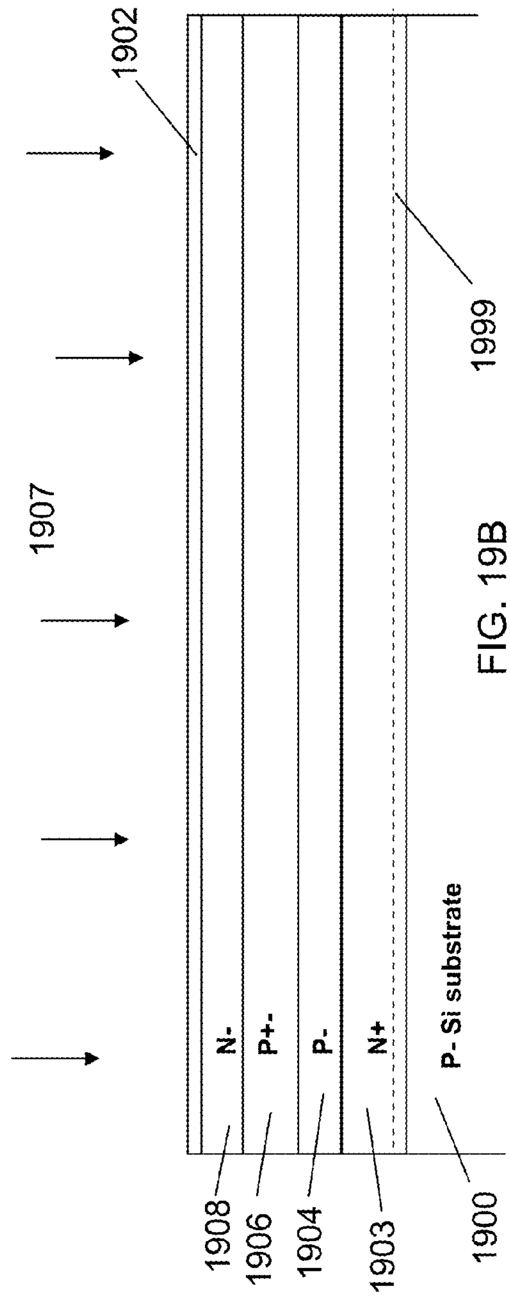

As illustrated in FIG. 19B, the top surface of donor wafer 1900 may be prepared for oxide wafer bonding with a deposition of an oxide 1902 or by thermal oxidation of the N− layer 1908 to form oxide layer 1902, or a re-oxidation of implant screen oxide 1901. A layer transfer demarcation plane 1999 (shown as a dashed line) may be formed in donor wafer 1900 or N+ layer 1903 (shown) by hydrogen implantation 1907 or other methods as previously described. Both the donor wafer 1900 and acceptor wafer 1910 may be prepared for wafer bonding as previously described and then low temperature (less than approximately 400° C.) bonded. The portion of the N+ layer 1903 and the N− donor wafer substrate 1900 that are above the layer transfer demarcation plane 1999 may be removed by cleaving and polishing, or other low temperature processes as previously described, such as, for example, ion-cut or other methods.

Figure 19C:
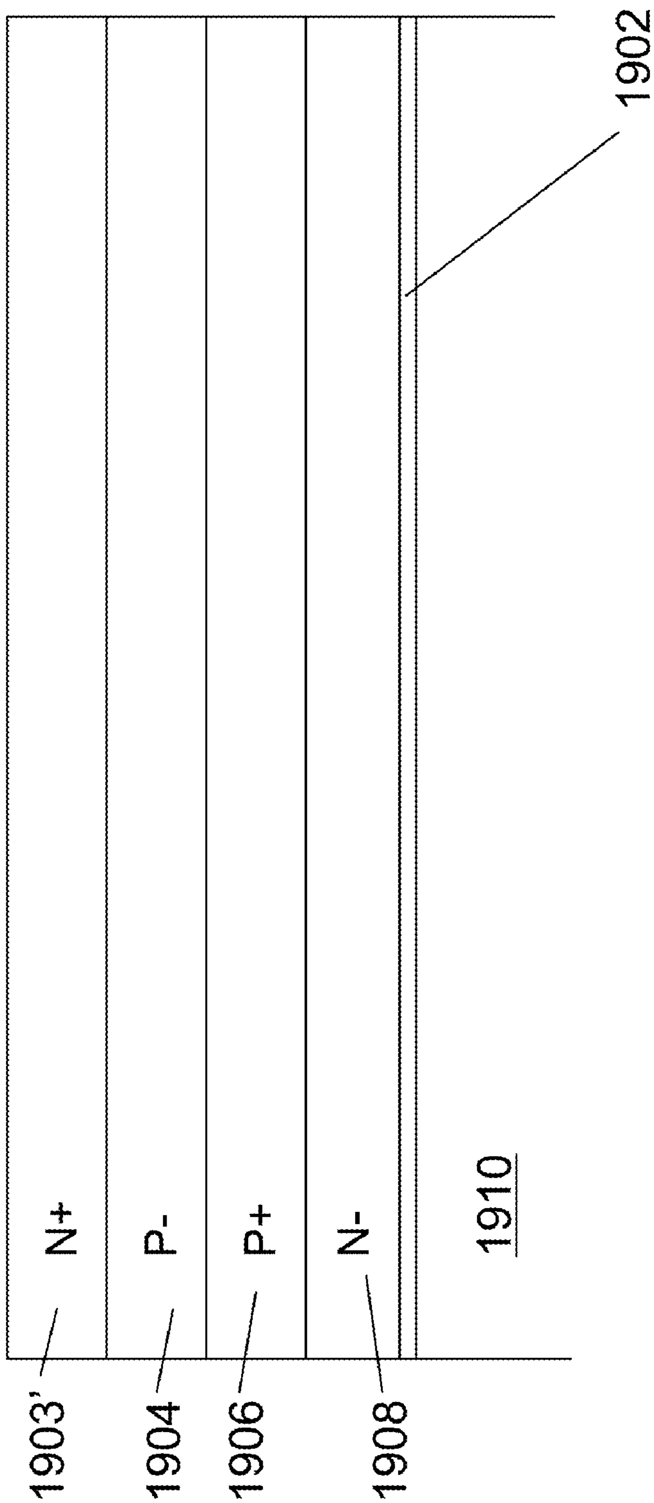

As illustrated in FIG. 19C, the remaining N+ layer 1903', P− doped layer 1904, P+ doped layer 1906, N− doped layer 1908, and oxide layer 1902 have been layer transferred to acceptor wafer 1910. The top surface of N+ layer 1903' may be chemically or mechanically polished smooth and flat. Now multiple transistors may be formed with low temperature (less than approximately 400° C.) processing and aligned to the acceptor wafer 1910 alignment marks (not shown). For illustration clarity, the oxide layers, such as 1902, used to facilitate the wafer to wafer bond are not shown in subsequent drawings.

Figure 19D:
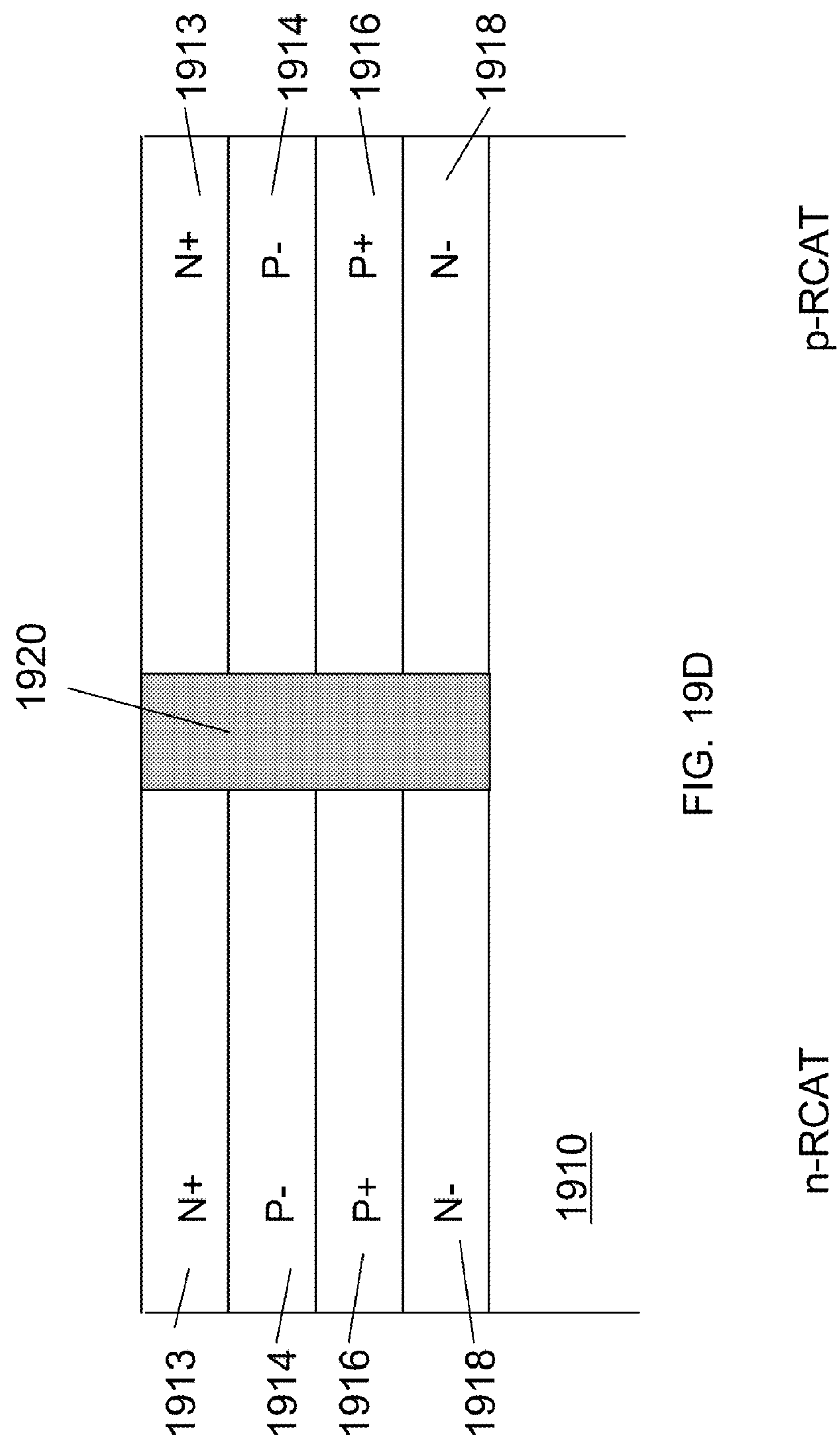

As illustrated in FIG. 19D the transistor isolation region may be lithographically defined and then formed by plasma/RIE etch removal of portions of N+ doped layer 1903', P− doped layer 1904, P+ doped layer 1906, and N− doped layer 1908 to at least the top oxide of acceptor substrate 1910. Then a low-temperature gap fill oxide may be deposited and chemically mechanically polished, remaining in transistor isolation region 1920. Thus formed are future RCAT transistor regions N+ doped 1913, P− doped 1914, P+ doped 1916, and N− doped 1918.

Figure 19E:
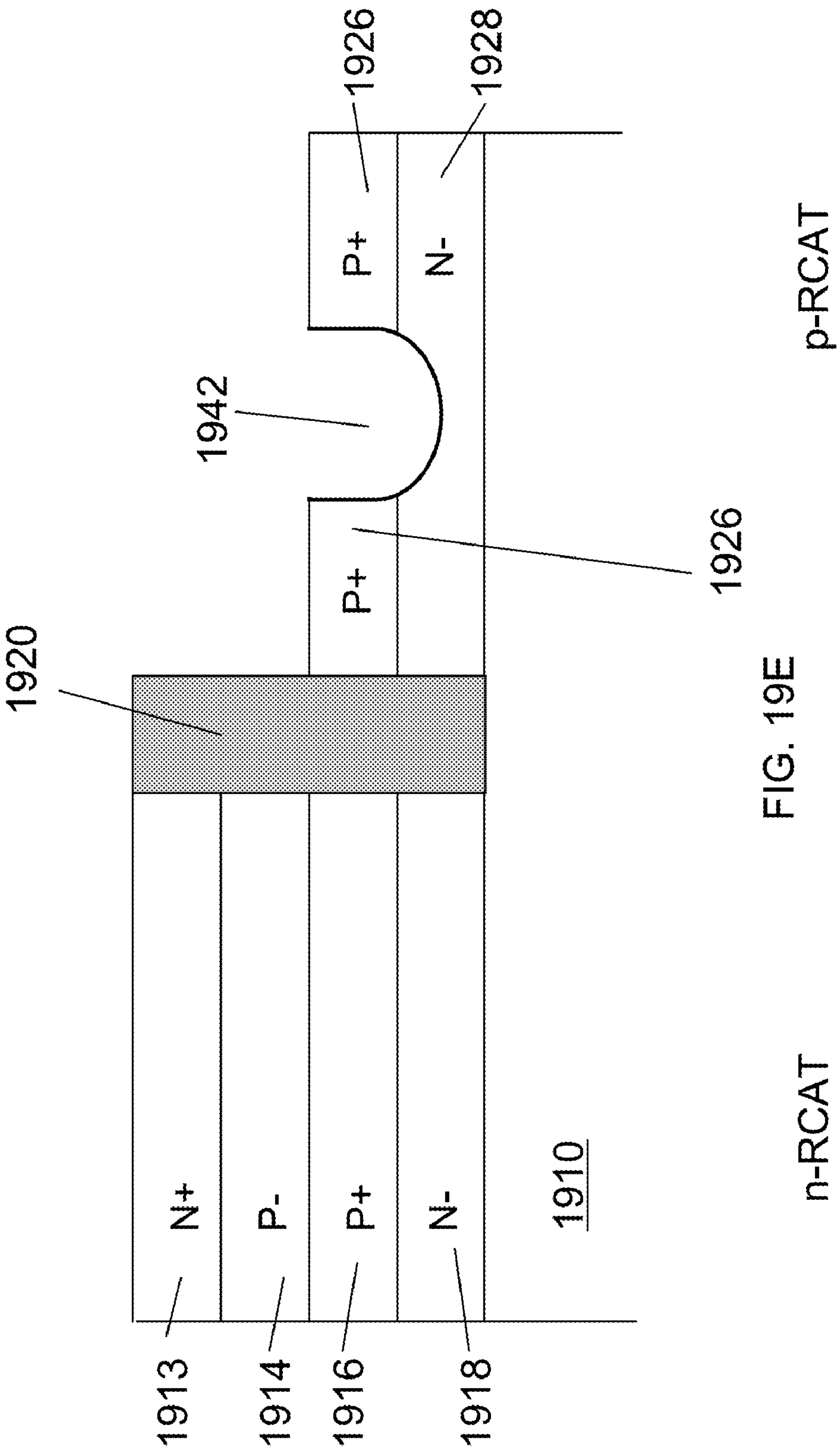

As illustrated in FIG. 19E the N+ doped region 1913 and P− doped region 1914 of the p-RCAT portion of the wafer are lithographically defined and removed by either plasma/RIE etch or a selective wet etch. Then the p-RCAT recessed channel 1942 may be mask defined and etched. The recessed channel surfaces and edges may be smoothed by wet chemical or plasma/RIE etching techniques to mitigate high field effects. These process steps form P+ source and drain regions 1926 and N− transistor channel region 1928.

Figure 19F:
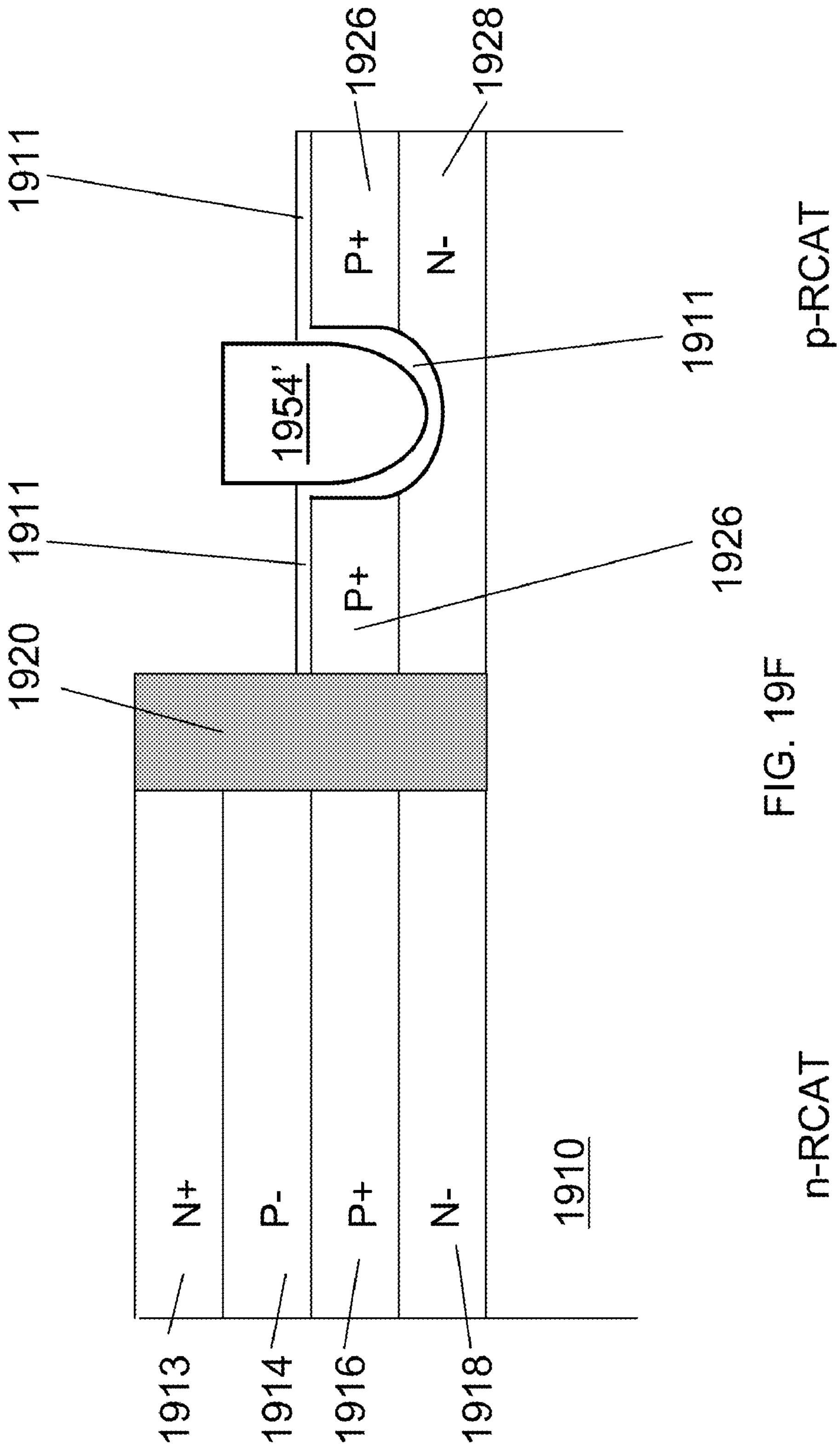

As illustrated in FIG. 19F, a gate oxide 1911 may be formed and a gate metal material 1954 may be deposited. The gate oxide 1911 may be an atomic layer deposited (ALD) gate dielectric that is paired with a work function specific gate metal 1954 in the industry standard high k metal gate process schemes described previously and targeted for an p-channel RCAT utility. Or the gate oxide 1911 may be formed with a low temperature oxide deposition or low temperature microwave plasma oxidation of the silicon surfaces and then a gate material such as, for example, platinum or aluminum may be deposited. Then the gate material 1954 may be chemically mechanically polished, and the p-RCAT gate electrode 1954' defined by masking and etching.

Figure 19G:
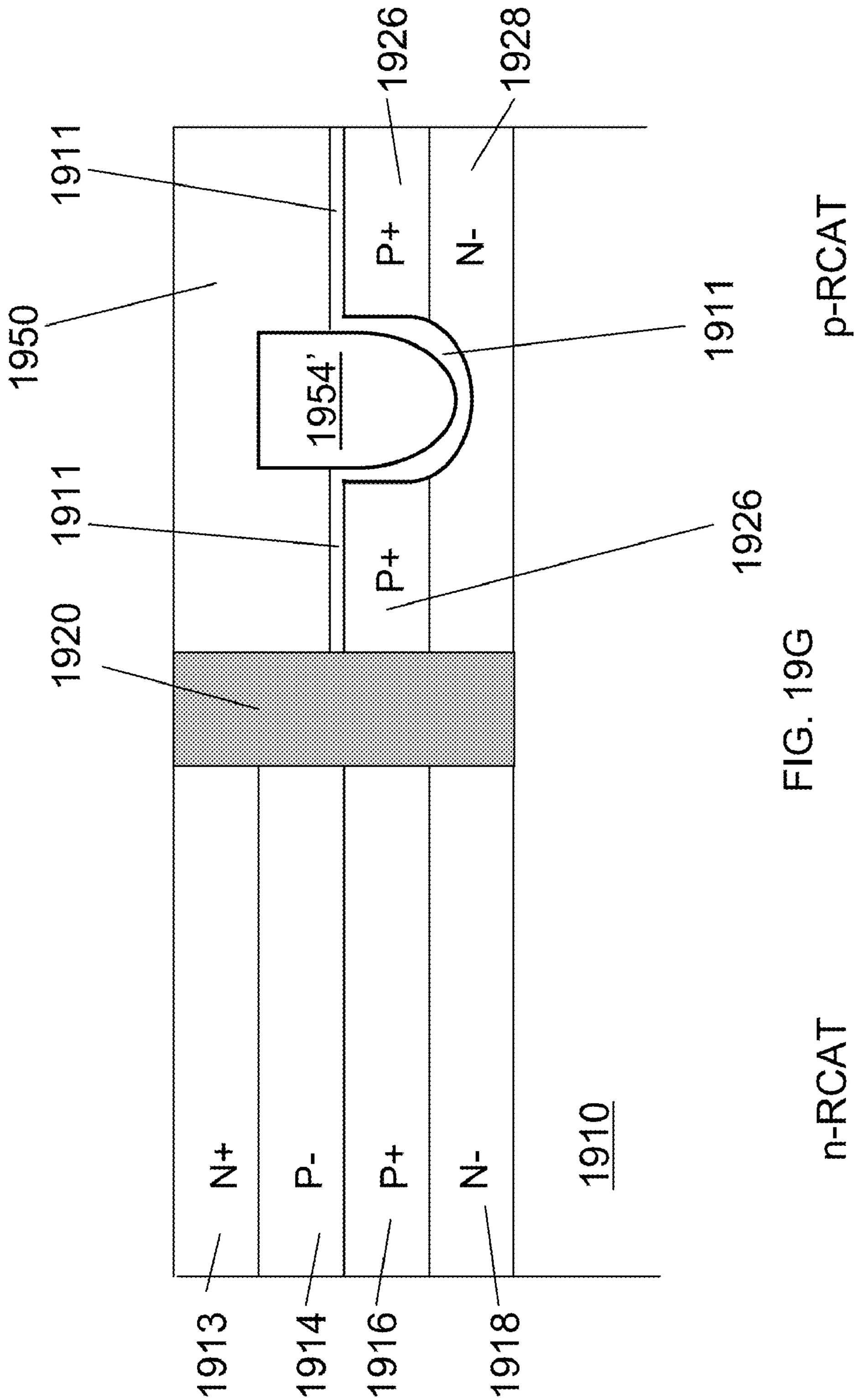

As illustrated in FIG. 19G, a low temperature oxide 1950 may be deposited and planarized, substantially covering the formed p-RCAT so that processing to form the n-RCAT may proceed.

Figure 19H:
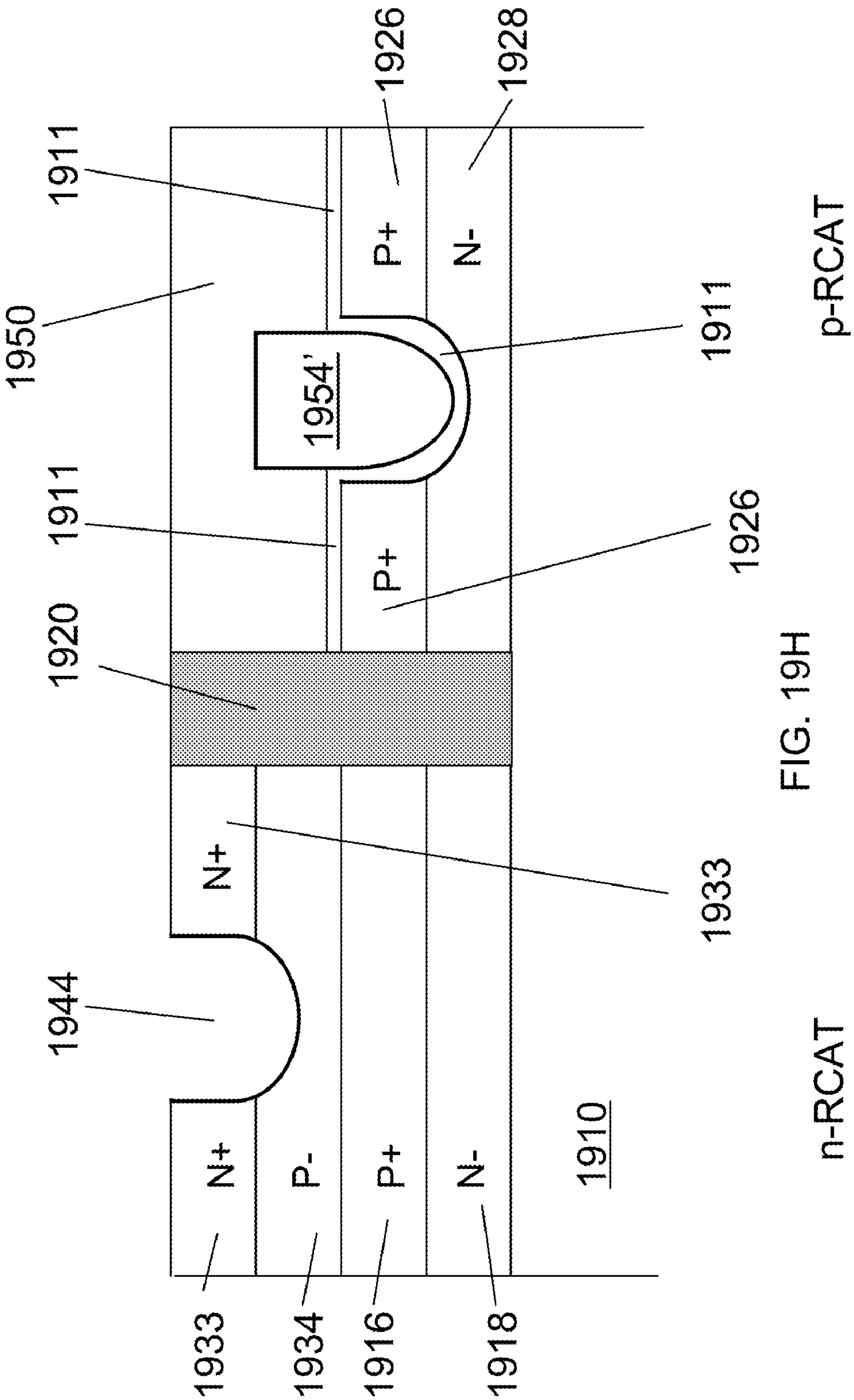

As illustrated in FIG. 19H the n-RCAT recessed channel 1944 may be mask defined and etched. The recessed channel surfaces and edges may be smoothed by wet chemical or plasma/RIE etching techniques to mitigate high field effects. These process steps form N+ source and drain regions 1933 and P− transistor channel region 1934.

Figure 19I:
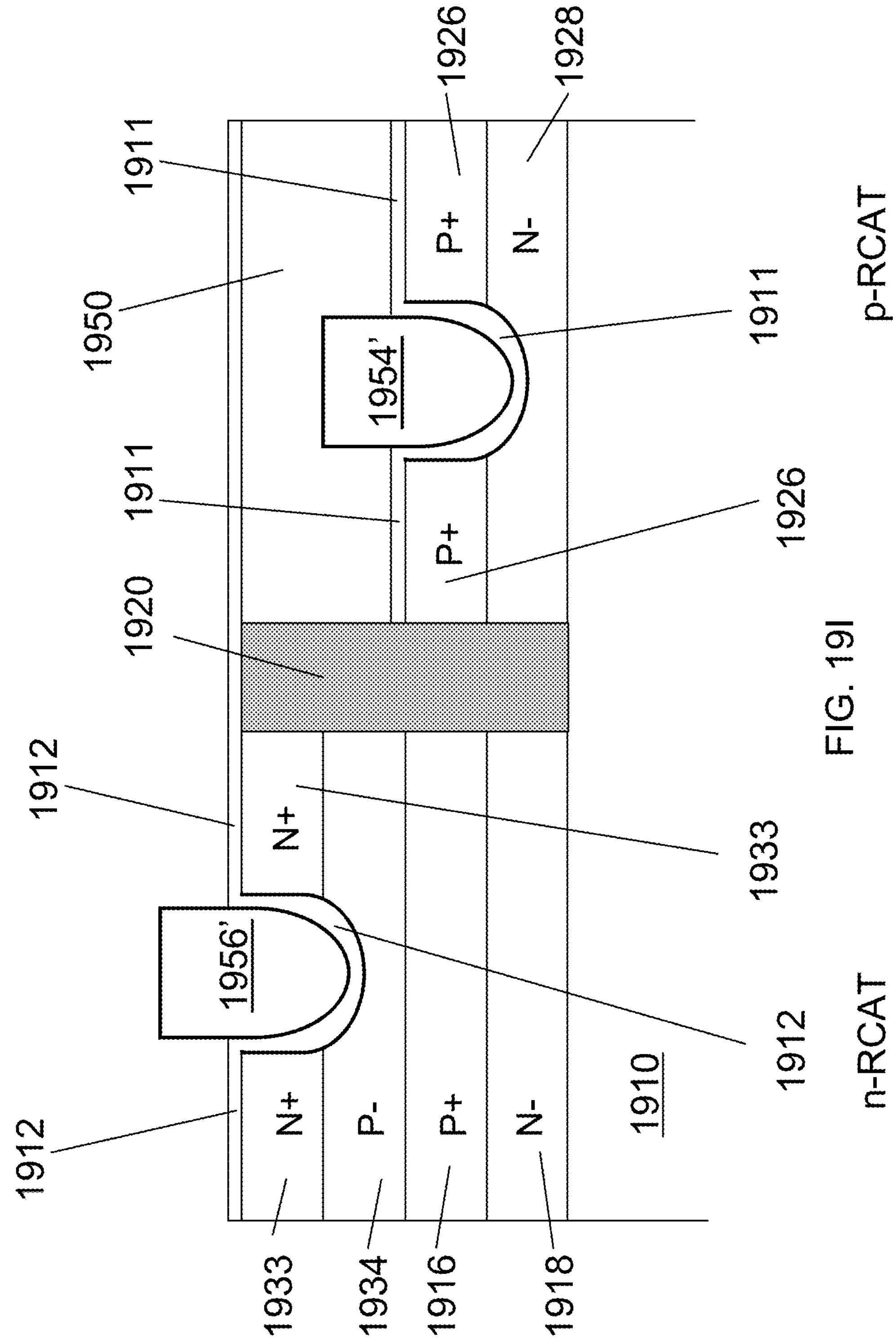
Figure 19J:
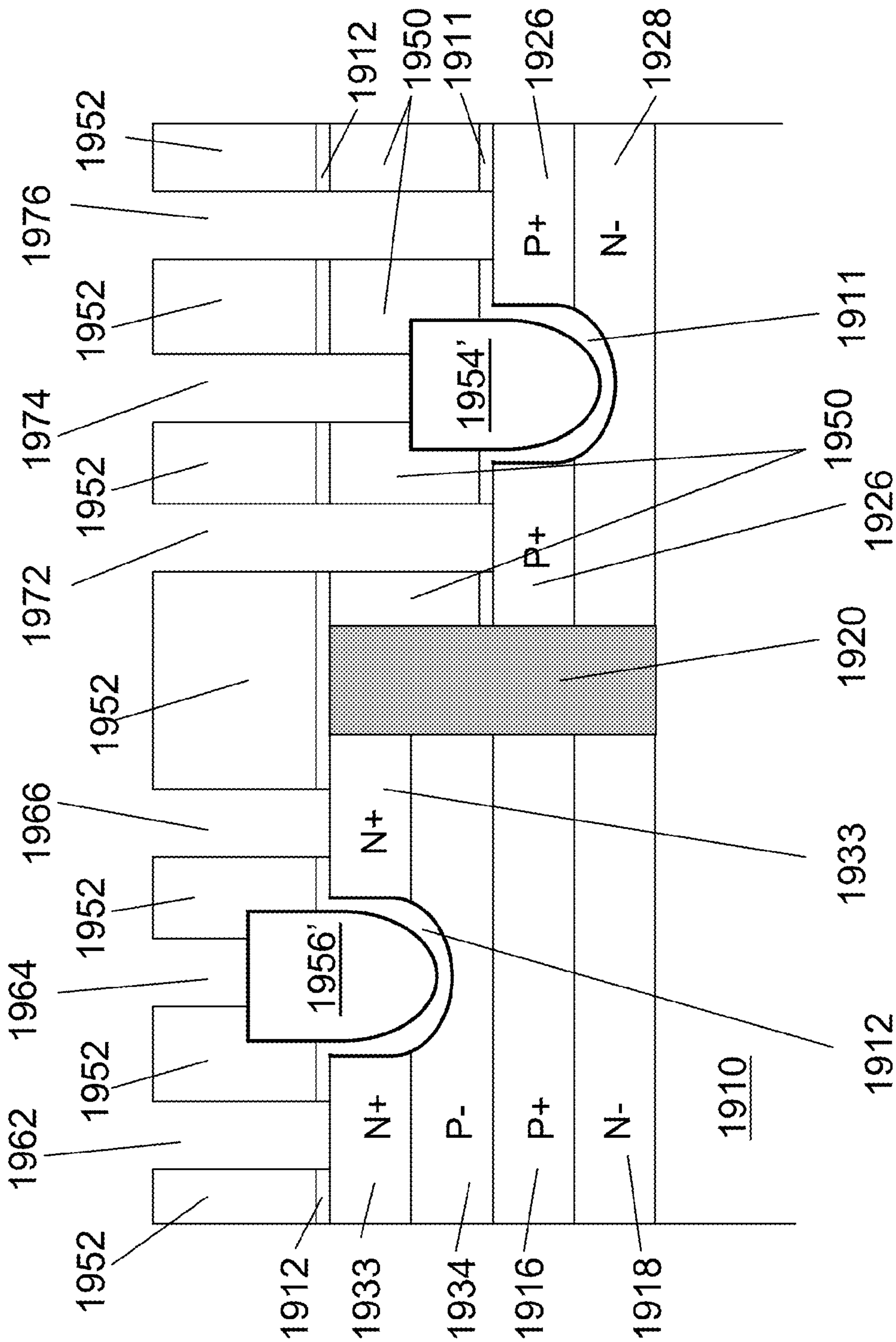

As illustrated in FIG. 19I, a gate oxide 1912 may be formed and a gate metal material 1956 may be deposited. The gate oxide 1912 may be an atomic layer deposited (ALD) gate dielectric that is paired with a work function specific gate metal 1956 in the industry standard high k metal gate process schemes described previously and targeted for use in a n-channel RCAT. Or the gate oxide 1912 may be formed with a low temperature oxide deposition or low temperature microwave plasma oxidation of the silicon surfaces and then a gate material such as, for example, tungsten or aluminum may be deposited. Then the gate material 1956 may be chemically mechanically polished, and the gate electrode 1956' defined by masking and etching As illustrated in FIG. 19J, the entire structure may be substantially covered with a Low Temperature Oxide 1952, which may be planarized with chemical mechanical polishing. Contacts and metal interconnects may be formed by lithography and plasma/RIE etch. The n-RCAT N+ source and drain regions 1933, P− transistor channel region 1934, gate dielectric 1912 and gate electrode 1956' are shown. The p-RCAT P+ source and drain regions 1926, N− transistor channel region 1928, gate dielectric 1911 and gate electrode 1954' are shown. Transistor isolation region 1920, oxide 1952, n-RCAT source contact 1962, gate contact 1964, and drain contact 1966 are shown. p-RCAT source contact 1972, gate contact 1974, and drain contact 1976 are shown. The n-RCAT source contact 1962 and drain contact 1966 provide electrical coupling to their respective N+ regions 1933. The n-RCAT gate contact 1964 provides electrical coupling to gate electrode 1956'. The p-RCAT source contact 1972 and drain contact 1976 provide electrical coupling their respective N+ region 1926. The p-RCAT gate contact 1974 provides electrical coupling to gate electrode 1954'. Contacts (not shown) to P+ doped region 1916, and N− doped region 1918 may be made to allow biasing for noise suppression and back-gate/substrate biasing.

Interconnect metallization may then be conventionally formed. The thru layer via 1960 (not shown) may be formed to electrically couple the complementary RCAT layer metallization to the acceptor substrate 1910 at acceptor wafer metal connect pad 1980 (not shown). This flow enables the formation of a mono-crystalline silicon n-RCAT and p-RCAT constructed in a single layer transfer of prefabricated wafer sized doped layers, which may be formed and connected to the underlying multi-metal layer semiconductor device without exposing the underlying devices to a high temperature.

Persons of ordinary skill in the art will appreciate that the illustrations in FIGS. 19A through 19J are exemplary only and are not drawn to scale. Such skilled persons will further appreciate that many variations are possible such as, for example, the n-RCAT may be processed prior to the p-RCAT, or that various etch hard masks may be employed. Such skilled persons will further appreciate that devices other than a complementary RCAT may be created with minor variations of the process flow, such as, for example, complementary bipolar junction transistors, or complementary raised source drain extension transistors, or complementary junction-less transistors, or complementary V-groove transistors. Many other modifications within the scope of the invention will suggest themselves to such skilled persons after reading this specification. Thus the invention is to be limited only by the appended claims.

Figures 20A, 20B:
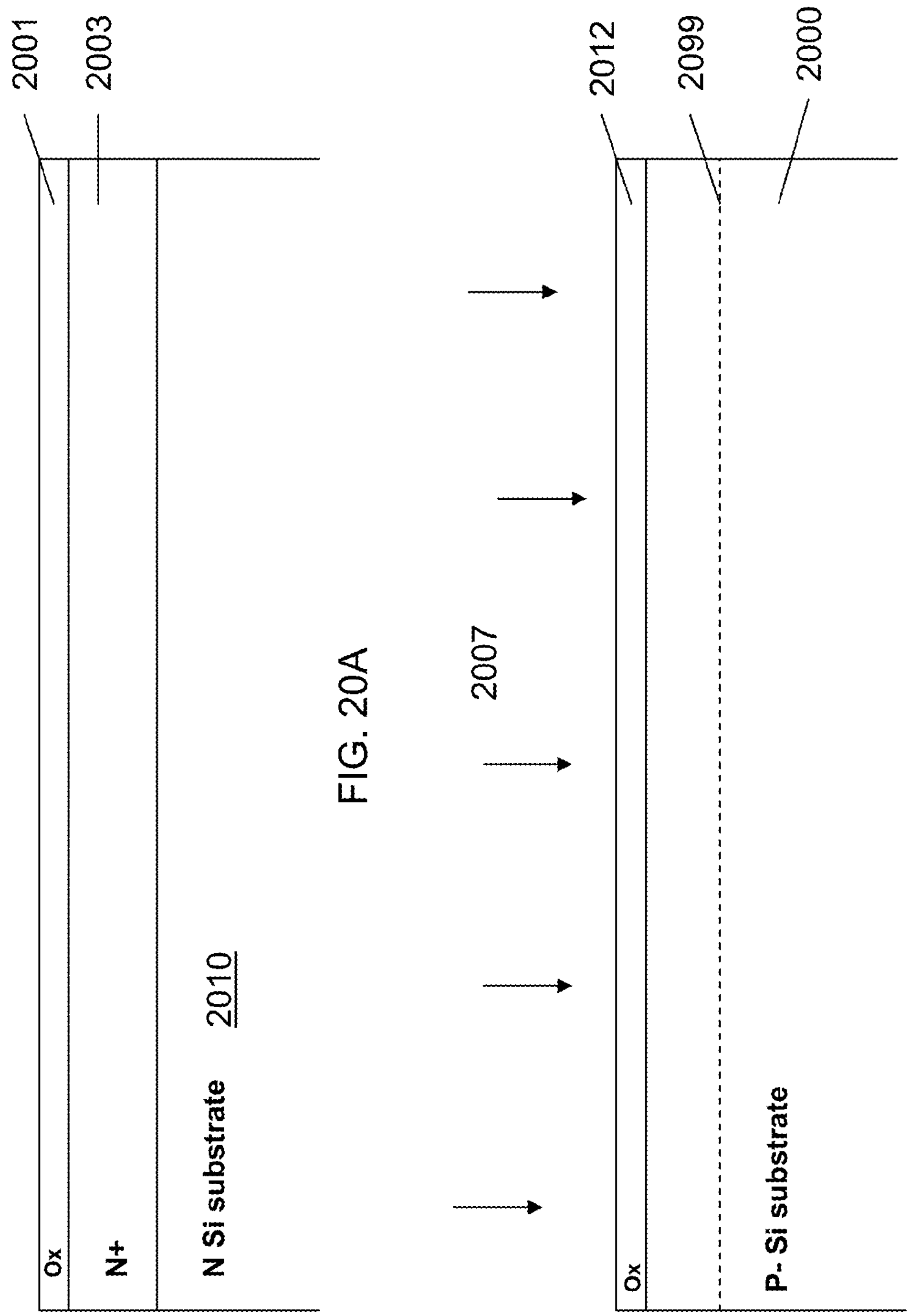
FIGS. 20A-P are exemplary drawing illustrations of steps for formation of 3D cells.
Figure 20C:
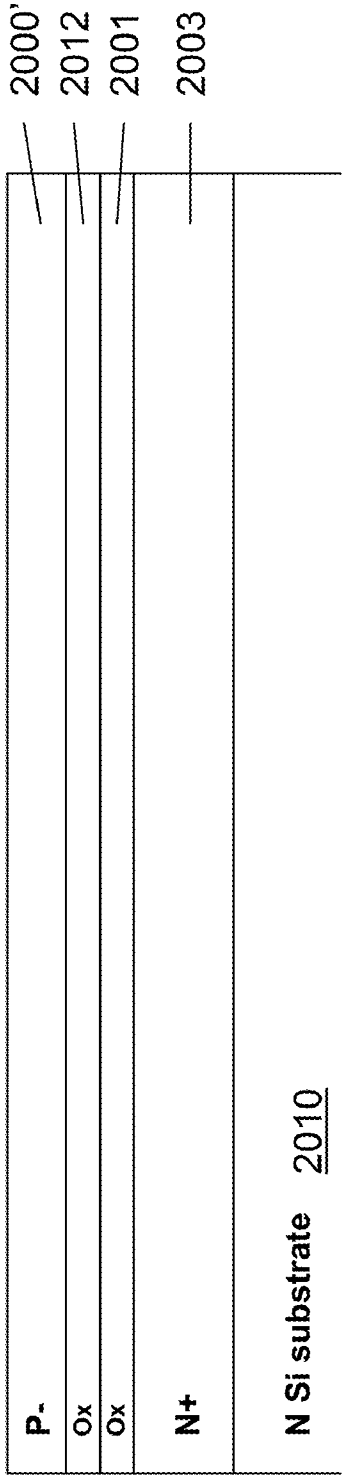
Figure 20D:
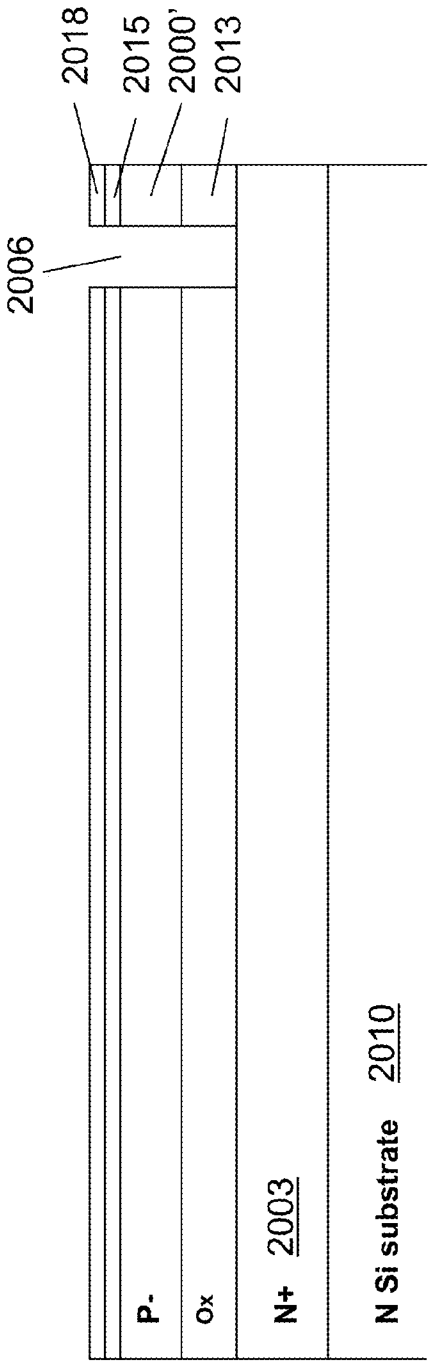
Figure 20E:
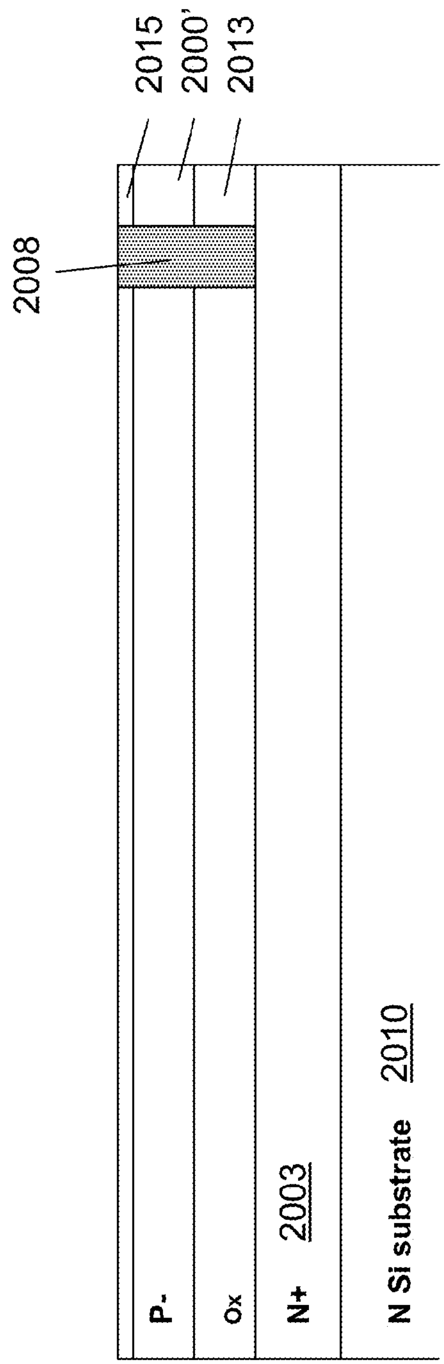
Figure 20F:
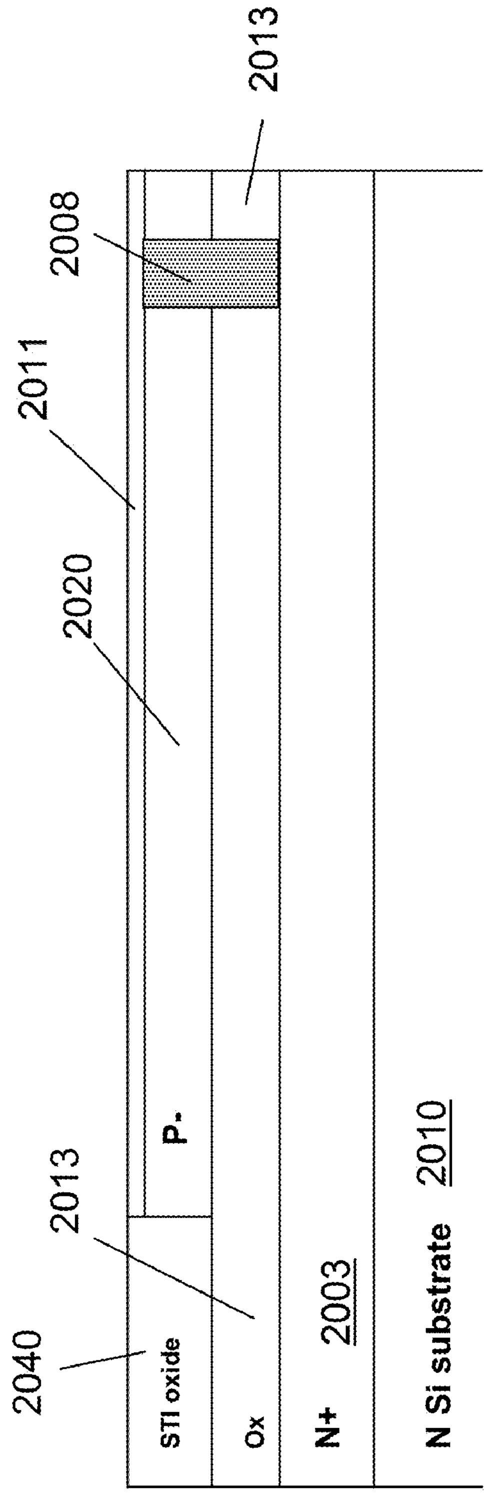
Figure 20G:
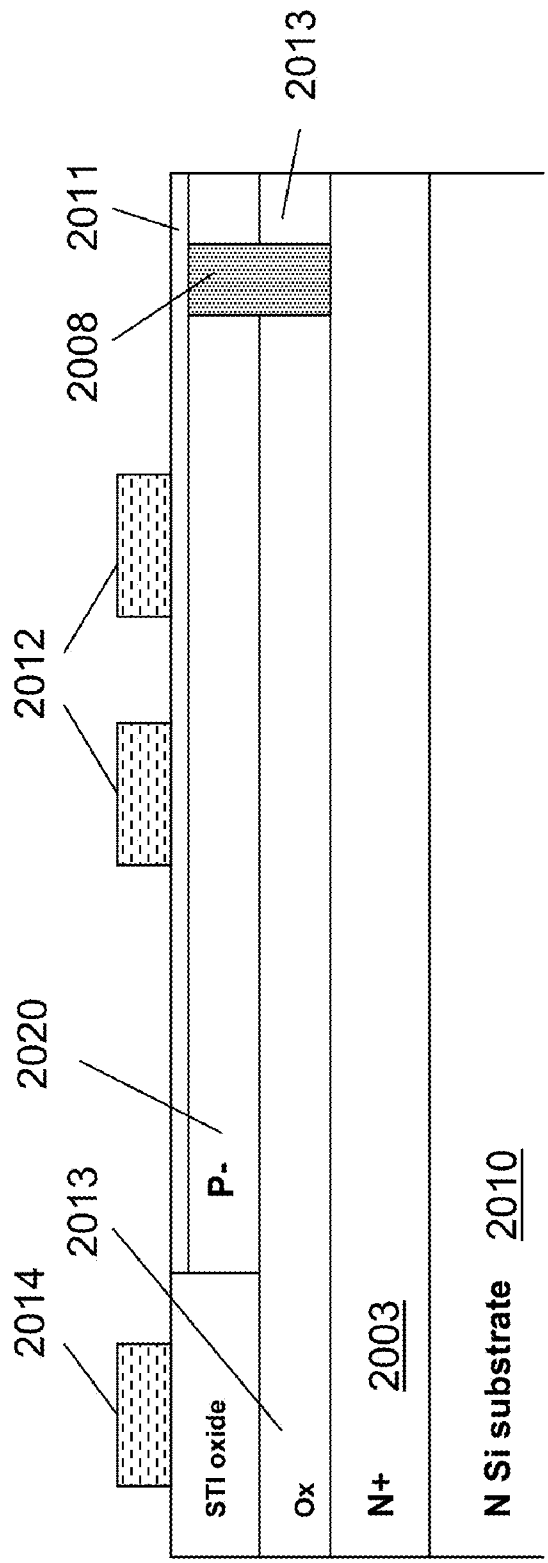
Figure 20H:
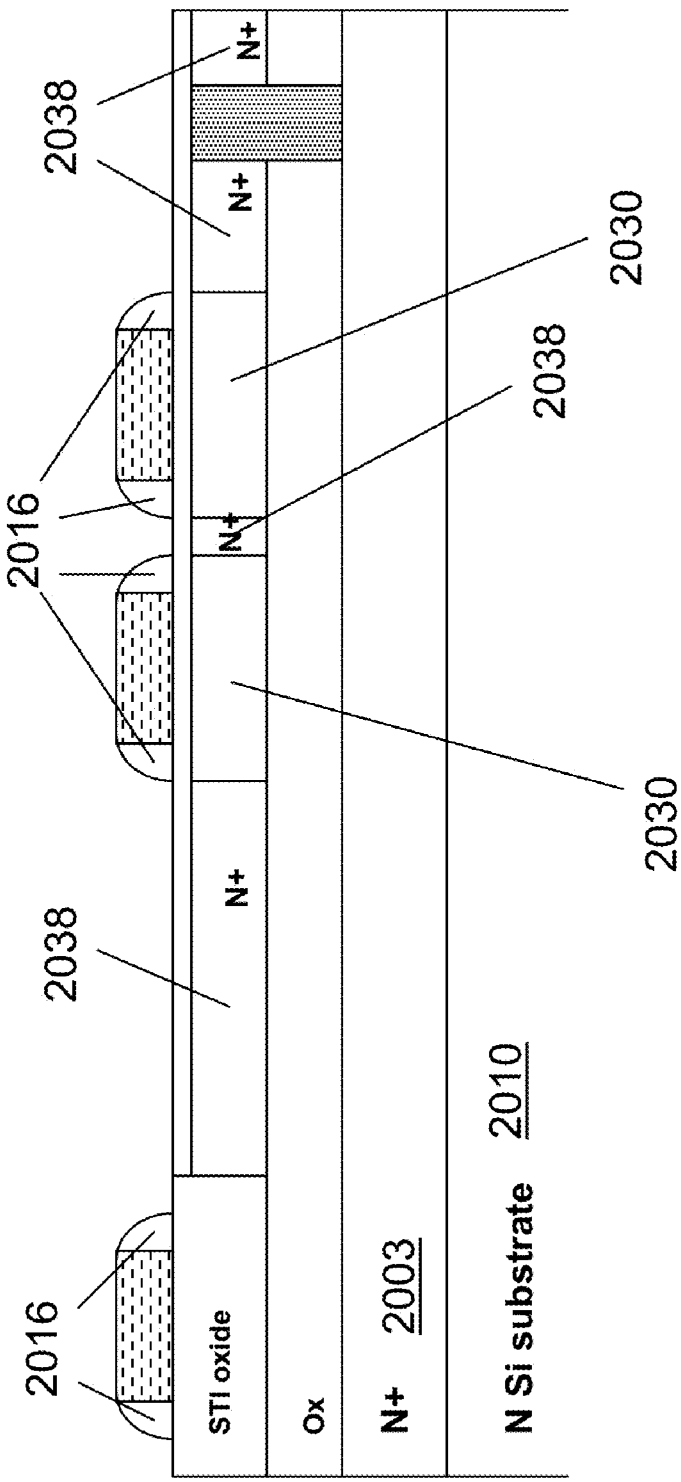
Figure 20I:
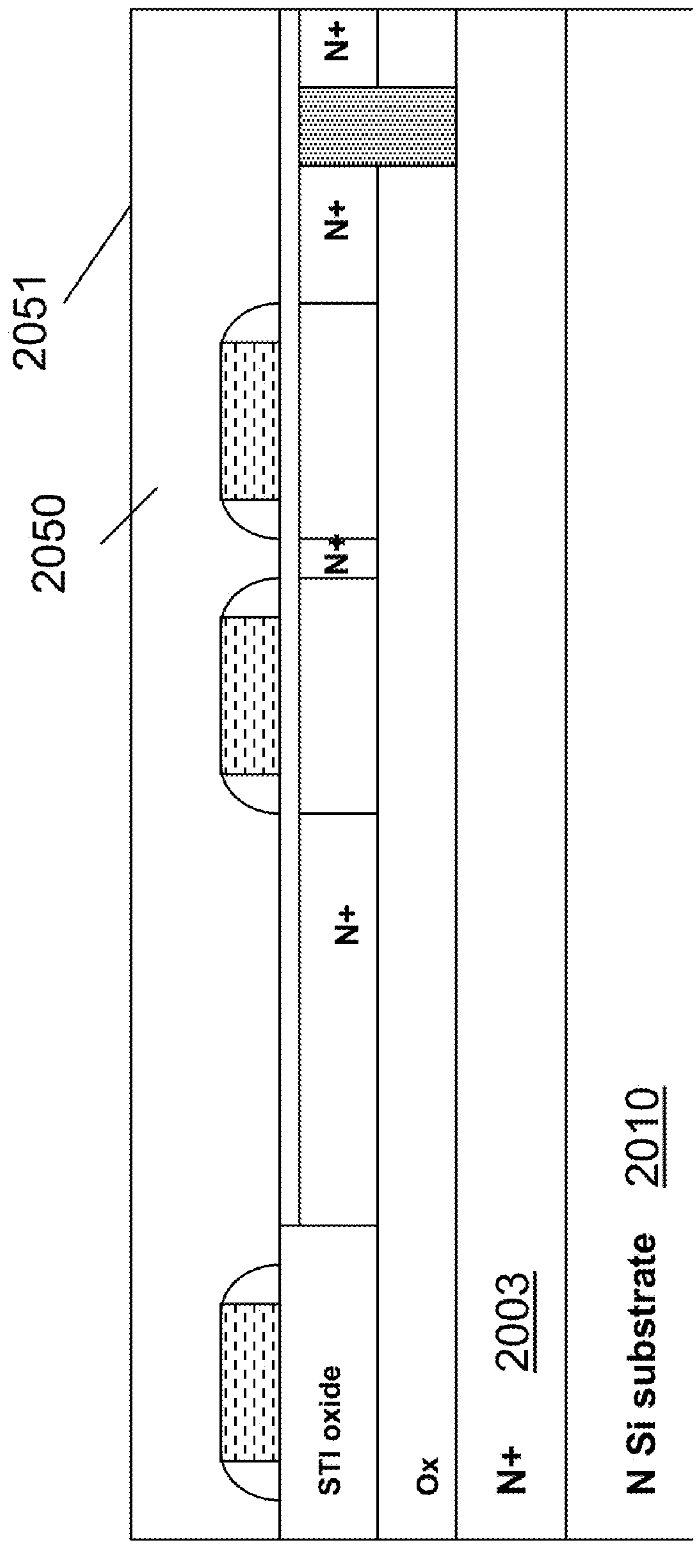
Figure 20J:
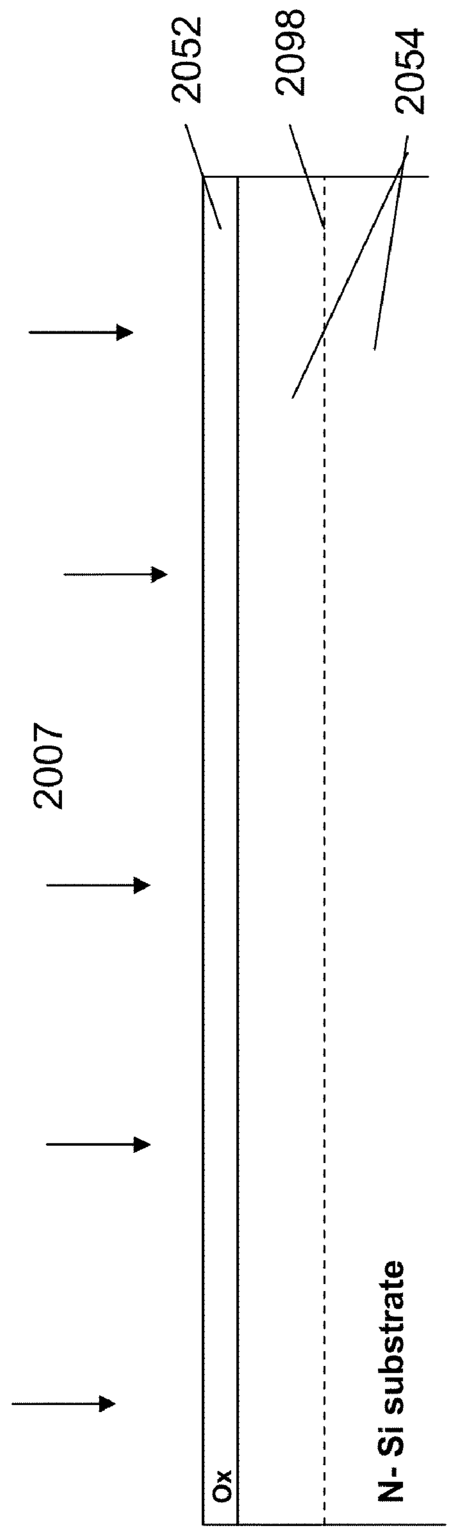
Figure 20K:
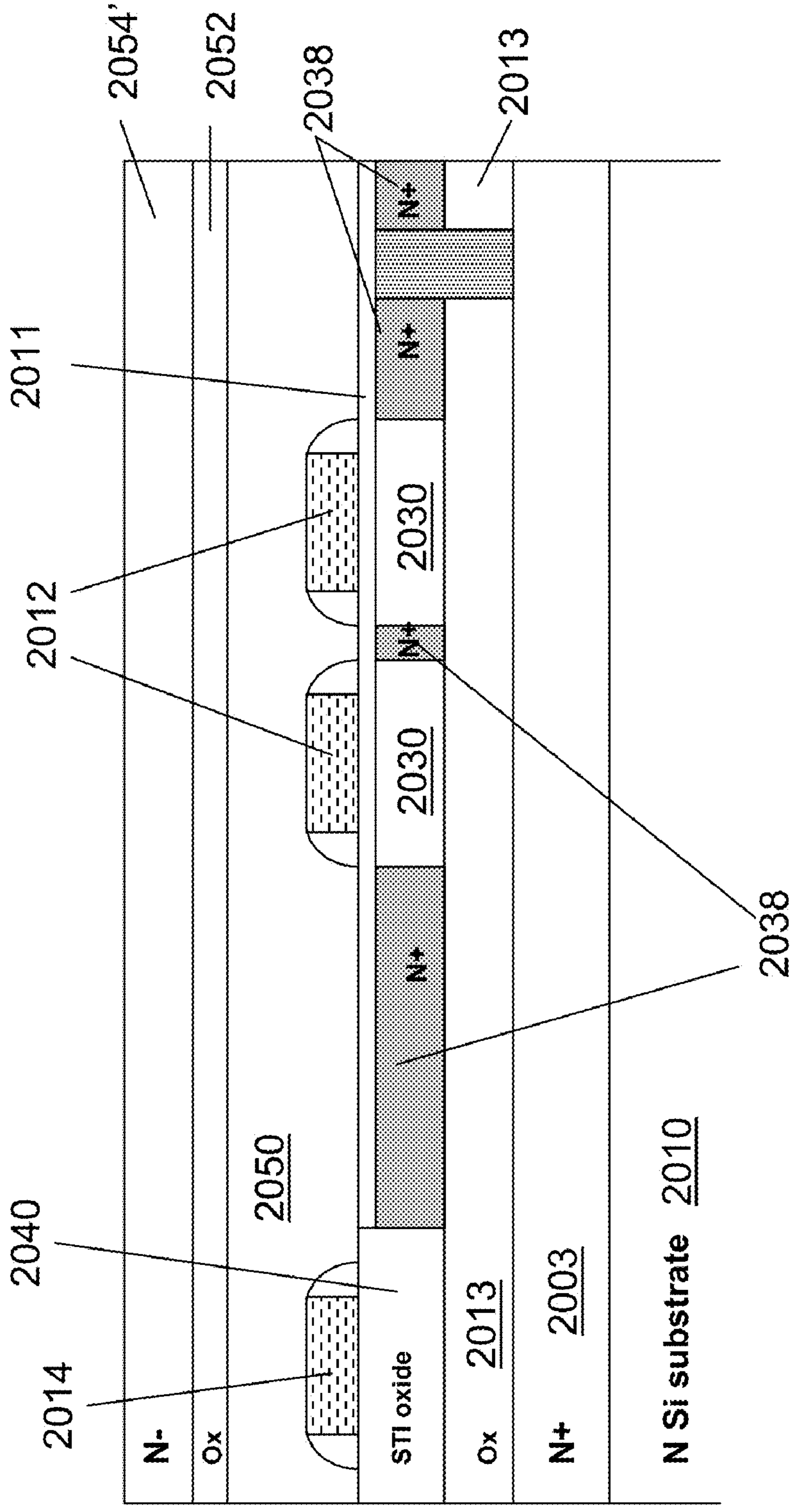
Figure 20L:
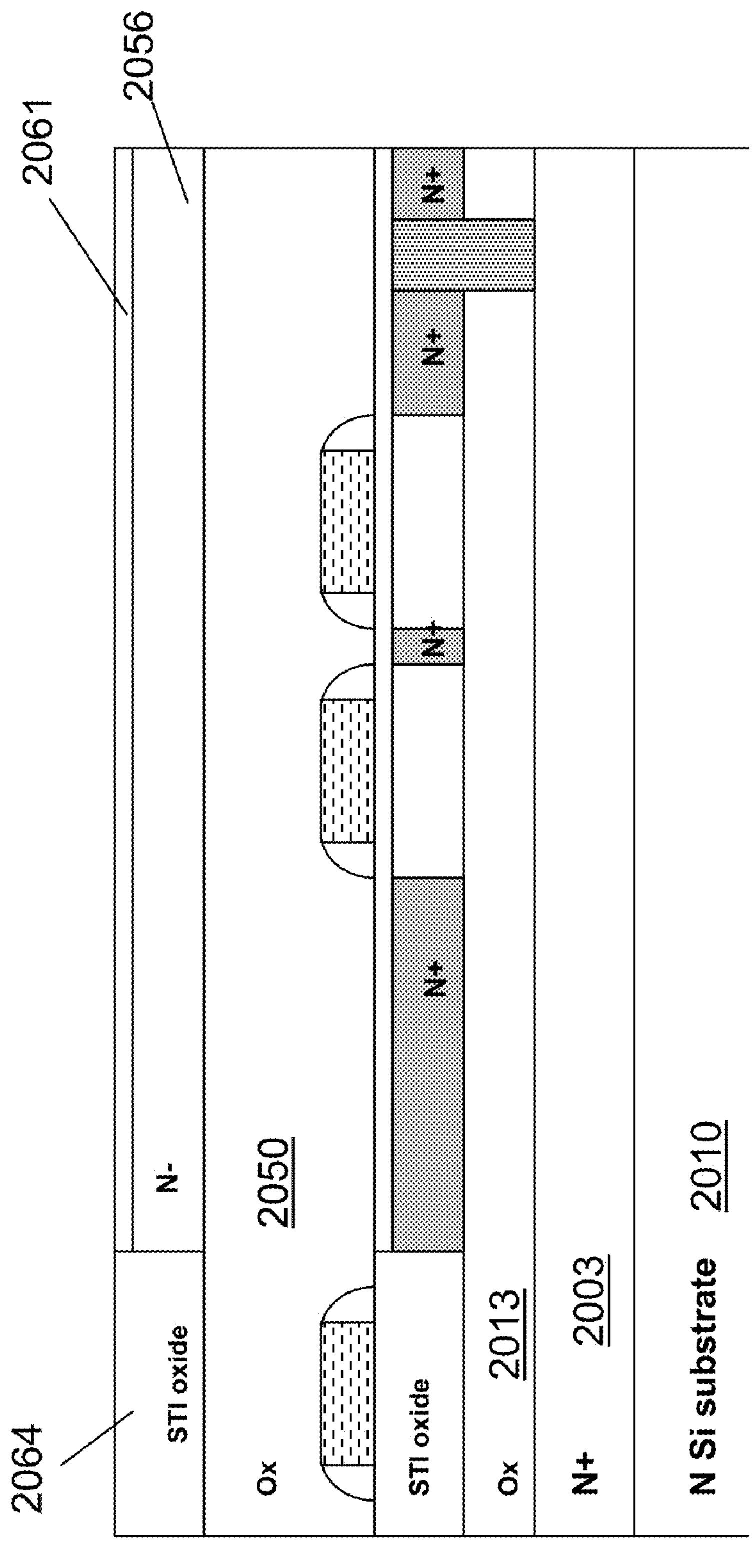
Figure 20M:
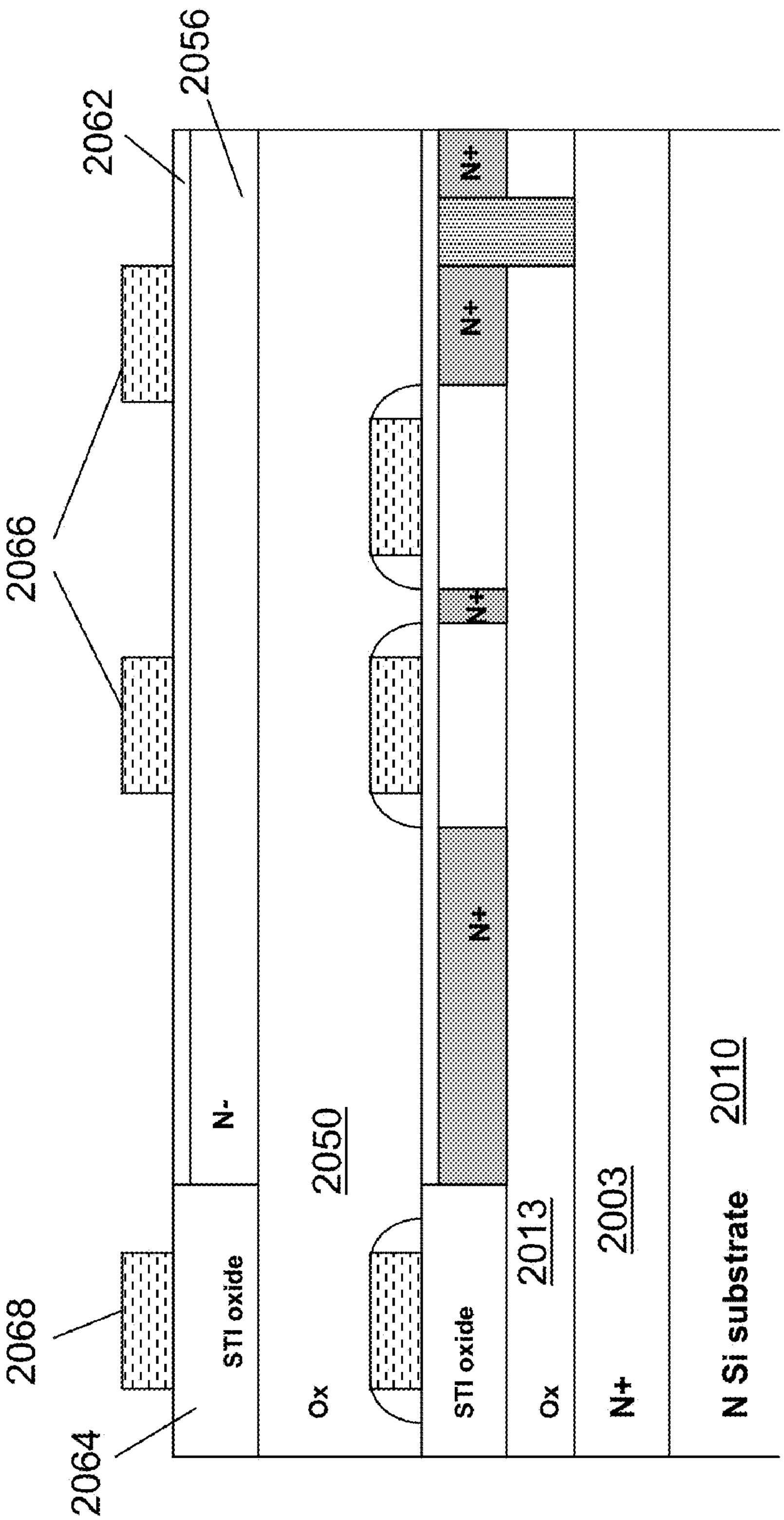
Figure 20N:
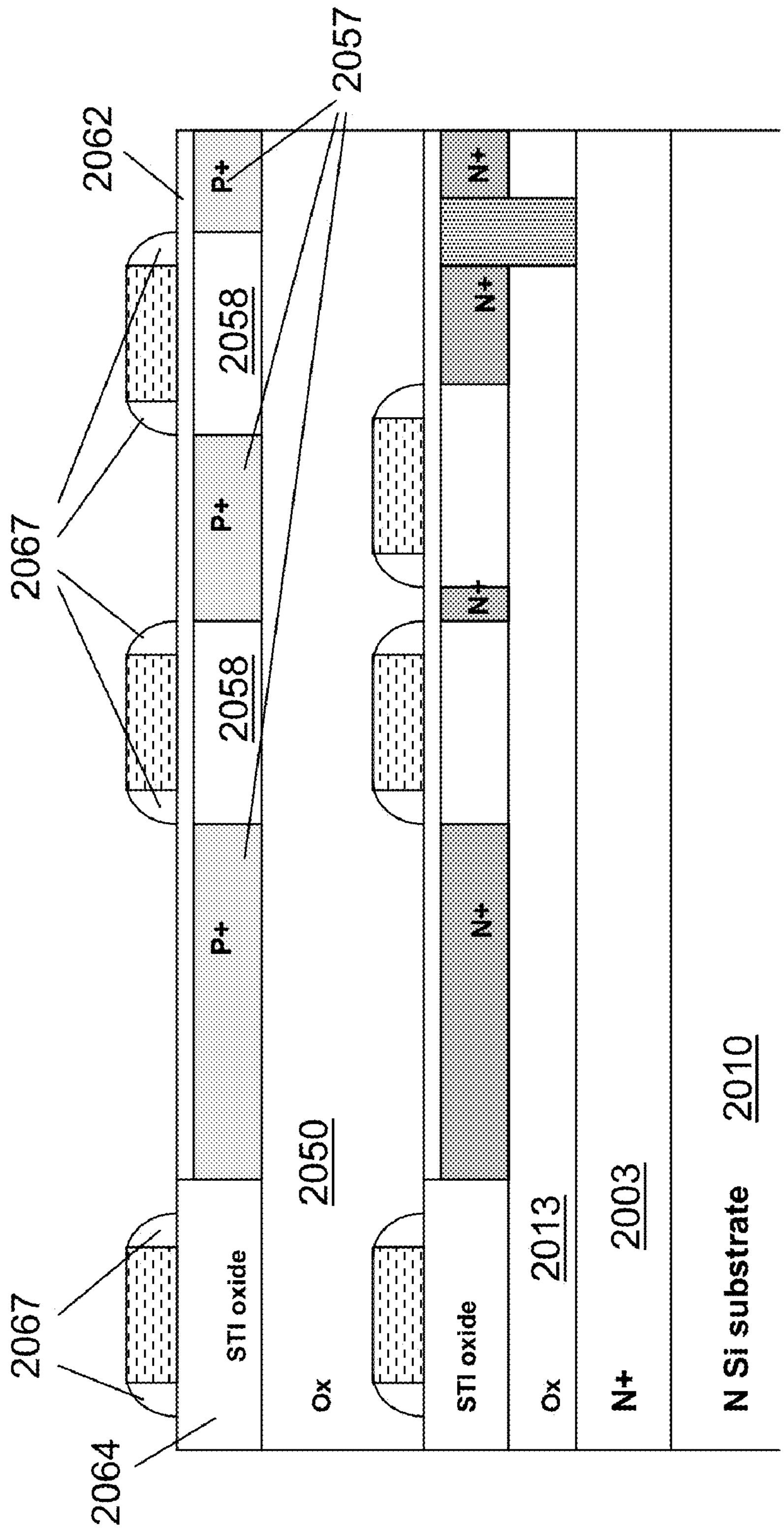
Figure 20O:
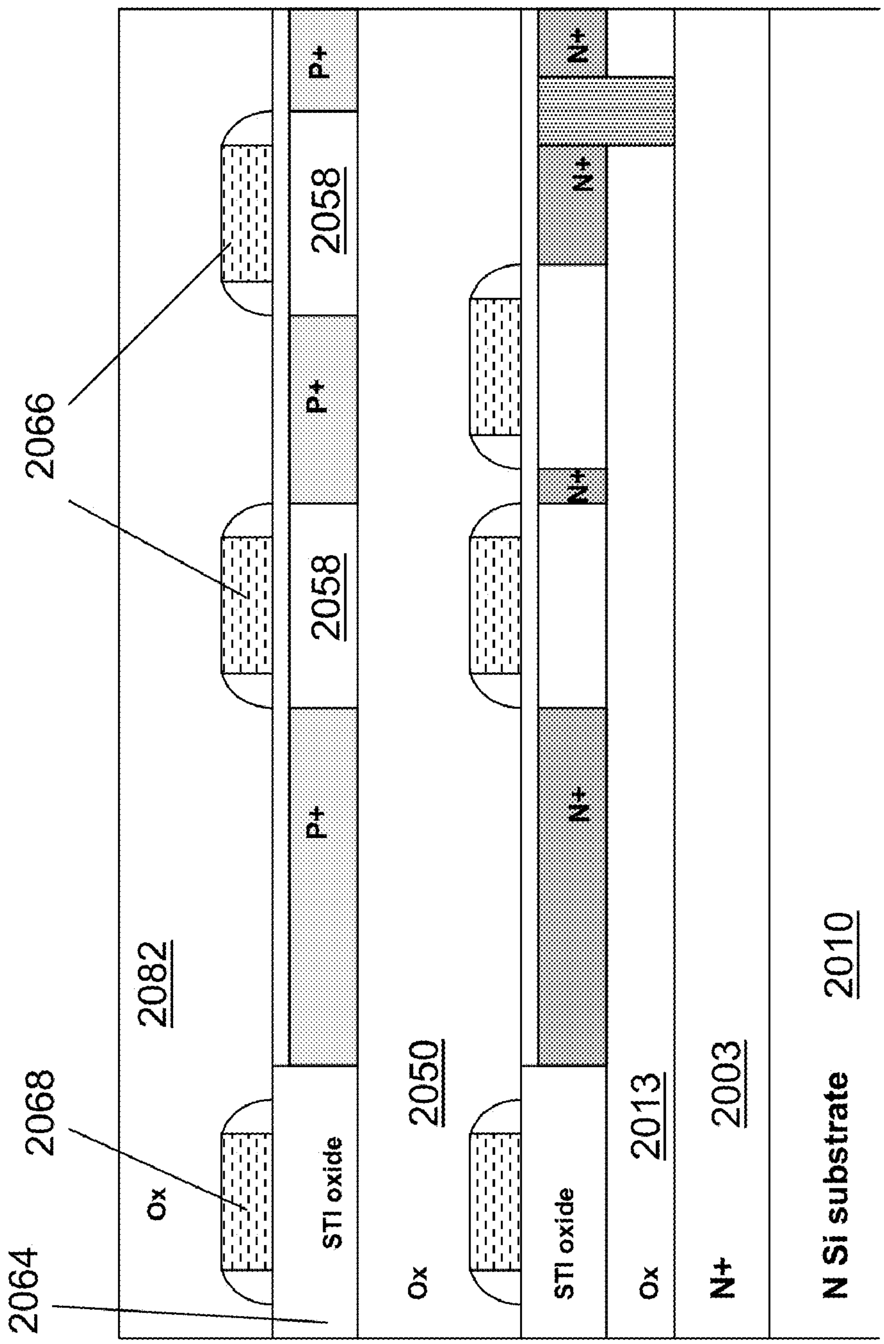
Figure 20P:
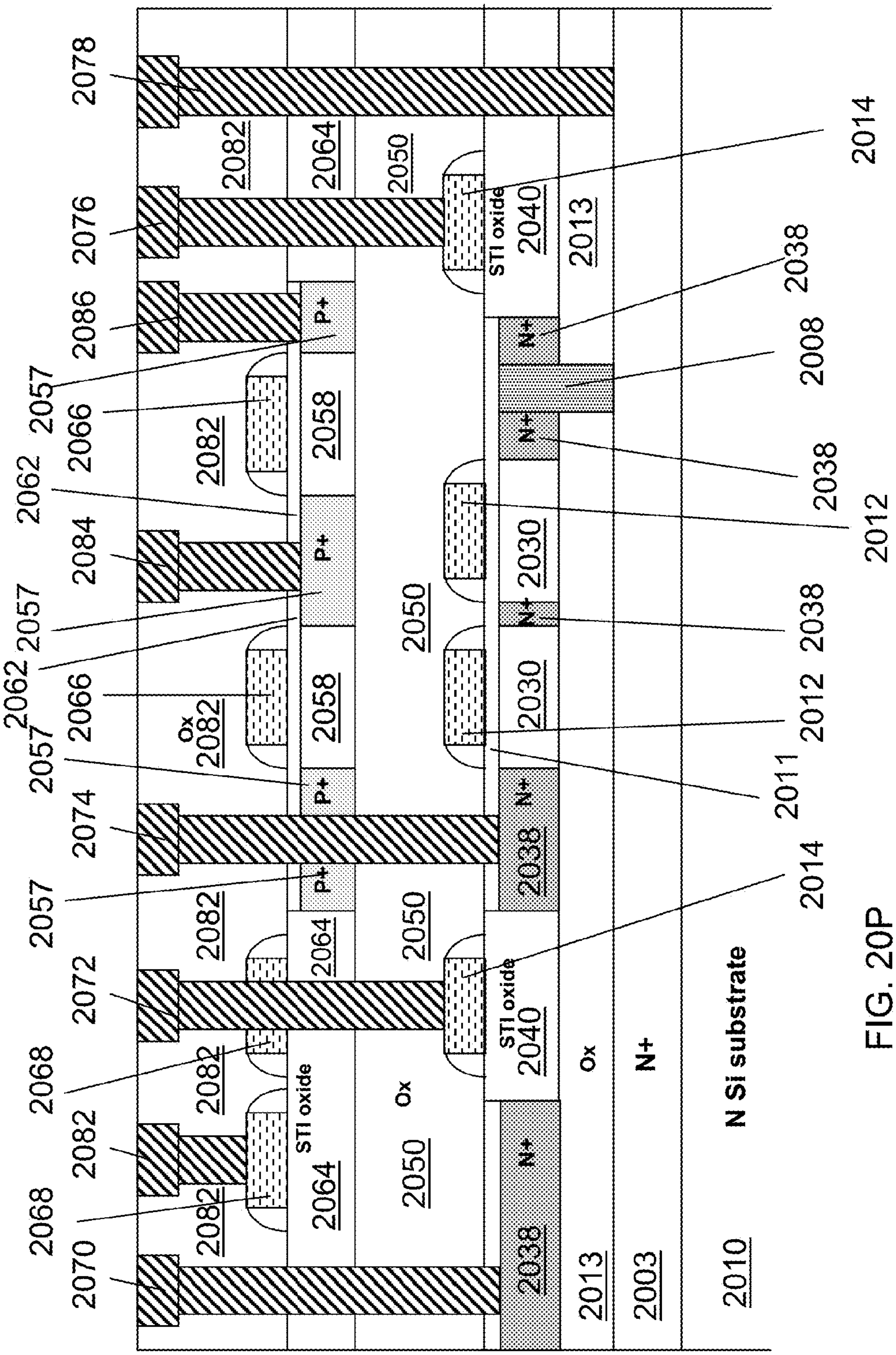

An alternative process flow to create devices and interconnect to enable building a 3D IC and a 3D IC cell library is illustrated in FIGS. 20A to 20P.

As illustrated in FIG. 20A, a heavily doped N type mono-crystalline acceptor wafer 2010 may be processed to comprise a wafer sized layer of N+ doping 2003. N+ doped layer 2003 may be formed by ion implantation and thermal anneal or may alternatively be formed by epitaxially depositing a doped N+ silicon layer or by a combination of epitaxy and implantation and anneals. A screen oxide 2001 may be grown or deposited before the implant to protect the silicon from implant contamination and to provide an oxide surface for later wafer to wafer bonding. Alternatively, a high temperature resistant metal such as, for example, Tungsten may be added as a low resistance interconnect layer, as a uniform wafer sized sheet layer across the wafer or as a defined geometry metallization, and oxide layer 2001 may be deposited to provide an oxide surface for later wafer to wafer bonding. The doped N+ layer 2003 or the high temperature resistant metal in the acceptor wafer may function as the ground plane or ground lines for the source connections of the NMOS transistors manufactured in the donor wafer above it.

As illustrated in FIG. 20B, the top surface of a P− mono-crystalline silicon donor wafer 2000 may be prepared for oxide wafer bonding with a deposition of an oxide 2012 or by thermal oxidation of the P− donor wafer to form oxide layer 2002. A layer transfer demarcation plane 2099 (shown as a dashed line) may be formed in donor wafer 2000 by hydrogen implantation 2007 or other methods as previously described. Both the donor wafer 2000 and acceptor wafer 2010 may be prepared for wafer bonding as previously described and then bonded. The portion of the P− donor wafer substrate 2000 that is above the layer transfer demarcation plane 2099 may be removed by cleaving and polishing, or other processes as previously described, such as, for example, ion-cut or other methods.

As illustrated in FIG. 20C, the remaining P− layer 2000' and oxide layer 2012 has been layer transferred to acceptor wafer 2010. The top surface of P− layer 2000' may be chemically or mechanically polished smooth and flat and epitaxial (EPI) smoothing techniques may be employed. For illustration clarity, the oxide layers, such as 2001 and 2012, used to facilitate the wafer to wafer bond, are combined and shown as oxide layer 2013.

As illustrated in FIG. 20D a CMP polish stop layer 2018, such as, for example, silicon nitride or amorphous carbon, may be deposited after oxide layer 2015. A contact opening is lithographically defined and plasma/RIE etched removing regions of P− doped layer 2000' and oxide layer 2013 to form the NMOS source to ground contact opening 2006.

As illustrated in FIG. 20E, the NMOS source to ground contact opening 2006 is filled by a deposition of heavily doped polysilicon or amorphous silicon, or a high melting point metal such as, for example, tungsten, and then chemically mechanically polished to the level of the oxide layer 2015. This forms the NMOS source to ground contact 2008. Alternatively, these contacts could be used to connect the drain or source of the NMOS to any signal line in the high temperature resistant metal in the acceptor wafer.

Next, a standard NMOS transistor formation process flow is performed with two exceptions. First, no lithographic masking steps are used for an implant step that differentiates NMOS and PMOS devices, as only the NMOS devices are being formed in this layer. Second, high temperature anneal steps may or may not be done during the NMOS formation, as some or substantially all of the necessary anneals can be done after the PMOS formation described later.

As illustrated in FIG. 20F a shallow trench oxide region may be lithographically defined and plasma/RIE etched to at least the top level of oxide layer 2013 removing regions of P− mono-crystalline silicon layer 2000'. A gap-fill oxide may be deposited and CMP'ed flat to form conventional STI oxide isolation region 2040 and P− doped mono-crystalline silicon regions 2020. Threshold adjust implants may or may not be performed at this time. The silicon surface is cleaned of remaining oxide with a short HF (Hydrofluoric Acid) etch or other method.

As illustrated in FIG. 20G, a gate oxide 2011 may be formed and a gate metal material, such as, for example, polycrystalline silicon, may be deposited. The gate oxide 2012 may be an atomic layer deposited (ALD) gate dielectric that is paired with a work function specific gate metal in the industry standard high k metal gate process schemes described previously. Or the gate oxide 2012 may be formed with a low temperature oxide deposition or low temperature microwave plasma oxidation of the silicon surfaces and then a gate material such as, for example, tungsten or aluminum may be deposited. Then the NMOS gate electrodes 2012 and poly on STI interconnect 2014 may be defined by masking and etching. Gate stack self aligned LDD (Lightly Doped Drain) and halo punch-thru implants may be performed at this time to adjust junction and transistor breakdown characteristics.

As illustrated in FIG. 20H a conventional spacer deposition of oxide and/or nitride and a subsequent etchback may be done to form NMOS implant offset spacers 2016 on the NMOS gate electrodes 2012 and the poly on STI interconnect 2014. Then a self aligned N+ source and drain implant may be performed to create NMOS transistor source and drains 2038 and remaining P− silicon NMOS transistor channels 2030. High temperature anneal steps may or may not be done at this time to activate the implants and set initial junction depths. A self aligned silicide may also be formed.

As illustrated in FIG. 20I the entire structure may be substantially covered with a gap fill oxide 2050, which may be planarized with chemical mechanical polishing. The oxide surface 2051 may be prepared for oxide to oxide wafer bonding as previously described.

Additionally, one or more metal interconnect layers (not shown) with associated contacts and vias (not shown) may be constructed utilizing standard semiconductor manufacturing processes. The metal layer may be constructed at lower temperature using such metals as Copper or Aluminum, or may be constructed with refractory metals such as, for example, Tungsten to provide high temperature utility at greater than approximately 400° C.

As illustrated in FIG. 20J, an N− mono-crystalline silicon donor wafer 2054 may be prepared for oxide wafer bonding with a deposition of an oxide 2052 or by thermal oxidation of the N− donor wafer to form oxide layer 2052. A layer transfer demarcation plane 2098 (shown as a dashed line) may be formed in donor wafer 2054 by hydrogen implantation 2007 or other methods as previously described. Both the donor wafer 2054 and the now acceptor wafer 2010 may be prepared for wafer bonding as previously described, and then bonded. To optimize the PMOS mobility, the donor wafer 2054 may be rotated with respect to the acceptor wafer 2010 as part of the bonding process to facilitate creation of the PMOS channel in the <110> silicon plane direction. The portion of the N− donor wafer substrate 2054 that is above the layer transfer demarcation plane 2098 may be removed by cleaving and polishing, or other processes as previously described, such as, for example, ion-cut or other methods.

As illustrated in FIG. 20K, the remaining N− layer 2054' and oxide layer 2052 has been layer transferred to acceptor wafer 2010. Oxide layer 2052 is bonded to oxide layer 2050. The top surface of N− layer 2054' may be chemically or mechanically polished smooth and flat and epitaxial (EPI) smoothing techniques may be employed. For illustration clarity oxide layer 2052 used to facilitate the wafer to wafer bond is not shown in subsequent illustrations.

As illustrated in FIG. 20L a polishing stop layer 2061, such as, for example, silicon nitride or amorphous carbon with a protecting oxide layer may be deposited. Then a shallow trench region may be lithographically defined and plasma/RIE etched to at least the top level of oxide layer 2050 removing regions of N− mono-crystalline silicon layer 2054'. A gap-fill oxide may be deposited and CMP'ed flat to form conventional STI oxide isolation region 2064 and N− doped mono-crystalline silicon regions 2056. Transistor threshold adjust implants may or may not be performed at this time. The silicon surface is cleaned of remaining oxide with a short HF (Hydrofluoric Acid) etch or other method.

As illustrated in FIG. 20M, a gate oxide 2062 may be formed and a gate metal material, such as, for example, polycrystalline silicon, may be deposited. The gate oxide 2062 may be an atomic layer deposited (ALD) gate dielectric that is paired with a work function specific gate metal in the industry standard high k metal gate process schemes described previously. Or the gate oxide 2062 may be formed with a low temperature oxide deposition or low temperature microwave plasma oxidation of the silicon surfaces and then a gate material such as, for example, tungsten or aluminum may be deposited. Then the PMOS gate electrodes 2066 and poly on STI interconnect 2068 may be defined by masking and etching. Gate stack self aligned LDD (Lightly Doped Drain) and halo punch-thru implants may be performed at this time to adjust junction and transistor breakdown characteristics.

As illustrated in FIG. 20N a conventional spacer deposition of oxide and/or nitride and a subsequent etchback may be done to form PMOS implant offset spacers 2067 on the PMOS gate electrodes 2066 and the poly on STI interconnect 2068. Then a self aligned N+ source and drain implant may be performed to create PMOS transistor source and drains 2057 and remaining N− silicon PMOS transistor channels 2058. Thermal anneals to activate implants and set junctions in both the PMOS and NMOS devices may be performed with RTA (Rapid Thermal Anneal) or furnace thermal exposures. Alternatively, laser annealing may be utilized to activate implants and set the junctions. Optically absorptive and reflective layers as described previously may be employed to anneal implants and activate junctions. A self aligned silicide may also be formed.

As illustrated in FIG. 200 the entire structure may be substantially covered with a Low Temperature Oxide 2082, which may be planarized with chemical mechanical polishing.

Additionally, one or more metal interconnect layers (not shown) with associated contacts and vias (not shown) may be constructed utilizing standard semiconductor manufacturing processes. The metal layer may be constructed at lower temperature using such metals as Copper or Aluminum, or may be constructed with refractory metals such as, for example, Tungsten to provide high temperature utility at greater than approximately 400° C.

As illustrated in FIG. 20P, contacts and metal interconnects may be formed by lithography and plasma/RIE etch. The N mono-crystalline silicon substrate 2010, N+ ground plane layer 2003, oxide regions 2013, NMOS source to ground contact 2008, N+ NMOS source and drain regions 2038, NMOS channel regions 2030, NMOS STI oxide regions 2040, NMOS gate dielectric 2011, NMOS gate electrodes 2012, NMOS gates over STI 2014, gap fill oxide 2050, PMOS STI oxide regions 2064, P+ PMOS source and drain regions 2057, PMOS channel regions 2058, PMOS gate dielectric 2062, PMOS gate electrodes 2066, PMOS gates over STI 2068, and gap fill oxide 2082 are shown. Three groupings of the eight interlayer contacts may be lithographically defined and plasma/RIE etched. First, the contact 2078 to the N+ ground plane layer 2003, as well as the NMOS drain only contact 2070 and the NMOS only gate on STI contact 2076 may be masked and etched in a first contact step, which is a deep oxide etch stopping on silicon (2038 and 2003) or polycrystalline silicon 2014. Then the NMOS & PMOS gate on STI interconnect contact 2072 and the NMOS & PMOS drain contact 2074 may be masked and etched in a second contact step, which is an oxide/silicon/oxide etch stopping on silicon 2038 and poly-crystalline silicon 2014. These contacts also make an electrical connection to the sides of silicon 2057 and poly-crystalline silicon 2068. Then the PMOS gate interconnect on STI contact 2082, the PMOS only source contact 2084, and the PMOS only drain contact 2086 may be masked and etched in a third contact step, which is a shallow oxide etch stopping on silicon 2057 or poly-crystalline silicon 2068. Alternatively, the shallowest contacts may be masked and etched first, followed by the mid-level, and then the deepest contacts. The metal lines are mask defined and etched, contacts and metal line filled with barrier metals and copper interconnect, and CMP'ed in a normal Dual Damascene interconnect scheme, thereby completing the eight types of contact connections.

An advantage of this 3D cell structure is the independent formation of the PMOS transistors and the NMOS transistors. Therefore, each transistor formation may be optimized independently. This may be accomplished by the independent selection of the crystal orientation, various stress materials and techniques, such as, for example, doping profiles, material thicknesses and compositions, temperature cycles, and so forth.

This process flow enables the manufacturing of a 3D IC library of cells that can be created from the devices and interconnect constructed by layer transferring prefabricated wafer sized doped layers. In addition, with reference to the FIG. 2 discussions, these devices and interconnect may be formed and then layer transferred and electrically coupled to an underlying multi-metal layer semiconductor device without exposing the underlying devices to a high temperature.

Persons of ordinary skill in the art will appreciate that the illustrations in FIGS. 20A through 20P are exemplary only and are not drawn to scale. Such skilled persons will further appreciate that many variations are possible such as, for example, the PMOS may be built first and the NMOS stacked on top, or one or more layers of interconnect metallization may be constructed between the NMOS and PMOS transistor layers, or one or more layers interconnect metallization may be constructed on top of the PMOS devices, or more than one NMOS or PMOS device layer may be stacked such that the resulting total number of mono-crystalline silicon device layers is greater than two, backside TSVs may be employed to connect to the ground plane, or devices other than CMOS MOSFETS may be created with minor variations of the process flow, such as, for example, complementary bipolar junction transistors, or complementary raised source drain extension transistors, or complementary junction-less transistors. Many other modifications within the scope of the invention will suggest themselves to such skilled persons after reading this specification. Thus the invention is to be limited only by the appended claims.

3D memory device structures may also be constructed in layers of mono-crystalline silicon and take advantage of pre-processing a donor wafer by forming wafer sized layers of various materials without a process temperature restriction, then layer transferring the preprocessed donor wafer to the acceptor wafer, followed by some optional processing steps, and repeating this procedure multiple times, and then processing with either low temperature (below approximately 400° C.) or high temperature (greater than approximately 400° C.) after the final layer transfer to form memory device structures, such as, for example, transistors, on or in the multiple transferred layers that may be physically aligned and may be electrically coupled to the acceptor wafer.

Novel monolithic 3D Dynamic Random Access Memories (DRAMs) may be constructed in the above manner. Preferred embodiments of this invention utilize the floating body DRAM type.

Further details of a floating body DRAM and its operation modes can be found in U.S. Pat. Nos. 7,541,616, 7,514,748, 7,499,358, 7,499,352, 7,492,632, 7,486,563, 7,477,540, and 7,476,939. Background information on floating body DRAM and its operation is given in "Floating Body RAM Technology and its Scalability to 32 nm Node and Beyond," Electron Devices Meeting, 2006. *IEDM '06. International*, vol., no., pp. 1-4, 11-13 Dec. 2006 by T. Shino, et. al.; "Overview and future challenges of floating body RAM (FBRAM) technology for 32 nm technology node and beyond", *Solid-State Electronics*, Volume 53, Issue 7; "Papers Selected from the 38th European Solid-State Device Research Conference"—*ESSDERC'*08, July 2009, pages 676-683, ISSN 0038-1101, DOI: 10.1016/j.sse.2009.03.010 by Takeshi Hamamoto, et al.; "New Generation of Z-RAM," *Electron Devices Meeting*, 2007. *IEDM* 2007. *IEEE International*, vol., no., pp. 925-928, 10-12 Dec. 2007 by Okhonin, S., et al. Prior art for constructing monolithic 3D DRAMs used planar transistors where crystalline silicon layers were formed with either selective epitaxy technology or laser recrystallization. Both selective epitaxy technology and laser recrystallization may not provide perfectly mono-crystalline silicon and often require a high thermal budget. A description of these processes is given in the book entitled "Integrated Interconnect Technologies for 3D Nanoelectronic Systems" by Bakir and Meindl. The contents of these documents are incorporated in this specification by reference.

Figure 21:
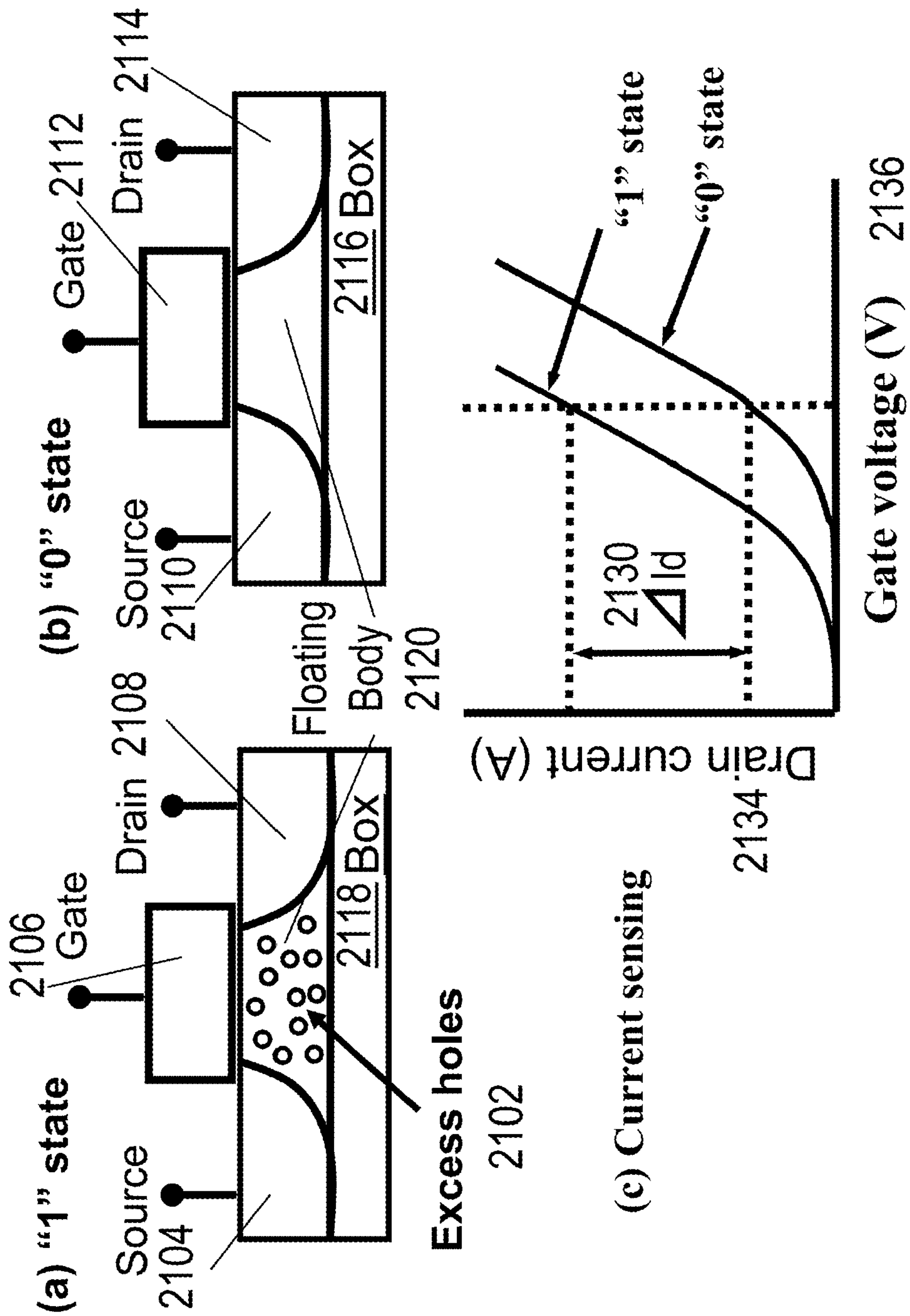
FIG. 21 is an exemplary drawing illustration of the basics of floating body DRAM.

As illustrated in FIG. 21 the fundamentals of operating a floating body DRAM are described. In order to store a '1' bit, excess holes 2102 may exist in the floating body region 2120 and change the threshold voltage of the memory cell transistor including source 2104, gate 2106, drain 2108, floating body 2120, and buried oxide (BOX) 2118. This is shown in FIG. 21(*a*). The '0' bit corresponds to no charge being stored in the floating body 2120 and affects the threshold voltage of the memory cell transistor including source 2110, gate 2112, drain 2114, floating body 2120, and buried oxide (BOX) 2116. This is shown in FIG. 21(*b*). The difference in threshold voltage between the memory cell transistor depicted in FIG. 21(*a*) and FIG. 21(*b*) manifests itself as a change in the drain current 2134 of the transistor at a particular gate voltage 2136. This is described in FIG. 21(*c*). This current differential 2130 may be sensed by a sense amplifier circuit to differentiate between '0' and '1' states and thus function as a memory bit.

As illustrated in FIGS. 22A to 22H, a horizontally-oriented monolithic 3D DRAM that utilizes two masking steps per memory layer may be constructed that is suitable for 3D IC manufacturing.

Figure 22A:
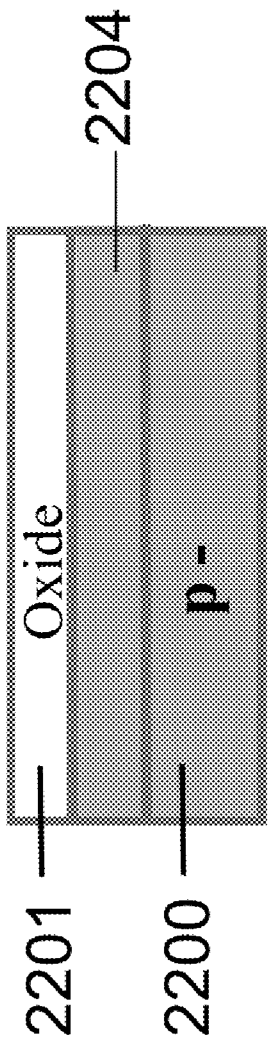
FIGS. 22A-H are exemplary drawing illustrations of the formation of a floating body DRAM transistor.

As illustrated in FIG. 22A, a P− substrate donor wafer 2200 may be processed to comprise a wafer sized layer of P− doping 2204. The P− layer 2204 may have the same or a different dopant concentration than the P− substrate 2200. The P− doping layer 2204 may be formed by ion implantation and thermal anneal. A screen oxide 2201 may be grown before the implant to protect the silicon from implant contamination and to provide an oxide surface for later wafer to wafer bonding.

Figure 22B:
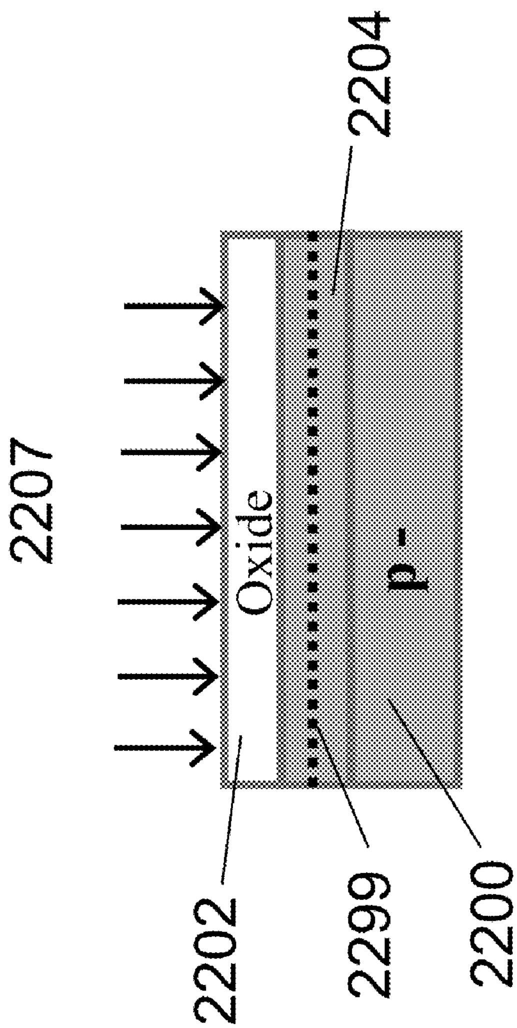

As illustrated in FIG. 22B, the top surface of donor wafer 2200 may be prepared for oxide to oxide wafer bonding with a deposition of an oxide 2202 or by thermal oxidation of the P− layer 2204 to form oxide layer 2202, or a re-oxidation of implant screen oxide 2201. A layer transfer demarcation plane 2299 (shown as a dashed line) may be formed in donor wafer 2200 or P− layer 2204 (shown) by hydrogen implantation 2207 or other methods as previously described. Both the donor wafer 2200 and acceptor wafer 2210 may be prepared for wafer bonding as previously described and then bonded, preferably at a low temperature (less than approximately 400° C.) to minimize stresses. The portion of the P− layer 2204 and the P− donor wafer substrate 2200 that are above the layer transfer demarcation plane 2299 may be removed by cleaving and polishing, or other processes as previously described, such as, for example, ion-cut or other methods.

Figure 22C:
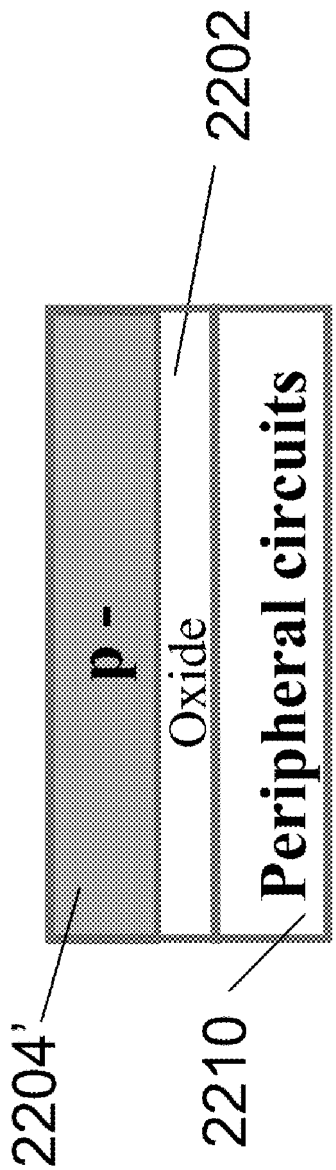

As illustrated in FIG. 22C, the remaining P− doped layer 2204', and oxide layer 2202 have been layer transferred to acceptor wafer 2210. Acceptor wafer 2210 may comprise peripheral circuits such that they can withstand an additional rapid-thermal-anneal (RTA) and still remain operational and retain good performance. For this purpose, the peripheral circuits may be formed such that they have not been subject to a weak RTA or no RTA for activating dopants. Also, the peripheral circuits may utilize a refractory metal such as, for example, tungsten that can withstand high temperatures greater than approximately 400° C. The top surface of P− doped layer 2204' may be chemically or mechanically polished smooth and flat. Now transistors may be formed and aligned to the acceptor wafer 2210 alignment marks (not shown).

Figure 22D:
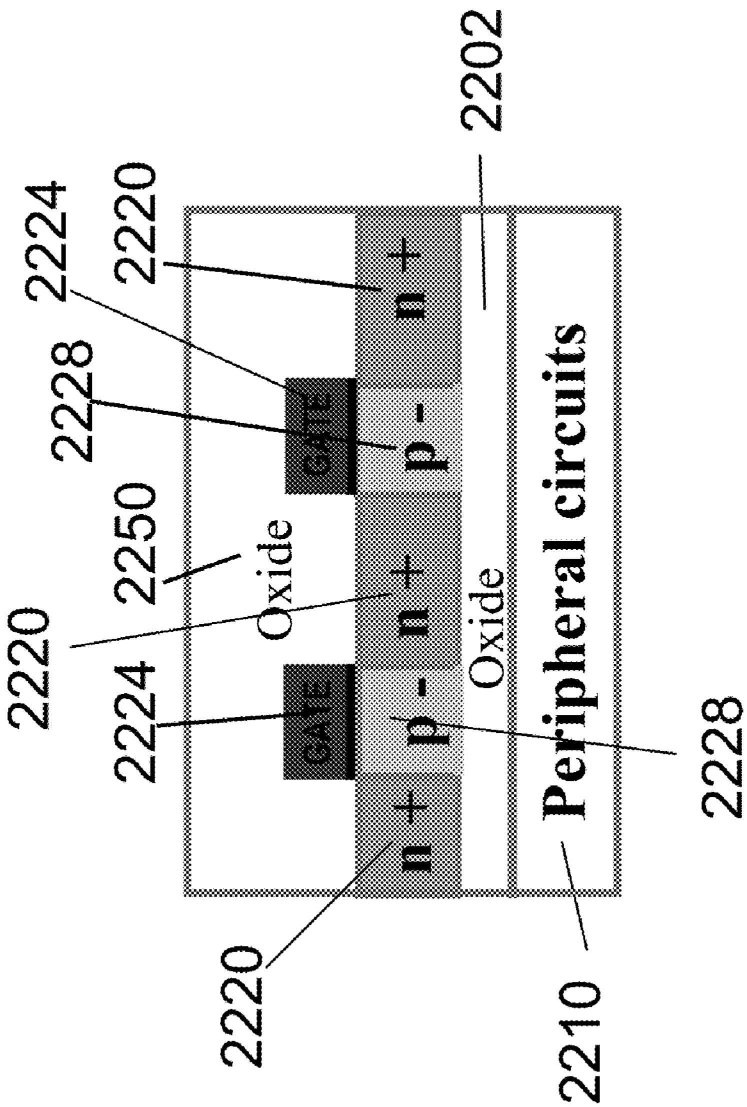

As illustrated in FIG. 22D shallow trench isolation (STI) oxide regions (not shown) may be lithographically defined and plasma/RIE etched to at least the top level of oxide layer 2202 removing regions of P− mono-crystalline silicon layer 2204'. A gap-fill oxide may be deposited and CMP'ed flat to form conventional STI oxide regions and P− doped mono-crystalline silicon regions (not shown) for forming the transistors. Threshold adjust implants may or may not be performed at this time. A gate stack 2224 may be formed with a gate dielectric, such as, for example, thermal oxide, and a gate metal material, such as, for example, polycrystalline silicon. Alternatively, the gate oxide may be an atomic layer deposited (ALD) gate dielectric that is paired with a work function specific gate metal in the industry standard high k metal gate process schemes described previously. Further, the gate oxide may be formed with a rapid thermal oxidation (RTO), a low temperature oxide deposition or low temperature microwave plasma oxidation of the silicon surfaces and then a gate material such as, for example, tungsten or aluminum may be deposited. Gate stack self aligned LDD (Lightly Doped Drain) and halo punch-thru implants may be performed at this time to adjust junction and transistor breakdown characteristics. A conventional spacer deposition of oxide and/or nitride and a subsequent etchback may be done to form implant offset spacers (not shown) on the gate stacks 2224. Then a self aligned N+ source and drain implant may be performed to create transistor source and drains 2220 and remaining P− silicon NMOS transistor channels 2228. High temperature anneal steps may or may not be done at this time to activate the implants and set initial junction depths. Finally, the entire structure may be substantially covered with a gap fill oxide 2250, which may be planarized with chemical mechanical polishing. The oxide surface may be prepared for oxide to oxide wafer bonding as previously described.

Figure 22E:
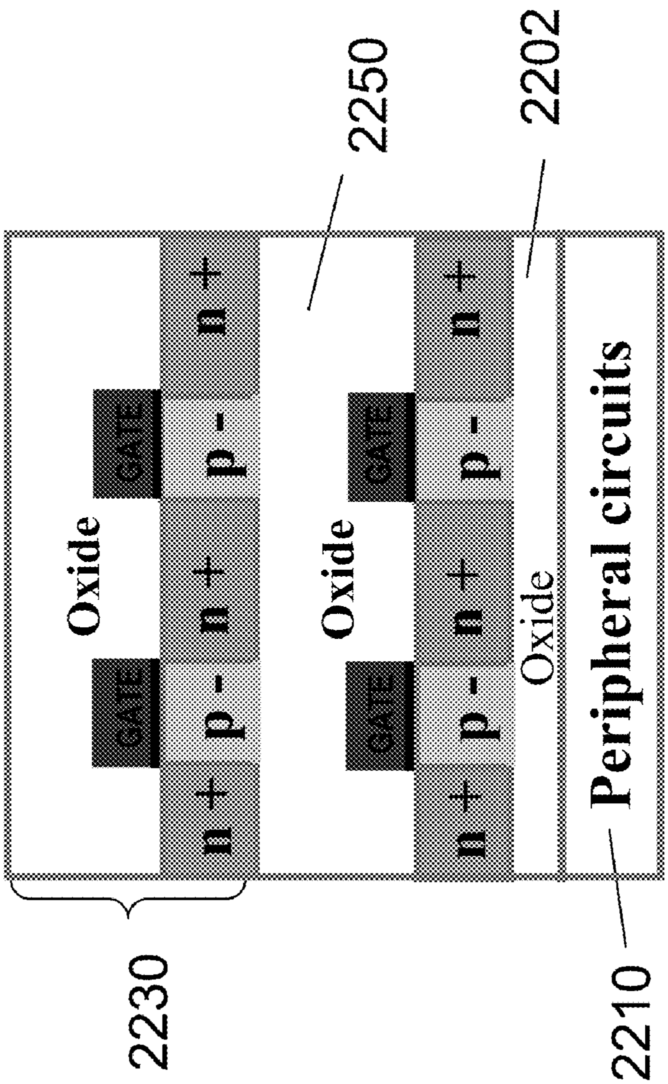

As illustrated in FIG. 22E, the transistor layer formation, bonding to acceptor wafer 2210 oxide 2250, and subsequent transistor formation as described in FIGS. 22A to 22D may be repeated to form the second tier 2230 of memory transistors. After substantially all of the desired memory layers are constructed, a rapid thermal anneal (RTA) may be conducted to activate the dopants in substantially all of the memory layers and in the acceptor substrate 2210 peripheral circuits. Alternatively, optical anneals, such as, for example, a laser based anneal, may be performed.

Figure 22F:
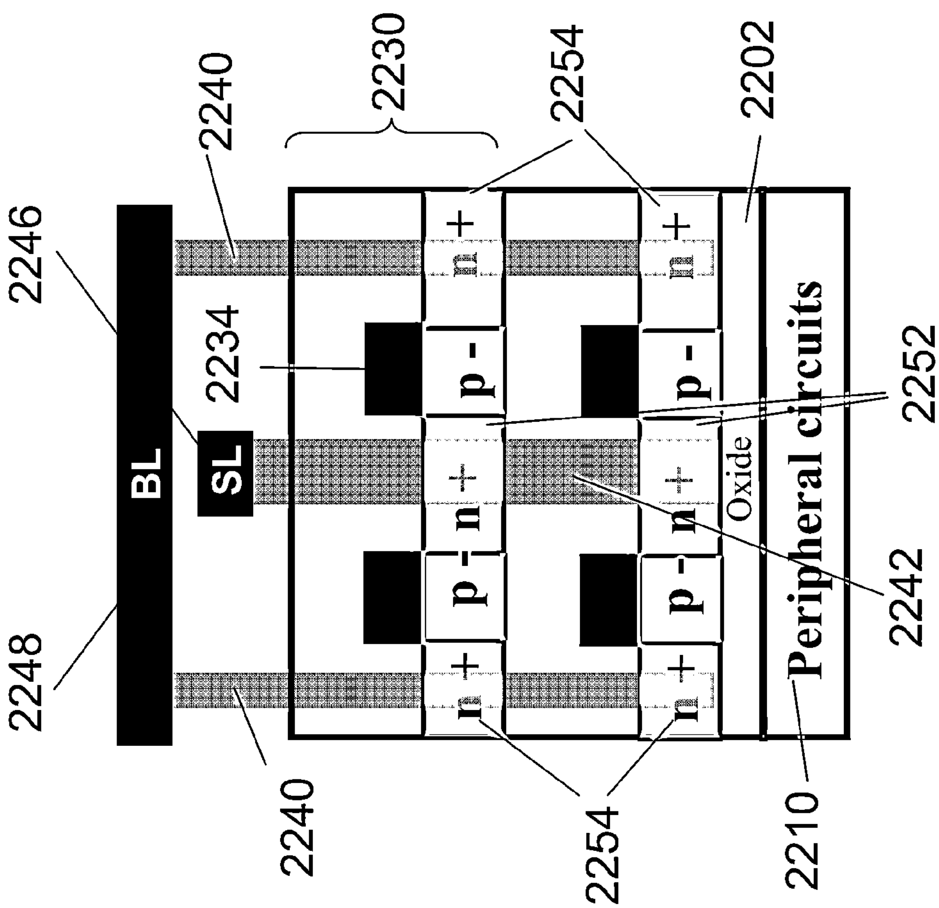

As illustrated in FIG. 22F, contacts and metal interconnects may be formed by lithography and plasma/RIE etch. Bit line (BL) contacts 2240 electrically couple the memory layers' transistor N+ regions on the transistor drain side 2254, and the source line contact 2242 electrically couples the memory layers' transistor N+ regions on the transistors source side 2252. The bit-line (BL) wiring 2248 and source-line (SL) wiring 2246 electrically couples the bit-line contacts 2240 and source-line contacts 2242 respectively. The gate stacks, such as, for example, 2234, may be connected with a contact and metallization (not shown) to form the word-lines (WLs). A thru layer via 2260 (not shown) may be formed to electrically couple the BL, SL, and WL metallization to the acceptor substrate 2210 peripheral circuitry via an acceptor wafer metal connect pad 1980 (not shown).

Figure 22G:
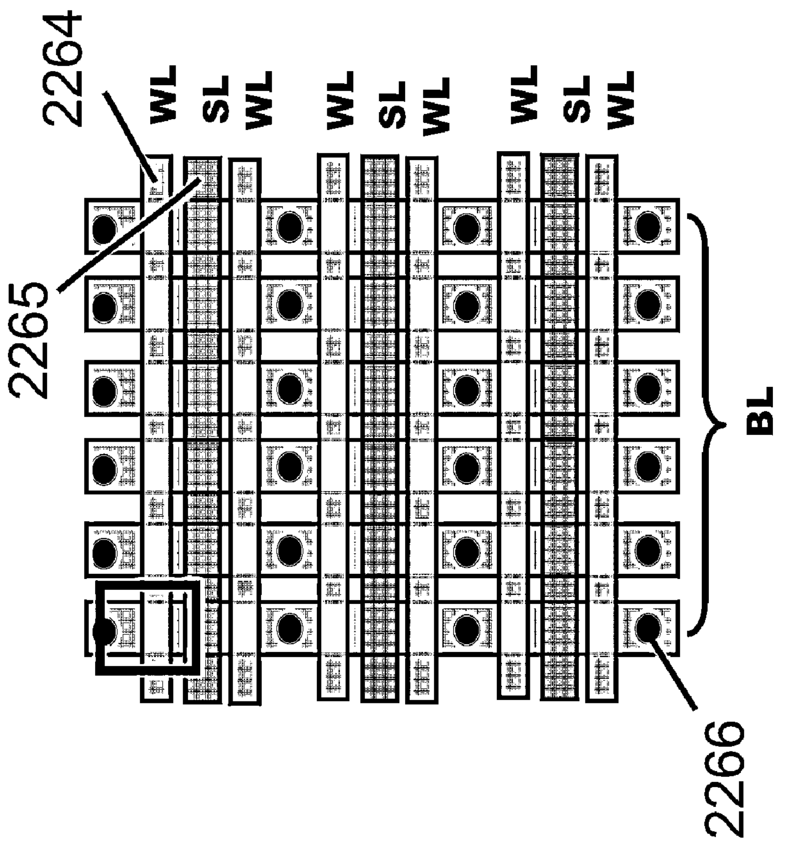

As illustrated in FIG. 22G, a top-view layout a section of the top of the memory array is shown where WL wiring 2264 and SL wiring 2265 may be perpendicular to the BL wiring 2266.

Figure 22H:
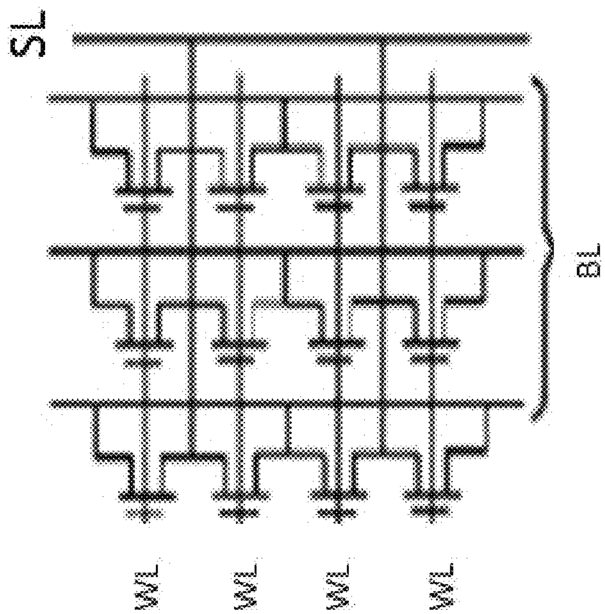

As illustrated in FIG. 22H, a schematic of each single layer of the DRAM array shows the connections for WLs, BLs and SLs at the array level. The multiple layers of the array share BL and SL contacts, but each layer has its own unique set of WL connections to allow each bit to be accessed independently of the others.

This flow enables the formation of a horizontally-oriented monolithic 3D DRAM array that utilizes two masking steps per memory layer and is constructed by layer transfers of wafer sized doped mono-crystalline silicon layers and this 3D DRAM array may be connected to an underlying multi-metal layer semiconductor device, which may or may not contain the peripheral circuits, used to control the DRAM's read and write functions.

Persons of ordinary skill in the art will appreciate that the illustrations in FIGS. 22A through 22H are exemplary only and are not drawn to scale. Such skilled persons will further appreciate that many variations are possible such as, for example, the transistors may be of another type such as RCATs, or junction-less. Additionally, the contacts may utilize doped poly-crystalline silicon, or other conductive materials. Moreover, the stacked memory layer may be connected to a periphery circuit that is above the memory stack. Many other modifications within the scope of the invention will suggest themselves to such skilled persons after reading this specification. Thus the invention is to be limited only by the appended claims.

As illustrated in FIGS. 23A to 23M, a horizontally-oriented monolithic 3D DRAM that utilizes one masking step per memory layer may be constructed that is suitable for 3D IC.

Figure 23A:
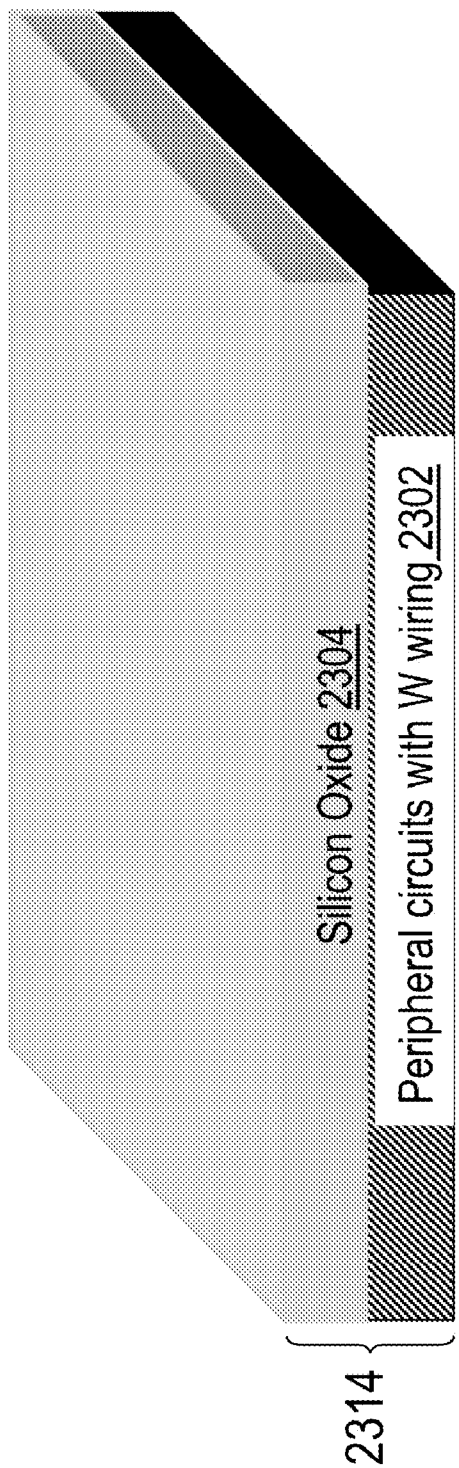
FIGS. 23A-M are exemplary drawing illustrations of the formation of a floating body DRAM transistor.

As illustrated in FIG. 23A, a silicon substrate with peripheral circuitry 2302 may be constructed with high temperature (greater than approximately 400° C.) resistant wiring, such as, for example, Tungsten. The peripheral circuitry substrate 2302 may comprise memory control circuits as well as circuitry for other purposes and of various types, such as, for example, analog, digital, radio frequency (RF), or memory. The peripheral circuitry substrate 2302 may comprise peripheral circuits that can withstand an additional rapid-thermal-anneal (RTA) and still remain operational and retain good performance. For this purpose, the peripheral circuits may be formed such that they have been subject to a weak RTA or no RTA for activating dopants. The top surface of the peripheral circuitry substrate 2302 may be prepared for oxide wafer bonding with a deposition of a silicon oxide 2304, thus forming acceptor wafer 2414.

Figure 23B:
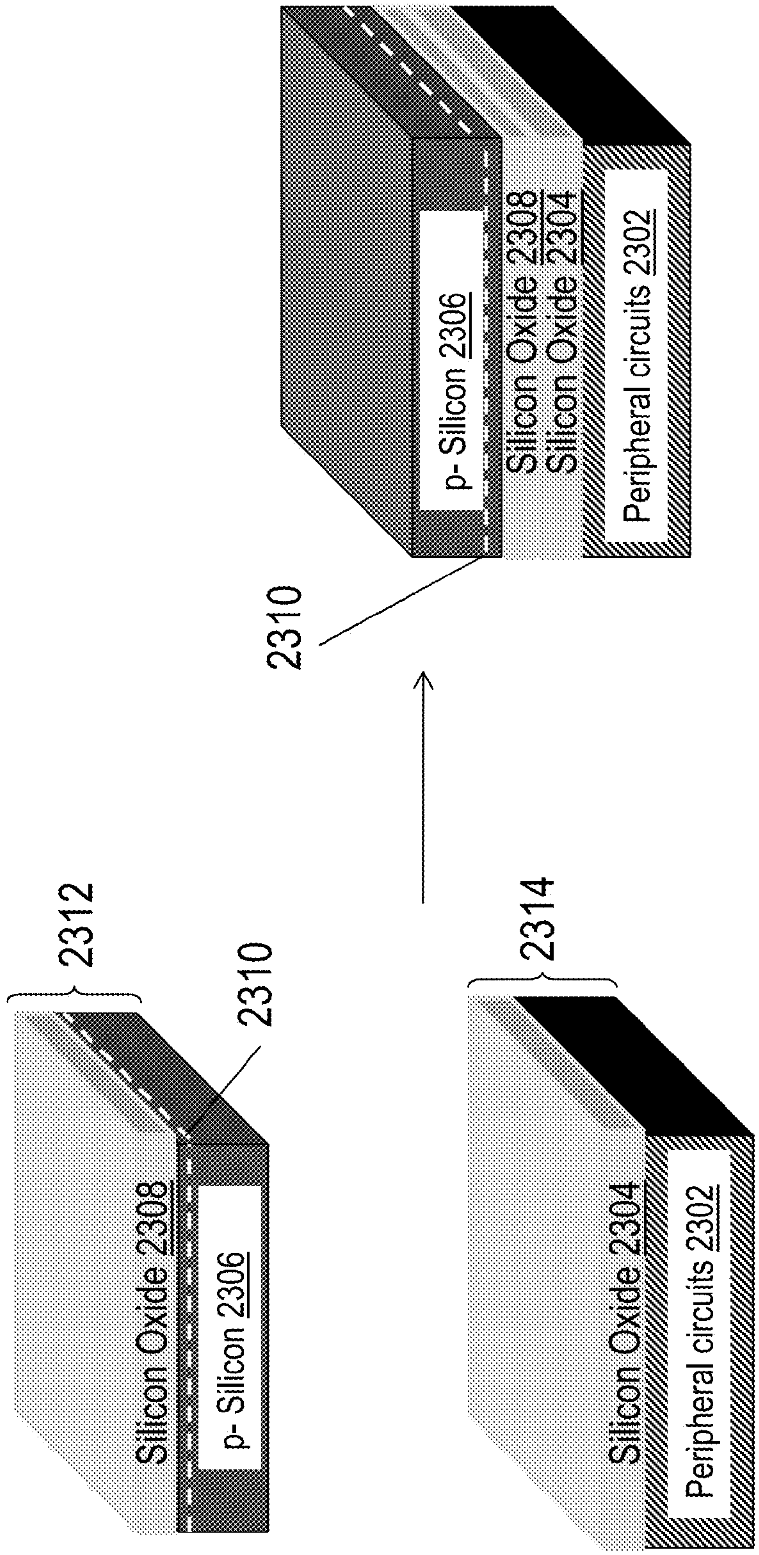

As illustrated in FIG. 23B, a mono-crystalline silicon donor wafer 2312 may be optionally processed to comprise a wafer sized layer of P− doping (not shown) which may have a different dopant concentration than the P− substrate 2306. The P− doping layer may be formed by ion implantation and thermal anneal. A screen oxide 2308 may be grown or deposited prior to the implant to protect the silicon from implant contamination and to provide an oxide surface for later wafer to wafer bonding. A layer transfer demarcation plane 2310 (shown as a dashed line) may be formed in donor wafer 2312 within the P− substrate 2306 or the P− doping layer (not shown) by hydrogen implantation or other methods as previously described. Both the donor wafer 2312 and acceptor wafer 2314 may be prepared for wafer bonding as previously described and then bonded at the surfaces of oxide layer 2304 and oxide layer 2308, at a low temperature (less than approximately 400° C.) preferred for lowest stresses, or a moderate temperature (less than approximately 900° C.).

Figure 23C:
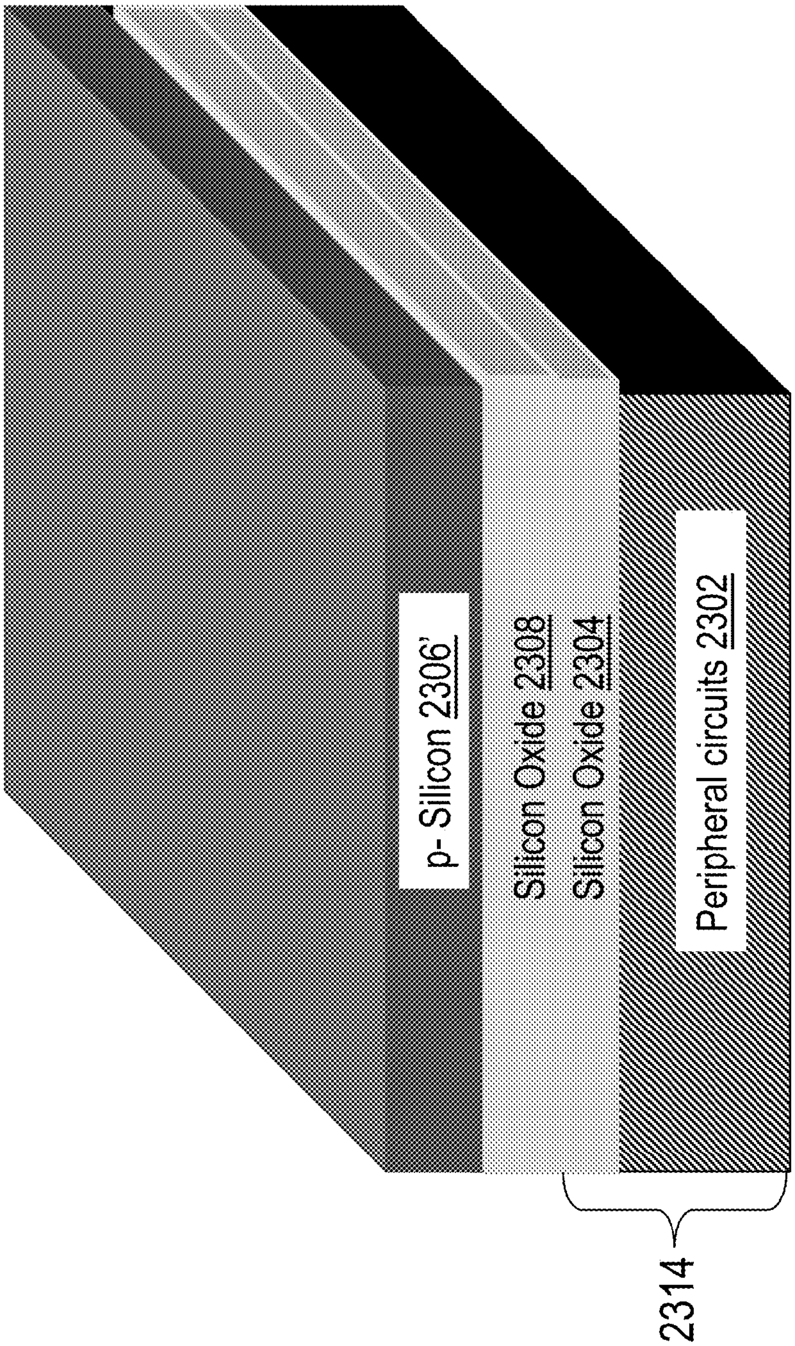

As illustrated in FIG. 23C, the portion of the P− layer (not shown) and the P− wafer substrate 2306 that are above the layer transfer demarcation plane 2310 may be removed by cleaving and polishing, or other processes as previously described, such as, for example, ion-cut or other methods, thus forming the remaining mono-crystalline silicon P− layer 2306'. Remaining P− layer 2306' and oxide layer 2308 have been layer transferred to acceptor wafer 2314. The top surface of P− layer 2306' may be chemically or mechanically polished smooth and flat. Now transistors or portions of transistors may be formed and aligned to the acceptor wafer 2314 alignment marks (not shown).

Figure 23D:
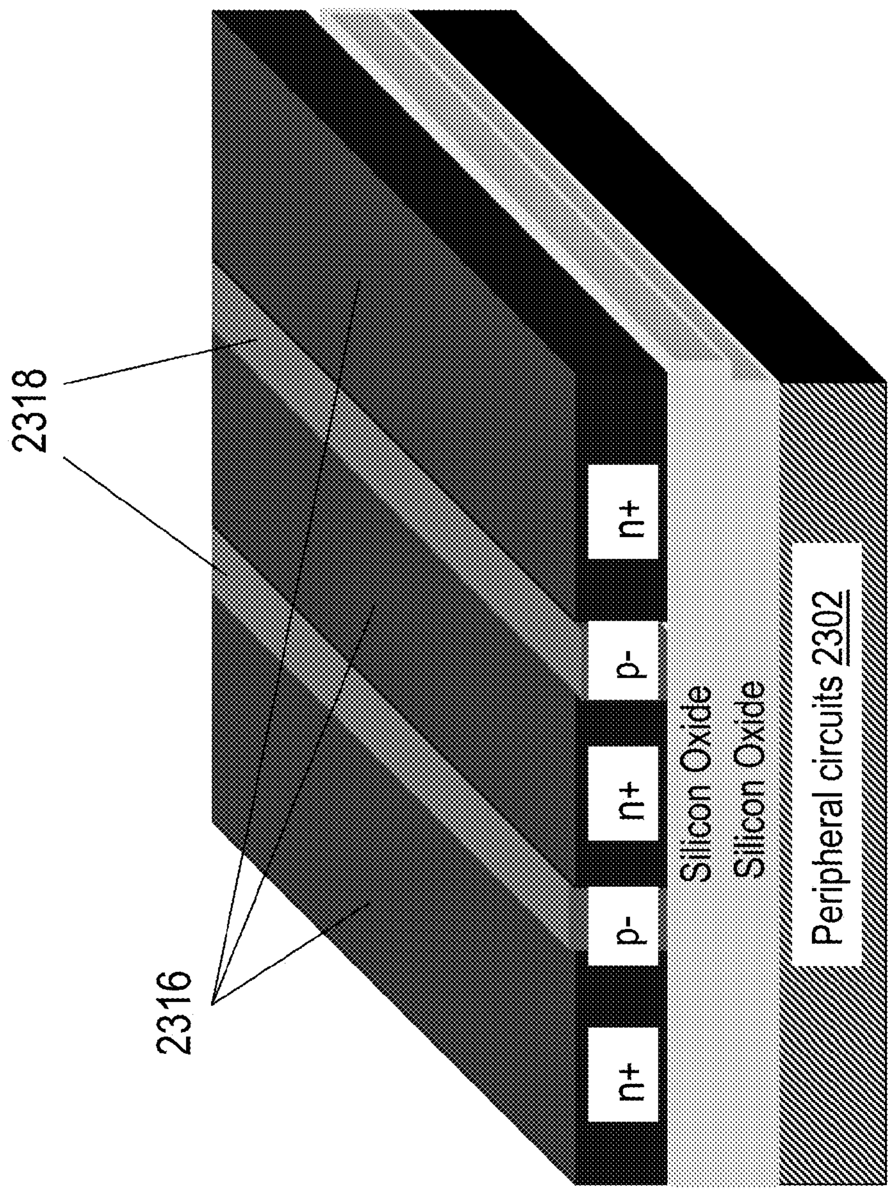

As illustrated in FIG. 23D, N+ silicon regions 2316 may be lithographically defined and N type species, such as, for example, Arsenic, may be ion implanted into P− silicon layer 2306'. This also forms remaining regions of P− silicon 2318.

Figure 23E:
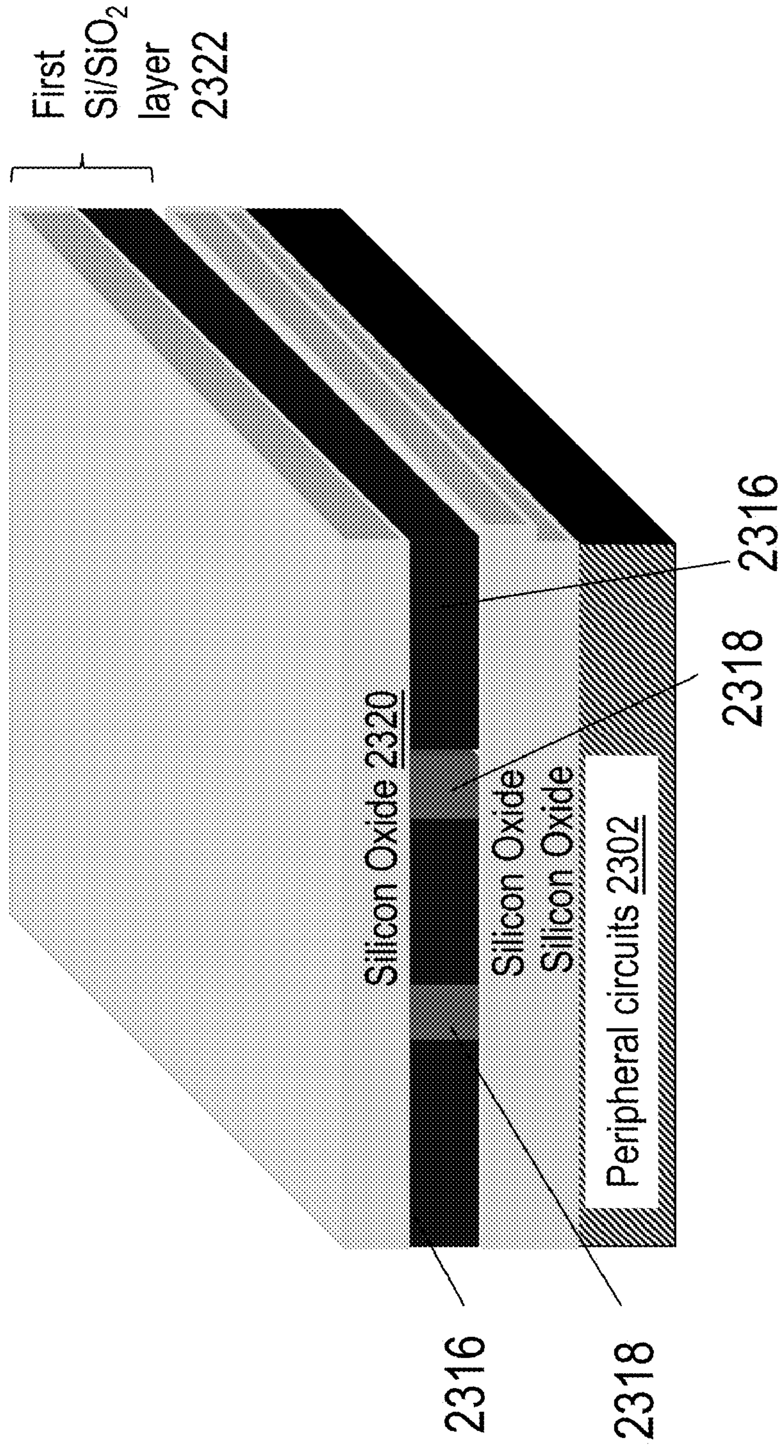

As illustrated in FIG. 23E, oxide layer 2320 may be deposited to prepare the surface for later oxide to oxide bonding. This now forms the first Si/SiO2 layer 2322 which includes silicon oxide layer 2320, N+ silicon regions 2316, and P− silicon regions 2318.

Figure 23F:
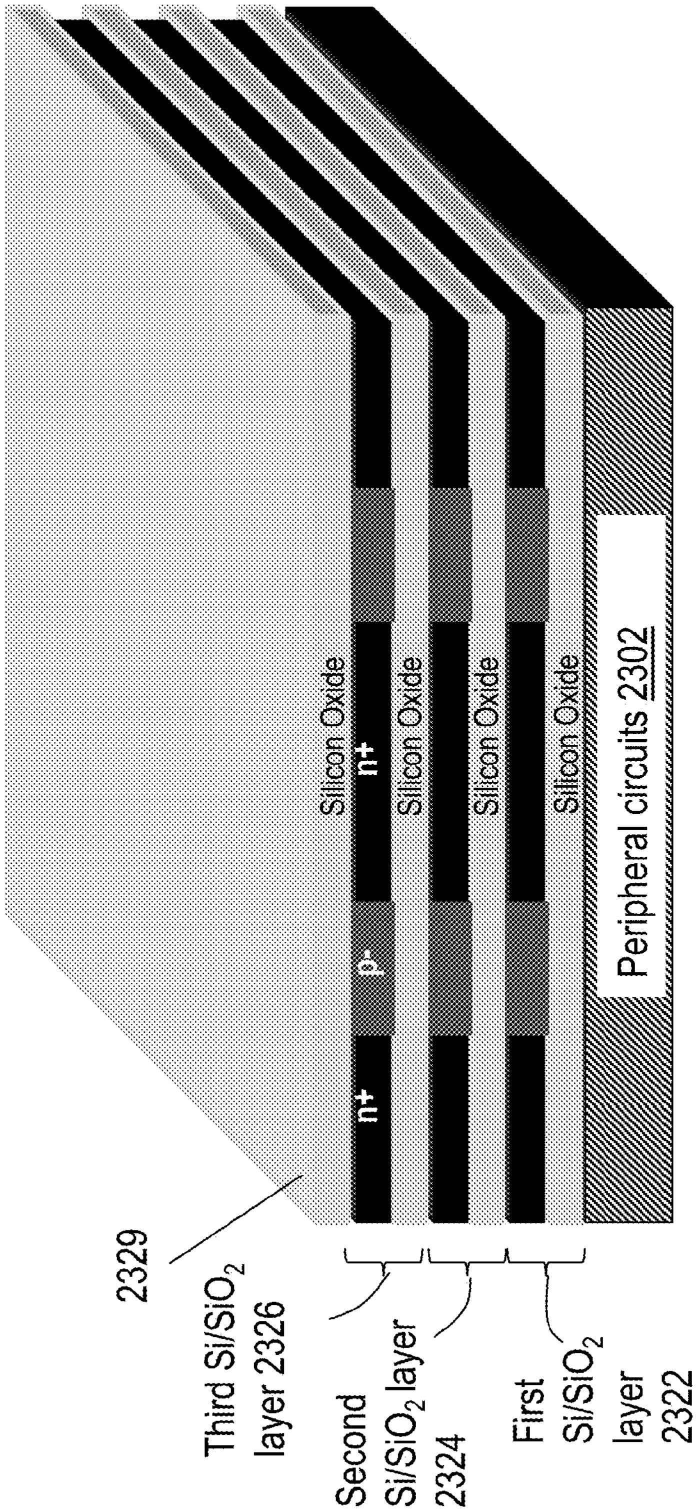

As illustrated in FIG. 23F, additional Si/SiO2 layers, such as, for example, second Si/SiO2 layer 2324 and third Si/SiO2 layer 2326, may each be formed as described in FIGS. 23A to 23E. Oxide layer 2329 may be deposited. After substantially all of the desired memory layers are constructed, a rapid thermal anneal (RTA) may be conducted to activate the dopants in substantially all of the memory layers 2322, 2324, 2326 and in the peripheral circuits 2302. Alternatively, optical anneals, such as, for example, a laser based anneal, may be performed.

Figure 23G:
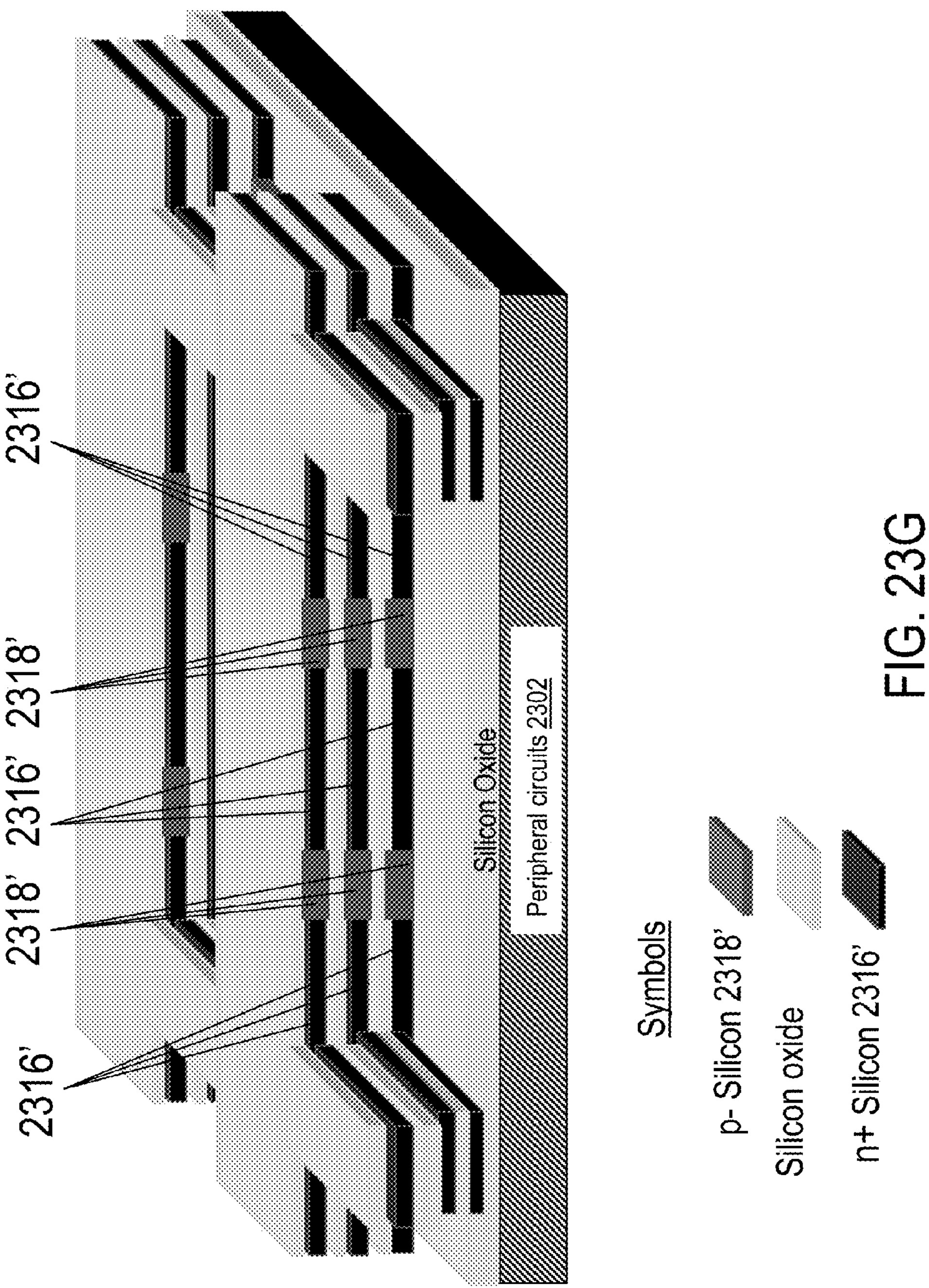

As illustrated in FIG. 23G, oxide layer 2329, third Si/SiO2 layer 2326, second Si/SiO2 layer 2324 and first Si/SiO2 layer 2322 may be lithographically defined and plasma/RIE etched to form a portion of the memory cell structure. Regions of P− silicon 2318', which will form the floating body transistor channels, and N+ silicon regions 2316', which form the source, drain and local source lines, result from the etch.

Figure 23H:
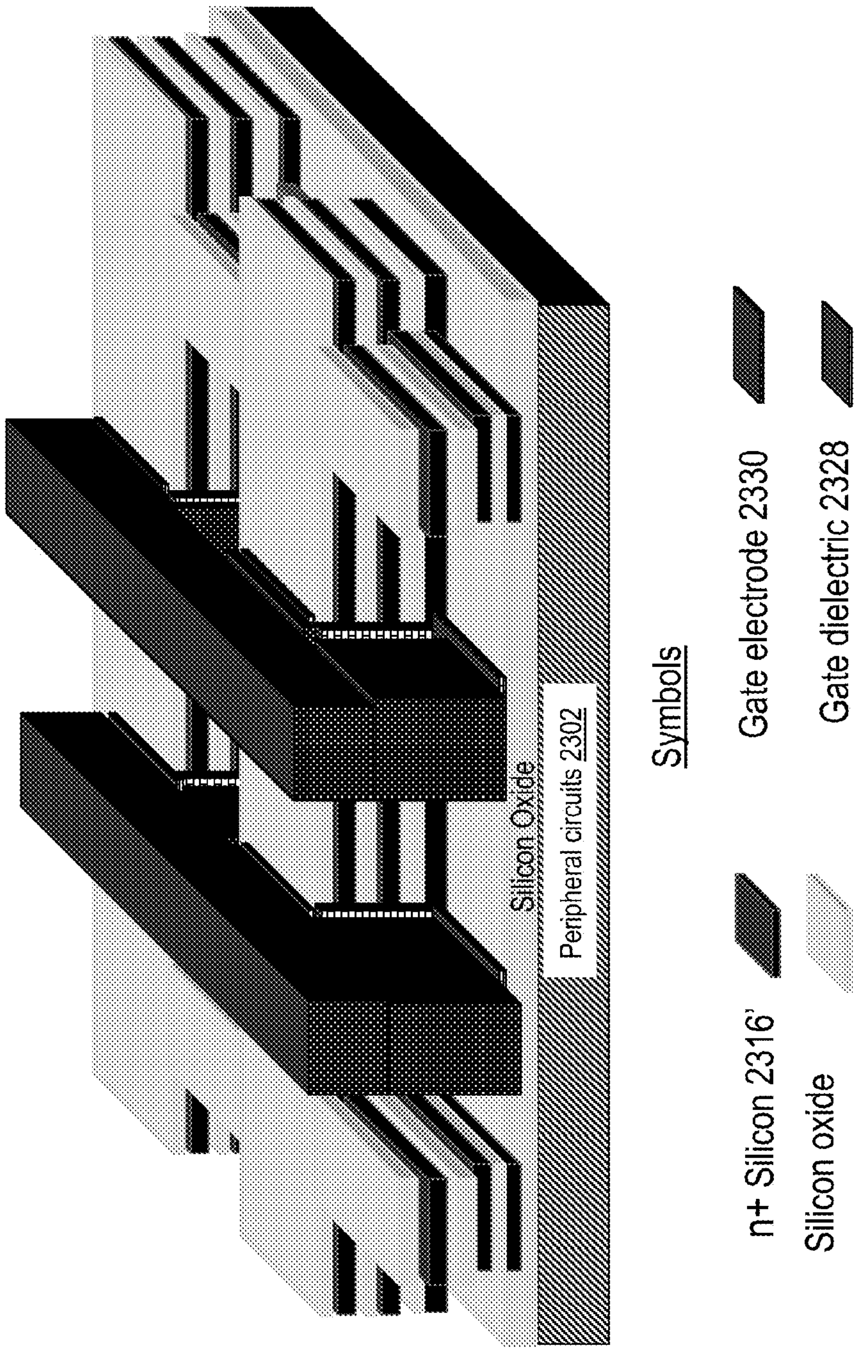

As illustrated in FIG. 23H, a gate dielectric and gate electrode material may be deposited, planarized with a chemical mechanical polish (CMP), and then lithographically defined and plasma/RIE etched to form gate dielectric regions 2328 which may be self aligned to and substantially covered by gate electrodes 2330 (shown), or substantially cover the entire silicon/oxide multi-layer structure. The gate electrode 2330 and gate dielectric 2328 stack may be sized and aligned such that P− silicon regions 2318' are substantially covered. The gate stack comprised of gate electrode 2330 and gate dielectric 2328 may be formed with a gate dielectric, such as, for example, thermal oxide, and a gate electrode material, such as, for example, polycrystalline silicon. Alternatively, the gate dielectric may be an atomic layer deposited (ALD) material that is paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 23I:
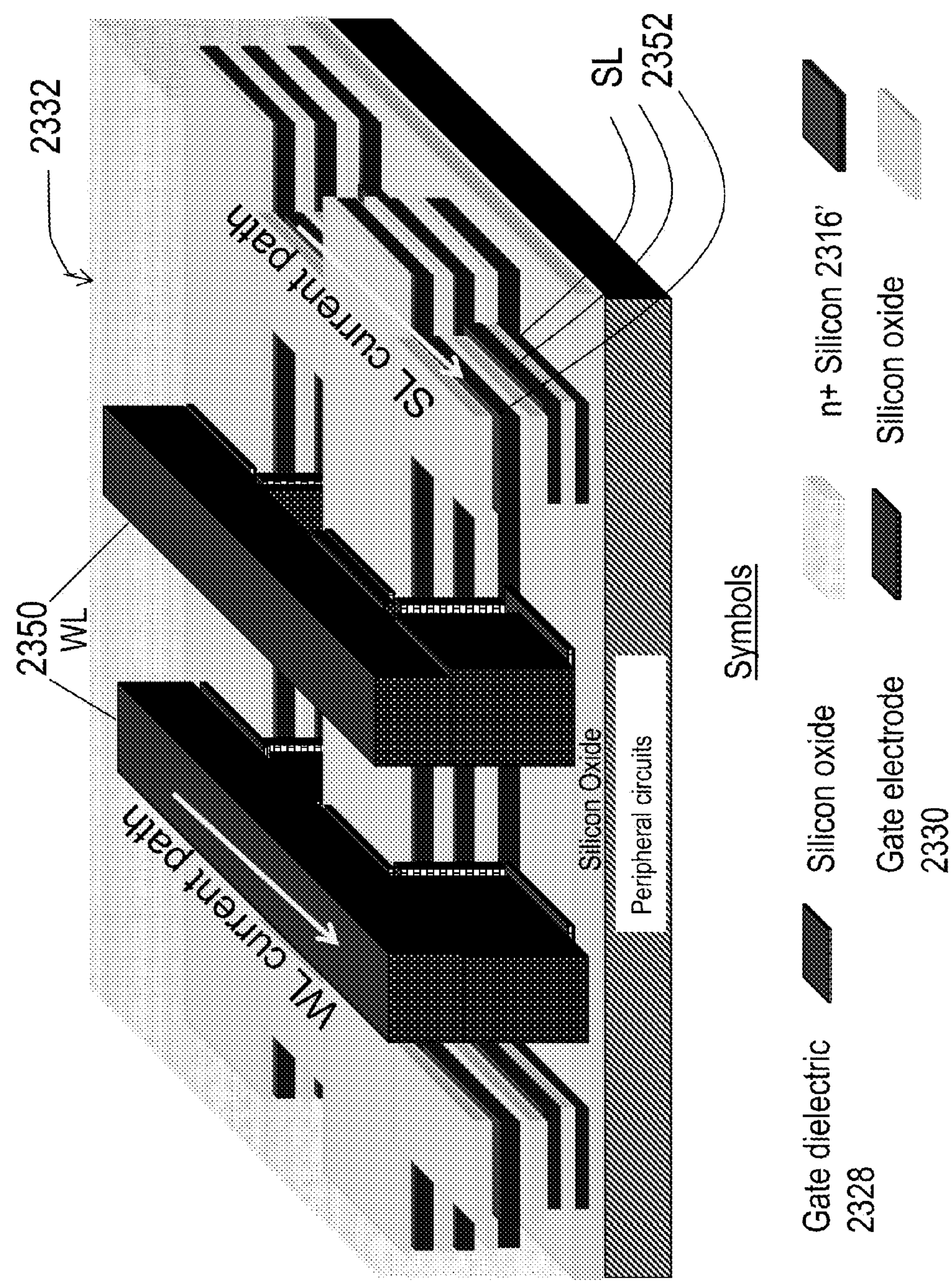

As illustrated in FIG. 23I, the entire structure may be substantially covered with a gap fill oxide 2332, which may be planarized with chemical mechanical polishing. The oxide 2332 is shown transparent in the figure for clarity. Word-line regions (WL) 2350, coupled with and composed of gate electrodes 2330, and source-line regions (SL) 2352, composed of indicated N+ silicon regions 2316', are shown.

Figure 23J:
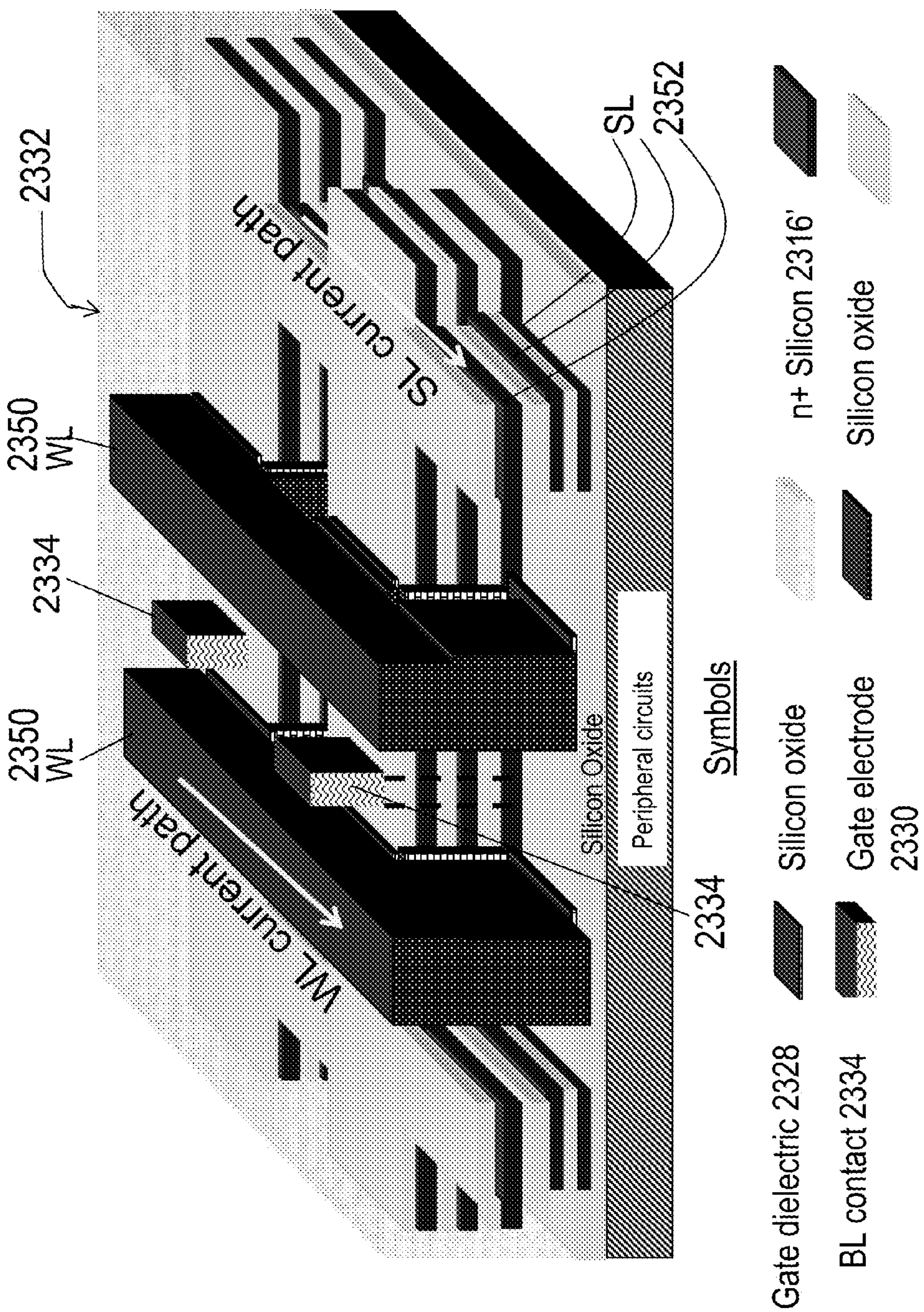

As illustrated in FIG. 23J, bit-line (BL) contacts 2334 may be lithographically defined, etched with plasma/RIE, photoresist removed, and then metal, such as, for example, copper, aluminum, or tungsten, may be deposited to fill the contact and etched or polished to the top of oxide 2332. Each BL contact 2334 may be shared among substantially all layers of memory, shown as three layers of memory in FIG. 23J. A thru layer via 2360 (not shown) may be formed to electrically couple the BL, SL, and WL metallization to the acceptor substrate 2314 peripheral circuitry via an acceptor wafer metal connect pad 2380 (not shown).

Figure 23K:
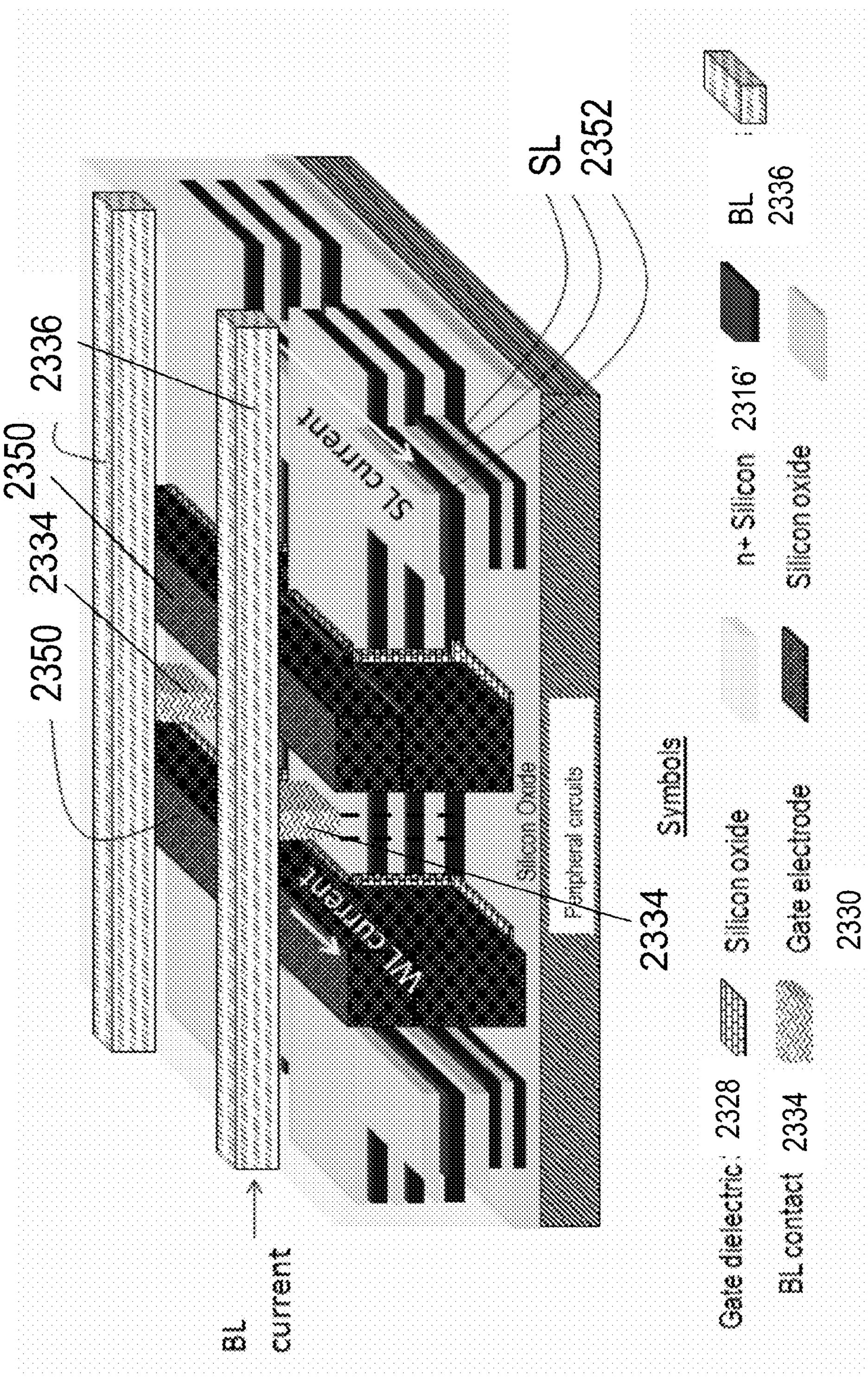

As illustrated in FIG. 23K, BL metal lines 2336 may be formed and connect to the associated BL contacts 2334. Contacts and associated metal interconnect lines (not shown) may be formed for the WL and SL at the memory array edges. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al.

Figure 23L:
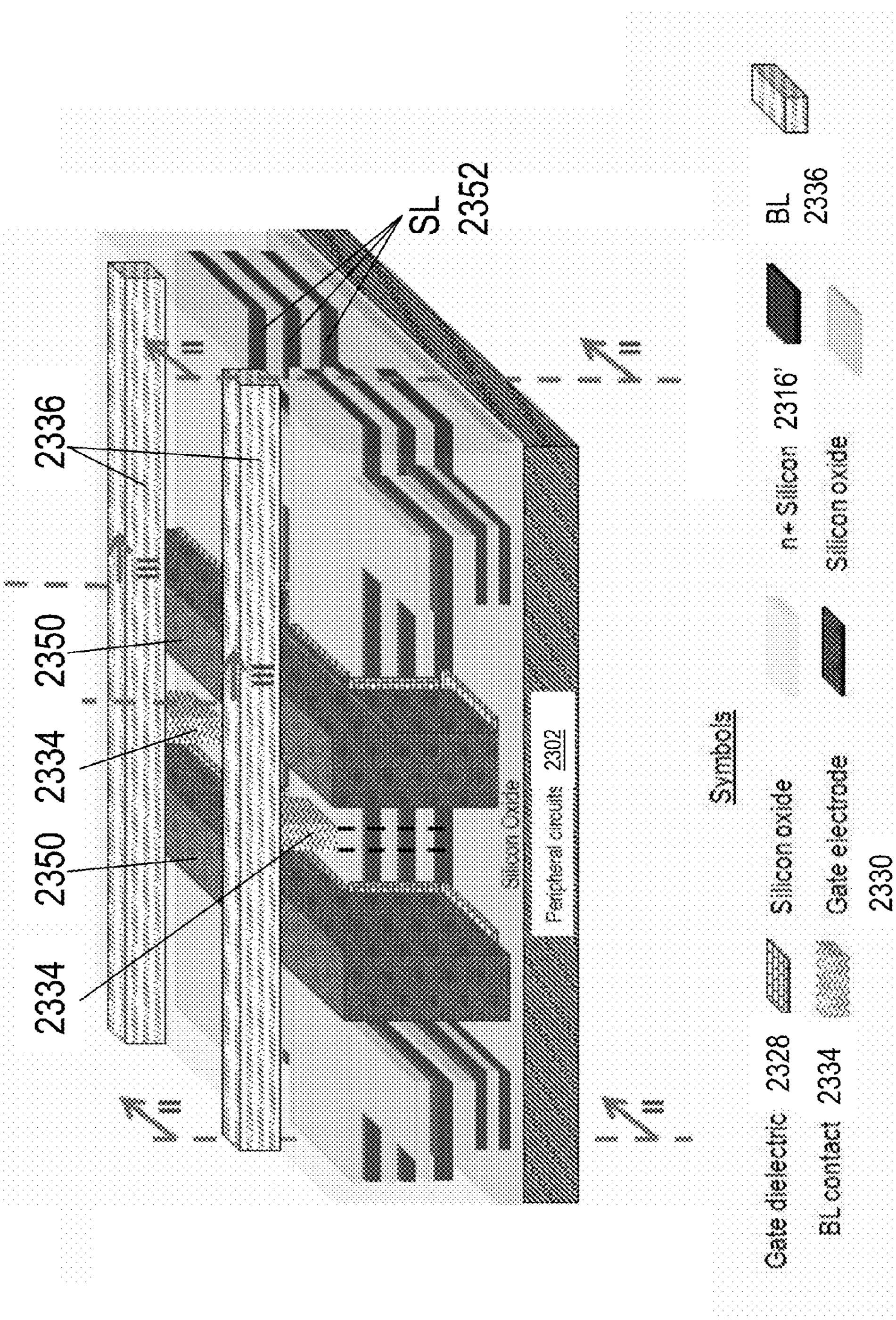
Figure 39A:
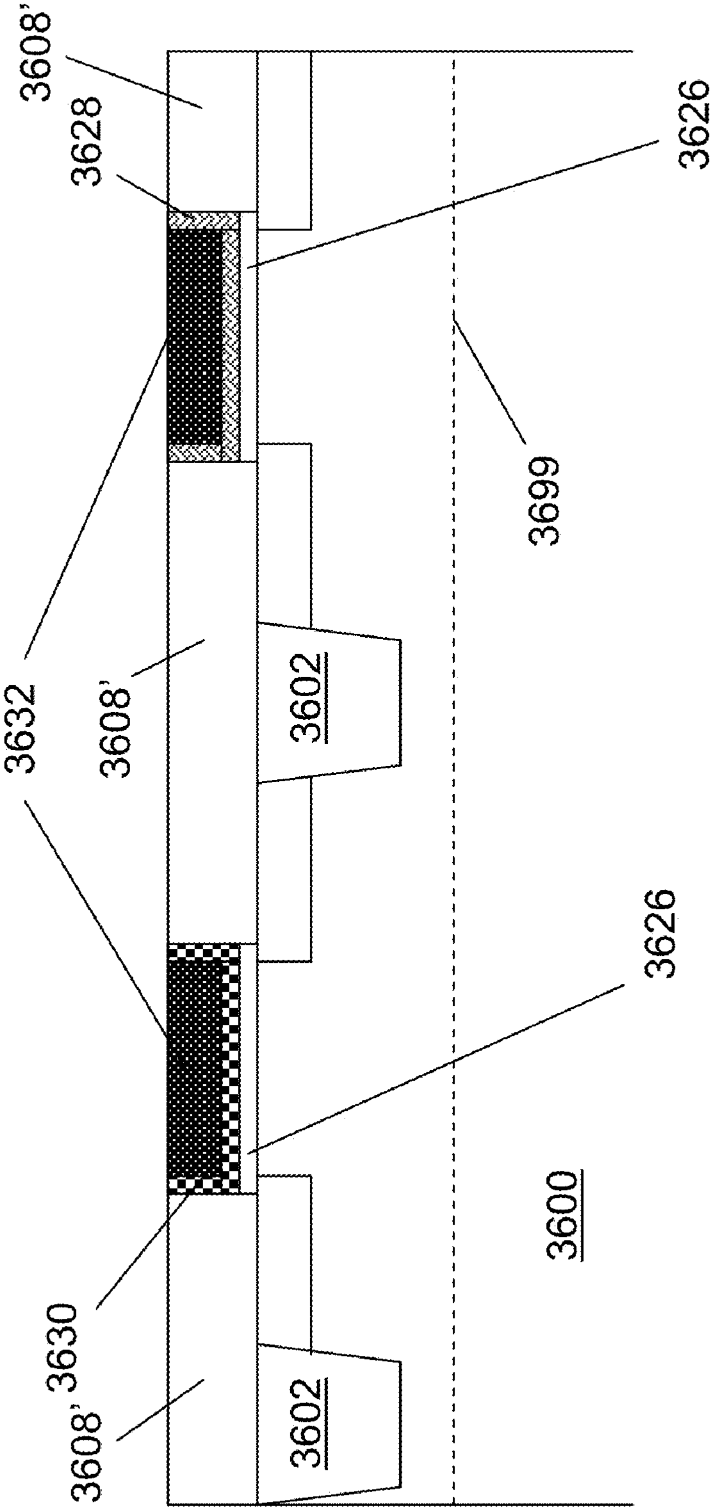
FIGS. 39A-F are exemplary drawing illustrations of the formation of top planar transistors.
Figure 39B:
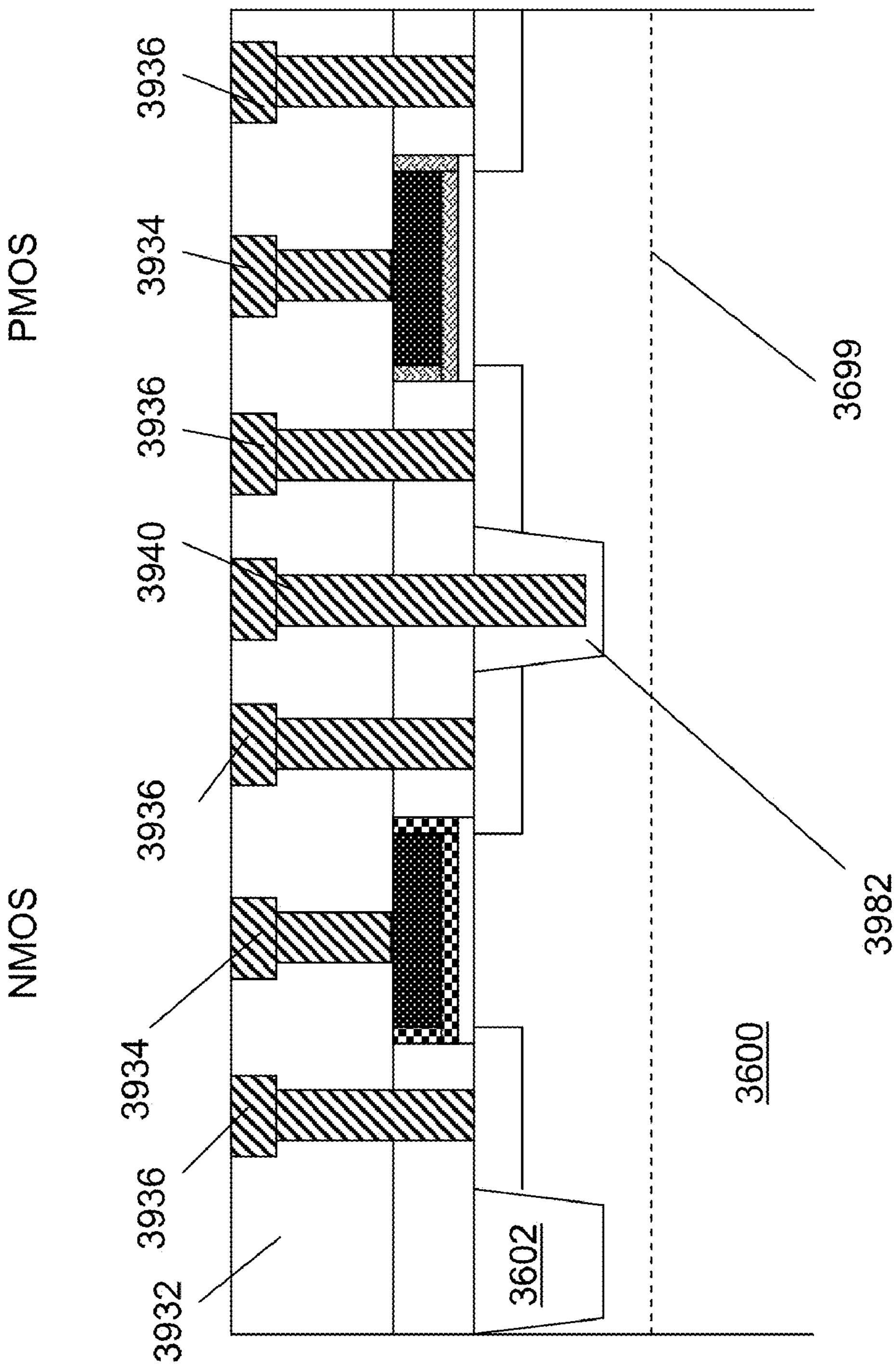
Figure 39C:
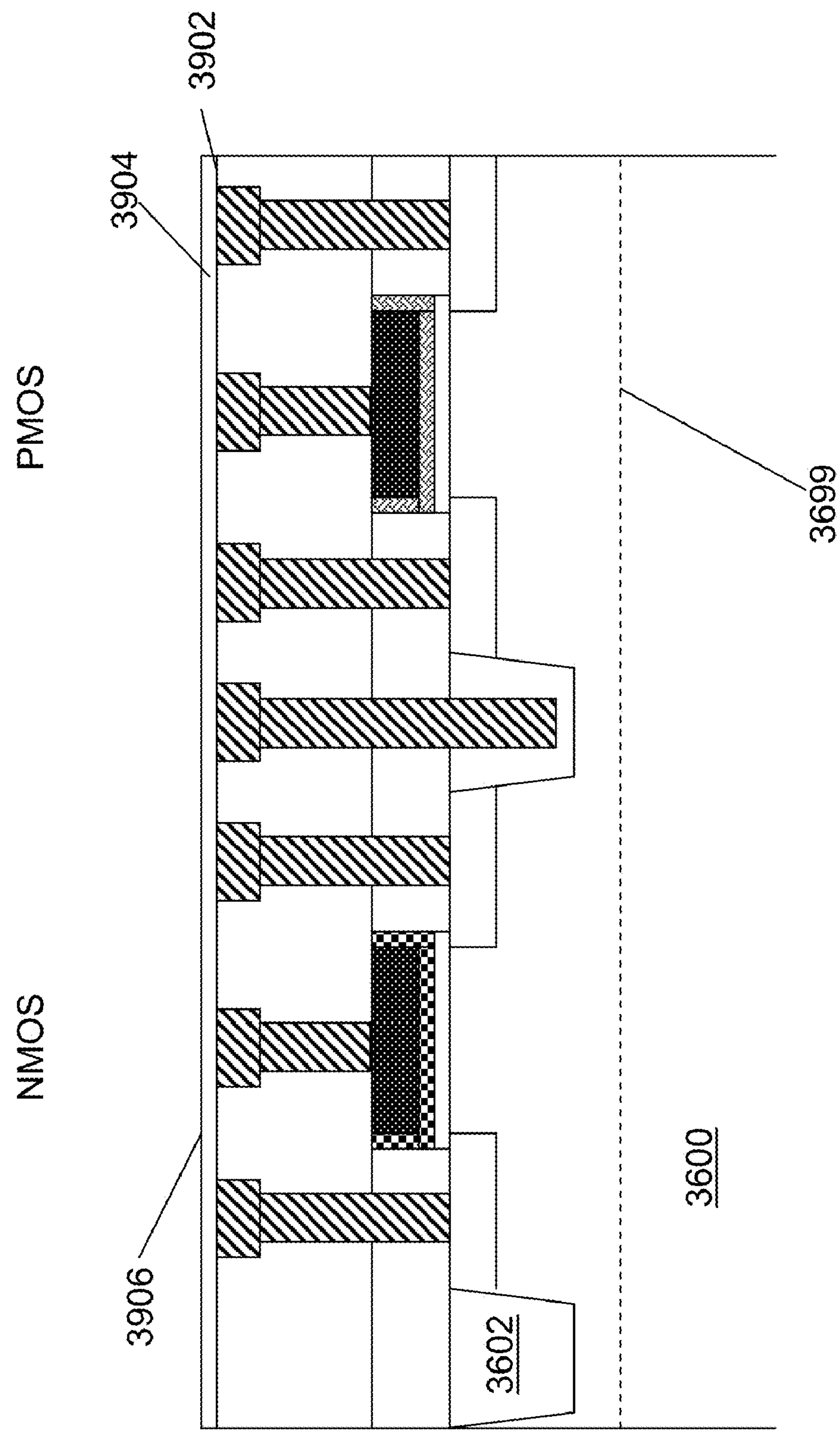
Figure 39D:
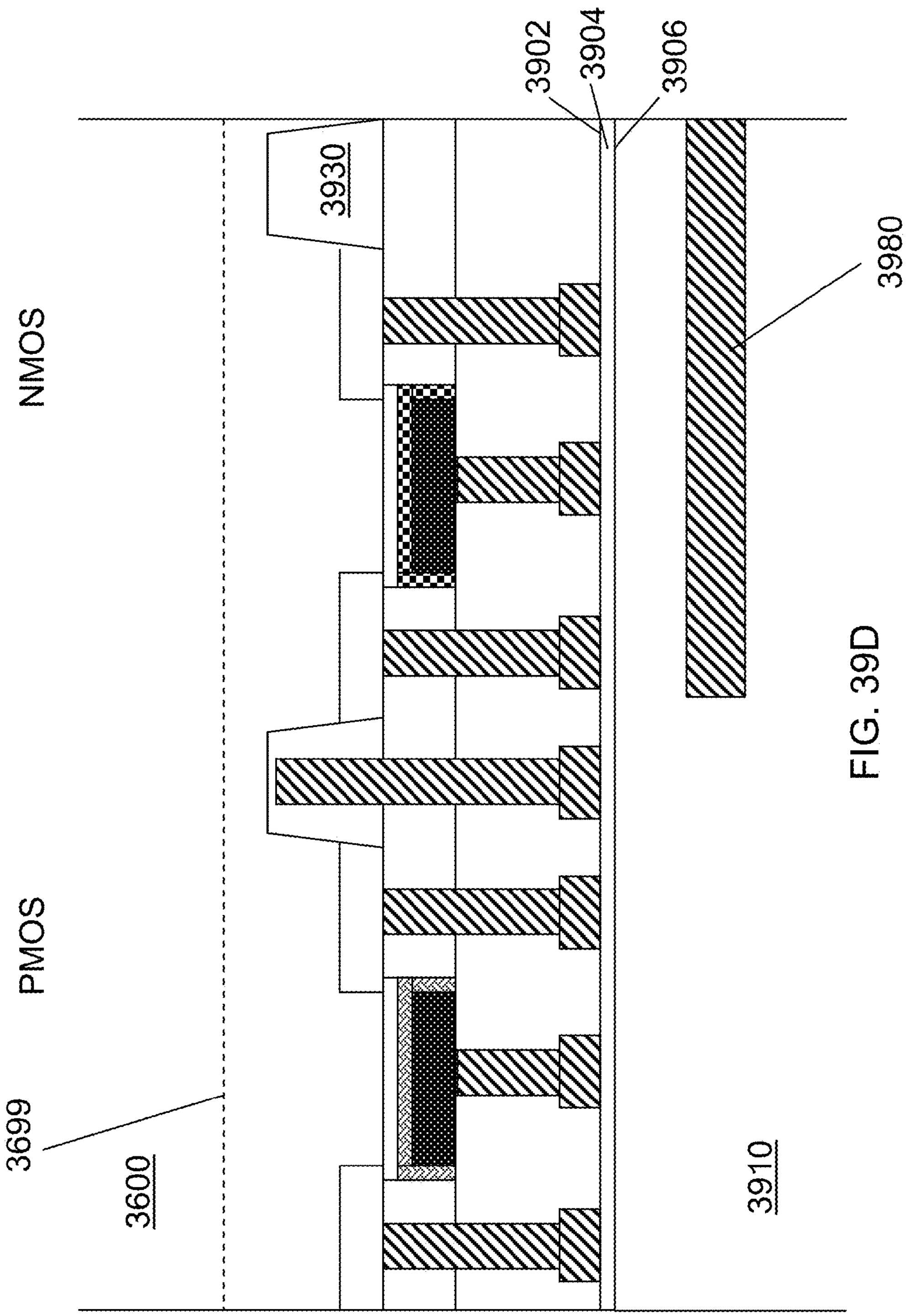
Figure 39E:
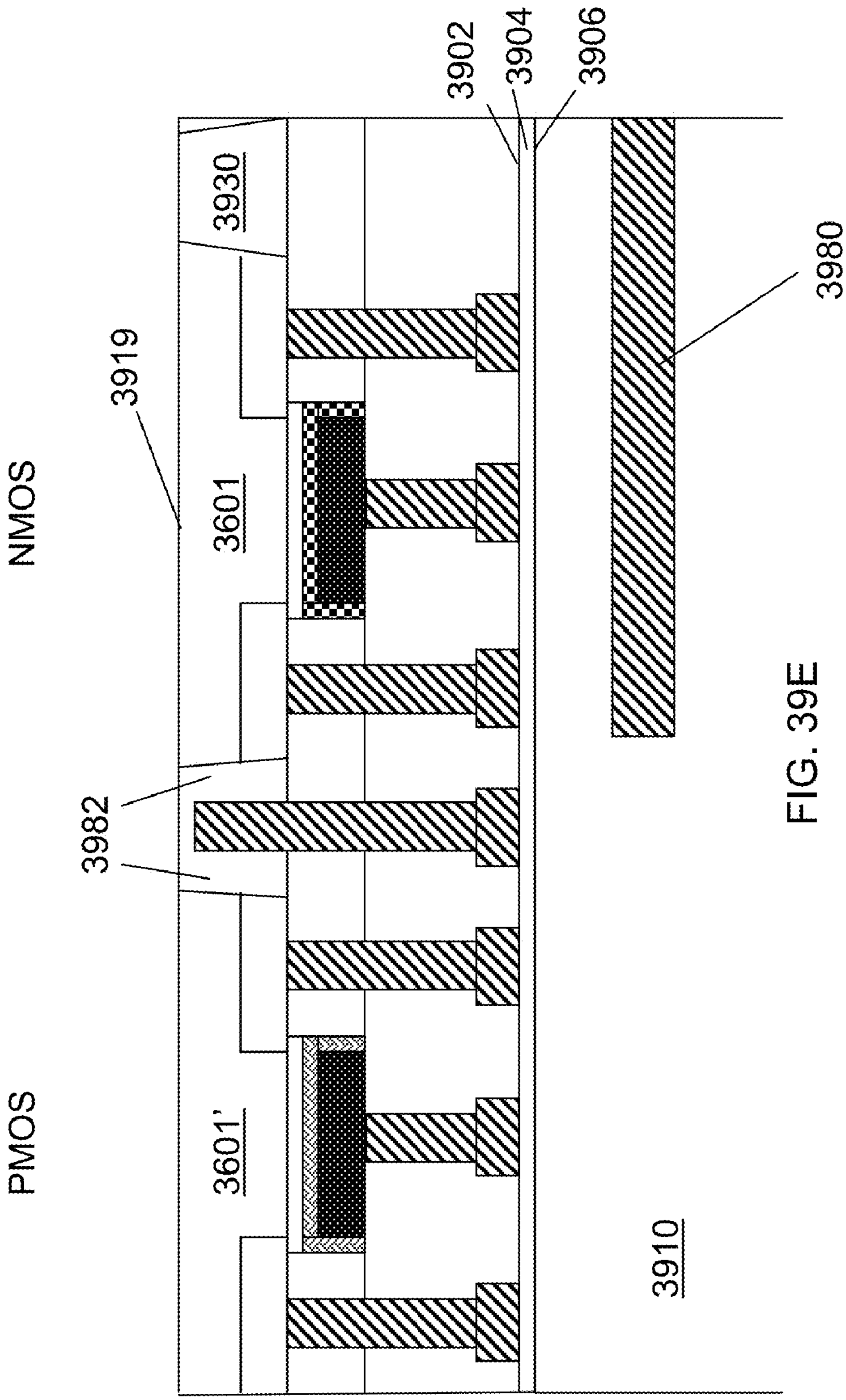
Figures 1, 39E:
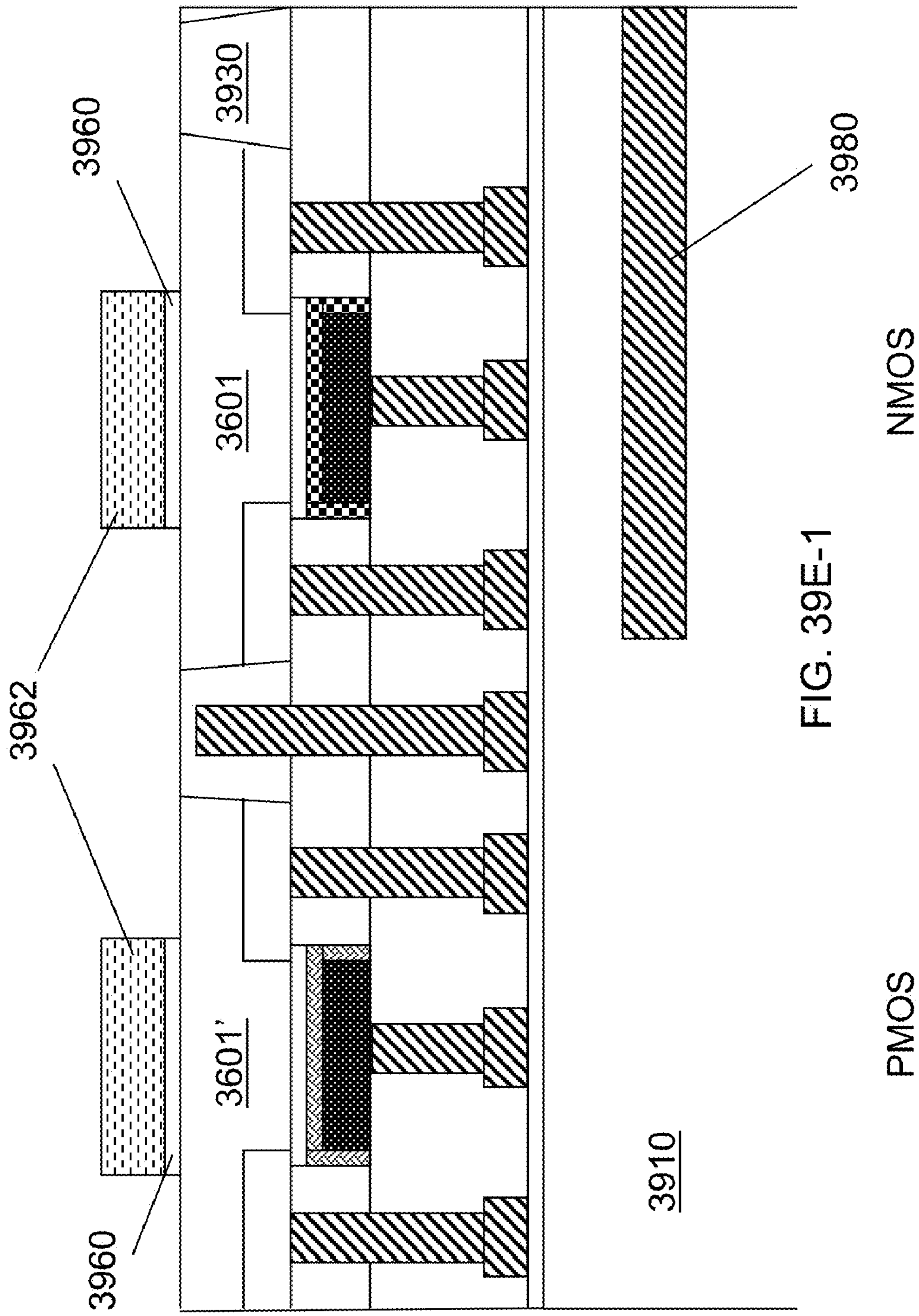
Figure 39F:
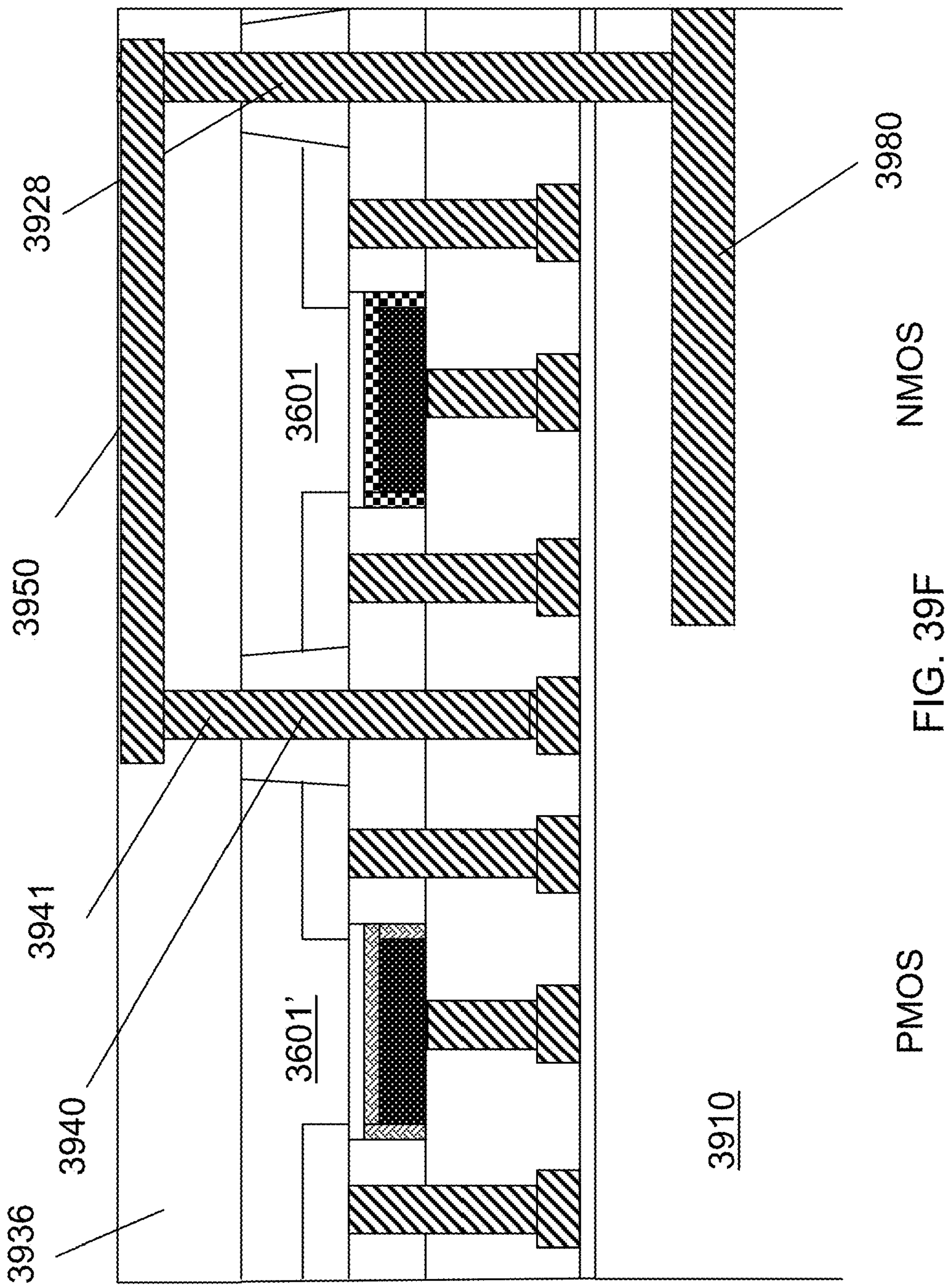
Figures 1, 39F:
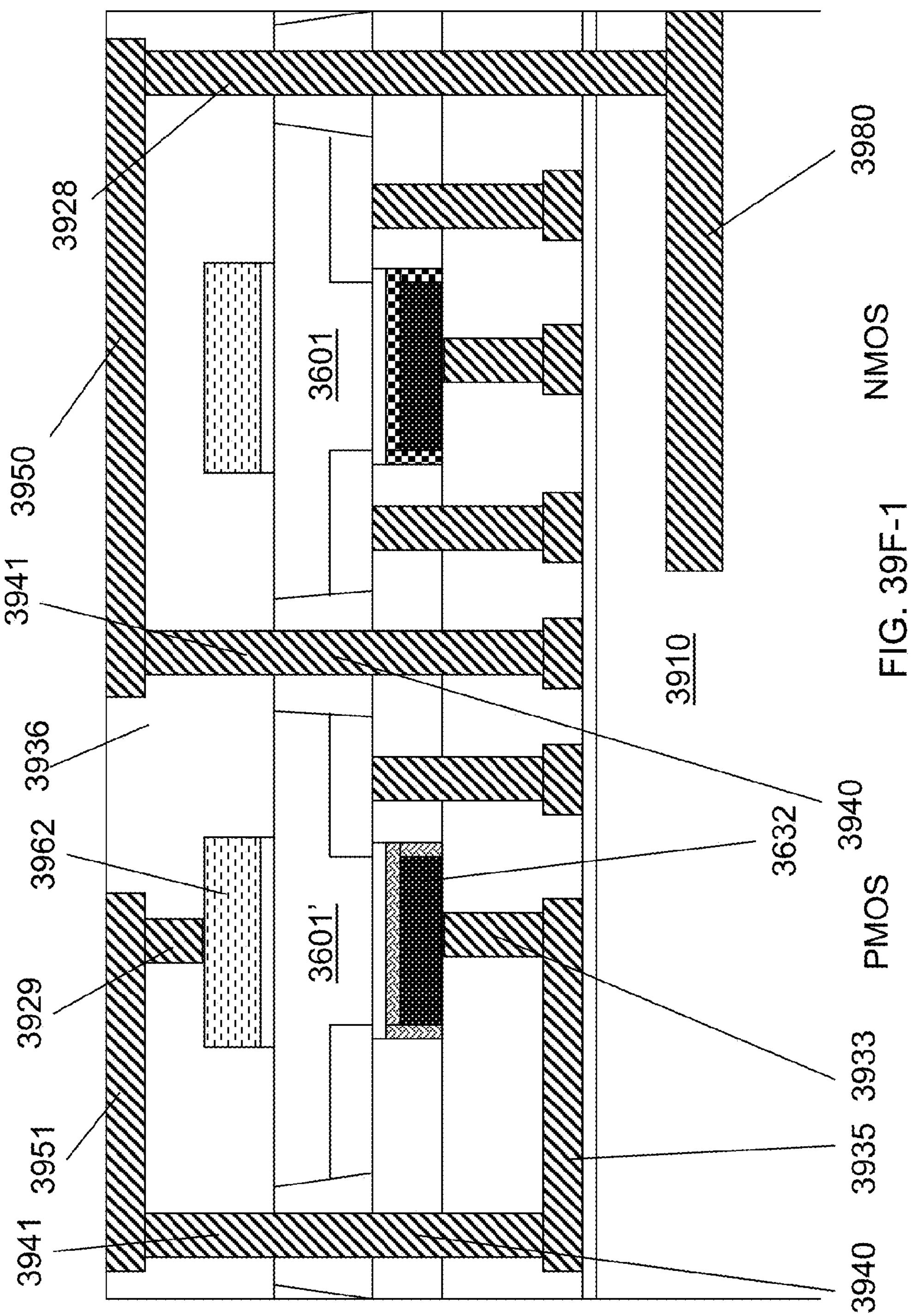
Figures 2, 39F:
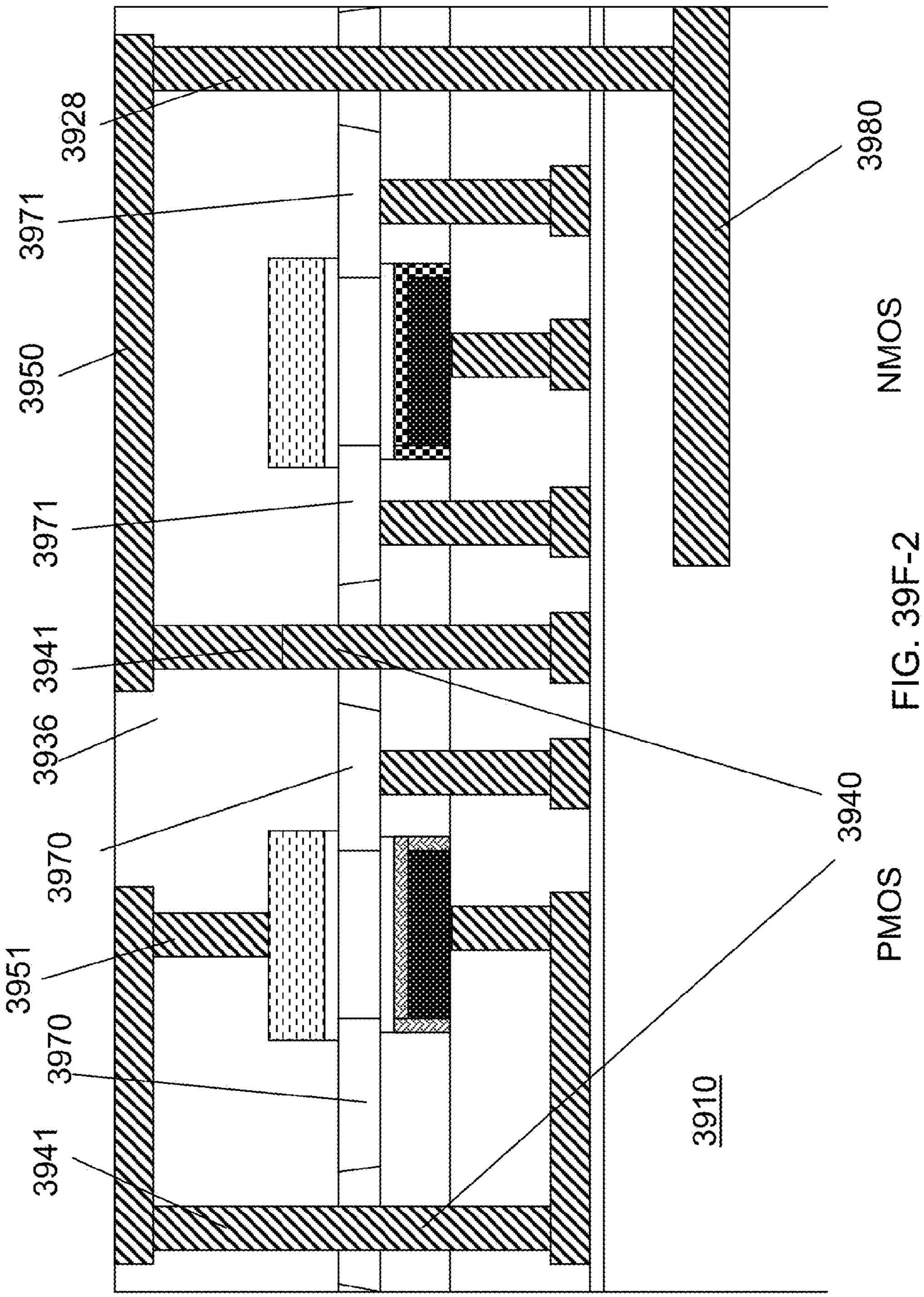

As illustrated in FIG. 23L, 23L1 and 23L2, cross section cut II of FIG. 23L is shown in FIG. 23L1, and cross section cut III of FIG. 23L is shown in FIG. 23L2. BL metal line 2336, oxide 2332, BL contact 2334, WL regions 2350, gate dielectric 2328, P− silicon regions 2318', and peripheral circuits substrate 2302 are shown in FIG. 23L1. The BL contact 2334 connects to one side of the three levels of floating body transistors that may be comprised of two N+ silicon regions 2316' in each level with their associated P− silicon region 2318'. BL metal lines 2336, oxide 2332, gate electrode 2330, gate dielectric 2328, P− silicon regions 2318', interlayer oxide region ('ox'), and peripheral circuits substrate 2302 are shown in FIG. 23L2. The gate electrode 2330 is common to substantially all six P− silicon regions 2318' and forms six two-sided gated floating body transistors.

Figure 23M:
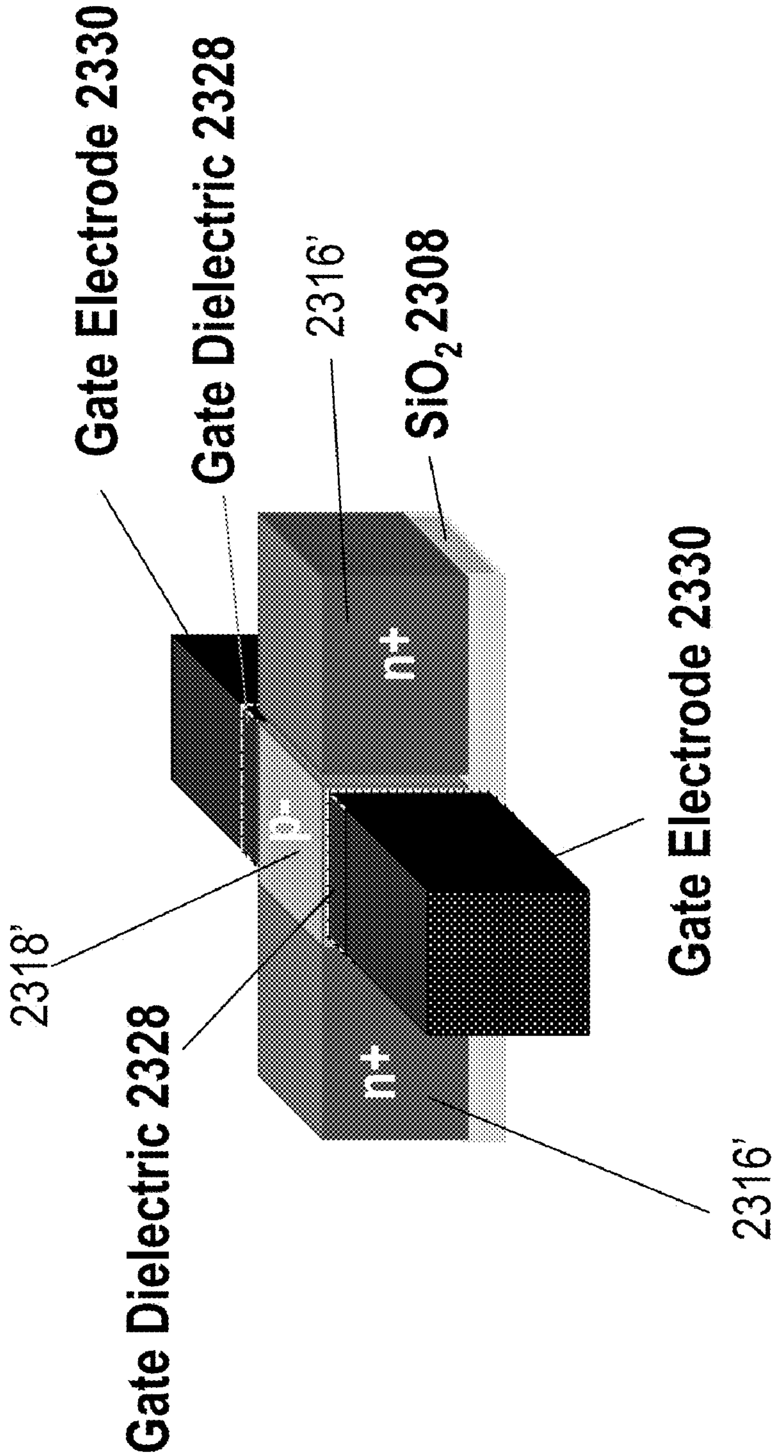

As illustrated in FIG. 23M, a single exemplary floating body transistor with two gates on the first Si/SiO2 layer 2322 may be comprised of P− silicon region 2318' (functioning as the floating body transistor channel), N+ silicon regions 2316' (functioning as source and drain), and two gate electrodes 2330 with associated gate dielectrics 2328. The transistor is electrically isolated from beneath by oxide layer 2308.

This flow enables the formation of a horizontally-oriented monolithic 3D DRAM that utilizes one masking step per memory layer constructed by layer transfers of wafer sized doped mono-crystalline silicon layers and this 3D DRAM may be connected to an underlying multi-metal layer semiconductor device.

Persons of ordinary skill in the art will appreciate that the illustrations in FIGS. 23A through 23M are exemplary only and are not drawn to scale. Such skilled persons will further appreciate that many variations are possible such as, for example, the transistors may be of another type such as RCATs, or junction-less. Additionally, the contacts may utilize doped poly-crystalline silicon, or other conductive materials. Moreover, the stacked memory layers may be connected to a periphery circuit that is above the memory stack. Further, the Si/SiO2 layers 2322, 2324 and 2326 may be annealed layer-by-layer as soon as their associated implantations are complete by using a laser anneal system. Many other modifications within the scope of the invention will suggest themselves to such skilled persons after reading this specification. Thus the invention is to be limited only by the appended claims.

As illustrated in FIGS. 24A to 24L, a horizontally-oriented monolithic 3D DRAM that utilizes zero additional masking steps per memory layer by sharing mask steps after substantially all the layers have been transferred may be constructed that is suitable for 3D IC manufacturing.

Figure 24A:
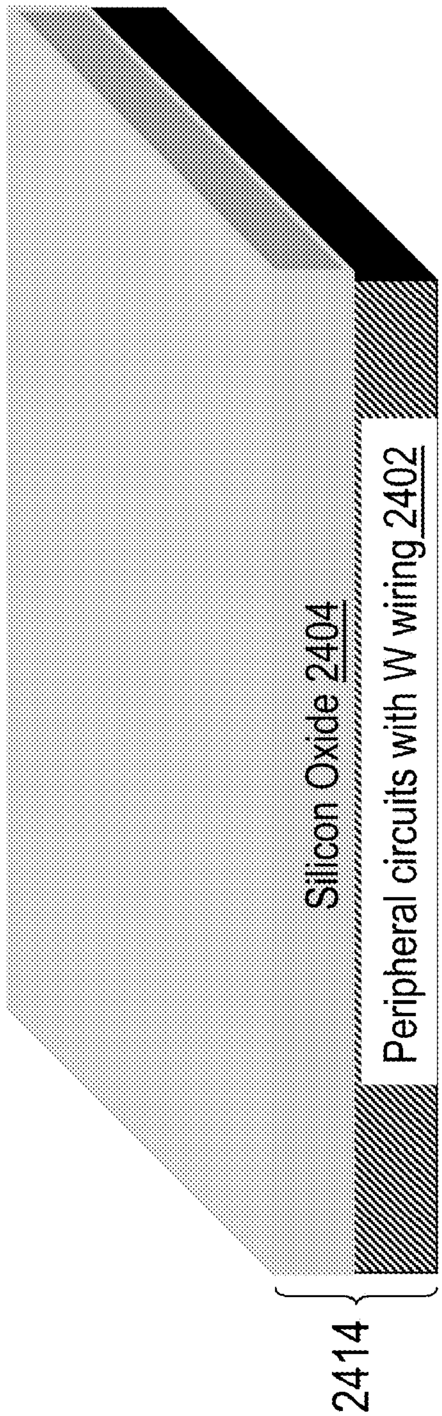
FIGS. 24A-L are exemplary drawing illustrations of the formation of a floating body DRAM transistor.

As illustrated in FIG. 24A, a silicon substrate with peripheral circuitry 2402 may be constructed with high temperature (greater than approximately 400° C.) resistant wiring, such as, for example, Tungsten. The peripheral circuitry substrate 2402 may comprise memory control circuits as well as circuitry for other purposes and of various types, such as, for example, analog, digital, RF, or memory. The peripheral circuitry substrate 2402 may comprise peripheral circuits that can withstand an additional rapid-thermal-anneal (RTA) and still remain operational and retain good performance. For this purpose, the peripheral circuits may be formed such that they have not been subject to a weak RTA or no RTA for activating dopants. The top surface of the peripheral circuitry substrate 2402 may be prepared for oxide wafer bonding with a deposition of a silicon oxide 2404, thus forming acceptor wafer 2414.

Figure 24B:
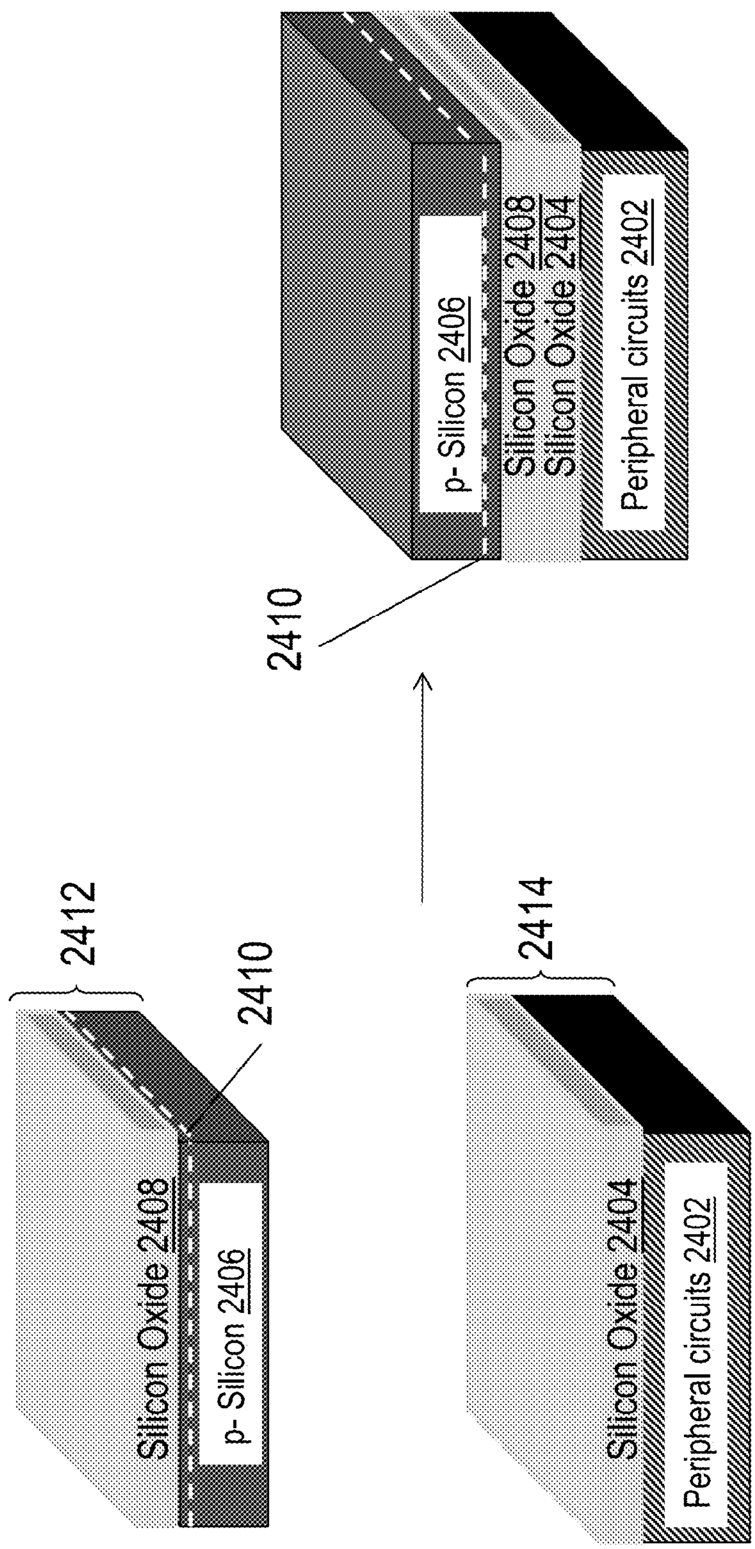

As illustrated in FIG. 24B, a mono-crystalline silicon donor wafer 2412 may be processed to comprise a wafer sized layer of P− doping (not shown) which may have a different dopant concentration than the P− substrate 2406. The P− doping layer may be formed by ion implantation and thermal anneal. A screen oxide 2408 may be grown or deposited prior to the implant to protect the silicon from implant contamination and to provide an oxide surface for later wafer to wafer bonding. A layer transfer demarcation plane 2410 (shown as a dashed line) may be formed in donor wafer 2412 within the P− substrate 2406 or the P− doping layer (not shown) by hydrogen implantation or other methods as previously described. Both the donor wafer 2412 and acceptor wafer 2414 may be prepared for wafer bonding as previously described and then bonded at the surfaces of oxide layer 2404 and oxide layer 2408, at a low temperature (less than approximately 400° C.) preferred for lowest stresses, or a moderate temperature (less than approximately 900° C.).

Figure 24C:
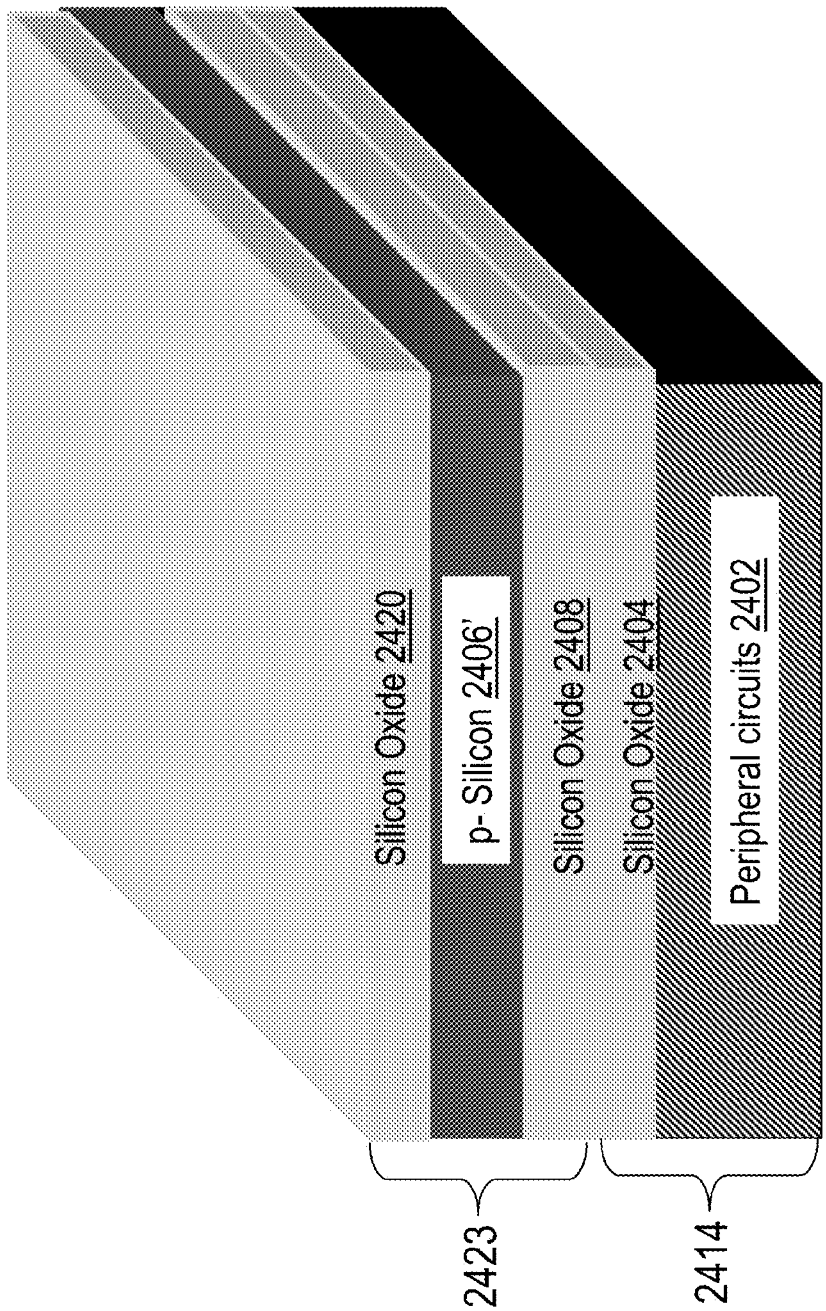

As illustrated in FIG. 24C, the portion of the P− layer (not shown) and the P− wafer substrate 2406 that are above the layer transfer demarcation plane 2410 may be removed by cleaving and polishing, or other processes as previously described, such as, for example, ion-cut or other methods, thus forming the remaining mono-crystalline silicon P− layer 2406'. Remaining P− layer 2406' and oxide layer 2408 have been layer transferred to acceptor wafer 2414. The top surface of P− layer 2406' may be chemically or mechanically polished smooth and flat. Now transistors or portions of transistors may be formed and aligned to the acceptor wafer 2414 alignment marks (not shown). Oxide layer 2420 may be deposited to prepare the surface for later oxide to oxide bonding. This now forms the first Si/SiO2 layer 2423 which includes silicon oxide layer 2420, P− silicon layer 2406', and oxide layer 2408.

Figure 24D:
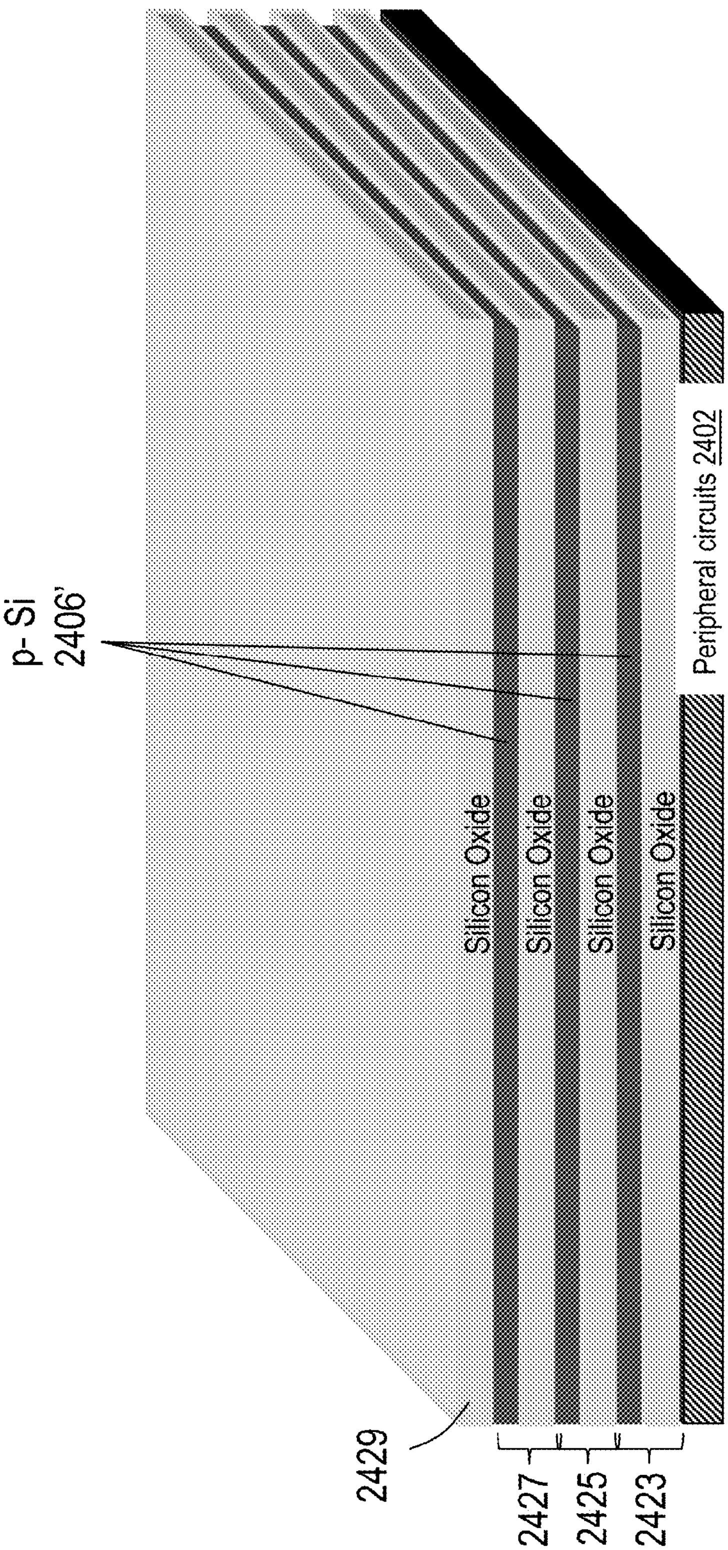

As illustrated in FIG. 24D, additional Si/SiO2 layers, such as, for example, second Si/SiO2 layer 2425 and third Si/SiO2 layer 2427, may each be formed as described in FIGS. 24A to 24C. Oxide layer 2429 may be deposited to electrically isolate the top silicon layer.

Figure 24E:
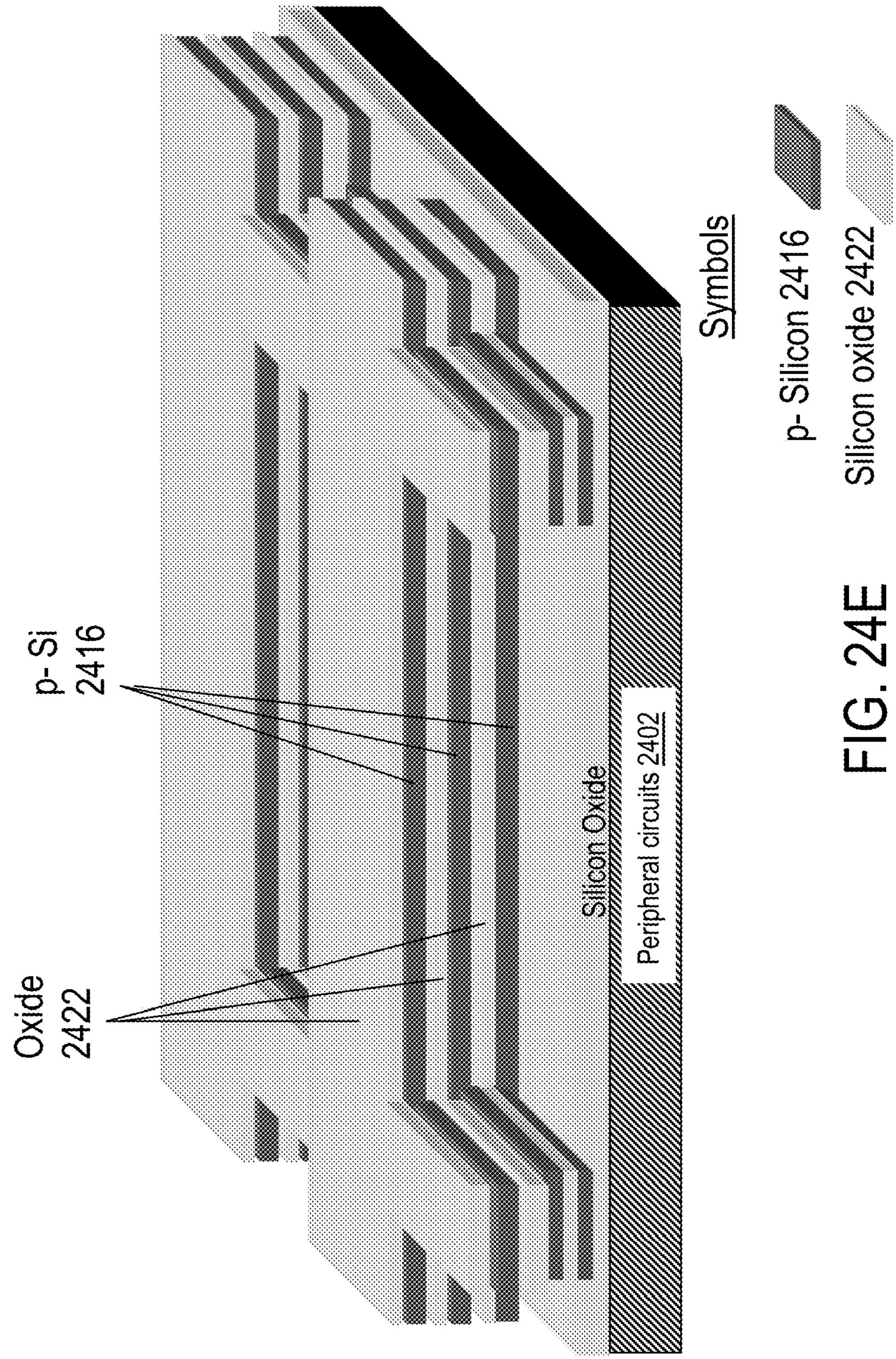

As illustrated in FIG. 24E, oxide 2429, third Si/SiO2 layer 2427, second Si/SiO2 layer 2425 and first Si/SiO2 layer 2423 may be lithographically defined and plasma/RIE etched to form a portion of the memory cell structure, which now comprise regions of P− silicon 2416 and oxide 2422.

Figure 24F:
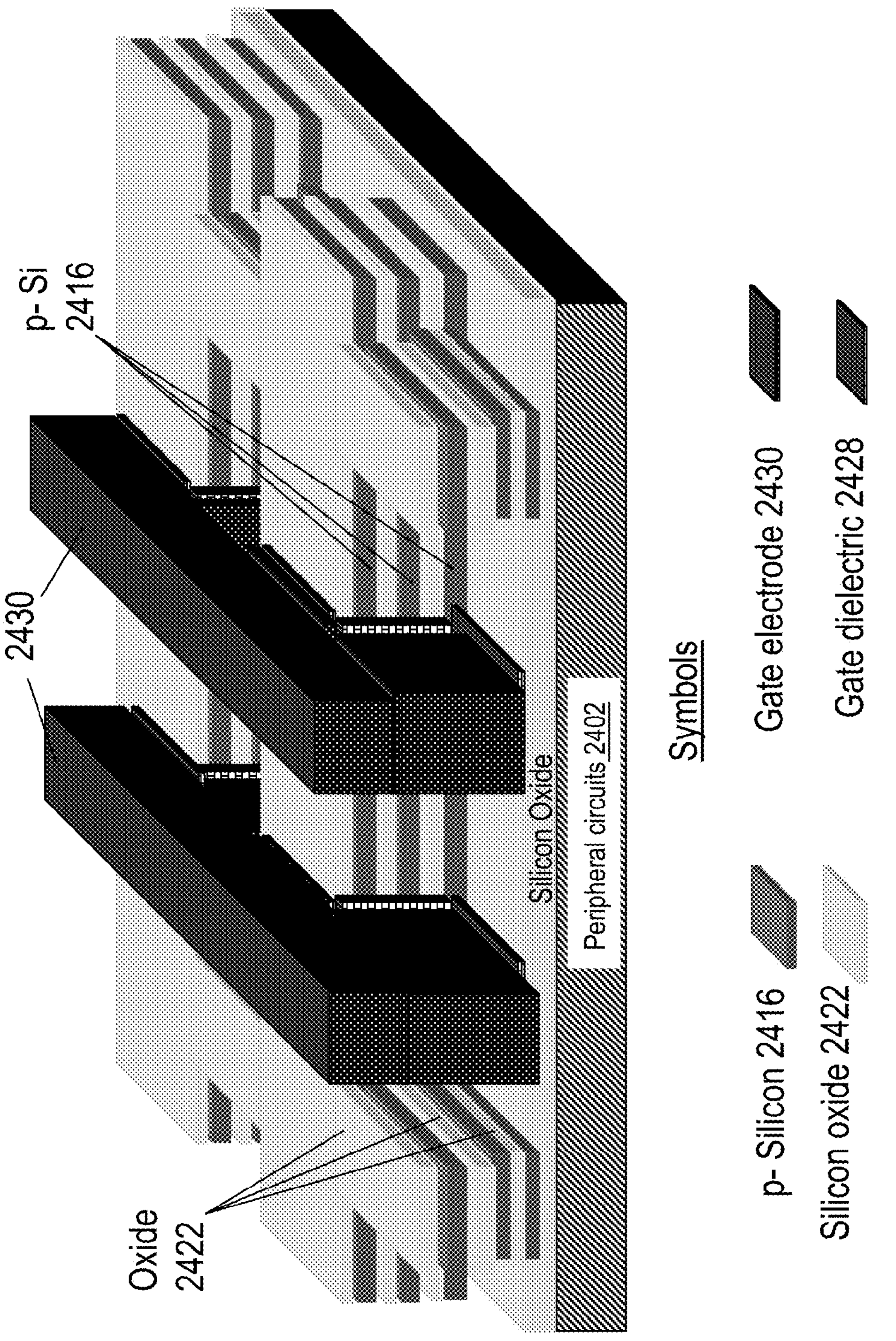

As illustrated in FIG. 24F, a gate dielectric and gate electrode material may be deposited, planarized with a chemical mechanical polish (CMP), and then lithographically defined and plasma/RIE etched to form gate dielectric regions 2428 which may either be self aligned to and substantially covered by gate electrodes 2430 (shown), or substantially cover the entire silicon/oxide multi-layer structure. The gate stack comprised of gate electrode 2430 and gate dielectric 2428 may be formed with a gate dielectric, such as, for example, thermal oxide, and a gate electrode material, such as, for example, poly-crystalline silicon. Alternatively, the gate dielectric may be an atomic layer deposited (ALD) material that is paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 24G:
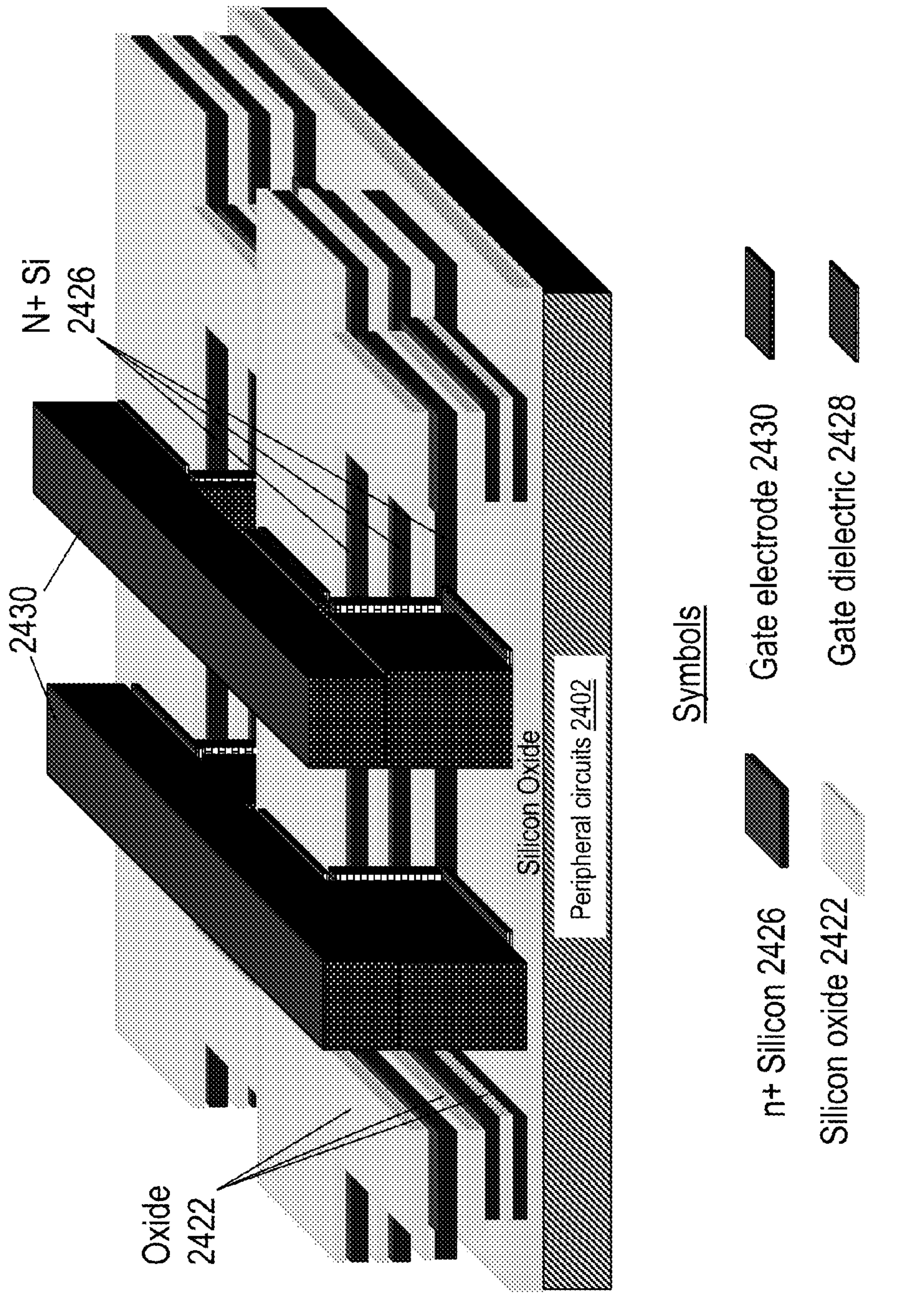

As illustrated in FIG. 24G, N+ silicon regions 2426 may be formed in a self aligned manner to the gate electrodes 2430 by ion implantation of an N type species, such as, for example, Arsenic, into the regions of P− silicon 2416 that are not blocked by the gate electrodes 2430. This also forms remaining regions of P− silicon 2417 (not shown) in the gate electrode 2430 blocked areas. Different implant energies or angles, or multiples of each, may be utilized to place the N type species into each layer of P− silicon regions 2416. Spacers (not shown) may be utilized during this multi-step implantation process and layers of silicon present in different layers of the stack may have different spacer widths to account for the differing lateral straggle of N type species implants. Bottom layers, such as, for example, 2423, could have larger spacer widths than top layers, such as, for example, 2427. Alternatively, angular ion implantation with substrate rotation may be utilized to compensate for the differing implant straggle. The top layer implantation may have a steeper angle than perpendicular to the wafer surface and hence land ions slightly underneath the gate electrode 2430 edges and closely match a more perpendicular lower layer implantation which may land ions slightly underneath the gate electrode 2430 edge due to the straggle effects of the greater implant energy necessary to reach the lower layer. A rapid thermal anneal (RTA) may be conducted to activate the dopants in substantially all of the memory layers 2423, 2425, 2427 and in the peripheral circuits 2402. Alternatively, optical anneals, such as, for example, a laser based anneal, may be performed.

Figure 24H:
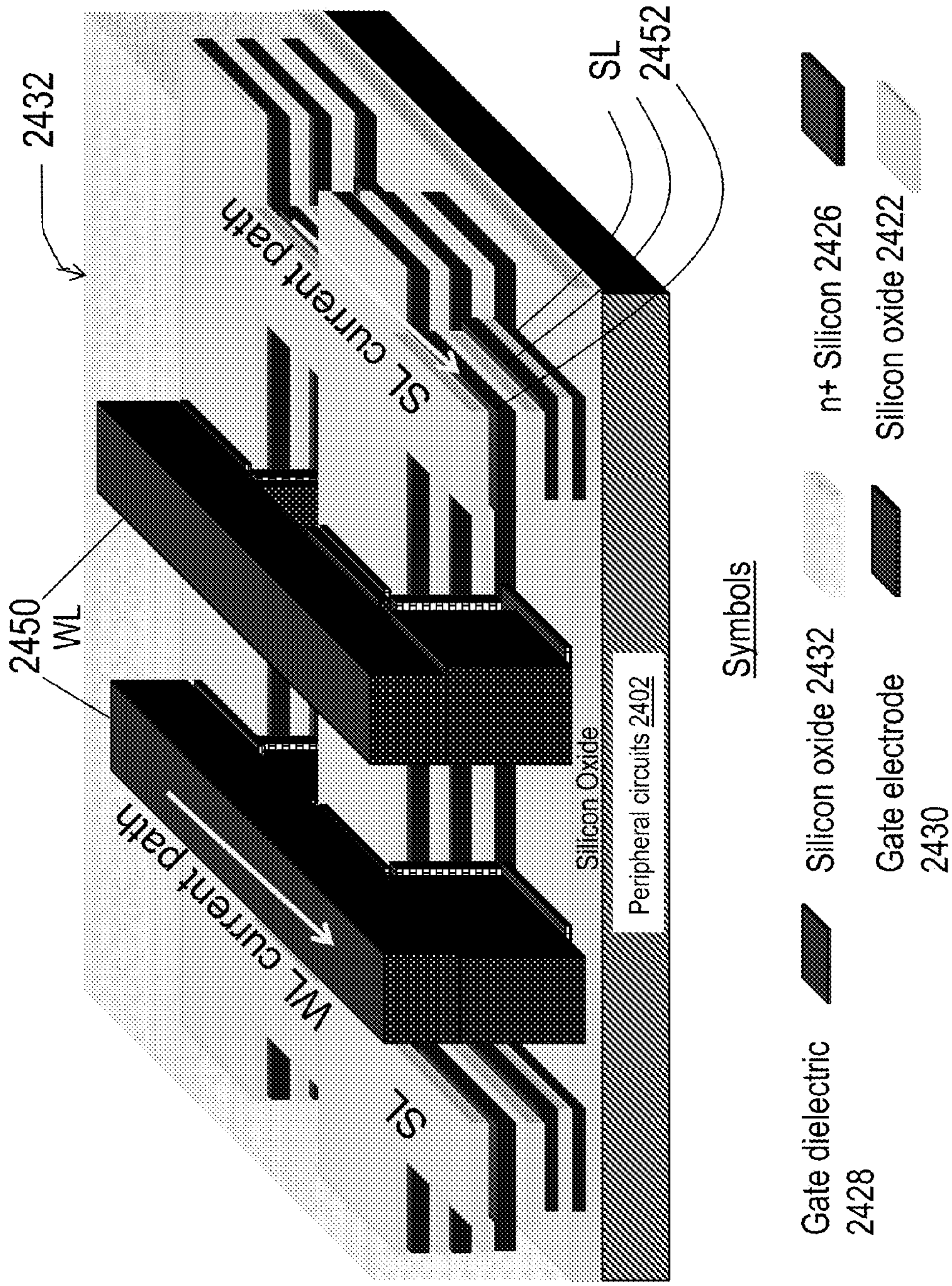

As illustrated in FIG. 24H, the entire structure may be substantially covered with a gap fill oxide 2432, which be planarized with chemical mechanical polishing. The oxide 2432 is shown transparent in the figure for clarity. Word-line regions (WL) 2450, coupled with and composed of gate electrodes 2430, and source-line regions (SL) 2452, composed of indicated N+ silicon regions 2426, are shown.

Figure 24I:
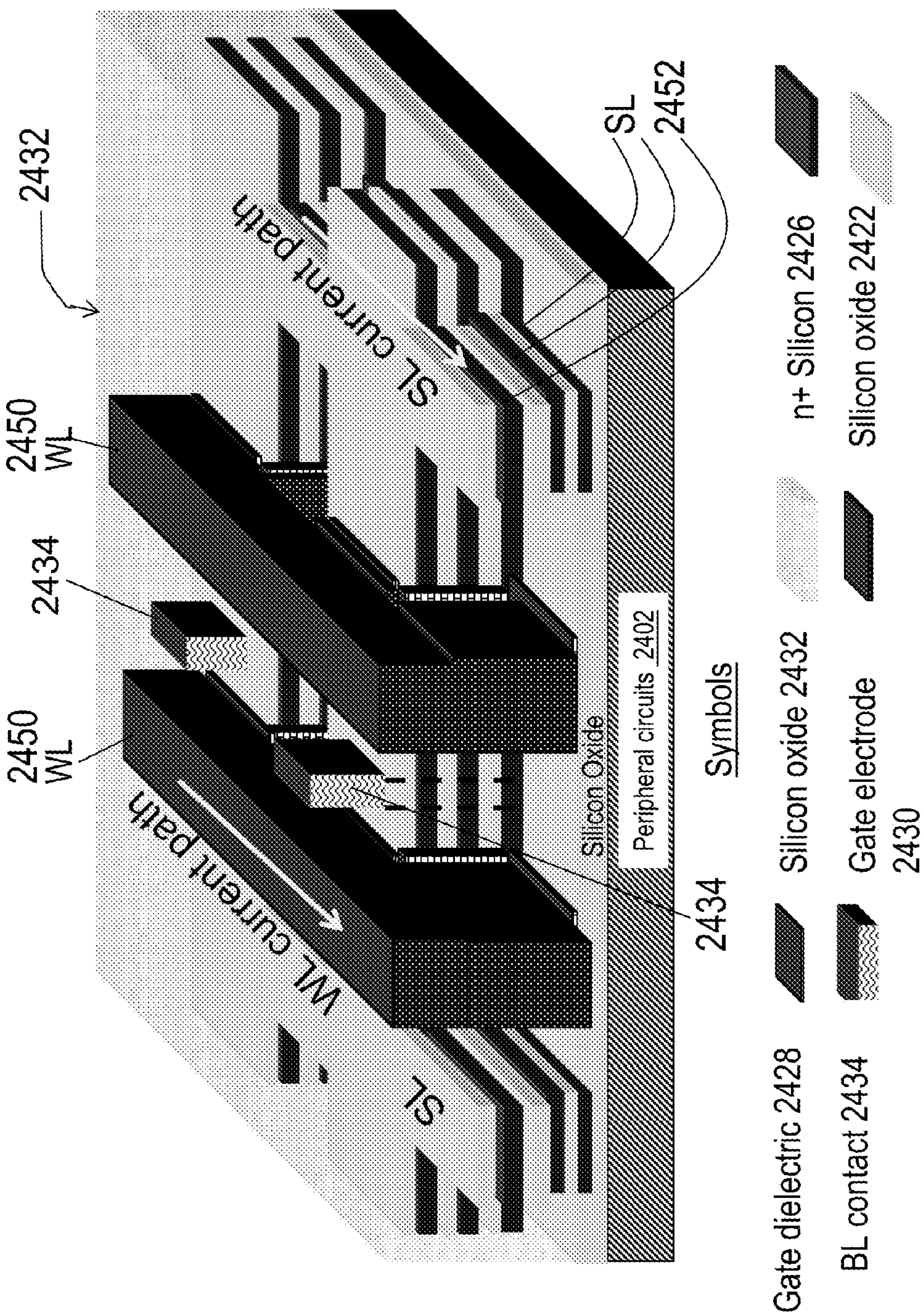

As illustrated in FIG. 24I, bit-line (BL) contacts 2434 may be lithographically defined, etched with plasma/RIE, photoresist removed, and then metal, such as, for example, copper, aluminum, or tungsten, may be deposited to fill the contact and etched or polished to the top of oxide 2432. Each BL contact 2434 may be shared among substantially all layers of memory, shown as three layers of memory in FIG. 24I. A thru layer via 2460 (not shown) may be formed to electrically couple the BL, SL, and WL metallization to the acceptor substrate 2414 peripheral circuitry via an acceptor wafer metal connect pad 2480 (not shown).

Figure 24J:
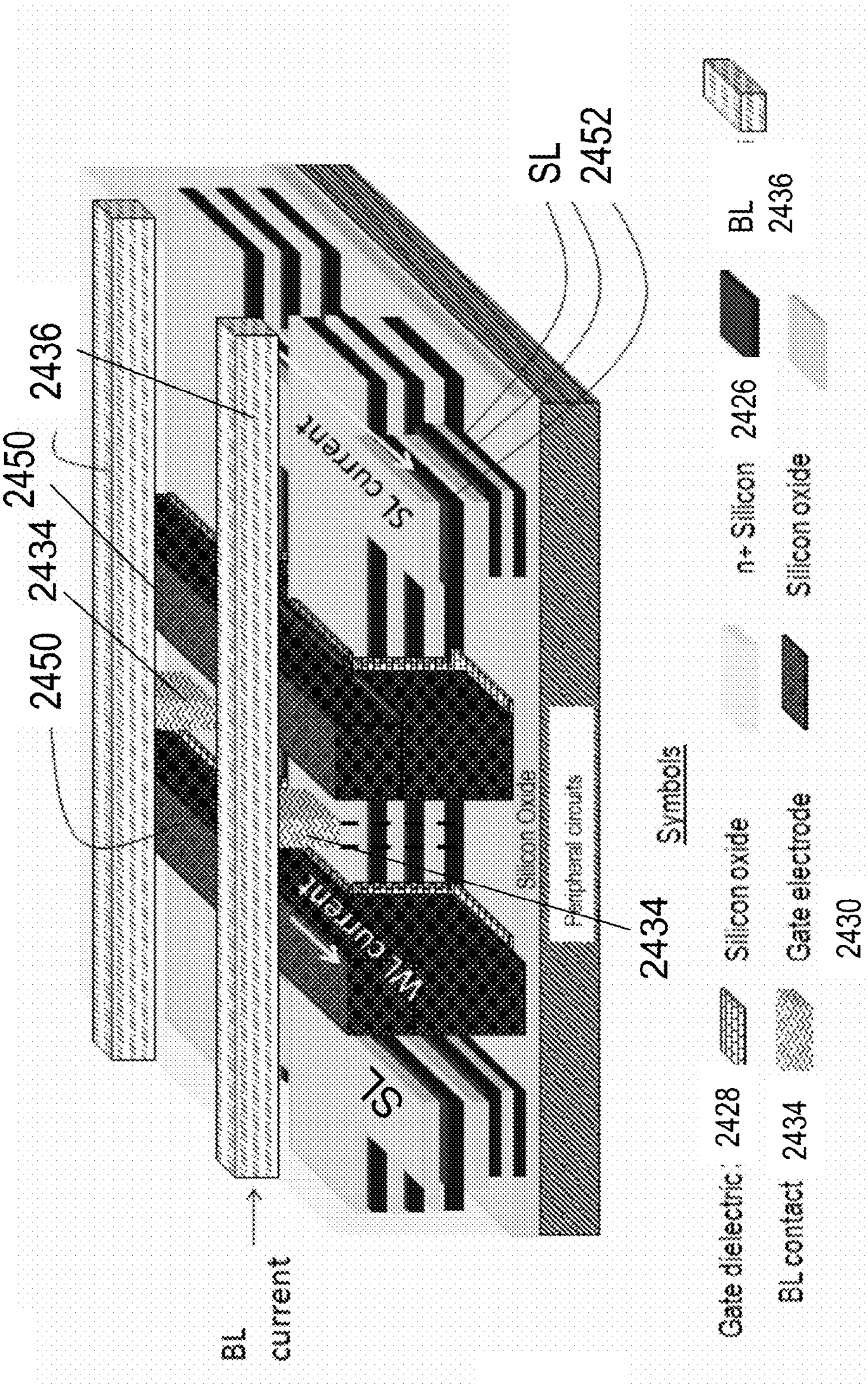

As illustrated in FIG. 24J, BL metal lines 2436 may be formed and connect to the associated BL contacts 2434. Contacts and associated metal interconnect lines (not shown) may be formed for the WL and SL at the memory array edges.

Figure 24K:
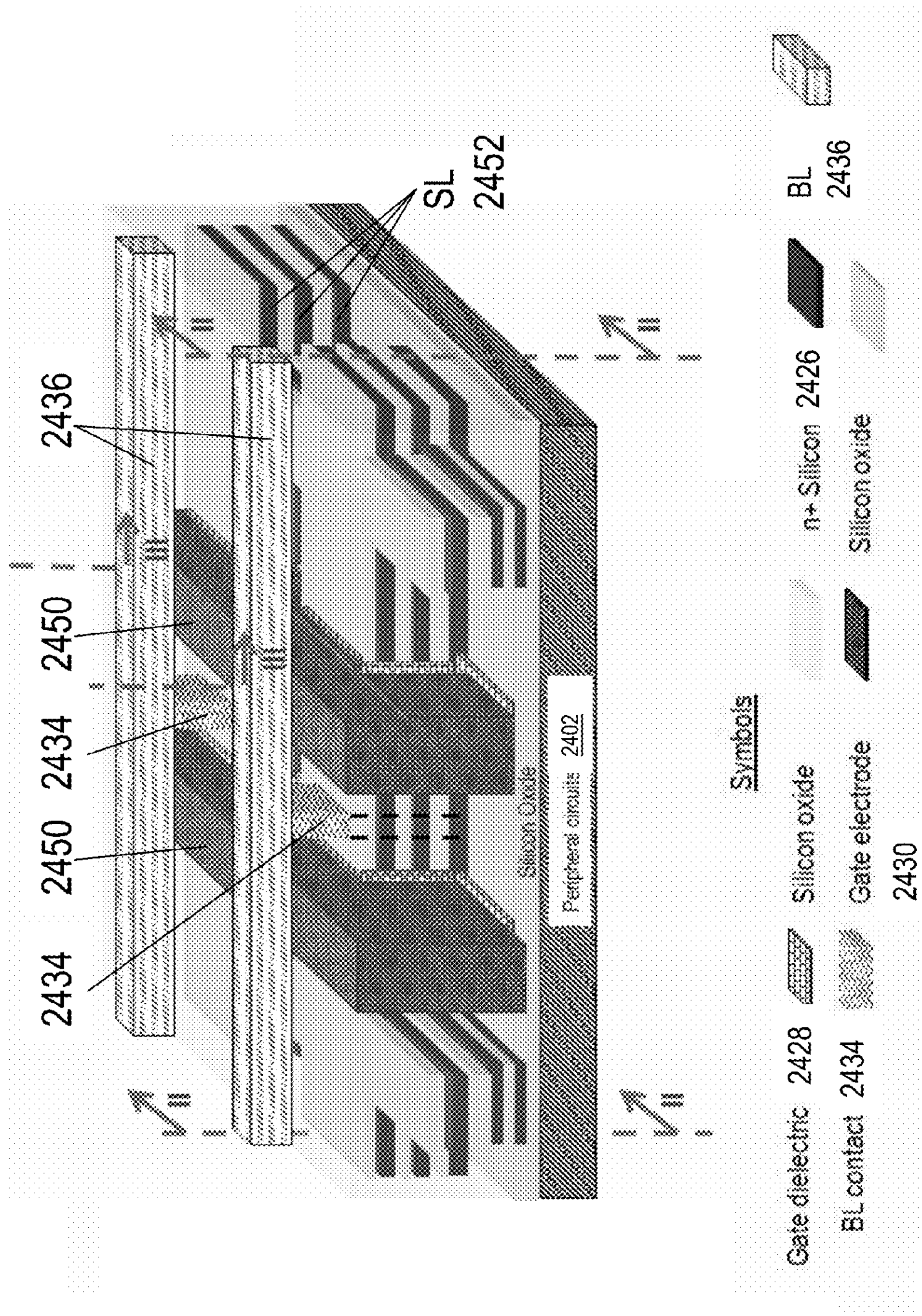
Figure 24L:
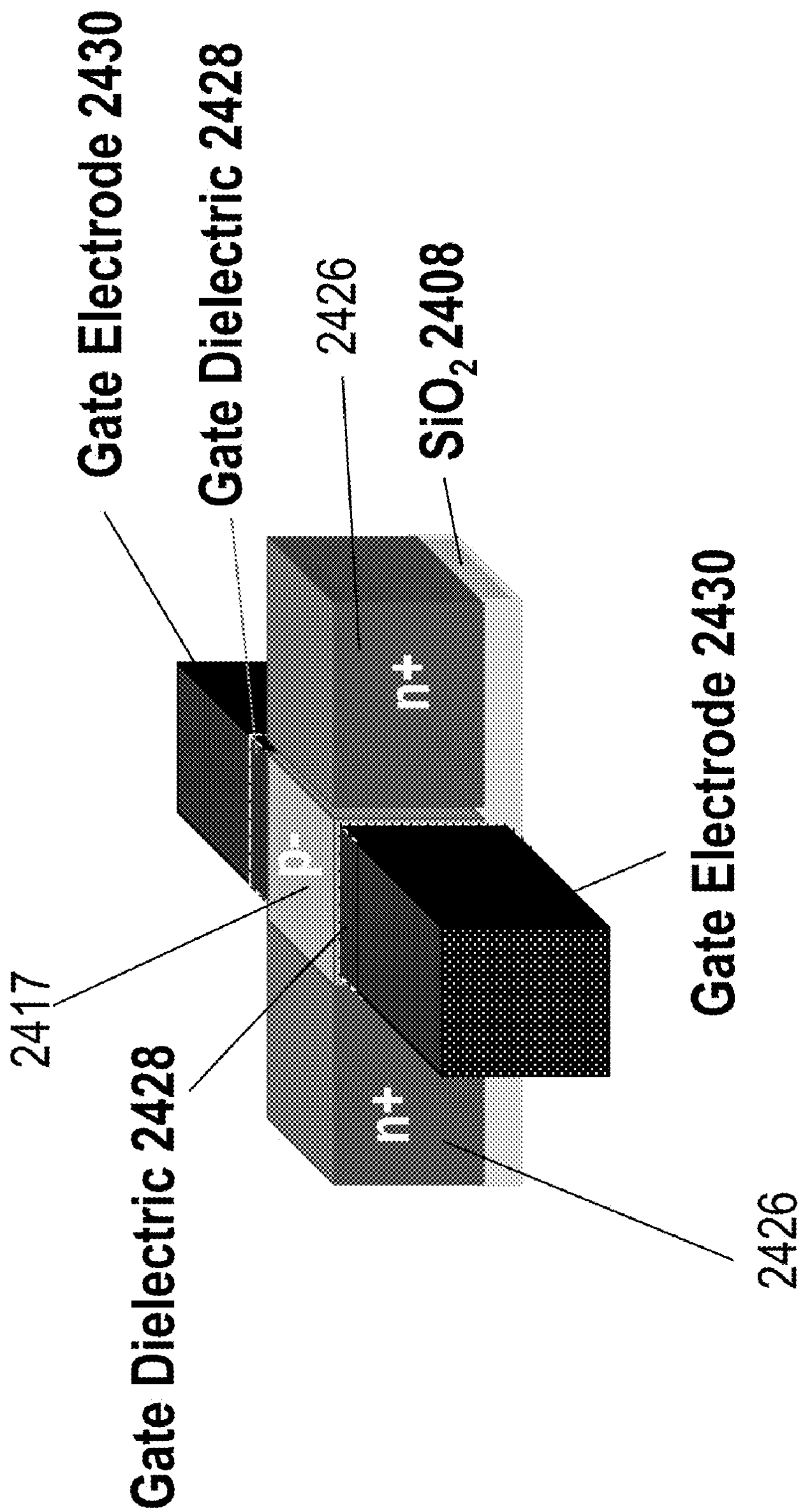

As illustrated in FIG. 24K, 24K1 and 24K2, cross section cut II of FIG. 24K is shown in FIG. 24K1, and cross section cut III of FIG. 24K is shown in FIG. 24K2. BL metal line 2436, oxide 2432, BL contact 2434, WL regions 2450, gate dielectric 2428, N+ silicon regions 2426, P− silicon regions 2417, and peripheral circuits substrate 2402 are shown in FIG. 24K1. The BL contact 2434 couples to one side of the three levels of floating body transistors that may be comprised of two N+ silicon regions 2426 in each level with their associated P− silicon region 2417. BL metal lines 2436, oxide 2432, gate electrode 2430, gate dielectric 2428, P− silicon regions 2417, interlayer oxide region ('ox'), and peripheral circuits substrate 2402 are shown in FIG. 24K2. The gate electrode 2430 is common to substantially all six P− silicon regions 2417 and forms six two-sided gated floating body transistors.

As illustrated in FIG. 24M, a single exemplary floating body two gate transistor on the first Si/SiO2 layer 2423 may be comprised of P− silicon region 2417 (functioning as the floating body transistor channel), N+ silicon regions 2426 (functioning as source and drain), and two gate electrodes 2430 with associated gate dielectrics 2428. The transistor is electrically isolated from beneath by oxide layer 2408.

This flow enables the formation of a horizontally-oriented monolithic 3D DRAM that utilizes zero additional masking steps per memory layer and is constructed by layer transfers of wafer sized doped mono-crystalline silicon layers and may be connected to an underlying multi-metal layer semiconductor device.

Persons of ordinary skill in the art will appreciate that the illustrations in FIGS. 24A through 24L are exemplary only and are not drawn to scale. Such skilled persons will further appreciate that many variations are possible such as, for example, the transistors may be of another type such as RCATs, or junction-less. Additionally, the contacts may utilize doped poly-crystalline silicon, or other conductive materials. Moreover, the stacked memory layer may be connected to a periphery circuit that is above the memory stack. Further, each gate of the double gate 3D DRAM can be independently controlled for better control of the memory cell. Many other modifications within the scope of the invention will suggest themselves to such skilled persons after reading this specification. Thus the invention is to be limited only by the appended claims.

Novel monolithic 3D memory technologies utilizing material resistance changes may be constructed in a similar manner. There are many types of resistance-based memories including phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," *IBM Journal of Research and Development*, vol. 52, no. 4.5, pp. 449-464, July 2008 by Burr, G. W., et. al. The contents of this document are incorporated in this specification by reference.

As illustrated in FIGS. 25A to 25K, a resistance-based zero additional masking steps per memory layer 3D memory may be constructed that is suitable for 3D IC manufacturing. This 3D memory utilizes junction-less transistors and has a resistance-based memory element in series with a select or access transistor.

Figure 25A:
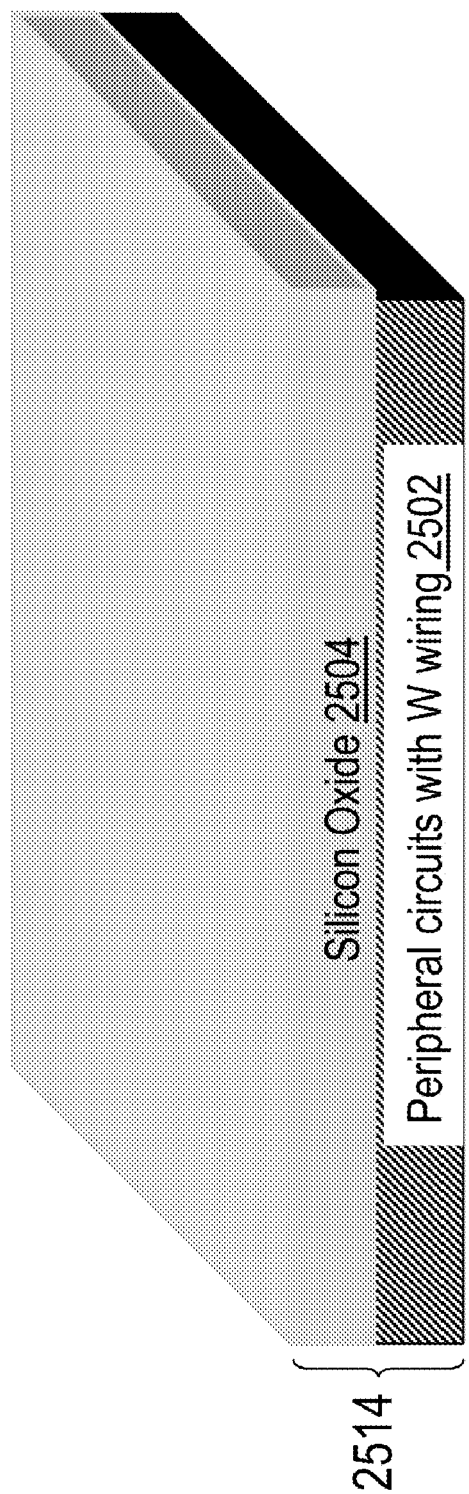
FIGS. 25A-K are exemplary drawing illustrations of the formation of a resistive memory transistor.

As illustrated in FIG. 25A, a silicon substrate with peripheral circuitry 2502 may be constructed with high temperature (greater than approximately 400° C.) resistant wiring, such as, for example, Tungsten. The peripheral circuitry substrate 2502 may comprise memory control circuits as well as circuitry for other purposes and of various types, such as, for example, analog, digital, RF, or memory. The peripheral circuitry substrate 2502 may comprise peripheral circuits that can withstand an additional rapid-thermal-anneal (RTA) and still remain operational and retain good performance. For this purpose, the peripheral circuits may be formed such that they have not been subject to a weak RTA or no RTA for activating dopants. The top surface of the peripheral circuitry substrate 2502 may be prepared for oxide wafer bonding with a deposition of a silicon oxide 2504, thus forming acceptor wafer 2514.

Figure 25B:
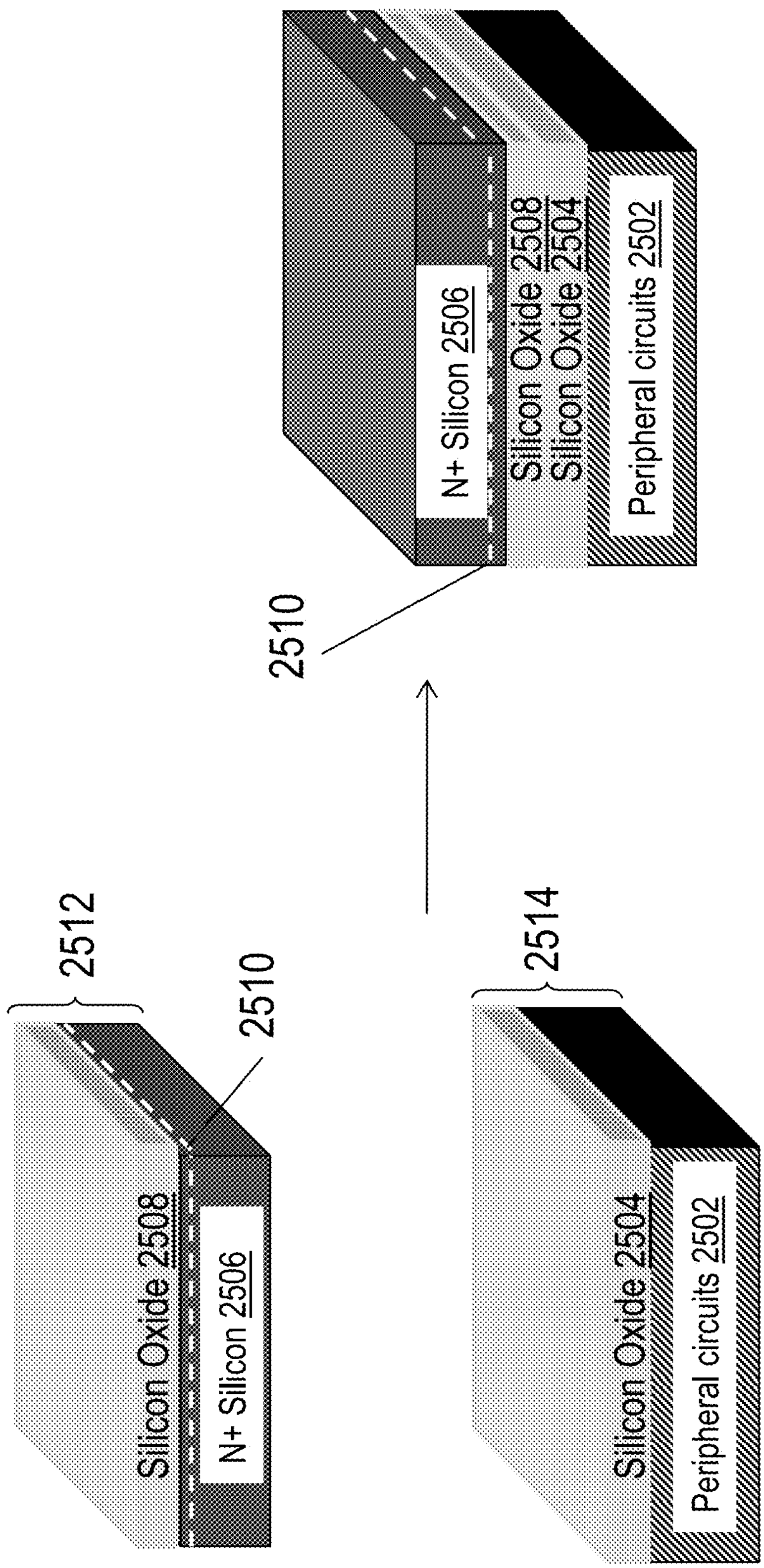

As illustrated in FIG. 25B, a mono-crystalline silicon donor wafer 2512 may be optionally processed to comprise a wafer sized layer of N+ doping (not shown) which may have a different dopant concentration than the N+ substrate 2506. The N+ doping layer may be formed by ion implantation and thermal anneal. A screen oxide 2508 may be grown or deposited prior to the implant to protect the silicon from implant contamination and to provide an oxide surface for later wafer to wafer bonding. A layer transfer demarcation plane 2510 (shown as a dashed line) may be formed in donor wafer 2512 within the N+ substrate 2506 or the N+ doping layer (not shown) by hydrogen implantation or other methods as previously described. Both the donor wafer 2512 and acceptor wafer 2514 may be prepared for wafer bonding as previously described and then bonded at the surfaces of oxide layer 2504 and oxide layer 2508, at a low temperature (less than approximately 400° C.) preferred for lowest stresses, or a moderate temperature (less than approximately 900° C.).

Figure 25C:
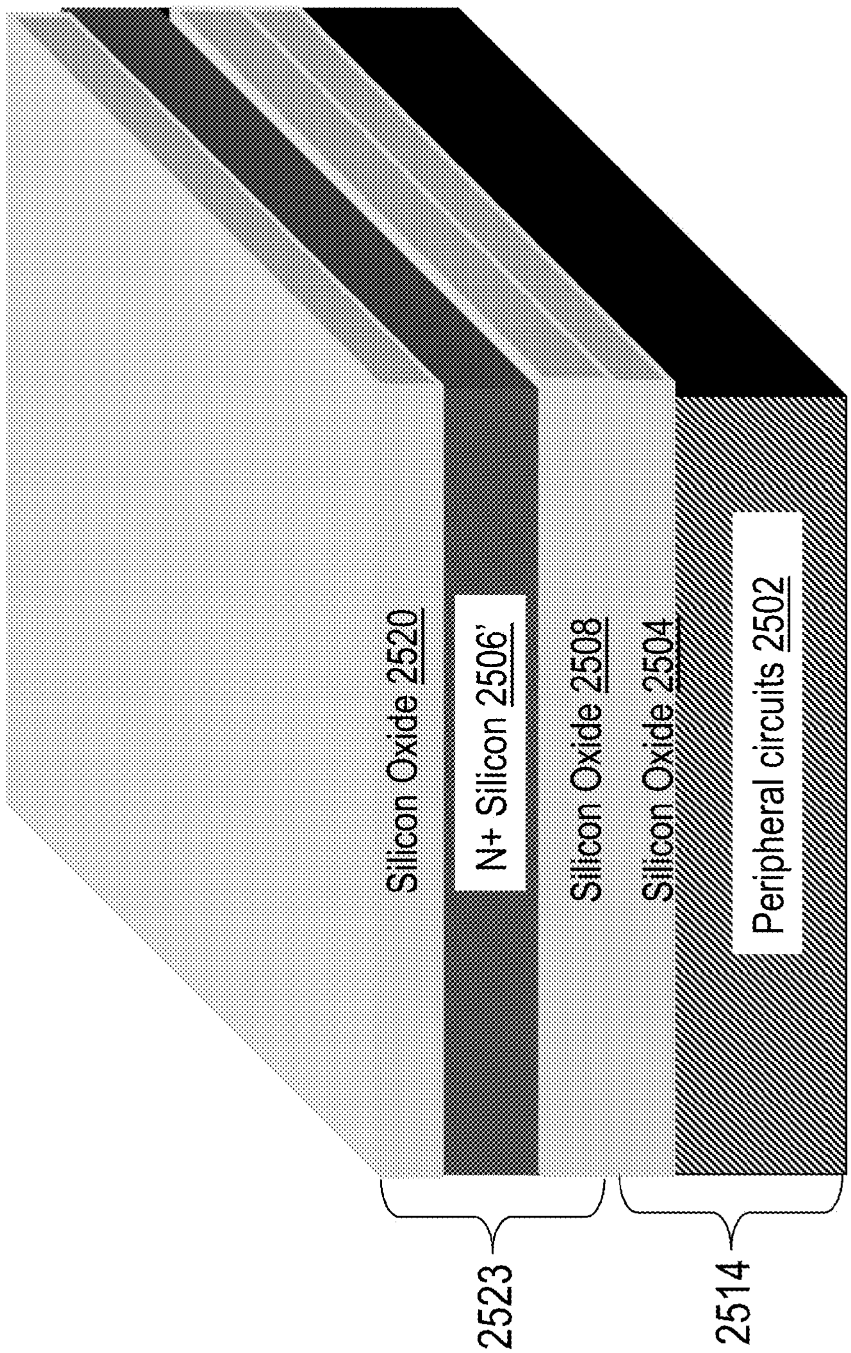

As illustrated in FIG. 25C, the portion of the N+ layer (not shown) and the N+ wafer substrate 2506 that are above the layer transfer demarcation plane 2510 may be removed by cleaving and polishing, or other processes as previously described, such as, for example, ion-cut or other methods, thus forming the remaining mono-crystalline silicon N+ layer 2506'. Remaining N+ layer 2506' and oxide layer 2508 have been layer transferred to acceptor wafer 2514. The top surface of N+ layer 2506' may be chemically or mechanically polished smooth and flat. Now transistors or portions of transistors may be formed and aligned to the acceptor wafer 2514 alignment marks (not shown). Oxide layer 2520 may be deposited to prepare the surface for later oxide to oxide bonding. This now forms the first Si/SiO2 layer 2523 which includes silicon oxide layer 2520, N+ silicon layer 2506', and oxide layer 2508.

Figure 25D:
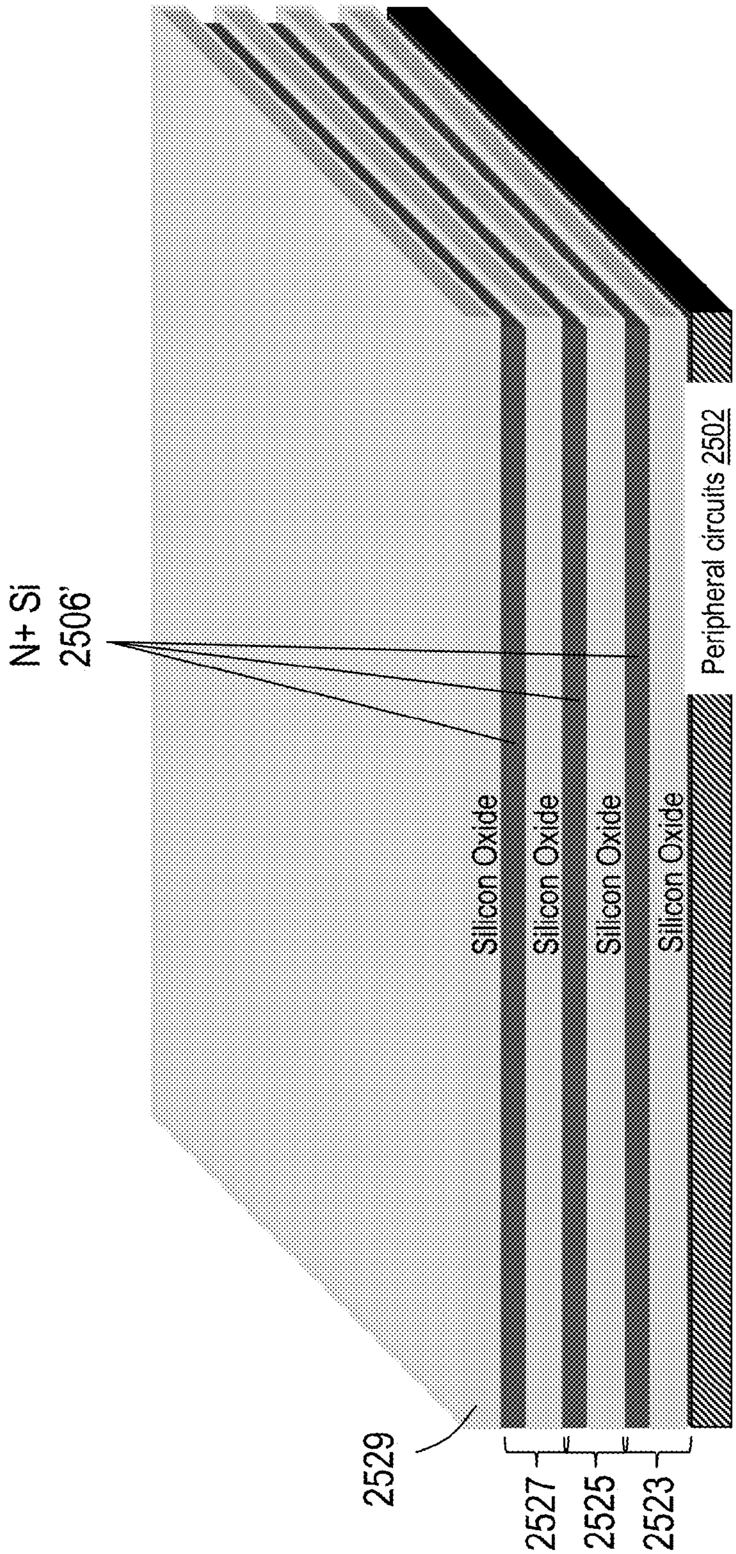

As illustrated in FIG. 25D, additional Si/SiO2 layers, such as, for example, second Si/SiO2 layer 2525 and third Si/SiO2 layer 2527, may each be formed as described in FIGS. 25A to 25C. Oxide layer 2529 may be deposited to electrically isolate the top N+ silicon layer.

Figure 25E:
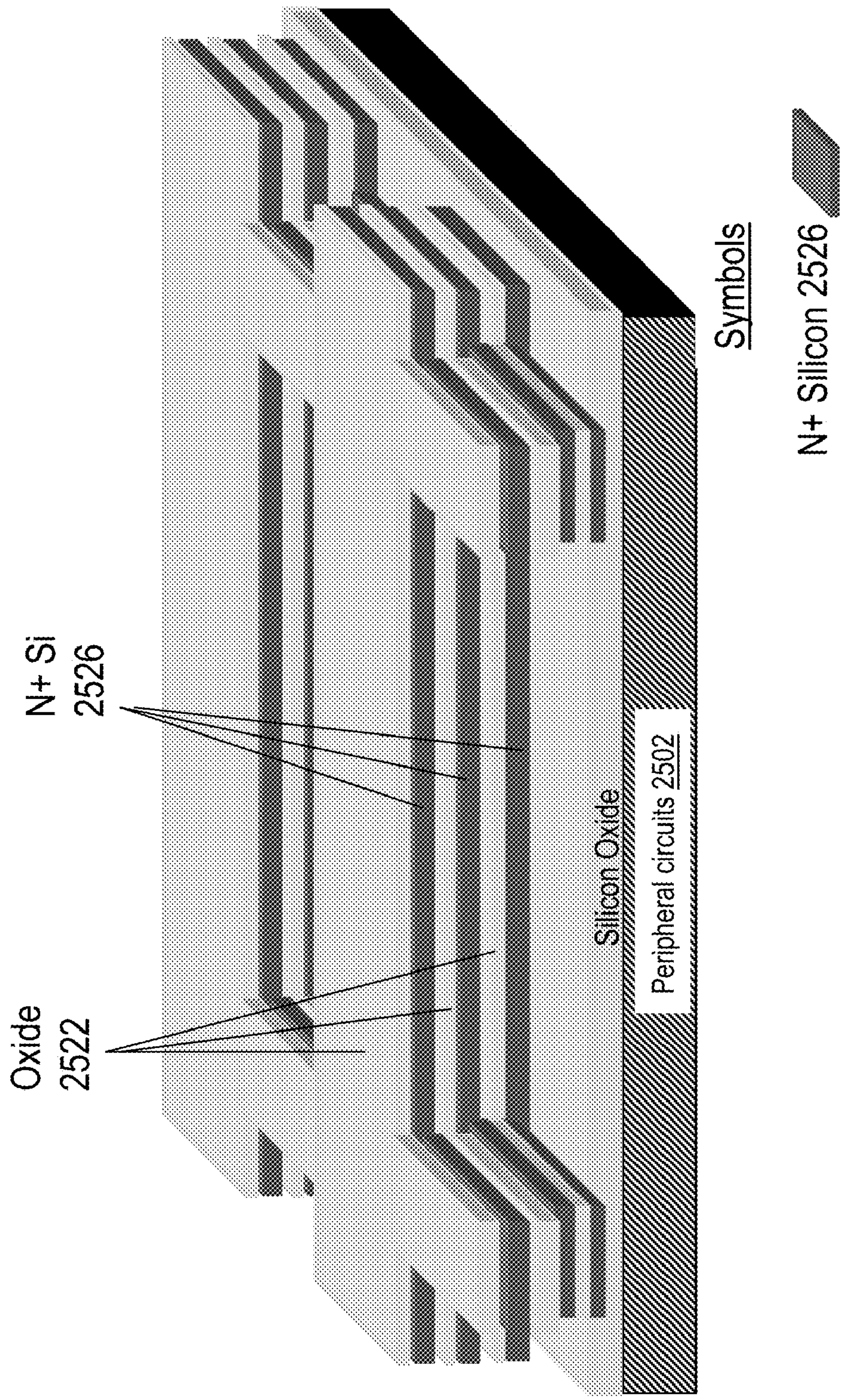

As illustrated in FIG. 25E, oxide 2529, third Si/SiO2 layer 2527, second Si/SiO2 layer 2525 and first Si/SiO2 layer 2523 may be lithographically defined and plasma/RIE etched to form a portion of the memory cell structure, which now comprises regions of N+ silicon 2526 and oxide 2522.

Figure 25F:
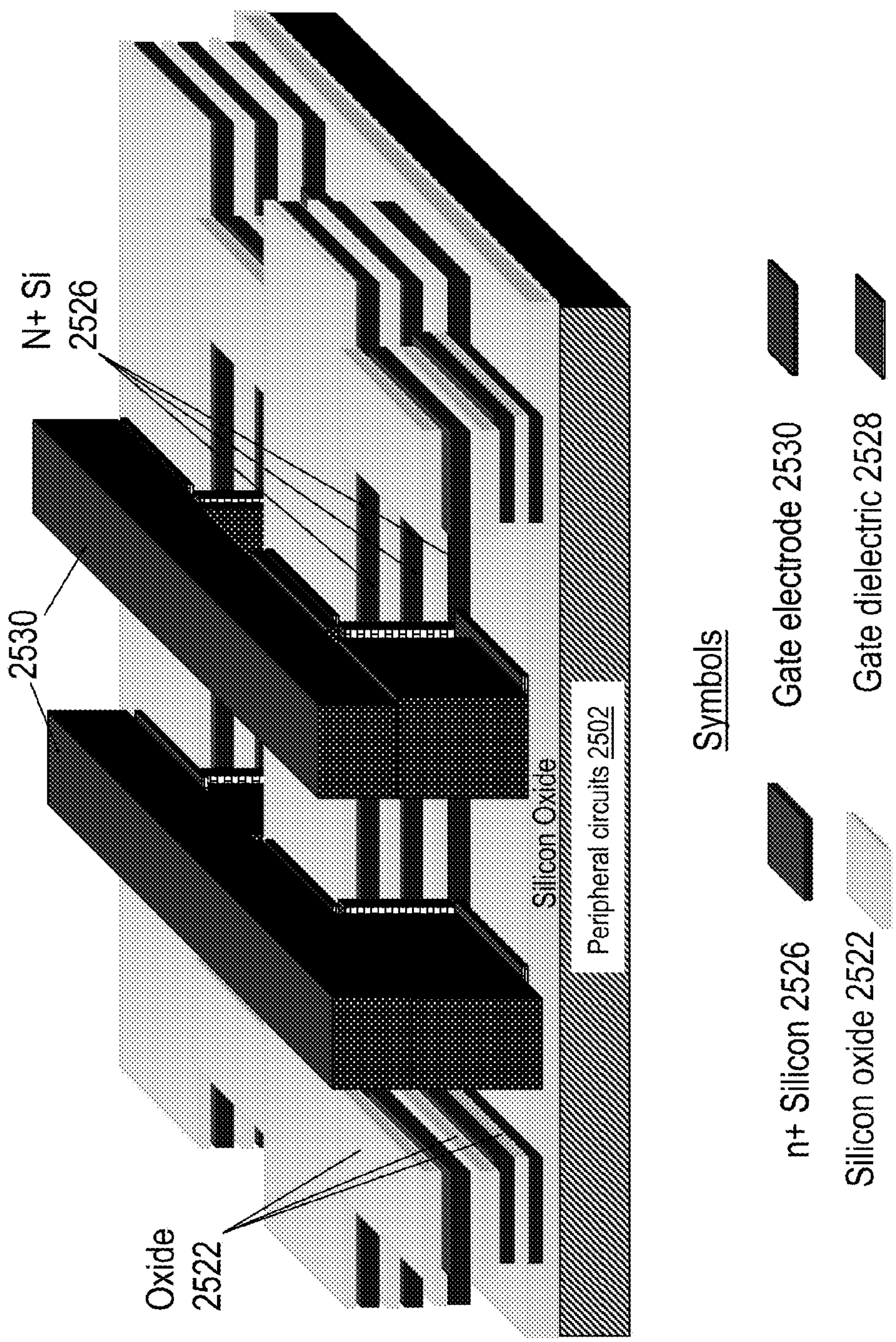

As illustrated in FIG. 25F, a gate dielectric and gate electrode material may be deposited, planarized with a chemical mechanical polish (CMP), and then lithographically defined and plasma/RIE etched to form gate dielectric regions 2528 which may either be self aligned to and substantially covered by gate electrodes 2530 (shown), or substantially cover the entire N+ silicon 2526 and oxide 2522 multi-layer structure. The gate stack comprised of gate electrode 2530 and gate dielectric 2528 may be formed with a gate dielectric, such as, for example, thermal oxide, and a gate electrode material, such as, for example, poly-crystalline silicon. Alternatively, the gate dielectric may be an atomic layer deposited (ALD) material that is paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 25G:
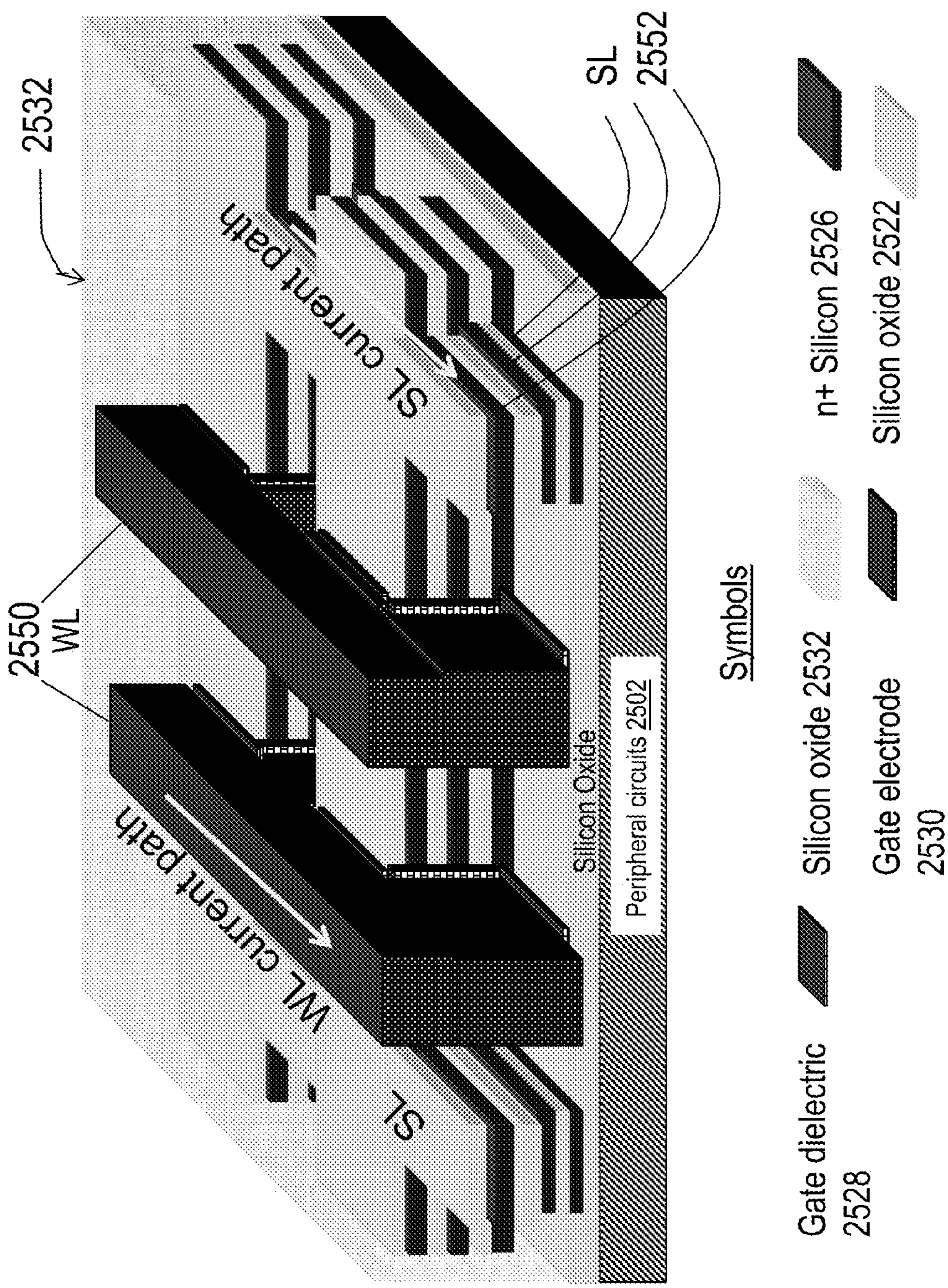

As illustrated in FIG. 25G, the entire structure may be substantially covered with a gap fill oxide 2532, which may be planarized with chemical mechanical polishing. The oxide 2532 is shown transparent in the figure for clarity. Word-line regions (WL) 2550, coupled with and composed of gate electrodes 2530, and source-line regions (SL) 2552, composed of N+ silicon regions 2526, are shown.

Figure 25H:
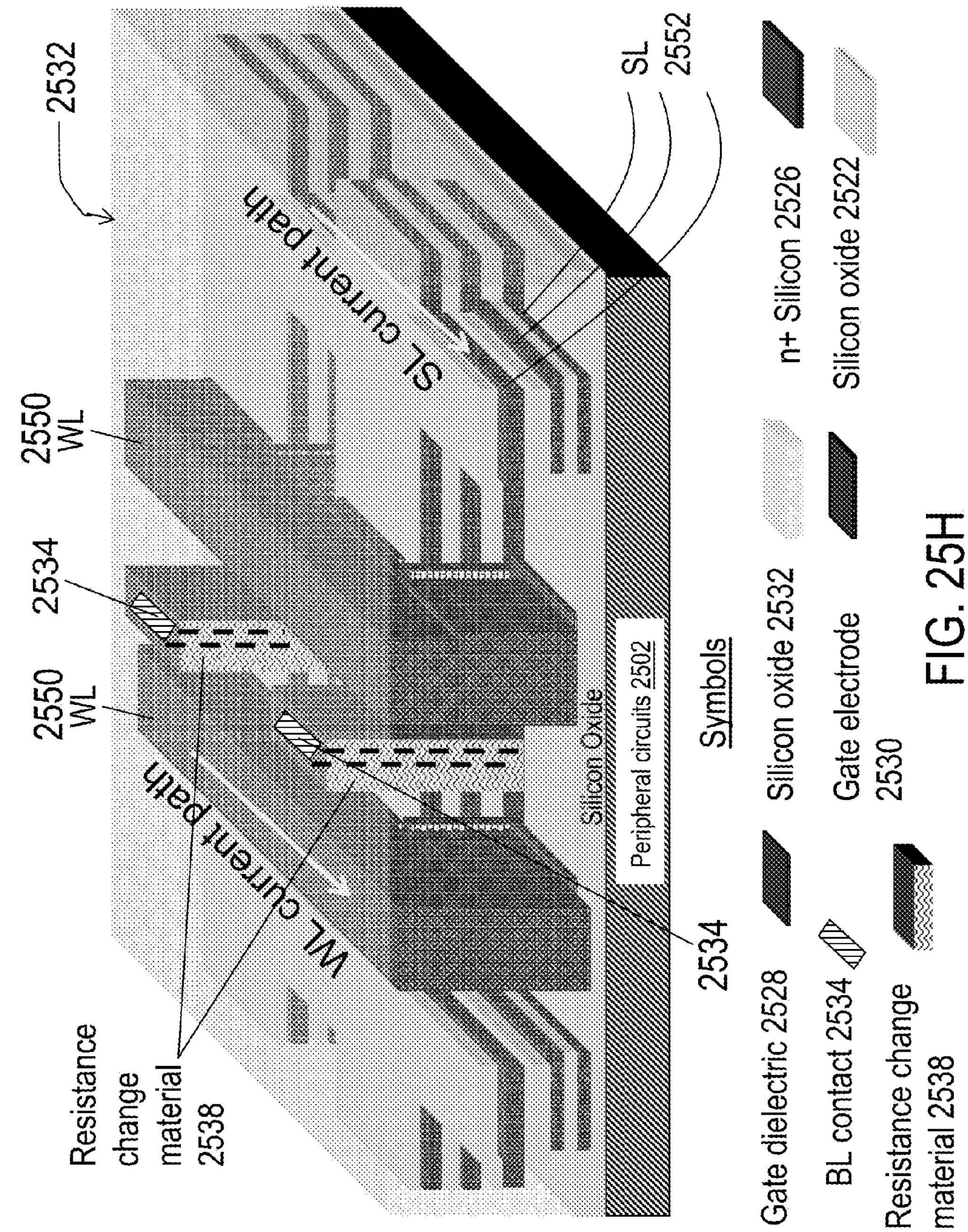

As illustrated in FIG. 25H, bit-line (BL) contacts 2534 may be lithographically defined, etched with plasma/RIE through oxide 2532, the three N+ silicon regions 2526, and associated oxide vertical isolation regions to connect substantially all memory layers vertically, and photoresist removed. Resistance change memory material 2538, such as, for example, hafnium oxide, may then be deposited, preferably with atomic layer deposition (ALD). The electrode for the resistance change memory element may then be deposited by ALD to form the electrode/BL contact 2534. The excess deposited material may be polished to planarity at or below the top of oxide 2532. Each BL contact 2534 with resistive change material 2538 may be shared among substantially all layers of memory, shown as three layers of memory in FIG. 25H.

Figure 25I:
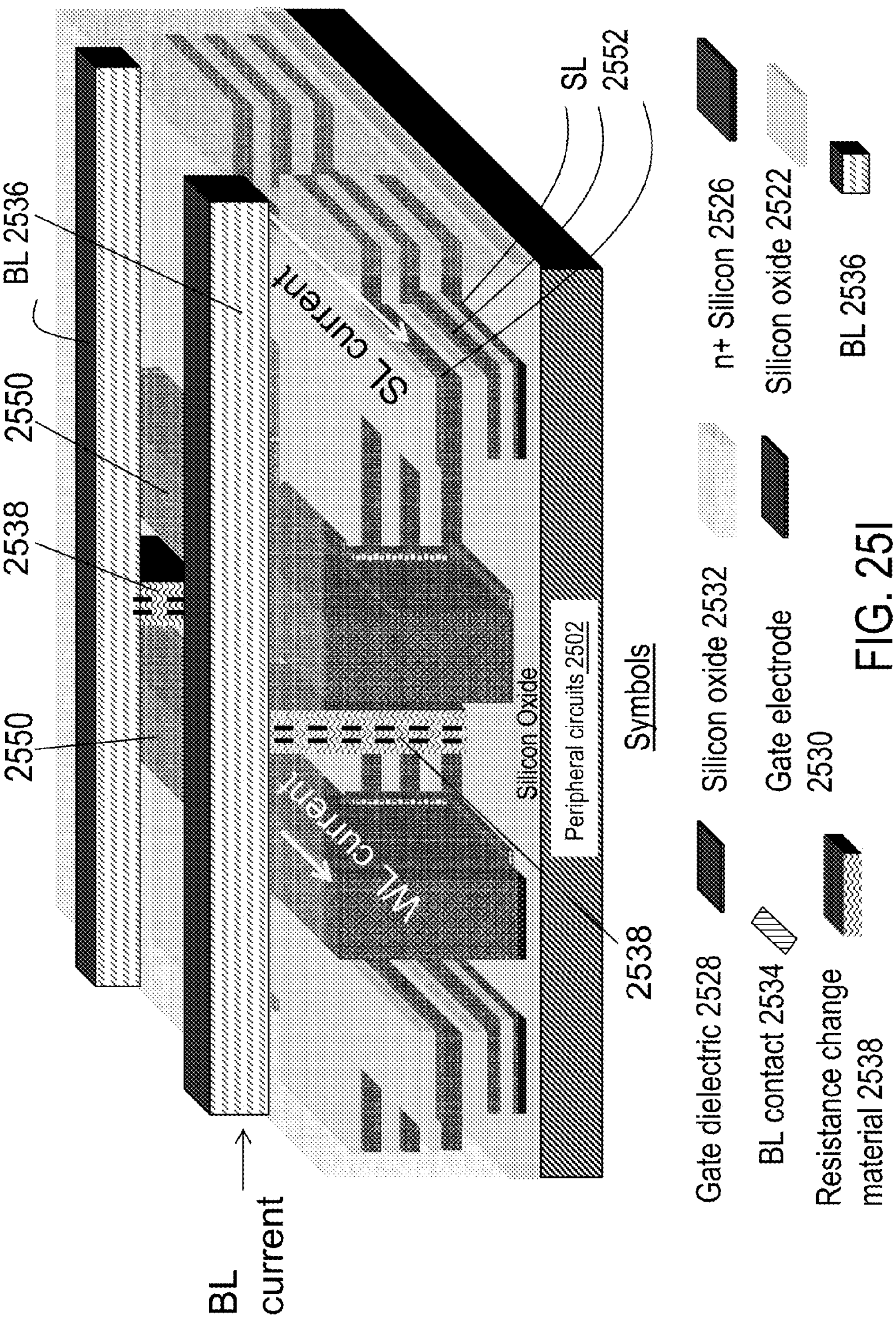

As illustrated in FIG. 25I, BL metal lines 2536 may be formed and connect to the associated BL contacts 2534 with resistive change material 2538. Contacts and associated metal interconnect lines (not shown) may be formed for the WL and SL at the memory array edges. A thru layer via 2560 (not shown) may be formed to electrically couple the BL, SL, and WL metallization to the acceptor substrate 2514 peripheral circuitry via an acceptor wafer metal connect pad 2580 (not shown).

Figure 25J:
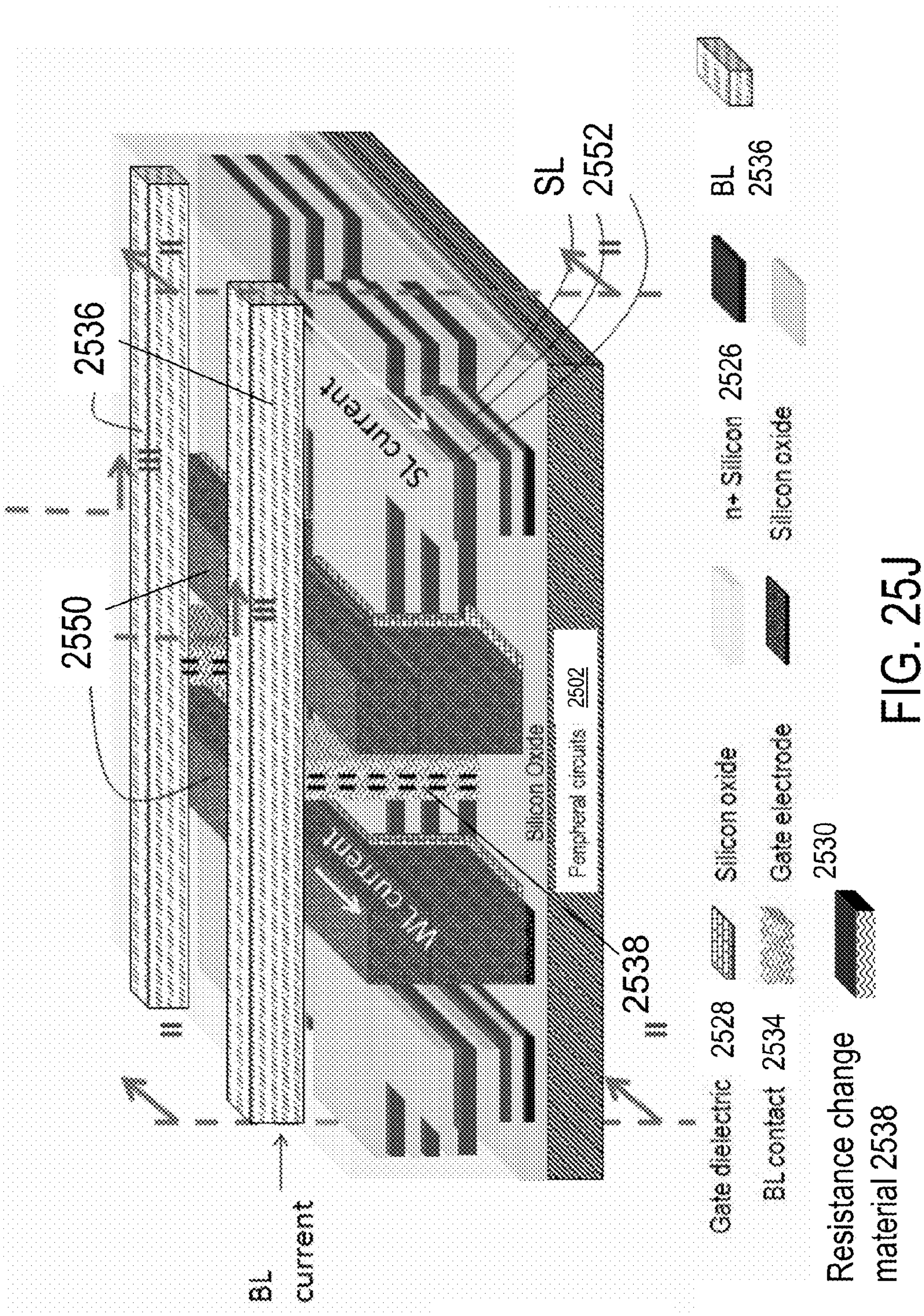
Figure 25K:
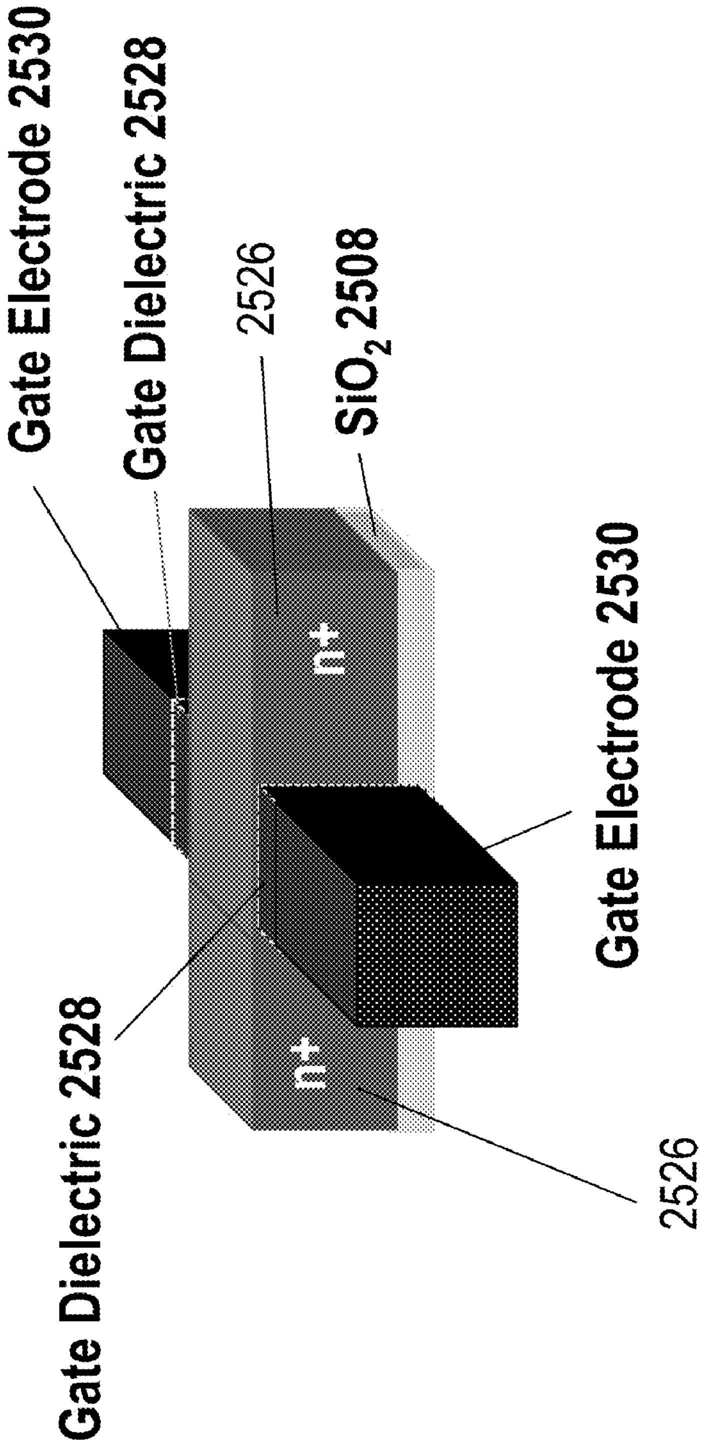

As illustrated in FIG. 25J, 25J1 and 25J2, cross section cut II of FIG. 25J is shown in FIG. 25J1, and cross section cut III of FIG. 25J is shown in FIG. 25J2. BL metal line 2536, oxide 2532, BL contact/electrode 2534, resistive change material 2538, WL regions 2550, gate dielectric 2528, N+ silicon regions 2526, and peripheral circuits substrate 2502 are shown in FIG. 25K1. The BL contact/electrode 2534 couples to one side of the three levels of resistive change material 2538. The other side of the resistive change material 2538 is coupled to N+ regions 2526. BL metal lines 2536, oxide 2532, gate electrode 2530, gate dielectric 2528, N+ silicon regions 2526, interlayer oxide region ('ox'), and peripheral circuits substrate 2502 are shown in FIG. 25K2. The gate electrode 2530 is common to substantially all six N+ silicon regions 2526 and forms six two-sided gated junction-less transistors as memory select transistors.

As illustrated in FIG. 25K, a single exemplary two-sided gated junction-less transistor on the first Si/SiO2 layer 2523 may be comprised of N+ silicon region 2526 (functioning as the source, drain, and transistor channel), and two gate electrodes 2530 with associated gate dielectrics 2528. The transistor is electrically isolated from beneath by oxide layer 2508.

This flow enables the formation of a resistance-based multi-layer or 3D memory array with zero additional masking steps per memory layer, which utilizes junction-less transistors and has a resistance-based memory element in series with a select transistor, and is constructed by layer transfers of wafer sized doped mono-crystalline silicon layers, and this 3D memory array may be connected to an underlying multi-metal layer semiconductor device.

Persons of ordinary skill in the art will appreciate that the illustrations in FIGS. 25A through 25K are exemplary only and are not drawn to scale. Such skilled persons will further appreciate that many variations are possible such as, for example, the transistors may be of another type such as RCATs. Additionally, doping of each N+ layer may be slightly different to compensate for interconnect resistances. Moreover, the stacked memory layer may be connected to a periphery circuit that is above the memory stack. Further, each gate of the double gate 3D resistance based memory can be independently controlled for better control of the memory cell. Many other modifications within the scope of the invention will suggest themselves to such skilled persons after reading this specification. Thus the invention is to be limited only by the appended claims.

As illustrated in FIGS. 26A to 26L, a resistance-based 3D memory may be constructed with zero additional masking steps per memory layer, which is suitable for 3D IC manufacturing. This 3D memory utilizes double gated MOSFET transistors and has a resistance-based memory element in series with a select transistor.

Figure 26A:
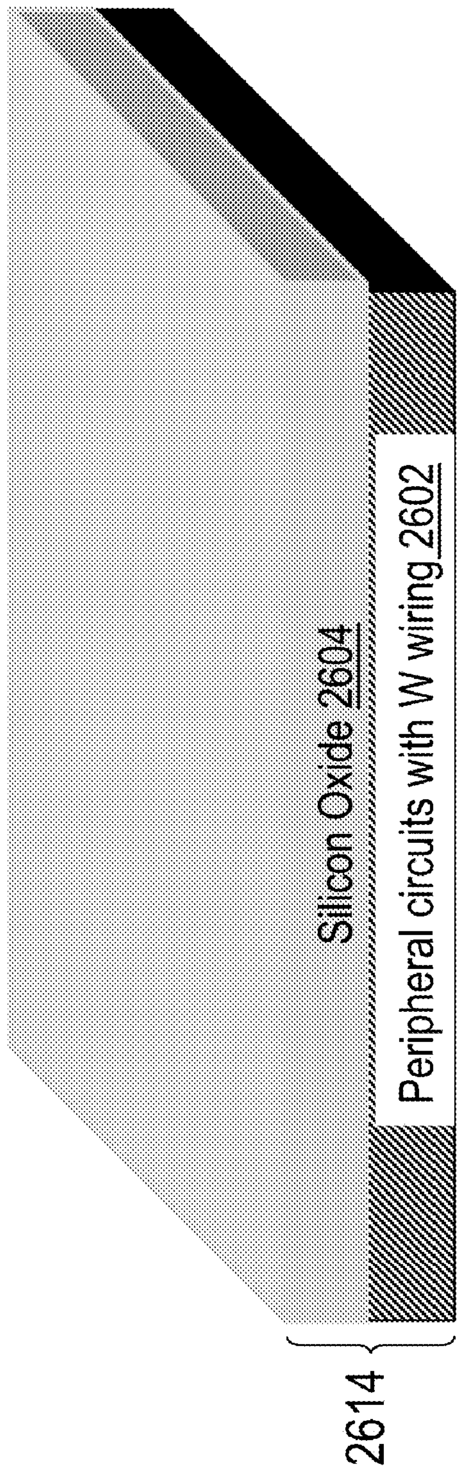
FIGS. 26A-L are exemplary drawing illustrations of the formation of a resistive memory transistor.

As illustrated in FIG. 26A, a silicon substrate with peripheral circuitry 2602 may be constructed with high temperature (greater than approximately 400° C.) resistant wiring, such as, for example, Tungsten. The peripheral circuitry substrate 2602 may comprise memory control circuits as well as circuitry for other purposes and of various types, such as, for example, analog, digital, RF, or memory. The peripheral circuitry substrate 2602 may comprise peripheral circuits that can withstand an additional rapid-thermal-anneal (RTA) and still remain operational and retain good performance. For this purpose, the peripheral circuits may be formed such that they have not been subject to a weak RTA or no RTA for activating dopants. The top surface of the peripheral circuitry substrate 2602 may be prepared for oxide wafer bonding with a deposition of a silicon oxide 2604, thus forming acceptor wafer 2614.

Figure 26B:
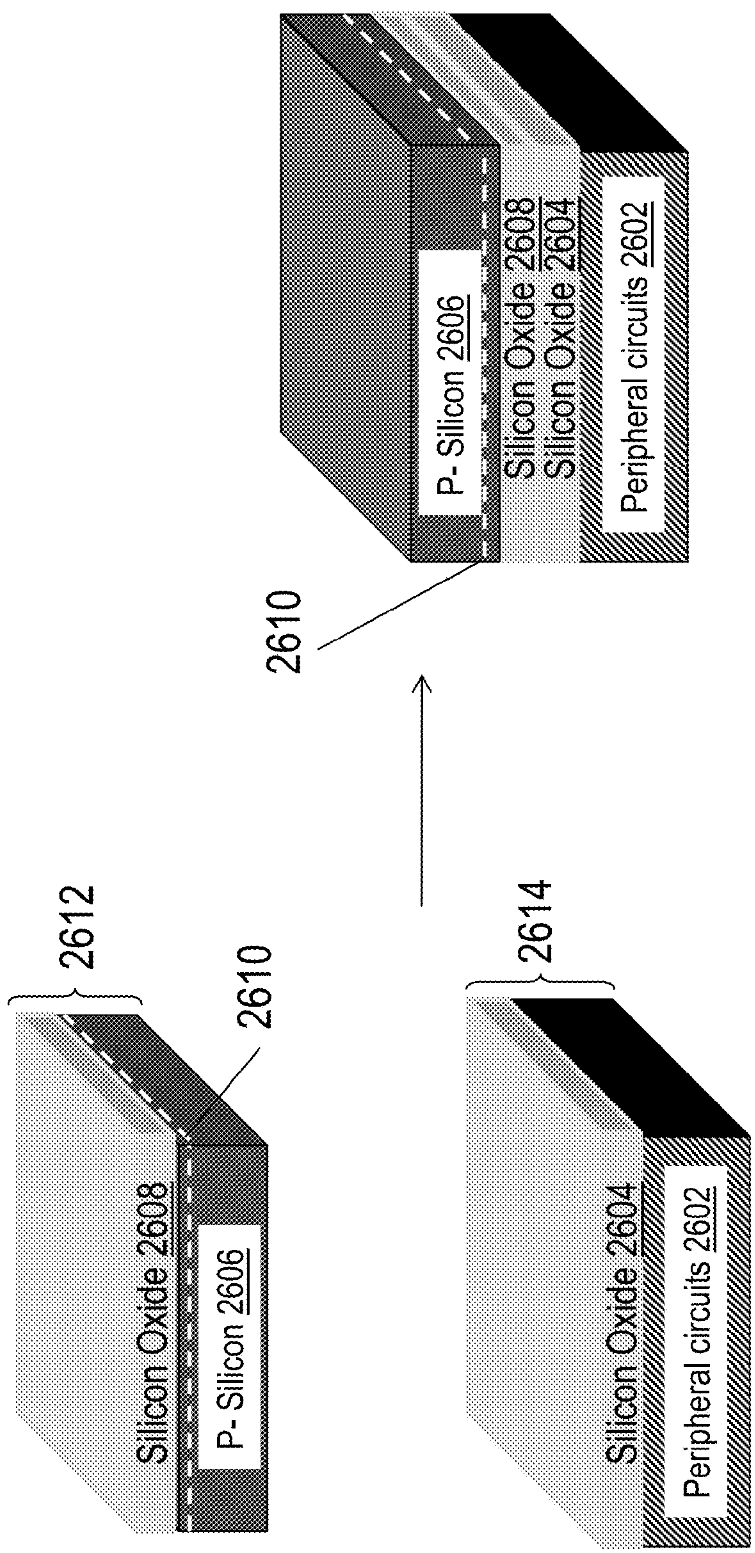

As illustrated in FIG. 26B, a mono-crystalline silicon donor wafer 2612 may be optionally processed to comprise a wafer sized layer of P− doping (not shown) which may have a different dopant concentration than the P− substrate 2606. The P− doping layer may be formed by ion implantation and thermal anneal. A screen oxide 2608 may be grown or deposited prior to the implant to protect the silicon from implant contamination and to provide an oxide surface for later wafer to wafer bonding. A layer transfer demarcation plane 2610 (shown as a dashed line) may be formed in donor wafer 2612 within the P− substrate 2606 or the P− doping layer (not shown) by hydrogen implantation or other methods as previously described. Both the donor wafer 2612 and acceptor wafer 2614 may be prepared for wafer bonding as previously described and then bonded at the surfaces of oxide layer 2604 and oxide layer 2608, at a low temperature (less than approximately 400° C.) preferred for lowest stresses, or a moderate temperature (less than approximately 900° C.).

Figure 26C:
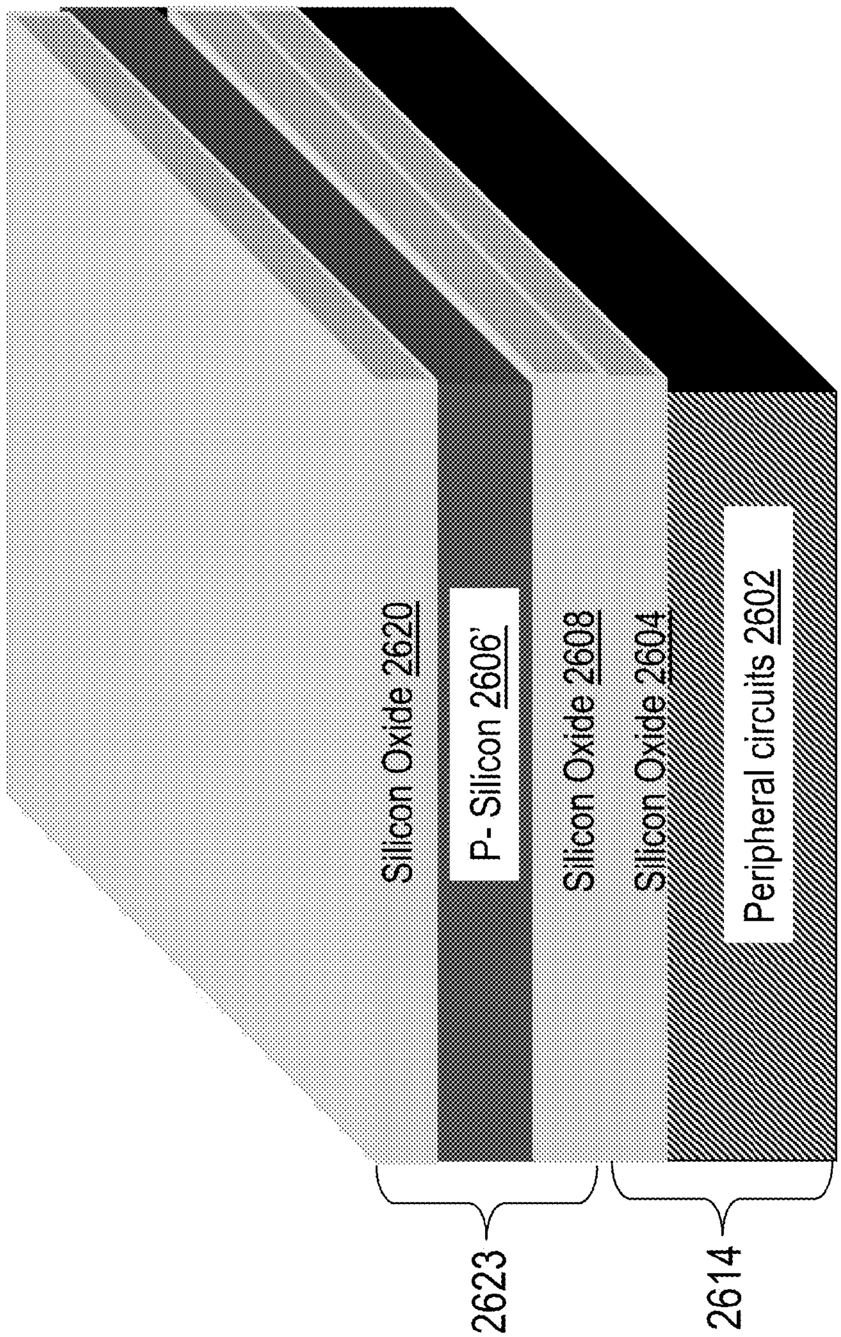

As illustrated in FIG. 26C, the portion of the P− layer (not shown) and the P− wafer substrate 2606 that are above the layer transfer demarcation plane 2610 may be removed by cleaving and polishing, or other processes as previously described, such as, for example, ion-cut or other methods, thus forming the remaining mono-crystalline silicon P− layer 2606'. Remaining P− layer 2606' and oxide layer 2608 have been layer transferred to acceptor wafer 2614. The top surface of P− layer 2606' may be chemically or mechanically polished smooth and flat. Now transistors or portions of transistors may be formed and aligned to the acceptor wafer 2614 alignment marks (not shown). Oxide layer 2620 may be deposited to prepare the surface for later oxide to oxide bonding. This now forms the first Si/SiO2 layer 2623 which includes silicon oxide layer 2620, P− silicon layer 2606', and oxide layer 2608.

Figure 26D:
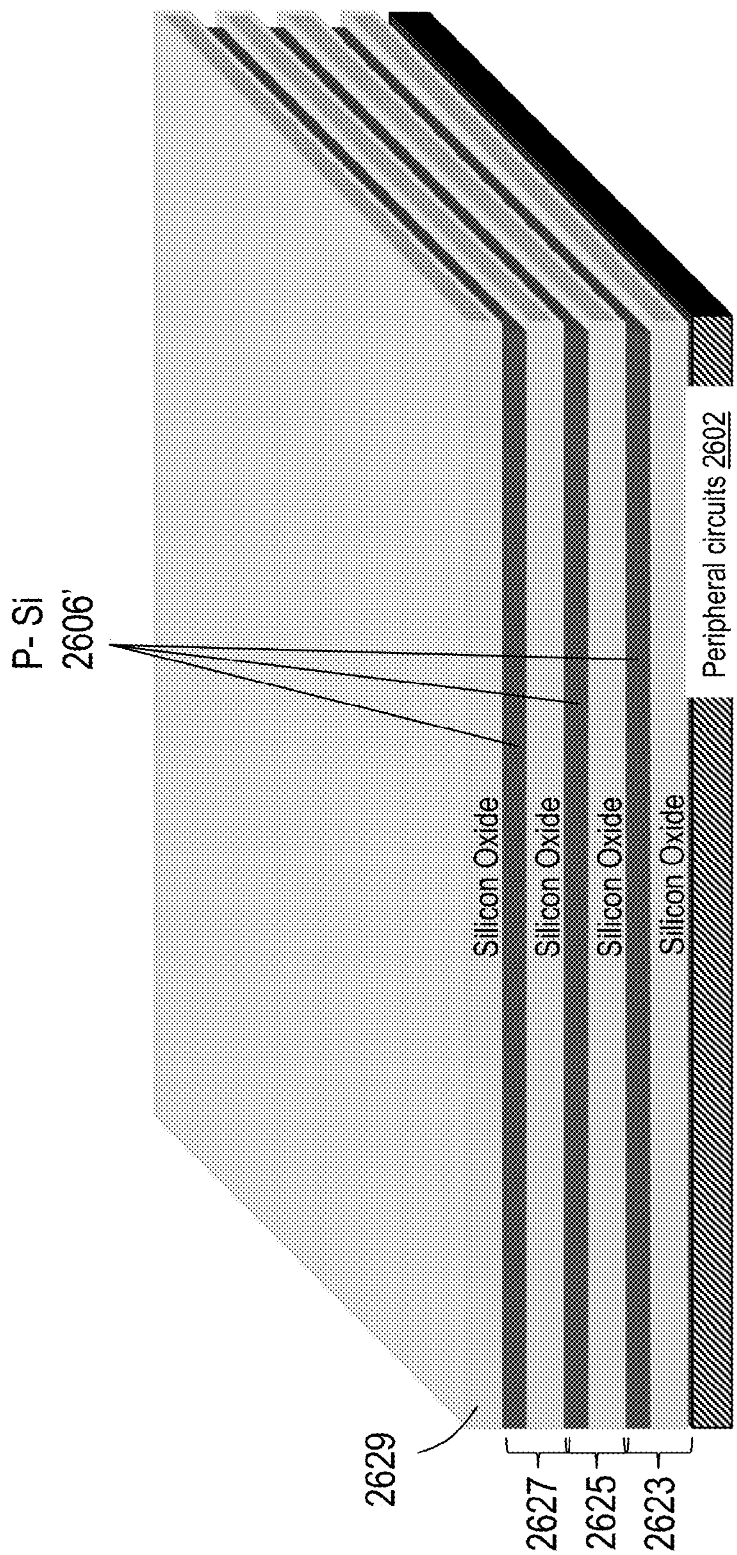

As illustrated in FIG. 26D, additional Si/SiO2 layers, such as, for example, second Si/SiO2 layer 2625 and third Si/SiO2 layer 2627, may each be formed as described in FIGS. 26A to 26C. Oxide layer 2629 may be deposited to electrically isolate the top silicon layer.

Figure 26E:
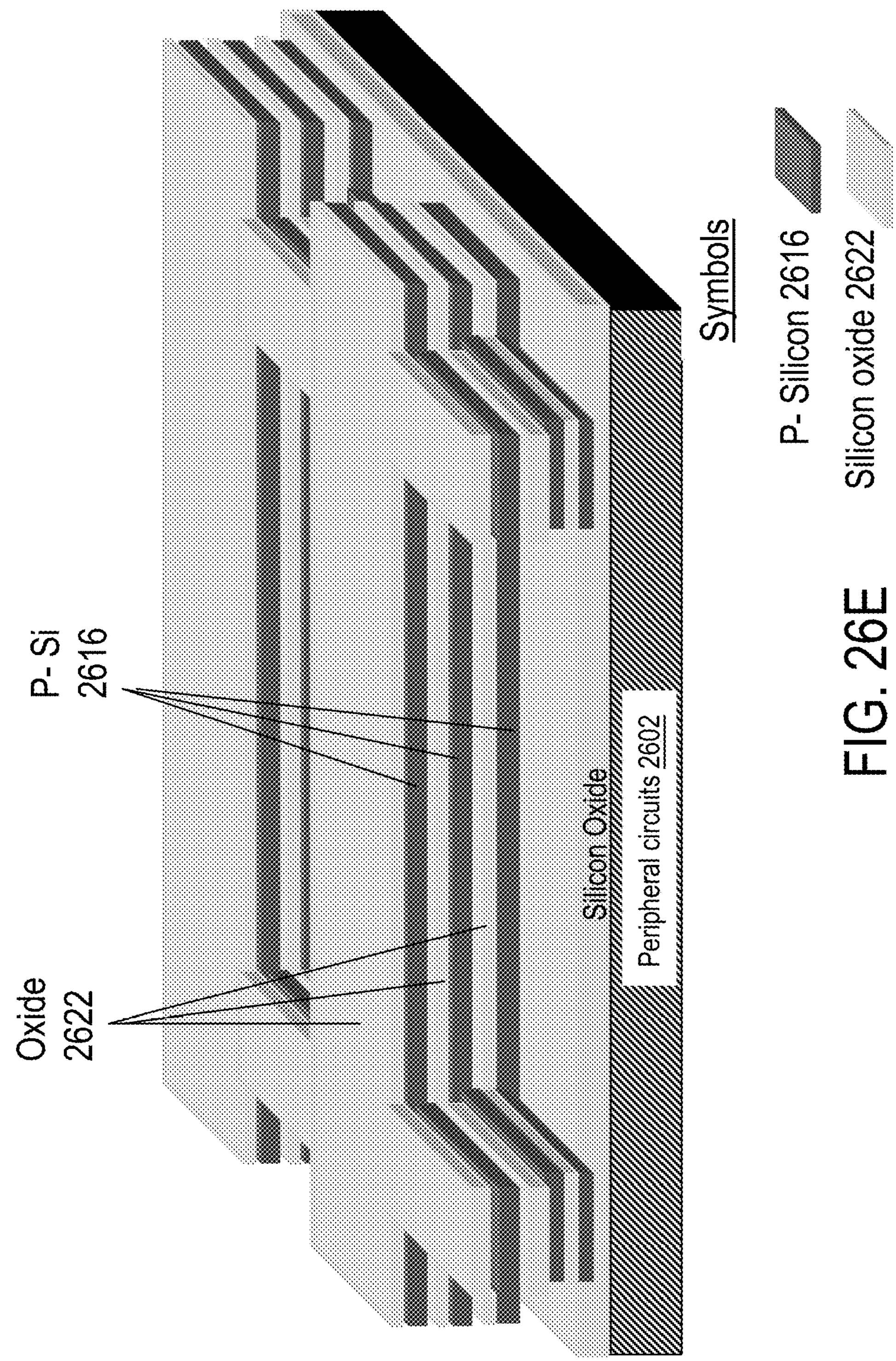

As illustrated in FIG. 26E, oxide 2629, third Si/SiO2 layer 2627, second Si/SiO2 layer 2625 and first Si/SiO2 layer 2623 may be lithographically defined and plasma/RIE etched to form a portion of the memory cell structure, which now comprises regions of P− silicon 2616 and oxide 2622.

Figure 26F:
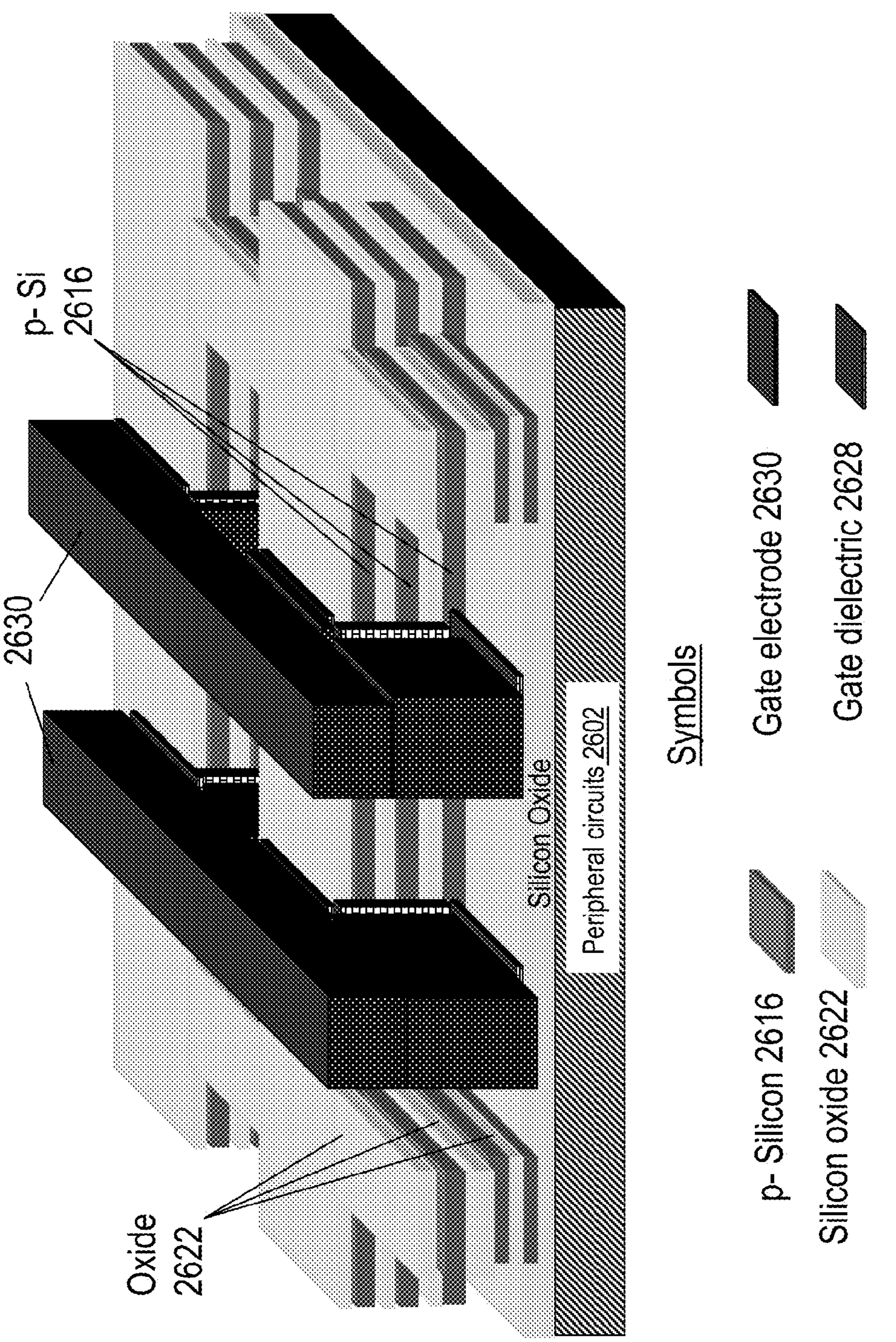

As illustrated in FIG. 26F, a gate dielectric and gate electrode material may be deposited, planarized with a chemical mechanical polish (CMP), and then lithographically defined and plasma/RIE etched to form gate dielectric regions 2628 which may either be self aligned to and substantially covered by gate electrodes 2630 (shown), or may substantially cover the entire silicon/oxide multi-layer structure. The gate stack comprised of gate electrode 2630 and gate dielectric 2628 may be formed with a gate dielectric, such as, for example, thermal oxide, and a gate electrode material, such as, for example, polycrystalline silicon. Alternatively, the gate dielectric may be an atomic layer deposited (ALD) material that is paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 26G:
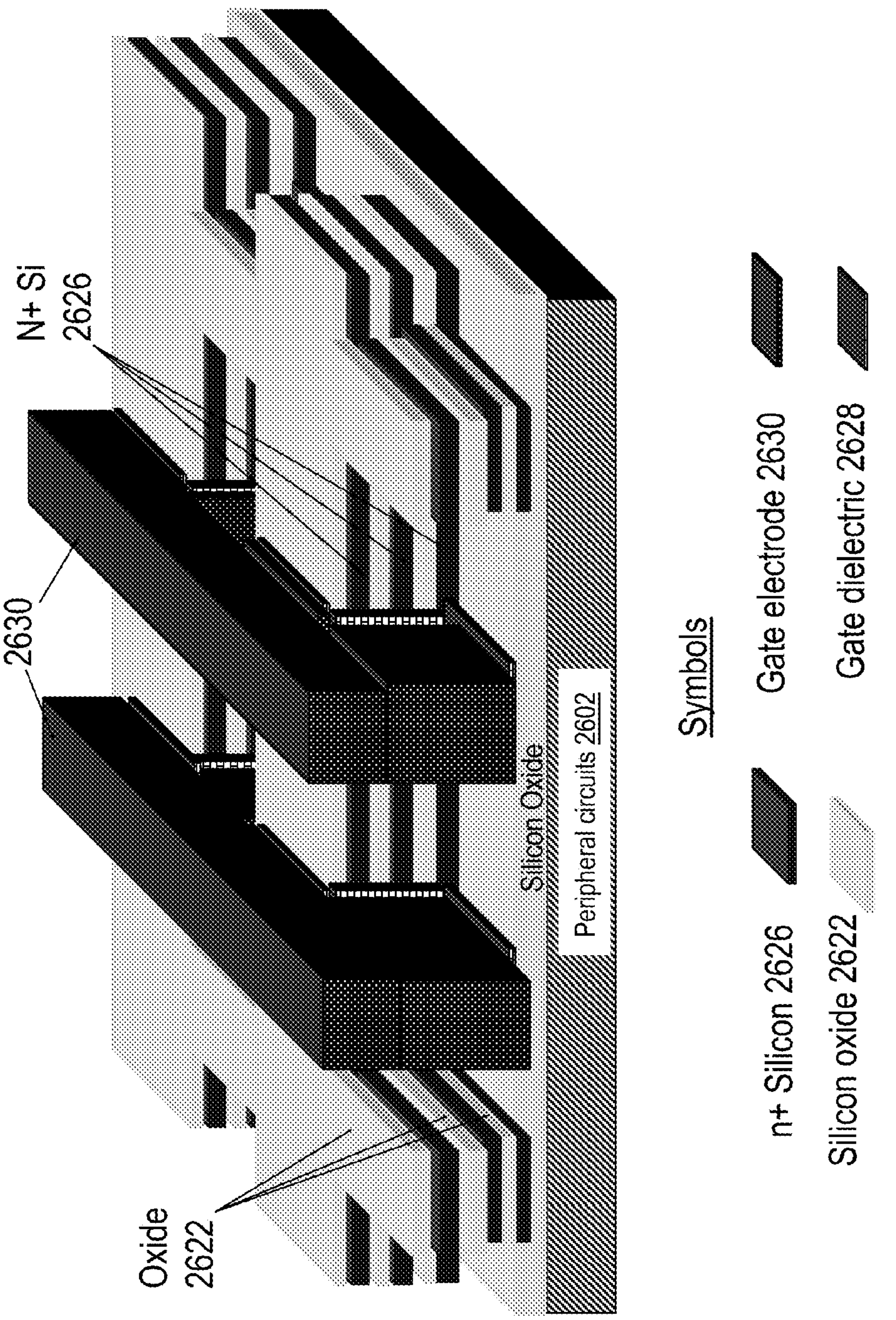

As illustrated in FIG. 26G, N+ silicon regions 2626 may be formed in a self aligned manner to the gate electrodes 2630 by ion implantation of an N type species, such as, for example, Arsenic, into the regions of P− silicon 2616 that are not blocked by the gate electrodes 2630. This also forms remaining regions of P− silicon 2617 (not shown) in the gate electrode 2630 blocked areas. Different implant energies or angles, or multiples of each, may be utilized to place the N type species into each layer of P− silicon regions 2616. Spacers (not shown) may be utilized during this multi-step implantation process and layers of silicon present in different layers of the stack may have different spacer widths to account for the differing lateral straggle of N type species implants. Bottom layers, such as, for example, 2623, could have larger spacer widths than top layers, such as, for example, 2627. Alternatively, angular ion implantation with substrate rotation may be utilized to compensate for the differing implant straggle. The top layer implantation may have a steeper angle than perpendicular to the wafer surface and hence land ions slightly underneath the gate electrode 2630 edges and closely match a more perpendicular lower layer implantation which may land ions slightly underneath the gate electrode 2630 edge due to the straggle effects of the greater implant energy necessary to reach the lower layer. A rapid thermal anneal (RTA) may be conducted to activate the dopants in substantially all of the memory layers 2623, 2625, 2627 and in the peripheral circuits 2602. Alternatively, optical anneals, such as, for example, a laser based anneal, may be performed.

Figure 26H:
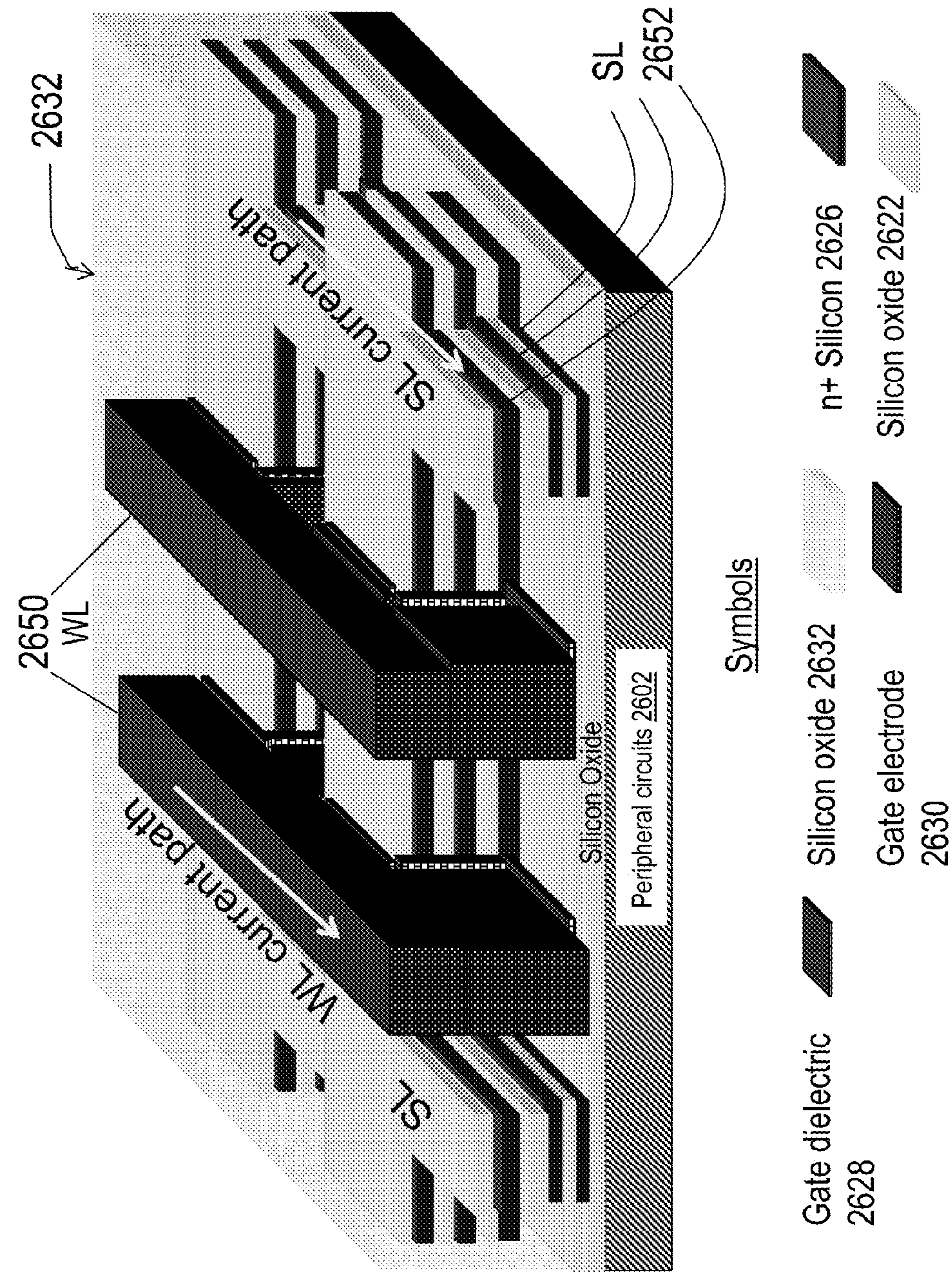

As illustrated in FIG. 26H, the entire structure may be substantially covered with a gap fill oxide 2632, which may be planarized with chemical mechanical polishing. The oxide 2632 is shown transparent in the figure for clarity. Word-line regions (WL) 2650, coupled with and composed of gate electrodes 2630, and source-line regions (SL) 2652, composed of indicated N+ silicon regions 2626, are shown.

Figure 26I:
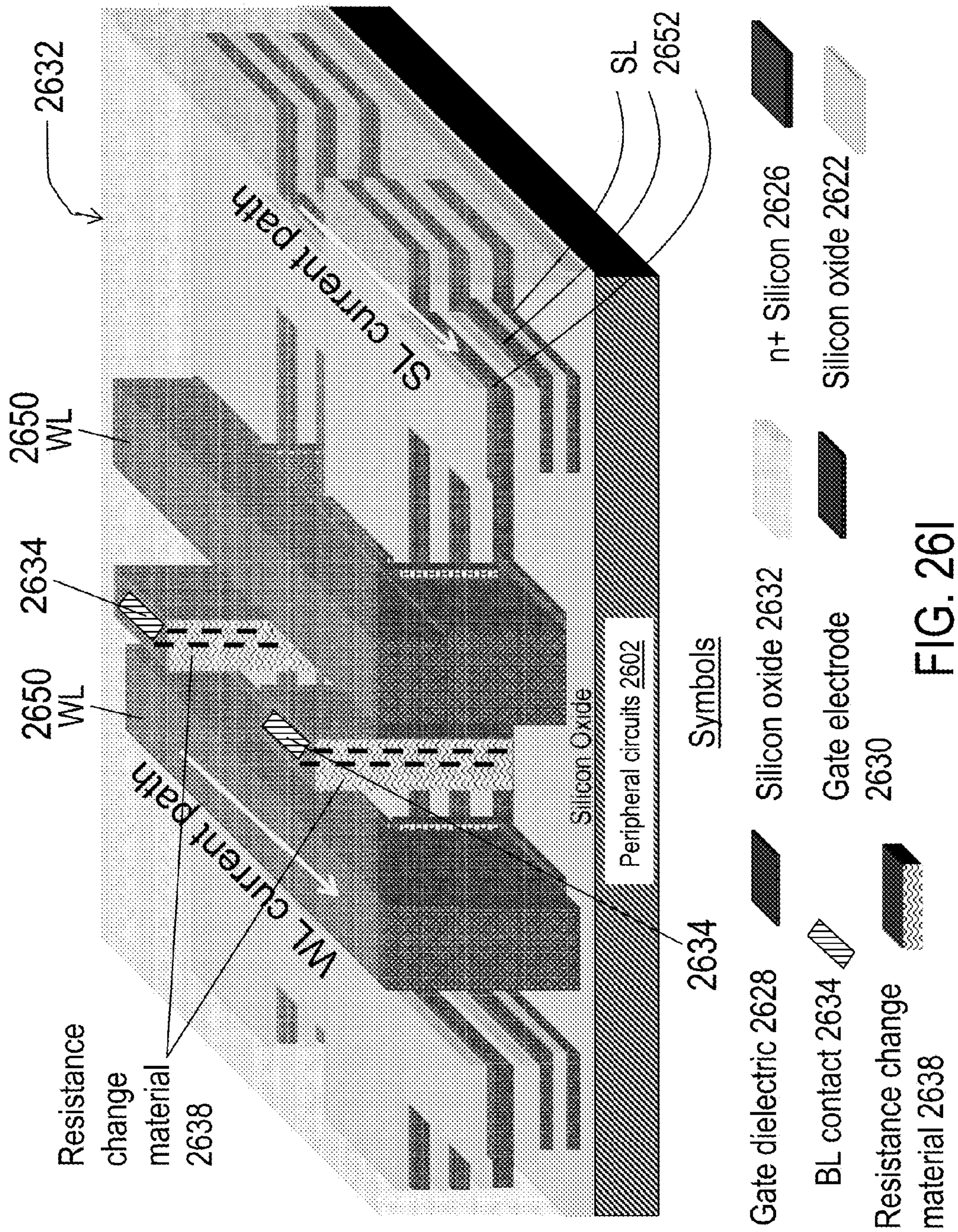

As illustrated in FIG. 26I, bit-line (BL) contacts 2634 may be lithographically defined, etched with plasma/RIE through oxide 2632, the three N+ silicon regions 2626, and associated oxide vertical isolation regions to connect substantially all memory layers vertically, and photoresist removed. Resistance change memory material 2638, such as, for example, hafnium oxide, may then be deposited, preferably with atomic layer deposition (ALD). The electrode for the resistance change memory element may then be deposited by ALD to form the electrode/BL contact 2634. The excess deposited material may be polished to planarity at or below the top of oxide 2632. Each BL contact 2634 with resistive change material 2638 may be shared among substantially all layers of memory, shown as three layers of memory in FIG. 26I.

Figure 26J:
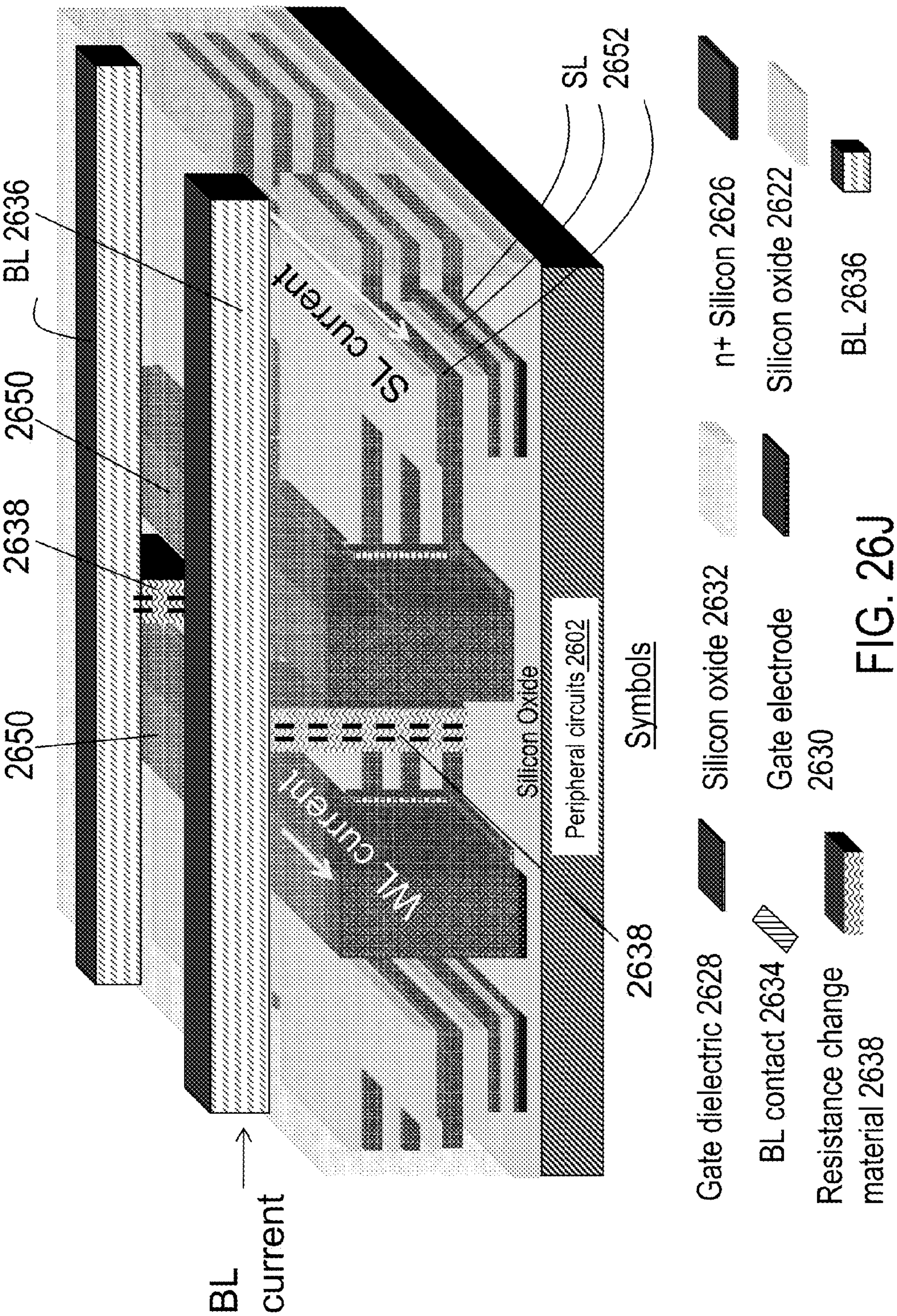

As illustrated in FIG. 26J, BL metal lines 2636 may be formed and connect to the associated BL contacts 2634 with resistive change material 2638. Contacts and associated metal interconnect lines (not shown) may be formed for the WL and SL at the memory array edges. A thru layer via 2660 (not shown) may be formed to electrically couple the BL, SL, and WL metallization to the acceptor substrate 2614 peripheral circuitry via an acceptor wafer metal connect pad 2680 (not shown).

Figure 26K:
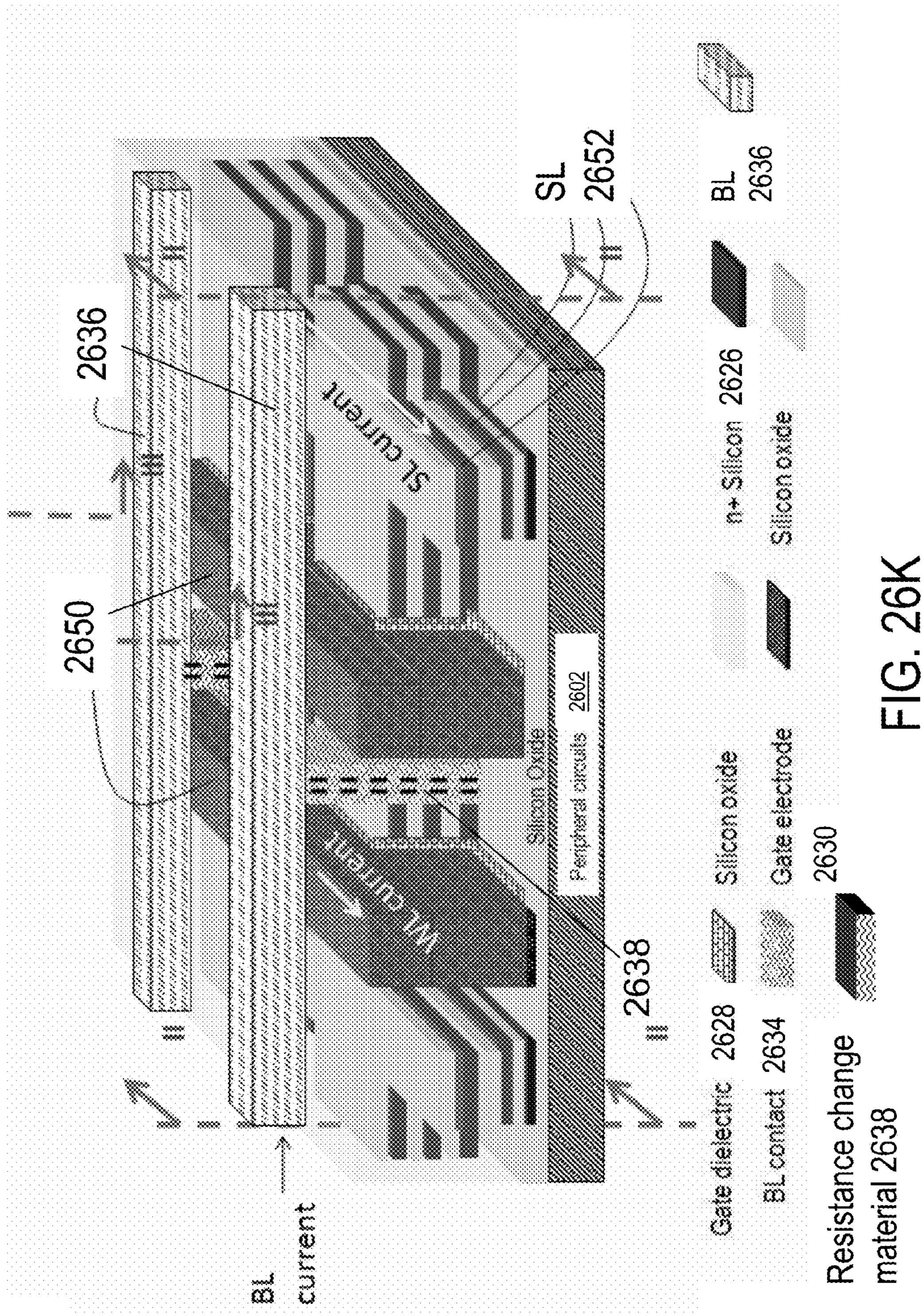

As illustrated in FIG. 26K, 26K1 and 26K2, cross section cut II of FIG. 26K is shown in FIG. 26K1, and cross section cut III of FIG. 26K is shown in FIG. 26K2. BL metal line 2636, oxide 2632, BL contact/electrode 2634, resistive change material 2638, WL regions 2650, gate dielectric 2628, P− silicon regions 2617, N+ silicon regions 2626, and peripheral circuits substrate 2602 are shown in FIG. 26K1. The BL contact/electrode 2634 couples to one side of the three levels of resistive change material 2638. The other side of the resistive change material 2638 is coupled to N+ silicon regions 2626. The P− regions 2617 with associated N+ regions 2626 on each side form the source, channel, and drain of the select transistor. BL metal lines 2636, oxide 2632, gate electrode 2630, gate dielectric 2628, P− silicon regions 2617, interlayer oxide regions (‘ox’), and peripheral circuits substrate 2602 are shown in FIG. 26K2. The gate electrode 2630 is common to substantially all six P− silicon regions 2617 and controls the six double gated MOSFET select transistors.

Figure 26L:
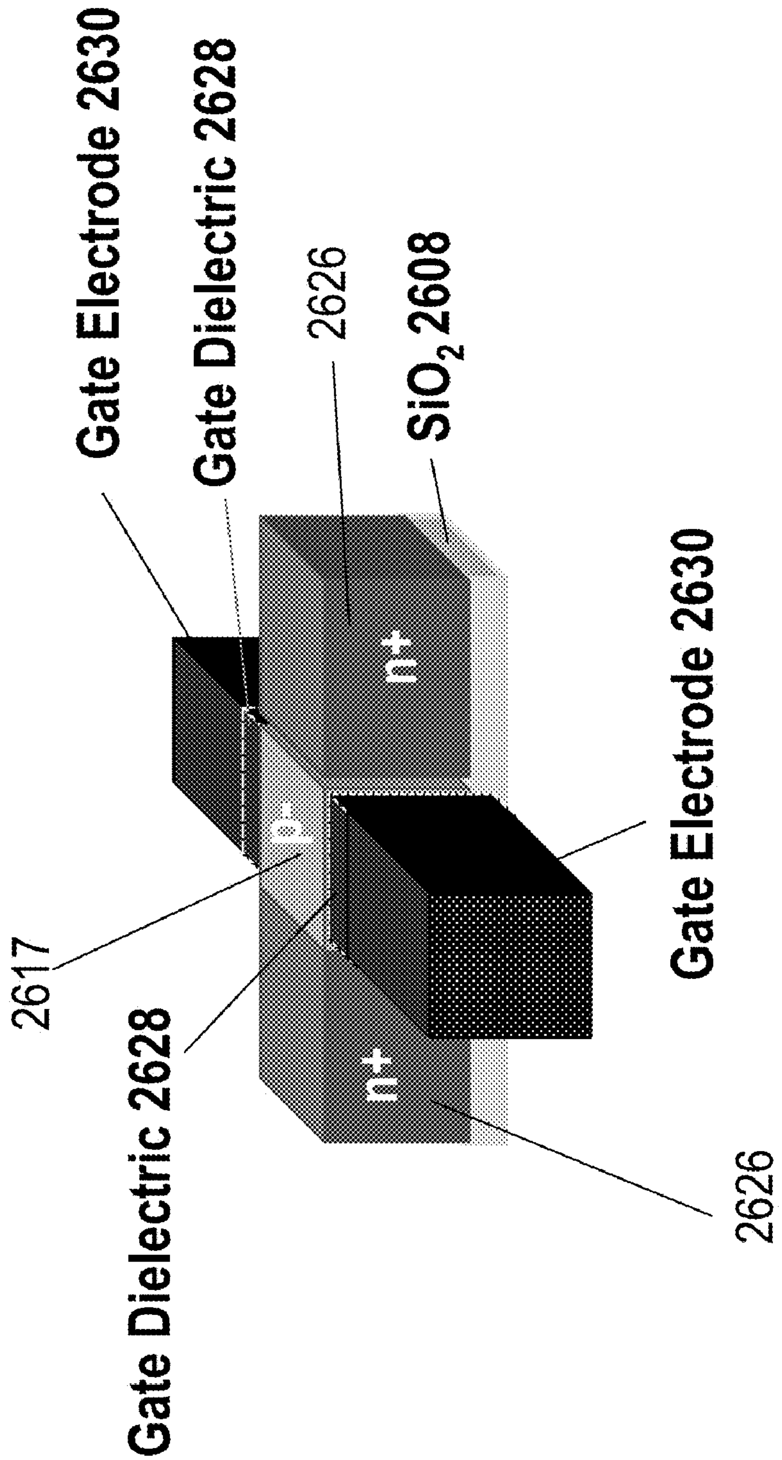

As illustrated in FIG. 26L, a single exemplary double gated MOSFET select transistor on the first Si/SiO2 layer 2623 may be comprised of P− silicon region 2617 (functioning as the transistor channel), N+ silicon regions 2626 (functioning as source and drain), and two gate electrodes 2630 with associated gate dielectrics 2628. The transistor is electrically isolated from beneath by oxide layer 2608.

The above flow enables the formation of a resistance-based 3D memory with zero additional masking steps per memory layer constructed by layer transfers of wafer sized doped mono-crystalline silicon layers and may be connected to an underlying multi-metal layer semiconductor device.

Persons of ordinary skill in the art will appreciate that the illustrations in FIGS. 26A through 26L are exemplary only and are not drawn to scale. Such skilled persons will further appreciate that many variations are possible such as, for example, the transistors may be of another type such as RCATs. The MOSFET selectors may utilize lightly doped drain and halo implants for channel engineering. Additionally, the contacts may utilize doped poly-crystalline silicon, or other conductive materials. Moreover, the stacked memory layer may be connected to a periphery circuit that is above the memory stack. Further, each gate of the double gate 3D DRAM can be independently controlled for better control of the memory cell. Many other modifications within the scope of the invention will suggest themselves to such skilled persons after reading this specification. Thus the invention is to be limited only by the appended claims.

As illustrated in FIGS. 27A to 27M, a resistance-based 3D memory with one additional masking step per memory layer may be constructed that is suitable for 3D IC manufacturing. This 3D memory utilizes double gated MOSFET select transistors and has a resistance-based memory element in series with the select transistor.

Figure 27A:
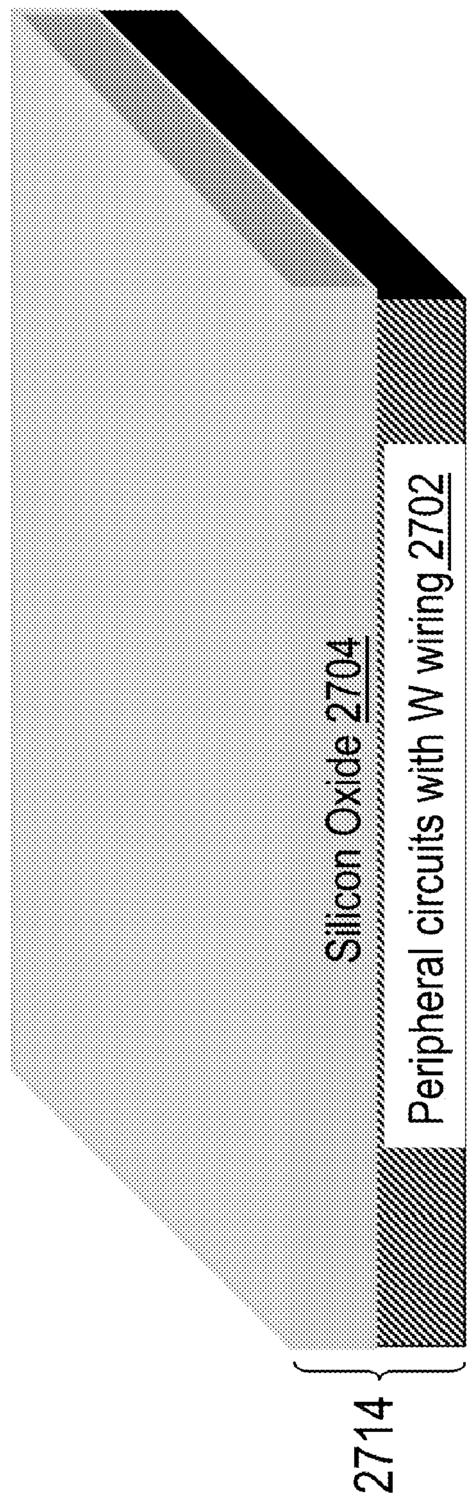
FIGS. 27A-M are exemplary drawing illustrations of the formation of a resistive memory transistor.

As illustrated in FIG. 27A, a silicon substrate with peripheral circuitry 2702 may be constructed with high temperature (greater than approximately 400° C.) resistant wiring, such as, for example, Tungsten. The peripheral circuitry substrate 2702 may comprise memory control circuits as well as circuitry for other purposes and of various types, such as, for example, analog, digital, RF, or memory. The peripheral circuitry substrate 2702 may comprise circuits that can withstand an additional rapid-thermal-anneal (RTA) and still remain operational and retain good performance. For this purpose, the peripheral circuits may be formed such that they have not been subject to a weak RTA or no RTA for activating dopants. The top surface of the peripheral circuitry substrate 2702 may be prepared for oxide wafer bonding with a deposition of a silicon oxide 2704, thus forming acceptor wafer 2414.

Figure 27B:
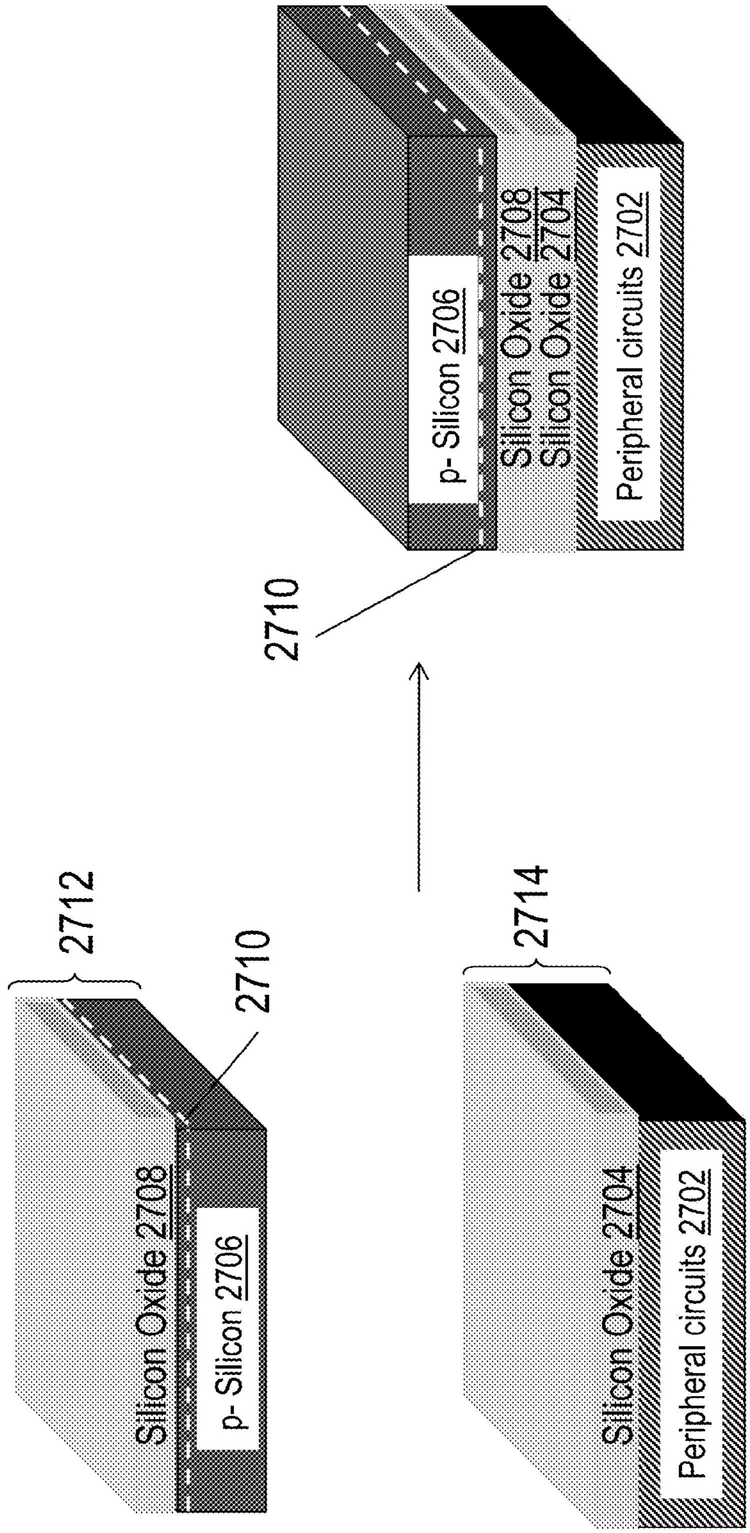

As illustrated in FIG. 27B, a mono-crystalline silicon donor wafer 2712 may be optionally processed to comprise a wafer sized layer of P− doping (not shown) which may have a different dopant concentration than the P− substrate 2706. The P− doping layer may be formed by ion implantation and thermal anneal. A screen oxide 2708 may be grown or deposited prior to the implant to protect the silicon from implant contamination and to provide an oxide surface for later wafer to wafer bonding. A layer transfer demarcation plane 2710 (shown as a dashed line) may be formed in donor wafer 2712 within the P− substrate 2706 or the P− doping layer (not shown) by hydrogen implantation or other methods as previously described. Both the donor wafer 2712 and acceptor wafer 2714 may be prepared for wafer bonding as previously described and then bonded at the surfaces of oxide layer 2704 and oxide layer 2708, at a low temperature (less than approximately 400° C.) preferred for lowest stresses, or a moderate temperature (less than approximately 900° C.).

Figure 27C:
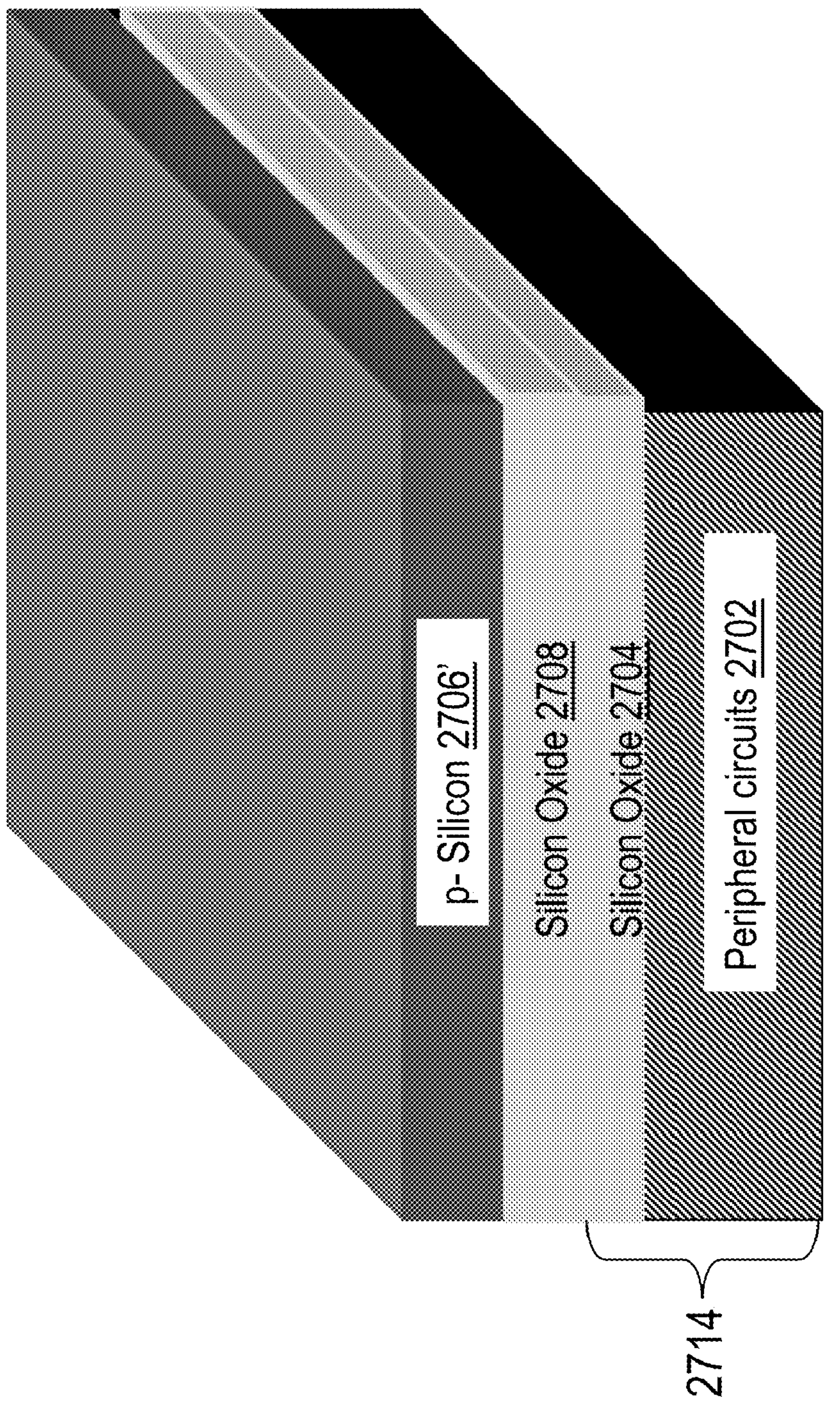

As illustrated in FIG. 27C, the portion of the P− layer (not shown) and the P− wafer substrate 2706 that are above the layer transfer demarcation plane 2710 may be removed by cleaving and polishing, or other processes as previously described, such as, for example, ion-cut or other methods, thus forming the remaining mono-crystalline silicon P− layer 2706'. Remaining P− layer 2706' and oxide layer 2708 have been layer transferred to acceptor wafer 2714. The top surface of P− layer 2706' may be chemically or mechanically polished smooth and flat. Now transistors or portions of transistors may be formed and aligned to the acceptor wafer 2714 alignment marks (not shown).

Figure 27D:
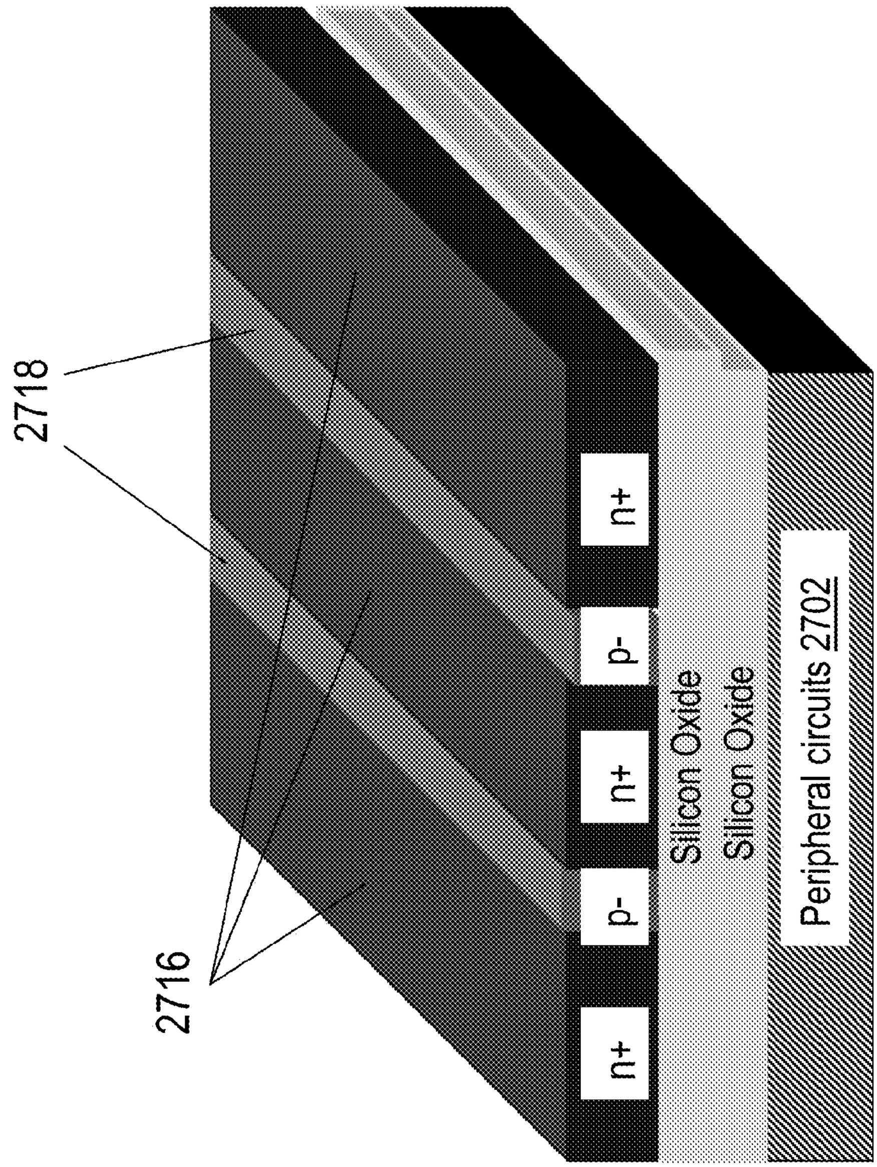

As illustrated in FIG. 27D, N+ silicon regions 2716 may be lithographically defined and N type species, such as, for example, Arsenic, may be ion implanted into P− silicon layer 2706'. This also forms remaining regions of P− silicon 2718.

Figure 27E:
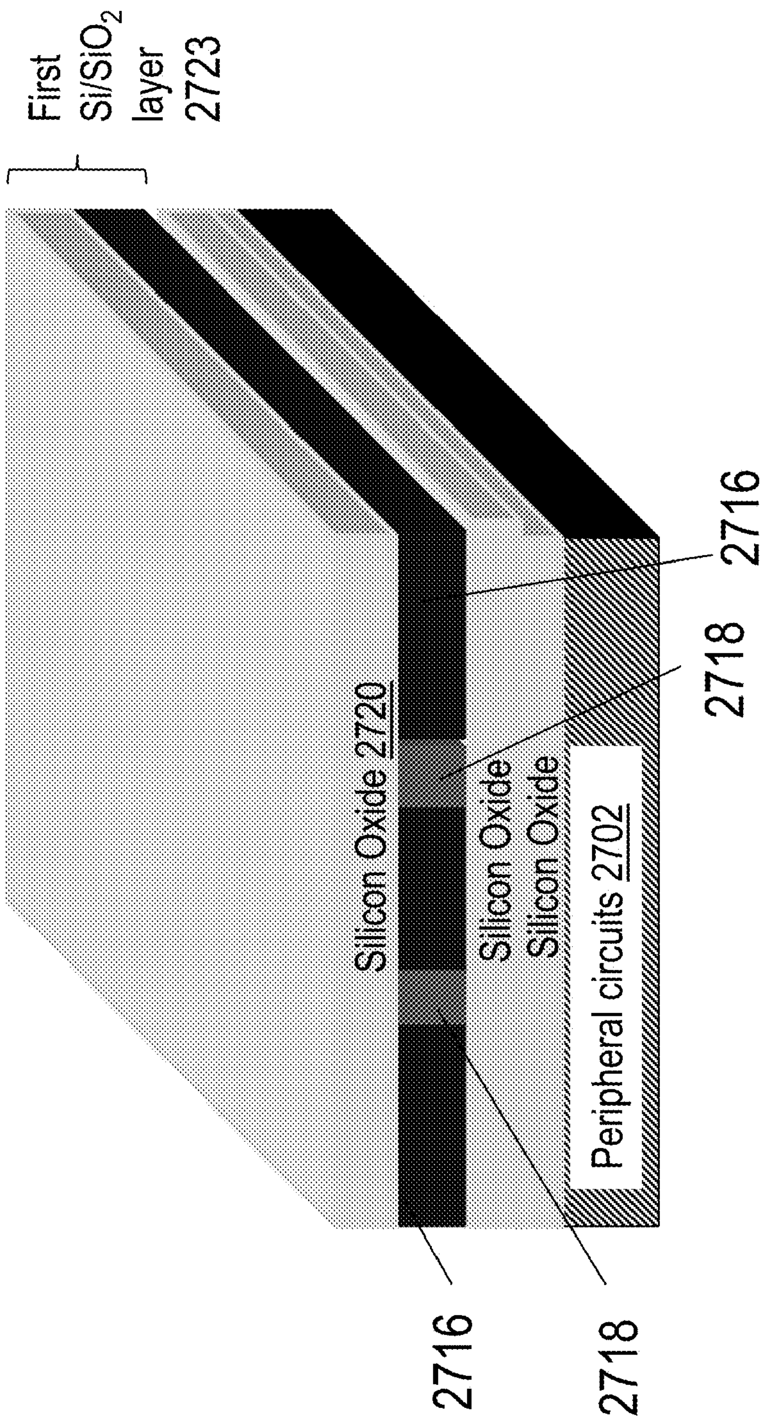

As illustrated in FIG. 27E, oxide layer 2720 may be deposited to prepare the surface for later oxide to oxide bonding. This now forms the first Si/SiO2 layer 2723 which includes silicon oxide layer 2720, N+ silicon regions 2716, and P− silicon regions 2718.

Figure 27F:
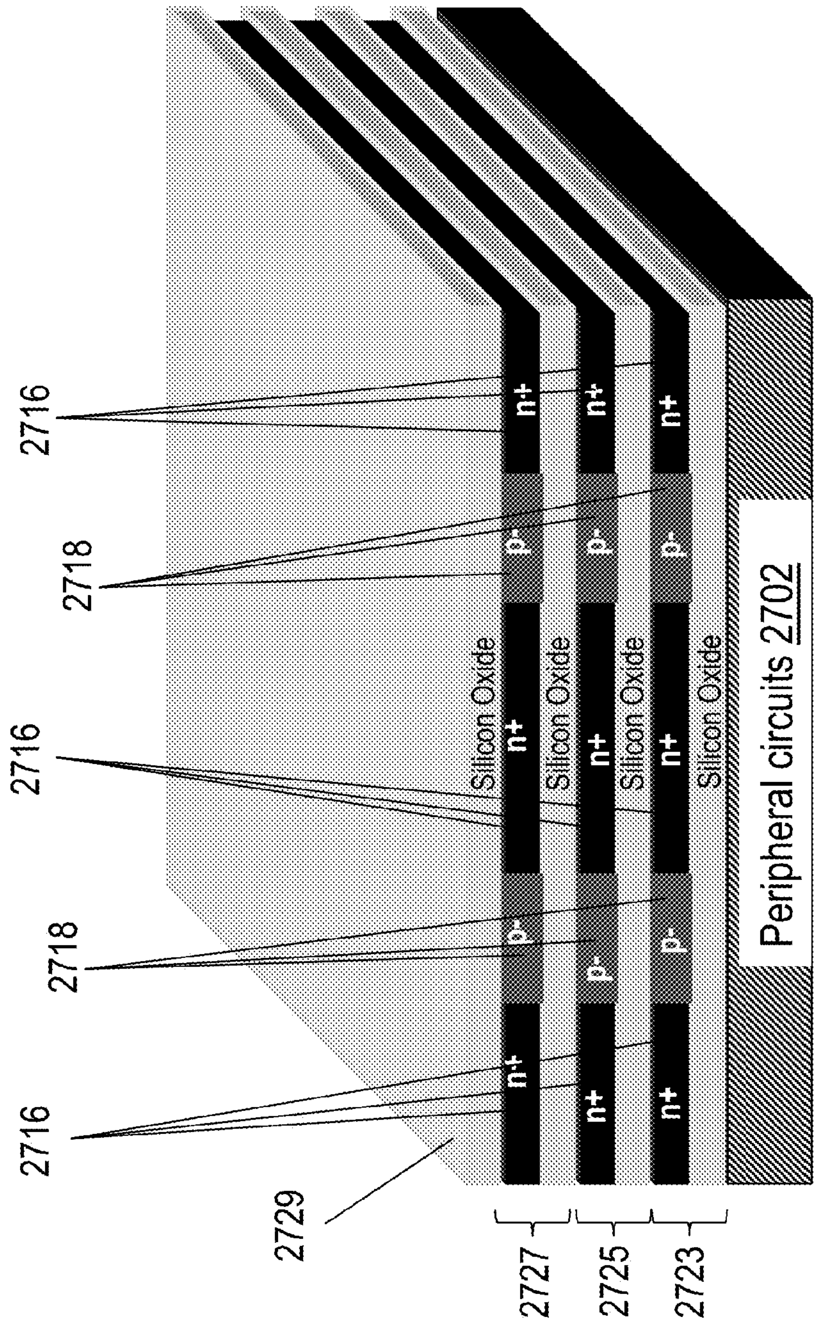

As illustrated in FIG. 27F, additional Si/SiO2 layers, such as, for example, second Si/SiO2 layer 2725 and third Si/SiO2 layer 2727, may each be formed as described in FIGS. 27A to 27E. Oxide layer 2729 may be deposited. After substantially all the desired numbers of memory layers are constructed, a rapid thermal anneal (RTA) may be conducted to activate the dopants in substantially all of the memory layers 2723, 2725, 2727 and in the peripheral circuits 2702. Alternatively, optical anneals, such as, for example, a laser based anneal, may be performed.

Figure 27G:
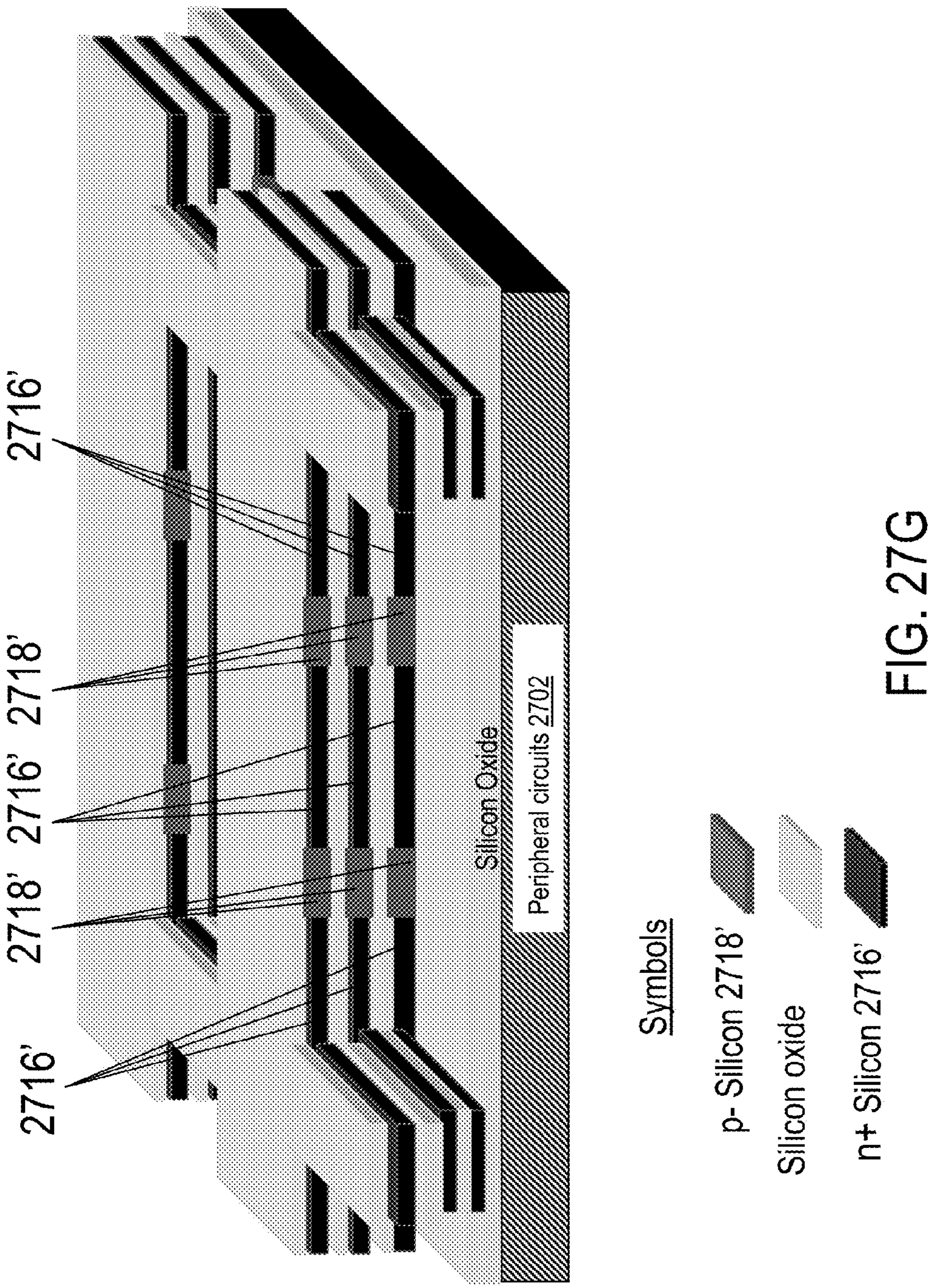

As illustrated in FIG. 27G, oxide layer 2729, third Si/SiO2 layer 2727, second Si/SiO2 layer 2725 and first Si/SiO2 layer 2723 may be lithographically defined and plasma/RIE etched to form a portion of the memory cell structure. Regions of P− silicon 2718', which will form the transistor channels, and N+ silicon regions 2716', which form the source, drain and local source lines, result from the etch.

Figure 27H:
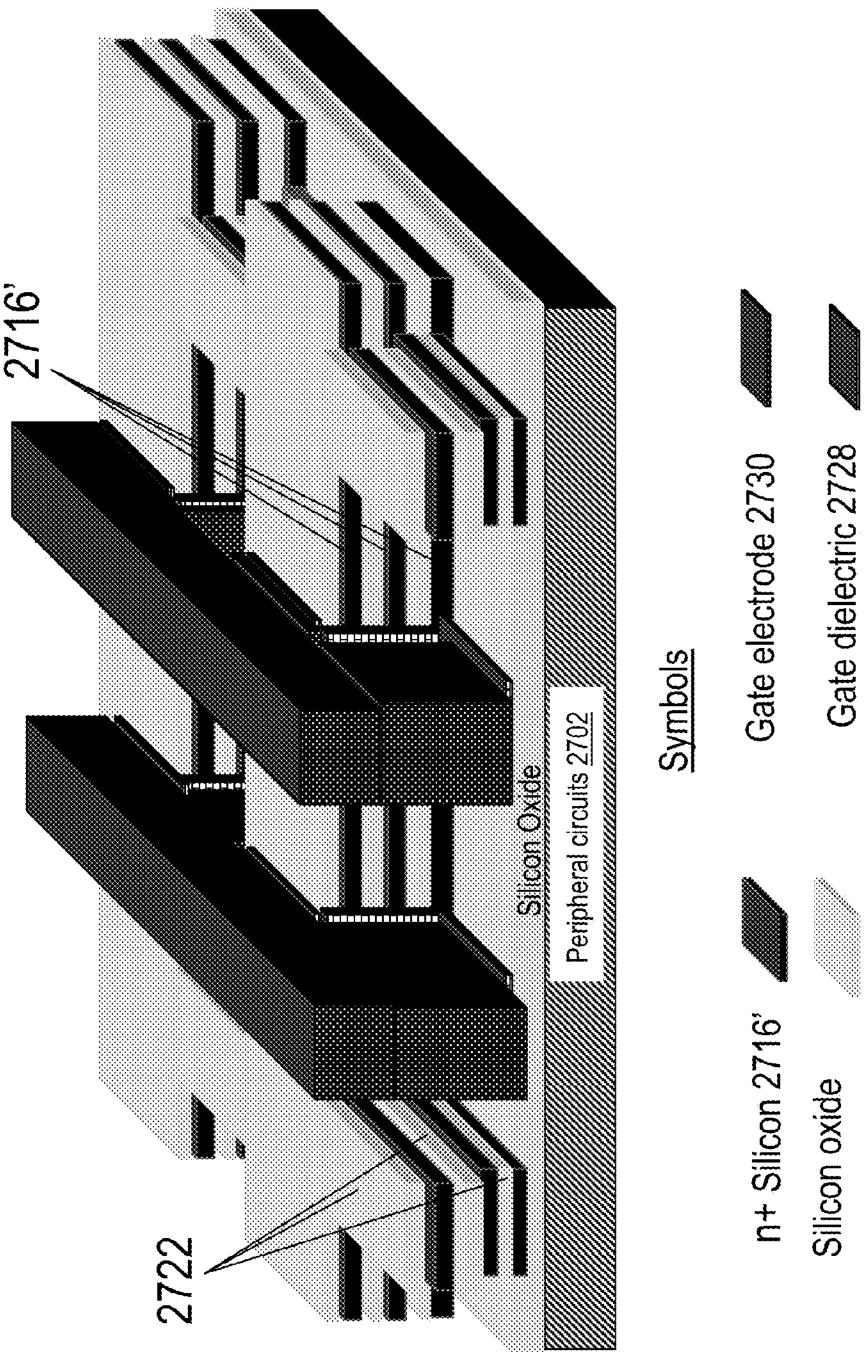

As illustrated in FIG. 27H, a gate dielectric and gate electrode material may be deposited, planarized with a chemical mechanical polish (CMP), and then lithographically defined and plasma/RIE etched to form gate dielectric regions 2728 which may be either self aligned to and substantially covered by gate electrodes 2730 (shown), or substantially cover the entire silicon/oxide multi-layer structure. The gate electrode 2730 and gate dielectric 2728 stack may be sized and aligned such that P− silicon regions 2718' are substantially covered. The gate stack comprised of gate electrode 2730 and gate dielectric 2728 may be formed with a gate dielectric, such as, for example, thermal oxide, and a gate electrode material, such as, for example, poly-crystalline silicon. Alternatively, the gate dielectric may be an atomic layer deposited (ALD) material that is paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 27I:
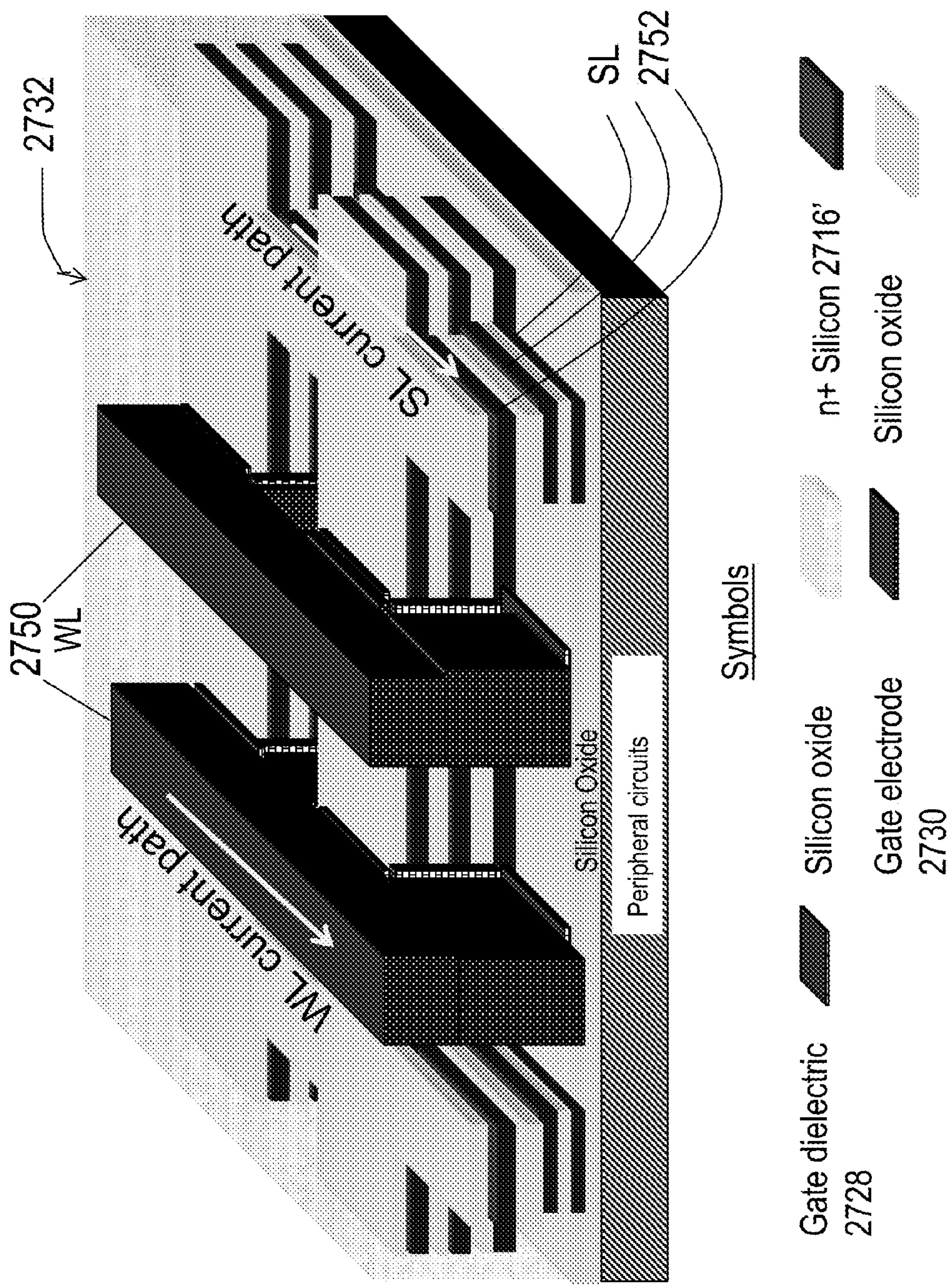

As illustrated in FIG. 27I, the entire structure may be substantially covered with a gap fill oxide 2732, which may be planarized with chemical mechanical polishing. The oxide 2732 is shown transparent in the figure for clarity. Word-line regions (WL) 2750, coupled with and composed of gate electrodes 2730, and source-line regions (SL) 2752, composed of indicated N+ silicon regions 2716', are shown.

Figure 27J:
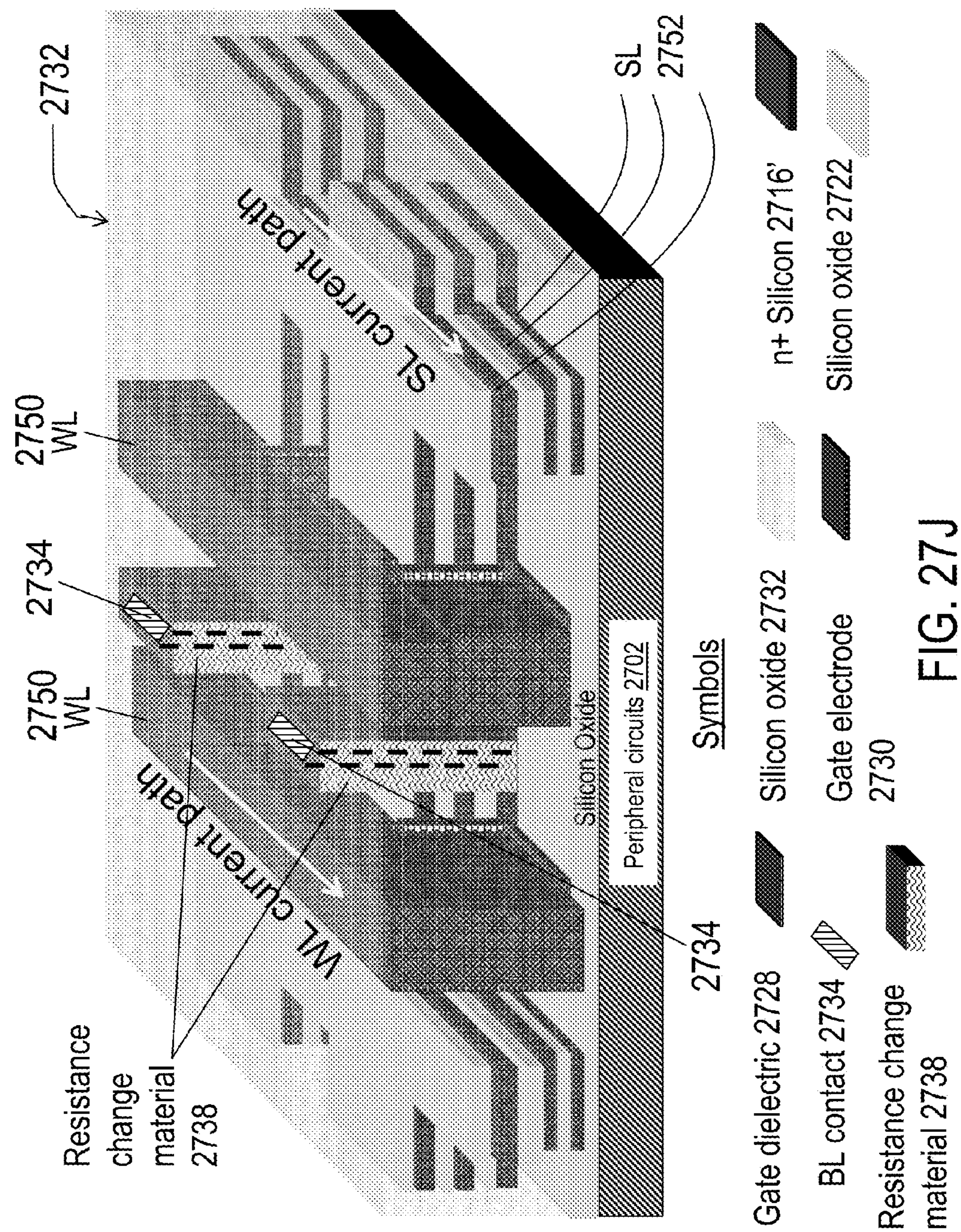

As illustrated in FIG. 27J, bit-line (BL) contacts 2734 may be lithographically defined, etched with plasma/RIE through oxide 2732, the three N+ silicon regions 2716', and associated oxide vertical isolation regions to connect substantially all memory layers vertically, and photoresist removed. Resistance change memory material 2738, such as, for example, hafnium oxide, may then be deposited, preferably with atomic layer deposition (ALD). The electrode for the resistance change memory element may then be deposited by ALD to form the BL contact/electrode 2734. The excess deposited material may be polished to planarity at or below the top of oxide 2732. Each BL contact/electrode 2734 with resistive change material 2738 may be shared among substantially all layers of memory, shown as three layers of memory in FIG. 27J.

Figure 27K:
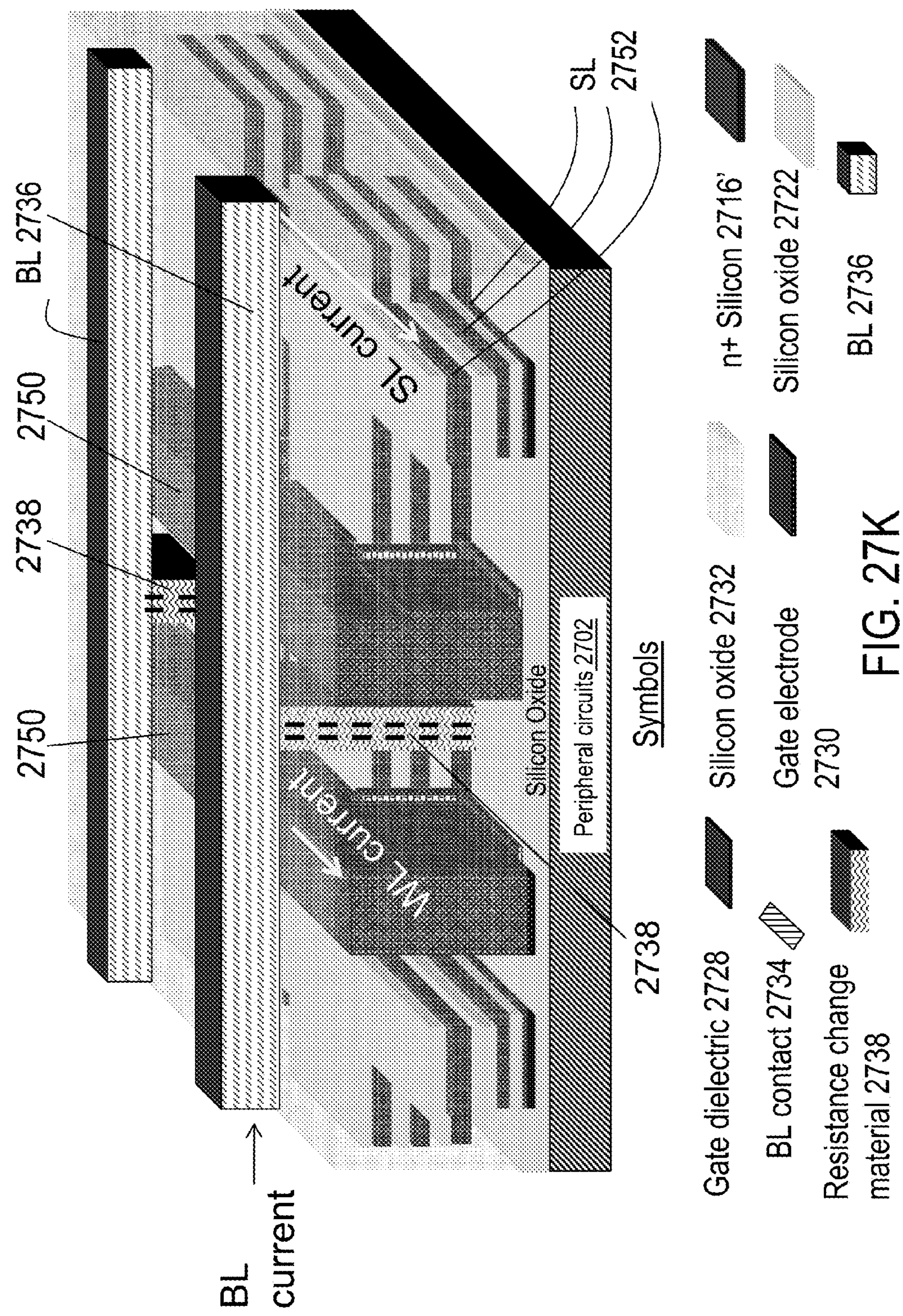

As illustrated in FIG. 27K, BL metal lines 2736 may be formed and connect to the associated BL contacts 2734 with resistive change material 2738. Contacts and associated metal interconnect lines (not shown) may be formed for the WL and SL at the memory array edges. A thru layer via 2760 (not shown) may be formed to electrically couple the BL, SL, and WL metallization to the acceptor substrate 2714 peripheral circuitry via an acceptor wafer metal connect pad 2780 (not shown).

Figure 27L:
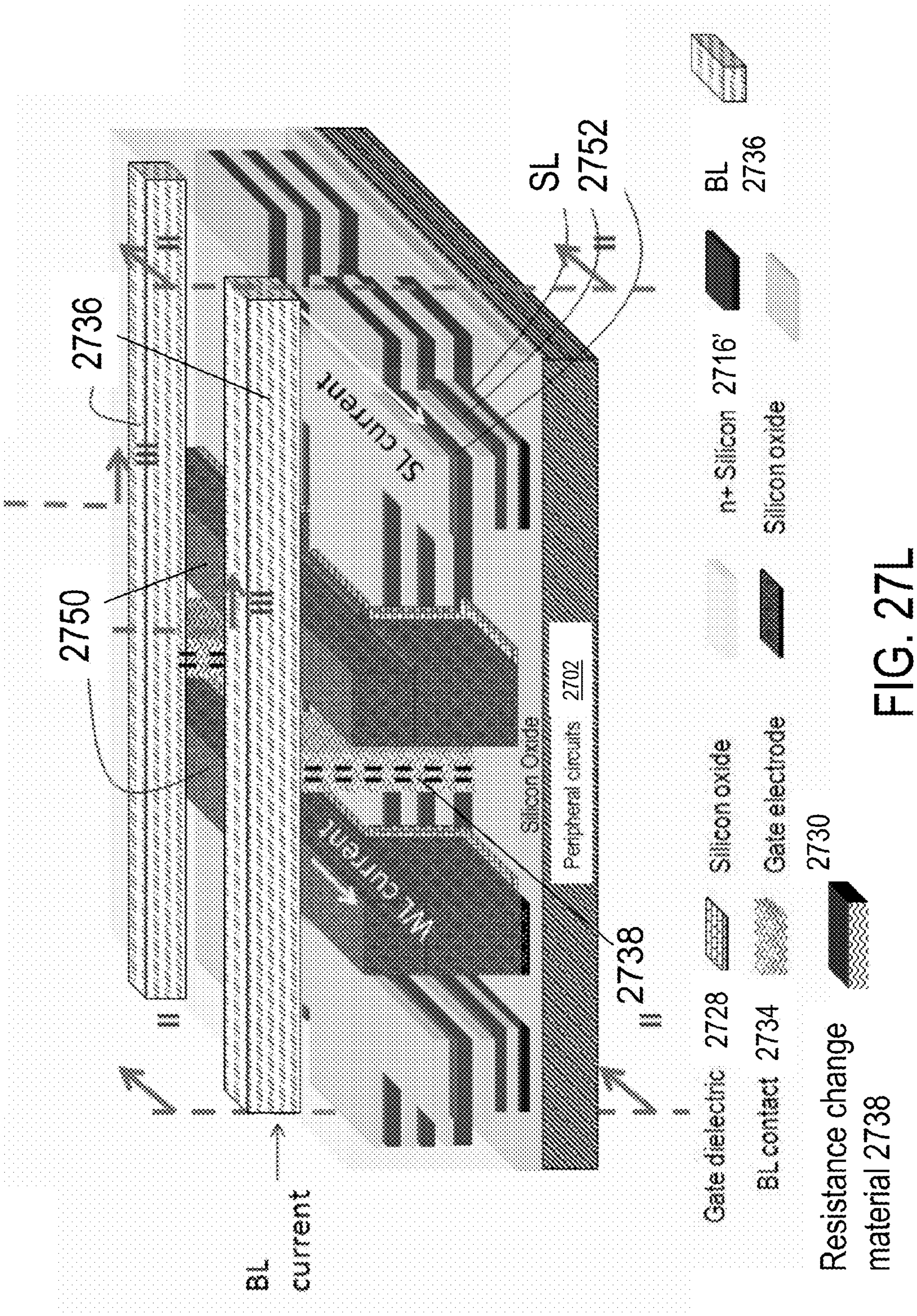
Figure 27M:
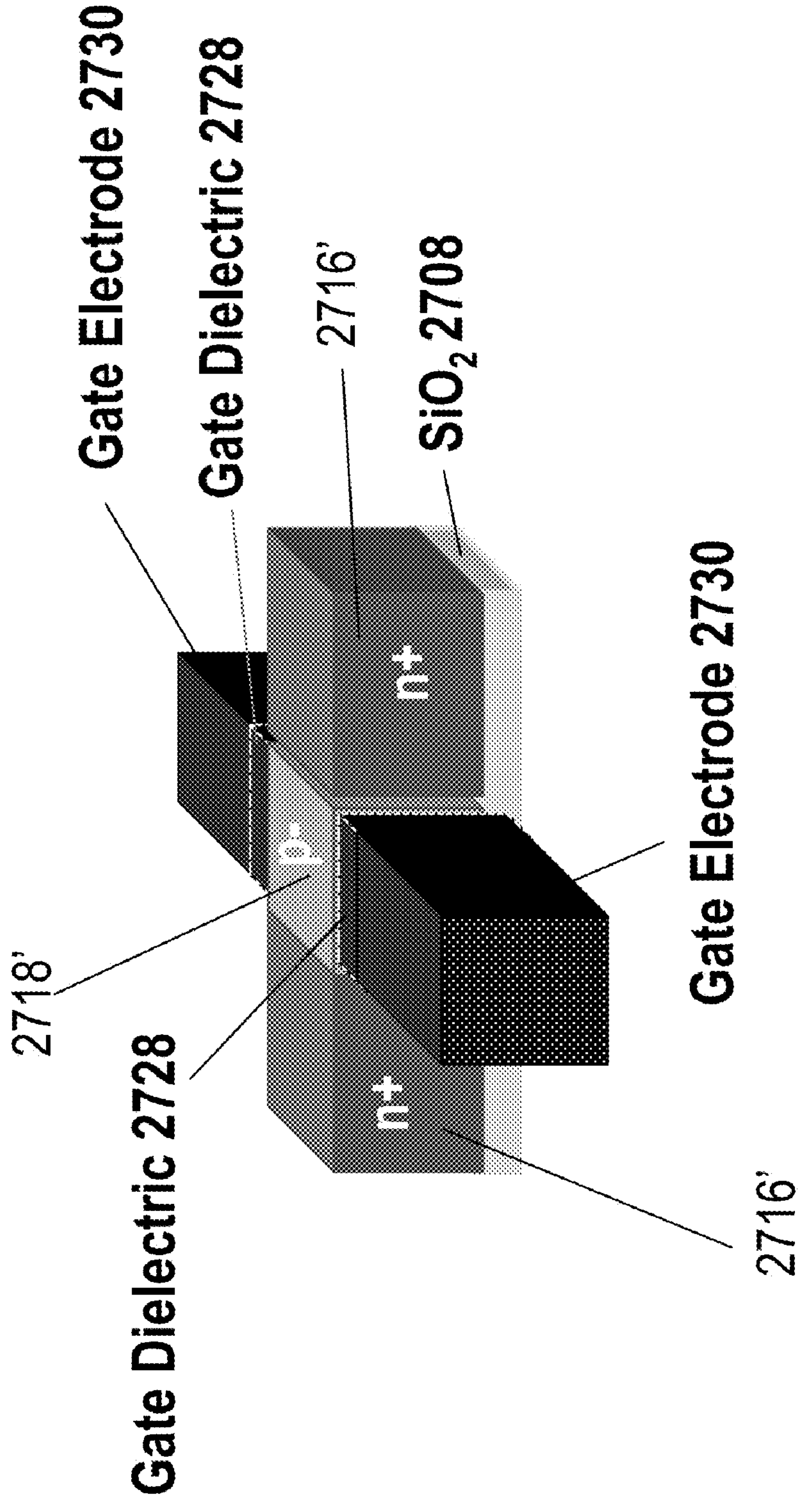

As illustrated in FIG. 27L, 27L1 and 27L2, cross section cut II of FIG. 27L is shown in FIG. 27L1, and cross section cut III of FIG. 27L is shown in FIG. 27L2. BL metal line 2736, oxide 2732, BL contact/electrode 2734, resistive change material 2738, WL regions 2750, gate dielectric 2728, P− silicon regions 2718', N+ silicon regions 2716', and peripheral circuits substrate 2702 are shown in FIG. 27L1. The BL contact/electrode 2734 couples to one side of the three levels of resistive change material 2738. The other side of the resistive change material 2738 is coupled to N+ silicon regions 2716'. The P− regions 2718' with associated N+ regions 2716' on each side form the source, channel, and drain of the select transistor. BL metal lines 2736, oxide 2732, gate electrode 2730, gate dielectric 2728, P− silicon regions 2718', interlayer oxide regions (‘ox’), and peripheral circuits substrate 2702 are shown in FIG. 27K2. The gate electrode 2730 is common to substantially all six P− silicon regions 2718' and controls the six double gated MOSFET select transistors.

As illustrated in FIG. 27L, a single exemplary double gated MOSFET select transistor on the first Si/SiO2 layer 2723 may be comprised of P− silicon region 2718' (functioning as the transistor channel), N+ silicon regions 2716' (functioning as source and drain), and two gate electrodes 2730 with associated gate dielectrics 2728. The transistor is electrically isolated from beneath by oxide layer 2708.

The above flow enables the formation of a resistance-based 3D memory with one additional masking step per memory layer constructed by layer transfers of wafer sized doped mono-crystalline silicon layers and may be connected to an underlying multi-metal layer semiconductor device Persons of ordinary skill in the art will appreciate that the illustrations in FIGS. 27A through 27M are exemplary only and are not drawn to scale. Such skilled persons will further appreciate that many variations are possible such as, for example, the transistors may be of another type, such as RCATs. Additionally, the contacts may utilize doped polycrystalline silicon, or other conductive materials. Moreover, the stacked memory layer may be connected to a periphery circuit that is above the memory stack. Further, the Si/SiO2 layers 2722, 2724 and 2726 may be annealed layer-by-layer as soon as their associated implantations are complete by using a laser anneal system. Many other modifications within the scope of the invention will suggest themselves to such skilled persons after reading this specification. Thus the invention is to be limited only by the appended claims.

As illustrated in FIGS. 28A to 28F, a resistance-based 3D memory with two additional masking steps per memory layer may be constructed that is suitable for 3D IC manufacturing. This 3D memory utilizes single gate MOSFET select transistors and has a resistance-based memory element in series with the select transistor.

Figure 28A:
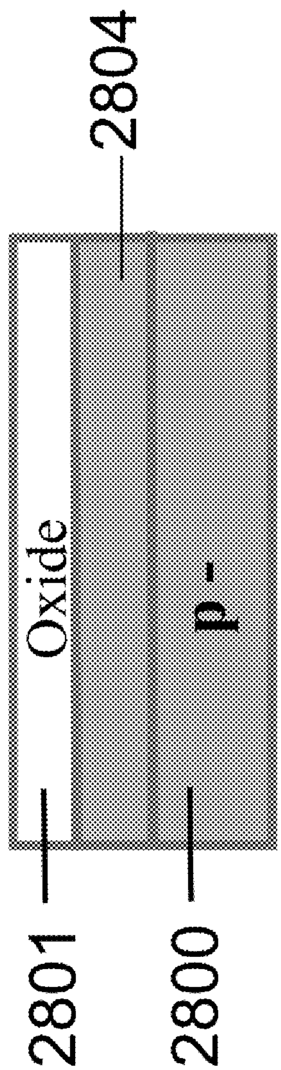
FIGS. 28A-F are exemplary drawing illustrations of the formation of a resistive memory transistor.

As illustrated in FIG. 28A, a P− substrate donor wafer 2800 may be processed to comprise a wafer sized layer of P− doping 2804. The P− layer 2804 may have the same or different dopant concentration than the P− substrate 2800. The P− doping layer 2804 may be formed by ion implantation and thermal anneal. A screen oxide 2801 may be grown before the implant to protect the silicon from implant contamination and to provide an oxide surface for later wafer to wafer bonding.

Figure 28B:
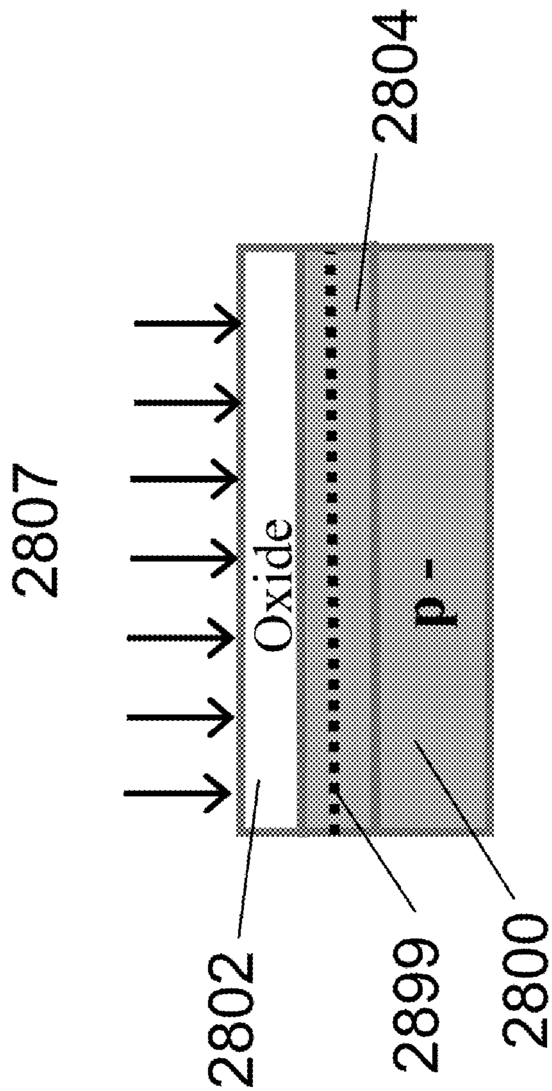

As illustrated in FIG. 28B, the top surface of donor wafer 2800 may be prepared for oxide wafer bonding with a deposition of an oxide 2802 or by thermal oxidation of the P− layer 2804 to form oxide layer 2802, or a re-oxidation of implant screen oxide 2801. A layer transfer demarcation plane 2899 (shown as a dashed line) may be formed in donor wafer 2800 or P− layer 2804 (shown) by hydrogen implantation 2807 or other methods as previously described. Both the donor wafer 2800 and acceptor wafer 2810 may be prepared for wafer bonding as previously described and then bonded, preferably at a low temperature (less than approximately 400° C.) to minimize stresses. The portion of the P− layer 2804 and the P− donor wafer substrate 2800 that are above the layer transfer demarcation plane 2899 may be removed by cleaving and polishing, or other processes as previously described, such as, for example, ion-cut or other methods.

Figure 28C:
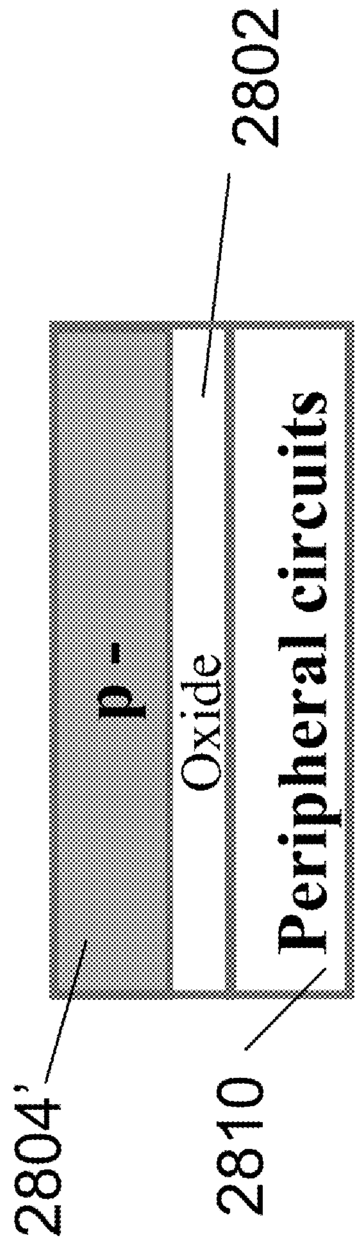

As illustrated in FIG. 28C, the remaining P− doped layer 2804', and oxide layer 2802 have been layer transferred to acceptor wafer 2810. Acceptor wafer 2810 may comprise peripheral circuits such that they can withstand an additional rapid-thermal-anneal (RTA) and still remain operational and retain good performance. For this purpose, the peripheral circuits may be formed such that they have not been subject to a weak RTA or no RTA for activating dopants. Also, the peripheral circuits may utilize a refractory metal such as, for example, tungsten that can withstand high temperatures greater than approximately 400° C. The top surface of P− doped layer 2804' may be chemically or mechanically polished smooth and flat. Now transistors may be formed and aligned to the acceptor wafer 2810 alignment marks (not shown).

Figure 28D:
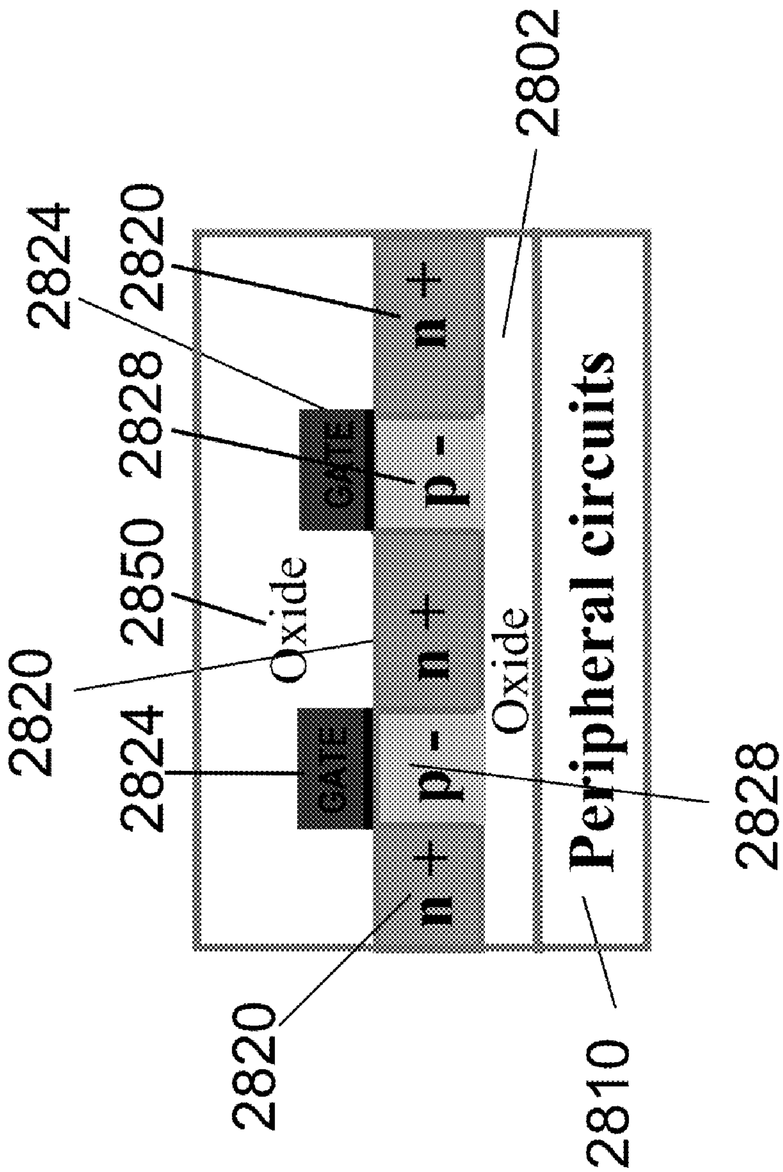

As illustrated in FIG. 28D shallow trench isolation (STI) oxide regions (not shown) may be lithographically defined and plasma/RIE etched to at least the top level of oxide layer 2802 removing regions of P− mono-crystalline silicon layer 2804'. A gap-fill oxide may be deposited and CMP’ed flat to form conventional STI oxide regions and P− doped mono-crystalline silicon regions (not shown) for forming the transistors. Threshold adjust implants may or may not be performed at this time. A gate stack 2824 may be formed with a gate dielectric, such as, for example, thermal oxide, and a gate metal material, such as, for example, polycrystalline silicon. Alternatively, the gate oxide may be an atomic layer deposited (ALD) gate dielectric that is paired with a work function specific gate metal in the industry standard high k metal gate process schemes described previously. Further, the gate oxide may be formed with a rapid thermal oxidation (RTO), a low temperature oxide deposition or low temperature microwave plasma oxidation of the silicon surfaces and then a gate material such as, for example, tungsten or aluminum may be deposited. Gate stack self aligned LDD (Lightly Doped Drain) and halo punch-thru implants may be performed at this time to adjust junction and transistor breakdown characteristics. A conventional spacer deposition of oxide and nitride and a subsequent etch-back may be done to form implant offset spacers (not shown) on the gate stacks 2824. Then a self aligned N+ source and drain implant may be performed to create transistor source and drains 2820 and remaining P− silicon NMOS transistor channels 2828. High temperature anneal steps may or may not be done at this time to activate the implants and set initial junction depths. Finally, the entire structure may be substantially covered with a gap fill oxide 2850, which may be planarized with chemical mechanical polishing. The oxide surface may be prepared for oxide to oxide wafer bonding as previously described.

Figure 28E:
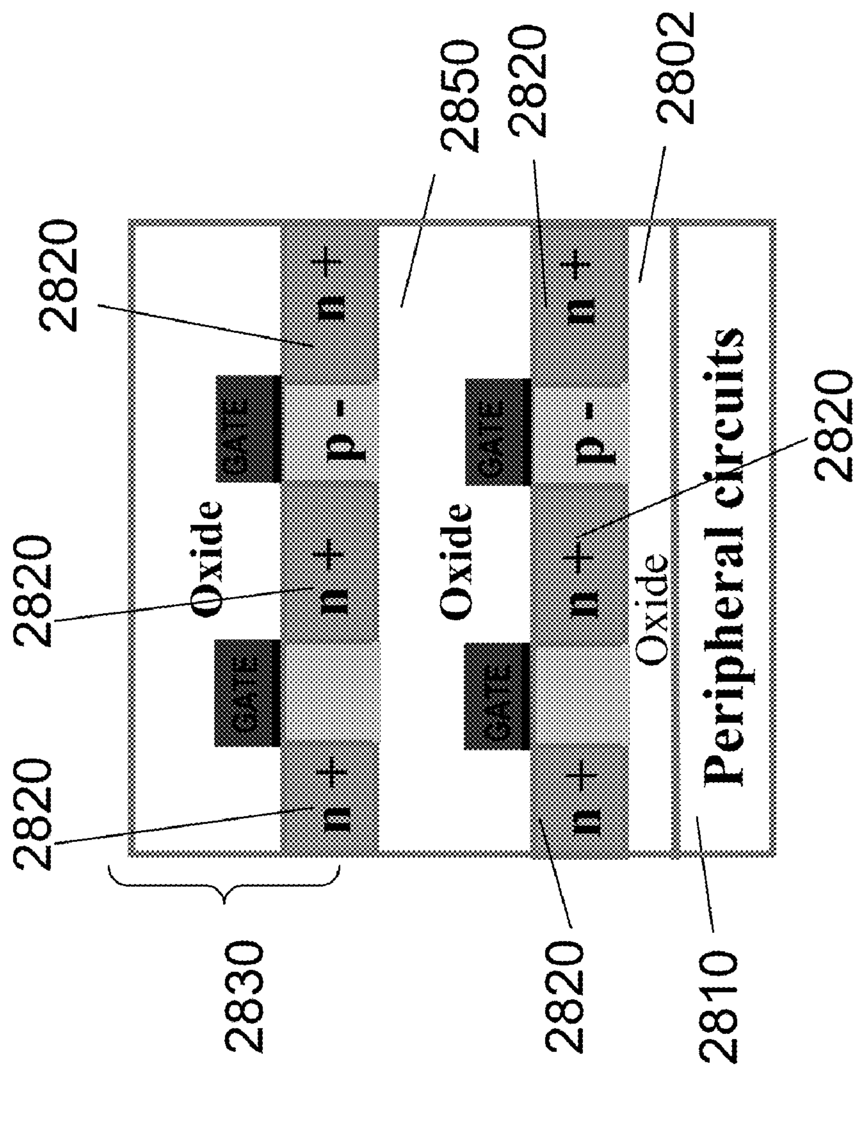

As illustrated in FIG. 28E, the transistor layer formation, bonding to acceptor wafer 2810 oxide 2850, and subsequent transistor formation as described in FIGS. 28A to 28D may be repeated to form the second tier 2830 of memory transistors. After substantially all the desired memory layers are constructed, a rapid thermal anneal(RTA) may be conducted to activate the dopants in substantially all of the memory layers and in the acceptor substrate 2810 peripheral circuits. Alternatively, optical anneals, such as, for example, a laser based anneal, may be performed.

Figure 28F:
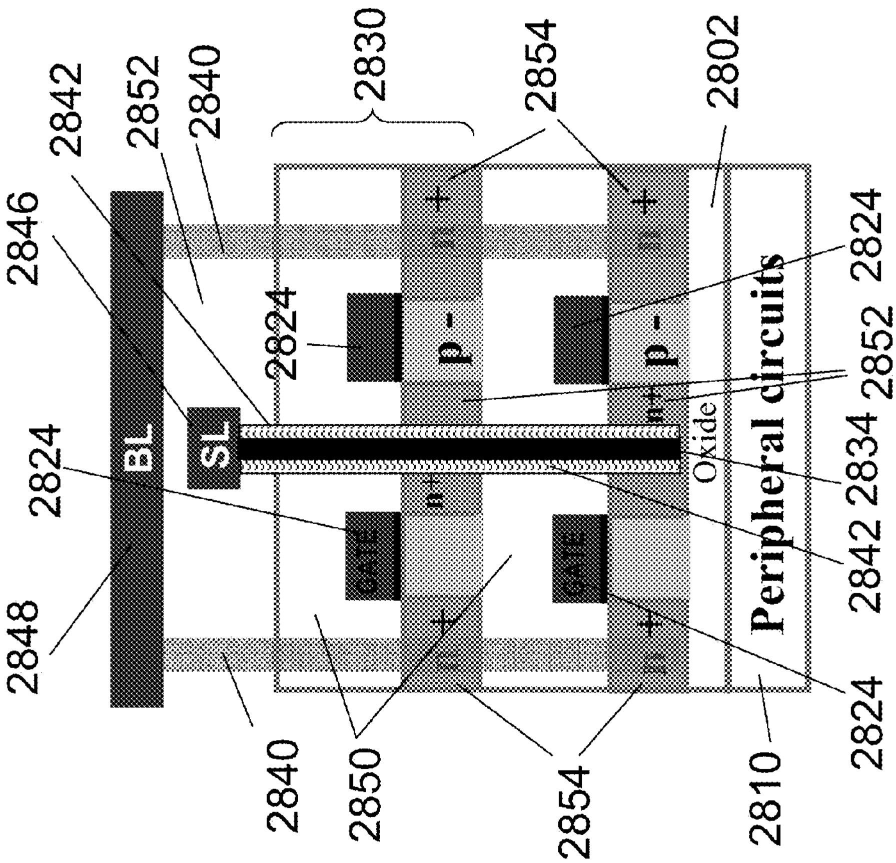

As illustrated in FIG. 28F, contacts and metal interconnects may be formed by lithography and plasma/RIE etch. Bit line (BL) contacts 2840 electrically couple the memory layers' transistor N+ regions on the transistor drain side 2854, and the source line contact 2842 electrically couples the memory layers' transistor N+ regions on the transistors source side 2852. The bit-line (BL) wiring 2848 and source-line (SL) wiring 2846 electrically couples the bit-line contacts 2840 and source-line contacts 2842 respectively. The gate stacks, such as, for example, 2834, may be connected with a contact and metallization (not shown) to form the word-lines (WLs). A thru layer via 2860 (not shown) may be formed to electrically couple the BL, SL, and WL metallization to the acceptor substrate 2810 peripheral circuitry via an acceptor wafer metal connect pad 1980 (not shown).

As illustrated in FIG. 28F, source-line (SL) contacts 2834 may be lithographically defined, etched with plasma/RIE through the oxide 2850 and N+ silicon regions 2820 of each memory tier, and associated oxide vertical isolation regions to connect substantially all memory layers vertically, and photoresist removed. Resistance change memory material 2842, such as, for example, hafnium oxide, may then be deposited, preferably with atomic layer deposition (ALD). The electrode for the resistance change memory element may then be deposited by ALD to form the SL contact/electrode 2834. The excess deposited material may be polished to planarity at or below the top of oxide 2850. Each SL contact/electrode 2834 with resistive change material 2842 may be shared among substantially all layers of memory, shown as two layers of memory in FIG. 28F. The SL contact 2834 electrically couples the memory layers' transistor N+ regions on the transistor source side 2852. SL metal lines 2846 may be formed and connect to the associated SL contacts 2834 with resistive change material 2842. Oxide layer 2852 may be deposited and planarized. Bit-line (BL) contacts 2840 may be lithographically defined, etched with plasma/RIE through oxide 2852, the oxide 2850 and N+ silicon regions 2820 of each memory tier, and associated oxide vertical isolation regions to connect substantially all memory layers vertically, and photoresist removed. BL contacts 2840 electrically couple the memory layers' transistor N+ regions on the transistor drain side 2854. BL metal lines 2848 may be formed and connect to the associated BL contacts 2840. The gate stacks, such as, for example, 2824, may be connected with a contact and metallization (not shown) to form the word-lines (WLs). A thru layer via 2860 (not shown) may be formed to electrically couple the BL, SL, and WL metallization to the acceptor substrate 2810 peripheral circuitry via an acceptor wafer metal connect pad 2880 (not shown).

This flow enables the formation of a resistance-based 3D memory with two additional masking steps per memory layer constructed by layer transfers of wafer sized doped layers and this 3D memory may be connected to an underlying multi-metal layer semiconductor device.

Persons of ordinary skill in the art will appreciate that the illustrations in FIGS. 28A through 28F are exemplary only and are not drawn to scale. Such skilled persons will further appreciate that many variations are possible such as, for example, the transistors may be of another type such as PMOS or RCATs. Additionally, the stacked memory layer may be connected to a periphery circuit that is above the memory stack. Moreover, each tier of memory could be configured with a slightly different donor wafer P− layer doping profile. Further, the memory could be organized in a different manner, such as BL and SL interchanged, or where there are buried wiring whereby wiring for the memory array is below the memory layers but above the periphery. Many other modifications within the scope of the invention will suggest themselves to such skilled persons after reading this specification. Thus the invention is to be limited only by the appended claims.

Charge trap NAND (Negated AND) memory devices are another form of popular commercial non-volatile memories. Charge trap device store their charge in a charge trap layer, wherein this charge trap layer then influences the channel of a transistor. Background information on charge-trap memory can be found in "*Integrated Interconnect Technologies for* 3*D Nanoelectronic Systems*", Artech House, 2009 by Bakir and Meindl ("Bakir"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al., and "Introduction to Flash memory", Proc. IEEE91, 489-502 (2003) by R. Bez, et al. Work described in Bakir utilized selective epitaxy, laser recrystallization, or polysilicon to form the transistor channel, which results in less than satisfactory transistor performance. The architectures shown in FIGS. 29 and 30 are relevant for any type of charge-trap memory.

As illustrated in FIGS. 29A to 29G, a charge trap based two additional masking steps per memory layer 3D memory may be constructed that is suitable for 3D IC. This 3D memory utilizes NAND strings of charge trap transistors constructed in mono-crystalline silicon.

Figure 29A:
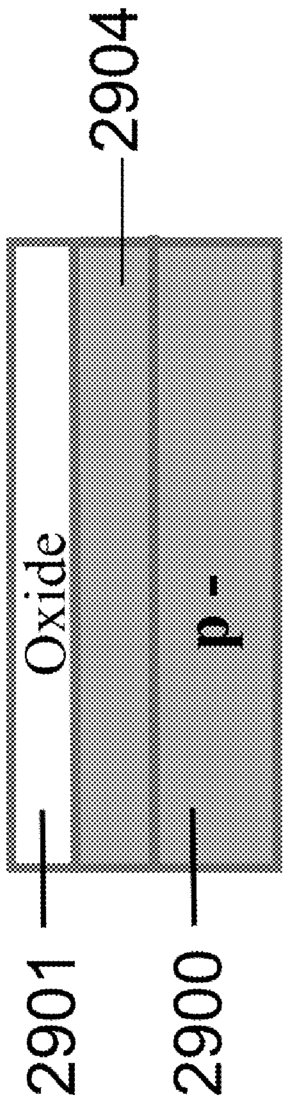
FIGS. 29A-G are exemplary drawing illustrations of the formation of a charge trap memory transistor.

As illustrated in FIG. 29A, a P− substrate donor wafer 2900 may be processed to comprise a wafer sized layer of P− doping 2904. The P-doped layer 2904 may have the same or different dopant concentration than the P− substrate 2900. The P− doped layer 2904 may have a vertical dopant gradient. The P− doped layer 2904 may be formed by ion implantation and thermal anneal. A screen oxide 2901 may be grown before the implant to protect the silicon from implant contamination and to provide an oxide surface for later wafer to wafer bonding.

Figure 29B:
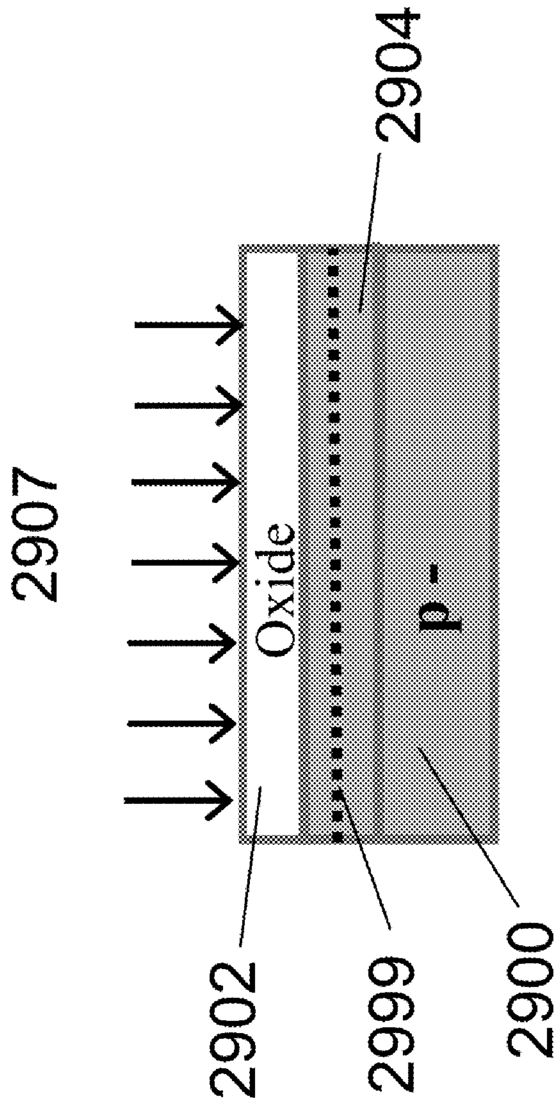

As illustrated in FIG. 29B, the top surface of donor wafer 2900 may be prepared for oxide wafer bonding with a deposition of an oxide 2902 or by thermal oxidation of the P− doped layer 2904 to form oxide layer 2902, or a re-oxidation of implant screen oxide 2901. A layer transfer demarcation plane 2999 (shown as a dashed line) may be formed in donor wafer 2900 or P− layer 2904 (shown) by hydrogen implantation 2907 or other methods as previously described. Both the donor wafer 2900 and acceptor wafer 2910 may be prepared for wafer bonding as previously described and then bonded, preferably at a low temperature (less than approximately 400° C.) to minimize stresses. The portion of the P− layer 2904 and the P− donor wafer substrate 2900 that are above the layer transfer demarcation plane 2999 may be removed by cleaving and polishing, or other processes as previously described, such as, for example, ion-cut or other methods.

Figure 29C:
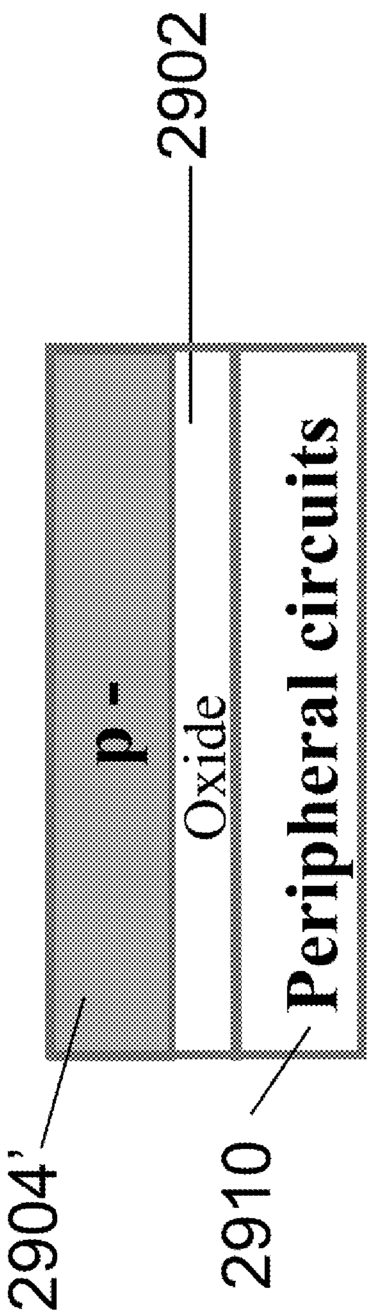

As illustrated in FIG. 29C, the remaining P− doped layer 2904', and oxide layer 2902 have been layer transferred to acceptor wafer 2910. Acceptor wafer 2910 may comprise peripheral circuits such that they can withstand an additional rapid-thermal-anneal (RTA) and still remain operational and retain good performance. For this purpose, the peripheral circuits may be formed such that they have not been subject to a weak RTA or no RTA for activating dopants. Also, the peripheral circuits may utilize a refractory metal such as, for example, tungsten that can withstand high temperatures greater than approximately 400° C. The top surface of P− doped layer 2904' may be chemically or mechanically polished smooth and flat. Now transistors may be formed and aligned to the acceptor wafer 2910 alignment marks (not shown).

Figure 29D:
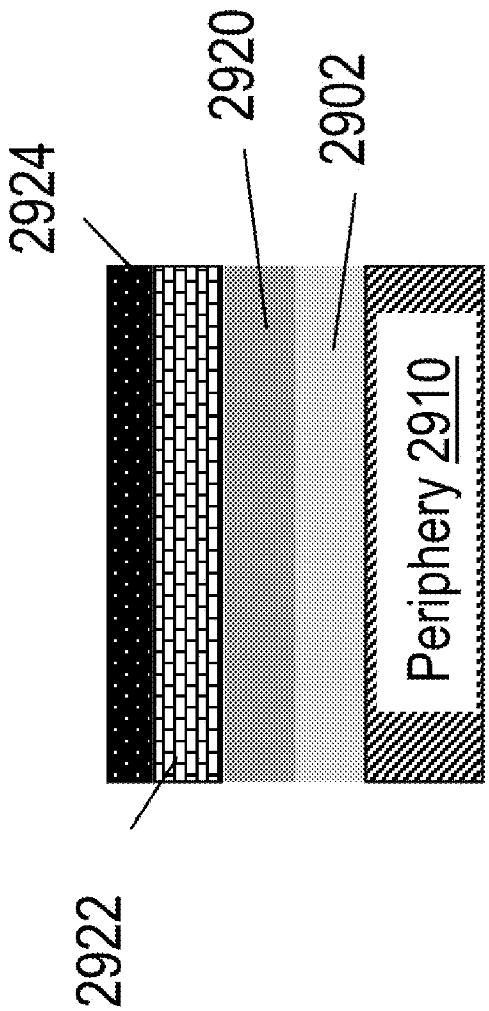

As illustrated in FIG. 29D shallow trench isolation (STI) oxide regions (not shown) may be lithographically defined and plasma/RIE etched to at least the top level of oxide layer 2902 removing regions of P− mono-crystalline silicon layer 2904', thus forming P− doped regions 2920. A gap-fill oxide may be deposited and CMP'ed flat to form conventional STI oxide regions and P− doped mono-crystalline silicon regions (not shown) for forming the transistors. Threshold adjust implants may or may not be performed at this time. A gate stack may be formed with growth or deposition of a charge trap gate dielectric 2922, such as, for example, thermal oxide and silicon nitride layers (ONO: Oxide-Nitride-Oxide), and a gate metal material 2924, such as, for example, doped or undoped poly-crystalline silicon. Alternatively, the charge trap gate dielectric may comprise silicon or III-V nano-crystals encased in an oxide.

Figure 29E:
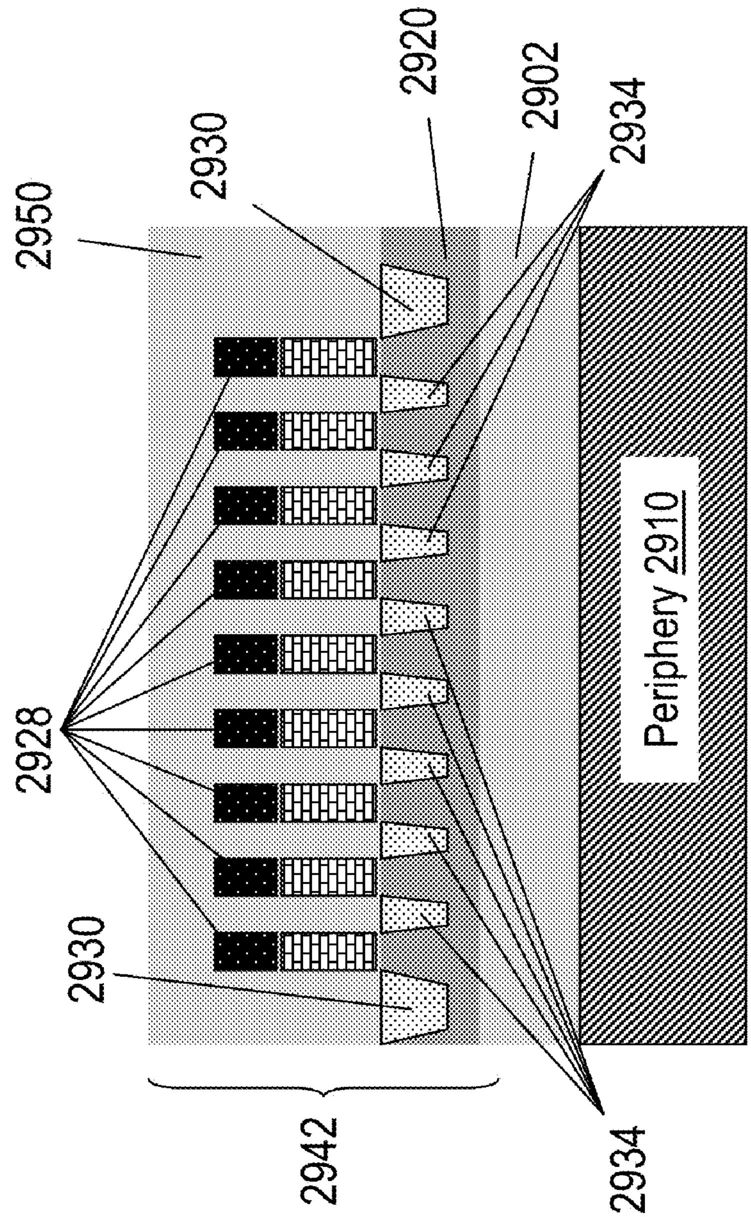

As illustrated in FIG. 29E, gate stacks 2928 may be lithographically defined and plasma/RIE etched removing regions of gate metal material 2924 and charge trap gate dielectric 2922. A self aligned N+ source and drain implant may be performed to create inter-transistor source and drains 2934 and end of NAND string source and drains 2930. Finally, the entire structure may be substantially covered with a gap fill oxide 2950 and the oxide planarized with chemical mechanical polishing. The oxide surface may be prepared for oxide to oxide wafer bonding as previously described. This now forms the first tier of memory transistors 2942 which includes silicon oxide layer 2950, gate stacks 2928, inter-transistor source and drains 2934, end of NAND string source and drains 2930, P− silicon regions 2920, and oxide 2902.

Figure 29F:
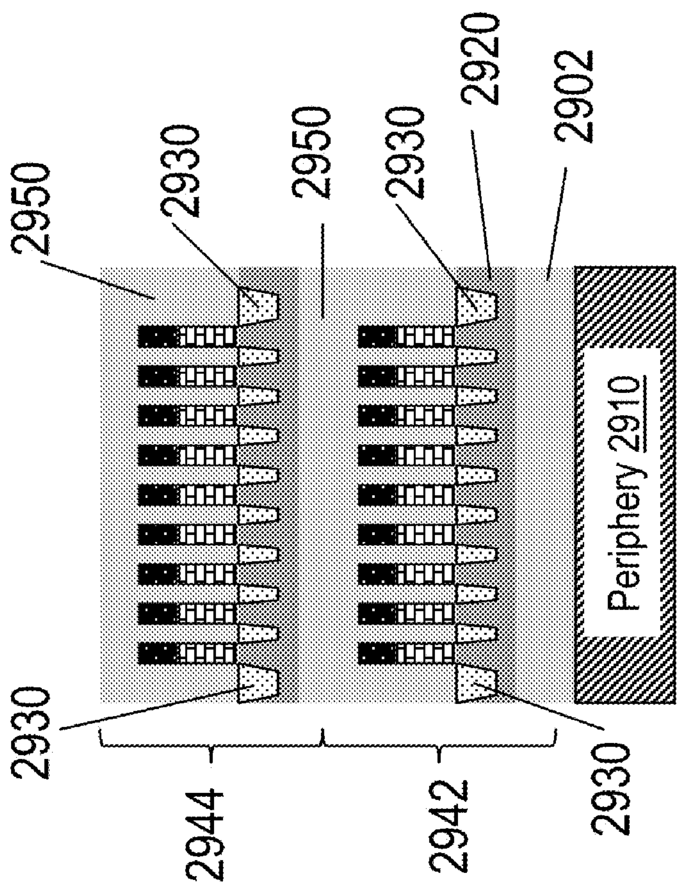

As illustrated in FIG. 29F, the transistor layer formation, bonding to acceptor wafer 2910 oxide 2950, and subsequent transistor formation as described in FIGS. 29A to 29D may be repeated to form the second tier 2944 of memory transistors on top of the first tier of memory transistors 2942. After substantially all the desired memory layers are constructed, a rapid thermal anneal(RTA) may be conducted to activate the dopants in substantially all of the memory layers and in the acceptor substrate 2910 peripheral circuits. Alternatively, optical anneals, such as, for example, a laser based anneal, may be performed.

Figure 29G:
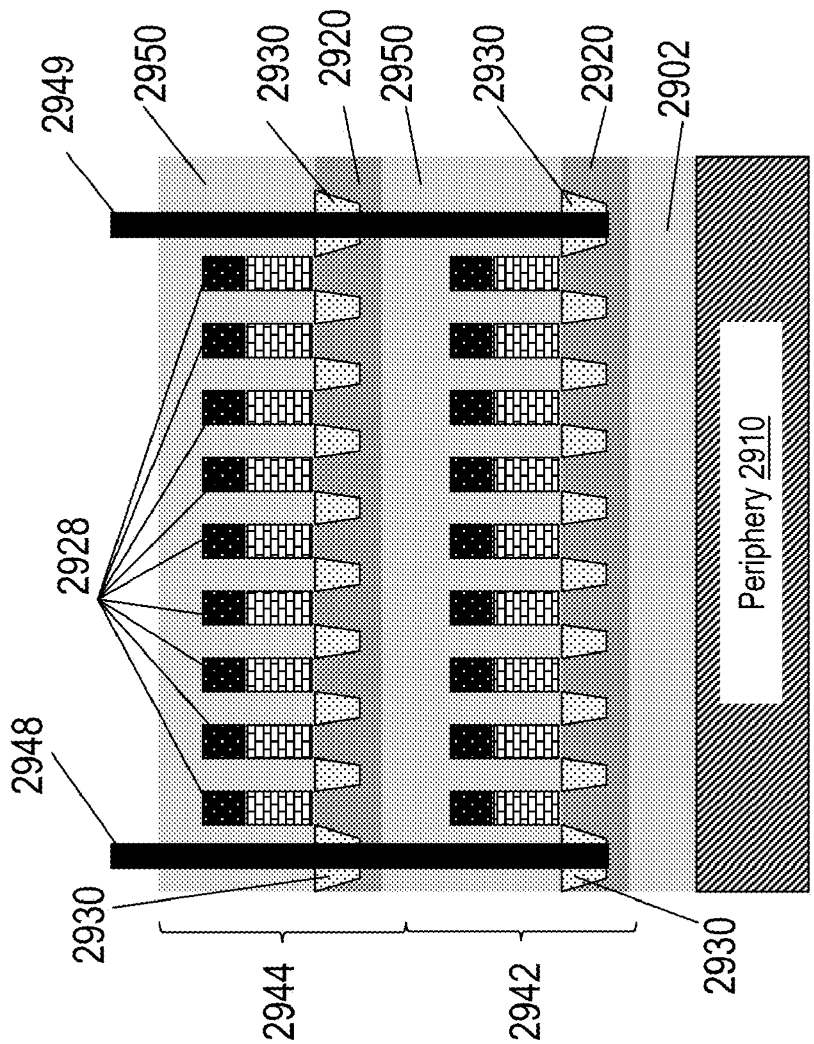

As illustrated in FIG. 29G, source line (SL) ground contact 2948 and bit line contact 2949 may be lithographically defined, etched with plasma/RIE through oxide 2950, end of NAND string source and drains 2930, and P− regions 2920 of each memory tier, and associated oxide vertical isolation regions to connect substantially all memory layers vertically, and photoresist removed. Metal or heavily doped poly-crystalline silicon may be utilized to fill the contacts and metallization utilized to form BL and SL wiring (not shown). The gate stacks 2928 may be connected with a contact and metallization to form the word-lines (WLs) and WL wiring (not shown). A thru layer via 2960 (not shown) may be formed to electrically couple the BL, SL, and WL metallization to the acceptor substrate 2910 peripheral circuitry via an acceptor wafer metal connect pad 2980 (not shown).

This flow enables the formation of a charge trap based 3D memory with two additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 29A through 29G are exemplary only and are not drawn to scale. Such skilled persons will further appreciate that many variations are possible such as, for example, BL or SL select transistors may be constructed within the process flow. Additionally, the stacked memory layer may be connected to a periphery circuit that is above the memory stack. Moreover, each tier of memory could be configured with a slightly different donor wafer P− layer doping profile. Further, the memory could be organized in a different manner, such as BL and SL interchanged, or these architectures can be modified into a NOR flash memory style, or where buried wiring for the memory array is below the memory layers but above the periphery. Additionally, the charge trap dielectric and gate layer may be deposited before the layer transfer and temporarily bonded to a carrier or holder wafer or substrate and then transferred to the acceptor substrate with periphery. Many other modifications within the scope of the invention will suggest themselves to such skilled persons after reading this specification. Thus the invention is to be limited only by the appended claims.

As illustrated in FIGS. 30A to 30G, a charge trap based 3D memory with zero additional masking steps per memory layer 3D memory may be constructed that is suitable for 3D IC manufacturing. This 3D memory utilizes NAND strings of charge trap junction-less transistors with junction-less select transistors constructed in mono-crystalline silicon.

Figure 30A:
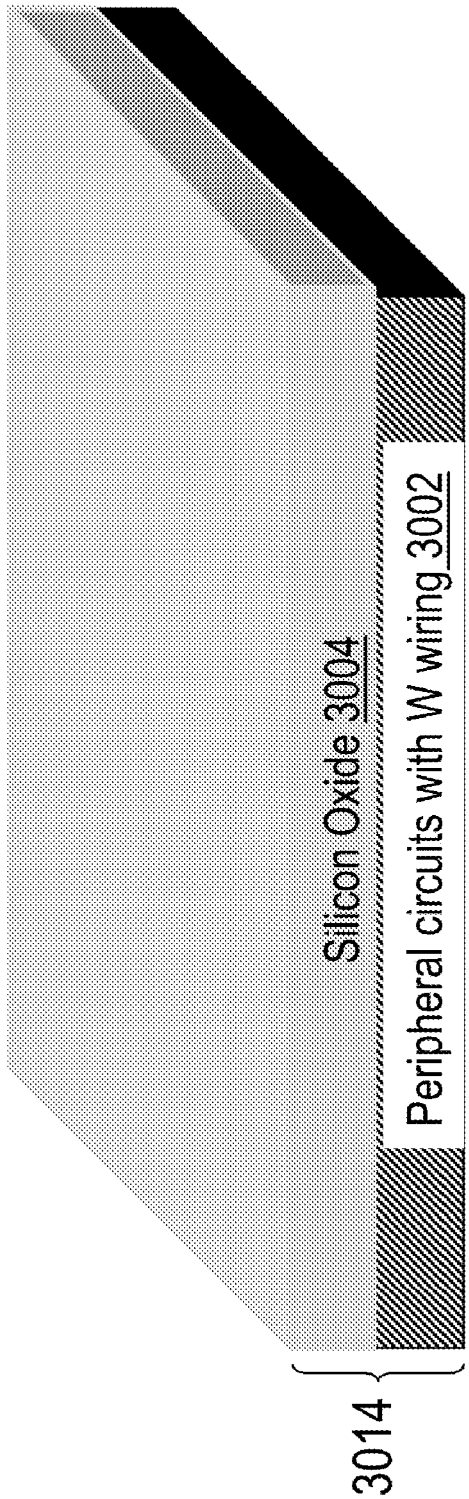
FIGS. 30A-G are exemplary drawing illustrations of the formation of a charge trap memory transistor.

As illustrated in FIG. 30A, a silicon substrate with peripheral circuitry 3002 may be constructed with high temperature (greater than approximately 400° C.) resistant wiring, such as, for example, Tungsten. The peripheral circuitry substrate 3002 may comprise memory control circuits as well as circuitry for other purposes and of various types, such as, for example, analog, digital, RF, or memory. The peripheral circuitry substrate 3002 may comprise peripheral circuits that can withstand an additional rapid-thermal-anneal (RTA) and still remain operational and retain good performance. For this purpose, the peripheral circuits may be formed such that they have not been subject to a weak RTA or no RTA for activating dopants. The top surface of the peripheral circuitry substrate 3002 may be prepared for oxide wafer bonding with a deposition of a silicon oxide 3004, thus forming acceptor wafer 3014.

Figure 30B:
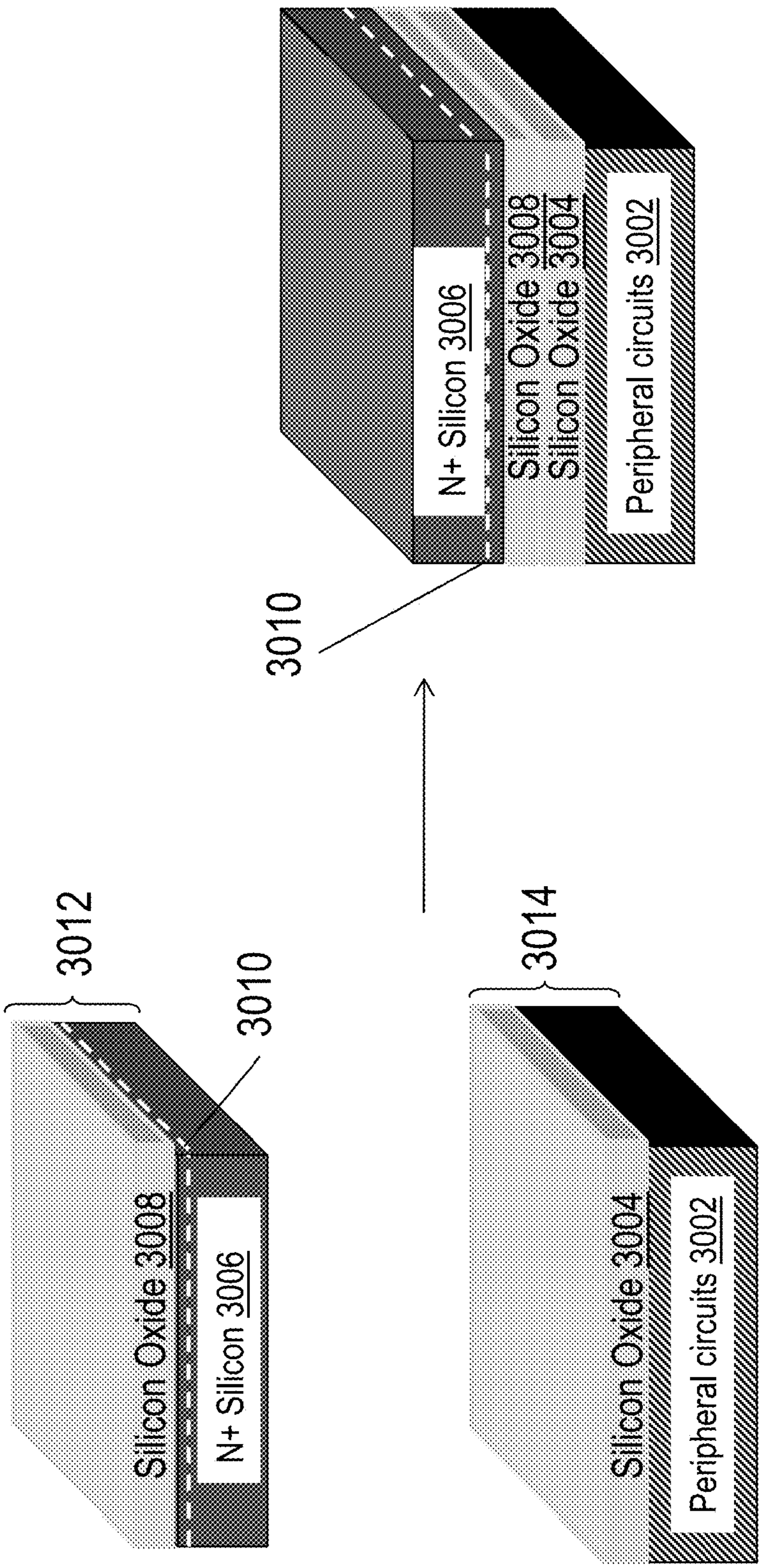

As illustrated in FIG. 30B, a mono-crystalline silicon donor wafer 3012 may be processed to comprise a wafer sized layer of N+ doping (not shown) which may have a different dopant concentration than the N+ substrate 3006. The N+ doping layer may be formed by ion implantation and thermal anneal. A screen oxide 3008 may be grown or deposited prior to the implant to protect the silicon from implant contamination and to provide an oxide surface for later wafer to wafer bonding. A layer transfer demarcation plane 3010 (shown as a dashed line) may be formed in donor wafer 3012 within the N+ substrate 3006 or the N+ doping layer (not shown) by hydrogen implantation or other methods as previously described. Both the donor wafer 3012 and acceptor wafer 3014 may be prepared for wafer bonding as previously described and then bonded at the surfaces of oxide layer 3004 and oxide layer 3008, at a low temperature (less than approximately 400° C.) preferred for lowest stresses, or a moderate temperature (less than approximately 900° C.).

Figure 30C:
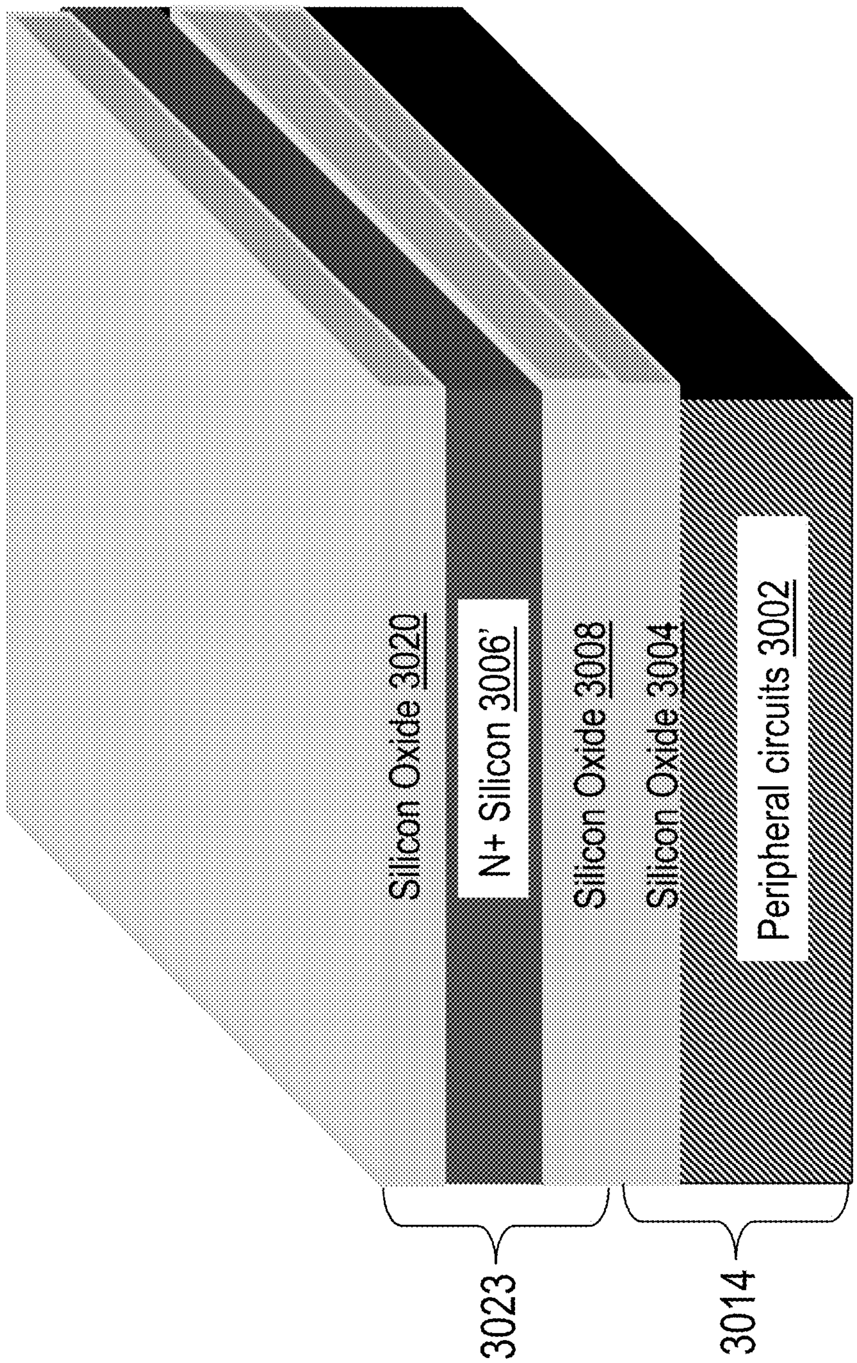

As illustrated in FIG. 30C, the portion of the N+ layer (not shown) and the N+ wafer substrate 3006 that are above the layer transfer demarcation plane 3010 may be removed by cleaving and polishing, or other processes as previously described, such as, for example, ion-cut or other methods, thus forming the remaining mono-crystalline silicon N+ layer 3006'. Remaining N+ layer 3006' and oxide layer 3008 have been layer transferred to acceptor wafer 3014. The top surface of N+ layer 3006' may be chemically or mechanically polished smooth and flat. Oxide layer 3020 may be deposited to prepare the surface for later oxide to oxide bonding. This now forms the first Si/SiO2 layer 3023 which includes silicon oxide layer 3020, N+ silicon layer 3006', and oxide layer 3008.

Figure 30D:
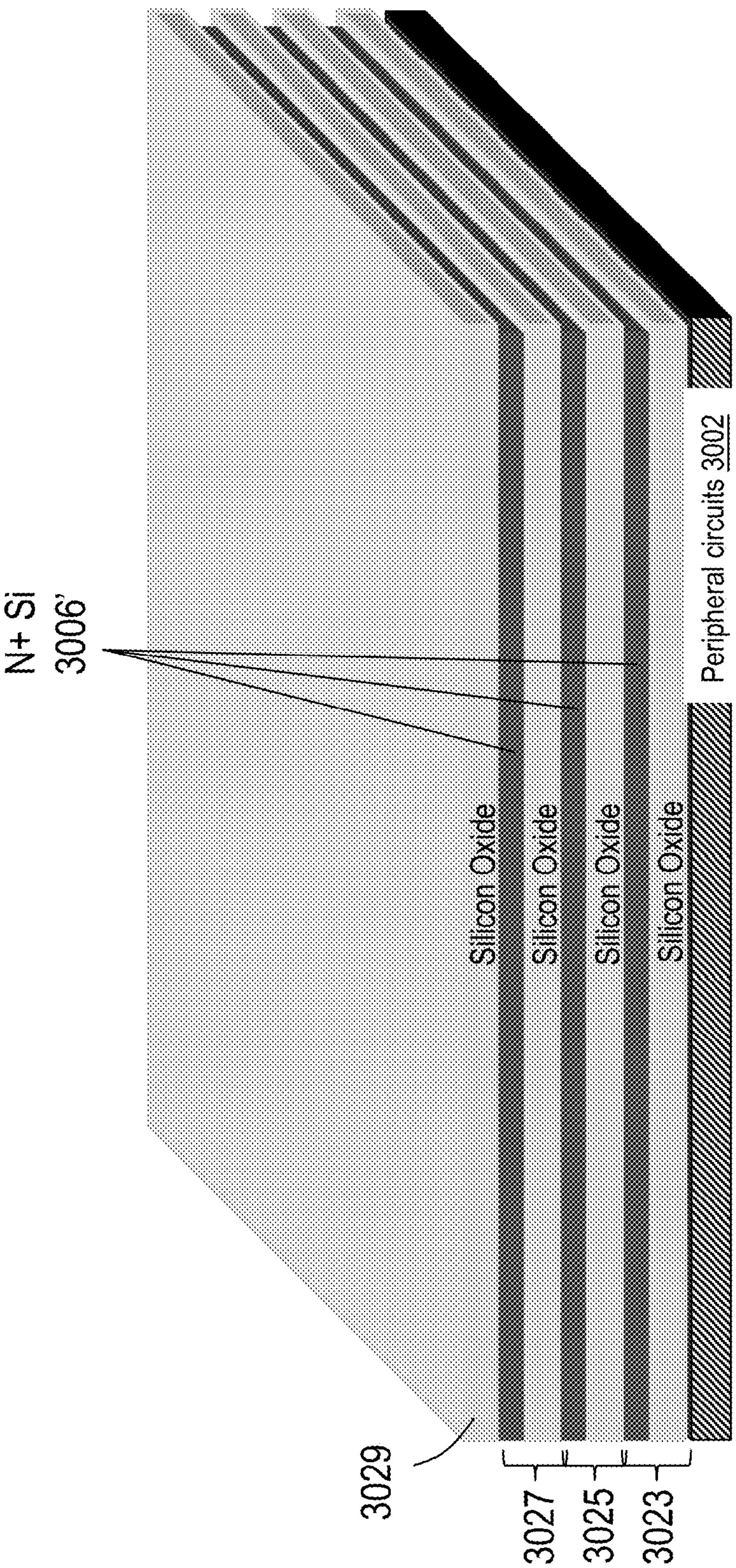

As illustrated in FIG. 30D, additional Si/SiO2 layers, such as, for example, second Si/SiO2 layer 3025 and third Si/SiO2 layer 3027, may each be formed as described in FIGS. 30A to 30C. Oxide layer 3029 may be deposited to electrically isolate the top N+ silicon layer.

Figure 30E:
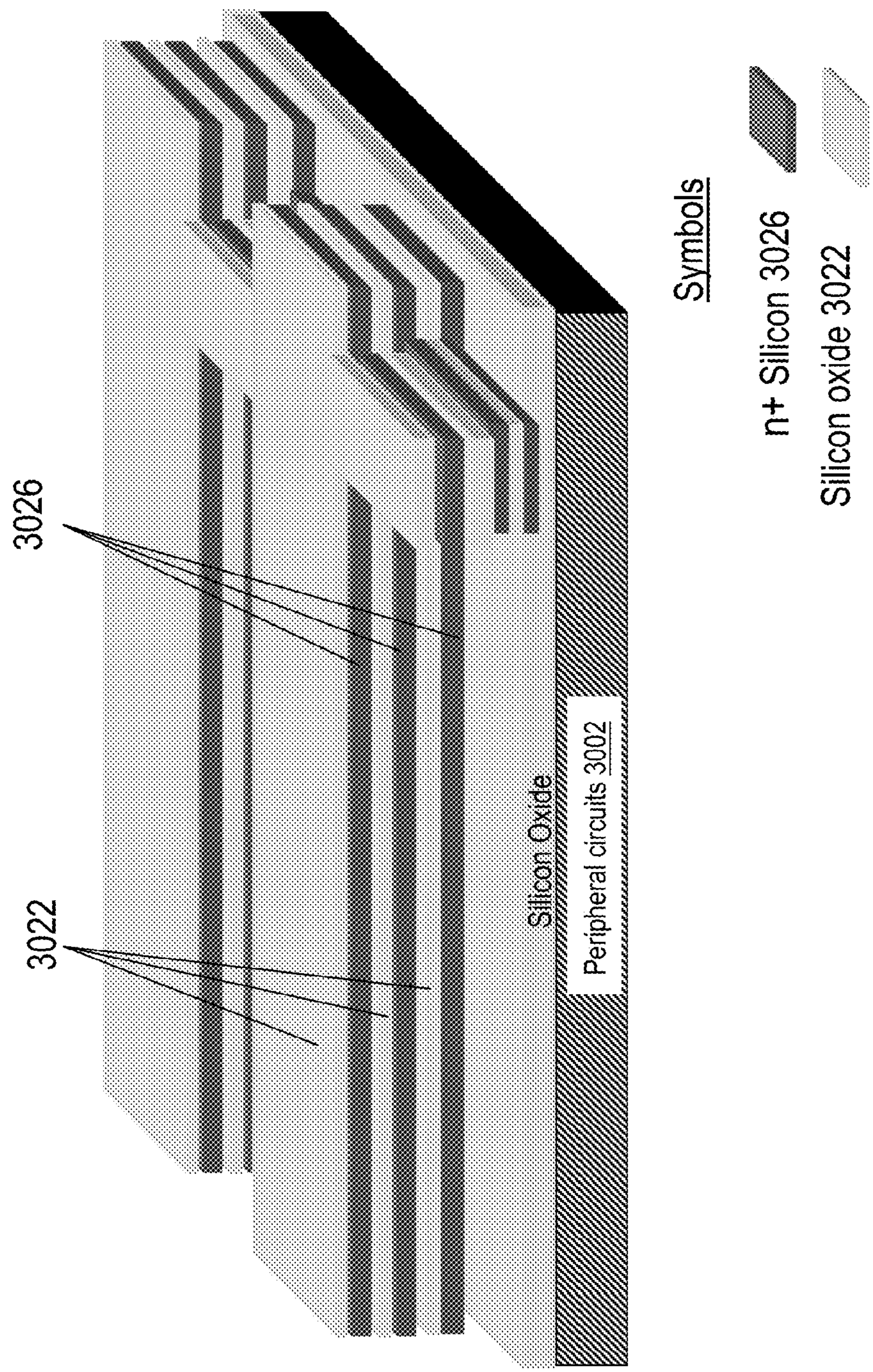

As illustrated in FIG. 30E, oxide 3029, third Si/SiO2 layer 3027, second Si/SiO2 layer 3025 and first Si/SiO2 layer 3023 may be lithographically defined and plasma/RIE etched to form a portion of the memory cell structure, which now comprises regions of N+ silicon 3026 and oxide 3022.

Figure 30F:
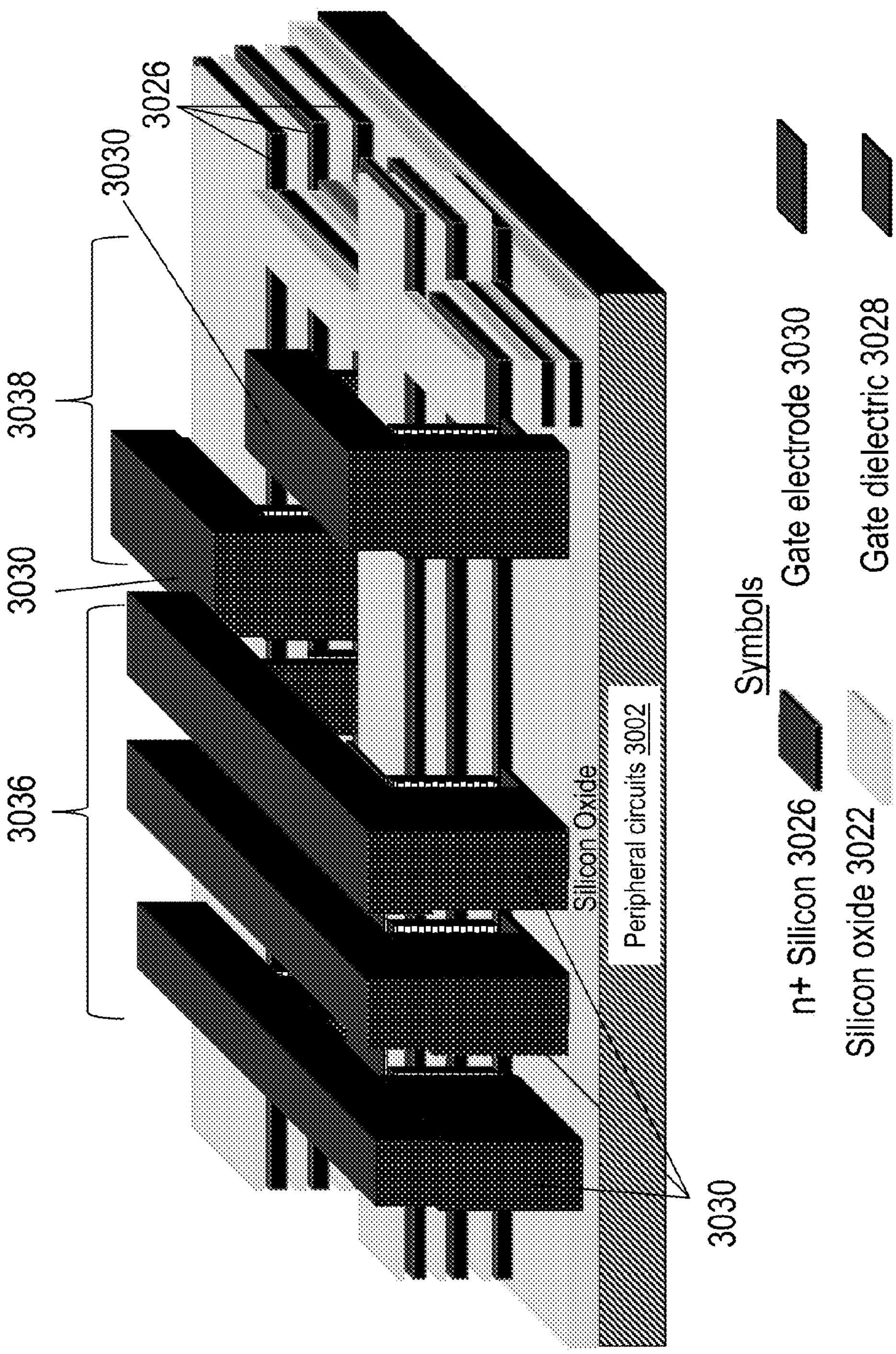

As illustrated in FIG. 30F, a gate stack may be formed with growth or deposition of a charge trap gate dielectric layer, such as, for example, thermal oxide and silicon nitride layers (ONO: Oxide-Nitride-Oxide), and a gate metal electrode layer, such as, for example, doped or undoped poly-crystalline silicon. The gate metal electrode layer may then be planarized with chemical mechanical polishing. Alternatively, the charge trap gate dielectric layer may comprise silicon or III-V nano-crystals encased in an oxide. The select gate area 3038 may comprise a non-charge trap dielectric. The gate metal electrode regions 3030 and gate dielectric regions 3028 of both the NAND string area 3036 and select transistor area 3038 may be lithographically defined and plasma/RIE etched.

Figure 30G:
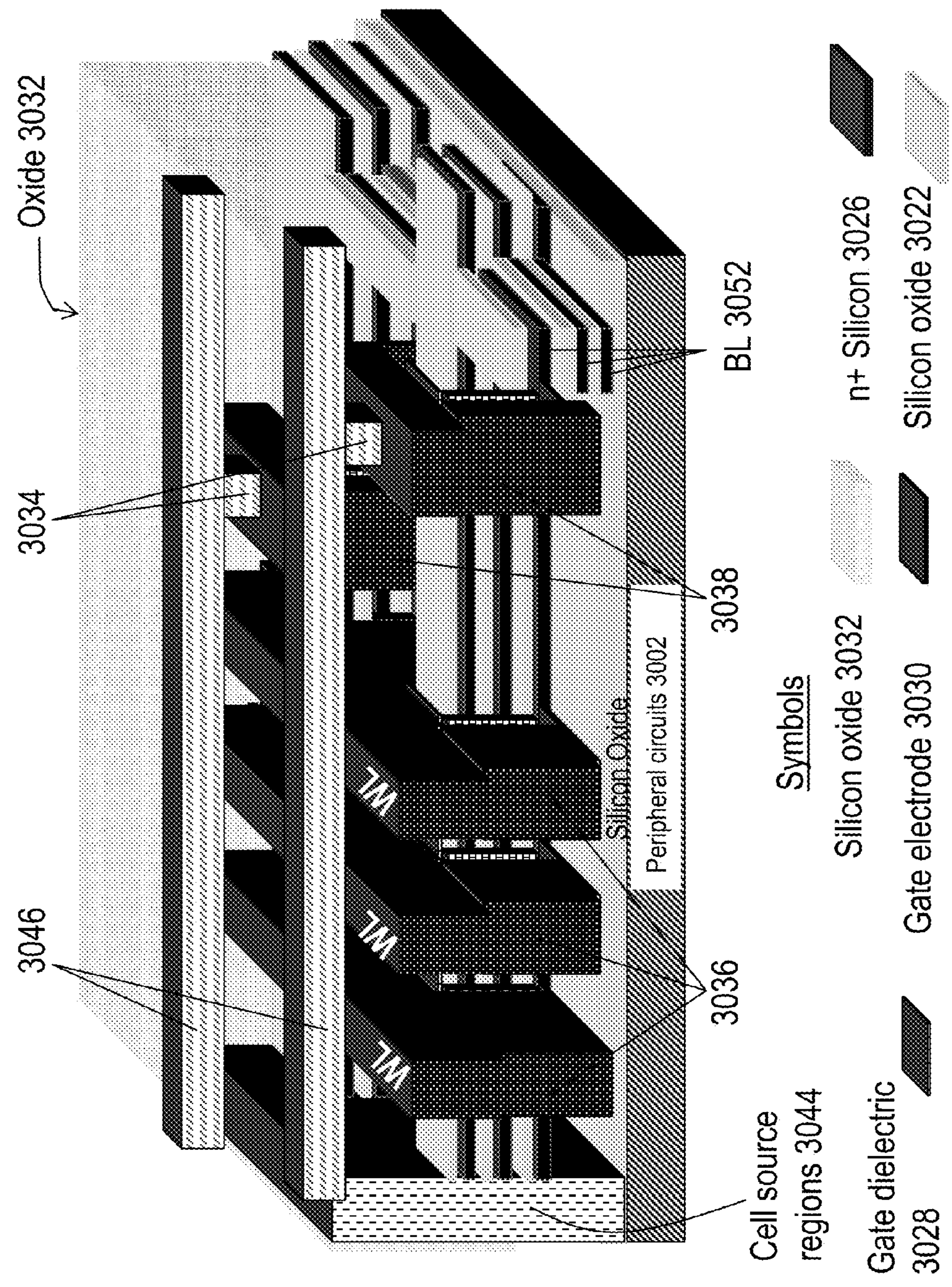

As illustrated in FIG. 30G, the entire structure may be substantially covered with a gap fill oxide 3032, which may be planarized with chemical mechanical polishing. The oxide 3032 is shown transparent in the figure for clarity. Select metal lines 3046 may be formed and connect to the associated select gate contacts 3034. Contacts and associated metal interconnect lines (not shown) may be formed for the WL and SL at the memory array edges. Word-line regions (WL) 3056, coupled with and composed of gate electrodes 3030, and bit-line regions (BL) 3052, composed of indicated N+ silicon regions 3026, are shown. Source regions 3044 may be formed by trench contact etch and fill to couple to the N+ silicon regions on the source end of the NAND string 3036. A thru layer via 3060 (not shown) may be formed to electrically couple the BL, SL, and WL metallization to the acceptor substrate 3014 peripheral circuitry via an acceptor wafer metal connect pad 3080 (not shown).

This flow enables the formation of a charge trap based 3D memory with zero additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 30A through 30G are exemplary only and are not drawn to scale. Such skilled persons will further appreciate that many variations are possible such as, for example, BL or SL contacts may be constructed in a staircase manner as described previously. Additionally, the stacked memory layer may be connected to a periphery circuit that is above the memory stack. Moreover, each tier of memory could be configured with a slightly different donor wafer N+ layer doping profile. Further, the memory could be organized in a different manner, such as BL and SL interchanged, or where buried wiring for the memory array is below the memory layers but above the periphery. Additional types of 3D charge trap memories may be constructed by layer transfer of mono-crystalline silicon; for example, those found in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. and "Multi-layered Vertical Gate NAND Flash overcoming stacking limit for terabit density storage", Symposium on VLSI Technology, 2009 by W. Kim, S. Choi, et al. Many other modifications within the scope of the invention will suggest themselves to such skilled persons after reading this specification. Thus the invention is to be limited only by the appended claims.

Floating gate (FG) memory devices are another form of popular commercial non-volatile memories. Floating gate devices store their charge in a conductive gate (FG) that is nominally isolated from unintentional electric fields, wherein the charge on the FG then influences the channel of a transistor. Background information on floating gate flash memory can be found in "Introduction to Flash memory", Proc. IEEE91, 489-502 (2003) by R. Bez, et al. The architectures shown in FIGS. 31 and 32 are relevant for any type of floating gate memory.

As illustrated in FIGS. 31A to 31G, a floating gate based 3D memory with two additional masking steps per memory layer may be constructed that is suitable for 3D IC manufacturing. This 3D memory utilizes NAND strings of floating gate transistors constructed in mono-crystalline silicon.

Figure 31A:
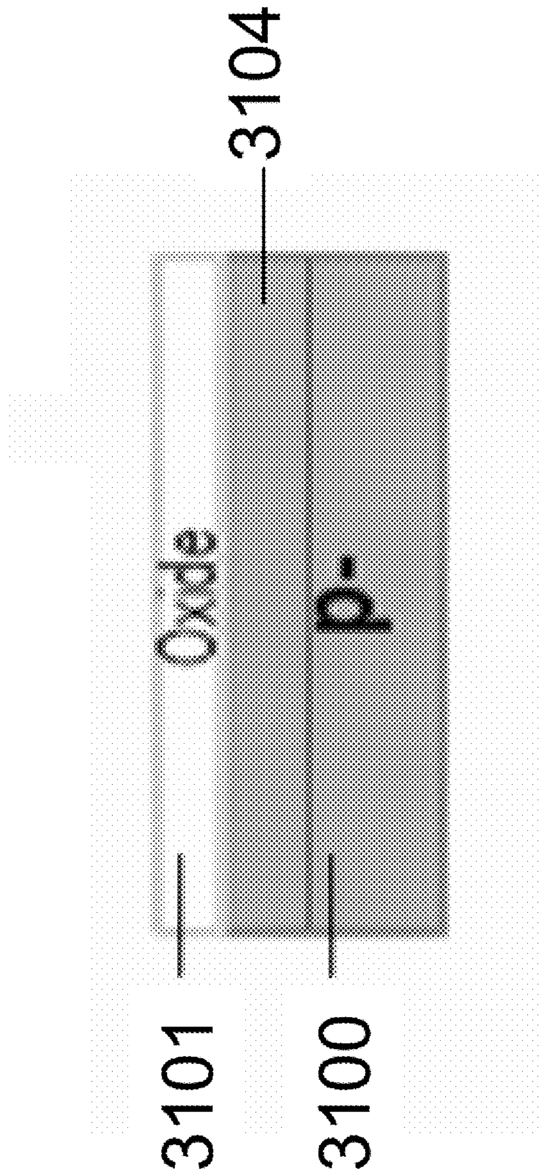
FIGS. 31A-G are exemplary drawing illustrations of the formation of a floating gate memory transistor.

As illustrated in FIG. 31A, a P− substrate donor wafer 3100 may be processed to comprise a wafer sized layer of P− doping 3104. The P-doped layer 3104 may have the same or a different dopant concentration than the P− substrate 3100. The P− doped layer 3104 may have a vertical dopant gradient. The P− doped layer 3104 may be formed by ion implantation and thermal anneal. A screen oxide 3101 may be grown before the implant to protect the silicon from implant contamination and to provide an oxide surface for later wafer to wafer bonding.

Figure 31B:
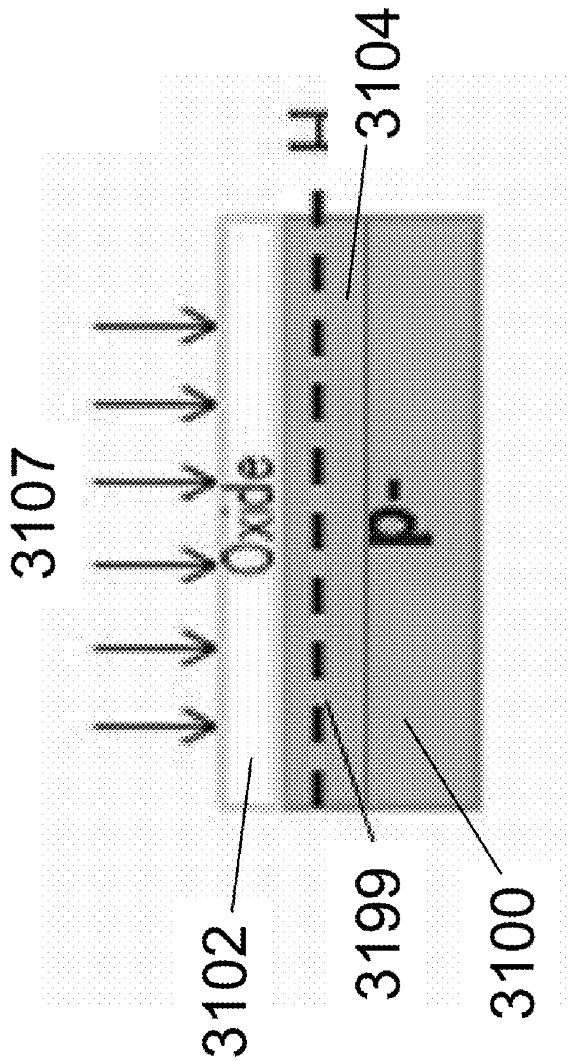

As illustrated in FIG. 31B, the top surface of donor wafer 3100 may be prepared for oxide wafer bonding with a deposition of an oxide 3102 or by thermal oxidation of the P− doped layer 3104 to form oxide layer 3102, or a re-oxidation of implant screen oxide 3101. A layer transfer demarcation plane 3199 (shown as a dashed line) may be formed in donor wafer 3100 or P− layer 3104 (shown) by hydrogen implantation 3107 or other methods as previously described. Both the donor wafer 3100 and acceptor wafer 3110 may be prepared for wafer bonding as previously described and then bonded, preferably at a low temperature (less than approximately 400° C.) to minimize stresses. The portion of the P− layer 3104 and the P− donor wafer substrate 3100 that are above the layer transfer demarcation plane 3199 may be removed by cleaving and polishing, or other processes as previously described, such as, for example, ion-cut or other methods.

Figure 31C:
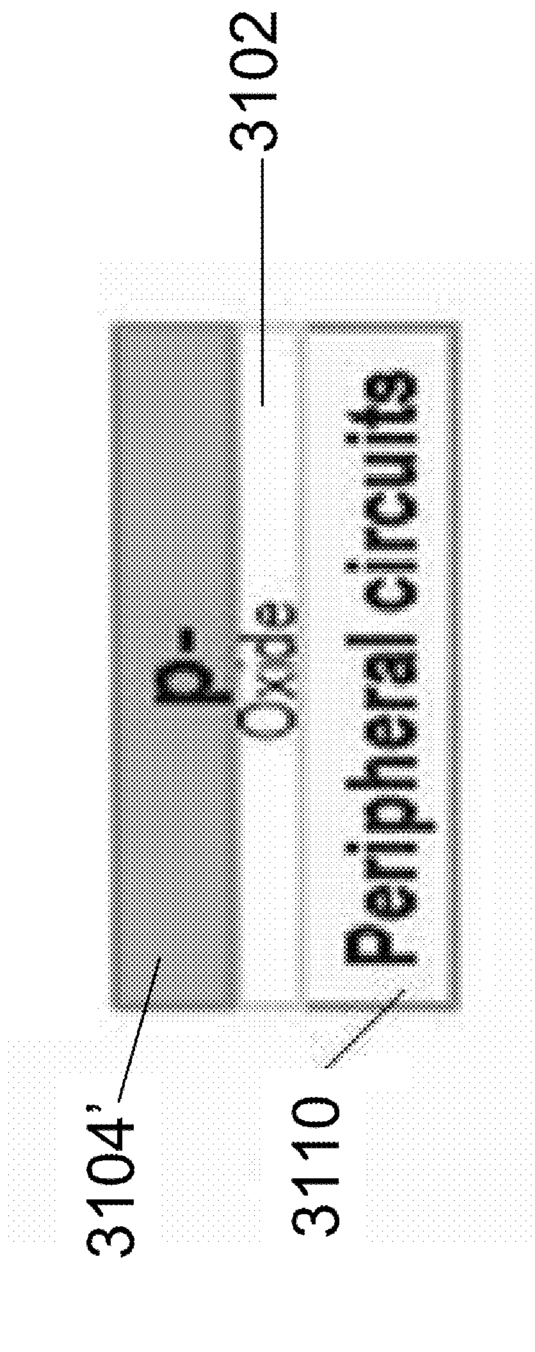

As illustrated in FIG. 31C, the remaining P− doped layer 3104', and oxide layer 3102 have been layer transferred to acceptor wafer 3110. Acceptor wafer 3110 may comprise peripheral circuits such that they can withstand an additional rapid-thermal-anneal (RTA) and still remain operational and retain good performance. For this purpose, the peripheral circuits may be formed such that they have not been subject to a weak RTA or no RTA for activating dopants. Also, the peripheral circuits may utilize a refractory metal such as, for example, tungsten that can withstand high temperatures greater than approximately 400° C. The top surface of P− doped layer 3104' may be chemically or mechanically polished smooth and flat. Now transistors may be formed and aligned to the acceptor wafer 3110 alignment marks (not shown).

Figure 31D:
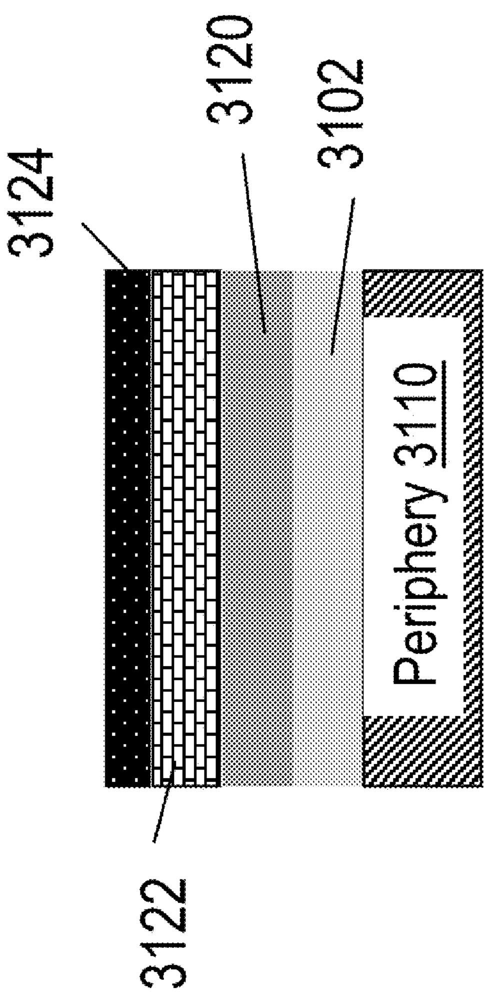

As illustrated in FIG. 31D a partial gate stack may be formed with growth or deposition of a tunnel oxide 3122, such as, for example, thermal oxide, and a FG gate metal material 3124, such as, for example, doped or undoped poly-crystalline silicon. Shallow trench isolation (STI) oxide regions (not shown) may be lithographically defined and plasma/RIE etched to at least the top level of oxide layer 3102 removing regions of P− mono-crystalline silicon layer 3104', thus forming P− doped regions 3120. A gap-fill oxide may be deposited and CMP'ed flat to form conventional STI oxide regions (not shown).

Figure 31E:
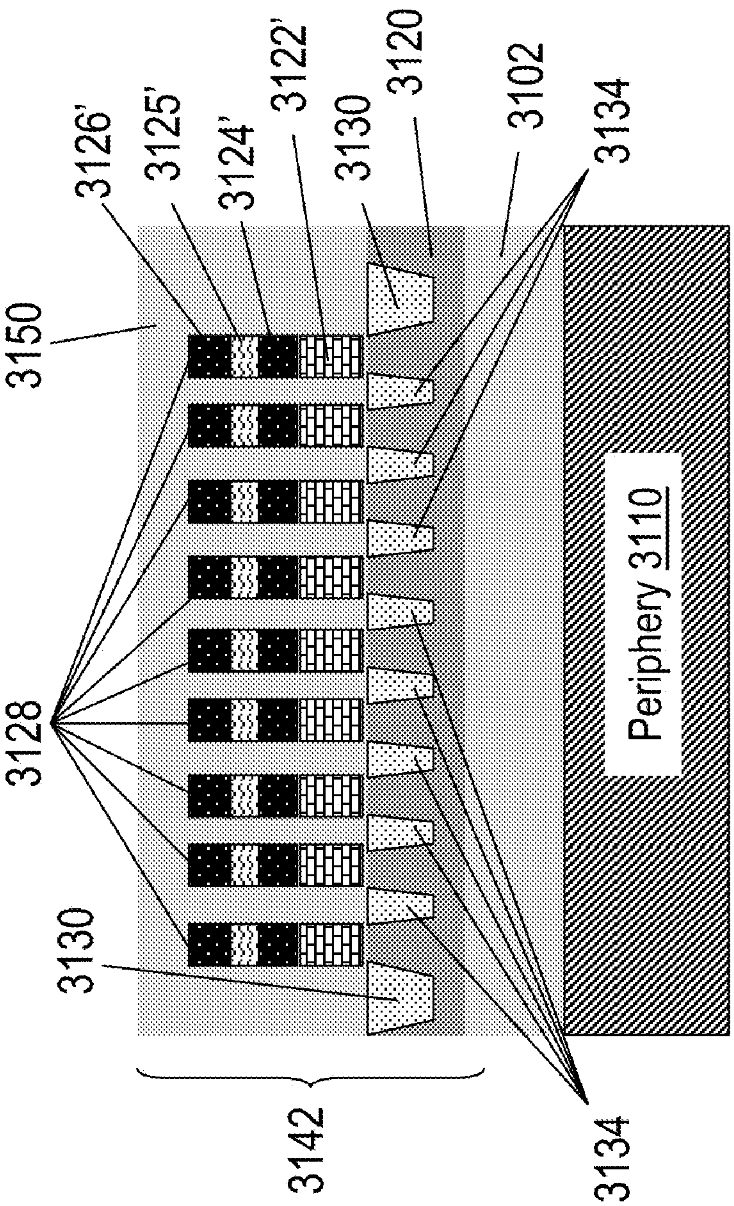

As illustrated in FIG. 31E, an inter-poly oxide layer 3125, such as, for example, silicon oxide and silicon nitride layers (ONO: Oxide-Nitride-Oxide), and a Control Gate (CG) gate metal material 3126, such as, for example, doped or undoped poly-crystalline silicon, may be deposited. The gate stacks 3128 may be lithographically defined and plasma/RIE etched removing regions of CG gate metal material 3126, inter-poly oxide layer 3125, FG gate metal material 3124, and tunnel oxide 3122. This results in the gate stacks 3128 comprised of CG gate metal regions 3126', inter-poly oxide regions 3125', FG gate metal regions 3124, and tunnel oxide regions 3122'. Only one gate stack 3128 is annotated with region tie lines for clarity. A self aligned N+ source and drain implant may be performed to create inter-transistor source and drains 3134 and end of NAND string source and drains 3130. Finally, the entire structure may be substantially covered with a gap fill oxide 3150, which may be planarized with chemical mechanical polishing. The oxide surface may be prepared for oxide to oxide wafer bonding as previously described. This now forms the first tier of memory transistors 3142 which includes silicon oxide layer 3150, gate stacks 3128, inter-transistor source and drains 3134, end of NAND string source and drains 3130, P− silicon regions 3120, and oxide 3102.

Figure 31F:
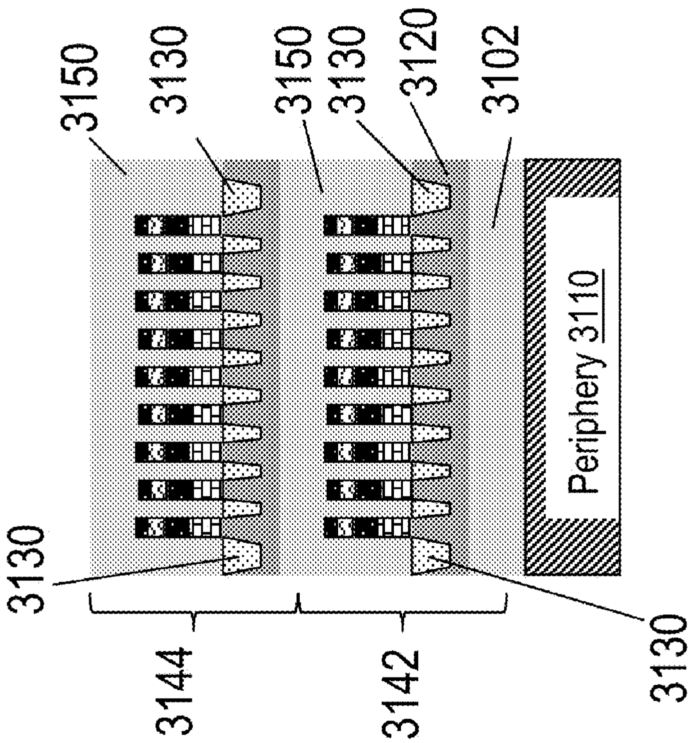

As illustrated in FIG. 31F, the transistor layer formation, bonding to acceptor wafer 3110 oxide 3150, and subsequent transistor formation as described in FIGS. 31A to 31D may be repeated to form the second tier 3144 of memory transistors on top of the first tier of memory transistors 3142. After substantially all the desired memory layers are constructed, a rapid thermal anneal (RTA) may be conducted to activate the dopants in substantially all of the memory layers and in the acceptor substrate 3110 peripheral circuits. Alternatively, optical anneals, such as, for example, a laser based anneal, may be performed.

Figure 31G:
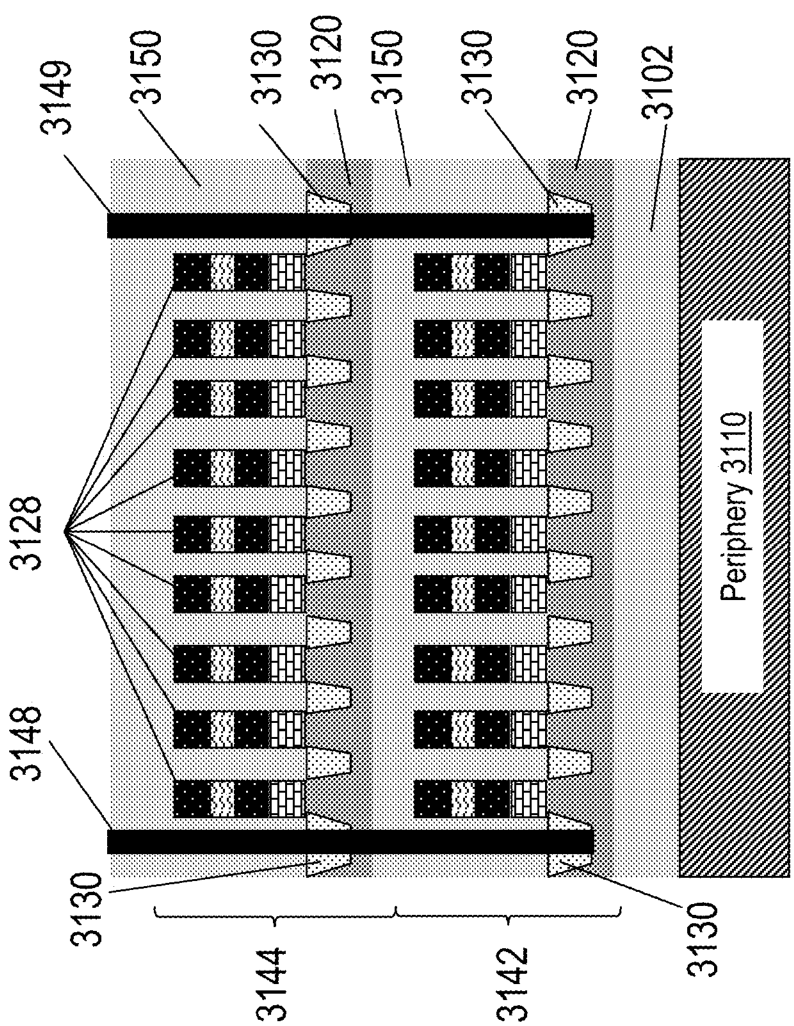

As illustrated in FIG. 31G, source line (SL) ground contact 3148 and bit line contact 3149 may be lithographically defined, etched with plasma/RIE through oxide 3150, end of NAND string source and drains 3130, and P− regions 3120 of each memory tier, and associated oxide vertical isolation regions to connect substantially all memory layers vertically, and photoresist removed. Metal or heavily doped poly-crystalline silicon may be utilized to fill the contacts and metallization utilized to form BL and SL wiring (not shown). The gate stacks 3128 may be connected with a contact and metallization to form the word-lines (WLs) and WL wiring (not shown). A thru layer via 3160 (not shown) may be formed to electrically couple the BL, SL, and WL metallization to the acceptor substrate 3110 peripheral circuitry via an acceptor wafer metal connect pad 3180 (not shown).

This flow enables the formation of a floating gate based 3D memory with two additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 31A through 31G are exemplary only and are not drawn to scale. Such skilled persons will further appreciate that many variations are possible such as, for example, BL or SL select transistors may be constructed within the process flow. Additionally, the stacked memory layer may be connected to a periphery circuit that is above the memory stack. Moreover, each tier of memory could be configured with a slightly different donor wafer P− layer doping profile. Further, the memory could be organized in a different manner, such as BL and SL interchanged, or where buried wiring for the memory array is below the memory layers but above the periphery. Many other modifications within the scope of the invention will suggest themselves to such skilled persons after reading this specification. Thus the invention is to be limited only by the appended claims.

As illustrated in FIGS. 32A to 32H, a floating gate based 3D memory with one additional masking step per memory layer 3D memory may be constructed that is suitable for 3D IC manufacturing. This 3D memory utilizes 3D floating gate junction-less transistors constructed in mono-crystalline silicon.

Figure 32A:
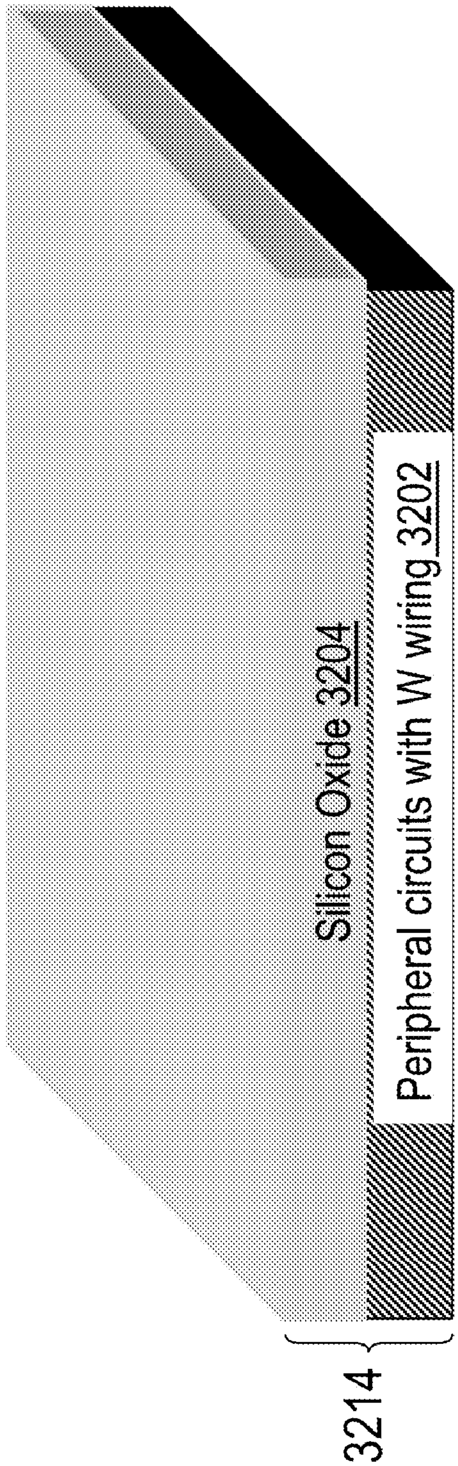
FIGS. 32A-H are exemplary drawing illustrations of the formation of a floating gate memory transistor.

As illustrated in FIG. 32A, a silicon substrate with peripheral circuitry 3202 may be constructed with high temperature (greater than approximately 400° C.) resistant wiring, such as, for example, Tungsten. The peripheral circuitry substrate 3202 may comprise memory control circuits as well as circuitry for other purposes and of various types, such as, for example, analog, digital, RF, or memory. The peripheral circuitry substrate 3202 may comprise peripheral circuits that can withstand an additional rapid-thermal-anneal (RTA) and still remain operational and retain good performance. For this purpose, the peripheral circuits may be formed such that they have not been subject to a weak RTA or no RTA for activating dopants. The top surface of the peripheral circuitry substrate 3202 may be prepared for oxide wafer bonding with a deposition of a silicon oxide 3204, thus forming acceptor wafer 3214.

Figure 32B:
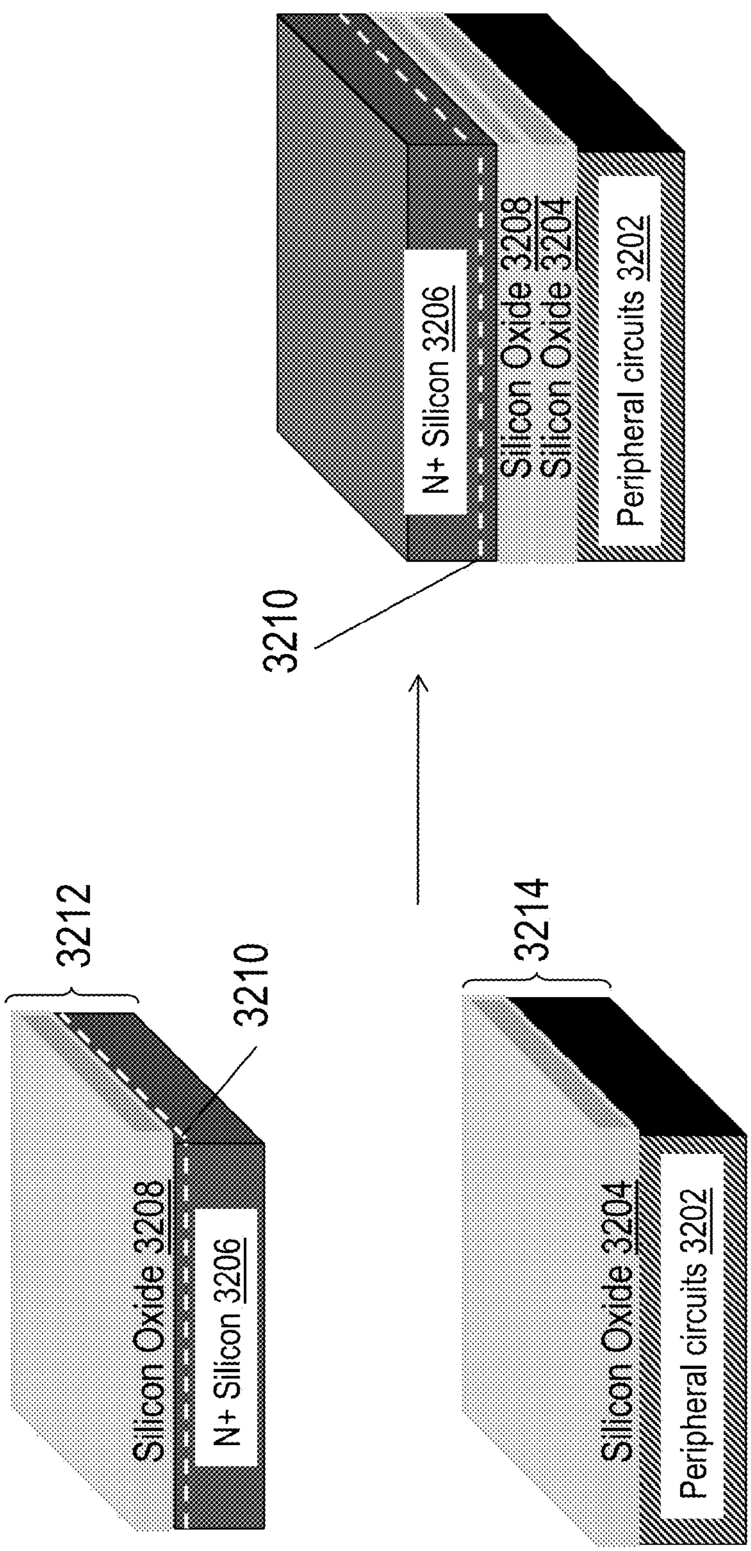

As illustrated in FIG. 32B, a mono-crystalline N+ doped silicon donor wafer 3212 may be processed to comprise a wafer sized layer of N+ doping (not shown) which may have a different dopant concentration than the N+ substrate 3206. The N+ doping layer may be formed by ion implantation and thermal anneal. A screen oxide 3208 may be grown or deposited prior to the implant to protect the silicon from implant contamination and to provide an oxide surface for later wafer to wafer bonding. A layer transfer demarcation plane 3210 (shown as a dashed line) may be formed in donor wafer 3212 within the N+ substrate 3206 or the N+ doping layer (not shown) by hydrogen implantation or other methods as previously described. Both the donor wafer 3212 and acceptor wafer 3214 may be prepared for wafer bonding as previously described and then bonded at the surfaces of oxide layer 3204 and oxide layer 3208, at a low temperature (less than approximately 400° C.) preferred for lowest stresses, or a moderate temperature (less than approximately 900° C.).

Figure 32C:
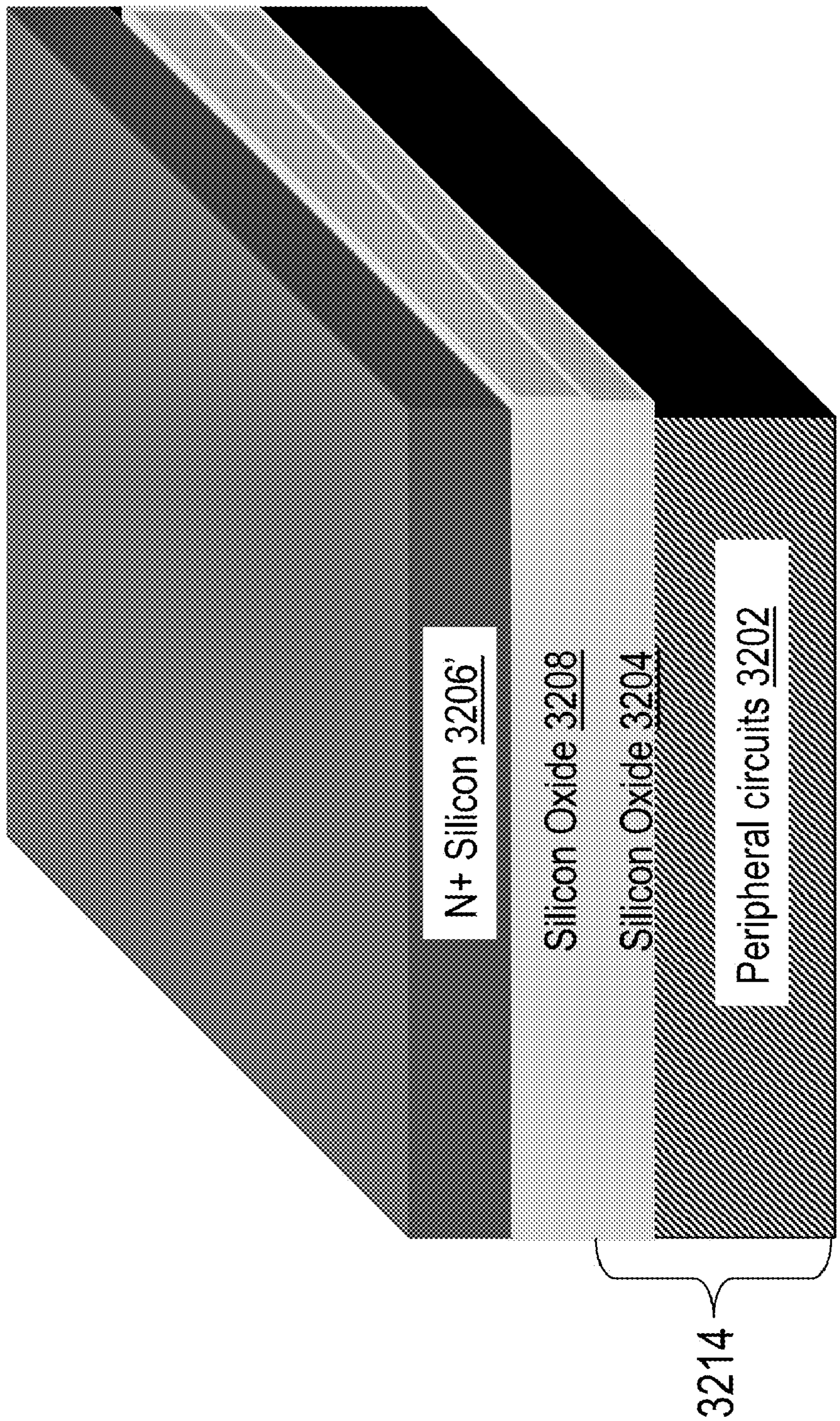

As illustrated in FIG. 32C, the portion of the N+ layer (not shown) and the N+ wafer substrate 3206 that are above the layer transfer demarcation plane 3210 may be removed by cleaving and polishing, or other processes as previously described, such as, for example, ion-cut or other methods, thus forming the remaining mono-crystalline silicon N+ layer 3206'. Remaining N+ layer 3206' and oxide layer 3208 have been layer transferred to acceptor wafer 3214. The top surface of N+ layer 3206' may be chemically or mechanically polished smooth and flat. Now transistors or portions of transistors may be formed and aligned to the acceptor wafer 3214 alignment marks (not shown).

Figure 32D:
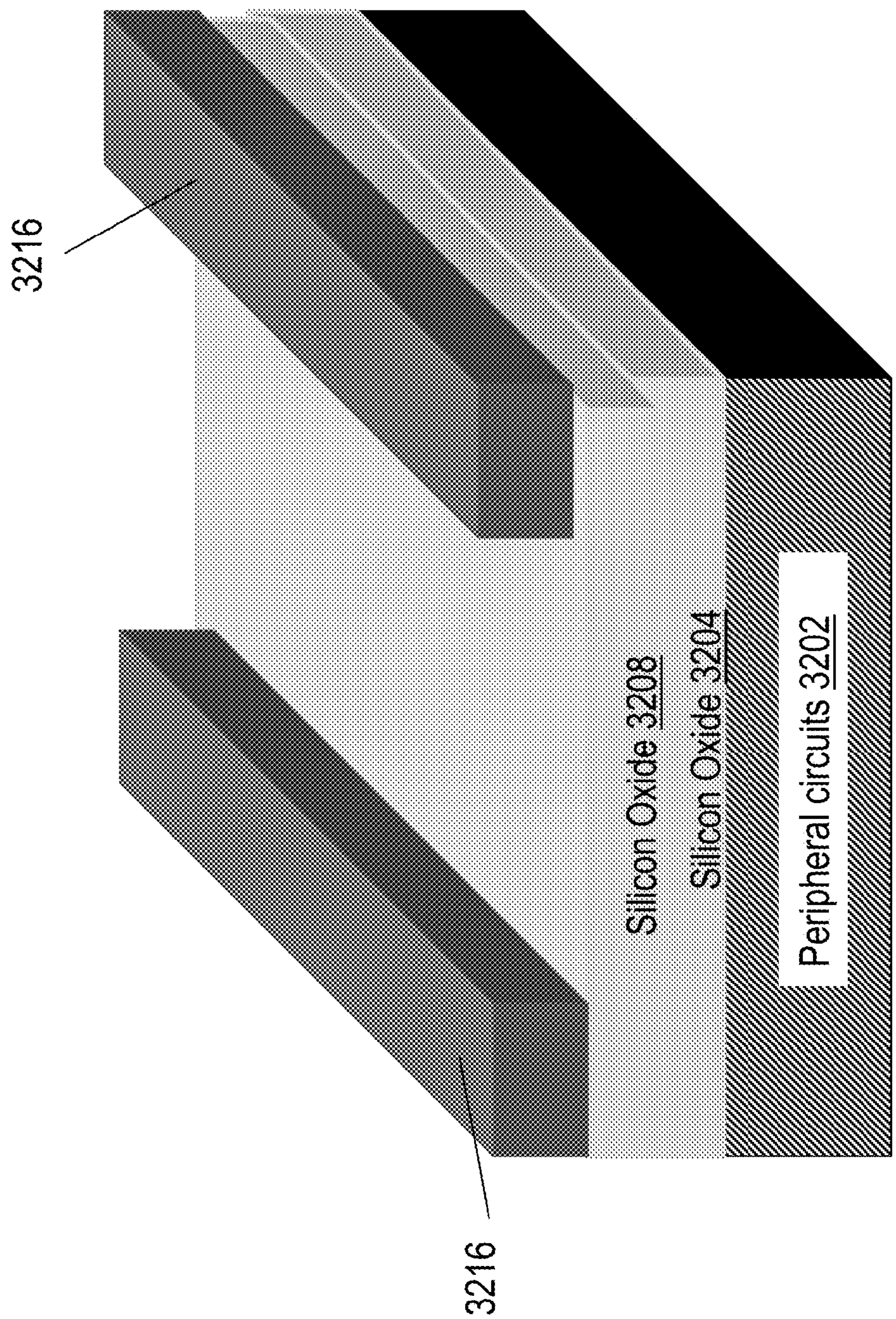

As illustrated in FIG. 32D N+ regions 3216 may be lithographically defined and then etched with plasma/RIE removing regions of N+ layer 3206' and stopping on or partially within oxide layer 3208.

Figure 32E:
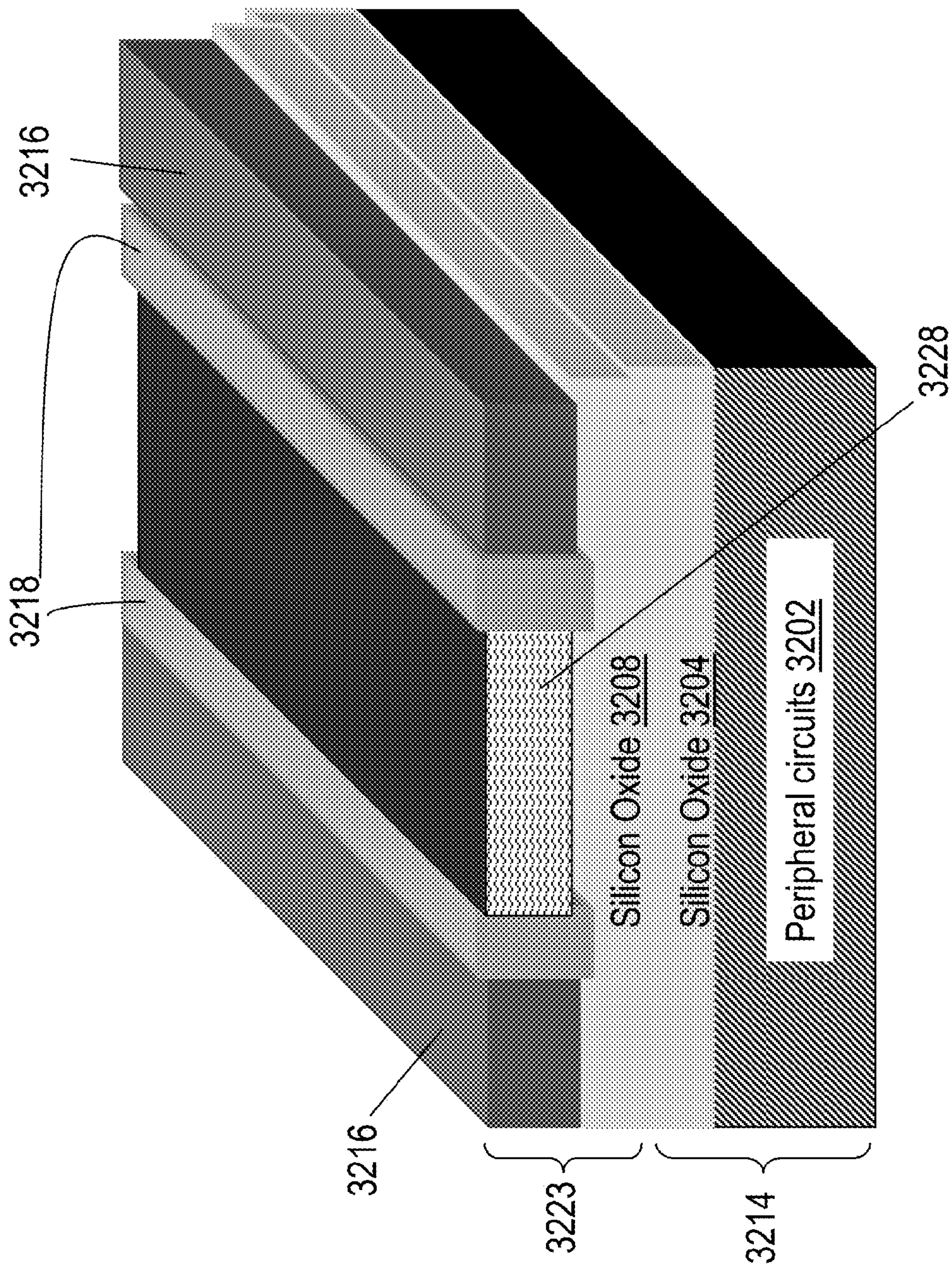

As illustrated in FIG. 32E a tunneling dielectric 3218 may be grown or deposited, such as, for example, thermal silicon oxide, and a floating gate (FG) material 3228, such as, for example, doped or undoped poly-crystalline silicon, may be deposited. The structure may be planarized by chemical mechanical polishing to approximately the level of the N+ regions 3216. The surface may be prepared for oxide to oxide wafer bonding as previously described, such as, for example, a deposition of a thin oxide. This now forms the first memory layer 3223 which includes future FG regions 3228, tunneling dielectric 3218, N+ regions 3216 and oxide 3208.

Figure 32F:
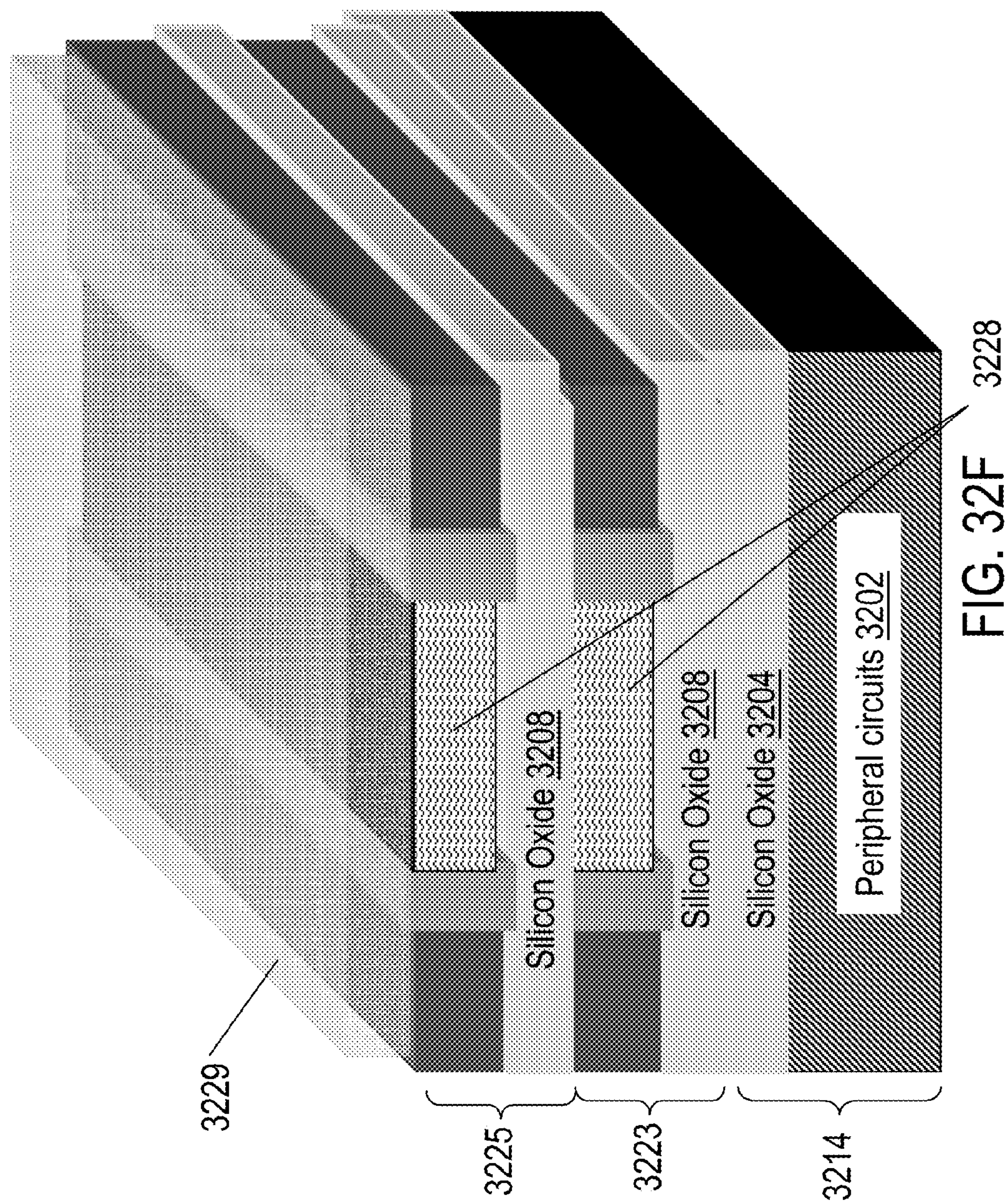

As illustrated in FIG. 32F, the N+ layer formation, bonding to an acceptor wafer, and subsequent memory layer formation as described in FIGS. 32A to 32E may be repeated to form the second layer 3225 of memory on top of the first memory layer 3223. A layer of oxide 3229 may then be deposited.

Figure 32G:
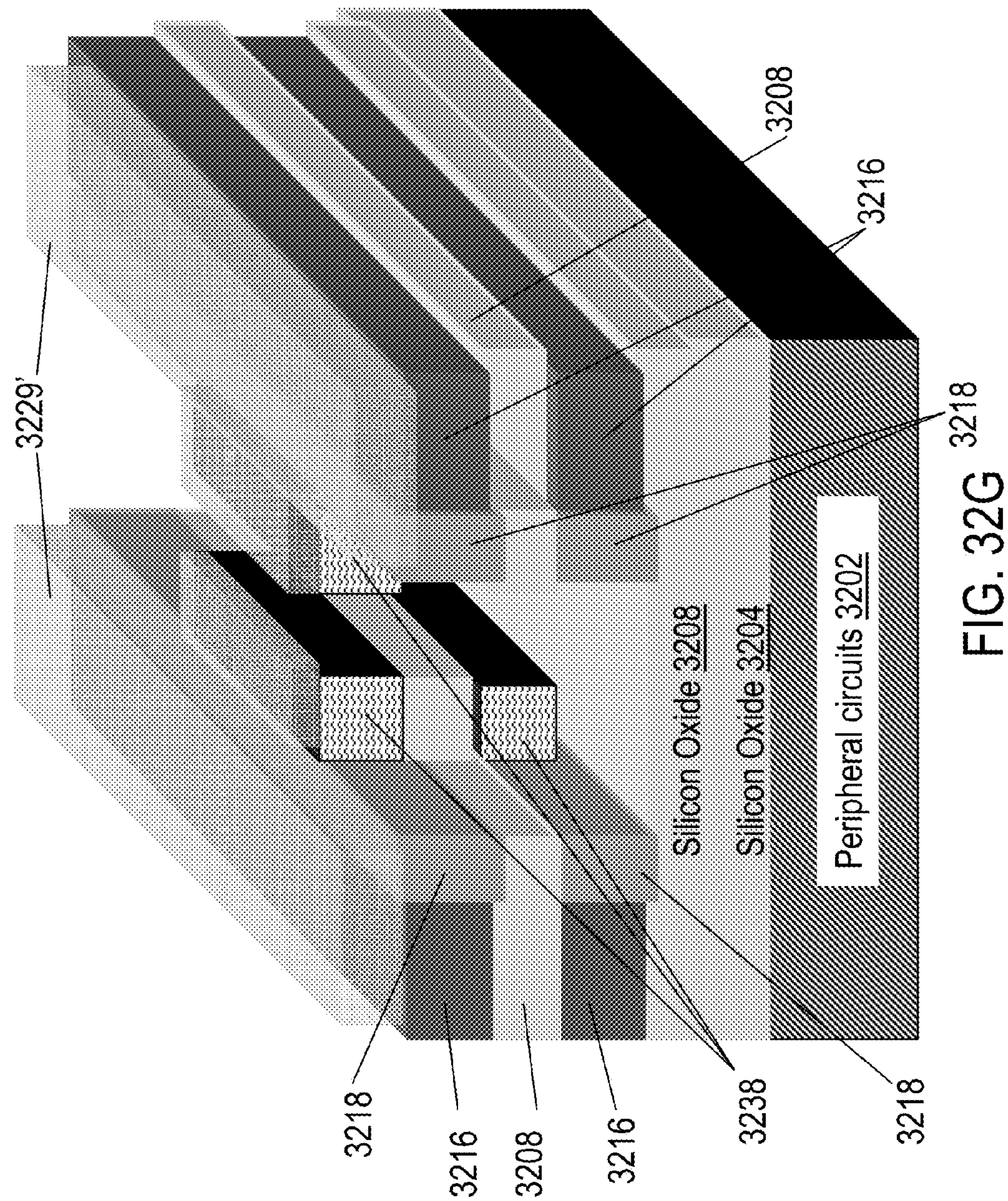

As illustrated in FIG. 32G, FG regions 3238 may be lithographically defined and then etched with plasma/RIE removing portions of oxide layer 3229, future FG regions 3228 and oxide layer 3208 on the second layer of memory 3225 and future FG regions 3228 on the first layer of memory 3223, stopping on or partially within oxide layer 3208 of the first memory layer 3223.

Figure 32H:
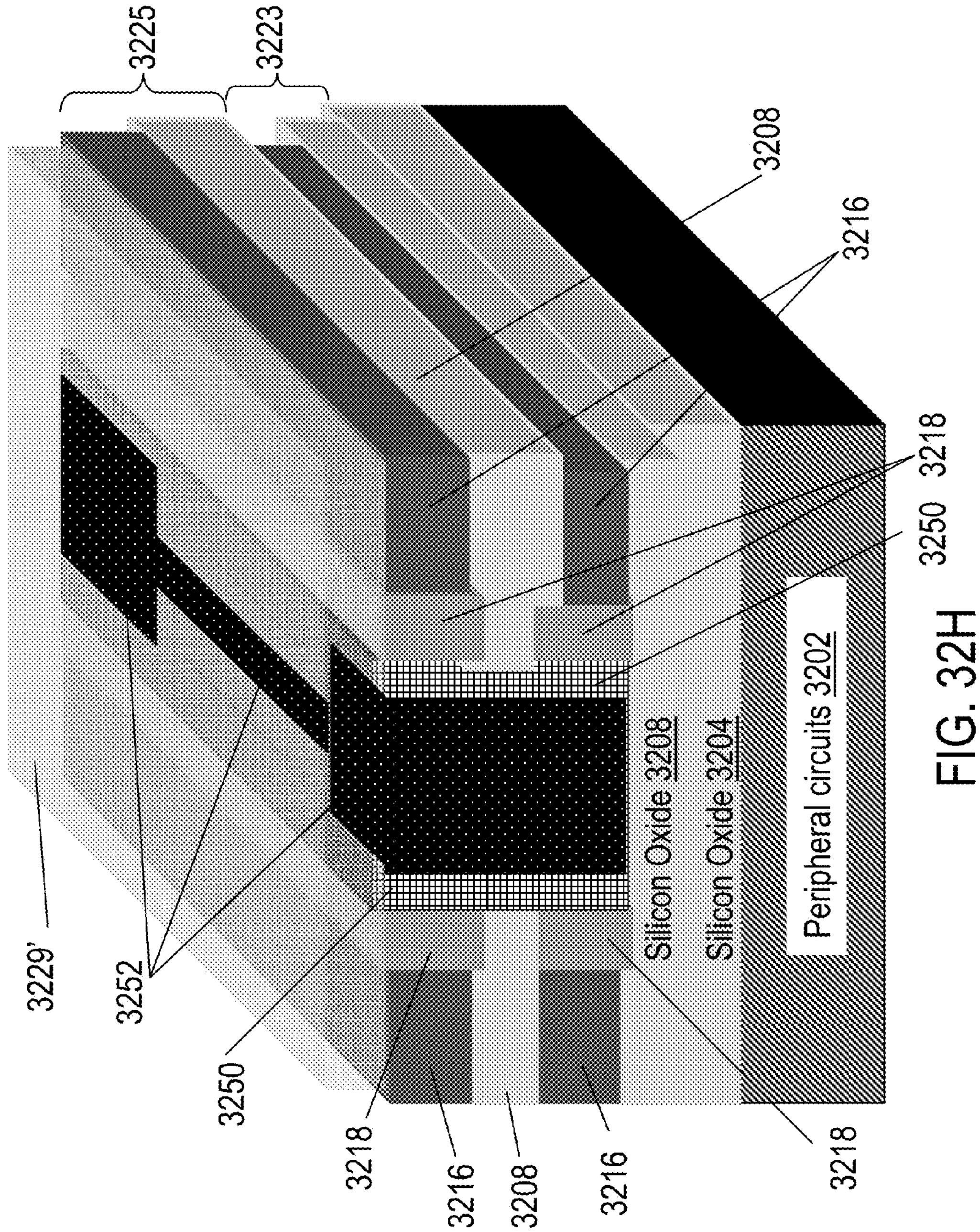

As illustrated in FIG. 32H, an inter-poly oxide layer 3250, such as, for example, silicon oxide and silicon nitride layers (ONO: Oxide-Nitride-Oxide), and a Control Gate (CG) gate material 3252, such as, for example, doped or undoped poly-crystalline silicon, may be deposited. The surface may be planarized by chemical mechanical polishing leaving a thinned oxide layer 3229'. As shown in the illustration, this results in the formation of 4 horizontally oriented floating gate memory cells with N+ junction-less transistors. Contacts and metal wiring to form well-know memory access/decoding schemes may be processed and a thru layer via may be formed to electrically couple the memory access decoding to the acceptor substrate peripheral circuitry via an acceptor wafer metal connect pad.

This flow enables the formation of a floating gate based 3D memory with one additional masking step per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 32A through 32H are exemplary only and are not drawn to scale. Such skilled persons will further appreciate that many variations are possible such as, for example, memory cell control lines could be built in a different layer rather than the same layer. Additionally, the stacked memory layers may be connected to a periphery circuit that is above the memory stack. Moreover, each tier of memory could be configured with a slightly different donor wafer N+ layer doping profile. Further, the memory could be organized in a different manner, such as BL and SL interchanged, or these architectures could be modified into a NOR flash memory style, or where buried wiring for the memory array is below the memory layers but above the periphery. Many other modifications within the scope of the invention will suggest themselves to such skilled persons after reading this specification.

The Following Sections Discuss Embodiments to the Invention Wherein Wafer or Die-Sized Sized Pre-Formed Repeating Strips of Layers in a Donor Wafer are Transferred onto an Acceptor Wafer and then Processed to Create 3D ICs.

An embodiment of this invention is to pre-process a donor wafer by forming repeating wafer-sized or die-sized strips of layers of various materials without a forming process temperature restriction, then layer transferring the pre-processed donor wafer to the acceptor wafer, and processing with either low temperature (below approximately 400° C.) or high temperature (greater than approximately 400° C.) after the layer transfer to form device structures, such as, for example, transistors, on or in the donor wafer that may be physically aligned and may be electrically coupled to the acceptor wafer.

Figure 33A:
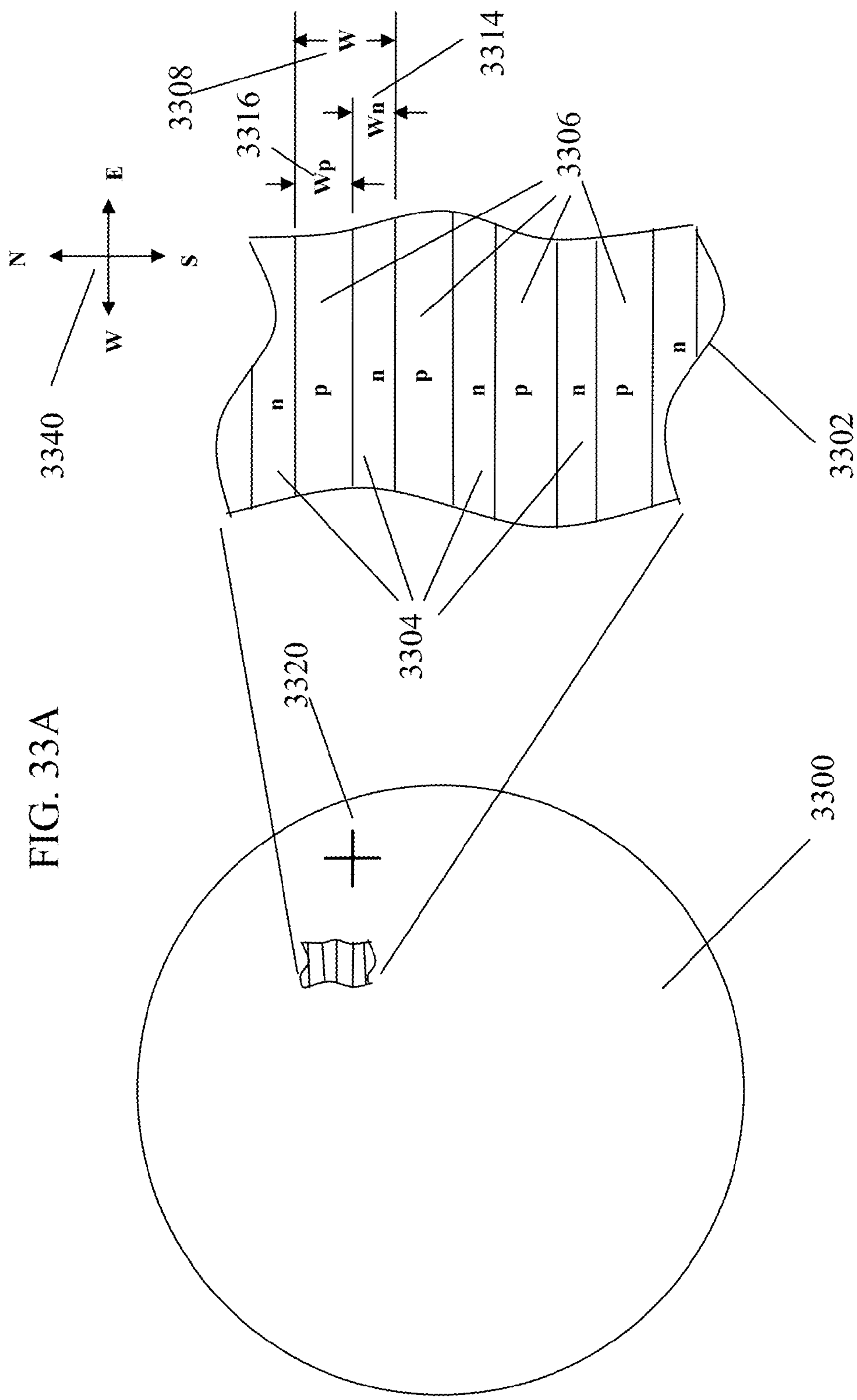
FIG. 33A is a exemplary drawing illustration of a donor wafer.

As illustrated in FIG. 33A, a generalized process flow may begin with a donor wafer 3300 that is preprocessed with repeating strips across the wafer or die of conducting, semiconducting or insulating materials that may be formed by deposition, ion implantation and anneal, oxidation, epitaxial growth, combinations of above, or other semiconductor processing steps and methods. For example, a repeating pattern of n-type strips 3304 and p-type strips 3306 may be constructed on donor wafer 3300 and are drawn in illustration blow-up area 3302. The width of the n-type strips 3304 is Wn 3314 and the width of the p-type strips 3306 is Wp 3316. Their sum W 3308 is the width of the repeating pattern. A four cardinal directions indicator 3340 will be used to assist the explanation. The strips traverse from East to West and the alternating repeats from North to South. The donor wafer strips 3304 and 3306 may extend in length from East to Westby the acceptor die width plus the maximum donor wafer to acceptor wafer misalignment, or alternatively, may extend the entire length of a donor wafer from East to West. Donor wafer 3300 may have one or more donor alignment marks 3320. The donor wafer 3300 may be preprocessed with a layer transfer demarcation plane, such as, for example, a hydrogen implant cleave plane.

Figure 33B:
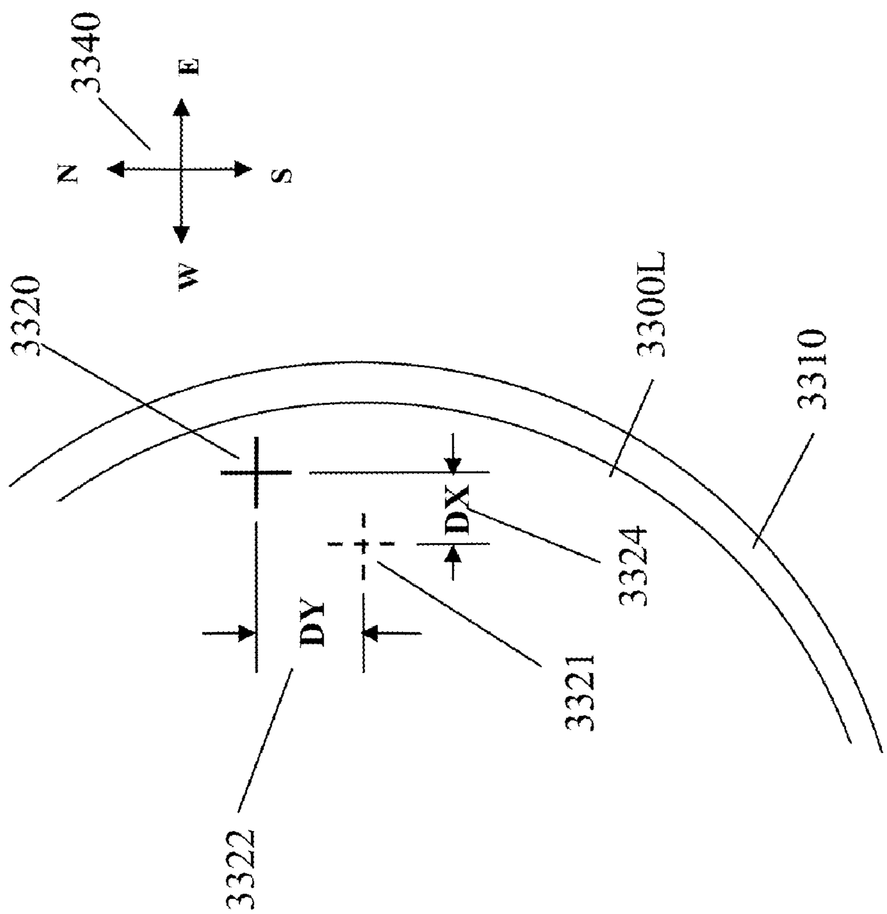
FIG. 33B is a exemplary drawing illustration of a transferred layer on top of a main wafer.

As illustrated in FIG. 33B, the donor wafer 3300 with a layer transfer demarcation plane may be flipped over, aligned, and bonded to the acceptor wafer 3310. Typically the donor wafer 3300 to acceptor wafer 3310 maximum misalignment due to the bonding processing may be approximately 1 micron. The acceptor wafer 3310 may be a preprocessed wafer that has fully functional circuitry or may be a wafer with previously transferred layers, or may be a blank carrier or holder wafer, or other kinds of substrates. The acceptor wafer 3310 and the donor wafer 3300 may be a bulk mono-crystalline silicon wafer or a Silicon On Insulator (SOI) wafer or a Germanium on Insulator (GeOI) wafer. Both the donor wafer 3300 and the acceptor wafer 3310 bonding surfaces may be prepared for wafer bonding by oxide depositions, polishes, plasma, or wet chemistry treatments to facilitate successful wafer to wafer bonding. The donor wafer 3300 may be cleaved at or thinned to the layer transfer demarcation plane, leaving a portion of the donor wafer 3300L and the pre-processed strips and layers such as, for example, n-type strips 3304 and p-type strips 3306.

As further illustrated in FIG. 33B, the remaining donor wafer portion 3300L may be further processed to create device structures and thru layer connections to landing strips or pads on the acceptor wafer. A four cardinal directions indicator 3340 will be used to assist the explanation. By making the landing strips or pads 3338 in FIG. 33D somewhat wider than the width W 3308 of the repeating strips, the alignment of the device structures on the donor wafer can be shifted up or down (North or South) in steps of distance W until the thru layer connections are within a W distance to being on top of the appropriate landing pad. Since there's no pattern in the other direction the alignment can be left or right (East or West) as much as needed until the thru layer connections are on top of the appropriate landing pad. This mask alignment scheme is further explained below. The misalignment in the East-West direction is DX 3324 and the misalignment in the North-South direction is DY 3322. For simplicity of the following explanations, the donor wafer alignment mark 3320 and acceptor wafer alignment mark 3321 may be assumed to be placed such that the donor wafer alignment mark 3320 is always north of the acceptor wafer alignment mark 3321. The cases where donor wafer alignment mark 3320 is either perfectly aligned with or aligned south of acceptor alignment mark 3321 are handled in a similar manner. In addition, these alignment marks may be placed in only a few locations on each wafer, within each step field, within each die, within each repeating pattern W, or in other locations as a matter of design choice. Due to the die-sized or wafer-sized donor wafer strips extending in the East-West direction, proper East-West alignment to those prefabricated strips may be achieved regardless of misalignment DX 3324. Alignment of images for further processing of donor wafer structures in the East-West direction may be accomplished by utilizing the East-West co-ordinate of the acceptor wafer alignment mark 3321. If die-sized donor wafer strips are utilized, the repeating strips may overlap into the die scribeline the distance of the maximum donor wafer to acceptor wafer misalignment.

Figure 33C:
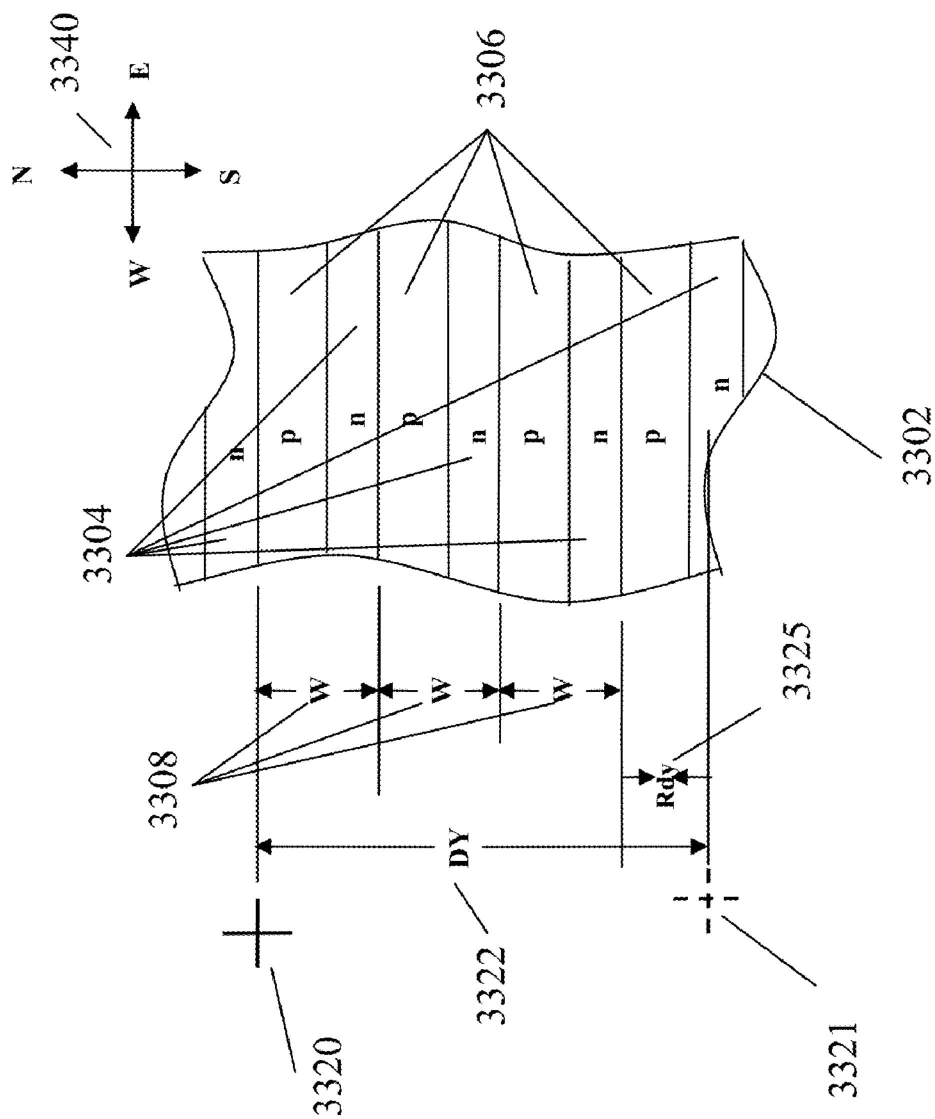
FIG. 33C is a exemplary drawing illustration of a measured alignment offset.

As illustrated in FIG. 33C, donor wafer alignment mark 3320 may land DY 3322 distance in the North-South direction away from acceptor alignment mark 3321. N-type strips 3304 and p-type strips 3306 of repeat width sum W 3308 are drawn in illustration blow-up area 3302. A four cardinal directions indicator 3340 will be used to assist the explanation. In this illustration, misalignment DY 3322 is comprised of three repeat sum distances W 3308 and a residual Rdy 3325. In the generalized case, residual Rdy 3325 is the remainder of DY 3322 modulo W 3308, 0<=Rdy 3325<W 3308. Proper alignment of images for further processing of donor wafer structures may be accomplished by utilizing the East-West coordinate of acceptor wafer alignment mark 3321 for the image's East-West alignment mark position, and by shifting Rdy 3325 from the acceptor wafer alignment mark 3321 in the North-South direction for the image's North-South alignment mark position.

Figure 33D:
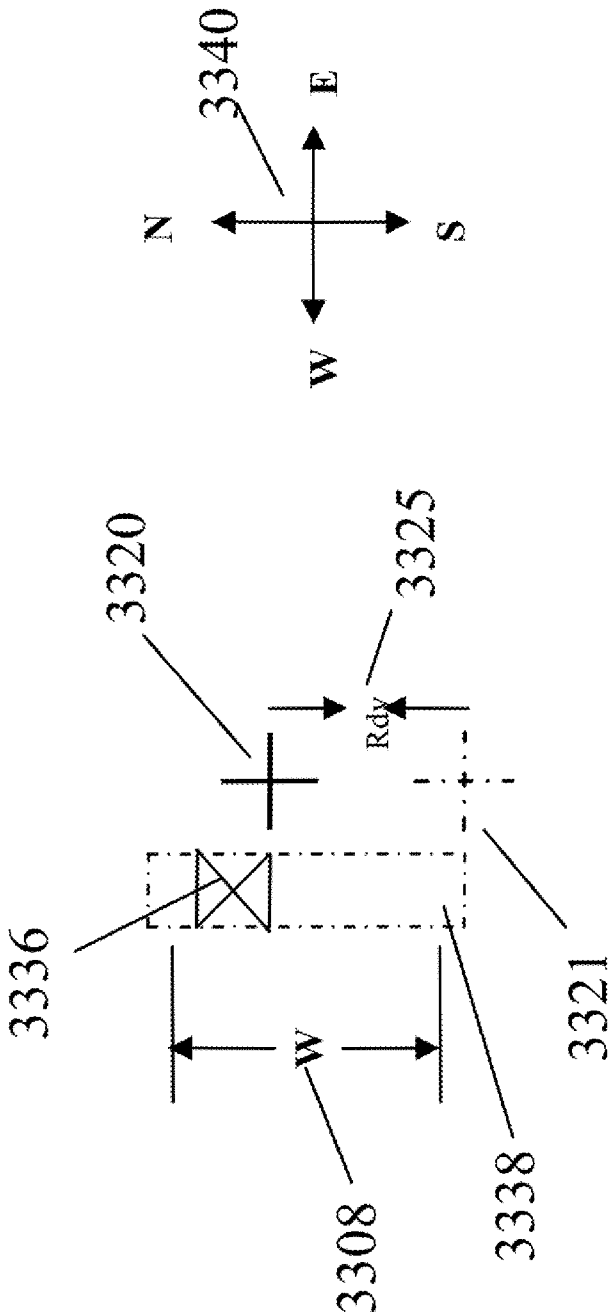
FIG. 33D is an exemplary drawing illustration of a connection strip.

As illustrated in FIG. 33D acceptor metal connect strip or landing pad 3338 may be designed with length W 3308 plus an extension for via design rules and for angular misalignment across the die. Acceptor metal connect strip 3338 may be oriented length-wise in the North-South direction. A four cardinal directions indicator 3340 will be used to assist the explanation. The acceptor metal connect strip 3338 extension, in length and/or width, may include compensation for via design rules and for angular (rotational) misalignment between the donor and acceptor wafer when they are bonded together, and may include uncompensated donor wafer bow and warp. The acceptor metal connect strip 3338 is aligned to the acceptor wafer alignment mark 3321. Thru layer via (TLV) 3336 may be aligned as described above in a similar manner as other donor wafer structure definition images. The TLV's 3336 East-West alignment mark position may be the East-West coordinate of acceptor wafer alignment mark 3321, and the TLV's North-South alignment mark position is Rdy 3325 from the acceptor wafer alignment mark 3321 in the North-South direction.

Figure 33E:
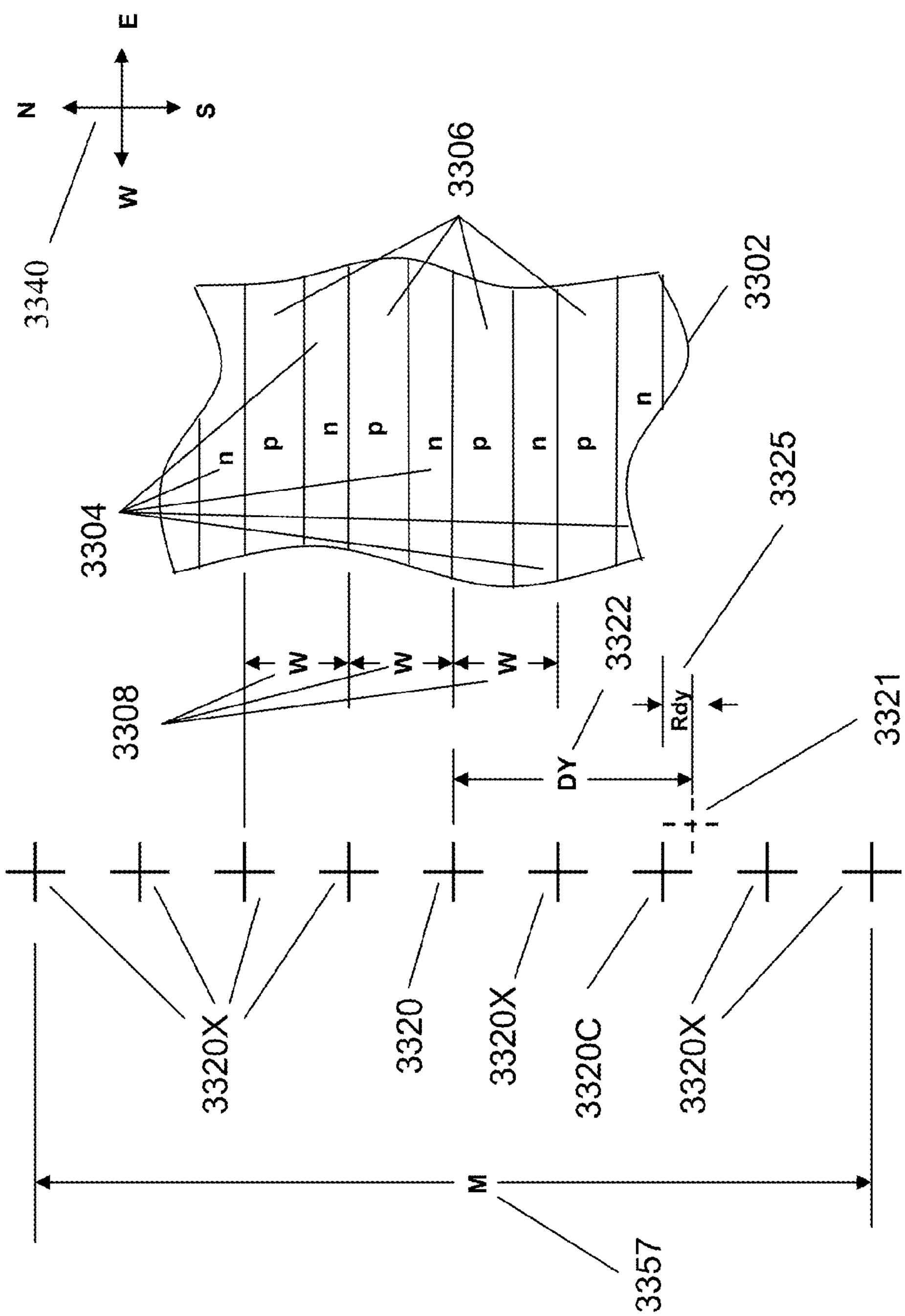
FIG. 33E is an exemplary drawing illustration of a donor wafer.

As illustrated in FIG. 33E, the donor wafer alignment mark 3320 may be replicated precisely every repeat W 3380 in the North to South direction, comprising alignment marks 3320×, and 3320C, for a distance to substantially cover the full extent of potential North to South donor wafer to acceptor wafer misalignment M 3357. The donor wafer alignment mark 3320 may land DY 3322 distance in the North-South direction away from acceptor alignment mark 3321. N-type strips 3304 and p-type strips 3306 of repeat width sum W 3308 are drawn in illustration blow-up area 3302. A four cardinal directions indicator 3340 will be used to assist the explanation. The residue Rdy 3325 may therefore be the North to South misalignment between the closest donor wafer alignment mark 3320C and the acceptor wafer alignment mark 3321. Proper alignment of images for further processing of donor wafer structures may be accomplished by utilizing the East-West coordinate of acceptor wafer alignment mark 3321 for the image's East-West alignment mark position, and by shifting Rdy 3325 from the acceptor wafer alignment mark 3321 in the North-South direction for the image's North-South alignment mark position.

Persons of ordinary skill in the art will appreciate that the illustrations in FIGS. 33A through 33E are exemplary only and are not drawn to scale. Such skilled persons will further appreciate that many variations are possible such as, for example, Wn 3314 and Wp 3316 could be set for the minimum width of the corresponding transistor plus its isolation in the selected process node. Additionally, the North-South direction could become the East-West direction (and vice versa) by merely rotating the wafer 90° and that the strips of n-type transistors 3304 and strips of p-type transistors 3306 could also run North-South as a matter of design choice with corresponding adjustments to the rest of the fabrication process. Such skilled persons will further appreciate that the strips of n-type transistors 3304 and strips of p-type transistors 3306 can have many different organizations as a matter of design choice. For example, the strips of n-type transistors 3304 and strips of p-type transistors 3306 can each comprise a single row of transistors in parallel, multiple rows of transistors in parallel, multiple groups of transistors of different dimensions and orientations and types (either individually or in groups), and different ratios of transistor sizes or numbers between the strips of n-type transistors 3304 and strips of p-type transistors 3306, etc. Thus the scope of the invention is to be limited only by the appended claims.

There are multiple methods by which a transistor or other devices may be formed to enable the manufacturing of a 3D IC. Two examples will be described.

Figure 34A:
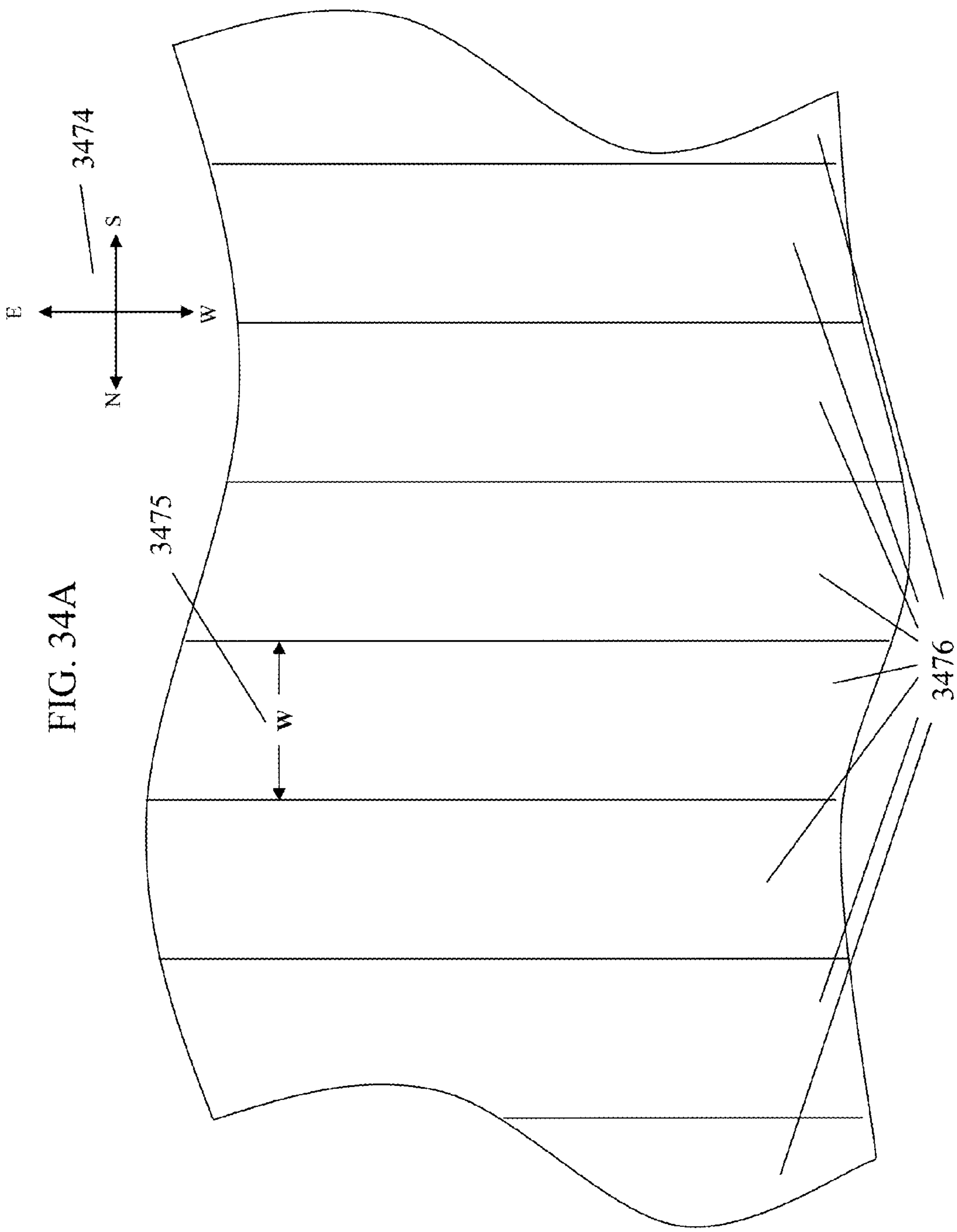
FIGS. 34A-L are exemplary drawing illustrations of the formation of top planar transistors.

As illustrated in FIGS. 34A to 34L, planar V-groove NMOS and PMOS transistors may be formed with a single layer transfer as follows. As illustrated in FIG. 34A of a top view blow-up section of a donor wafer (with reference to the FIG. 33A discussion), repeating strips 3476 of repeat width W 3475 may be created in the East-West direction. A four cardinal directions indicator 3474 will be used to assist the explanation. Repeating strips 3476 may be as long as the length of the acceptor die plus a margin for the maximum donor wafer to acceptor wafer misalignment, or alternatively, these strips 3476 may extend the entire length of a donor wafer. The remaining FIGS. 34B to 34L will illustrate a cross sectional view.

Figure 34B:
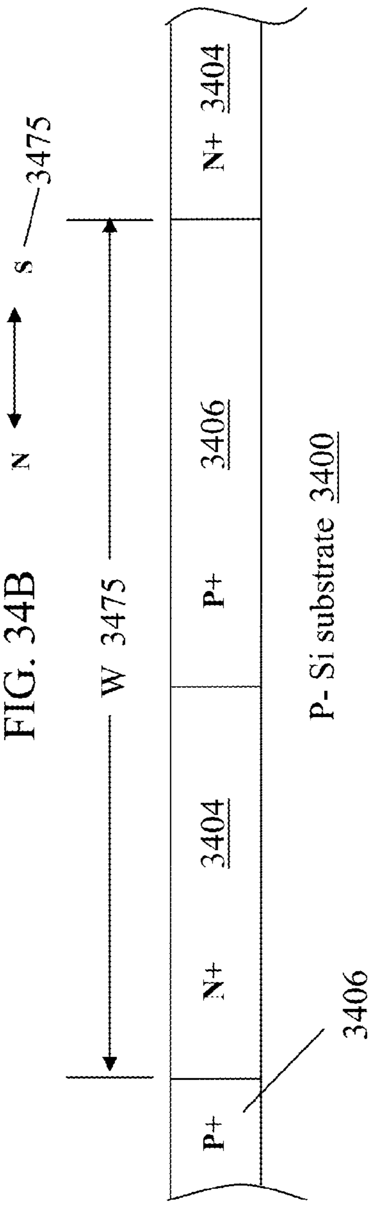

As illustrated in FIG. 34B, a P− substrate donor wafer 3400 may be processed to comprise East to West strips of N+ doping 3404 and P+ doping 3406 of combined repeat width W 3475 in the North to South direction. A two cardinal directions indicator 3475 will be used to assist the explanation. The N+ strip 3404 and P+ strip 3406 may be formed by masked ion implantation and a thermal anneal.

Figure 34C:
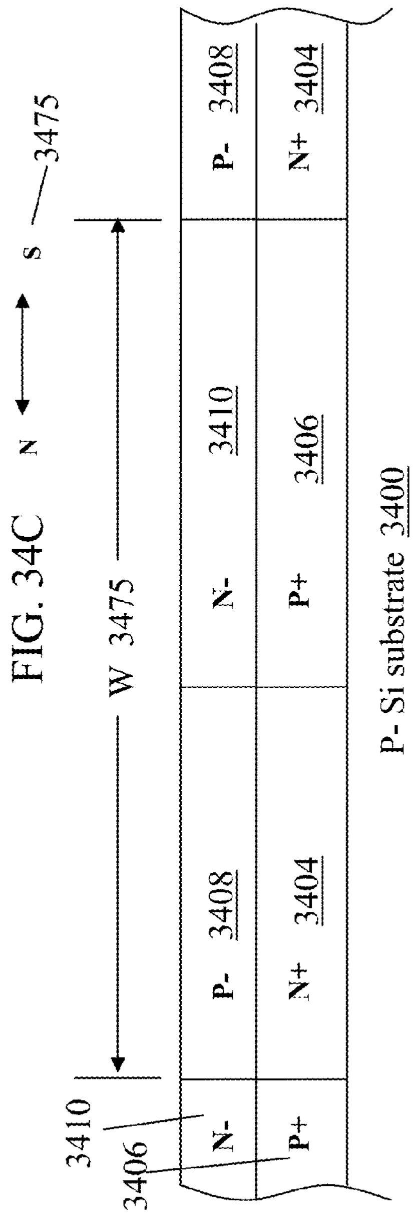

As illustrated in FIG. 34C, a P-epitaxial growth may be performed and then followed by masking, ion implantation, and anneal to form East to West strips of N− doping 3410 and P− doping 3408 of combined repeat width W 3475 in the North to South direction and in alignment with previously formed N+ strips 3404 and P+ strips 3406. N-strip 3410 may be stacked on top of P+ strip 3406, and P− strip 3408 may be stacked on top of N+ strip 3404. N+ strips 3404, P+ strips 3406, P− strip 3408, and N-strip 3410 may have graded doping to mitigate transistor performance issues, such as, for example, short channel effects, or lower contact resistance after the NMOS and PMOS transistors are formed.

Figure 34D:
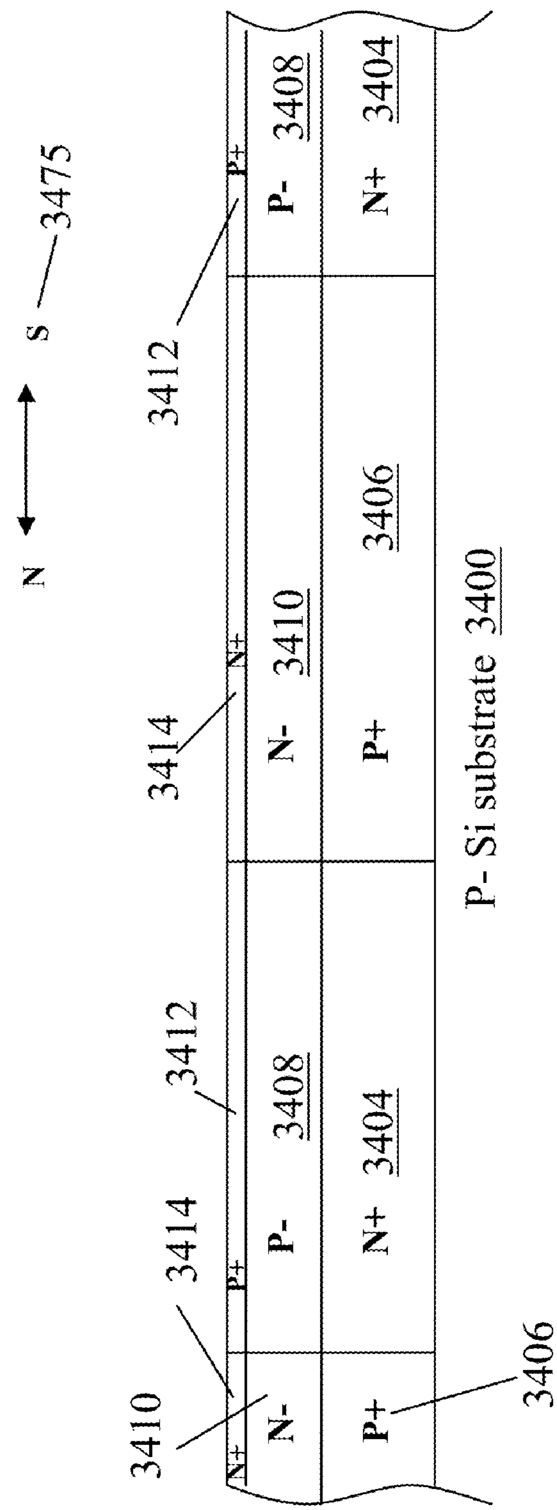

As illustrated in FIG. 34D shallow P+ strips 3412 and N+ strips 3414 may be formed by masking, shallow ion implantation, and RTA activation to form East to West strips of P+ doping 3412 and N+ doping 3414 of combined repeat width W 3475 in the North to South direction and in alignment with previously formed N+ strips 3404, P+ strips 3406, N− strips 3410 and P− strips 3408. N+ strip 3414 may be stacked on top of N− strip 3410, and P+ strip 3412 may be stacked on top of P− strip 3408. The shallow P+ strips 3412 and N+ strips 3414 may be doped by Plasma Assisted Doping (PLAD) techniques.

Figure 34E:
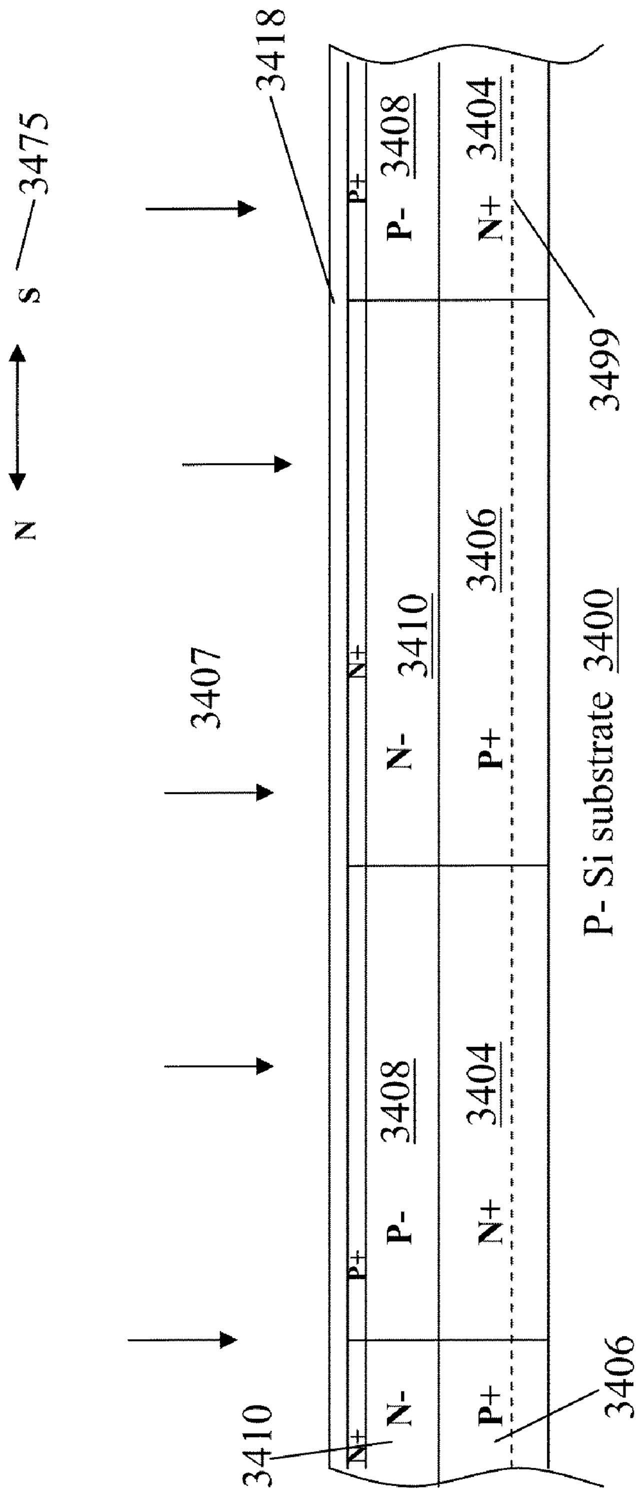

As illustrated in FIG. 34E, the top surface of processed donor wafer 3400 may be prepared for oxide wafer bonding with a deposition of an oxide 3418 or by thermal oxidation of shallow P+ strips 3412 and N+ strips 3414 to form oxide layer 3418. A layer transfer demarcation plane 3499 (shown as dashed line) may be formed by hydrogen implantation 3407 or other methods as previously described. Oxide 3418 may be deposited or grown before the H+ implant, and may comprise differing thicknesses over the P+ strips 3412 and N+ strips 3414 to allow an even H+ implant range stopping and facilitate a level and continuous layer transfer demarcation plane 3499 (shown as dashed line). Both the donor wafer 3400 and acceptor wafer 3410 may be prepared for wafer bonding as previously described and then low temperature (less than approximately 400° C.) bonded. The portion of the N+ strips 3404, P+ strips 3406, and the P− donor wafer substrate 3400 that are above the layer transfer demarcation plane 3499 may be removed by cleaving or other low temperature processes as previously described, such as, for example, ion-cut or other methods.

Figure 34F:
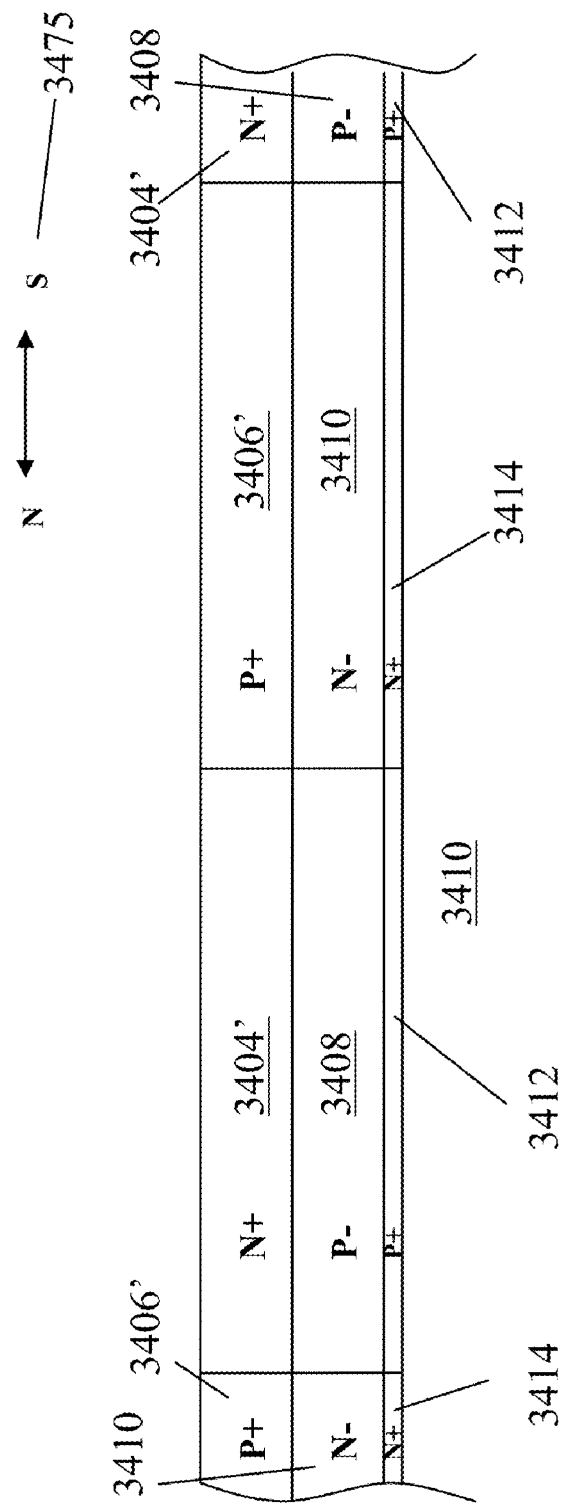

As illustrated in FIG. 34F, P+ strip 3412, N+ strip 3414, P− strip 3408, N− strip 3410, remaining N+ strip 3404', and remaining P+ strip 3406' have been layer transferred to acceptor wafer 3410. The top surface of N+ strip 3404' and P+ strip 3406' may be chemically or mechanically polished. Now transistors are formed with low temperature (less than approximately 400° C.) processing and aligned to the acceptor wafer 3410 alignment marks (not shown). For illustration clarity, the oxide layers, such as, for example, oxide 3418, used to facilitate the wafer to wafer bond are not shown.

Figure 34G:
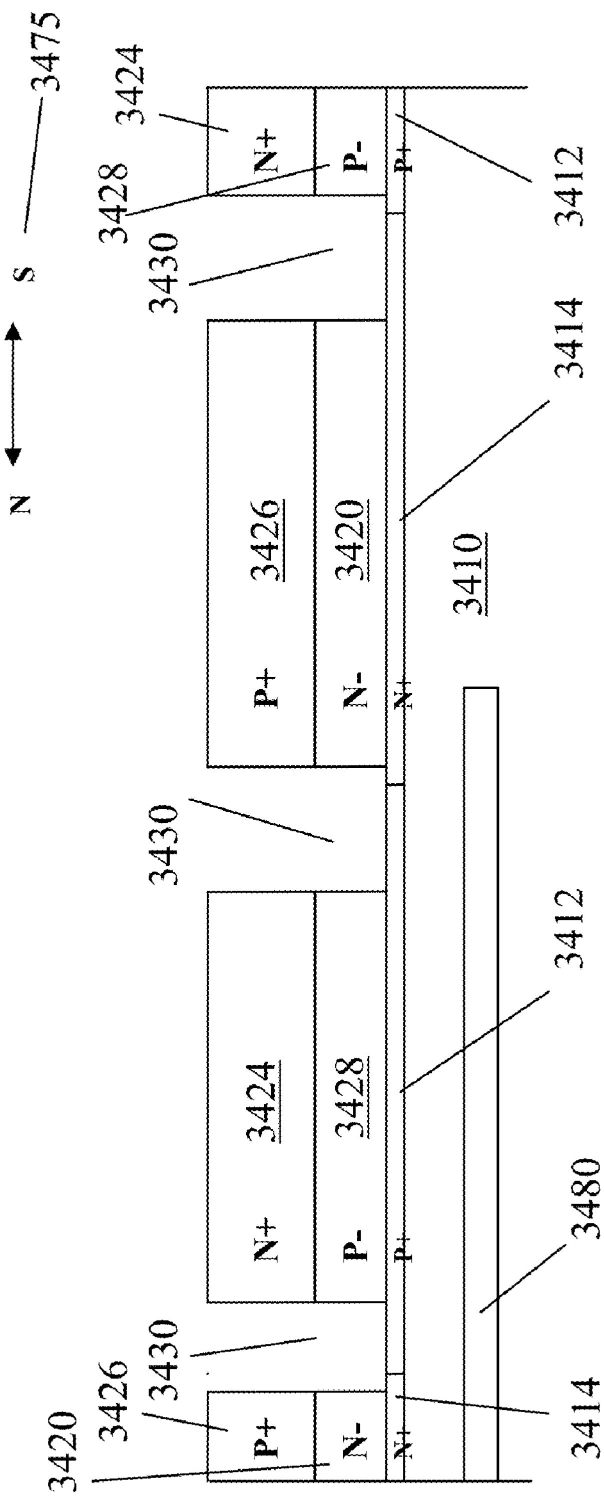

As illustrated in FIG. 34G, the substrate P+ body tie 3412 and substrate N+ body tie 3414 contact opening 3430 and partial transistor isolation may be soft or hard mask defined and then etched thru N+ strips 3404', P− strips 3408, P+ strips 3406', and N− strips 3410. This forms N+ regions 3424, P+ regions 3426, P− regions 3428, and N− regions 3420. The acceptor metal connect strip 3480 as previously discussed in FIG. 33D is shown.

Figure 34H:
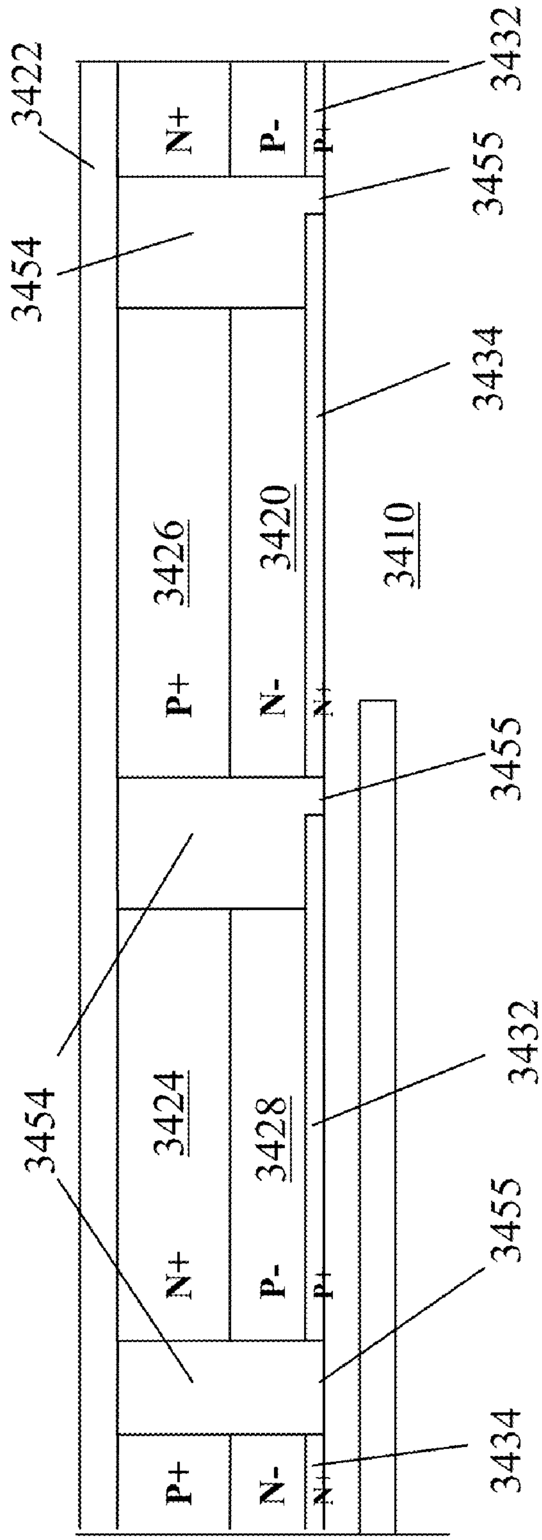

As illustrated in FIG. 34H, the transistor isolation may be completed by mask defining and then etching shallow P+ strips 3412 and N+ strips 3414 to the top of acceptor wafer 3410, forming P+ substrate tie regions 3432, N+ substrate tie regions 3434, and transistor isolation regions 3455. Then a low-temperature gap fill oxide 3454 may be deposited and chemically mechanically polished. A thin polish stop layer 3422, such as, for example, low temperature silicon nitride with a thin oxide buffer layer, may then be deposited.

Figure 34I:
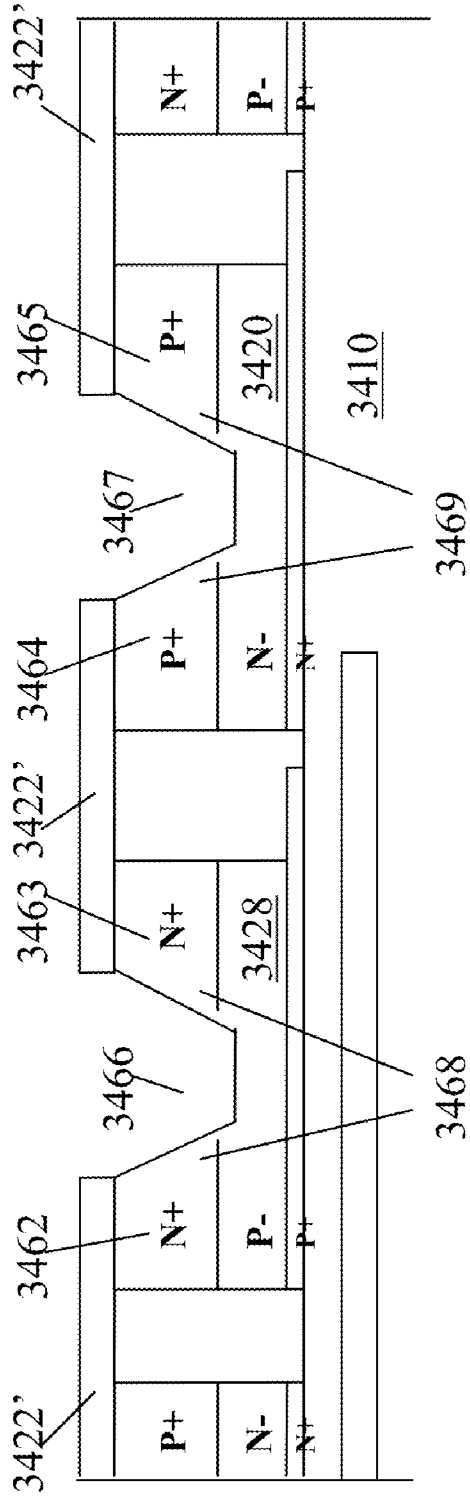

As illustrated in FIG. 34I, NMOS source region 3462, NMOS drain region 3463, and NMOS self-aligned gate opening region 3466 may be defined by masking and etching the thin polish stop layer 3422 and then followed by a sloped N+ etch of N+ region 3424 and may continue into P− region 3428. The sloped (30-90 degrees, 45 is shown) etch or etches may be accomplished with wet chemistry or plasma/RIE etching techniques. This process forms NMOS sloped source and drain extensions 3468. Then PMOS source region 3464, PMOS drain region 3465, PMOS self-aligned gate opening region 3467 may be defined by masking and etching the thin polish stop layer 3422 and then followed by a sloped P+ etch of P+ region 3426 and may continue into N− region 3420. The sloped (30-90 degrees, 45 is shown) etch or etches may be accomplished with wet chemistry or plasma/RIE etching techniques. This process forms PMOS sloped source and drain extensions 3469. The above two masked etches also form thin polish stop layer regions 3422'.

Figure 34J:
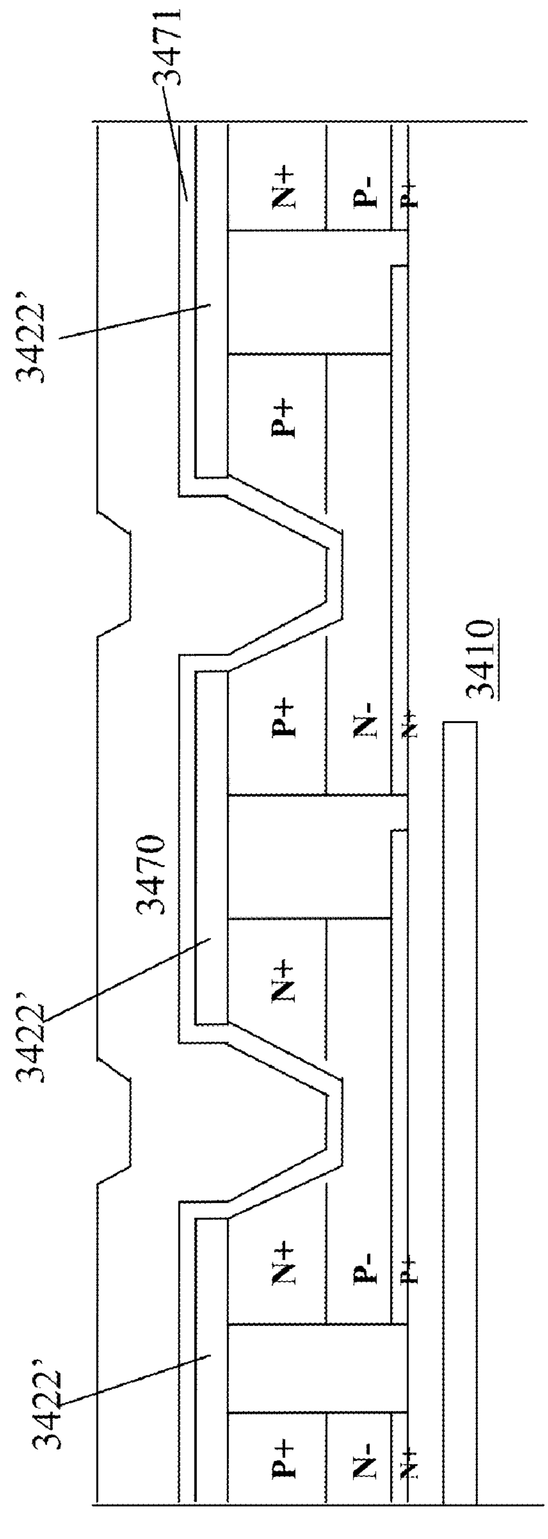

As illustrated in FIG. 34J, a gate dielectric 3471 may be formed and a gate metal material 3470 may be deposited. The gate dielectric 3471 may be an atomic layer deposited (ALD) gate dielectric that is paired with a work function specific gate metal 3470 in the industry standard high k metal gate process schemes described previously. Or the gate dielectric 3471 may be formed with a low temperature oxide deposition or low temperature microwave plasma oxidation of the silicon surfaces and then a gate metal material 3470 such as, for example, tungsten or aluminum may be deposited. The gate oxides and gate metals may be different between the NMOS and PMOS V-groove devices, and may be accomplished with selective removal of one gate oxide/metal pair type and replacement with another gate oxide/metal pair type.

Figure 34K:
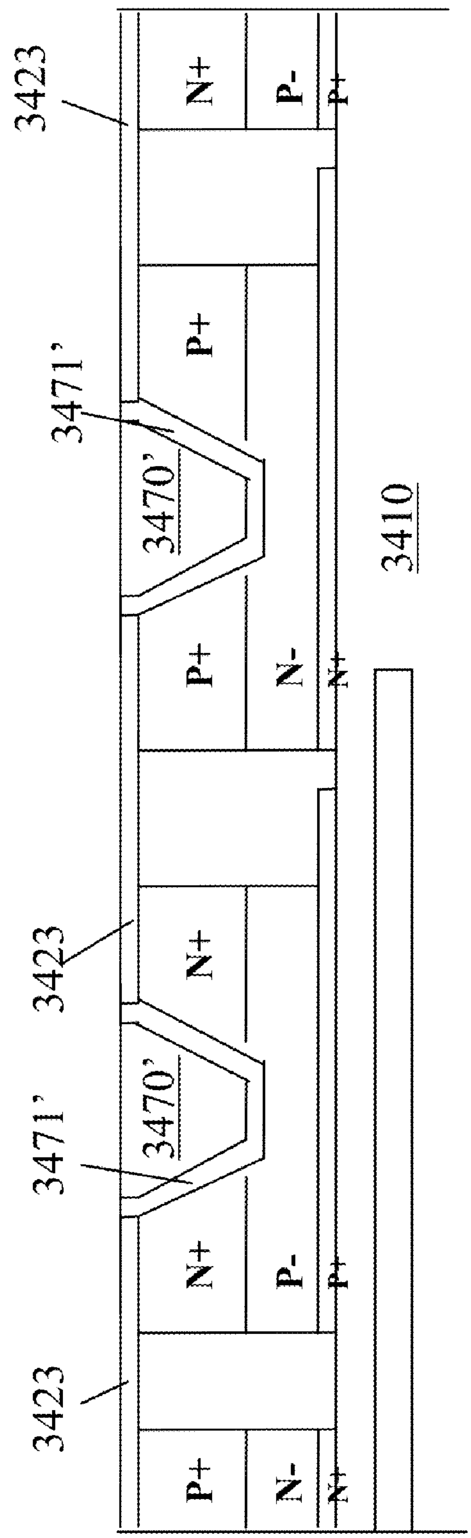

As illustrated in FIG. 34K, the gate material 3470 and gate dielectric 3471 may be chemically mechanically polished with the polish stop in the polish stop regions 3422'. The gate material regions 3470' and gate dielectric regions 3471' are thus remaining in the intended V-groove. Remaining polish stop regions 3423 are shown.

Figure 34L:
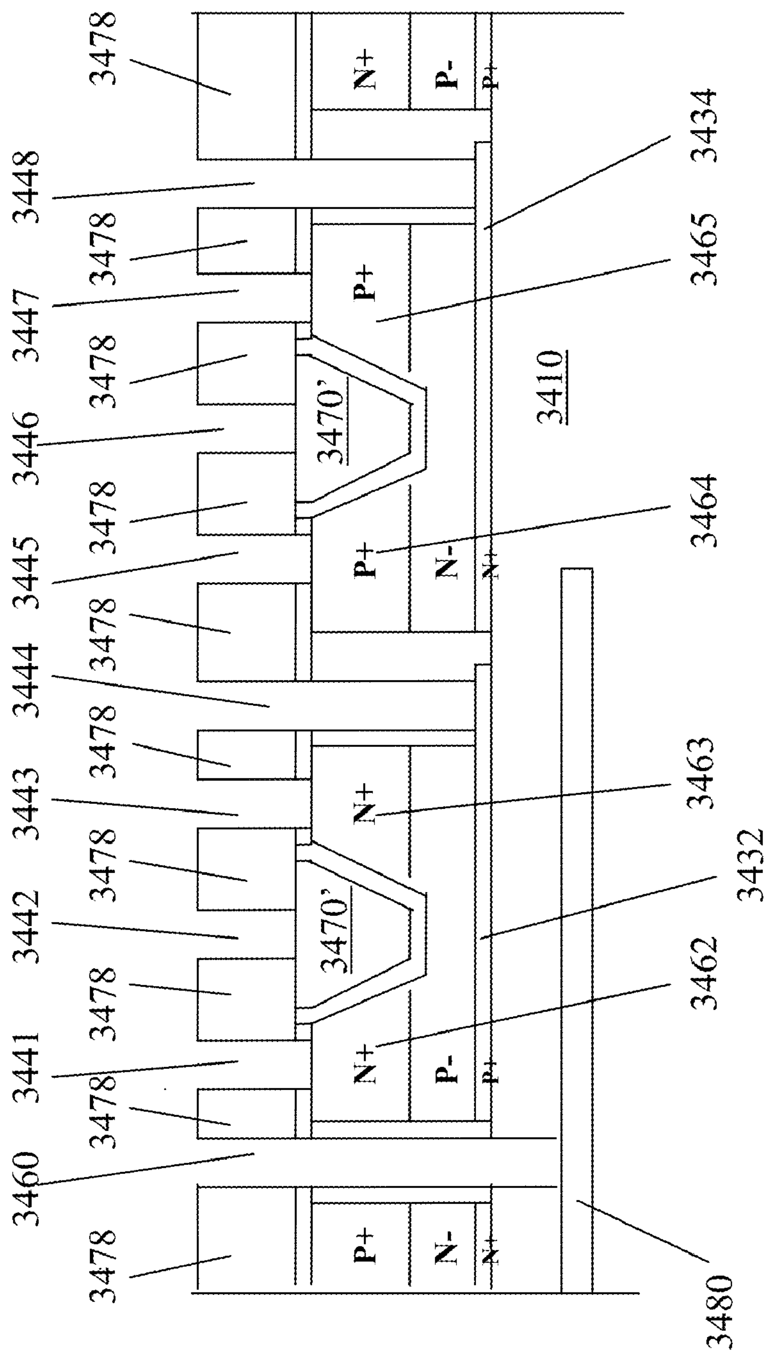

As illustrated in FIG. 34L, a low temperature thick oxide 3478 is deposited and NMOS source contact 3441, NMOS gate contact 3442, NMOS drain contact 3443, substrate P+ body tie contact 3444, PMOS source contact 3445, NMOS gate contact 3446, NMOS drain contact 3447, substrate N+ body tie contact 3448, and thru layer via 3460 openings are masked and etched preparing the transistors to be connected via metallization. The thru layer via 3460 provides electrical connection between the donor wafer transistors and the acceptor metal connect strip 3480.

This flow enables the formation of planar V-groove NMOS and PMOS transistors constructed by layer transfer of wafer sized doped strips of mono-crystalline silicon and may be connected to an underlying multi-metal layer semiconductor device without exposing it to a high temperature (above approximately 400° C.) process step.

Persons of ordinary skill in the art will appreciate that while the transistors fabricated in FIGS. 34A through 34L are shown with their conductive channels oriented in a north-south direction and their gate electrodes oriented in an east-west direction for clarity in explaining the simultaneous fabrication of P-channel and N-channel transistors, that other orientations and organizations are possible. Such skilled persons will further appreciate that the transistors may be rotated 90° with their gate electrodes oriented in a north-south direction. For example, it will be evident to such skilled persons that transistors aligned with each other along an east-west strip or row can either be electrically isolated from each other with Low-Temperature Oxide 3454 or share source and drain regions and contacts as a matter of design choice. Such skilled persons will also realize that strips or rows of 'n' type transistors may contain multiple N-channel transistors aligned in a north-south direction and strips or rows of 'p' type transistors may contain multiple P-channel transistors aligned in a north-south direction, specifically to form back-to-back sub-rows of P-channel and N-channel transistors for efficient logic layouts in which adjacent sub-rows of the same type share power supply lines and connections. Such skilled persons will also realize that a variation of the p & n well strip donor wafer preprocessing above is to also preprocess the well isolations with shallow trench etching, dielectric fill, and CMP prior to the layer transfer and that there are many process flow arrangements and sequences to form the donor wafer stacked strips prior to the layer transfer to the acceptor wafer. Such skilled persons will also realize that a similar flow may be utilized to construct CMOS versions of other types of transistors, such as, for example, RCAT, S-RCAT, and junction-less. Many other design choices are possible within the scope of the invention and will suggest themselves to such skilled persons, thus the invention is to be limited only by the appended claims.

Figure 35A:
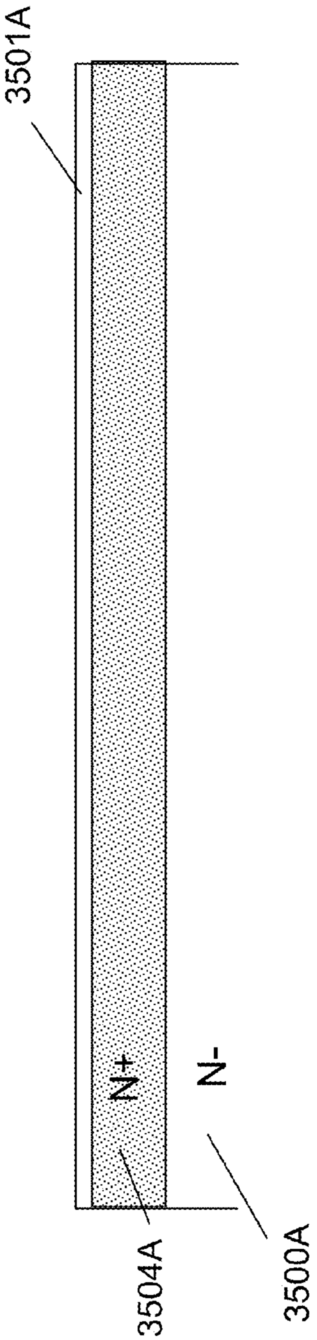
FIGS. 35A-M are exemplary drawing illustrations of the formation of a junction-less transistor.

As illustrated in FIGS. 35A to 35M, an n-channel 4-sided gated junction-less transistor (JLT) may be constructed that is suitable for 3D IC manufacturing. As illustrated in FIG. 35A, an N− substrate donor wafer 3500A may be processed to comprise a wafer sized layer of N+ doping 3504A. The N+ doping layer 3504A may be formed by ion implantation and thermal anneal. A screen oxide 3501A may be grown before the implant to protect the silicon from implant contamination and to provide an oxide surface for later wafer to wafer bonding. The N+ layer 3504A may alternatively be formed by epitaxial growth of a doped silicon layer of N+ or may be a deposited layer of heavily N+ doped poly-crystalline silicon. The N+ doped layer 3504A may be formed by doping the N− substrate wafer 3500A by Plasma Assisted Doping (PLAD) techniques. These processes may be done at temperatures above 400° C. as the layer transfer to the processed substrate with metal interconnects has yet to be done.

Figure 35B:
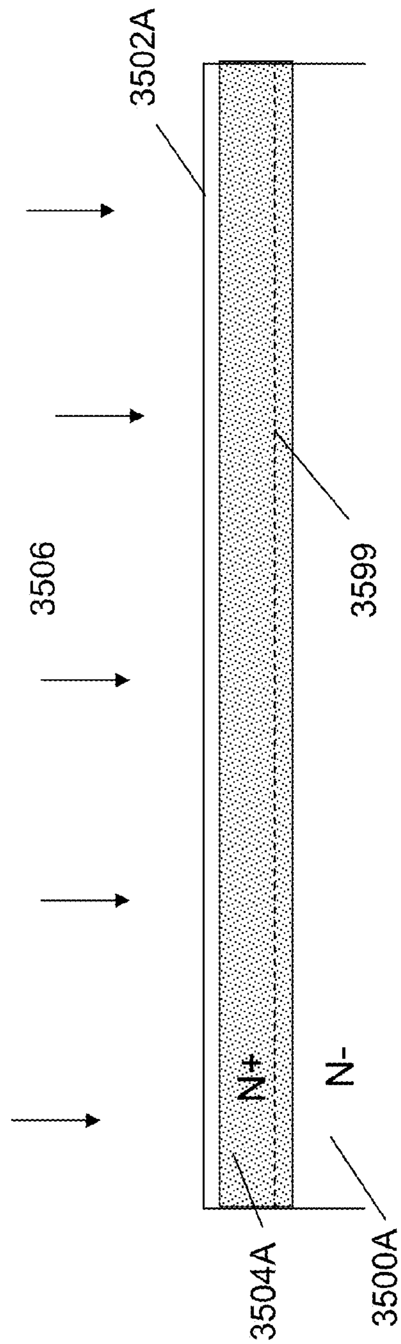

As illustrated in FIG. 35B, the top surface of donor wafer 3500A may be prepared for oxide wafer bonding with a deposition of an oxide 3502A or by thermal oxidation of the N+ layer 3504A to form oxide layer 3502A, or a re-oxidation of implant screen oxide 3501A to form oxide layer 3502*a*. A layer transfer demarcation plane 3599 (shown as a dashed line) may be formed in donor wafer 3500A or N+ layer 3504A (shown) by hydrogen implantation 3506 or other methods as previously described.

Figure 35C:
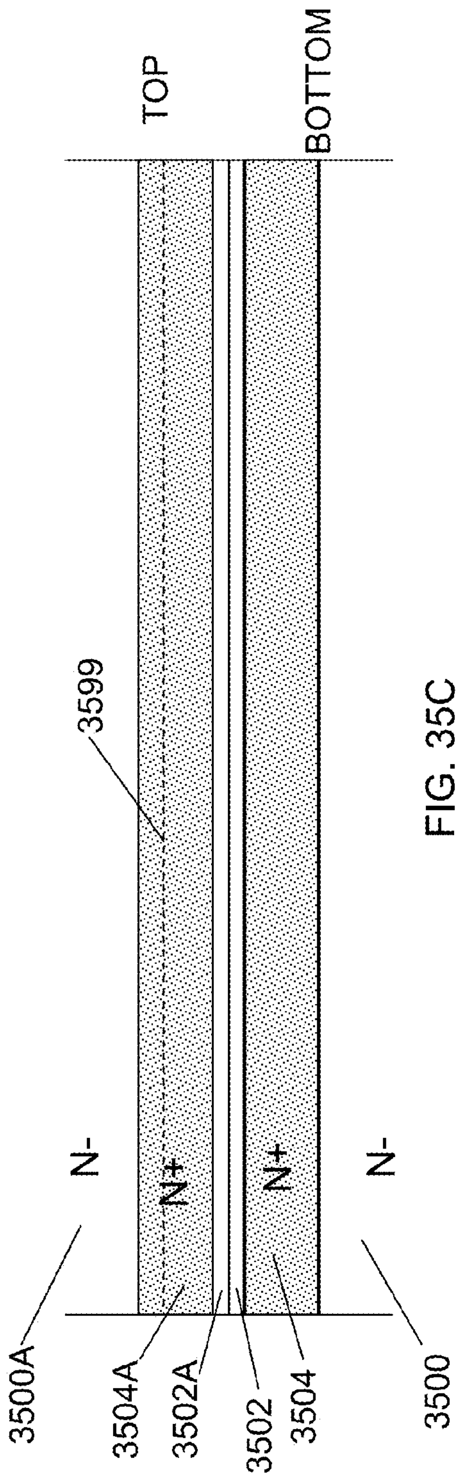

As illustrated in FIG. 35C, an acceptor wafer 3500 is prepared in a identical manner as the donor wafer 3500A as described related to FIG. 35A, thus forming N+ layer 3504 and oxide layer 3502. Both the donor wafer 3500A (flipped upside down and on 'top') and acceptor wafer 3500 (bottom') may be prepared for wafer bonding as previously described and then low temperature (less than approximately 400° C.) or high temperature bonded. Alternatively, N+ doped layer 3504 may be formed with conventional doped poly-crystalline silicon material that may be optically annealed to form large grains.

Figure 35D:
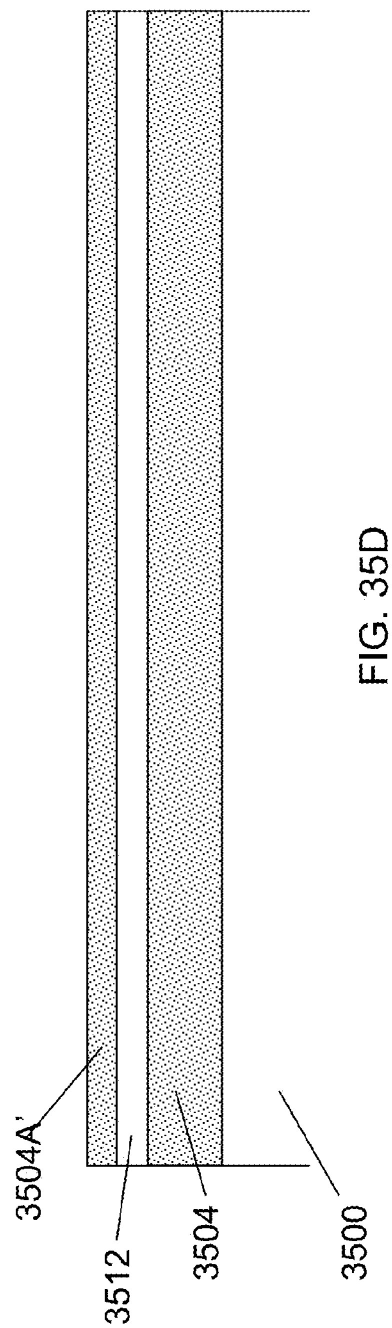

As illustrated in FIG. 35D, the portion of the N+ layer 3504A and the N− donor wafer substrate 3500A that are above the layer transfer demarcation plane 3599 may be removed by cleaving and polishing, or other low or high temperature processes as previously described, such as, for example, ion-cut or other methods. The remaining N+ layer 3504A' has been layer transferred to acceptor wafer 3500. The top surface of N+ layer 3504A' may be chemically or mechanically polished and may be thinned to the desired thickness. The thin N+ doped silicon layer 3504A' may be on the order of 5 nm to 40 nm thick and will eventually form the transistor channel that will be gated on four sides. The two 'half' gate oxides 3502 and 3502A may now be atomically bonded together to form the gate oxide 3512, which will eventually become the top gate oxide of the junction-less transistor. A high temperature anneal may be performed to remove any residual oxide or interface charges.

Figure 35E:
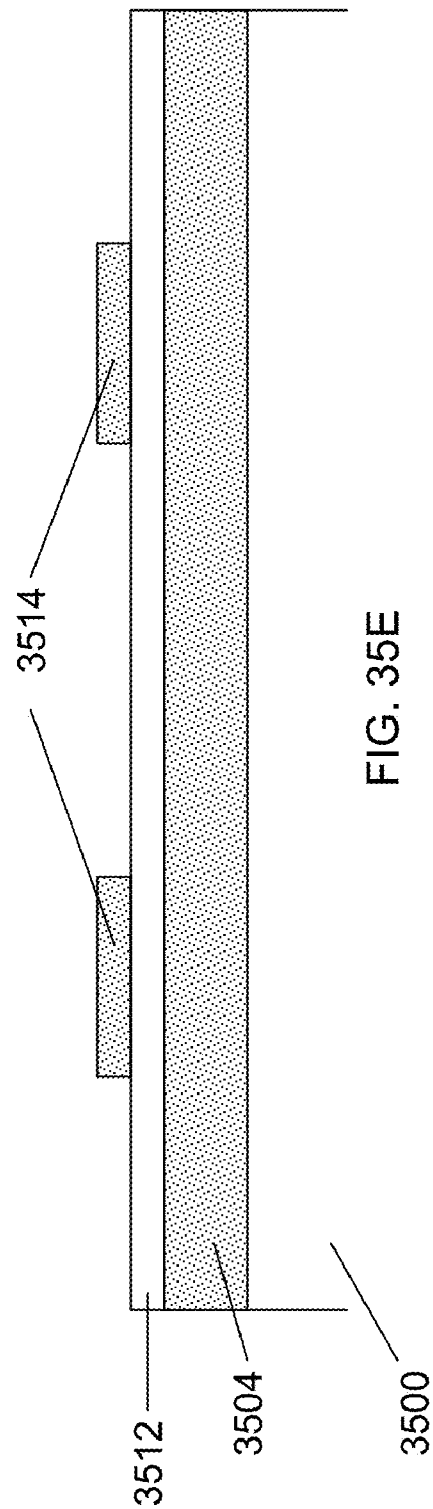

Now strips of transistor channels may be formed with processing temperatures higher than approximately 400° C. as necessary. As illustrated in FIG. 35E, a thin oxide may be grown or deposited, or formed by liquid oxidants such as, for example, 350° C. sulfuric peroxide to protect the thin transistor N+ silicon layer 3504A' top from contamination. Then parallel wires 3514 of repeated pitch (the repeat pitch distance may include space for future isolation and other device structures) of the thin N+ doped silicon layer 3504A' may be formed by conventional masking, etching, and then photoresist removal. The thin masking oxide, if present, may then be striped in a dilute hydrofluoric acid (HF) solution.

Figure 35F:
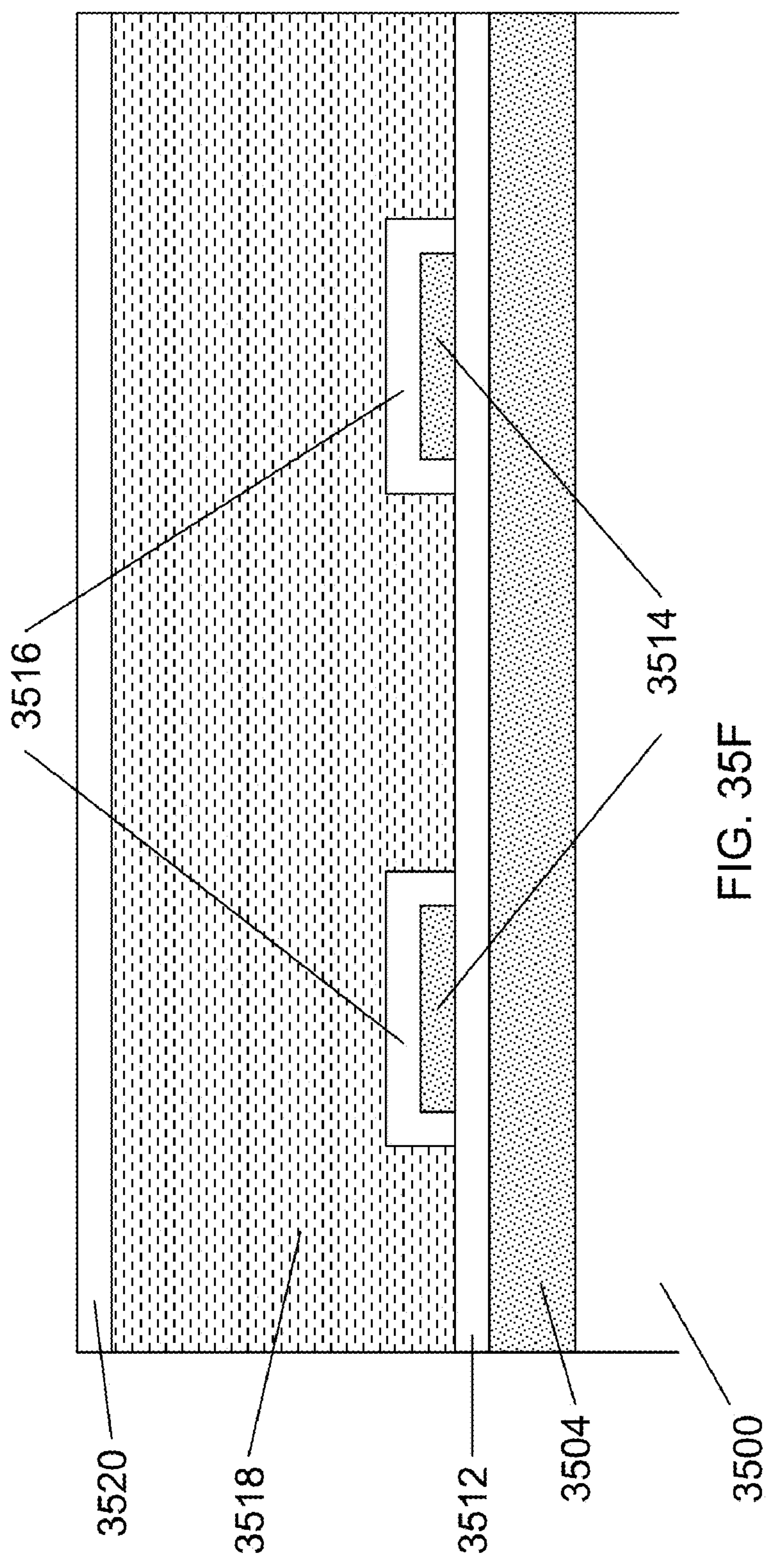

As illustrated in FIG. 35F, a conventional thermal gate oxide 3516 is grown and poly-crystalline or amorphous silicon 3518, doped or undoped, is deposited. Alternatively, a high-k metal gate (HKMG) process may be employed as previously described. The poly-crystalline silicon 3518 may be chemically mechanically polished (CMP'ed) flat and a thin oxide 3520 may be grown or deposited to prepare the wafer 3500 for low temperature oxide bonding.

Figure 35G:
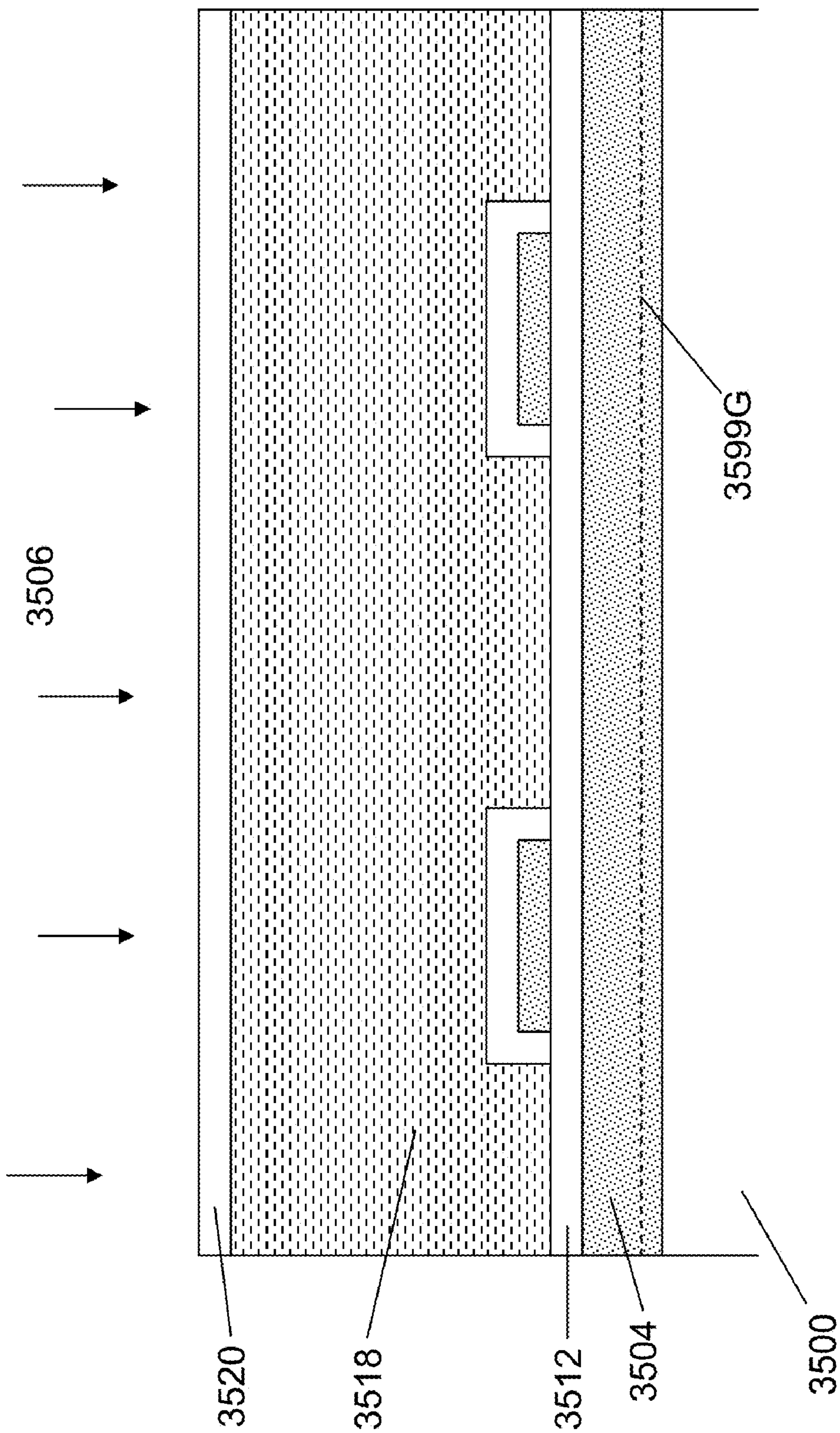

As illustrated in FIG. 35G, a layer transfer demarcation plane 3599G (shown as a dashed line) may be formed in now donor wafer 3500 or N+ layer 3504 (shown) by hydrogen implantation 3506 or other methods as previously described.

Figure 35H:
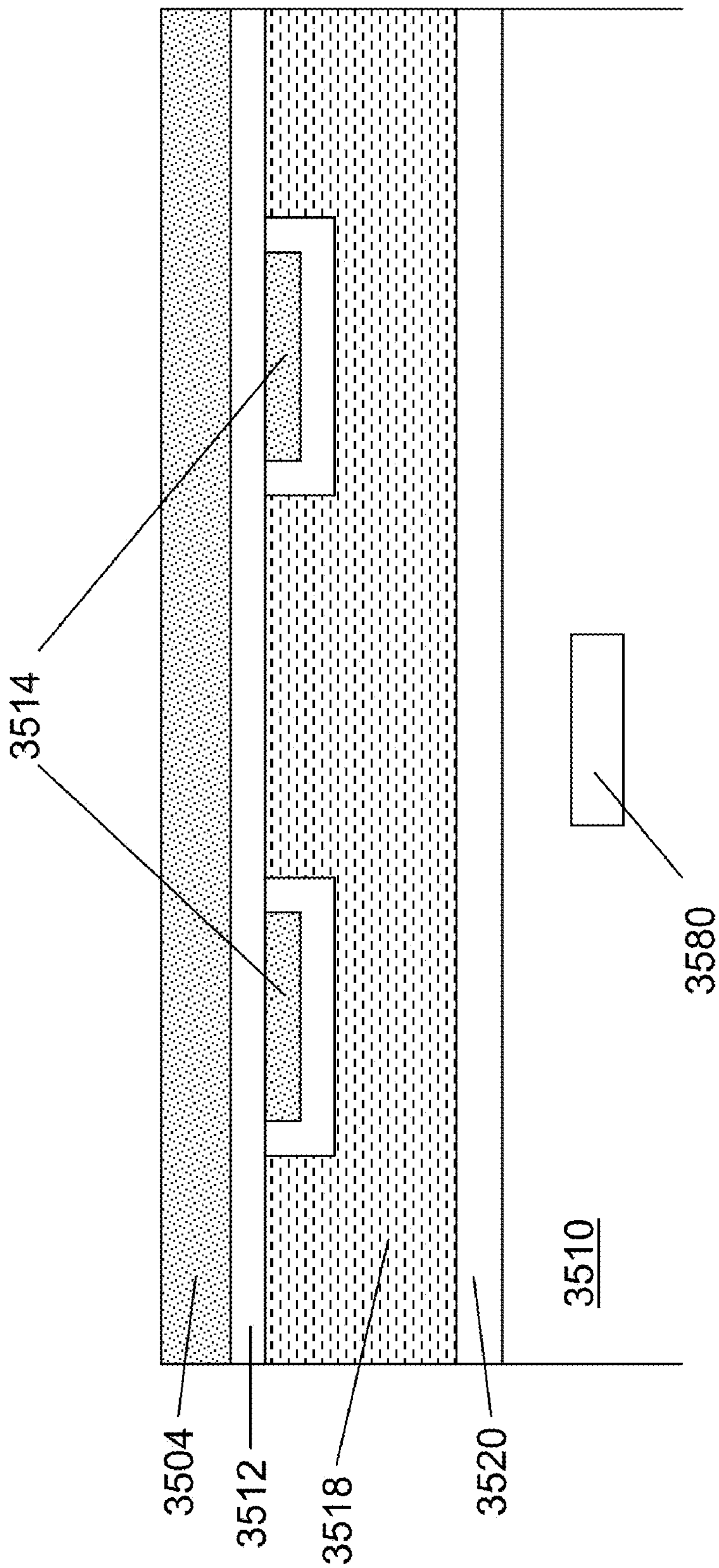

As illustrated in FIG. 35H, both the donor wafer 3500 and acceptor wafer 3510 top layers and surfaces may be prepared for wafer bonding as previously described and then aligned to the acceptor wafer 3510 alignment marks (not shown) and low temperature (less than approximately 400° C.) bonded. The portion of the N+ layer 3504 and the N− donor wafer substrate 3500 that are above the layer transfer demarcation plane 3599 may be removed by cleaving and polishing, or other low temperature processes as previously described, such as, for example, ion-cut or other methods. The acceptor wafer metal interconnect strip 3580 is also illustrated.

Figure 35I:
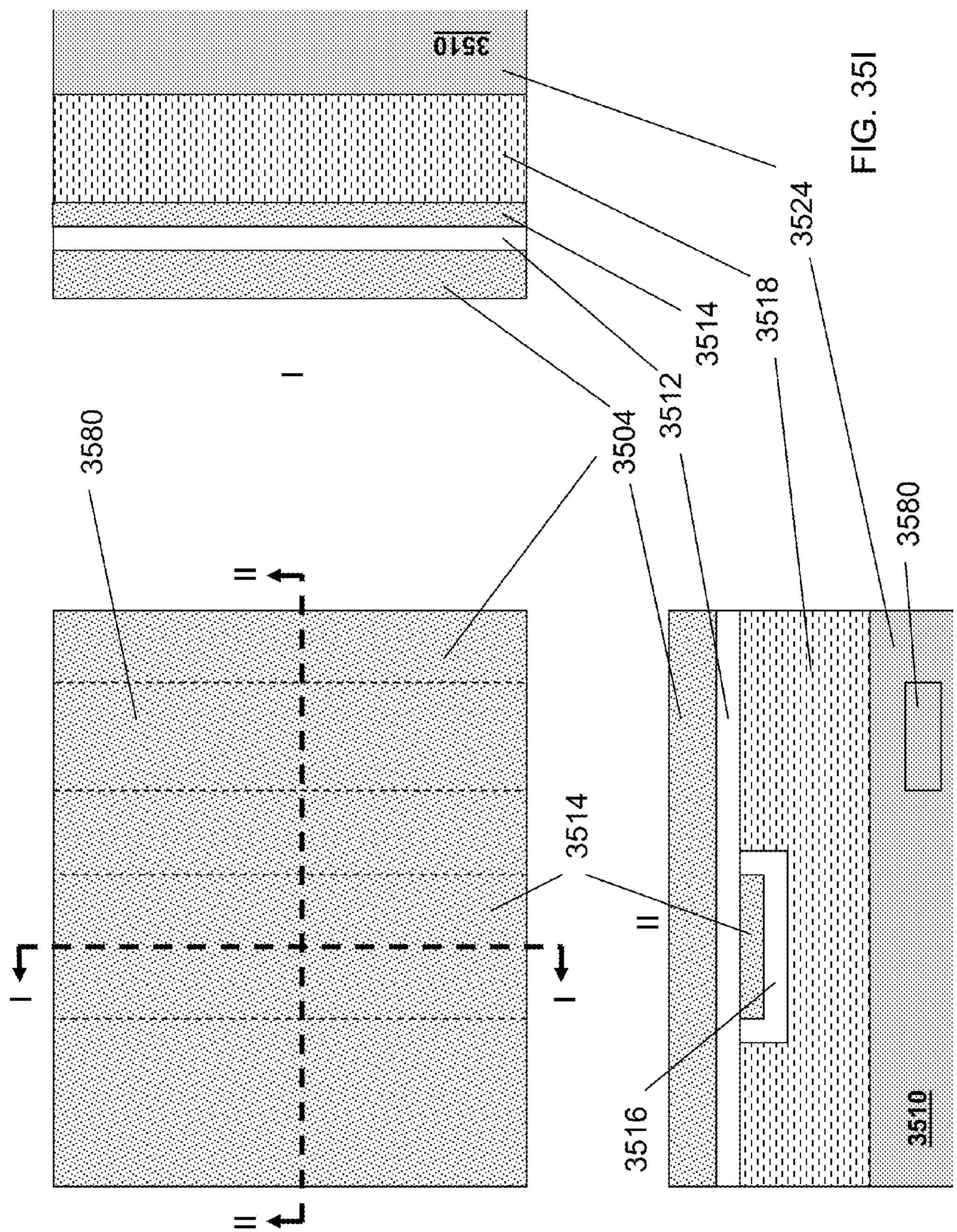

FIG. 35I is a top view at the same step as FIG. 35H with cross-sectional views I and II. The N+ doped layer 3504 and the top gate oxide 3512 form the gate of one side of the transistor channel strip 3514, and the bottom and side gate oxide 3516 with poly-crystalline silicon bottom and side gates 3518 gate the other three sides of the transistor channel strip 3514. The acceptor wafer 3510 has a top oxide layer that also encases the acceptor metal interconnect strip 3580.

Figure 35J:
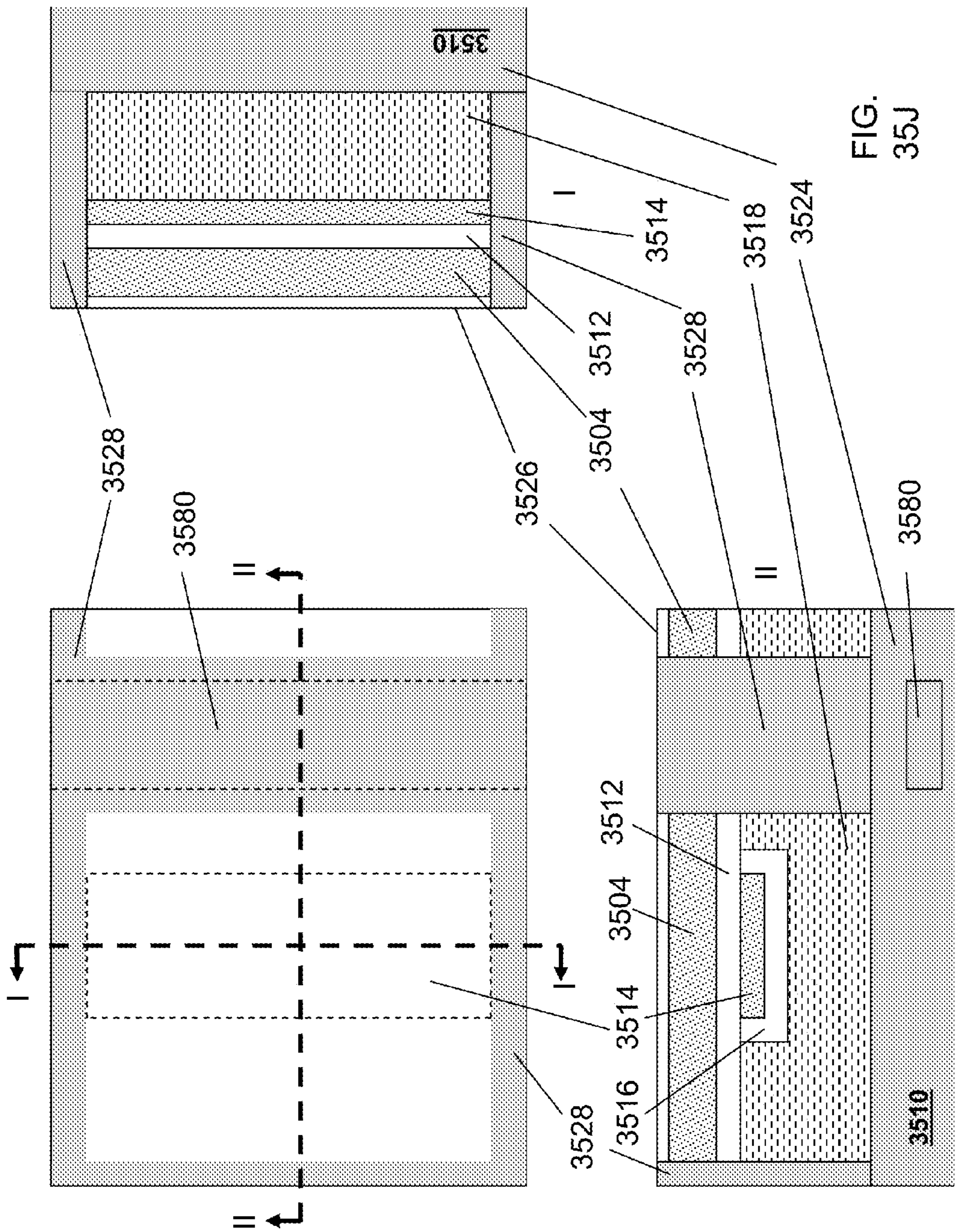

As illustrated in FIG. 35J, a polish stop layer 3526 of a material such as, for example, oxide and silicon nitride may be deposited on the top surface of the wafer. Isolation openings 3528 may be masked and then etched to the depth of the acceptor wafer 3510 top oxide layer 3524. The isolation openings 3528 may be filled with a low temperature gap fill oxide, and chemically and mechanically polished (CMP'ed) flat. This will fully isolate the transistors from each other.

Figure 35K:
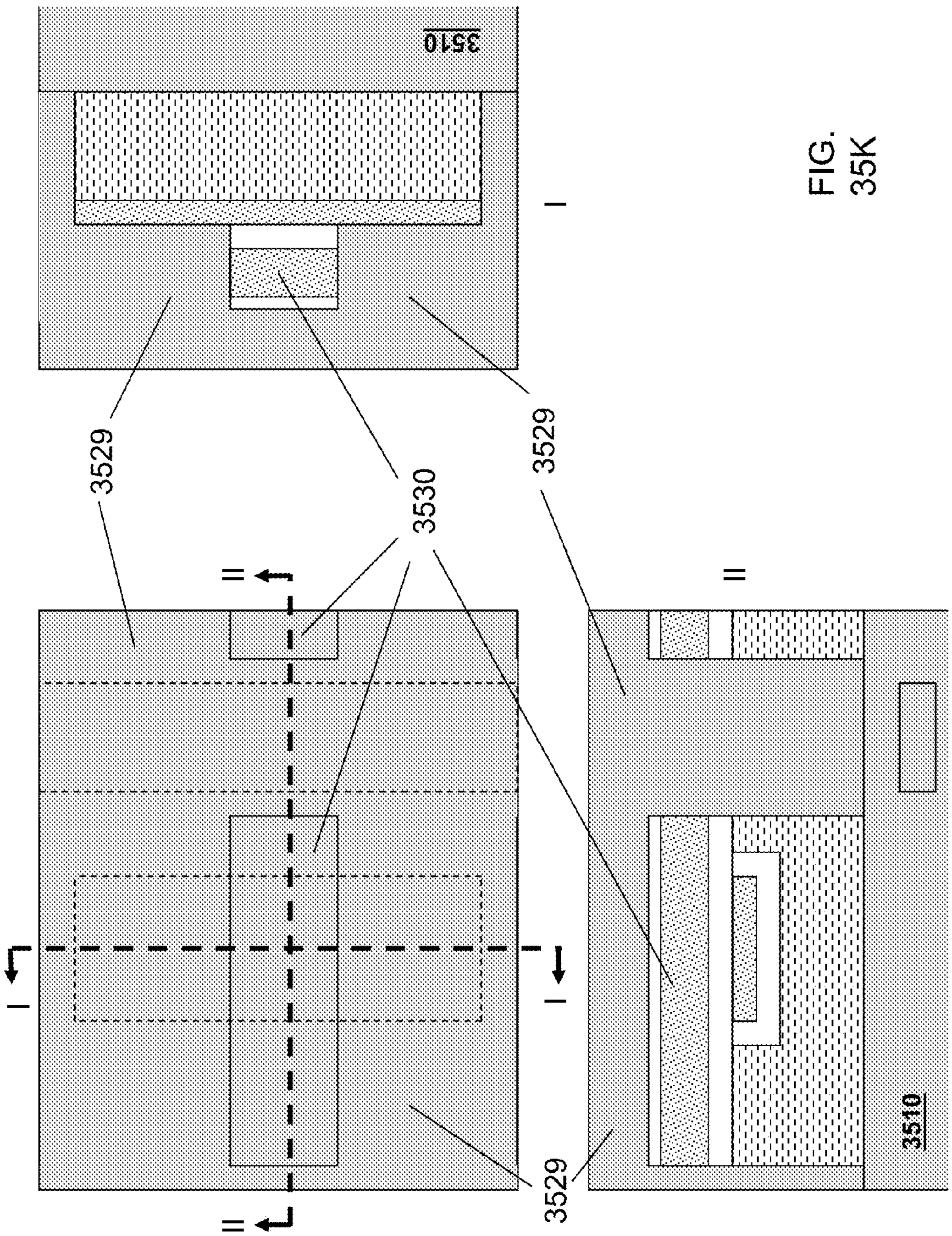
Figure 35L:
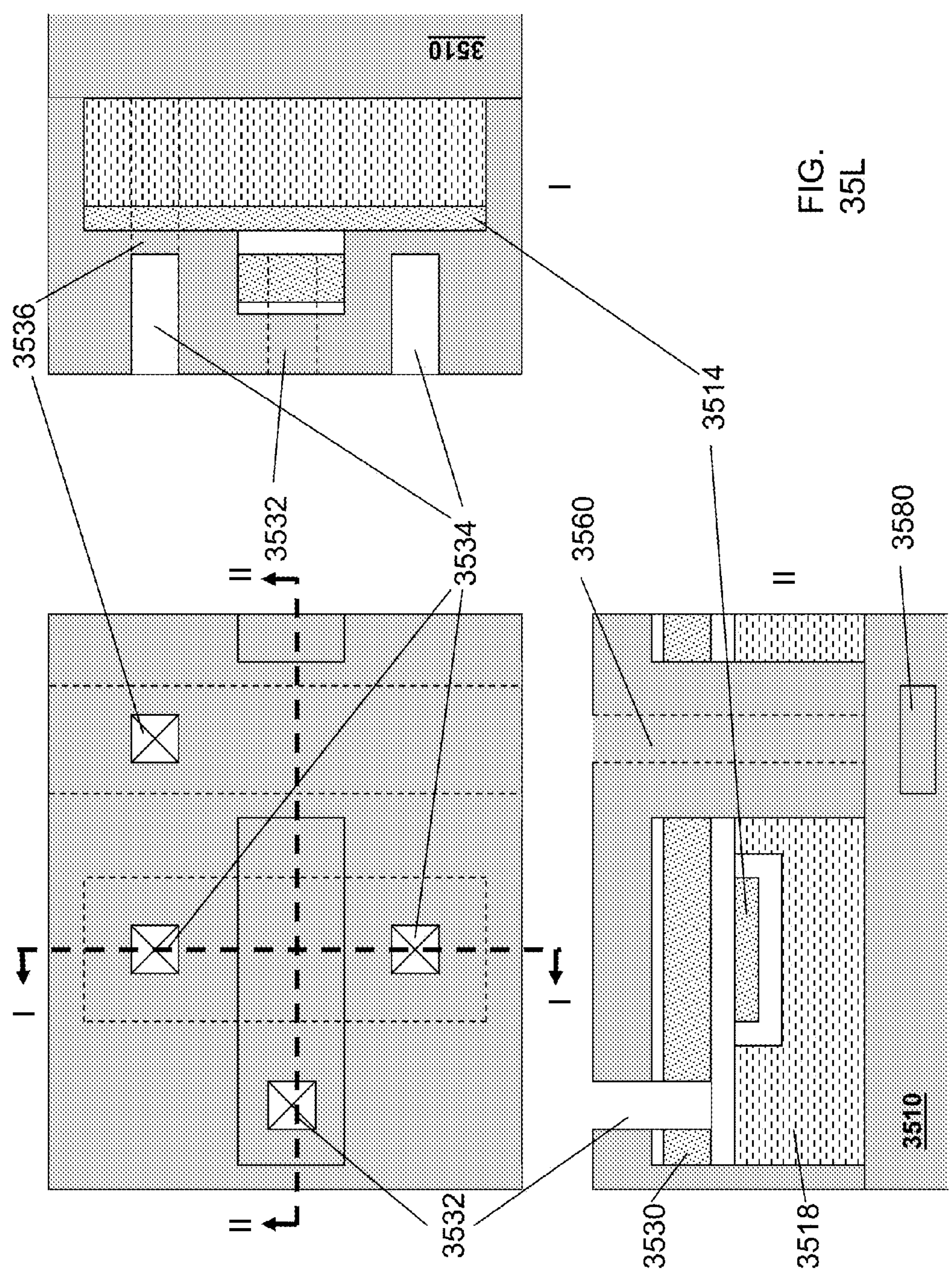

As illustrated in FIG. 35K, the top gate 3530 may be masked and then etched. The etched openings may then be filled with a low temperature gap fill oxide 3529 by deposition, and chemically and mechanically (CMP'ed) polished flat. Then an additional oxide layer, also shown merged with and labeled as 3529, is deposited to enable interconnect metal isolation. As illustrated in FIG. 35L the contacts are masked and etched. The gate contact 3532 is masked and etched, so that the contact etches through the top gate layer 3530, and during the metal opening mask and etch processes the gate oxide 3512 is etched and the top 3530 and bottom 3518 gates are connected together. The contacts 3534 to the two terminals of the transistor channel layer 3514 are masked and etched. Then the thru layer vias 3560 to acceptor wafer 3510 metal interconnect strip 3580 are masked and etched.

Figure 35M:
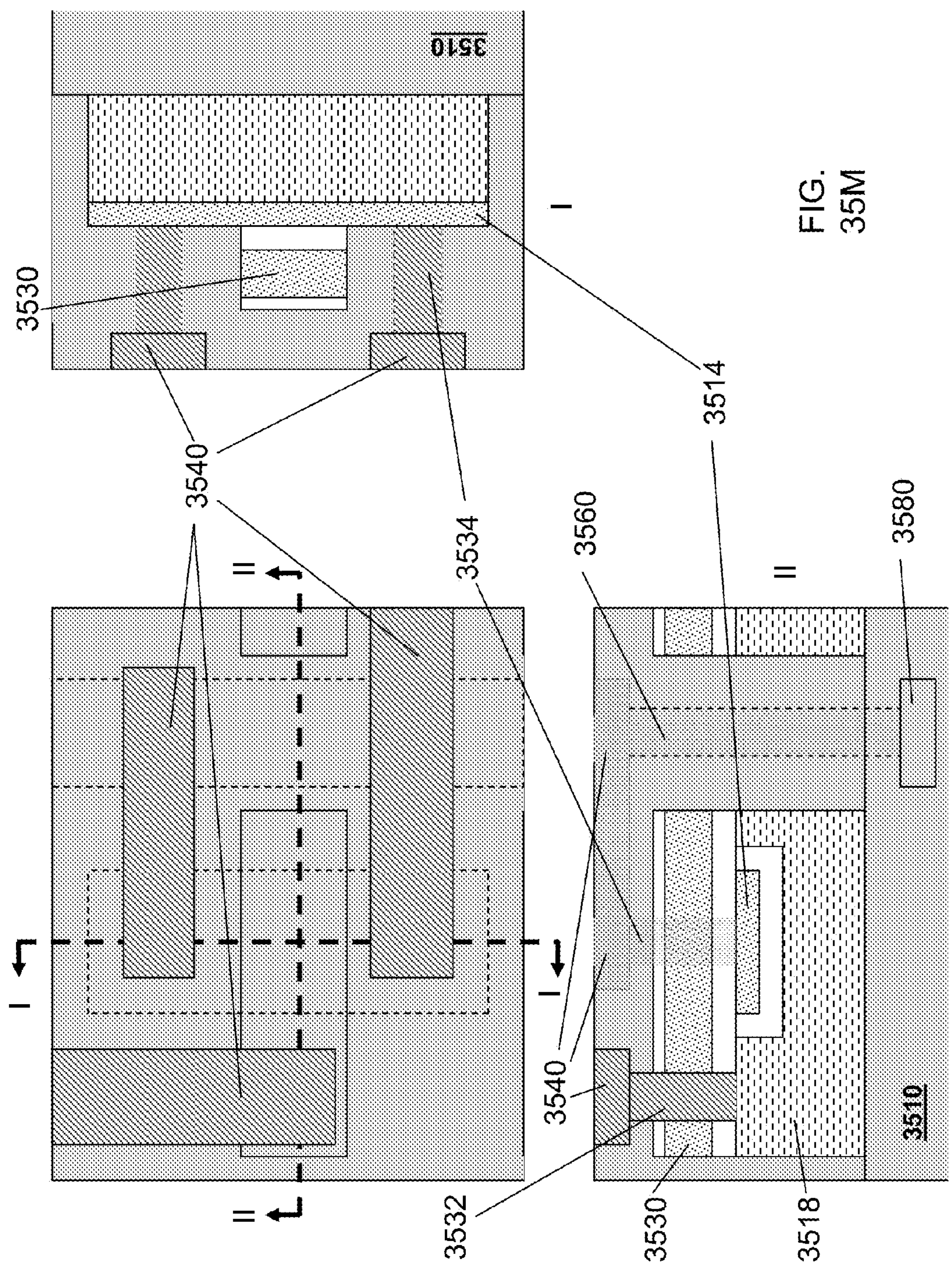

As illustrated in FIG. 35M, metal lines 3540 are mask defined and etched, filled with barrier metals and copper interconnect, and CMP'ed in a normal metal interconnect scheme. This completes the contact via 3532 simultaneous coupling to the top 3530 and bottom 3518 gates for the 4-sided gate connection. The two transistor channel terminal contacts (source and drain) 3522 independently connect to the transistor channel element 3508 on each side of the gate 3514. The thru via 3560 electrically couples the transistor layer metallization to the acceptor substrate 3510 at acceptor wafer metal connect strip 3580.

This flow enables the formation of a mono-crystalline silicon channel 4-sided gated junction-less transistor that may be formed and connected to the underlying multi-metal layer semiconductor device without exposing the underlying devices to a high temperature.

A p channel 4-sided gated JLT may be constructed as above with the N+ layer 3504A formed as P+ doped, and the gate metals 3518 and 3504 are of appropriate work function to shutoff the p channel at a gate voltage of zero, such as, for example, heavily doped N+ silicon.

The Following Sections Discuss Embodiments to the Invention Wherein Wafer or Die-Sized Sized Pre-Formed Repeating Device Structures are Transferred and then Processed to Create 3D ICs.

An embodiment of this invention is to pre-process a donor wafer by forming wafer-sized or die-sized layers of pre-formed repeating device structures without a process temperature restriction, then layer transferring the pre-processed donor wafer to the acceptor wafer, and processing with either low temperature (below approximately 400° C.) or high temperature (greater than approximately 400° C.) after the layer transfer to form device structures, such as, for example, transistors, on or in the donor wafer that may be physically aligned and may be electrically coupled to the acceptor wafer. Methods are described to build both 'n' type and 'p' type transistors on the same layer by partially processing the first phase of transistor formation on the donor wafer with normal CMOS processing including a 'dummy gate', a process known as 'gate-last'. In various embodiments of the invention, a layer transfer of the mono-crystalline silicon may be performed after the dummy gate is completed and before the formation of a replacement gate. The dummy gate and the replacement gate may include various materials such as, for example, silicon and silicon dioxide, or metal and low k materials such as, for example, TiAlN and HfO2. An example may be the high-k metal gate (HKMG) CMOS transistors that have been developed for the 45 nm, 32 nm, 22 nm, and future CMOS generations. Intel and TSMC have shown the advantages of a 'gate-last' approach to construct high performance HKMG CMOS transistors (C, Auth et al., VLSI 2008, pp 128-129 and C. H. Jan et al, 2009 IEDM p. 647).

FIGS. 36A to 36H describe an overall process flow wherein CMOS transistors are partially processed on a donor wafer, temporarily transferred to a carrier or holder substrate or wafer and thinned, layer transferred to an acceptor substrate, and then the transistor and interconnections are completed in low temperature (below approximately 400° C.).

Figure 36A:
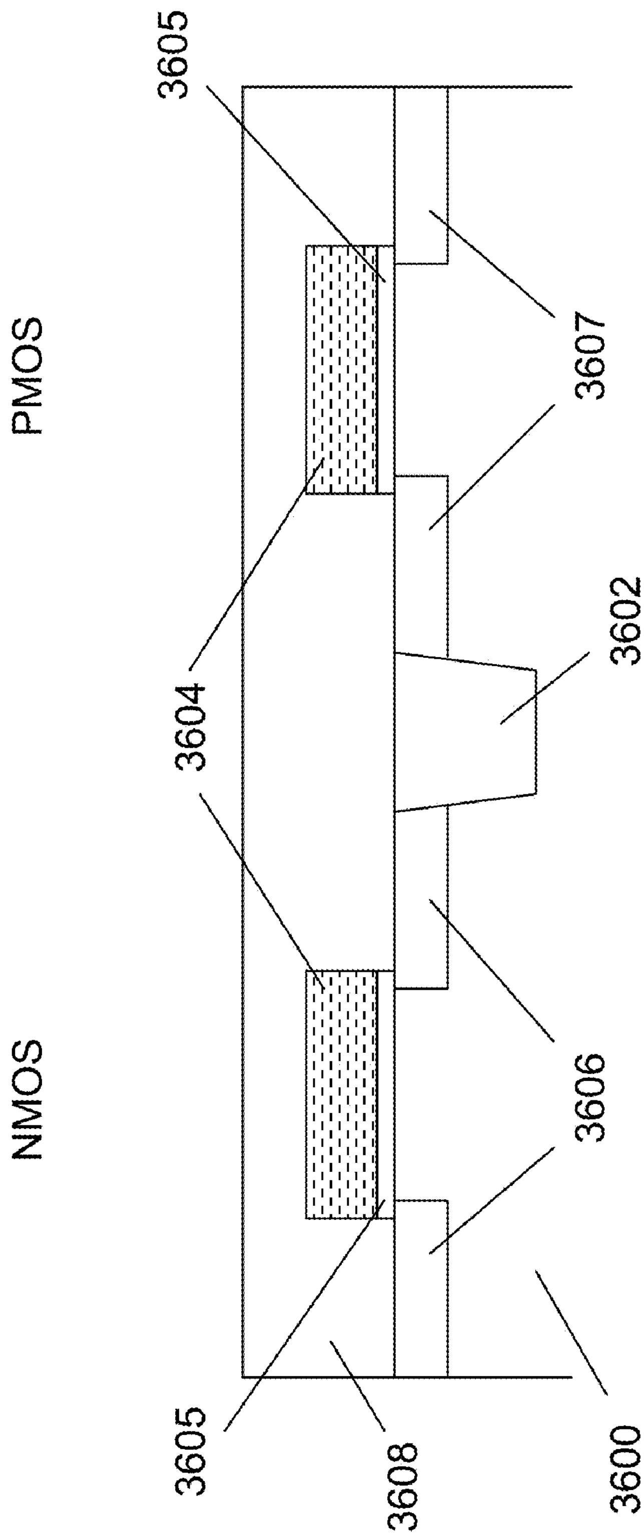
FIGS. 36A-H are exemplary drawing illustrations of the formation of top planar transistors.

As illustrated in FIG. 36A, a donor wafer 3600 may be processed in the normal state of the art HKMG gate-last manner up to the step prior to where CMP exposure of the poly-crystalline silicon dummy gates takes place. The donor wafer 3600 may be a bulk mono-crystalline silicon wafer (shown), or a Silicon On Insulator (SOI) wafer, or a Germanium on Insulator (GeOI) wafer. Donor wafer 3600, the shallow trench isolation (STI) 3602 between transistors, the poly-crystalline silicon 3604 and gate oxide 3605 of both n-type and p-type CMOS dummy gates, their associated source and drains 3606 for NMOS and 3607 for PMOS, and the inter-layer dielectric (ILD) 3608 are shown in the cross section illustration. These structures of FIG. 36A illustrate completion of the first phase of transistor formation.

Figure 36B:
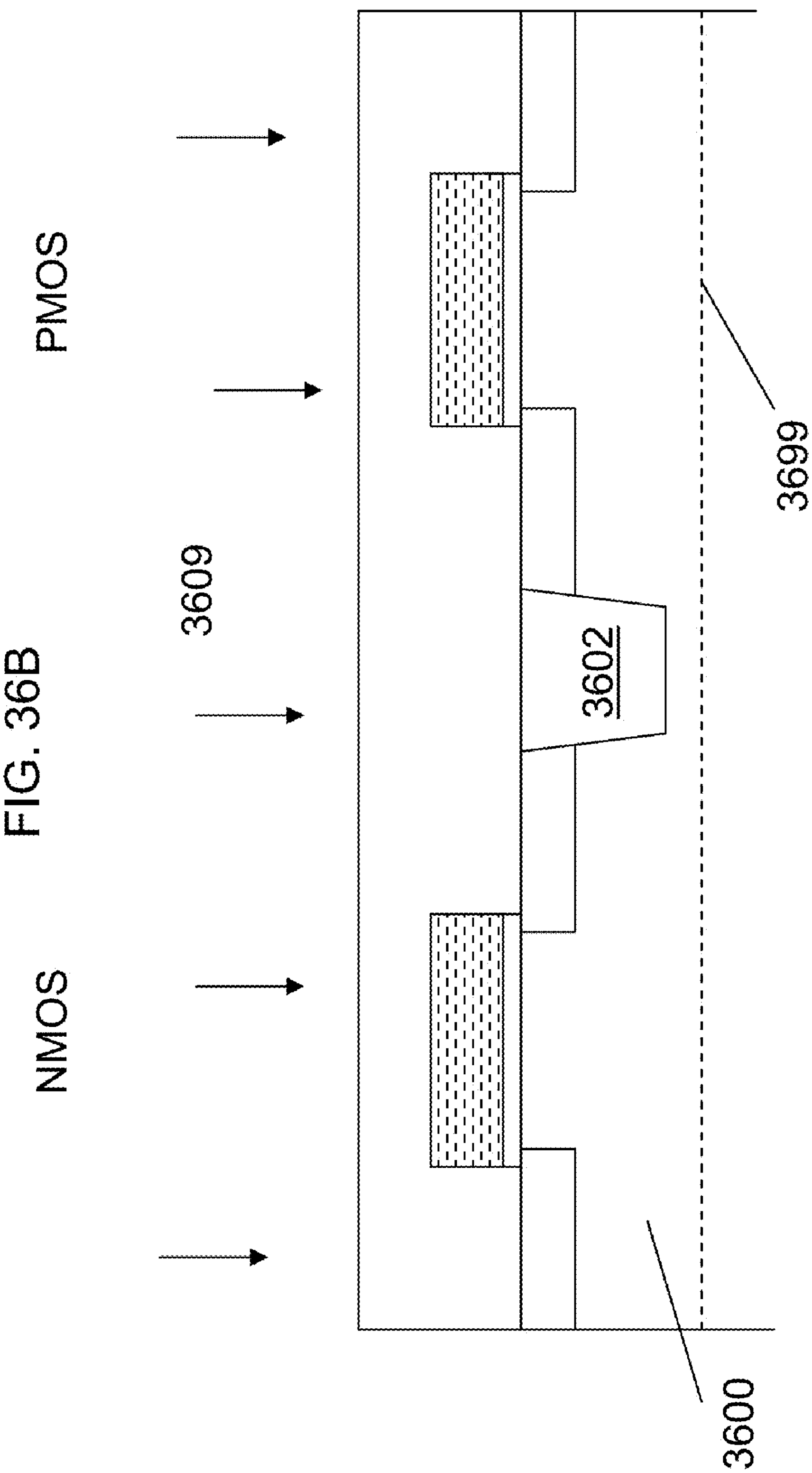

As illustrated in FIG. 36B, a layer transfer demarcation plane (shown as dashed line) 3699 may be formed by hydrogen implantation 3609 or other methods as previously described.

Figure 36C:
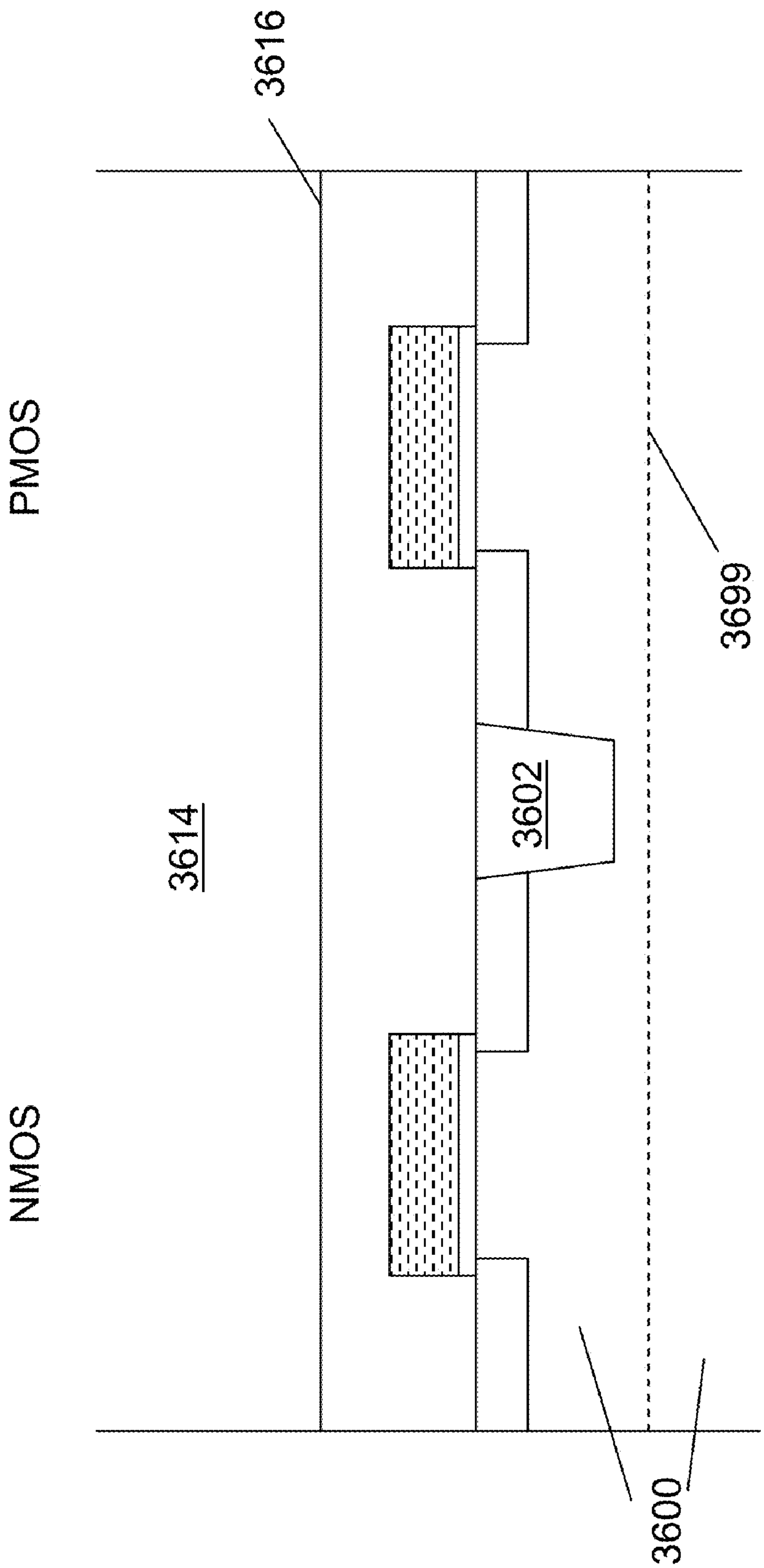

As illustrated in FIG. 36C, donor wafer 3600 with the first phase of transistor formation completed may be temporarily bonded to carrier or holder substrate 3614 at interface 3616 with a low temperature process that may facilitate a low temperature release. The carrier or holder substrate 3614 may be a glass substrate to enable state of the art optical alignment with the acceptor wafer. A temporary bond between the carrier or holder substrate 3614 and the donor wafer 3600 at interface 3616 may be made with a polymeric material, such as, for example, polyimide DuPont HD3007, which can be released at a later step by laser ablation, Ultra-Violet radiation exposure, or thermal decomposition. Alternatively, a temporary bond may be made with uni-polar or bi-polar electrostatic technology such as, for example, the Apache tool from Beam Services Inc.

Figure 36D:
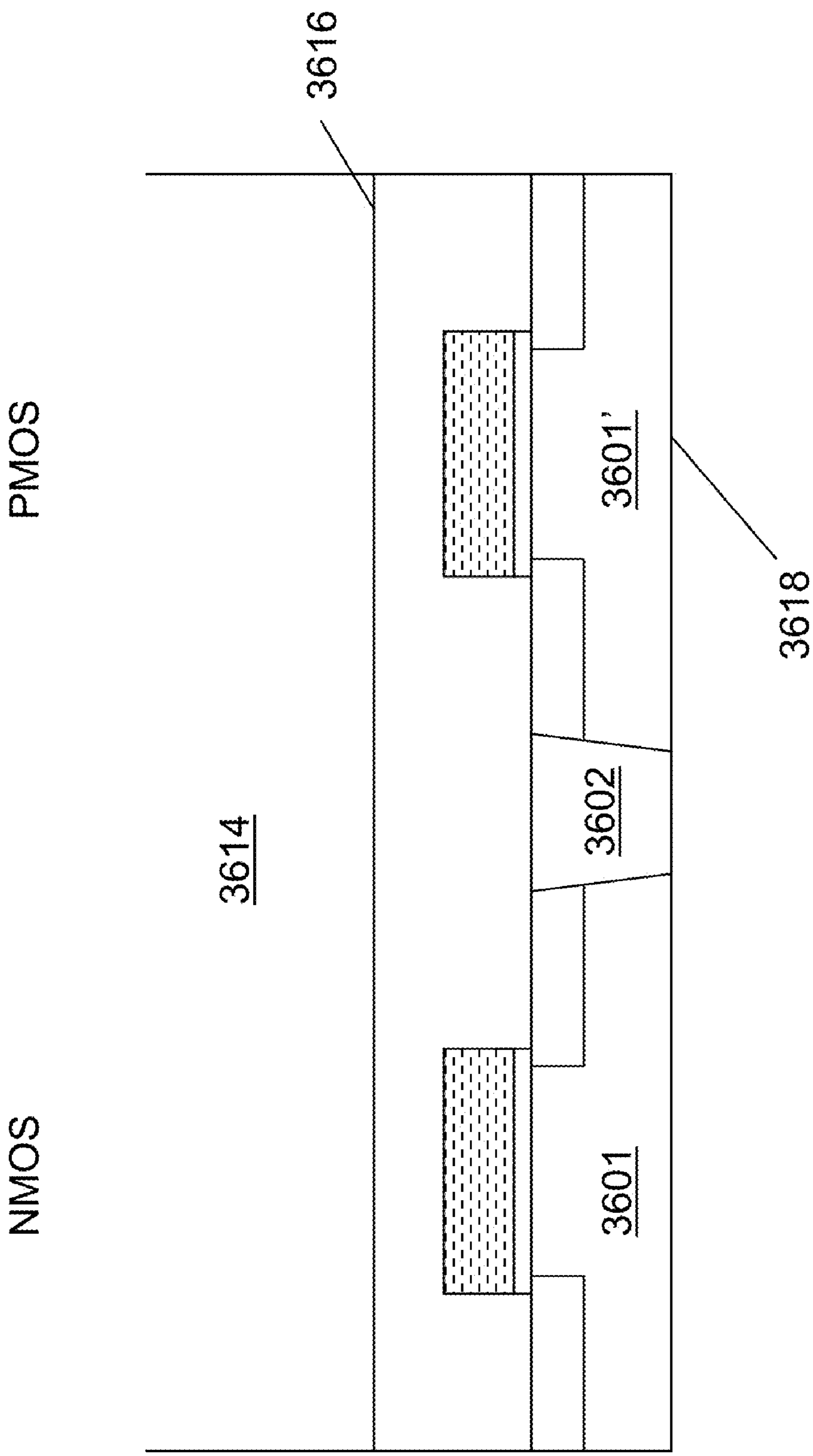

As illustrated in FIG. 36D, the portion of the donor wafer 3600 that is below the layer transfer demarcation plane 3699 may be removed by cleaving or other processes as previously described, such as, for example, ion-cut or other methods. The remaining donor wafer regions 3601 and 3601' may be thinned by chemical mechanical polishing (CMP) so that the transistor STI 3602 may be exposed at the donor wafer face 3618. Alternatively, the CMP could continue to the bottom of the junctions to eventually create fully depleted SOI transistors.

Figure 36E:
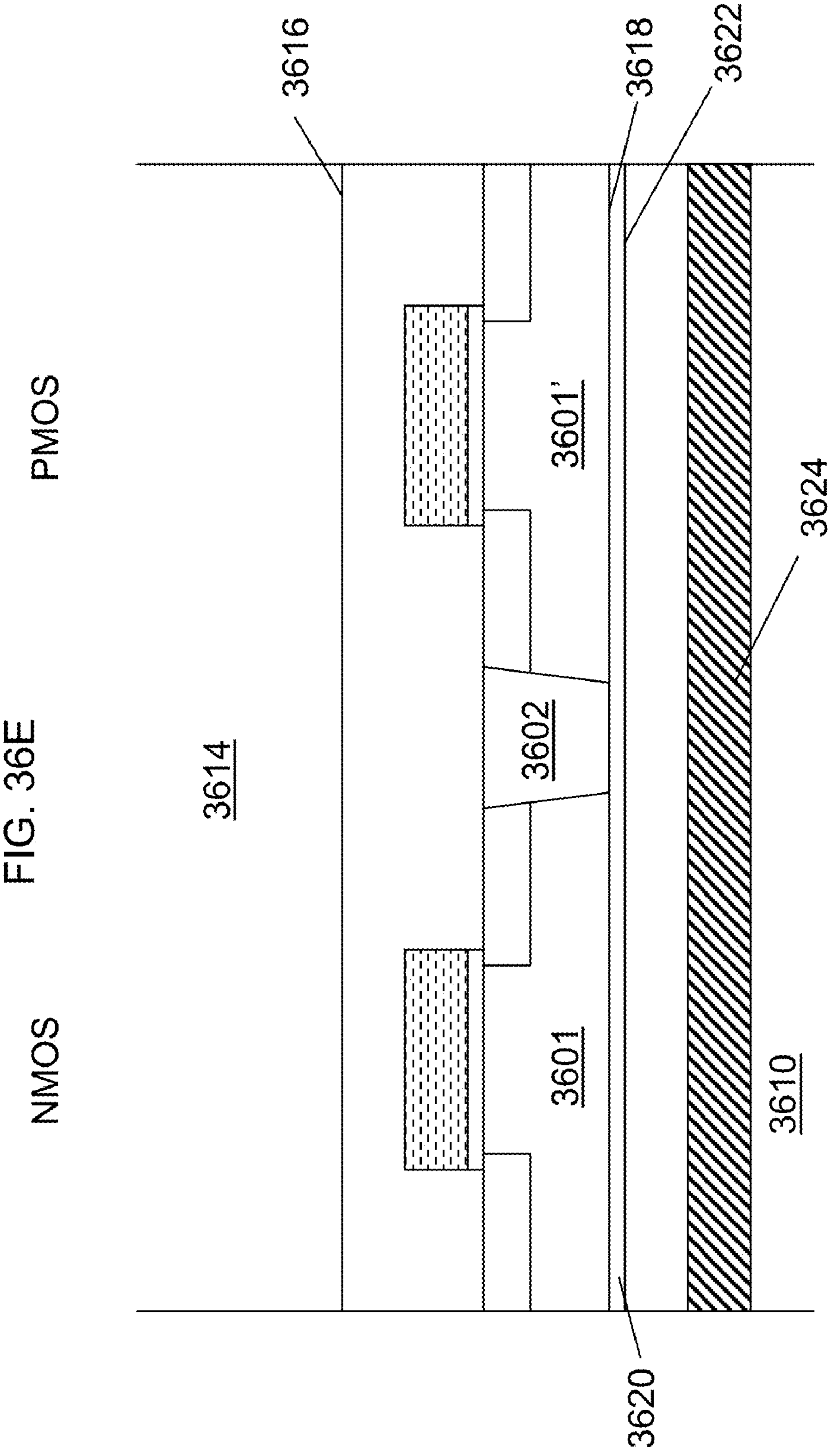

As illustrated in FIG. 36E, oxide 7020 may be deposited on the remaining donor wafer 3601 surface 3618. Both the donor wafer surface 3618 and acceptor substrate 3610 may be prepared for wafer bonding as previously described and then low temperature (less than approximately 400° C.) aligned and bonded at surface 3622. With reference to the FIG. 33D discussion, acceptor wafer metal connect strip 3624 is shown.

Figure 36F:
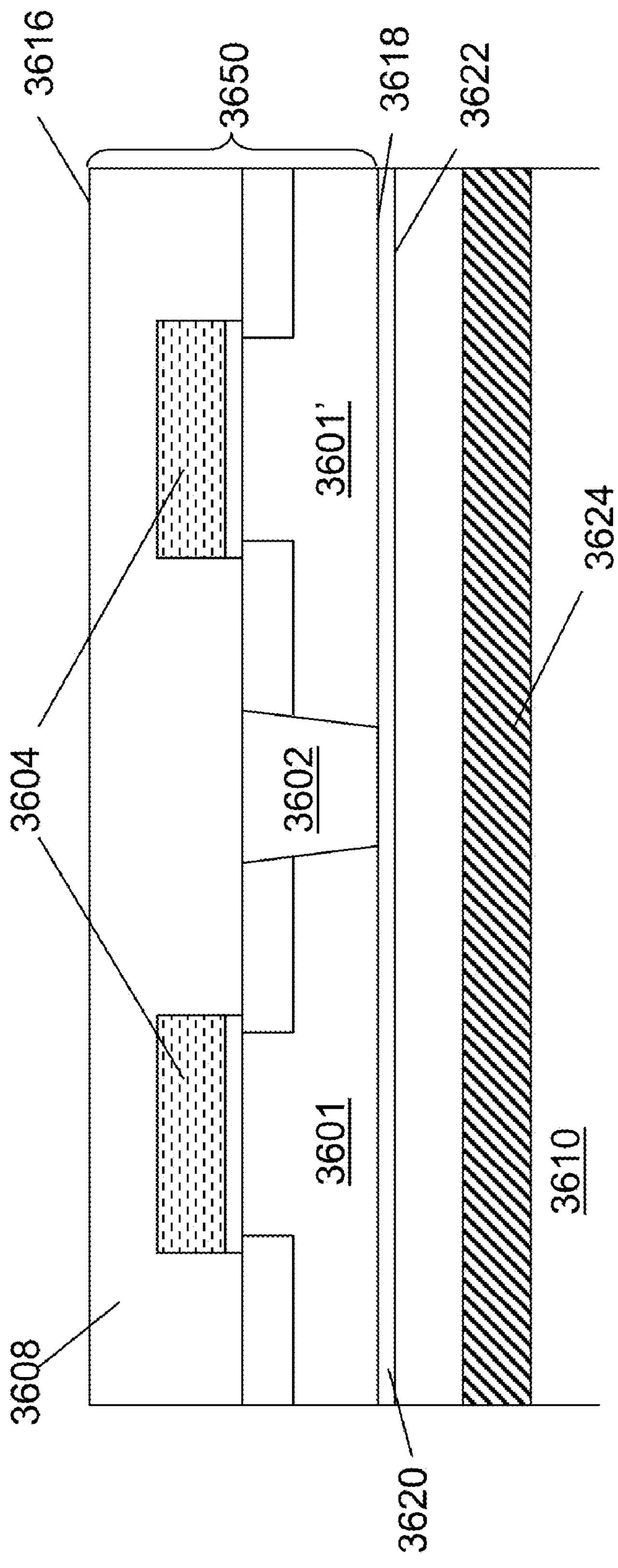

As illustrated in FIGS. 36F, the carrier or holder substrate 7014 may then be released at interface 3616 using a low temperature process such as, for example, laser ablation. The bonded combination of acceptor substrate 3610 and first phase completed HKMG CMOS transistor tier 3250 may now be ready for normal state of the art gate-last transistor formation completion.

Figure 36G:
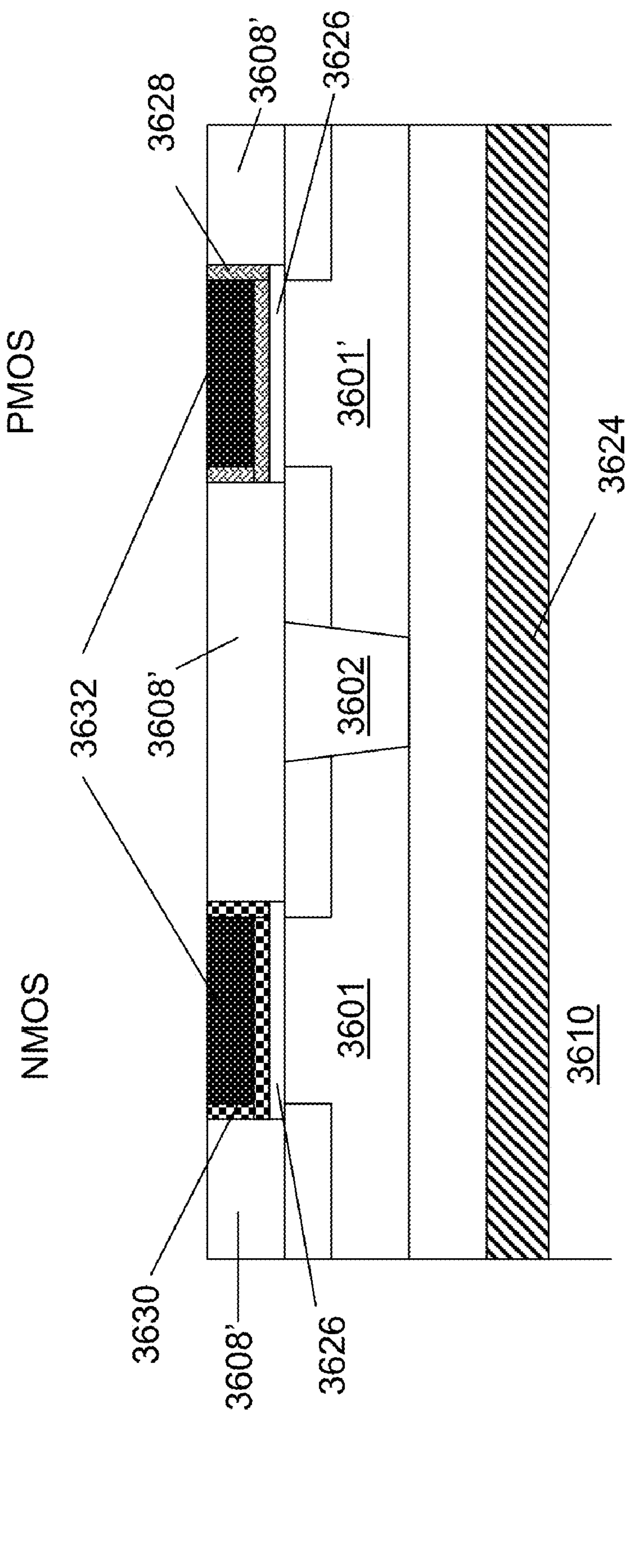

As illustrated in FIG. 36G, the inter layer dielectric 3608 may be chemical mechanically polished to expose the top of the poly-crystalline silicon dummy gates and create regions 3608' of interlayer dielectric. The dummy poly-crystalline silicon gates 3604 may then be removed by etching and the hi-k gate dielectric 3626 and the PMOS specific work function metal gate 3628 may be deposited. The PMOS work function metal gate may be removed from the NMOS transistors and the NMOS specific work function metal gate 3630 may be deposited. An aluminum fill 3632 may be performed on both NMOS and PMOS gates and the metal chemical mechanically polished. For illustration clarity, the oxide layers used to facilitate the wafer to wafer bond are not shown.

Figure 36H:
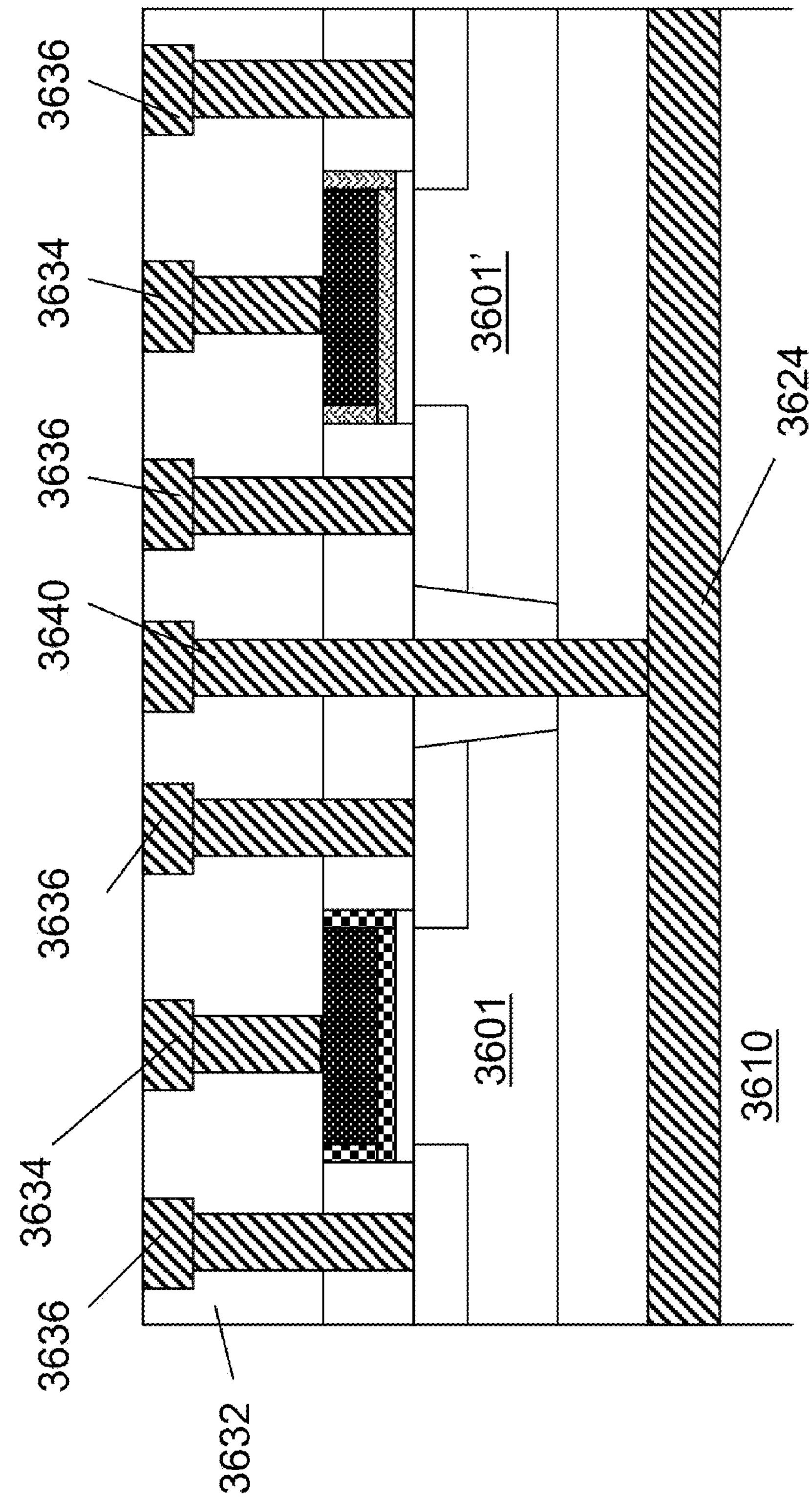

As illustrated in FIG. 36H, a low temperature dielectric layer 3632 may be deposited and the normal gate 3634 and source/drain 3636 contact formation and metallization may now be performed to connect to and between the PMOS & NMOS transistors. Thru layer via (TLV) 3640 may be lithographically defined, plasma/RIE etched, and metallization formed. TLV 3640 electrically couples the transistor layer metallization to the acceptor substrate 3610 at acceptor wafer metal connect strip 3624.

Persons of ordinary skill in the art will appreciate that the illustrations in FIGS. 36A through 36H are exemplary only and are not drawn to scale. Such skilled persons will further appreciate that many variations are possible such as, for example, the top metal layer may be formed to act as the acceptor wafer landing strips for a repeat of the above process flow to stack another preprocessed thin mono-crystalline layer of two-phase formed transistors. Additionally, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Moreover, other transistor types are possible, such as, for example, RCAT and junction-less. Thus the scope of the invention is to be limited only by the appended claims.

With reference to the discussion of FIGS. 36A to 36H, FIGS. 37A to 37G describe a process flow wherein CMOS transistors are partially processed on a donor wafer, which is temporarily bonded and transferred to a carrier or holder wafer, after which it is cleaved, thinned and planarized before being layer transferred to an acceptor substrate. After bonding to the acceptor substrate, the temporary carrier or holder wafer is removed, the surface planarized, and then the transistor and interconnections are completed with low temperature (below approximately 400° C.) processes. State of the art CMOS transistors may be constructed with methods that are suitable for 3D IC manufacturing.

Figure 37A:
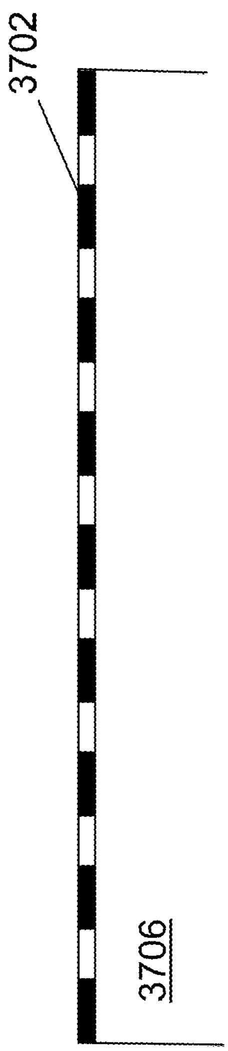
FIGS. 37A-G are exemplary drawing illustrations of the formation of top planar transistors.

As illustrated in FIG. 37A, a donor wafer 3706 may be processed in the normal state of the art HKMG gate-last manner up to the step prior to where CMP exposure of the poly-crystalline silicon dummy gates takes place. The donor wafer 3706 may be a bulk mono-crystalline silicon wafer (shown), or a Silicon On Insulator (SOI) wafer, or a Germanium on Insulator (GeOI) wafer. Donor wafer 3706 and CMOS dummy gates 3702 are shown in the cross section illustration. These structures of FIG. 37A illustrate completion of the first phase of transistor formation.

Figure 37B:
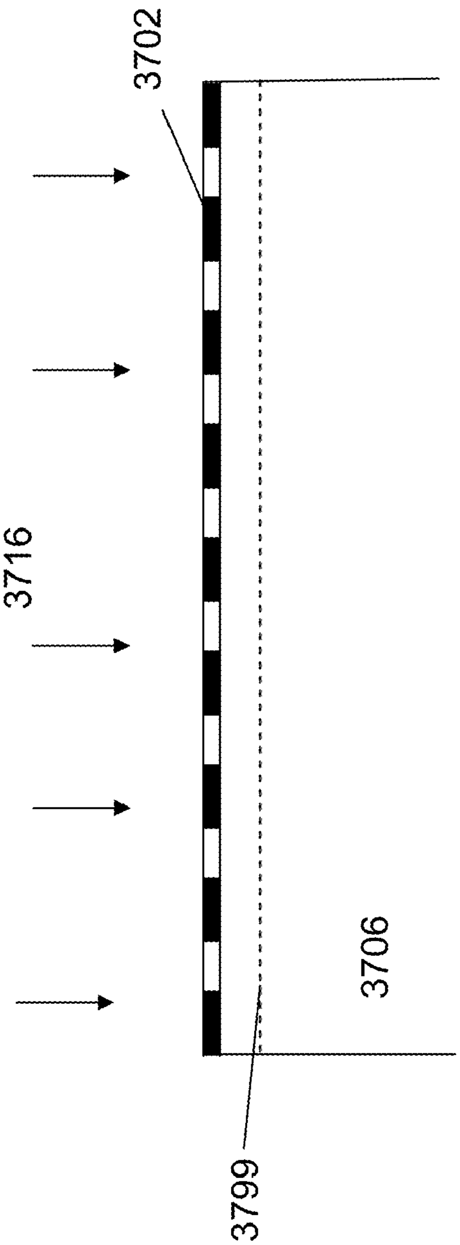

As illustrated in FIG. 37B, a layer transfer demarcation plane (shown as dashed line) 3799 may be formed in donor wafer 3706 by hydrogen implantation 3716 or other methods as previously described. Both the donor wafer 3706 top surface and carrier or holder silicon wafer 3726 may be prepared for wafer bonding as previously described.

Figure 37C:
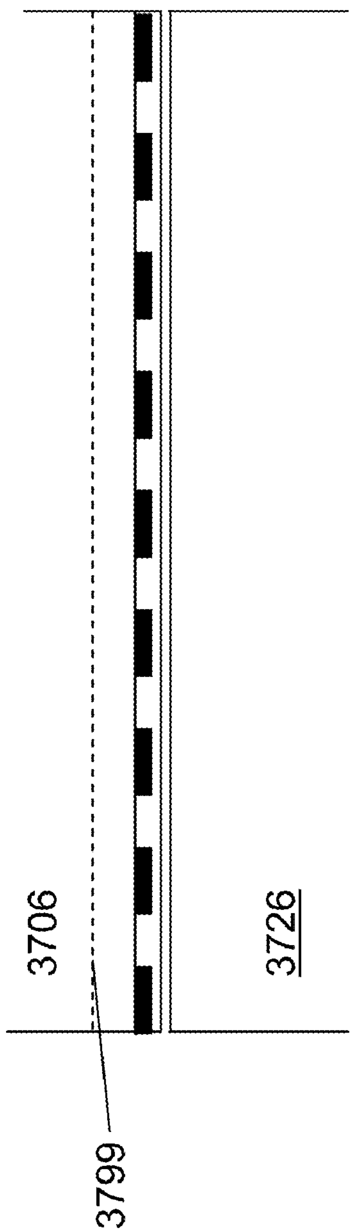

As illustrated in FIG. 37C, donor wafer 3706 with the first phase of transistor formation completed may be permanently bonded to carrier or holder silicon wafer 3726 and may utilize oxide to oxide bonding.

Figure 37D:
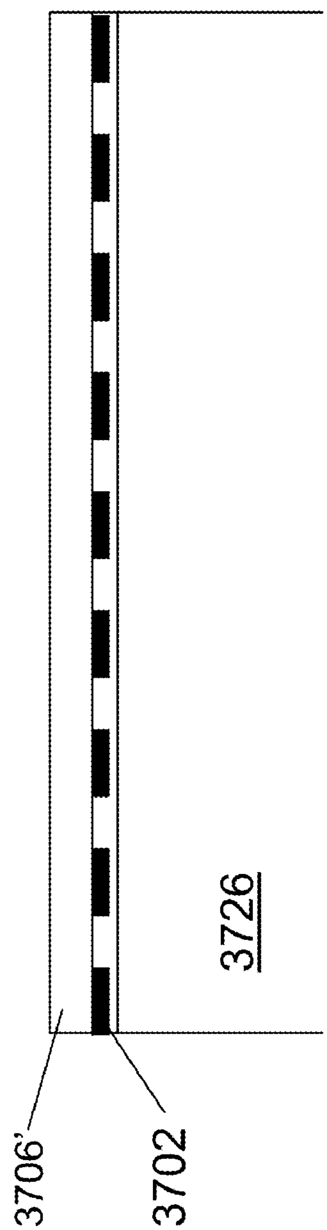

As illustrated in FIG. 37D, the portion of the donor wafer 3706 that is above the layer transfer demarcation plane 3799 may be removed by cleaving or other processes as previously described, such as, for example, ion-cut or other methods. The remaining donor wafer 3706' may be thinned by chemical mechanical polishing (CMP). Thus dummy transistors 3702 and associated remaining donor wafer 3706' are transferred and permanently bonded to carrier or holder silicon wafer 3726.

Figure 37E:
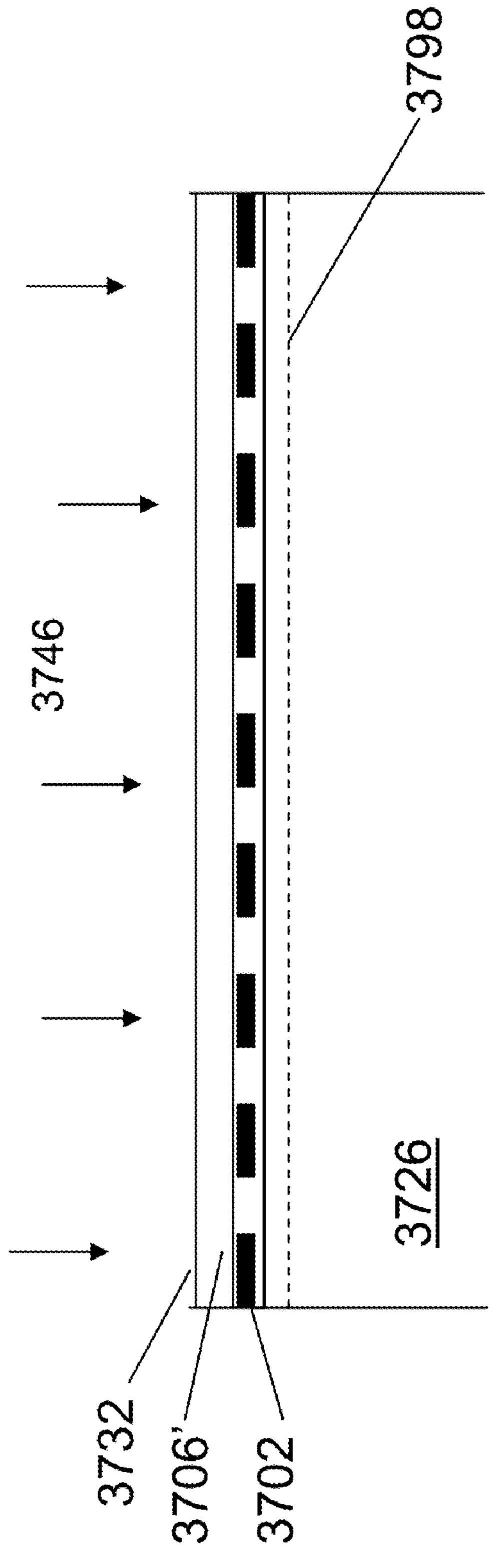

As illustrated in FIG. 37E, a thin layer of oxide 7032 may be deposited on the remaining donor wafer 3706' open surface. A layer transfer demarcation plane (shown as dashed line) 3798 may be formed in carrier or holder silicon wafer 3726 by hydrogen implantation 3746 or other methods as previously described.

Figure 37F:
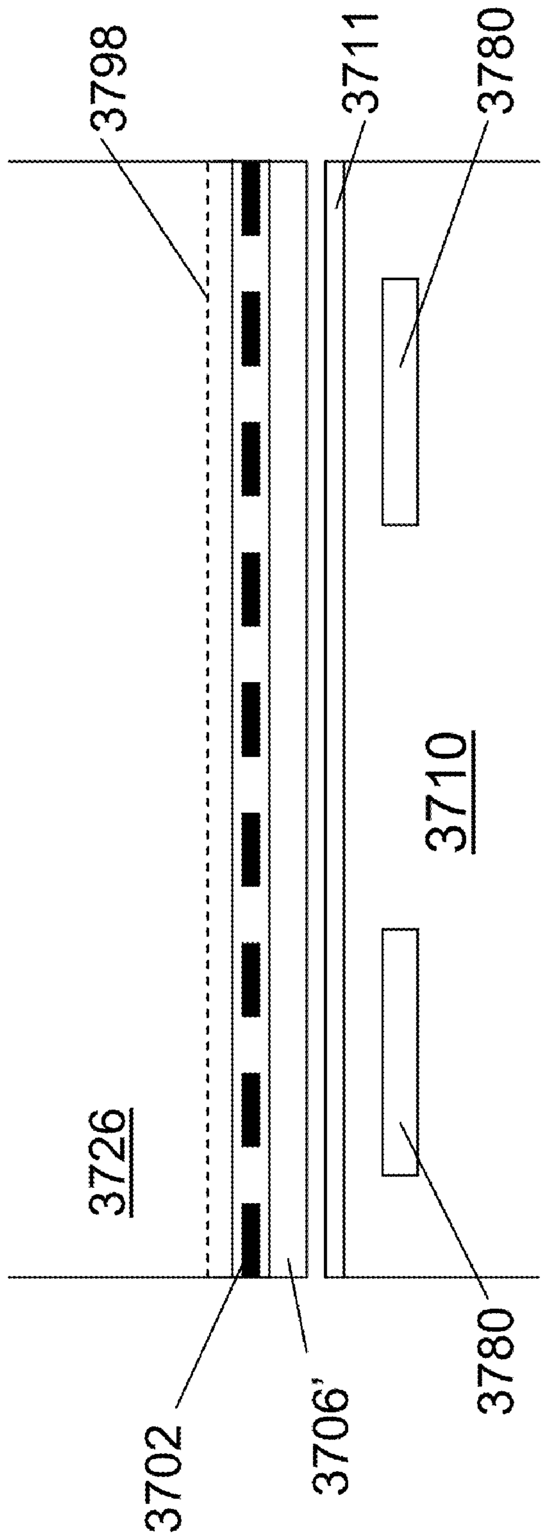

As illustrated in FIG. 37F, carrier or holder silicon wafer 3726, with layer transfer demarcation plane (shown as dashed line) 3798, dummy gates 3702, and remaining donor wafer 3706' may be prepared for wafer bonding as previously described and then low temperature (less than approximately 400° C.) aligned and bonded to acceptor substrate 3710. Acceptor substrate 3710 may comprise pre-made circuitry as described previously, top oxide layer 3711, and acceptor wafer metal connect strip 3780.

Figure 37G:
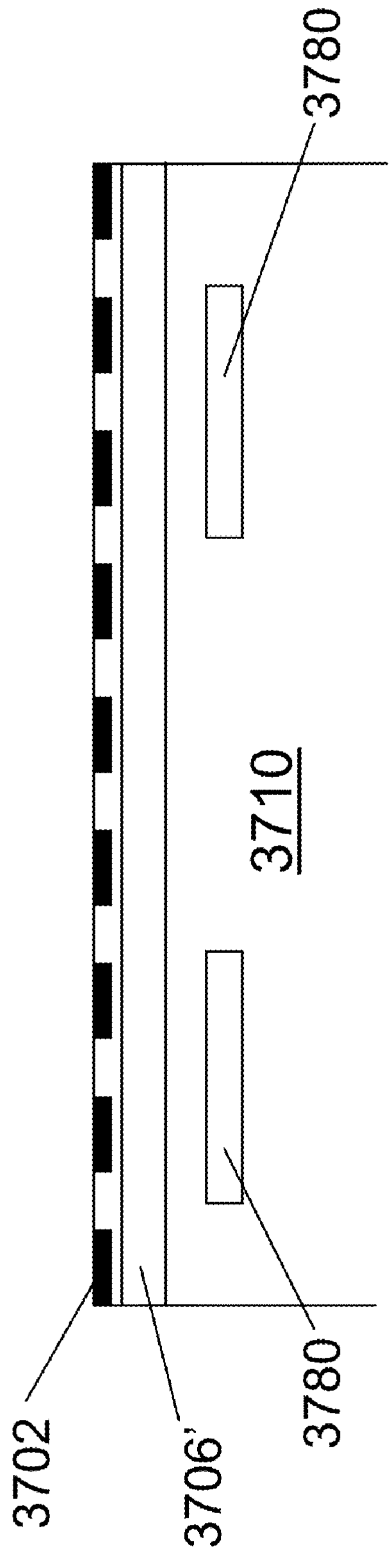

As illustrated in FIGS. 37G, the portion of the carrier or holder wafer 3726 that is above the layer transfer demarcation plane 3798 may be removed by cleaving or other processes as previously described, such as, for example, ion-cut or other methods. The remaining carrier or holder material may be removed by chemical mechanical polishing (CMP) or a wet etchant, such as, for example, Potassium Hydroxide (KOH). A second CMP may be performed to expose the top of the dummy gates 3702. The bonded combination of acceptor substrate 3710 and first phase completed HKMG CMOS transistor tier comprised of dummy gates 3702 and remaining donor wafer 3706' may now be ready for normal state of the art gate-last transistor formation completion as described previously with reference to FIGS. 36G and 36H.

Persons of ordinary skill in the art will appreciate that the illustrations in FIGS. 37A through 37G are exemplary only and are not drawn to scale. Such skilled persons will further appreciate that many variations are possible such as, for example, the carrier or holder wafer may be composed of some other material than mono-crystalline silicon, or the top metal layer may be formed to act as the acceptor wafer landing strips for a repeat of the above process flow to stack another preprocessed thin mono-crystalline layer of two-phase formed transistors. Additionally, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Thus the scope of the invention is to be limited only by the appended claims.

FIGS. 38A to 38E describe an overall process flow similar to FIG. 36 wherein CMOS transistors are partially processed on a donor wafer, temporarily transferred to a carrier or holder substrate and thinned, a double or back-gate is processed, layer transferred to an acceptor substrate, and then the transistor and interconnections are completed in low temperature (below approximately 400° C.). This provides a back-gated transistor (double gated) in a face-up process flow. State of the art CMOS transistors may be constructed with methods that are suitable for 3D IC manufacturing.

Figure 38A:
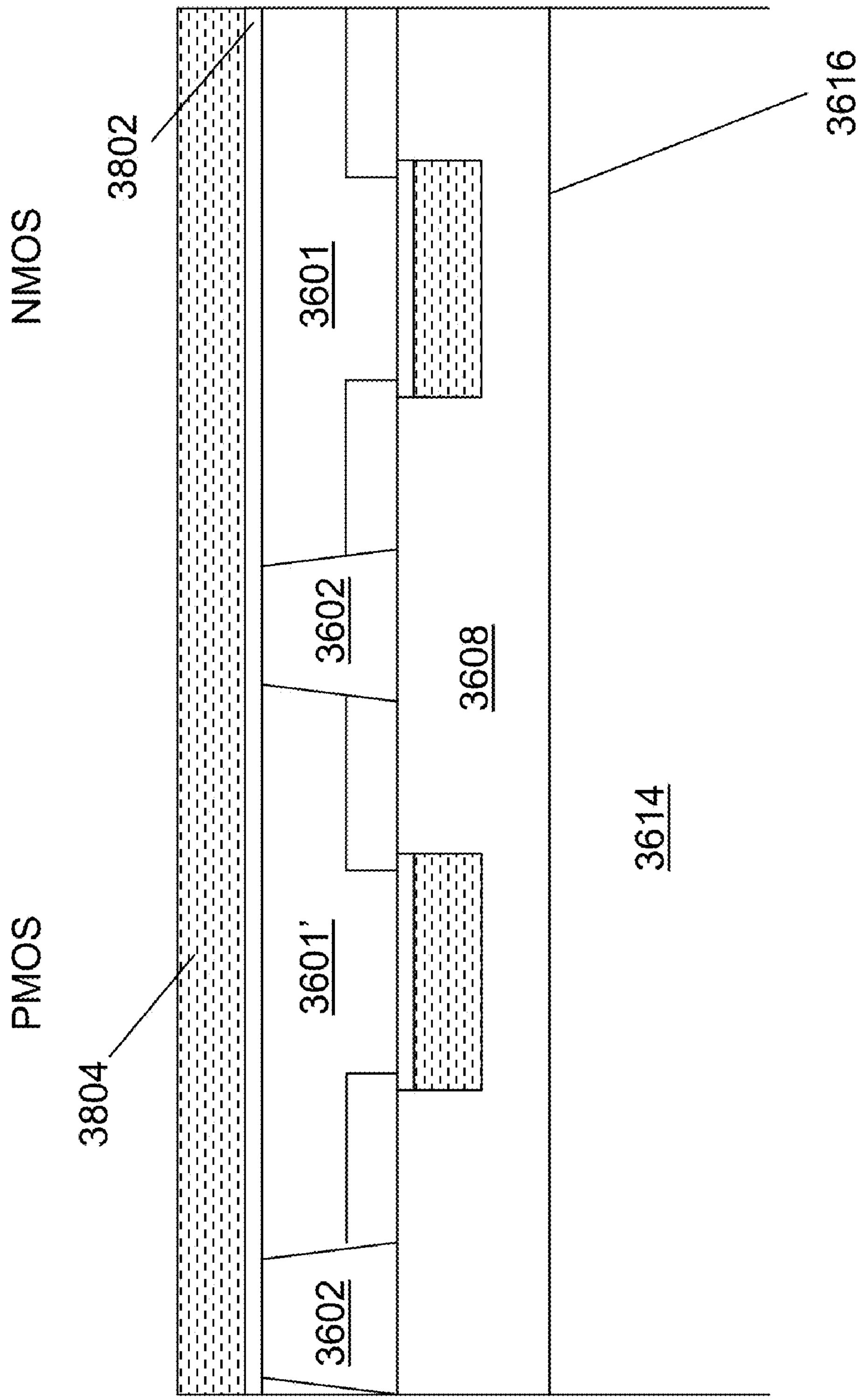
FIGS. 38A-E are exemplary drawing illustrations of the formation of top planar transistors.

As illustrated in FIG. 38A, planar CMOS dummy gate transistors may be processed as described in FIGS. 36A, 36B, 36C, and 36D. Carrier substrate 3614, bonding interface 3616, inter layer dielectric (ILD) 3608, shallow trench isolation (STI) regions 3602 and remaining donor wafer regions 3601 and 3601' are shown. These structures illustrate completion of the first phase of transistor formation. A second gate dielectric 3802 may be grown or deposited and second gate metal material 3804 may be deposited. The gate dielectric 3802 and second gate metal material 3804 may be formed with low temperature (approximately less than 400° C.) materials and processing, such as, for example, previously described TEL SPA gate oxide and amorphous silicon, ALD techniques, or hi-k metal gate stack (HKMG), or may be formed with a higher temperature gate oxide or oxynitride and doped poly-crystalline silicon if the carrier or holder substrate bond is permanent and the dopant movement or diffusion in the underlying transistors is accounted or compensated for.

Figure 38B:
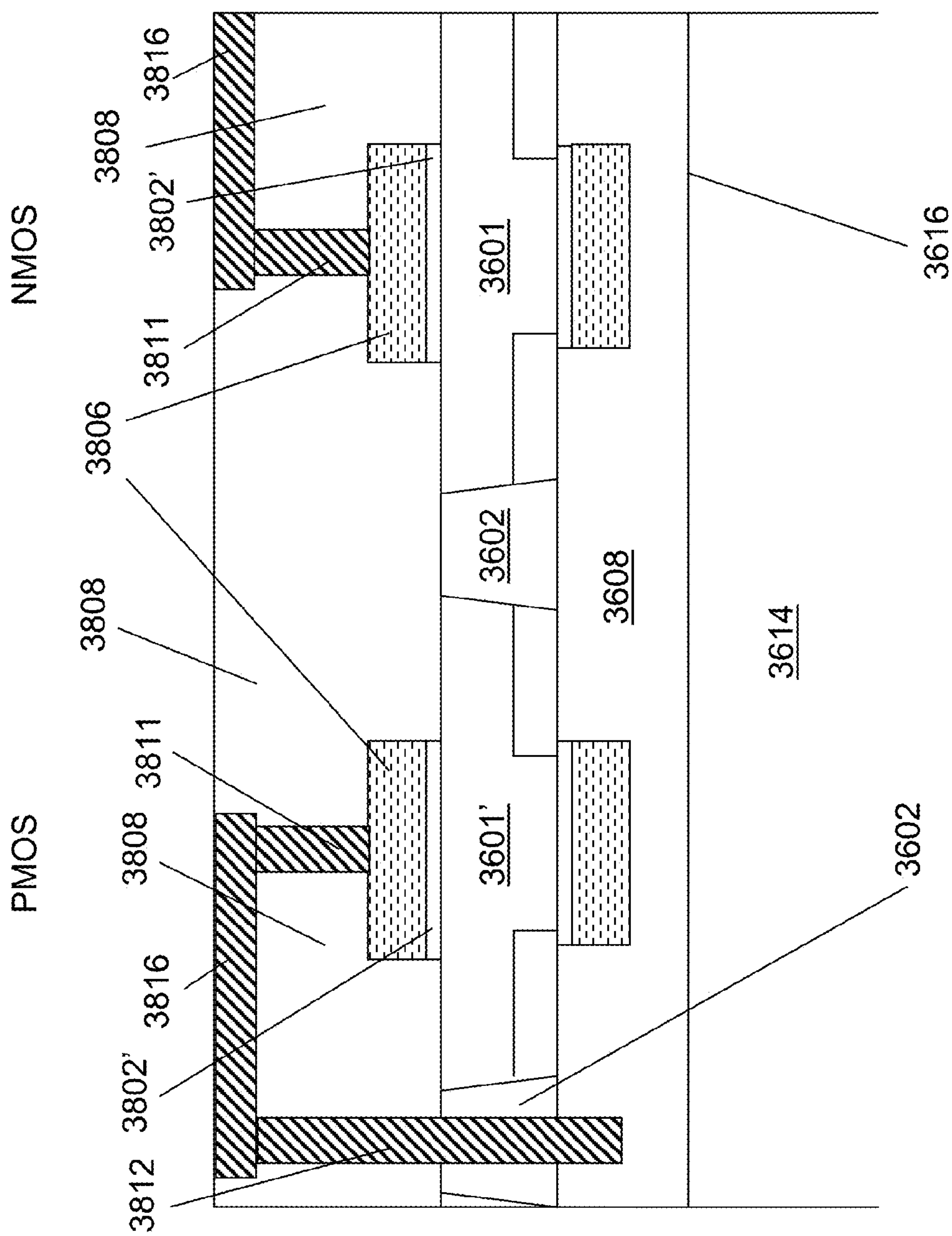

As illustrated in FIG. 38B, the gate stacks may be lithographically defined and plasma/RIE etched removing second gate metal material 3804 and gate dielectric 3802 leaving second transistor gates 3806 and associated gate dielectrics 3802' remaining. An ILD 3808 may be deposited and planarized, then second gate contacts 3811 and partial thru layer via 3812 and associated metallization 3816 may be conventionally formed.

Figure 38C:
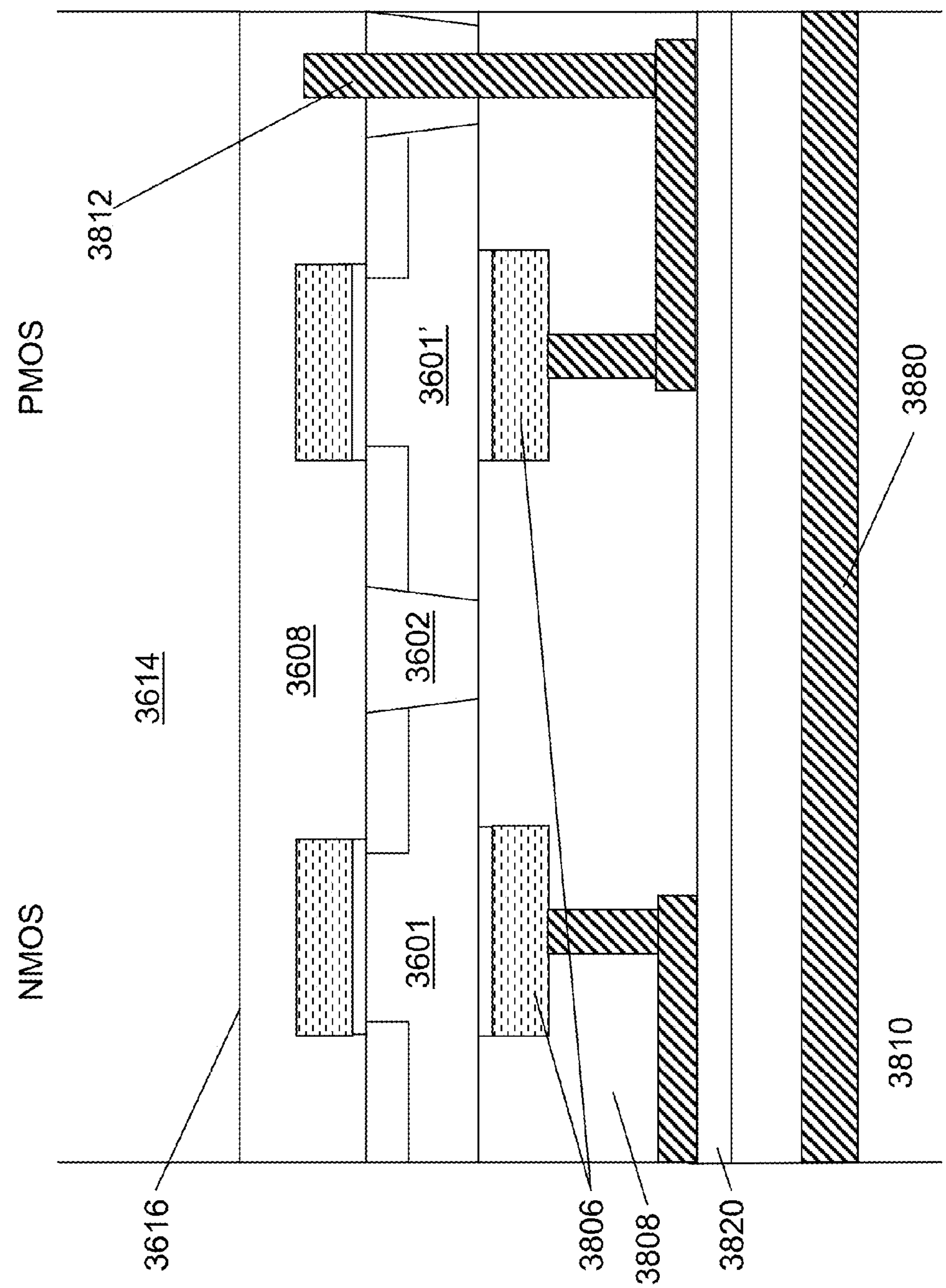

As illustrated in FIG. 38C, oxide layer 3820 may be deposited on the carrier or holder substrate with processed donor wafer surface for wafer bonding and electrical isolation of the metallization 3816 purposes. Both oxide layer 3820 surface and acceptor substrate 3810 may be prepared for wafer bonding as previously described and then low temperature (less than approximately 400° C.) aligned and bonded. Acceptor wafer metal connect strip 3880 is shown.

Figure 38D:
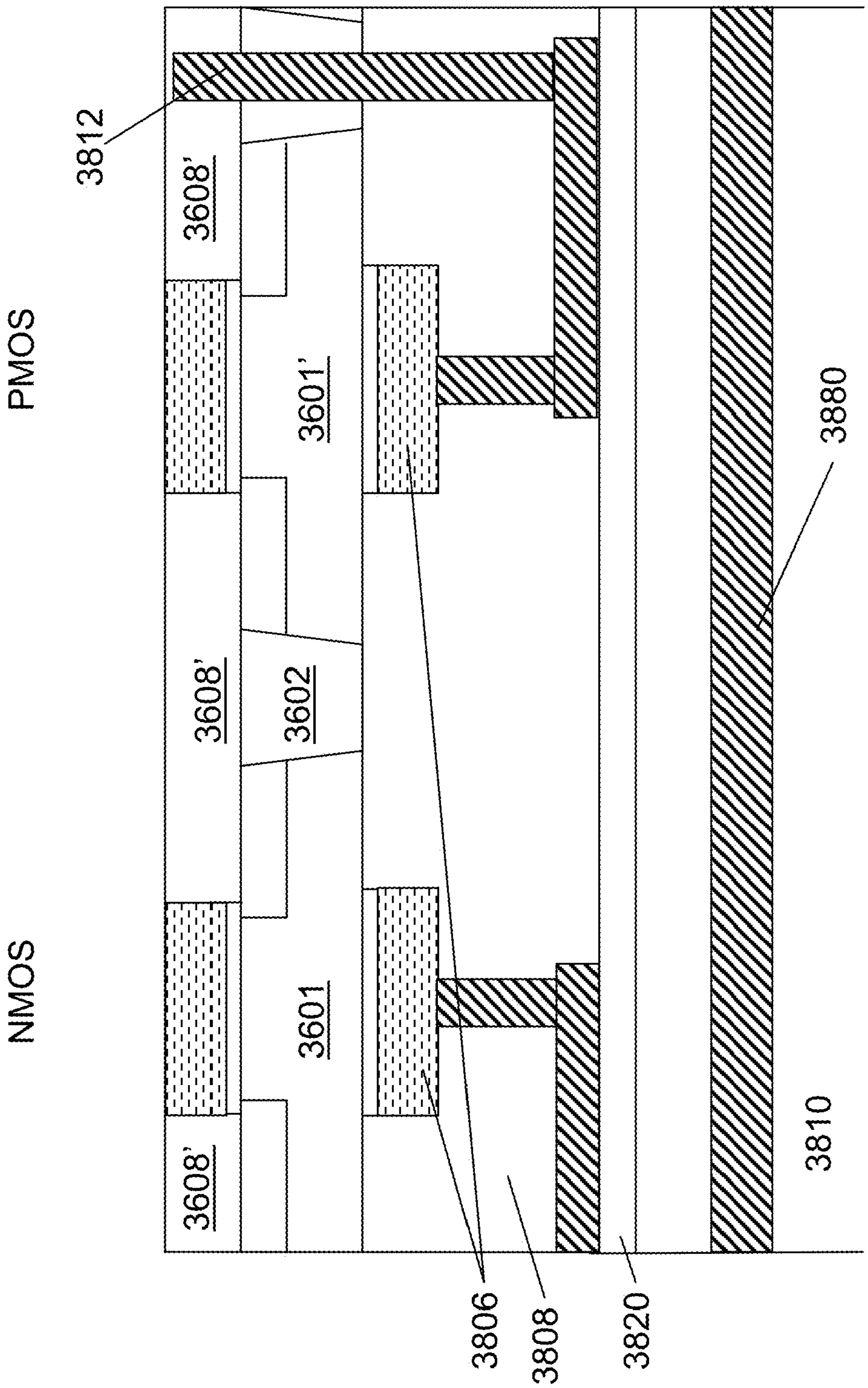

As illustrated in FIGS. 38D, the carrier or holder substrate 3614 may then be released atinterface 3816 using a low temperature process such as, for example, laser ablation. The bonded combination of acceptor substrate 3610 and first phase completed HKMG CMOS transistors may now be ready for normal state of the art gate-last transistor formation completion. The inter layer dielectric 3808 may be chemical mechanically polished to expose the top of the poly-crystalline silicon dummy gates and create regions 3808' of interlayer dielectric.

Figure 38E:
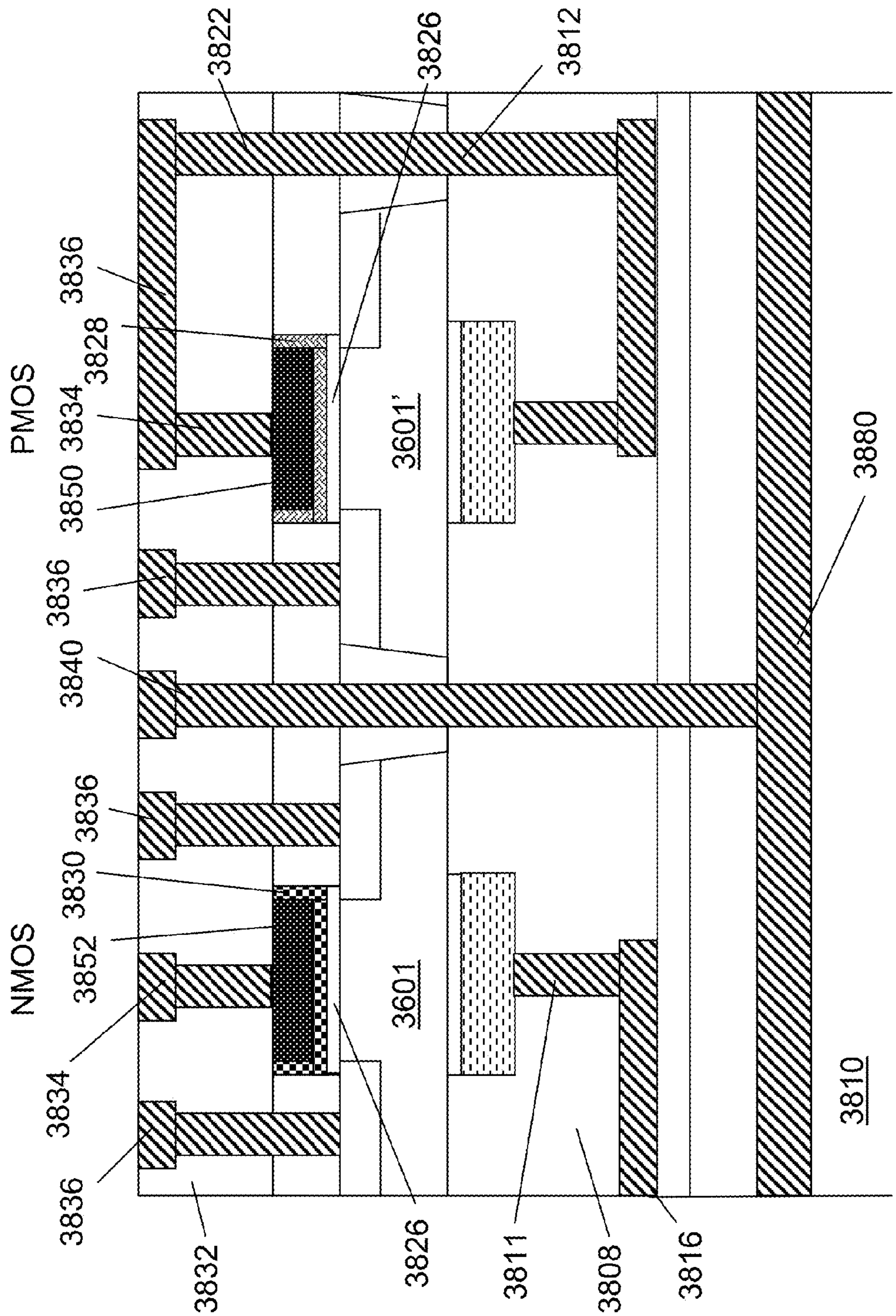

As illustrated in FIG. 38E, the dummy poly-crystalline silicon gates may then be removed by etching and the hi-k gate dielectric 3826 and the PMOS specific work function metal gate 3828 may be deposited. The PMOS work function metal gate may be removed from the NMOS transistors and the NMOS specific work function metal gate 3830 may be deposited. An aluminum fill may be performed and the metal chemical mechanically polished to create NMOS gate 3852 and PMOS gate 3850. A low temperature dielectric layer 3832 may be deposited and the normal gate 3834 and source/drain 3836 contact formation and metallization may now be performed to connect to and between the PMOS & NMOS transistors. Thru layer via (TLV) 3822 may be lithographically defined, plasma/RIE etched, and metallization formed to connect to partial thru layer via 3812. TLV 3822 with partial thru layer via 3812 electrically couples the transistor layer metallization to the acceptor substrate 3810 at acceptor wafer metal connect strip 3880. The PMOS transistor may be back-gated by connecting the PMOS gate 3850 to the bottom gate thru gate contact 3834 to metal line 3836 and to partial thru layer via 3812 and TLV 3822. The NMOS transistor may be back biased by connecting metal line 3816 to a back bias circuit that may be in the top transistor level or in the acceptor substrate 3810.

Persons of ordinary skill in the art will appreciate that the illustrations in FIGS. 38A through 38E are exemplary only and are not drawn to scale. Such skilled persons will further appreciate that many variations are possible such as, for example, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Such skilled persons will further appreciate that the above process flow may be utilized to create fully depleted SOI transistors, or junction-less, or RCATs. Thus the scope of the invention is to be limited only by the appended claims.

FIGS. 39A to 39D describe an overall process flow wherein CMOS transistors are partially processed on a donor wafer, ion implanted for later cleaving, transistors and some interconnect competed, then layer transferred to an acceptor substrate, donor cleaved and thinned, optional back-gate processing, and then interconnections are completed. This provides a back-gated transistor (double gated) in a transistor 'face-down' process flow. State of the art CMOS transistors may be constructed with methods that are suitable for 3D IC manufacturing.

As illustrated in FIG. 39A, planar CMOS dummy gate transistors may be processed as described in FIGS. 36A and 36B. The dummy gate transistors are now ready for normal state of the art gate-last transistor formation completion. The inter layer dielectric may be chemical mechanically polished to expose the top of the poly-crystalline silicon dummy gates and create regions 3608' of interlayer dielectric. The dummy gates may then be removed by etching and the hi-k gate dielectric 3626 and the PMOS specific work function metal gate 3628 may be deposited. The PMOS work function metal gate may be removed from the NMOS transistors and the NMOS specific work function metal gate 3630 may be deposited. An aluminum fill may be performed and the metal chemical mechanically polished to create NMOS and PMOS gates 3632. Thus donor wafer substrate 3600, layer transfer demarcation plane (shown as dashed line) 3699, shallow trench isolation (STI) regions 3602, interlayer dielectric regions 3608', hi-k gate dielectric 3626, PMOS specific work function metal gate 3628, NMOS specific work function metal gate 3630, and NMOS and PMOS gates 3632 are shown.

As illustrated in FIG. 39B, a low temperature dielectric layer 3932 may be deposited and the normal gate 3934 and source/drain 3936 contact formation and metallization may now be performed to connect to and between the PMOS & NMOS transistors. Partial top to bottom via 3940 may be lithographically defined, plasma/RIE etched into STI isolation region 3982, and metallization formed.

As illustrated in FIG. 39C, oxide layer 3920 may be deposited on the processed donor wafer 3600 surface 3902 for wafer bonding and electrical isolation of the metallization purposes.

As illustrated in FIG. 39D, oxide layer 3920 surface 3906 and acceptor substrate 3910 may be prepared for wafer bonding as previously described and then donor wafer 3600 is aligned to the acceptor substrate 3610 and they are bonded at a low temperature (less than approximately 400° C.). Acceptor wafer metal connect strip 3980 and the STI isolation 3930 where the future thru layer via (TLV) may be formed is shown.

As illustrated in FIG. 39E, the portion of the donor wafer 3600 that is above the layer transfer demarcation plane 3699 may be removed by cleaving or other processes as previously described, such as, for example, ion-cut or other methods. The remaining donor wafer regions 3601 and 3601' may be thinned by chemical mechanical polishing (CMP) so that the transistor STI regions 3982 and 3930 may be exposed at the donor wafer face 3919. Alternatively, the CMP could continue to the bottom of the junctions to eventually create fully depleted SOI transistors as will be discussed later with reference to FIGS. 39F-2.

As illustrated in FIG. 39F, a low-temperature oxide or low-k dielectric 3936 may be deposited and planarized. The thru layer via (TLV) 3928 may be lithographically defined and plasma/RIE etched. Contact 3941 may be lithographically defined and plasma/RIE etched to provide connection to partial top to bottom via 3940. Metallization may be formed for interconnection purposes. Donor wafer to acceptor wafer electrical coupling may be provided by partial top to bottom via 3940 connecting to contact 3941 connecting to metal line 3950 connecting to thru layer via (TLV) 3928 connecting to acceptor metal strip 3980.

The face down flow has some advantages such as, for example, enabling double gate transistors, back biased transistors, or access to the floating body in memory applications.

As illustrated in FIGS. 39E-1, a back gate for a double gate transistor may be constructed. A second gate dielectric 3960 may be grown or deposited and second gate metal material 3962 may be deposited. The gate dielectric 3960 and second gate metal material 3962 may be formed with low temperature (approximately less than 400° C.) materials and processing, such as, for example, previously described TEL SPA gate oxide and amorphous silicon, ALD techniques, or hi-k metal gate stack (HKMG). The gate stacks may be lithographically defined and plasma/RIE etched.

As illustrated in FIGS. 39F-1, a low-temperature oxide or low-k dielectric 3936 may be deposited and planarized. The thru layer via (TLV) 3928 may be lithographically defined and plasma/RIE etched. Contacts 3941 and 3929 may be lithographically defined and plasma/RIE etched to provide connection to partial top to bottom via 3940 or to the second gate. Metallization may be formed for interconnection purposes. Donor wafer to acceptor wafer electrical connections may be provided by partial top to bottom via 3940 connecting to contact 3941 connecting to metal line 3950 connecting to thru layer via (TLV) 3928 connecting to acceptor metal strip 3980. Back gate or double gate electrical coupling may be provided by PMOS gate 3632 connecting to gate contact 3933 connecting to metal line 3935 connecting to partial top to bottom via 3940 connecting to contact 3941 connecting to metal line 3951 connecting to contact 3929 connecting to back gate 3962.

As illustrated in FIGS. 39F-2, fully depleted SOI transistors with P+ junctions 3970 and N+ junctions 3971 may be alternatively constructed in this flow. In the FIG. 39E step description above, the CMP may be continued to the bottom of the junctions, thus creating fully depleted SOI transistors.

Persons of ordinary skill in the art will appreciate that the illustrations in FIGS. 39A through 39F-2 are exemplary only and are not drawn to scale. Such skilled persons will further appreciate that many variations are possible such as, for example, the above process flow may also be utilized to construct gates of other types, such as, for example, doped poly-crystalline silicon on thermal oxide, doped poly-crystalline silicon on oxynitride, or other metal gate configurations, as ‘dummy gates,’ perform a layer transfer of the thin mono-crystalline layer, replace the gate electrode and gate oxide, and then proceed with low temperature interconnect processing. Such skilled persons will further appreciate that the above process flow may be utilized to create junction-less transistors, or RCATs. Thus the scope of the invention is to be limited only by the appended claims.

FIGS. 40A to 40J describe an overall process flow utilizing a carrier wafer or a holder wafer wherein CMOS transistors are processed on two sides of a donor wafer, NMOS on one side and PMOS on the other, and then the NMOS on top of PMOS donor wafer may be transferred to an target or acceptor substrate with pre-processed circuitry. State of the art CMOS transistors and compact 3D library cells may be constructed with methods that are suitable for 3D IC manufacturing.

Figure 40A:
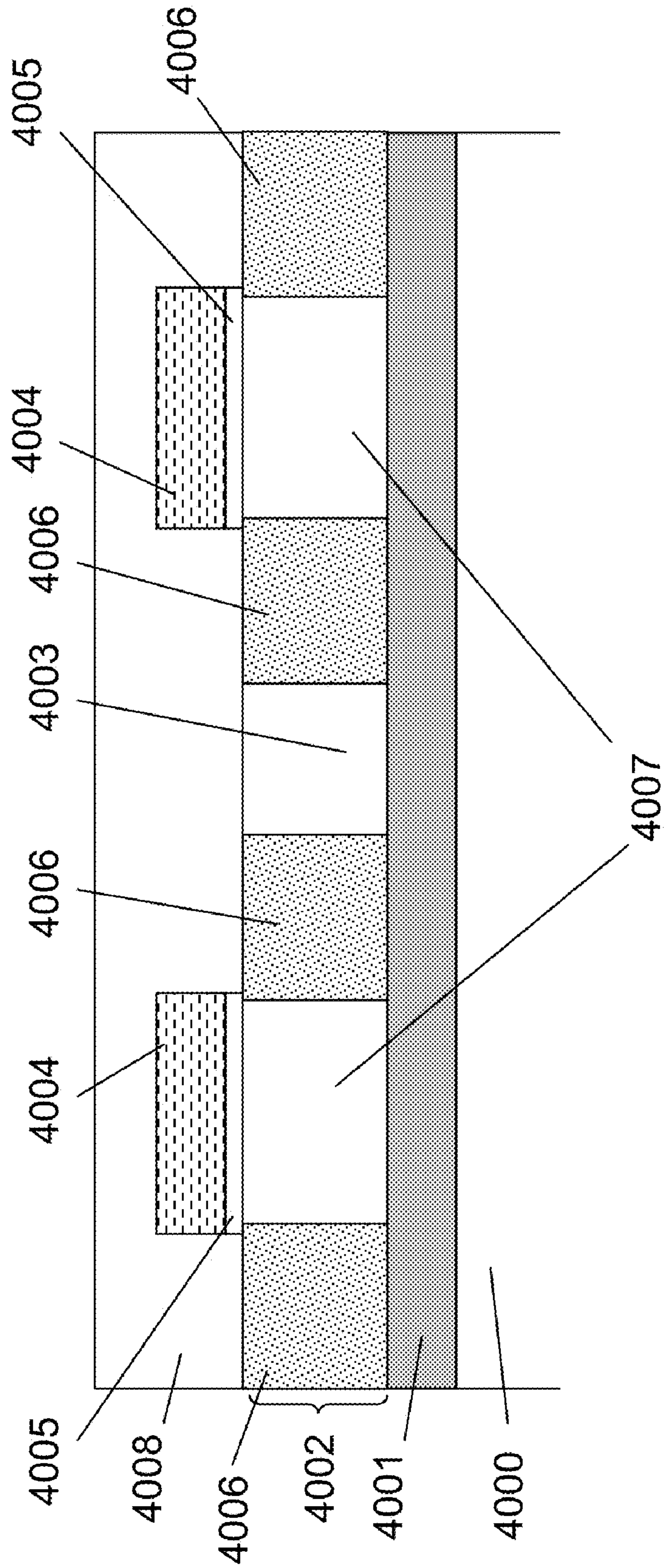
FIGS. 40A-K are exemplary drawing illustrations of a formation of top planar transistors.

As illustrated in FIG. 40A, a Silicon On Oxide (SOI) donor wafer 4000 may be processed in the normal state of the art HKMG gate-last manner up to the step prior to where CMP exposure of the poly-crystalline silicon dummy gates takes place, but forming only NMOS transistors. SOI donor wafer substrate 4000, the buried oxide (i.e., BOX) 4001, the thin silicon layer 4002 of the SOI wafer, the shallow trench isolation (STI) 4003 between NMOS transistors, the poly-crystalline silicon 4004 and gate dielectric 4005 of the NMOS dummy gates, NMOS source and drains 4006, the NMOS transistor channel 4007, and the NMOS interlayer dielectric (ILD) 4008 are shown in the cross section illustration. These structures of FIG. 40A illustrate completion of the first phase of NMOS transistor formation. The thermal cycles of the NMOS HKMG process may be adjusted to compensate for later thermal processing.

Figure 40B:
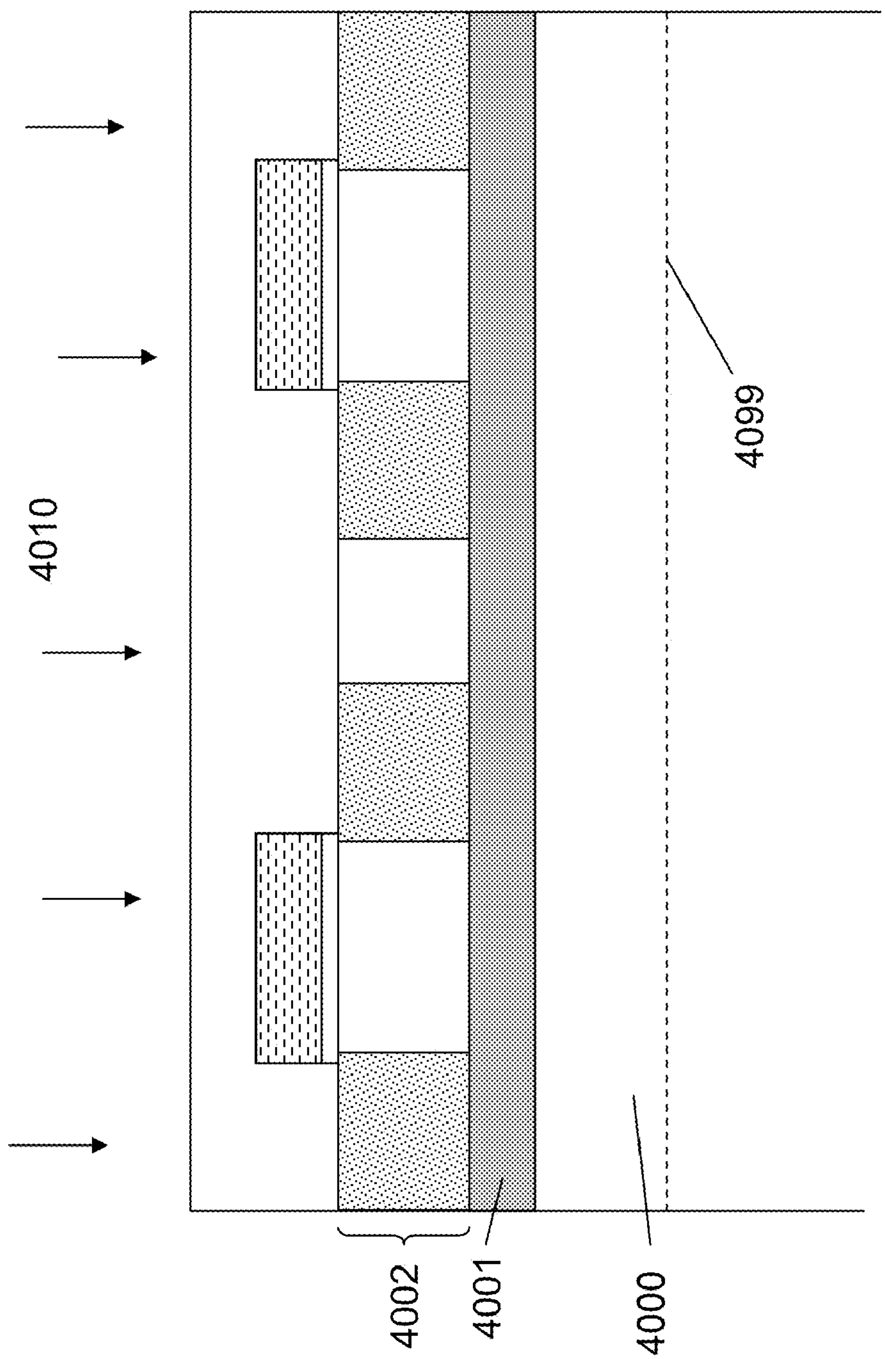

As illustrated in FIG. 40B, a layer transfer demarcation plane (shown as dashed line) 4099 may be formed in SOI donor wafer substrate 4000 by hydrogen implantation 4010 or other methods as previously described.

Figure 40C:
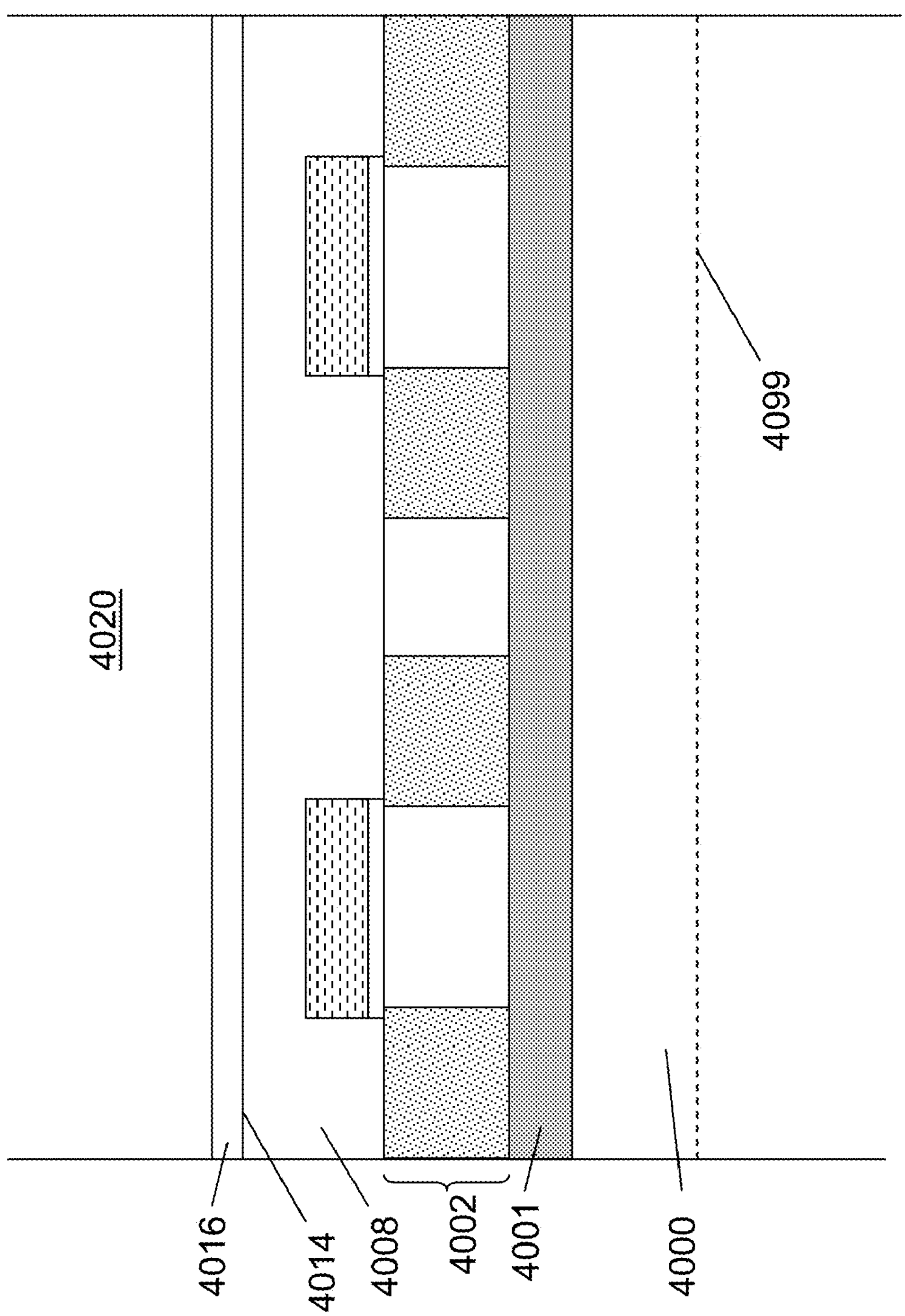

As illustrated in FIG. 40C, oxide 4016 may be deposited onto carrier wafer 4020 and then both the SOI donor wafer substrate 4000 and carrier or holder wafer 4020 may be prepared for wafer bonding as previously described, and then may be permanently oxide to oxide bonded together at interface 4014. Carrier or holder wafer 4020 may also be called a carrier or holder substrate, and may be comprised of mono-crystalline silicon, or other materials.

Figure 40D:
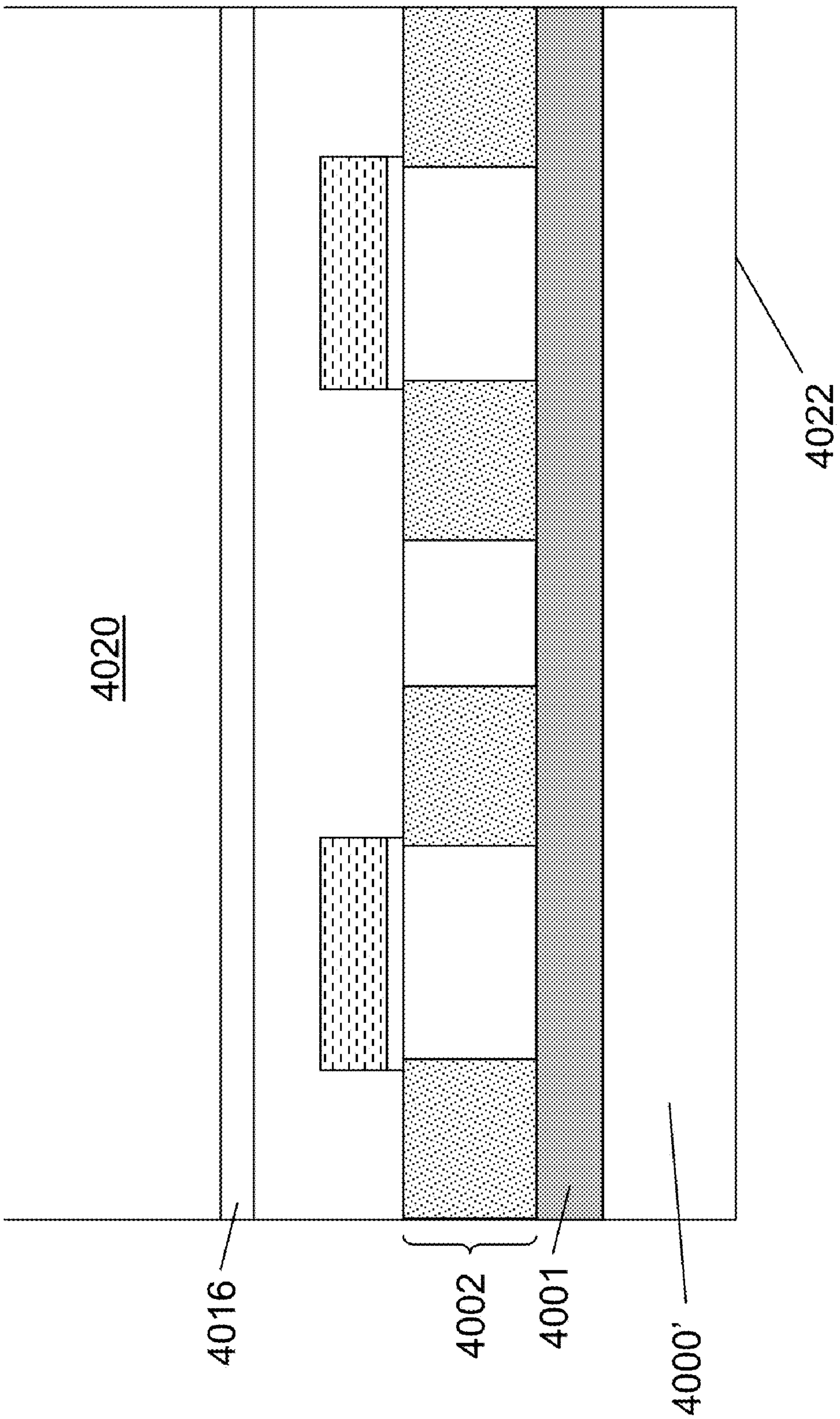

As illustrated in FIG. 40D, the portion of the SOI donor wafer substrate 4000 that is below the layer transfer demarcation plane 4099 may be removed by cleaving or other processes as previously described, such as, for example, ion-cut or other methods. The remaining donor wafer layer 4000' may be thinned by chemical mechanical polishing (CMP) and surface 4022 may be prepared for transistor formation.

Figure 40E:
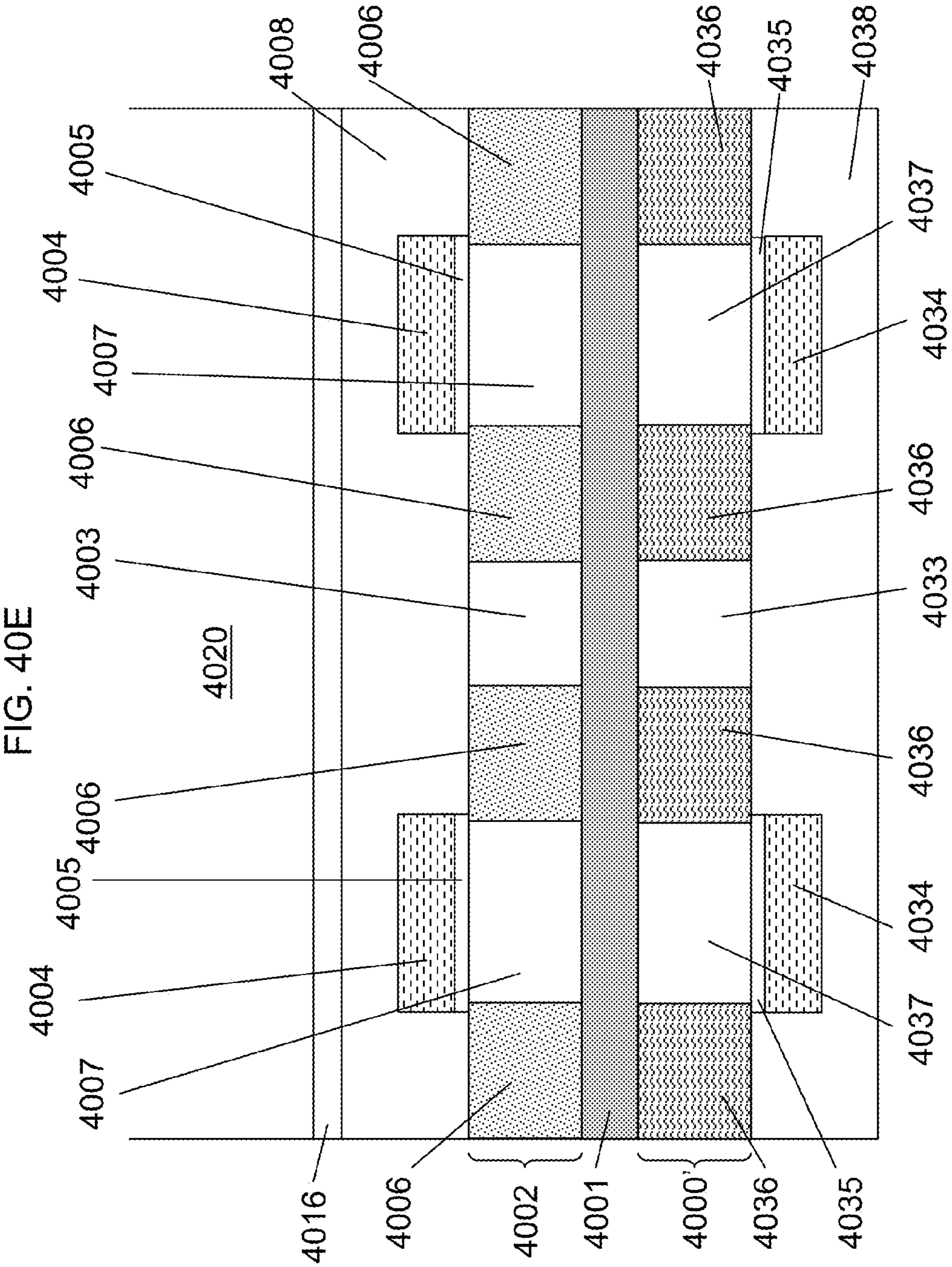

As illustrated in FIGS. 40E, donor wafer layer 4000' at surface 4022 may be processed in the normal state of the art HKMG gate last processing manner up to the step prior to where CMP exposure of the poly-crystalline silicon dummy gates takes place to form the PMOS transistors with dummy gates. The PMOS transistors may be precisely aligned at state of the art tolerances to the NMOS transistors due to the shared substrate possessing the same alignment marks. Carrier wafer 4020, oxide 4016, BOX 4001, the thin silicon layer 4002 of the SOI wafer, the shallow trench isolation (STI) 4003 between NMOS transistors, the poly-crystalline silicon 4004 and gate dielectric 4005 of the NMOS dummy gates, NMOS source and drains 4006, the NMOS transistor channels 4007, and the NMOS interlayer dielectric (ILD) 4008, donor wafer layer 4000', the shallow trench isolation (STI) 4033 between PMOS transistors, the poly-crystalline silicon 4034 and gate dielectric 4035 of the PMOS dummy gates, PMOS source and drains 4036, the PMOS transistor channels 4037, and the PMOS interlayer dielectric (ILD) 4038 are shown in the cross section illustration. A high temperature anneal may be performed to activate both the NMOS and the PMOS transistor dopants. These structures of FIG. 40E illustrate completion of the first phase of PMOS transistor formation.

Figure 40F:
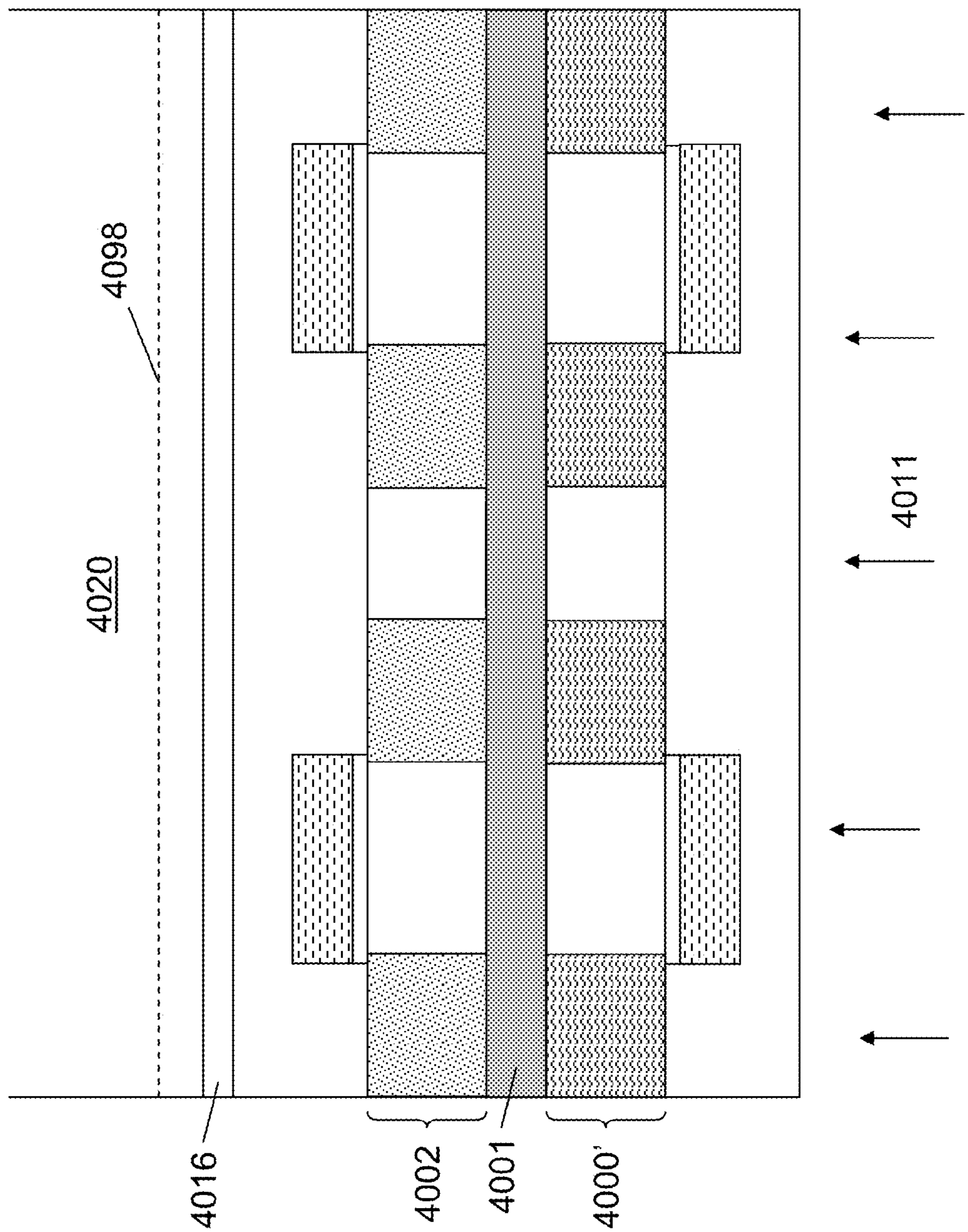

As illustrated in FIG. 40F, a layer transfer demarcation plane (shown as dashed line) 4098 may be formed in carrier or holder wafer 4020 by hydrogen implantation 4011 or other methods as previously described. The PMOS transistors may now be ready for normal state of the art gate-last transistor formation completion.

Figure 40G:
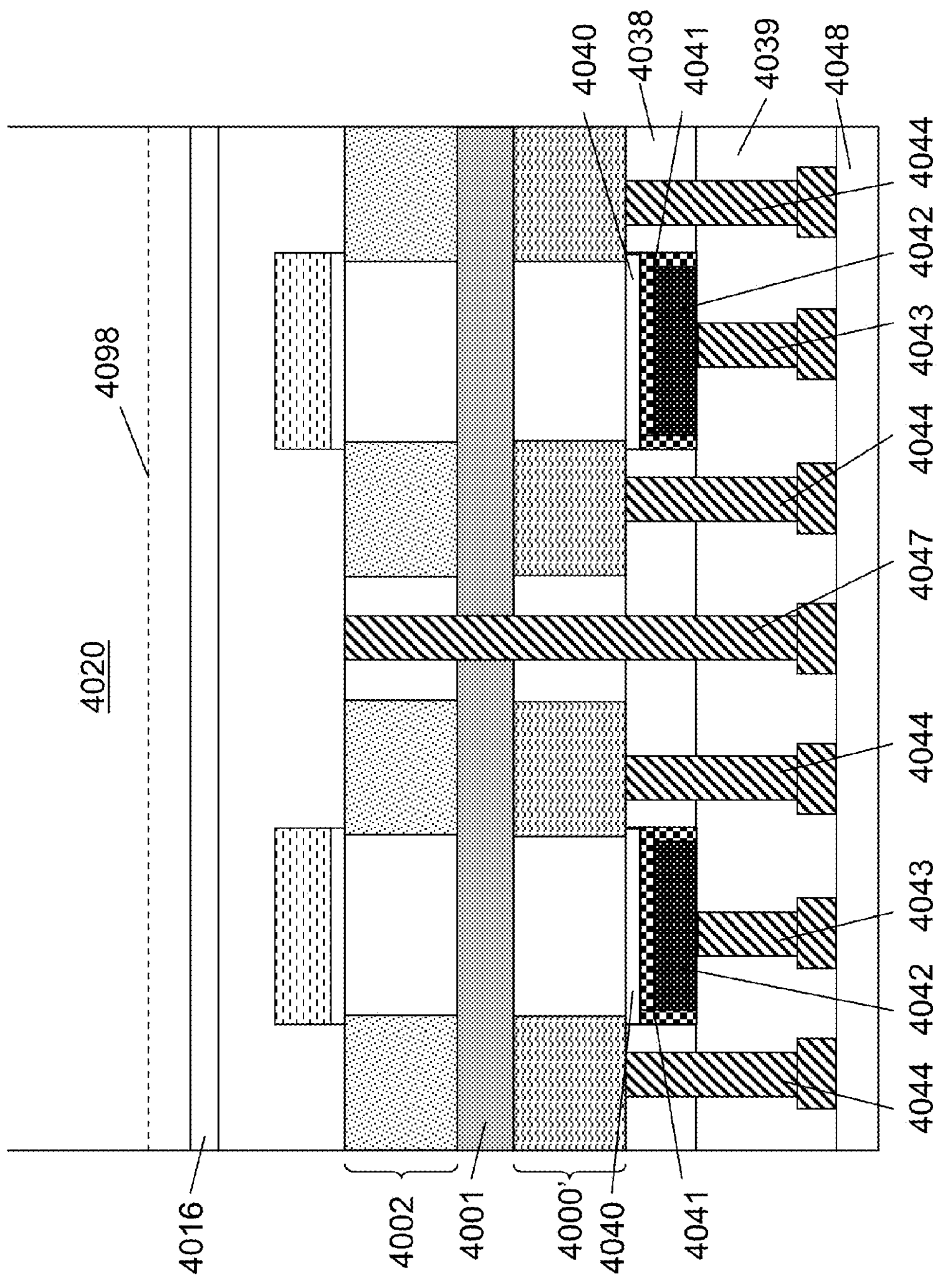

As illustrated in FIG. 40G, the PMOS ILD 4038 may be chemical mechanically polished to expose the top of the PMOS poly-crystalline silicon dummy gates, composed of poly-crystalline silicon 4034 and gate dielectric 4035, and the dummy gates may then be removed by etching. A hi-k gate dielectric 4040 and the PMOS specific work function metal gate 4041 may be deposited. An aluminum fill 4042 may be performed and the metal chemical mechanically polished. A low temperature dielectric layer 4039 may be deposited and the normal gate 4043 and source/drain 4044 contact formation and metallization may now be performed to connect to and between the PMOS transistors. Partially formed PMOS inter layer via (ILV) 4047 may be lithographically defined, plasma/RIE etched, and metallization formed. Oxide layer 4048 may be deposited to prepare for bonding.

Figure 40H:
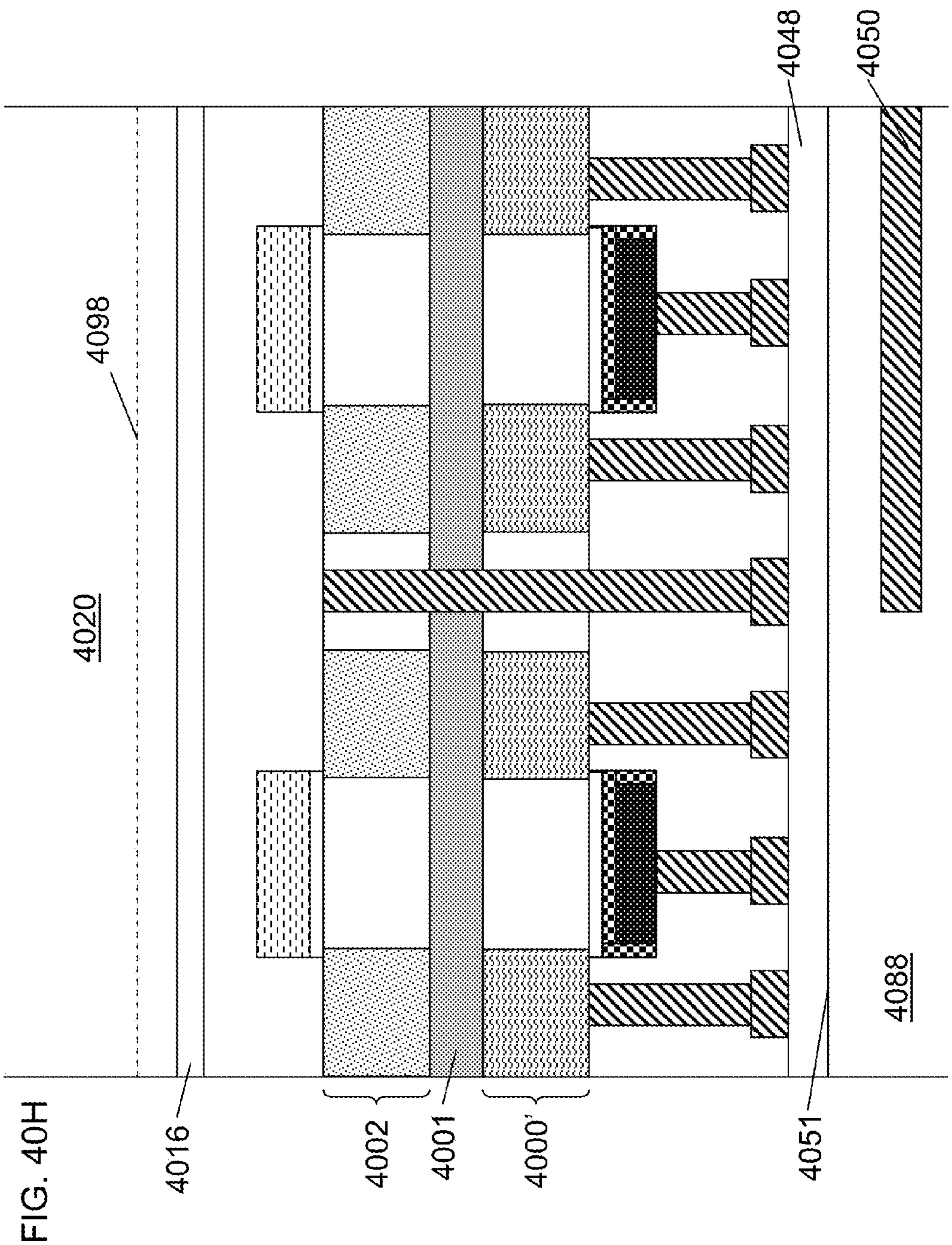

As illustrated in FIG. 40H, the donor wafer surface at oxide 4048 and top oxide surface of acceptor or target substrate 4088 with acceptor wafer metal connect strip 4050 may be prepared for wafer bonding as previously described and then low temperature (less than approximately 400° C.) aligned and oxide to oxide bonded at interface 4051.

Figure 40I:
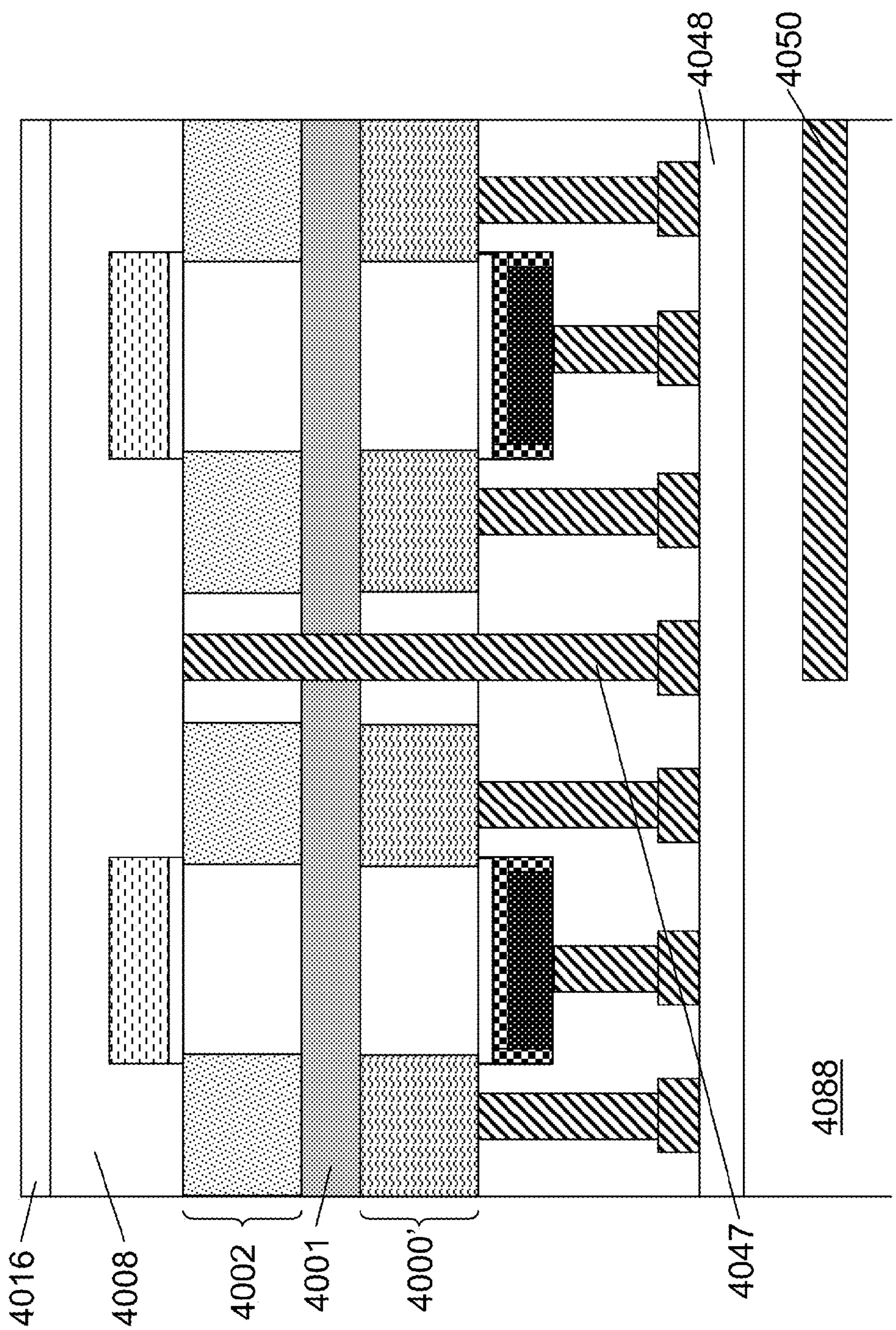

As illustrated in FIG. 40I, the portion of the carrier or holder wafer 4020 that is above the layer transfer demarcation plane 4098 may be removed by cleaving or other processes as previously described, such as, for example, ion-cut or other methods. The remaining layer of the carrier or holder wafer may be removed by chemical mechanical polishing (CMP) to or into oxide layer 4016. The NMOS transistors are now ready for normal state of the art gate-last transistor formation completion.

Figure 40J:
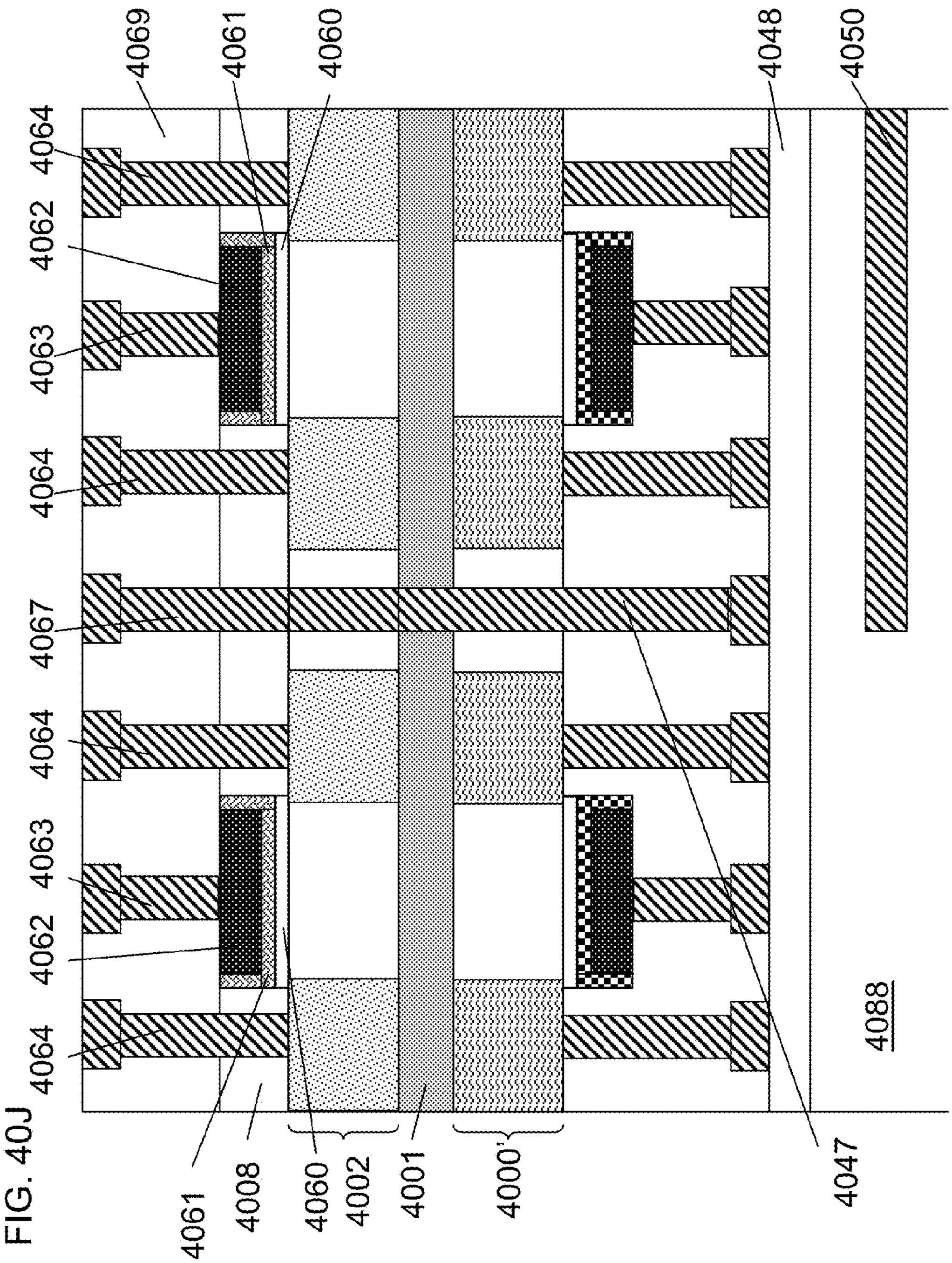

As illustrated in FIG. 40J, oxide 4016 and the NMOS ILD 4008 may be chemical mechanically polished to expose the top of the NMOS dummy gatescomposed of poly-crystalline silicon 4004 and gate dielectric 4005, and the dummy gates may then be removed by etching. A hi-k gate dielectric 4060 and an NMOS specific work function metal gate 40461 may be deposited. An aluminum fill 4062 may be performed and the metal chemical mechanically polished. A low temperature dielectric layer 4069 may be deposited and the normal gate 4063 and source/drain 4064 contact formation and metallization may now be performed to connect to and between the NMOS transistors. Partially formed NMOS inter layer via (ILV) 4067 may be lithographically defined, plasma/RIE etched, and metallization formed, thus electrically connecting NMOS ILV 4067 to PMOS ILV 4047.

Figure 40K:
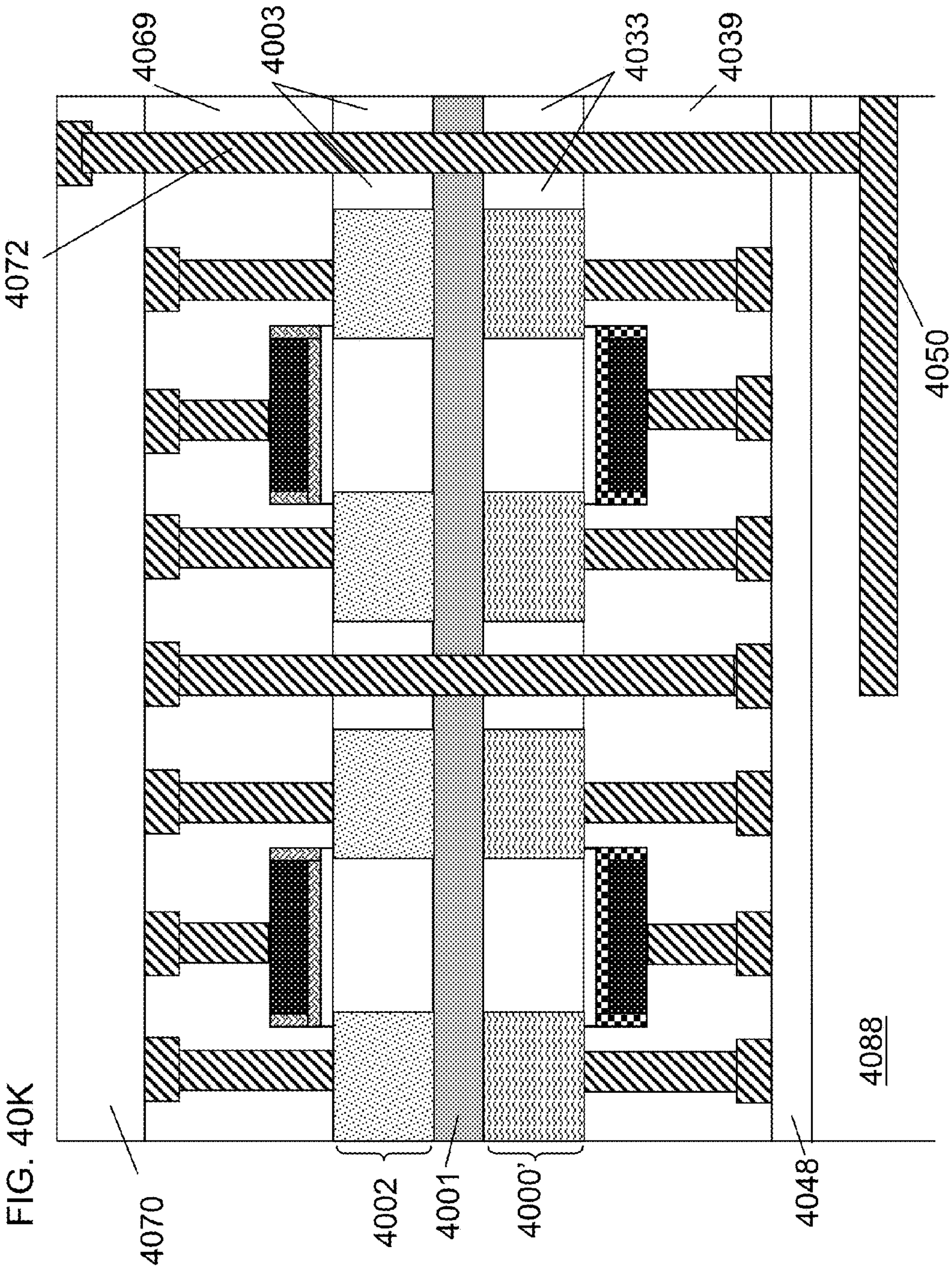

As illustrated in FIG. 40K, oxide 4070 may be deposited and planarized. Thru layer via (TLV) 4072 may be lithographically defined, plasma/RIE etched, and metallization formed. TLV 4072 electrically couples the NMOS transistor layer metallization to the acceptor or target substrate 4010 at acceptor wafer metal connect strip 4024. A topmost metal layer, at or above oxide 4070, of the layer stack illustrated may be formed to act as the acceptor wafer metal connect strips for a repeat of the above process flow to stack another preprocessed thin mono-crystalline silicon layer of NMOS on top of PMOS transistors.

Persons of ordinary skill in the art will appreciate that the illustrations in FIGS. 40A through 40K are exemplary only and are not drawn to scale. Such skilled persons will further appreciate that many variations are possible such as, for example, the transistor layers on each side of BOX 4001 may comprise full CMOS, or one side may be CMOS and the other n-type MOSFET transistors, or other combinations and types of semiconductor devices. Additionally, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Moreover, that other transistor types are possible, such as, for example, RCAT and junction-less. Further, the donor wafer 4000' in FIG. 40D may be formed from a bulk mono-crystalline silicon wafer with CMP to the NMOS junctions and oxide deposition in place of the SOI wafer discussed. Additionally, the donor wafer 4000 may start as a bulk silicon wafer and utilize an oxygen implantation and thermal anneal to form a buried oxide layer, such as, for example, the SIMOX process (i.e., separation by implantation of oxygen), or donor wafer 4000 may be a Germanium on Insulator (GeOI) wafer. Thus the scope of the invention is to be limited only by the appended claims.

The challenge of aligning preformed or partially preformed planar transistors to the underlying layers and substrates may be overcome by the use of repeating structures on the donor wafer or substrate and the use of metal connect landing strips either on the acceptor wafer only or on both the donor and acceptor wafers. Repeating patterns in one direction, for example, North to South repeats of preformed structures may be accomplished with the alignment scheme and metal landing strips as described previously with reference to the FIG. 33. The gate last HKMG process may be utilized to create a pre-processed donor wafer that builds not just one transistor type but both types by comprising alternating parallel strips or rows that are the die width plus maximum donor wafer to acceptor wafer misalignment in length.

Figure 41:
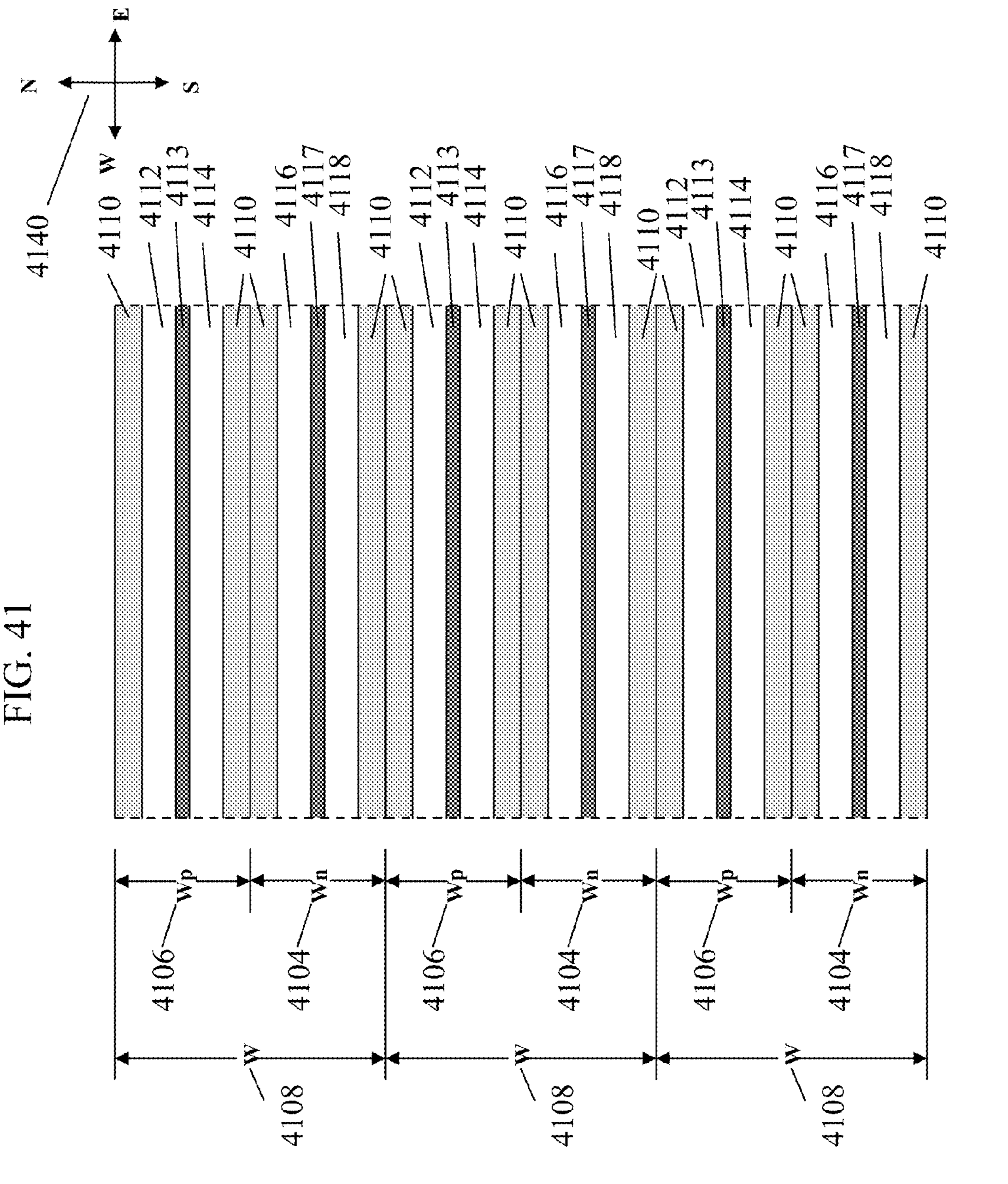
FIG. 41 is an exemplary drawing illustration of a layout for a donor wafer.

As illustrated in FIG. 41 and with reference to FIG. 33, the layout of the donor wafer formation into repeating strips and structures may be as follows. The width of the PMOS transistor strip width repeat Wp 4106 may be composed of two transistor isolations 4110 of width 2 F each, plus a PMOS transistor source 4112 of width 2.5 F, a PMOS gate 4113 of width F, and a PMOS transistor drain 4114 of width 2.5 F. The total Wp 4106 may be 10 F, where F is 2 times lambda, the minimum design rule. The width of the NMOS transistor strip width repeat Wn 4104 may be composed of two transistor isolations 4110 of width 2 F each, plus a NMOS transistor source 4116 of width 2.5 F, a NMOS gate 4117 of width F, and a NMOS transistor drain 4118 of width 2.5 F. The total Wn 4104 may be 10 F where F is 2 times lambda, the minimum design rule. The pattern repeat W 4108, which may be comprised of one Wn 4104 and one Wp 4106, may be 20 F and may be oriented in the North to South direction for this example.

Figure 42A:
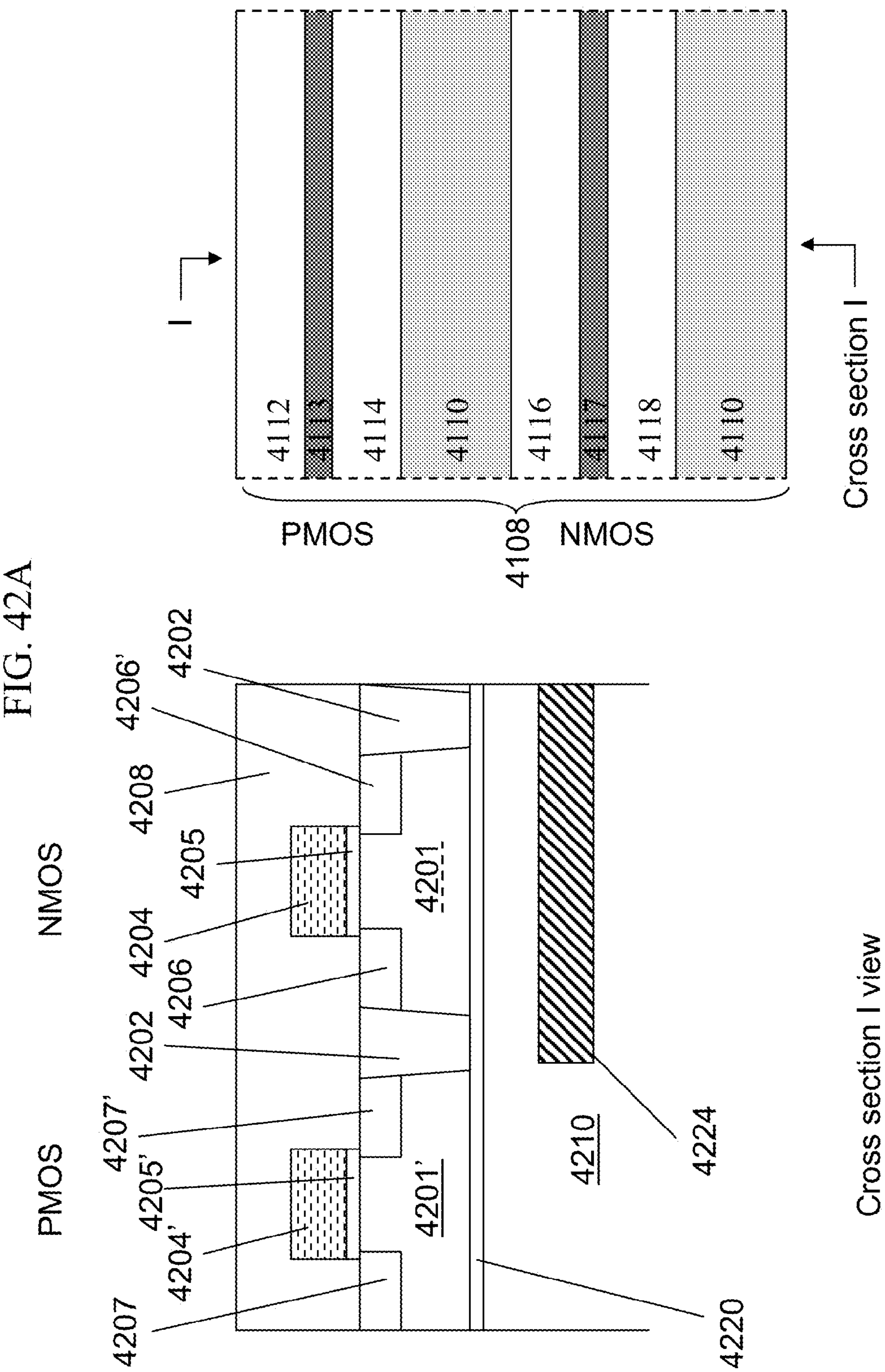
FIG. 42 A-F are exemplary drawing illustrations of formation of top planar transistors.

As illustrated in FIG. 42A, the top view of one pattern repeat W 4108 layout (ref FIG. 41) and cross sectional view of acceptor wafer 4210 after layer transfer of the first phase of HKMG transistor formation, layer transfer & bonding of the thin mono-crystalline preprocessed donor layer to the acceptor wafer, and release of the bonded structure from the carrier or holder substrate, as previously described in FIGS. 36A to 36F, are shown. Interlayer dielectric (ILD) 4208, the NMOS poly-crystalline silicon 4204 and NMOS gate oxide 4205 of NMOS dummy gate (NMOS gate 4117 strip), the PMOS poly-crystalline silicon 4204' and PMOS gate oxide 4205' of PMOS dummy gate (PMOS gate 4113 strip), NMOS source 4206 (NMOS transistor source 4116 strip), NMOS drain 4206' (NMOS transistor drain 4118 strip), PMOS source 4207 (PMOS transistor source 4112 strip), PMOS drain 4207' (PMOS transistor drain 4114 strip), remaining donor wafer regions 4201 and 4201', the shallow trench isolation (STI) 4202 between transistors (transistor isolation 4110 strips), oxide 4220, and acceptor metal connect strip 4224 are shown in the cross sectional illustration.

Figure 42B:
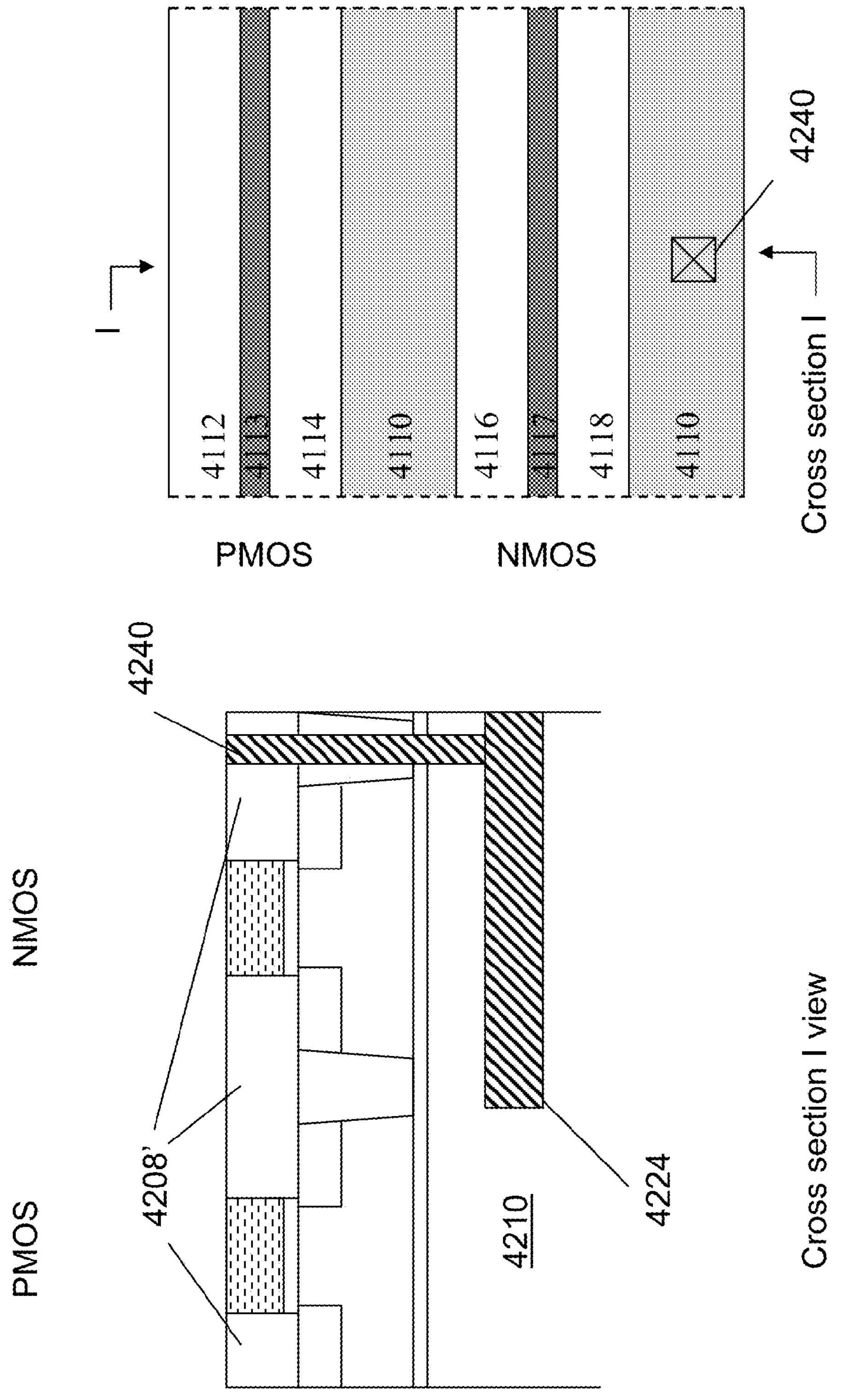

As illustrated in FIG. 42B, the inter layer dielectric 4208 may be chemical mechanically polished to expose the top of the poly-crystalline silicon dummy gates and create regions 4208' of interlayer dielectric. Partial thru layer via (TLV) 4240 may be lithographically defined, plasma/RIE etched, and metallization formed to couple with acceptor metal connect strip 4224.

Figure 42C:
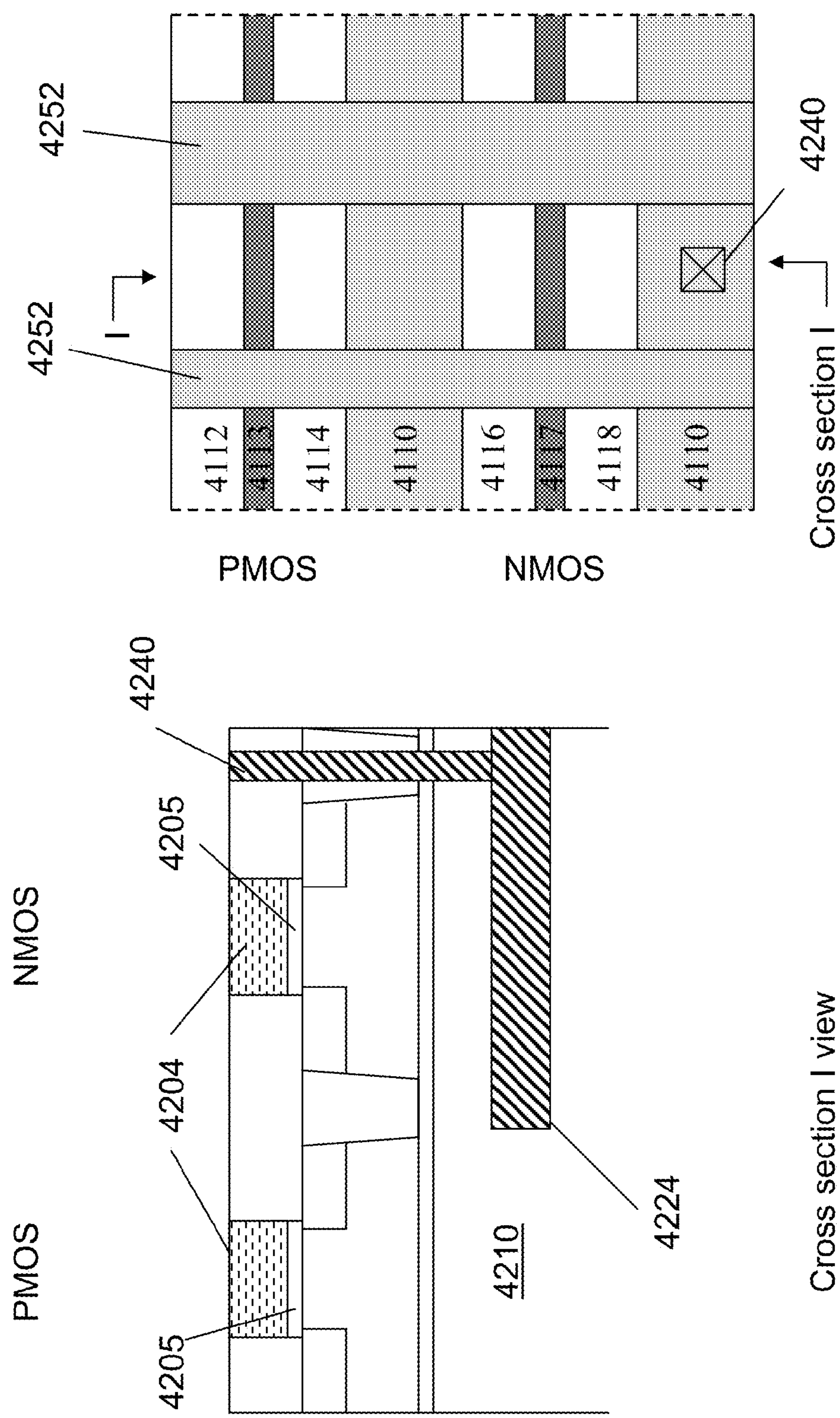

As illustrated in FIG. 42C, the long strips or rows of preformed transistors may be lithographically defined and plasma/RIE etched into desired transistor lengths or segments by forming isolation regions 4252. A low temperature oxidation may be performed to repair damage to the transistor edge and regions 4252 may be filled with a low temperature gap fill dielectric and planarized with CMP.

Figure 42D:
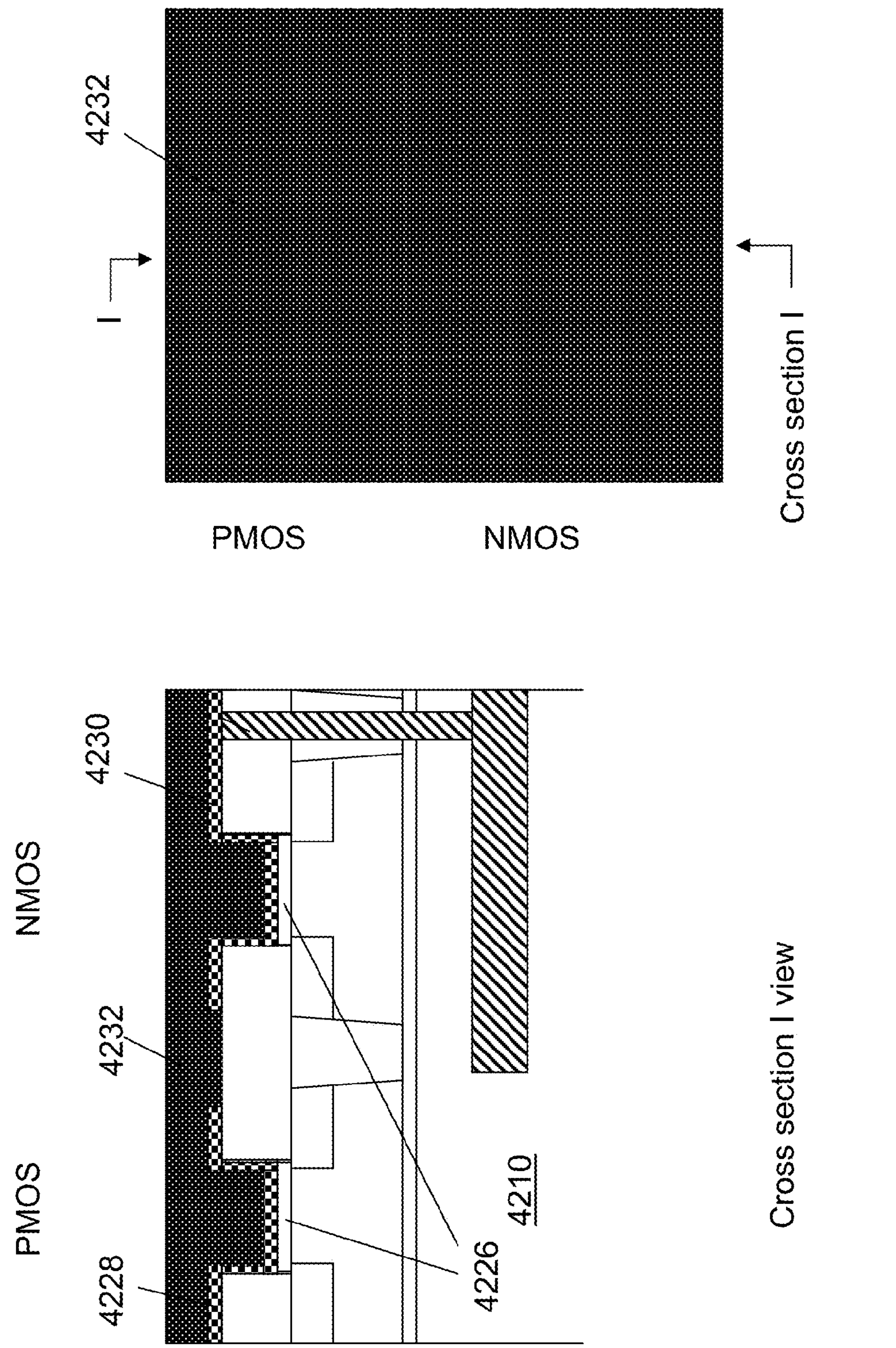
Figure 42E:
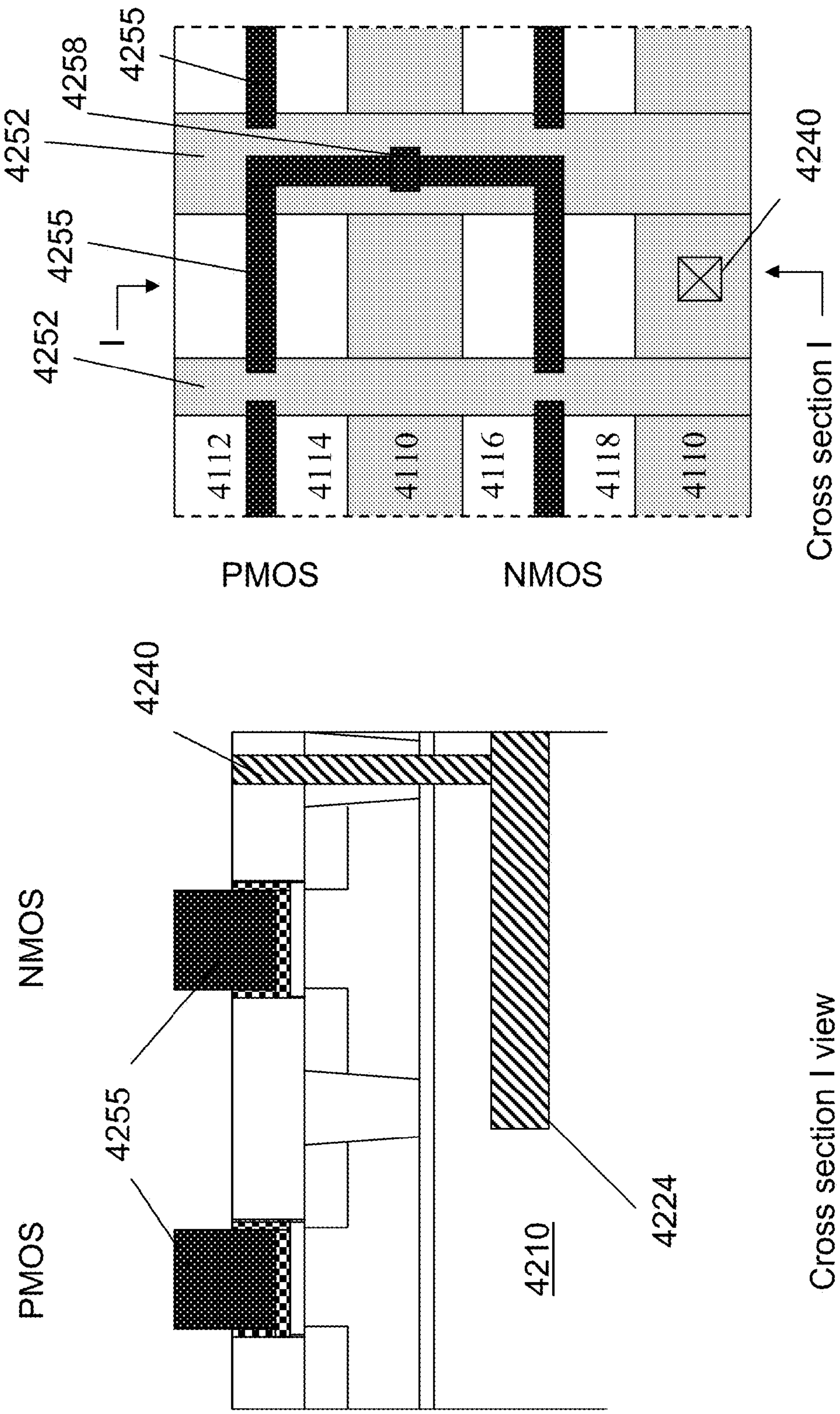

As illustrated in FIG. 42D, the dummy poly-crystalline silicon gates 4204 may then be removed by etching and the hi-k gate dielectric 4226 and the PMOS specific work function metal gate 4228 may be deposited. The PMOS work function metal gate may be removed from the NMOS transistors and the NMOS specific work function metal gate 4230 may be deposited. An aluminum fill 4232 may be performed on both NMOS and PMOS gates and the metal chemical mechanically polished but not fully remove the aluminum fill 4232 and planarize the surface for the gate definition As illustrated in FIG. 42E, he replacement gates 4255 may be lithographically defined and plasma/RIE etched and may provide a gate contact landing area 4258 on isolation region 4252.

Figure 42F:
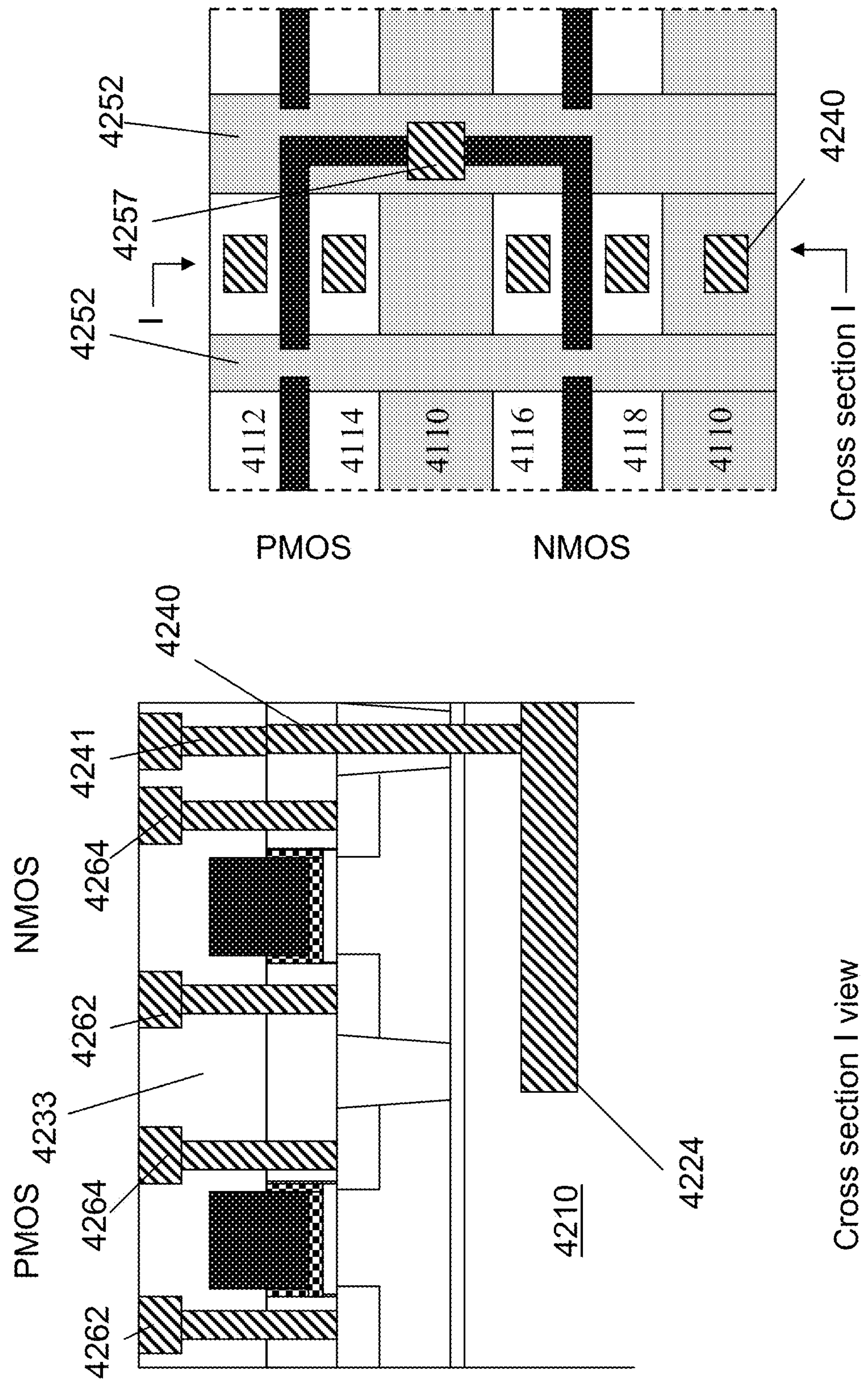

As illustrated in FIG. 42F, a low temperature dielectric layer 4233 may be deposited and the normal gate 4257, source 4262, and drain 4264 contact formation and metallization may now be performed. Top partial TLV 4241 may be lithographically defined, plasma/RIE etched, and metallization formed to electrically couple with the previously formed partial TLV 4240. Thus electrical connection from the donor wafer formed transistors to the acceptor wafer circuitry is made.

Persons of ordinary skill in the art will appreciate that the illustrations in FIGS. 42A through 42F are exemplary only and are not drawn to scale. Such skilled persons will further appreciate that many variations are possible such as, for example, the top metal layer may be formed to act as the acceptor wafer landing strips for a repeat of the above process flow to stack another preprocessed thin mono-crystalline layer of two-phase formed transistors. Or, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Or that other transistor types are possible, such as, for example, RCAT and junction-less. Or that additional arrangement of transistor strips may be constructed on the donor wafer such as, for example, NMOS/NMOS/PMOS, or PMOS/PMOS/NMOS, etc. Or that the direction of the transistor strips may be in a different than illustrated, such as, for example, East to West. Or that the partial TLV 4240 could be formed in various ways, such as, for example, before the CMP of dielectric 4208. Or, regions 4252 may be selectively opened and filled with specific inter layer dielectrics for the PMOS and NMOS transistors separately so to provide specific compressive or tensile stress enhancement to the transistor channels for carrier mobility enhancement. Thus the scope of the invention is to be limited only by the appended claims.

An embodiment of this invention is to pre-process a donor wafer by forming repeating wafer-sized or die-sized strips of layers of various materials that repeat in two directions, such as, for example, orthogonal to each other, for example a North to South repeat combined with an East to West repeat. These repeats of preformed structures may be constructed without a process temperature restriction, then layer transferring the pre-processed donor wafer to the acceptor wafer, and processing with either low temperature (below approximately 400° C.) or high temperature (greater than approximately 400° C.) after the layer transfer to form device structures, such as, for example, transistors, on or in the donor wafer that may be physically aligned and may be electrically coupled to the acceptor wafer. Many of the process flows in this document may utilize pattern repeats in one or two directions, for example, FIG. 36.

Two alignment schemes for subsequent processing of structures on the bonded donor wafer are described. The landing strips or pads in the acceptor wafer could be made sufficiently larger than the repeating pattern on the donor wafer in both directions, as shown in FIG. 43E, such that the mask alignment can be moved in increments of the repeating pattern left or right (East or West) and up or down (North or South) until the thru layer connections are on top of their corresponding landing strips or pads. Alternatively, a narrow landing strip or pad could extend sufficiently beyond the repeating in one direction and a metallization strip or pad in the donor wafer could extend sufficiently beyond the repeating pattern in the other direction, as shown in FIG. 43D, that after shifting the masks in increments of the repeating pattern in both directions to the right location the thru layer connection can be made at the intersection of the landing strip or pad in the acceptor wafer and the metallization strip or pad in the donor wafer.

Figure 43A:
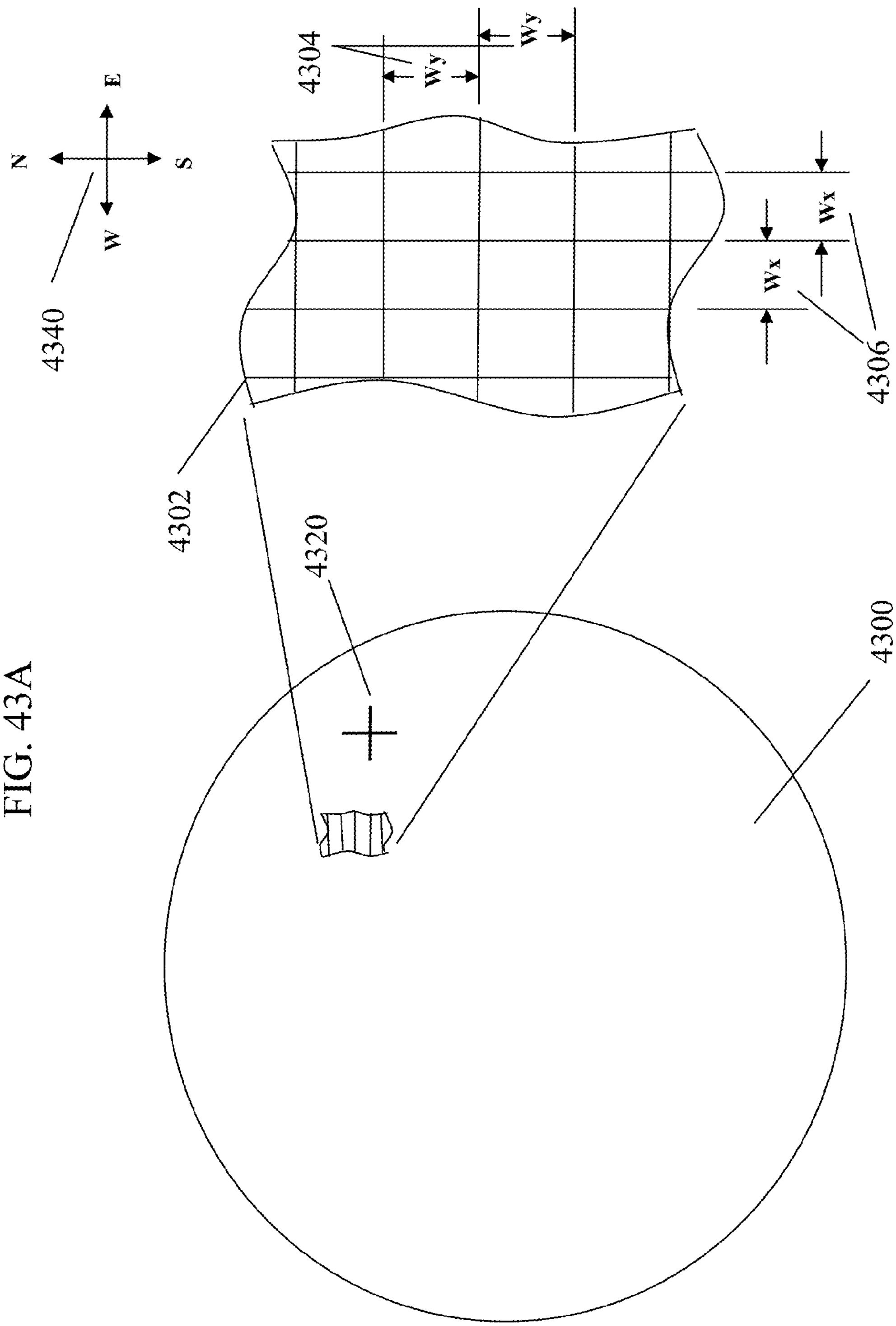
FIG. 43A is an exemplary drawing illustration of a donor wafer.

As illustrated in FIG. 43A, a generalized process flow may begin with a donor wafer 4300 that is preprocessed with repeating wafer-sized or die-sized strips of conducting, semiconducting or insulating materials that may be formed by deposition, ion implantation and anneal, oxidation, epitaxial growth, combinations of above, or other semiconductor processing steps and methods. A four cardinal directions indicator 4340 will be used to assist the explanation. Width Wy strips or rows 4304 may be constructed on donor wafer 4300 and are drawn in illustration blow-up area 4302. The width Wy strips or rows 4304 may traverse from East to West and have repeats from North to South that may extend substantially all the way across the wafer or die from North to South. The donor wafer strips 4304 may extend in length from East to Westby the acceptor die width plus the maximum donor wafer to acceptor wafer misalignment, or alternatively, may extend the entire length of a donor wafer from East to West. Width Wx strips or rows 4306 may be constructed on donor wafer 4300 and are drawn in illustration blow-up area 4302. The width Wx strips or rows 4306 may traverse from North to South and have repeats from East to West that may extend substantially all the way across the wafer or die from East to West. The donor wafer strips 4306 may extend in length from North to South by the acceptor die width plus the maximum donor wafer to acceptor wafer misalignment, or alternatively, may extend the entire length of a donor wafer from North to South. Donor wafer 4300 may have one or more donor alignment marks 4320. The donor wafer 4300 may be preprocessed with a layer transfer demarcation plane, such as, for example, a hydrogen implant cleave plane.

Figure 43B:
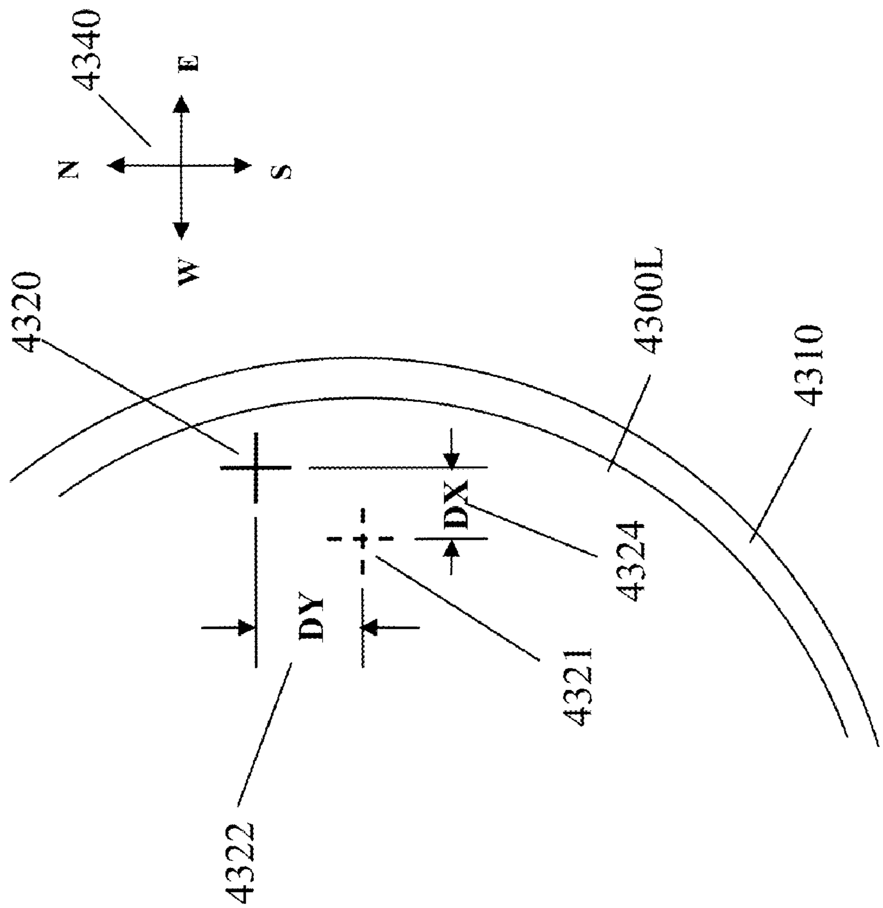
FIG. 43B is an exemplary drawing illustration of a transferred layer on top of an acceptor wafer.

As illustrated in FIG. 43B, the donor wafer 4300 with a layer transfer demarcation plane may be flipped over, aligned, and bonded to the acceptor wafer 4310. Or carrier wafer or holder wafer layer transfer techniques as previously discussed may be utilized. Typically the donor wafer 4300 to acceptor wafer 4310 maximum misalignment at wafer to wafer placement and bonding may be approximately 1 micron. The acceptor wafer 4310 may be a preprocessed wafer that has fully functional circuitry or may be a wafer with previously transferred layers, or may be a blank carrier or holder wafer, or other kinds of substrates and may also be called a target wafer. The acceptor wafer 4310 and the donor wafer 4300 may be a bulk mono-crystalline silicon wafer or a Silicon On Insulator (SOI) wafer or a Germanium on Insulator (GeOI) wafer. Both the donor wafer 4300 and the acceptor wafer 4310 bonding surfaces may be prepared for wafer bonding by oxide depositions, polishes, plasma, or wet chemistry treatments to facilitate successful wafer to wafer bonding. The donor wafer 4300 may be cleaved at or thinned to the layer transfer demarcation plane, leaving a portion of the donor wafer 4300L and the pre-processed strips, rows, and layers such as Wy strips 4304 and Wx strips 4306.

As further illustrated in FIG. 43B, the remaining donor wafer portion 4300L may be further processed to create device structures and donor structure to acceptor structure connections that are aligned to a combination of the acceptor wafer alignment marks 4321 and the donor wafer alignment marks 4320. A four cardinal directions indicator 4340 will be used to assist the explanation. The misalignment in the East-West direction is DX 4324 and the misalignment in the North-South direction is DY 4322. For simplicity of the following explanations, the donor wafer alignment mark 4320 and acceptor wafer alignment mark 4321 may be assumed to be placed such that the donor wafer alignment mark 4320 is always north and west of the acceptor wafer alignment mark 4321. The cases where donor wafer alignment mark 4320 is either perfectly aligned with or aligned south or east of acceptor alignment mark 4321 are handled in a similar manner. In addition, these alignment marks may be placed in only a few locations on each wafer, within each step field, within each die, within each repeating pattern W, or in other locations as a matter of design choice. If die-sized donor wafer strips are utilized, the repeating strips may overlap into the die scribeline the distance of the maximum donor wafer to acceptor wafer misalignment.

Figure 43C:
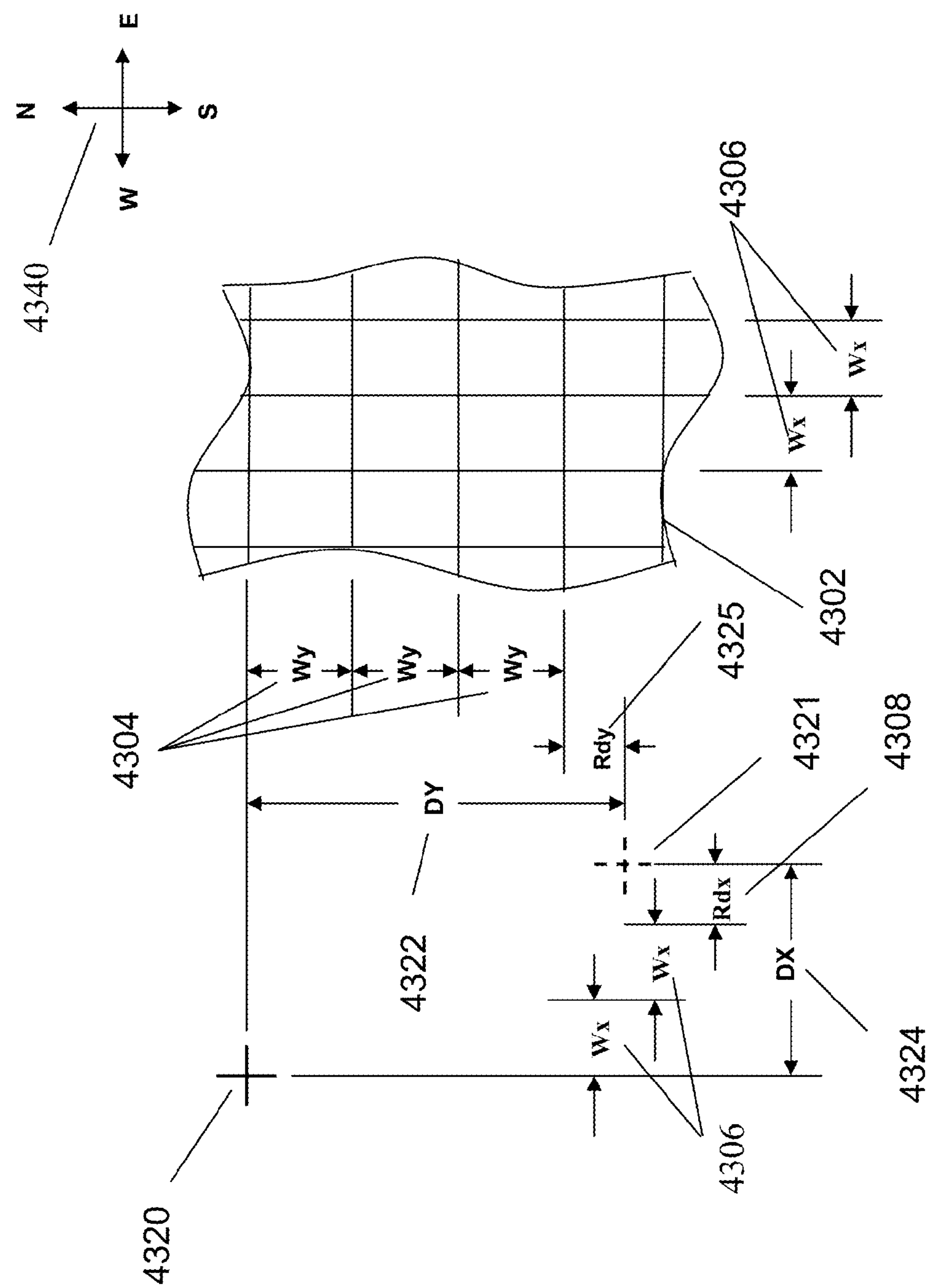
FIG. 43C is an exemplary drawing illustration of a measured alignment offset.
Figure 43D:
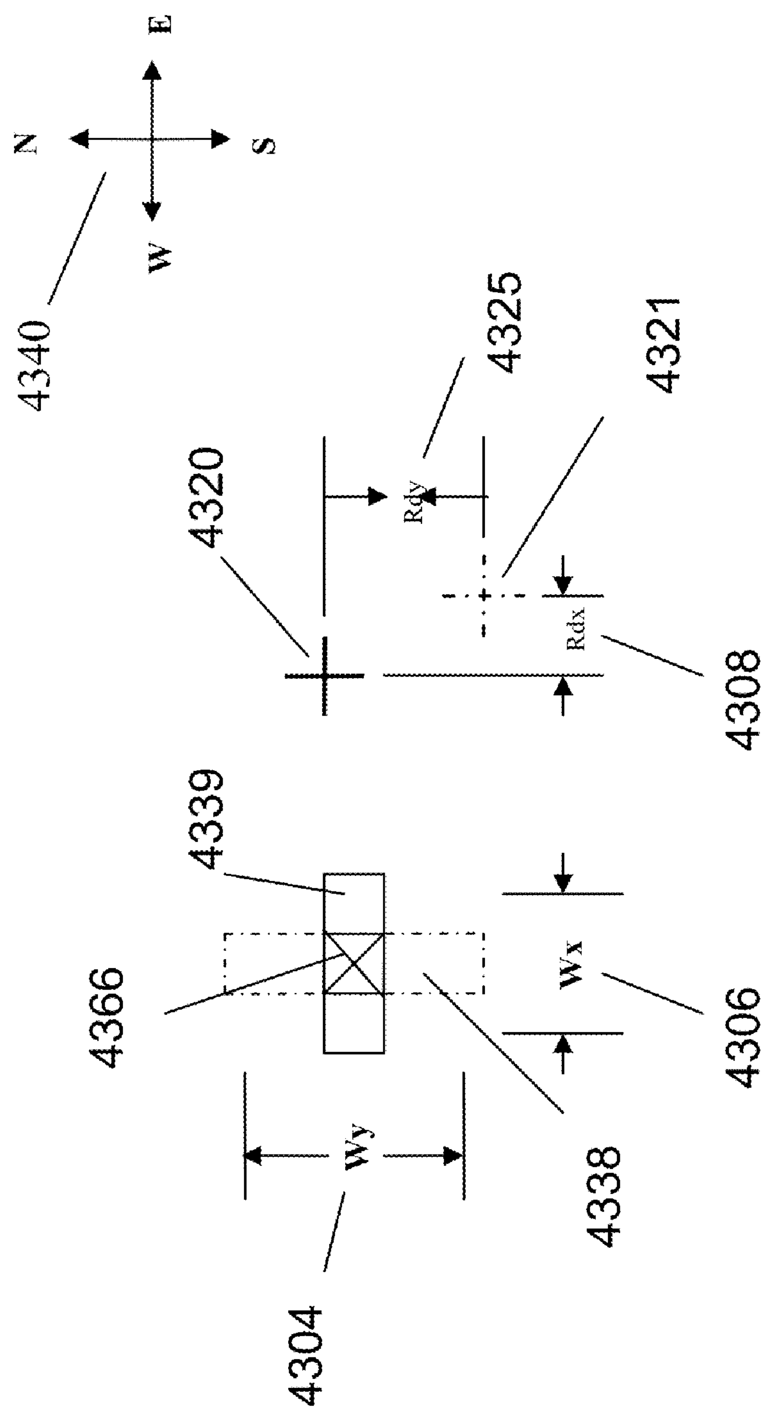
FIG. 43D, 43E, 43F are exemplary drawing illustrations of a connection strip.
Figure 43E:
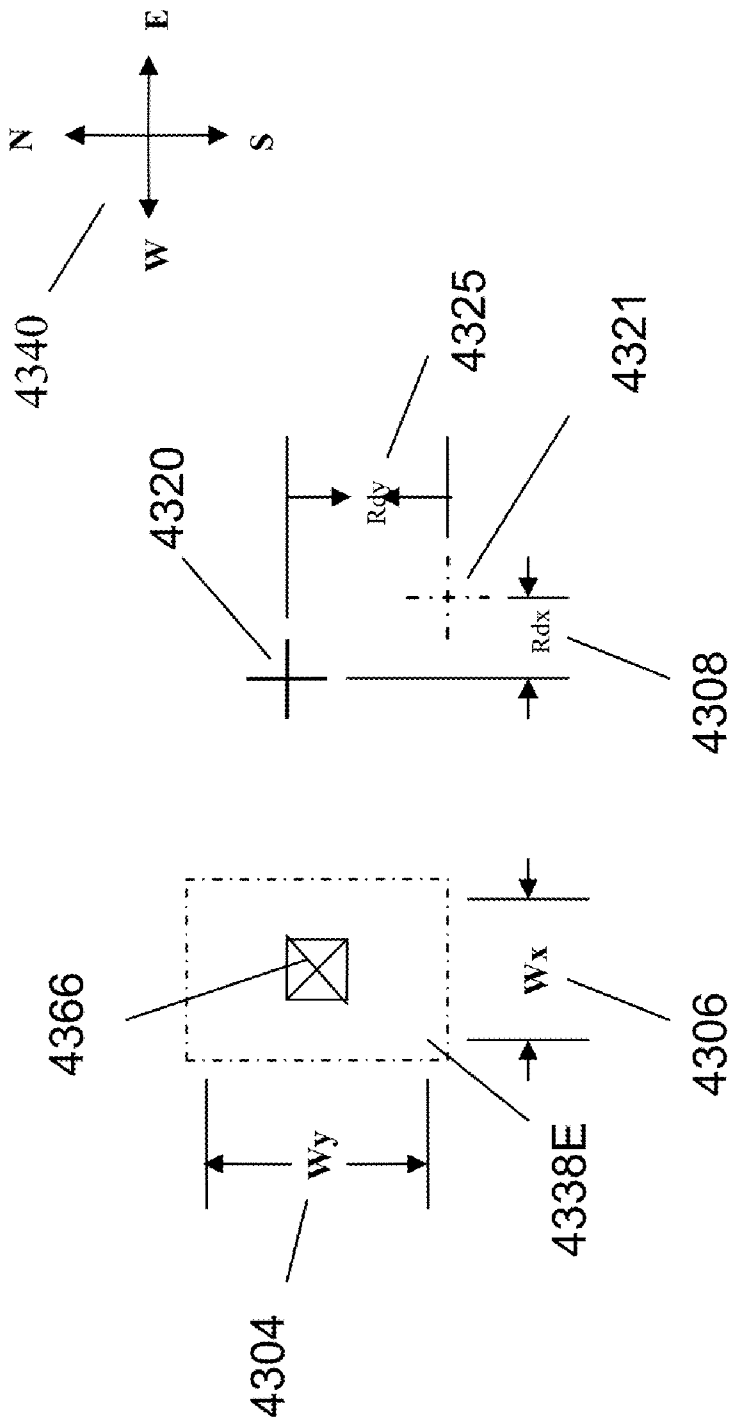

As illustrated in FIG. 43C, donor wafer alignment mark 4320 may land DY 4322 distance in the North-South direction away from acceptor alignment mark 4321. Wy strips 4304 are drawn in illustration blow-up area 4302. A four cardinal directions indicator 4340 will be used to assist the explanation. In this illustration, misalignment DY 4322 is comprised of three repeat strip or row distances Wy 4304 and a residual Rdy 4325. In the generalized case, residual Rdy 4325 is the remainder of DY 4322 modulo Wy 4304, 0<=Rdy 4325<Wy 4304. Proper alignment of images for further processing of donor wafer structures may be accomplished shifting Rdy 4325 from the acceptor wafer alignment mark 4321 in the North-South direction for the image's North-South alignment mark position. Similarly, donor wafer alignment mark 4320 may land DX 4324 distance in the East-West direction away from acceptor alignment mark 4321. Wx strips 4306 are drawn in illustration blow-up area 4302. In this illustration, misalignment DX 4324 is comprised of two repeat strip or row distances Wx 4306 and a residual Rdx 4308. In the generalized case, residual Rdx 4308 is the remainder of DX 4324 modulo Wx 4306, 0<=Rdx 4308<Wx 4306. Proper alignment of images for further processing of donor wafer structures may be accomplished shifting Rdx 4308 from the acceptor wafer alignment mark 4321 in the East-West direction for the image's East-West alignment mark position.

As illustrated in FIG. 43D acceptor metal connect strip 4338 may be designed with length Wy 4304 plus any extension for via design rules and angular misalignment within the die, and may be oriented length-wise in the North-South direction. A four cardinal directions indicator 4340 will be used to assist the explanation. The acceptor metal connect strip 4338 extension, in length or width, for via design rules may include compensation for angular misalignment due to the wafer to wafer bonding that is not compensated for by the stepper overlay algorithms, and may include uncompensated donor wafer bow and warp. The donor metal connect strip 4339 may be designed with length Wx 4306 plus any extension for via design rules and may be oriented length-wise in the East-West direction. The donor wafer metal connect strip 4339 extension, in length or width, for via design rules may include compensation for angular misalignment during wafer to wafer bonding and may include uncompensated donor wafer bow and warp. The acceptor metal connect strip 4338 is aligned to the acceptor wafer alignment mark 4321. Thru layer via (TLV) 4366 and donor wafer metal connect strip 4339 may be aligned as described above in a similar manner as other donor wafer structure definition images or masks. The TLV's 4366 and donor wafer metal connect strip's 4339 East-West alignment mark position may be Rdx 4308 from the acceptor wafer alignment mark 4321 in the East-West direction. The TLV's 4366 and donor wafer metal connect strip's 4339 North-South alignment mark position may be Rdy 4325 from the acceptor wafer alignment mark 4321 in the North-South direction.

As illustrated in FIG. 43E, a donor wafer to acceptor wafer metal connect scheme may be utilized when no donor wafer metal connect strip is desirable. A four cardinal directions indicator 4340 will be used to assist the explanation. Acceptor metal connect rectangle 4338E may be designed with North-South direction length of Wy 4304 plus any extension for via design rules and with East-West direction length of Wx 4306 plus any extension for via design rules. The acceptor metal connect rectangle 4338E extensions, in length or width, for via design rules may include compensation for angular misalignment during wafer to wafer bonding and may include uncompensated donor wafer bow and warp. The acceptor metal connect rectangle 4338E is aligned to the acceptor wafer alignment mark 4321. Thru layer via (TLV) 4366 may be aligned as described above in a similar manner as other donor wafer structure definition images or masks. The TLV's 4366 East-West alignment mark position may be Rdx 4308 from the acceptor wafer alignment mark 4321 in the East-West direction. The TLV's 4366 North-South alignment mark position may be Rdy 4325 from the acceptor wafer alignment mark 4321 in the North-South direction.

Figure 43F:
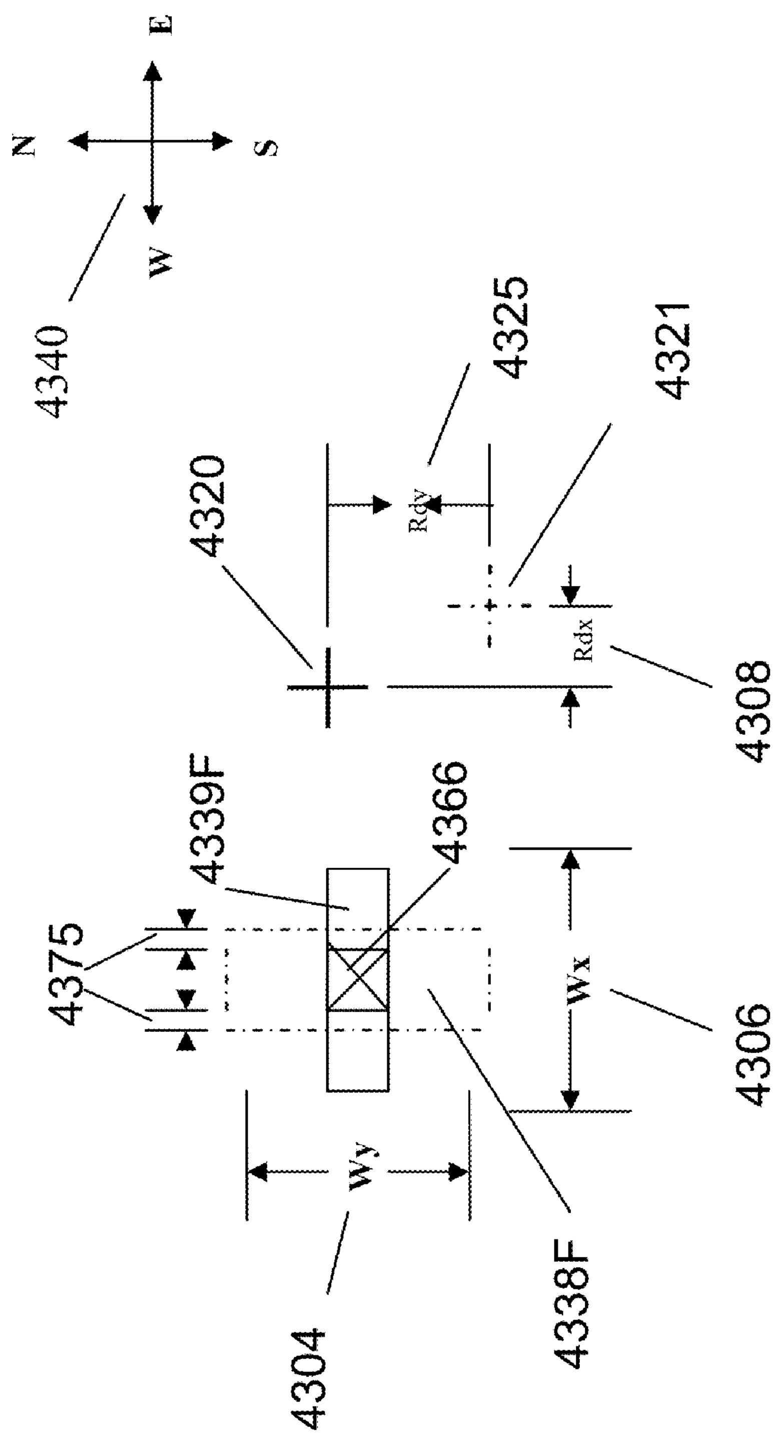

As illustrated in FIG. 43F, the length of donor wafer metal connect strip 4339F may be designed less than East-West repeat length Wx 4306 to provide an increase in connection density of TLVs 4366. This decrease in donor wafer metal connect strip 4339F length may be compensated for by increasing the width of acceptor metal connect strip 4338F by twice distance 4375 and shifting the East-West alignment towards the East after calculating and applying the usual Rdx 4308 offset to acceptor alignment mark 4321. The North-South alignment may be done as previously described.

Persons of ordinary skill in the art will appreciate that the illustrations in FIGS. 43A through 43F are exemplary only and are not drawn to scale. Such skilled persons will further appreciate that many variations are possible such as, for example, the North-South direction could become the East-West direction (and vice versa) by merely rotating the wafer 90° and that the Wy strips or rows 4304 could also run North-South as a matter of design choice with corresponding adjustments to the rest of the fabrication process. Such skilled persons will further appreciate that the strips within Wx 306 and Wy 4304 can have many different organizations as a matter of design choice. For example, the strips Wx 306 and Wy 4304 can each comprise a single row of transistors in parallel, multiple rows of transistors in parallel, multiple groups of transistors of different dimensions and orientations and types (either individually or in groups), and different ratios of transistor sizes or numbers, etc. Thus the scope of the invention is to be limited only by the appended claims.

Figure 44A:
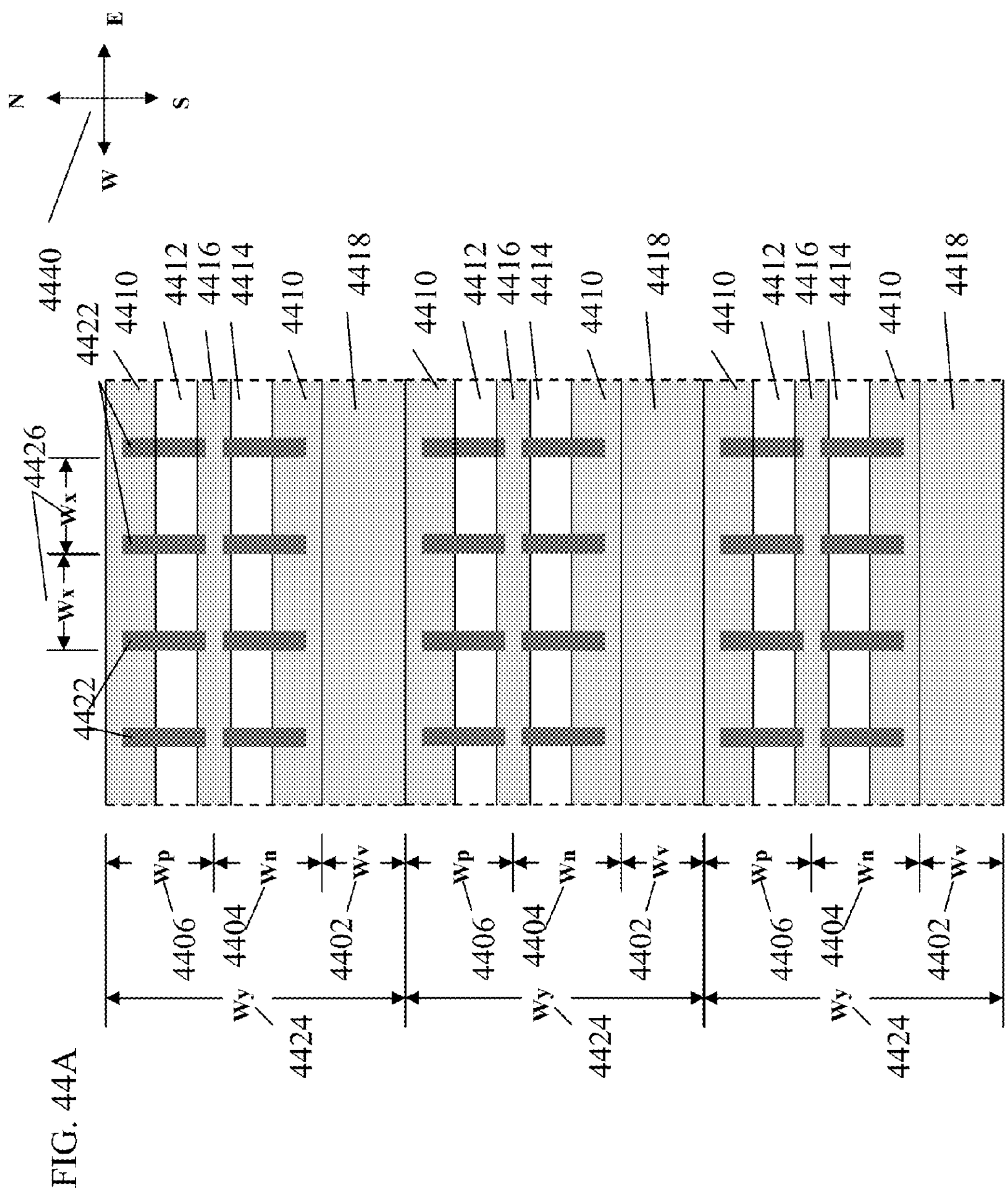
FIGS. 44A-C*are* exemplary drawing illustrations of a layout for a donor wafer.

As illustrated in FIG. 44A and with reference to FIGS. 41 and 43, the layout of the donor wafer formation into repeating strips and structures may be a repeating pattern in both the North-South and East-West directions. A four cardinal directions indicator 4440 will be used to assist the explanation. This repeating pattern may be a repeating pattern of transistors, of which each transistor has gate 4422, forming a band of transistors along the East-West axis. The repeating pattern in the North-South direction may comprise substantially parallel bands of transistors, of which each transistor has PMOS active area 4412 or NMOS active area 4414. The width of the PMOS transistor strip repeat Wp 4406 may be composed of transistor isolations 4410 of 3 F and shared 4416 of 1 F width, plus a PMOS transistor active area 4412 of width 2.5 F. The width of the NMOS transistor strip repeat Wn 4404 may be composed of transistor isolations 4410 of 3 F and shared 4416 of 1 F width, plus an NMOS transistor active area 4414 of width 2.5 F. The width Wv 4402 of the layer to layer via channel 4418, composed of transistor isolation oxide, may be 5 F. The total North-South repeat width Wy 4424 may be 18 F, the addition of Wv4402+Wn4404+Wp4406, where F is two times lambda, the minimum design rule. The gates 4422 may be of width F and spaced 4F apart from each other in the East-West direction. The East-West repeat width Wx 4426 may be 5 F. This forms a repeating pattern of continuous diffusion sea of gates. Adjacent transistors in the East-West direction may be electrically isolated from each other by biasing the gate in-between to the appropriate off state; i.e., grounded gate for NMOS and Vdd gate for PMOS.

Figure 44B:
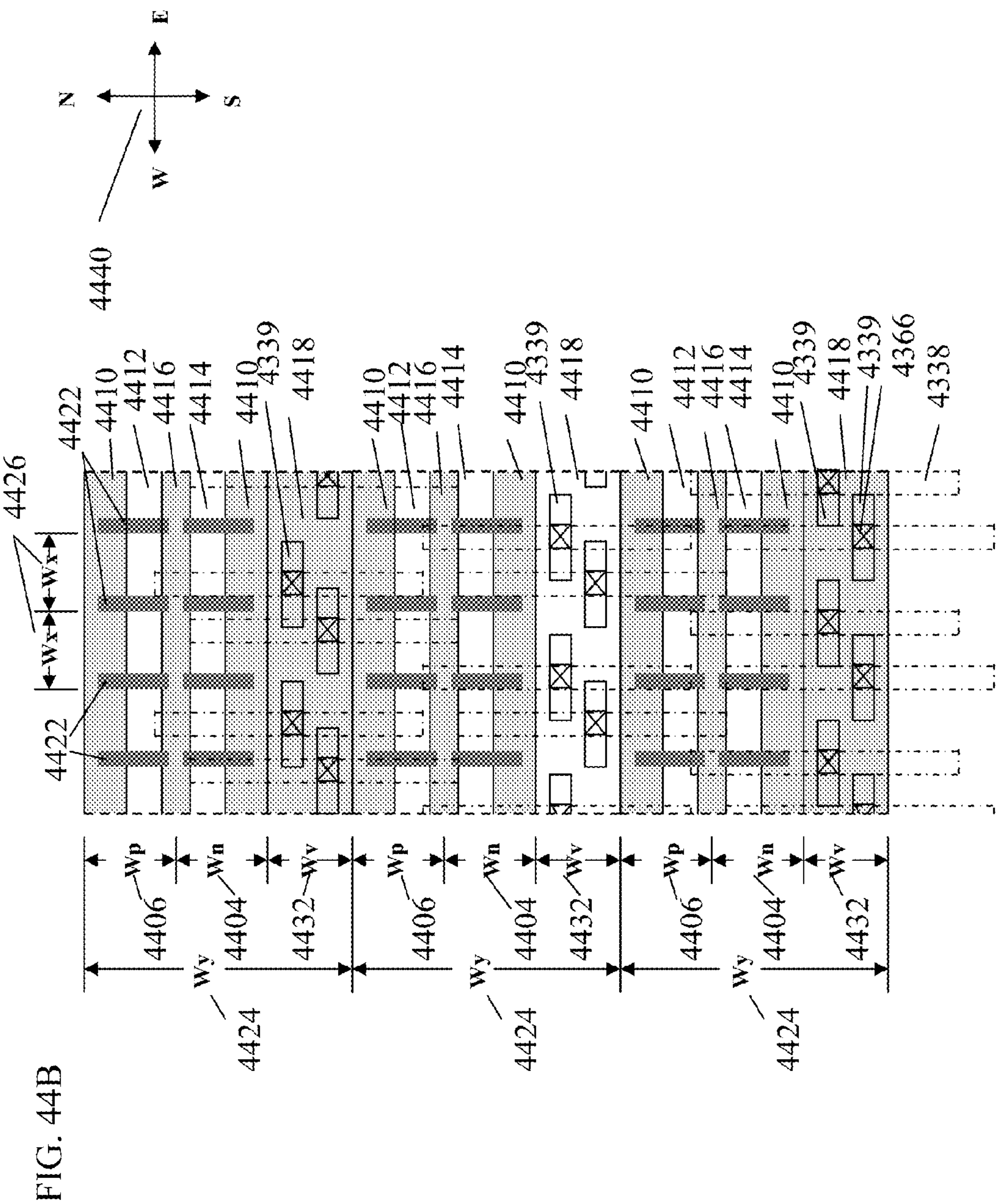

As illustrated in FIG. 44B and with reference to FIGS. 44A and 43, Wv 4432 may be enlarged for multiple rows (shown as two rows) of donor wafer metal connect strips 4439. The width Wv 4432 of the layer to layer via channel 4418 may be 10 F. Acceptor metal connect strip 4338 length may be Wy 4424 in length plus any extension indicated by design rules as described previously to provide connection to thru layer via (TLV) 4366.

Figure 44C:
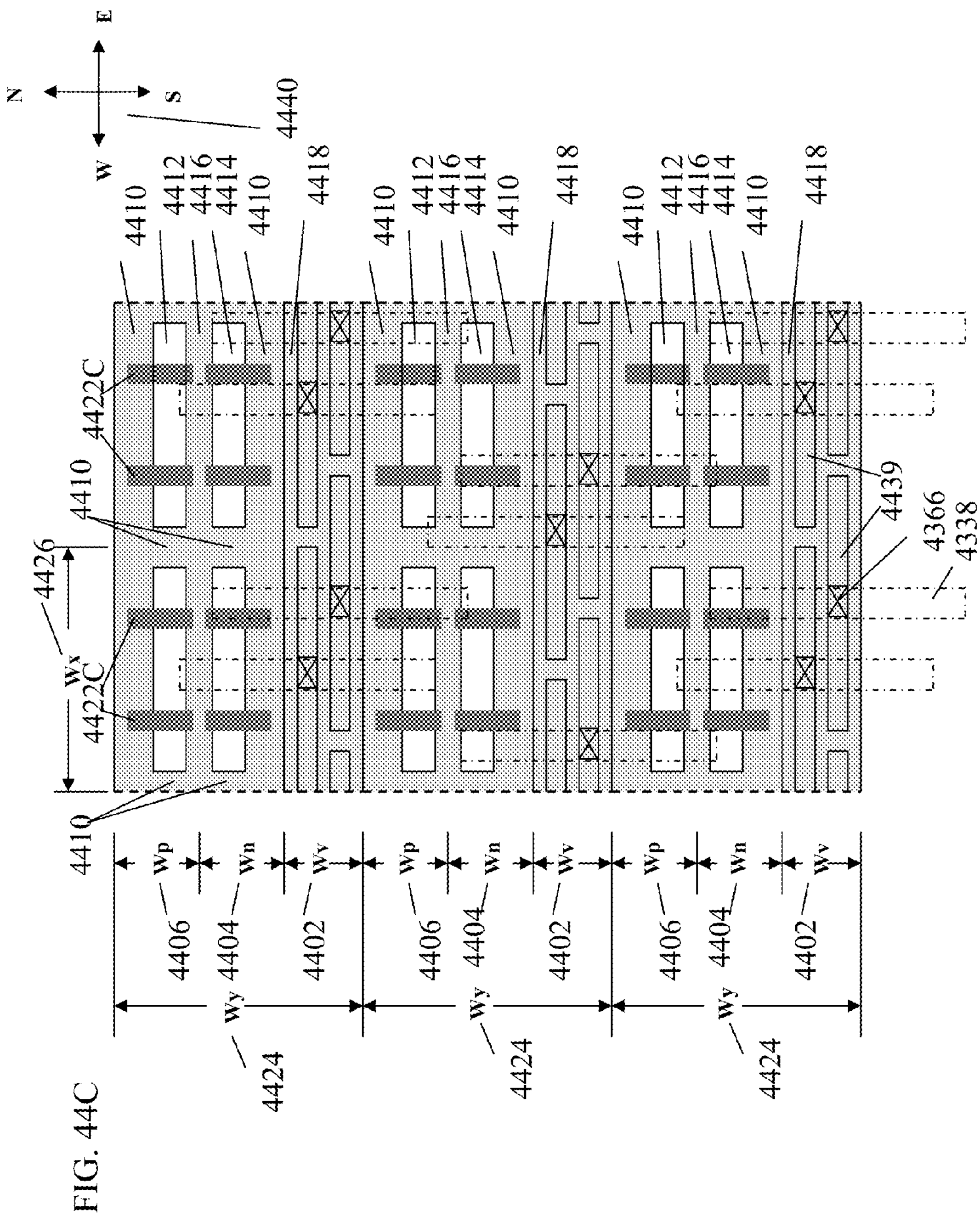

As illustrated in FIG. 44C and with reference to FIGS. 44B and 43, gates 4422C may be repeated in the East to West direction as pairs with an additional repeat of transistor isolations 4410. The East-West pattern repeat width Wx 4426 may be 14F. Donor wafer metal connect strip 4339 length may be Wx 4426 in length plus any extension indicated by design rules as described previously to provide connection to thru layer via (TLV) 4366. This repeating pattern of transistors with gates 4422C may form a band of transistors along the East-West axis.

The Following Sections Discuss Embodiments to the Invention Wherein Wafer or Die-Sized Sized Pre-Formed Non-Repeating Device Structures are Transferred and then Processed To Create 3D ICs.

An embodiment of this invention is to pre-process a donor wafer by forming a block or blocks of a non repeating pattern device structures and layer transferred using the above described techniques such that the donor wafer structures may be electrically coupled to the acceptor wafer. This donor wafer of non-repeating pattern device structures may be a memory block of DRAM, or a block of Input-Output circuits, or any other block of non-repeating pattern circuitry or combination thereof.

Figure 45:
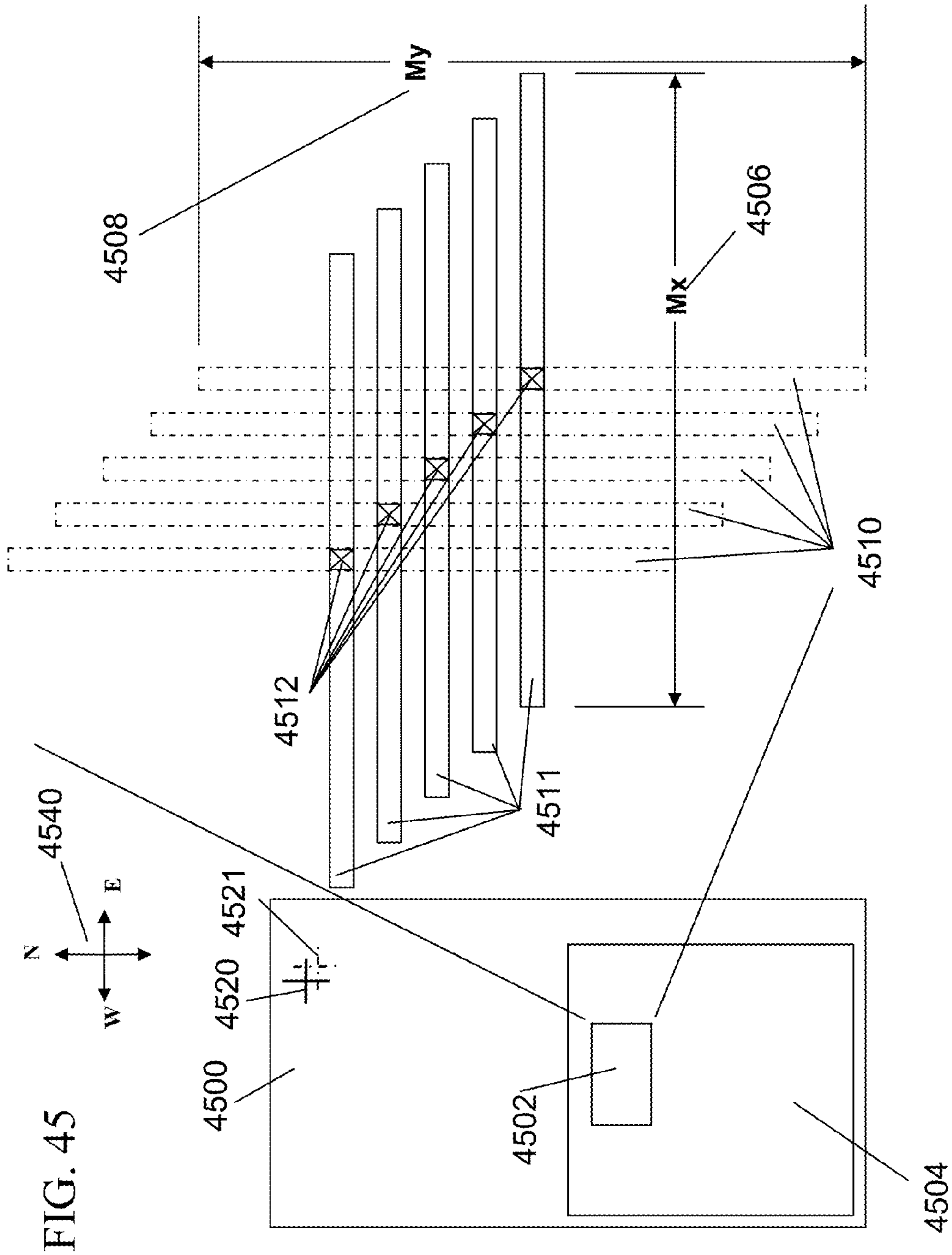
FIG. 45 is an exemplary drawing illustration of a connection strip array structure.

As illustrated in FIG. 45, an acceptor wafer die 4550 on an acceptor wafer may be aligned and bonded with a donor wafer which may have prefabricated non-repeating pattern device structures, such as, for example, block 4504. Acceptor alignment mark 4521 and donor wafer alignment mark 4520 may be located in the acceptor wafer die 4550 (shown) or may be elsewhere on the bonded donor and acceptor wafer stack. A four cardinal directions indicator 4540 will be used to assist the explanation. A general connectivity structure 4502 may be drawn inside or outside of the donor wafer non-repeating pattern device structure block 4504 and a blowup of the general connectivity structure 4502 is shown. Maximum donor wafer to acceptor wafer misalignment in the East-West direction Mx 4506 and maximum donor wafer to acceptor wafer misalignment in the North-South direction My 4508 may also include margin for incremental misalignment resulting from the angular misalignment during wafer to wafer bonding, and may include uncompensated donor wafer bow and warp. Acceptor wafer metal connect strips 4510, shown as oriented in the North-South direction, may have a length of at least My 4508 and may be aligned to the acceptor wafer alignment mark 4521. Donor wafer metal connect strips 4511, shown as oriented in the East-West direction, may have a length of at least Mx 4506 and may be aligned to the donor wafer alignment mark 4520. The thru layer via (TLV) 4512 connecting donor wafer metal connect strip 4511 to acceptor wafer metal connect strips 4510 may be aligned to the acceptor wafer alignment mark 4521 in the East-West direction and to the donor wafer alignment mark 4520 in the North-South direction in such a manner that the TLV will always be at the intersection of the correct two metal strips, which it needs to connect.

Alternatively, the donor wafer may comprise both repeating and non-repeating pattern device structures. The two elements, one repeating and the other non-repeating, may be patterned separately. The donor wafer non-repeating pattern device structures, such as, for example, block 4504, may be aligned to the donor wafer alignment mark 4520, and the repeating pattern device structures may be aligned to the acceptor wafer alignment mark 4521 with an offsets Rdx and Rdy as previously described with reference to FIG. 43. Donor wafer metal connect strips 4511, shown as oriented in the East-West direction, may be aligned to the donor wafer alignment mark 4520. Acceptor wafer metal connect strips 4510, shown as oriented in the North-South direction, may be aligned to the acceptor wafer alignment mark 4521 with the offset Rdy. The thru layer via (TLV) 4512 connecting donor wafer metal connect strip 4511 to acceptor wafer metal connect strips 4510 may be aligned to the acceptor wafer alignment mark 4521 in the East-West direction with the offset Rdx and to the donor wafer alignment mark 4520 in the North-South direction Persons of ordinary skill in the art will appreciate that the illustrations in FIG. 45 are exemplary only and are not drawn to scale. Such skilled persons will further appreciate that many variations are possible such as, for example, the North-South direction could become the East-West direction (and vice versa) by merely rotating the wafer 90° and that the donor wafer metal connect strips 4511 could also run North-South as a matter of design choice with corresponding adjustments to the rest of the fabrication process. Thus the scope of the invention is to be limited only by the appended claims.

The Following Sections Discuss Embodiments to the Invention that Enable Various Aspects of 3D IC Formation.

It may be desirable to screen the sensitive gate dielectric and other gate structures from the layer transfer or ion-cut atomic species implantation previously described, such as, for example, Hydrogen and Helium implantation thru the gate structures and into the underlying silicon wafer or substrate.

Figure 46:
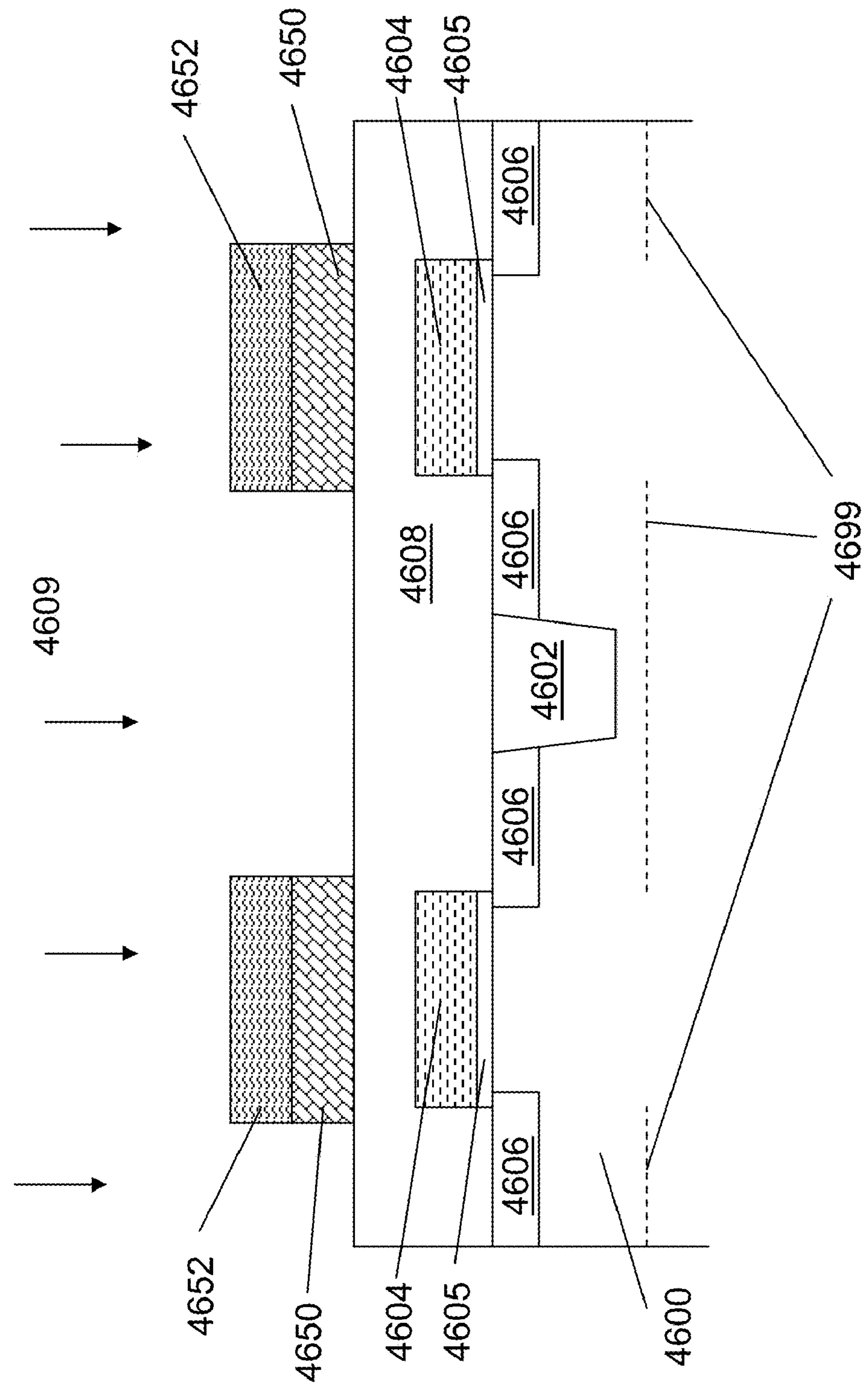
FIG. 46 is an exemplary drawing illustration of an implant shield structure.

As illustrated in FIG. 46, lithographic definition and etching of an atomically dense material 4650, for example 5000 angstroms of Tantalum, may be combined with a remaining 5,000 angstroms of photoresist 4552, to create implant stopping regions or shields on donor wafer 4600. Interlayer dielectric (ILD) 4608, gate metal 4604, gate dielectric 4605, transistor junctions 4606, shallow trench isolation (STI) 4602 are shown in the illustration. The screening of ion-cut implant 4609 may create segmented layer transfer demarcation planes 4599 (shown as dashed lines) in silicon wafer 4600, or other layers in previously described processes, and may need additional post-cleave polishing, such as, for example, by chemical mechanical polishing (CMP), to provide a smooth bonding or device structure formation surface for 3D IC manufacturability. Alternatively, the ion-cut implant 4609 may be done in multiple steps with a sufficient tilt each to create an overlapping or continuous demarcation plane 4599 below the protected regions.

When a high density of thru layer vias (TLVs) are made possible by the methods and techniques in this document, the conventional metallization layer scheme may be improved to take advantage of this dense 3D technology.

Figure 47A:
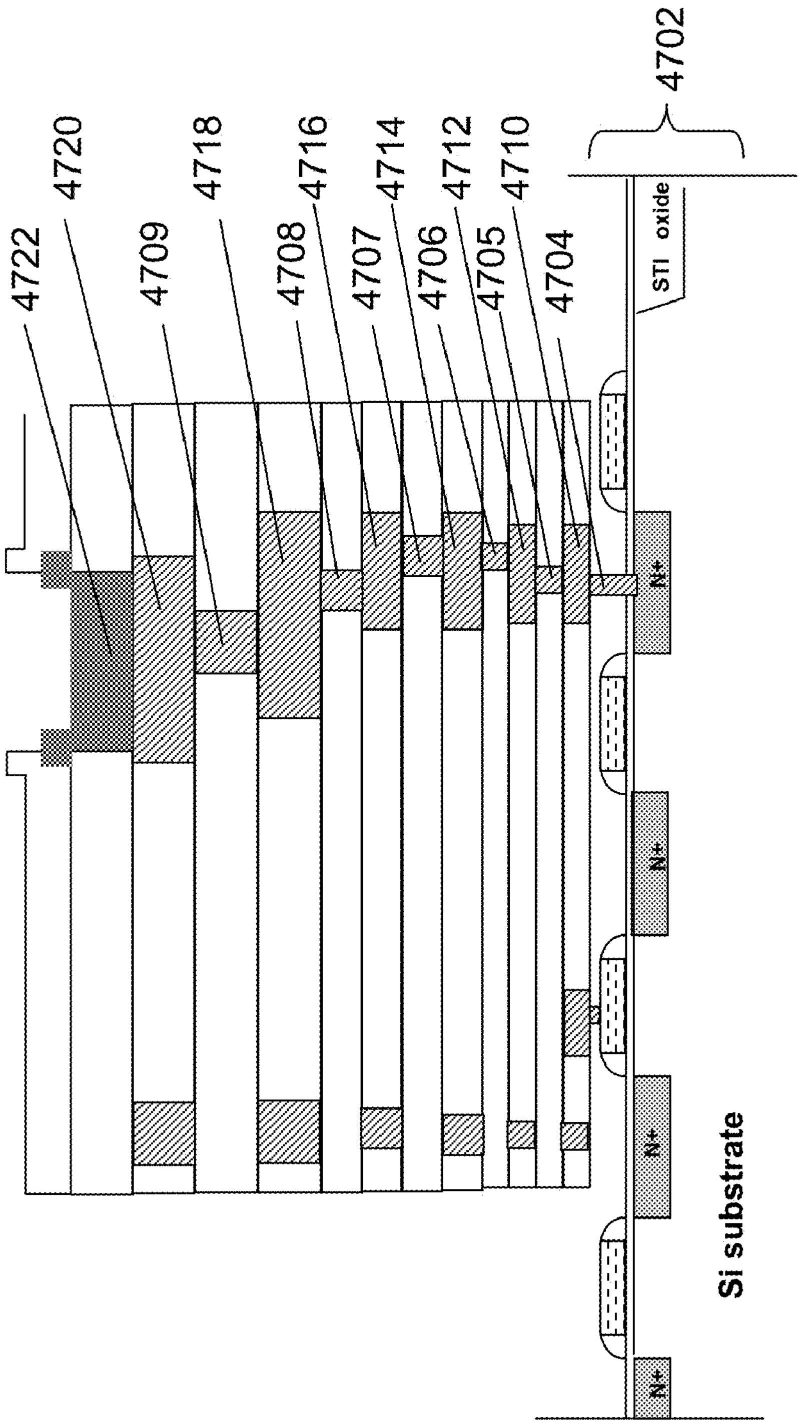
FIG. 47A is an exemplary drawing illustration of a metal interconnect stack prior art.

As illustrated in FIG. 47A, a conventional metallization layer scheme is built on a conventional transistor silicon layer 4702. The conventional transistor silicon layer 4702 is connected to the first metal layer 4710 thru the contact 4704. The dimensions of this interconnect pair of contact and metal lines generally are at the minimum line resolution of the lithography and etch capability for that technology process node. Traditionally, this is called a "1×' design rule metal layer. Usually, the next metal layer is also at the "1×' design rule, the metal line 4712 and via below 4705 and via above 4706 that connects metals 4712 with 4710 or with 4714 where desired. The next few layers are often constructed at twice the minimum lithographic and etch capability and are called '2×' metal layers, and may have thicker metal for higher current carrying capability. These are illustrated with metal line 4714 paired with via 4707 and metal line 4716 paired with via 4708 in FIG. 47. Accordingly, the metal via pairs of 4718 with 4709, and 4720 with bond pad 4722, represent the '4×' metallization layers where the planar and thickness dimensions are again larger and thicker than the 2× and 1× layers. The precise number of 1× or 2× or 4× metal and via layers may vary depending on interconnection needs and other requirements; however, the general flow is that of increasingly larger metal line, metal to metal space, and associated via dimensions as the metal layers are farther from the silicon transistors in conventional transistor silicon layer 4702 and closer to the bond pads 4722.

Figure 47B:
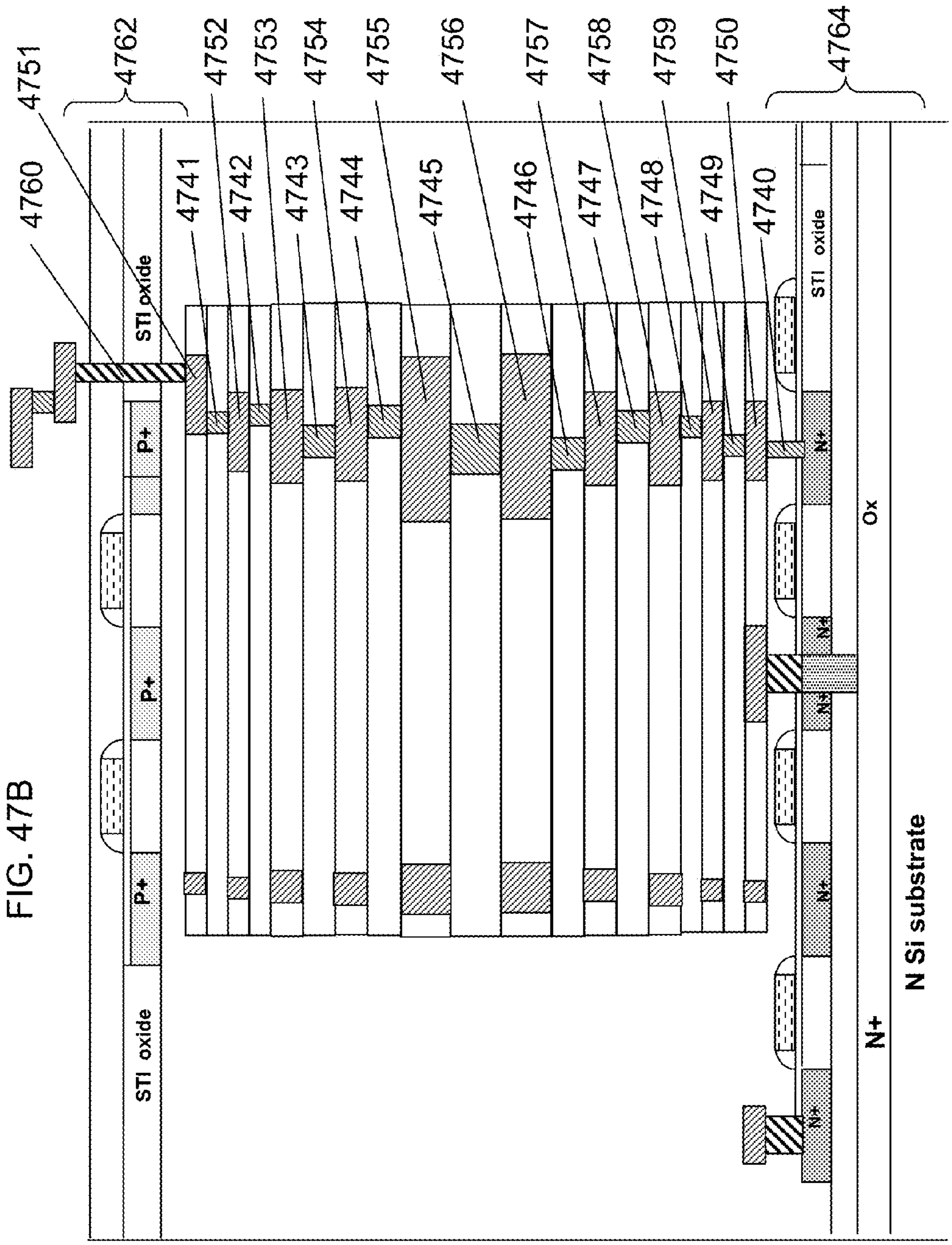
FIG. 47B is an exemplary drawing illustration of a metal interconnect stack.

As illustrated in FIG. 47B, an improved metallization layer scheme for 3D ICs may be built on the first mono-crystalline silicon device layer 4764. The first mono-crystalline silicon device layer 4764 is illustrated as the NMOS silicon transistor layer from the previously described FIG. 20, but may also be a conventional logic transistor silicon substrate or layer or other substrate as previously described for acceptor substrate or acceptor wafer. The '1X' metal layers 4750 and 4759 are connected with contact 4740 to the silicon transistors and vias 4748 and 4749 to each other or metal line 4758. The 2× layer pairs metal 4758 with via 4747 and metal 4757 with via 4746. The 4× metal layer 4756 is paired with via 4745 and metal 4755, also at 4×. However, now via 4744 is constructed in 2× design rules to enable metal line 4754 to be at 2×. Metal line 4753 and via 4743 are also at 2× design rules and thicknesses. Vias 4742 and 4741 are paired with metal lines 4752 and 4751 at the 1× minimum design rule dimensions and thickness, thus taking advantage of the high density of TLVs 4760. The TLV 4760 of the illustrated PMOS layer transferred silicon 4762, from the previously described FIG. 20, may then be constructed at the 1× minimum design rules and provide for maximum density of the top layer. The precise numbers of 1× or 2× or 4× layers may vary depending on circuit area and current carrying metallization requirements and tradeoffs. The layer transferred top transistor layer 4762 may be composed of any of the low temperature devices or transferred layers illustrated in this document.

When a transferred layer is not optically transparent to shorter wavelength light, and hence not able to detect alignment marks and images to a nanometer or tens of nanometer resolution, due to the transferred layer or its carrier or holder substrate's thickness, infra-red (IR) optics and imaging may be utilized for alignment purposes. However, the resolution and alignment capability may not be satisfactory. In this embodiment, alignment windows are created that allow use of the shorter wavelength light for alignment purposes during layer transfer flows.

Figure 48A:
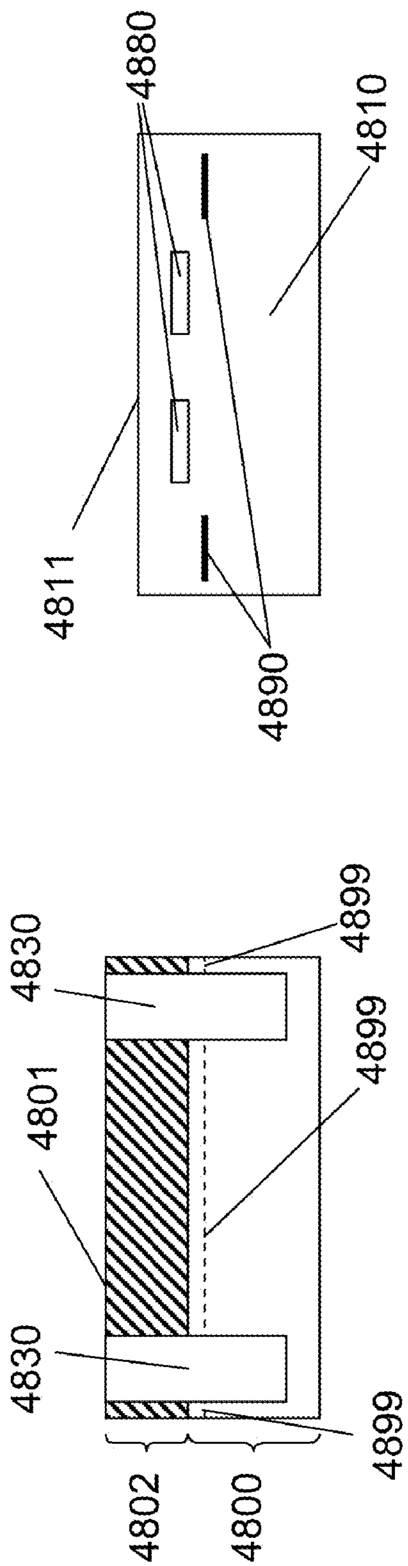
FIGS. 48A-D are exemplary drawing illustrations of a generalized layer transfer process flow with alignment windows.

As illustrated in FIG. 48A, a generalized process flow may begin with a donor wafer 4800 that is preprocessed with layers 4802 of conducting, semi-conducting or insulating materials that may be formed by deposition, ion implantation and anneal, oxidation, epitaxial growth, combinations of above, or other semiconductor processing steps and methods. The donor wafer 4800 may also be preprocessed with a layer transfer demarcation plane 4899, such as, for example, a hydrogen implant cleave plane, before or after layers 4802 are formed, or may be thinned by other methods previously described. Alignment windows 4830 may be lithographically defined, plasma/RIE etched, and then filled with shorter wavelength transparent material, such as, for example, silicon dioxide, and planarized with chemical mechanical polishing (CMP). Optionally, donor wafer 4800 may be further thinned by CMP. The size and placement on donor wafer 4800 of the alignment windows 4830 may be determined based on the maximum misalignment tolerance of the alignment scheme used while bonding the donor wafer 4800 to the acceptor wafer 4810, and the placement locations of the acceptor wafer alignment marks 4890. Alignment windows 4830 may be processed before or after layers 4802 are formed. Acceptor wafer 4810 may be a preprocessed wafer that has fully functional circuitry or may be a wafer with previously transferred layers, or may be a blank carrier or holder wafer, or other kinds of substrates and may be called a target wafer. The acceptor wafer 4810 and the donor wafer 4800 may be a bulk mono-crystalline silicon wafer or a Silicon On Insulator (SOI) wafer or a Germanium on Insulator (GeOI) wafer. Acceptor wafer 4810 metal connect pads or strips 4880 and acceptor wafer alignment marks 4890 are shown.

Both the donor wafer 4800 and the acceptor wafer 4810 bonding surfaces 4801 and 4811 may be prepared for wafer bonding by depositions, polishes, plasma, or wet chemistry treatments to facilitate successful wafer to wafer bonding.

Figure 48B:
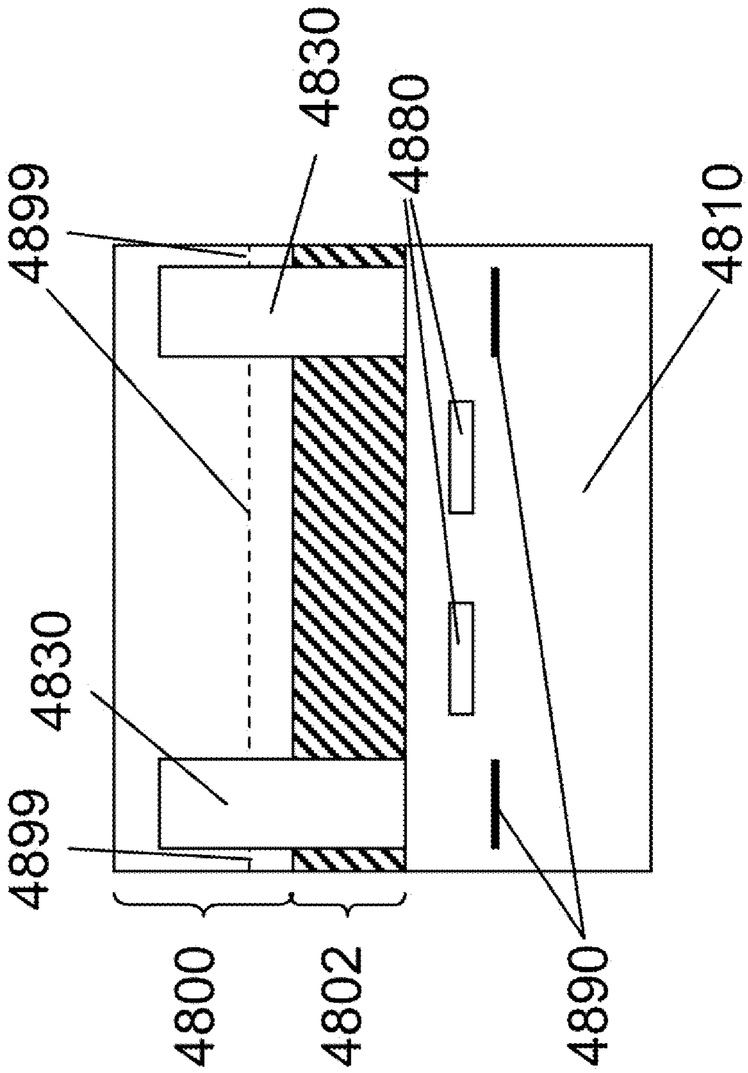

As illustrated in FIG. 48B, the donor wafer 4800 with layers 4802, alignment windows 4830, and layer transfer demarcation plane 4899 may then be flipped over, high resolution aligned to acceptor wafer alignment marks 4890, and bonded to the acceptor wafer 4810.

Figure 48C:
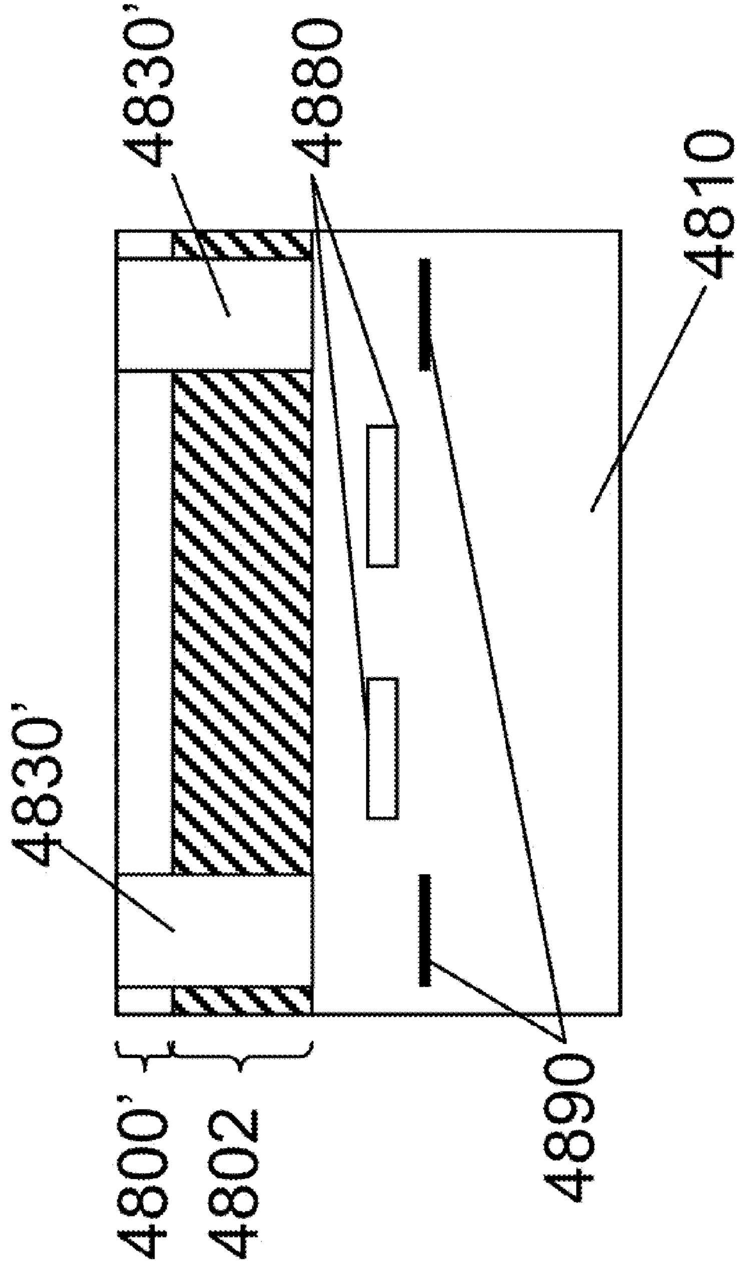

As illustrated in FIG. 48C, the donor wafer 4800 may be cleaved at or thinned to the layer transfer demarcation plane, leaving a portion of the donor wafer 4800', alignment windows 4830' and the pre-processed layers 4802 aligned and bonded to the acceptor wafer 4810.

Figure 48D:
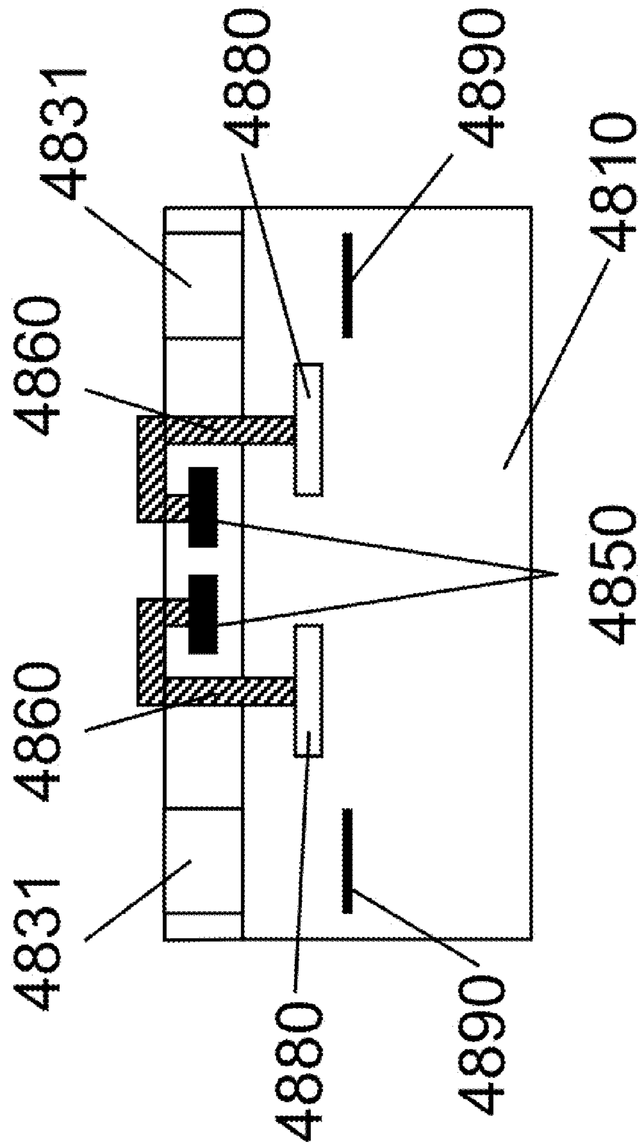

As illustrated in FIG. 48D, the remaining donor wafer portion 4800' may be removed by polishing or etching and the transferred layers 4802 may be further processed to create donor wafer device structures 4850 that are precisely aligned to the acceptor wafer alignment marks 4890, and further process the alignment windows 4830' into alignment window regions 4831. These donor wafer device structures 4850 may utilize thru layer vias (TLVs) 4860 to electrically couple the donor wafer device structures 4850 to the acceptor wafer metal connect pads or strips 4880. As the transferred layers 4802 are thin, on the order of 200 nm or less in thickness, the TLVs may be easily manufactured as a normal metal to metal via may be, and said TLV may have state of the art diameters such as, for example, nanometers or tens of nanometers.

An additional use for the high density of TLVs 4860 in FIG. 48D, or any such TLVs in this document, may be to thermally conduct heat generated by the active circuitry from one layer to another connected by the TLVs, such as, for example, donor layers and device structures to acceptor wafer or substrate, and may also be utilized to conduct heat to an on chip thermoelectric cooler, heat sink, or other heat removing device. A portion of TLVs on a 3D IC may be utilized primarily for electrical coupling, and a portion may be primarily utilized for thermal conduction. In many cases, the TLVs may provide utility for both electrical coupling and thermal conduction.

When multiple layers are stacked in a 3D IC, the power density per unit area increases. The thermal conductivity of mono-crystalline silicon is poor at 150 W/m-K and silicon dioxide, the most common electrical insulator in modern silicon integrated circuits, is a very poor 1.4 W/m-K. If a heat sink is placed at the top of a 3D IC stack, then the bottom chip or layer (farthest from the heat sink) has the poorest thermal conductivity to that heat sink, since the heat from that bottom layer must travel thru the silicon dioxide and silicon of the chip(s) or layer(s) above it.

Figure 51:
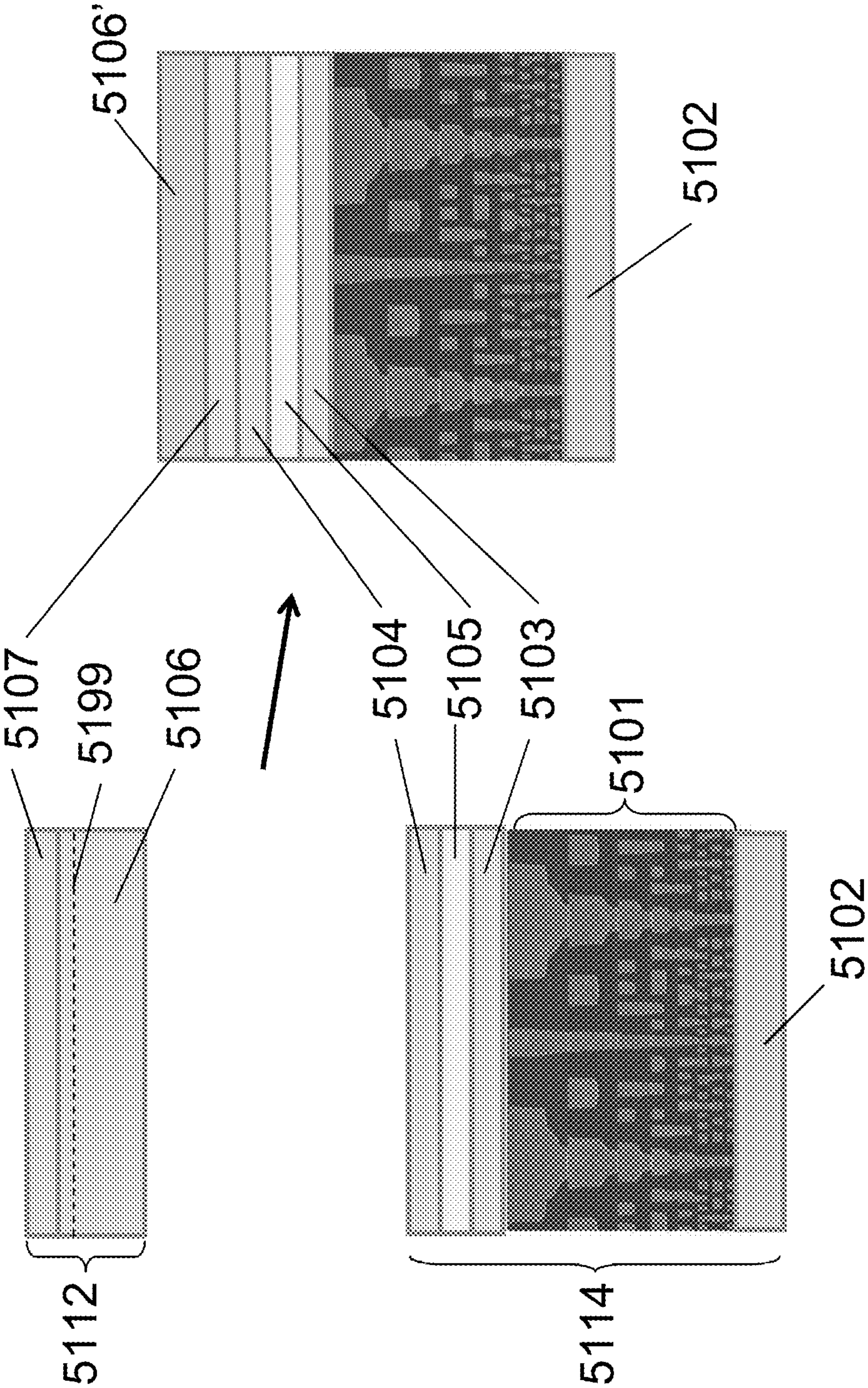
FIG. 51 is an exemplary drawing illustration of a heat spreader in a 3D IC.

As illustrated in FIG. 51A, a heat spreader layer 5105 may be deposited on top of a thin silicon dioxide layer 5103 which is deposited on the top surface of the interconnect metallization layers 5101 of substrate 5102. Heat spreader layer 5105 may comprise Plasma Enhanced Chemical Vapor Deposited Diamond Like Carbon (PECVD DLC), which has a thermal conductivity of 1000 W/m-K, or another thermally conductive material, such as, for example, Chemical Vapor Deposited (CVD) graphene (5000 W/m-K) or copper (400 W/m-K). Heat spreader layer 5015 may be of thickness approximately 20 nm up to approximately 1 micron. The preferred thickness range is approximately 50 nm to 100 nm and the preferred electrical conductivity of the heat spreader layer 5105 is an insulator to enable minimum design rule diameters of the future thru layer vias. If the heat spreader is electrically conducting, the TLV openings need to be somewhat enlarged to allow for the deposition of a non-conducting coating layer on the TLV walls before the conducting core of the TLV is deposited. Alternatively, if the heat spreader layer 5105 is electrically conducting, it may be masked and etched to provide the landing pads for the thru layer vias and a large grid around them for heat transfer, which could also be used as the ground plane or as power and ground straps for the circuits above and below it. Oxide layer 5104 may be deposited (and may be planarized to fill any gaps in the heat transfer layer) to prepare for wafer to wafer oxide bonding. Acceptor substrate 5114 may comprise substrate 5102, interconnect metallization layers 5101, thin silicon dioxide layer 5103, heat spreader layer 5105, and oxide layer 5104. The donor wafer substrate 5106 may be processed with wafer sized layers of doping as previously described, in preparation for forming transistors and circuitry after the layer transfer, such as, for example, junction-less, RCAT, V-groove, and bipolar. A screen oxide 5107 may be grown or deposited prior to the implant or implants to protect the silicon from implant contamination and to provide an oxide surface for later wafer to wafer bonding. A layer transfer demarcation plane 5199 (shown as a dashed line) may be formed in donor wafer substrate 5106 by hydrogen implantation, 'ion-cut' method, or other methods as previously described. Donor wafer 5112 may be comprised of donor substrate 5106, layer transfer demarcation plane 5199, screen oxide 5107, and any other layers (not shown) in preparation for forming transistors as discussed previously. Both the donor wafer 5112 and acceptor wafer 5114 may be prepared for wafer bonding as previously described and then bonded at the surfaces of oxide layer 5104 and oxide layer 5107, at a low temperature (less than approximately 400° C.). The portion of donor substrate 5106 that is above the layer transfer demarcation plane 5199 may be removed by cleaving and polishing, or other processes as previously described, such as, for example, ion-cut or other methods, thus forming the remaining transferred layers 5106'. Alternatively, donor wafer 5112 may be constructed and then layer transferred, using methods described previously such as, for example, ion-cut with replacement gates (not shown), to the acceptor substrate 5114. Now transistors or portions of transistors may be formed and aligned to the acceptor wafer alignment marks (not shown) and thru layer vias formed as previously described. Thus, a 3D IC with an integrated heat spreader is constructed.

Figure 52A:
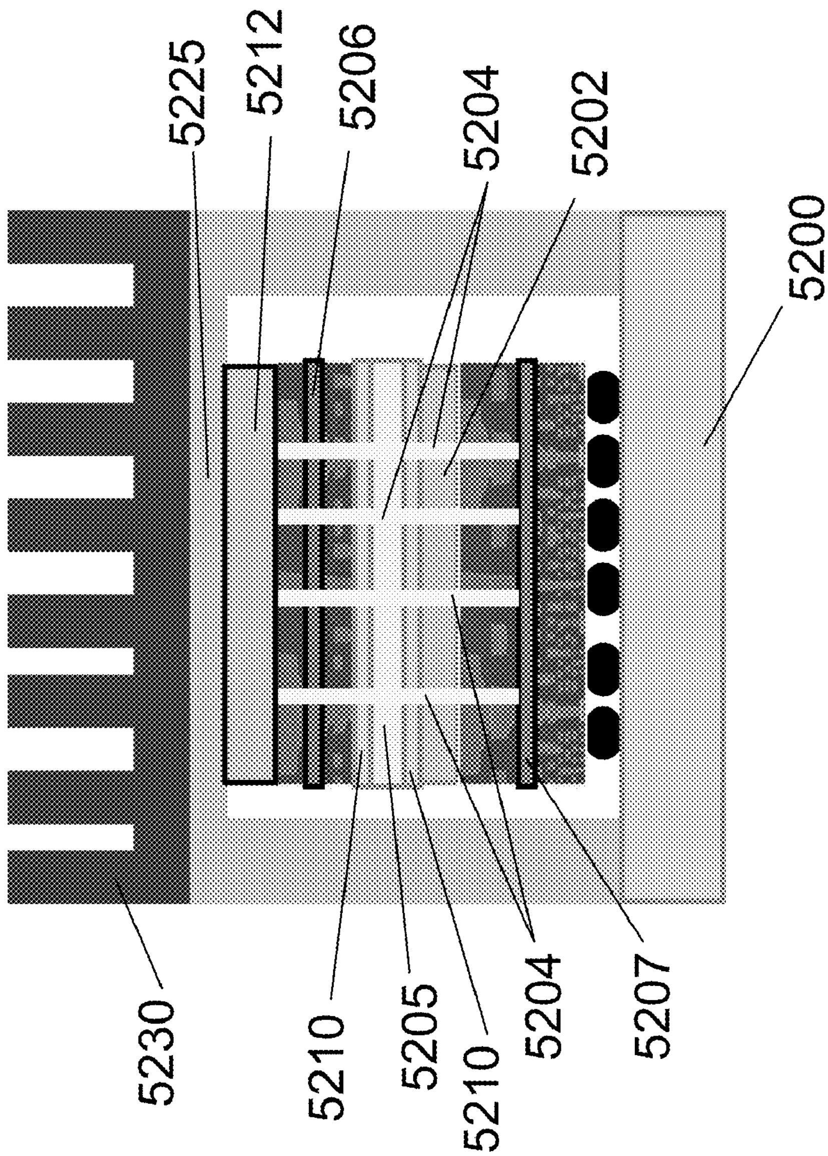
FIGS. 52A-B are exemplary drawing illustrations of an integrated heat removal configuration for 3D ICs.

As illustrated in FIG. 52A, a set of power and ground grids, such as, for example, bottom transistor layer power and ground grid 5207 and top transistor layer power and ground grid 5206, may be connected by thru layer power and ground vias 5204 and thermally coupled to electrically non-conducting heat spreader layer 5205. If the heat spreader is an electrical conductor, than it could either be used as a ground plane, or a pattern should be created with power and ground strips in between the landing pads for the TLVs. The density of the power and ground grids and the thru layer vias to the power and ground grids may be designed to guarantee a certain overall thermal resistance for substantially all the circuits in the 3D IC stack. Bonding oxides 5210, printed wiring board 5200, package heat spreader 5225, bottom transistor layer 5202, top transistor layer 5212, and heat sink 5230 are shown. Thus, a 3D IC with an integrated heat sink, heat spreaders, and thru layer vias to the power and ground grid is constructed.

Figure 52B:
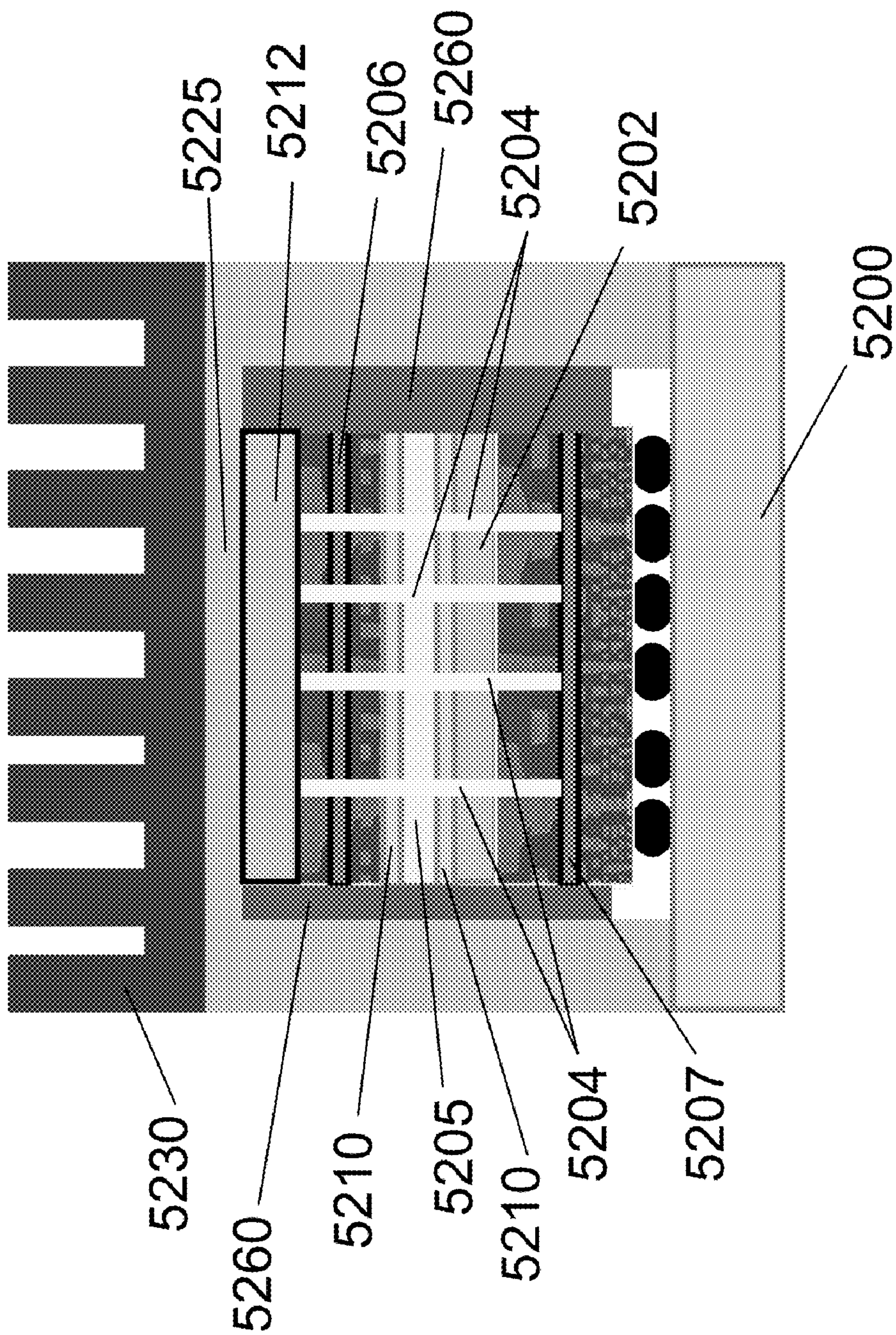

As illustrated in FIG. 52B, thermally conducting material, such as, for example, PECVD DLC, may be formed on the sidewalls of the 3D IC structure of FIG. 52A to form sidewall thermal conductors 5260 for sideways heat removal. Bottom transistor layer power and ground grid 5207, top transistor layer power and ground grid 5206, thru layer power and ground vias 5204, heat spreader layer 5205, bonding oxides 5210, printed wiring board 5200, package heat spreader 5225, bottom transistor layer 5202, top transistor layer 5212, and heat sink 5230 are shown.

Thermal anneals to activate implants and set junctions in previously described methods and process flows may be performed with RTA (Rapid Thermal Anneal) or furnace thermal exposures. Alternatively, laser annealing may be utilized to activate implants and set the junctions. Optically absorptive and reflective layers as described previously in FIGS. 15G and 15H may be employed to anneal implants and activate junctions on many of the devices or structures discussed in this document.

The monolithic 3D integration concepts described in this patent application can lead to novel embodiments of poly-crystalline silicon based memory architectures. While the below concepts in FIGS. 49 and 50 are explained by using resistive memory architectures as an example, it will be clear to one skilled in the art that similar concepts can be applied to the NAND flash, charge trap, and DRAM memory architectures and process flows described previously in this patent application.

As illustrated in FIGS. 49A to 49K, a resistance-based 3D memory with zero additional masking steps per memory layer may be constructed with methods that are suitable for 3D IC manufacturing. This 3D memory utilizes poly-crystalline silicon junction-less transistors that may have either a positive or a negative threshold voltage and has a resistance-based memory element in series with a select or access transistor.

Figure 49A:
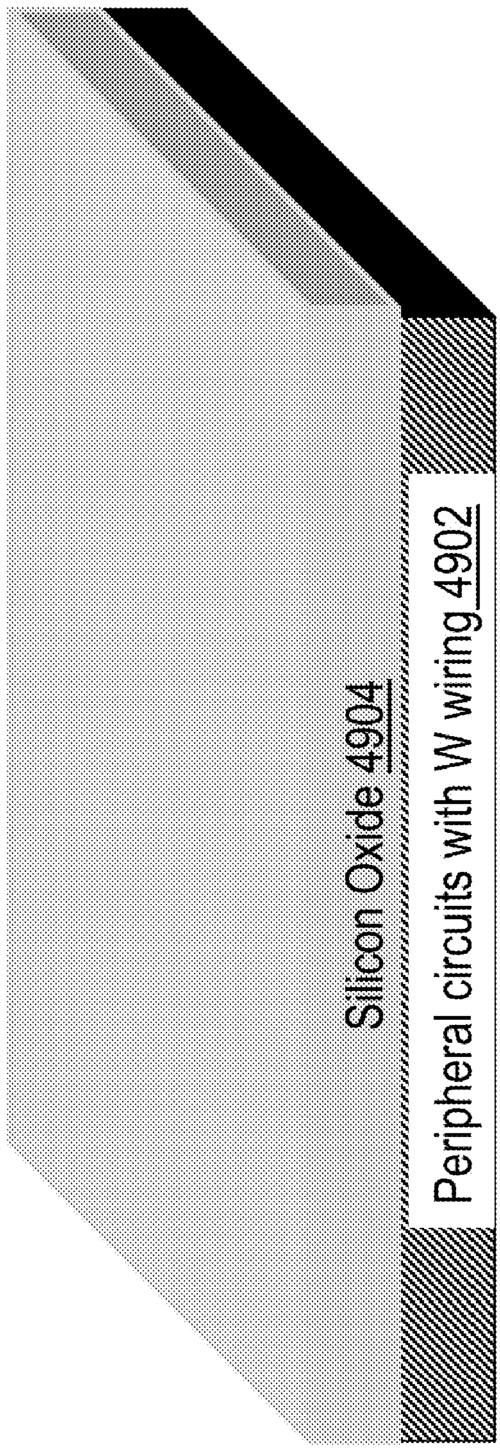
FIGS. 49A-K are exemplary drawing illustrations of the formation of a resistive memory transistor.

As illustrated in FIG. 49A, a silicon substrate with peripheral circuitry 4902 may be constructed with high temperature (greater than approximately 400° C.) resistant wiring, such as, for example, Tungsten. The peripheral circuitry substrate 4902 may comprise memory control circuits as well as circuitry for other purposes and of various types, such as, for example, analog, digital, RF, or memory. The peripheral circuitry substrate 4902 may comprise peripheral circuits that can withstand an additional rapid-thermal-anneal (RTA) and still remain operational and retain good performance. For this purpose, the peripheral circuits may be formed such that they have not been subject to a weak RTA or no RTA for activating dopants. Silicon oxide layer 4904 is deposited on the top surface of the peripheral circuitry substrate.

Figure 49B:
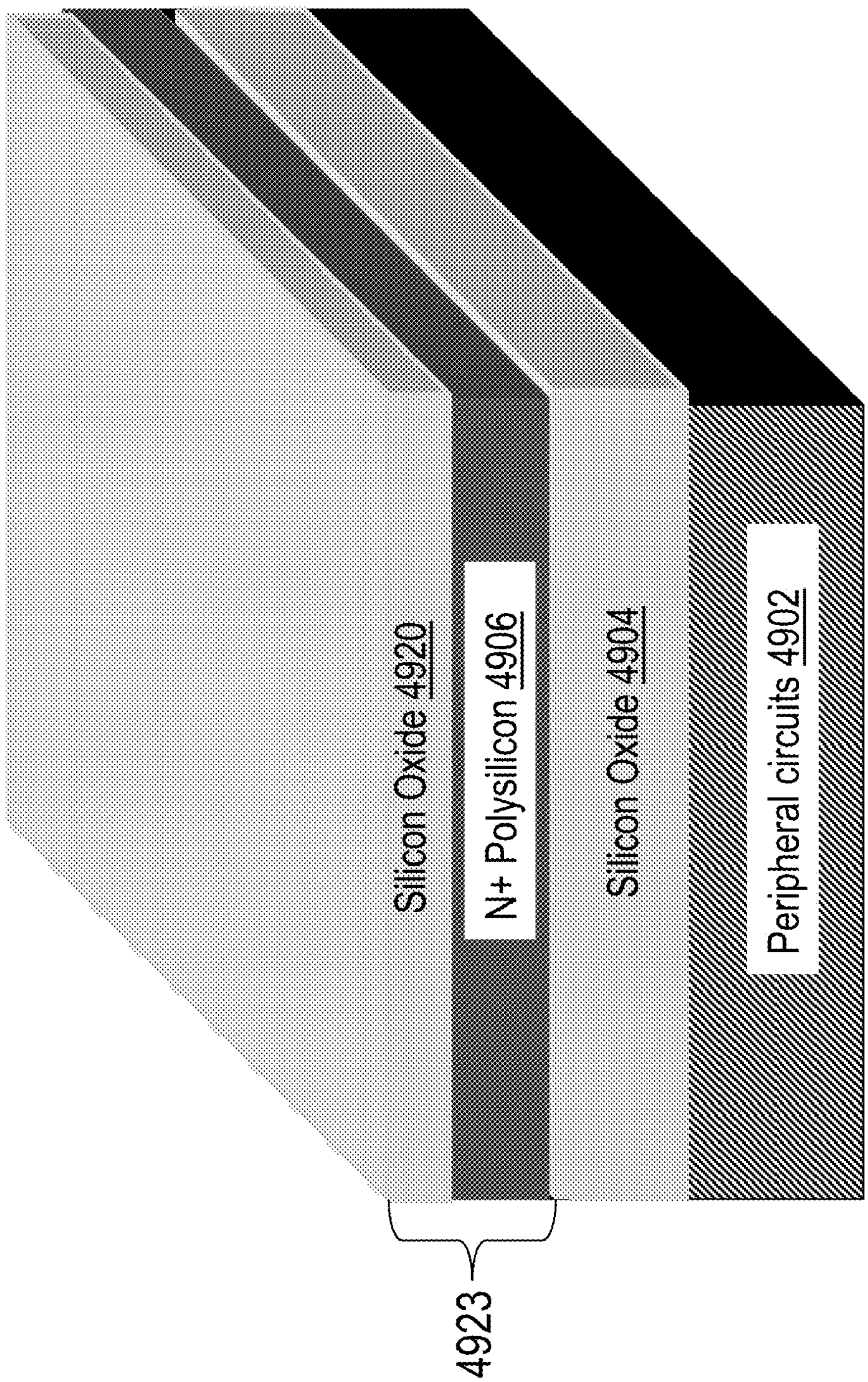

As illustrated in FIG. 49B, a layer of N+ doped poly-crystalline or amorphous silicon 4906 may be deposited. The amorphous silicon or poly-crystalline silicon layer 4906 may be deposited using a chemical vapor deposition process, such as, for example, LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 4920 may then be deposited or grown. This now forms the first Si/SiO2 layer 4923 which includes N+ doped poly-crystalline or amorphous silicon layer 4906 and silicon oxide layer 4920.

Figure 49C:
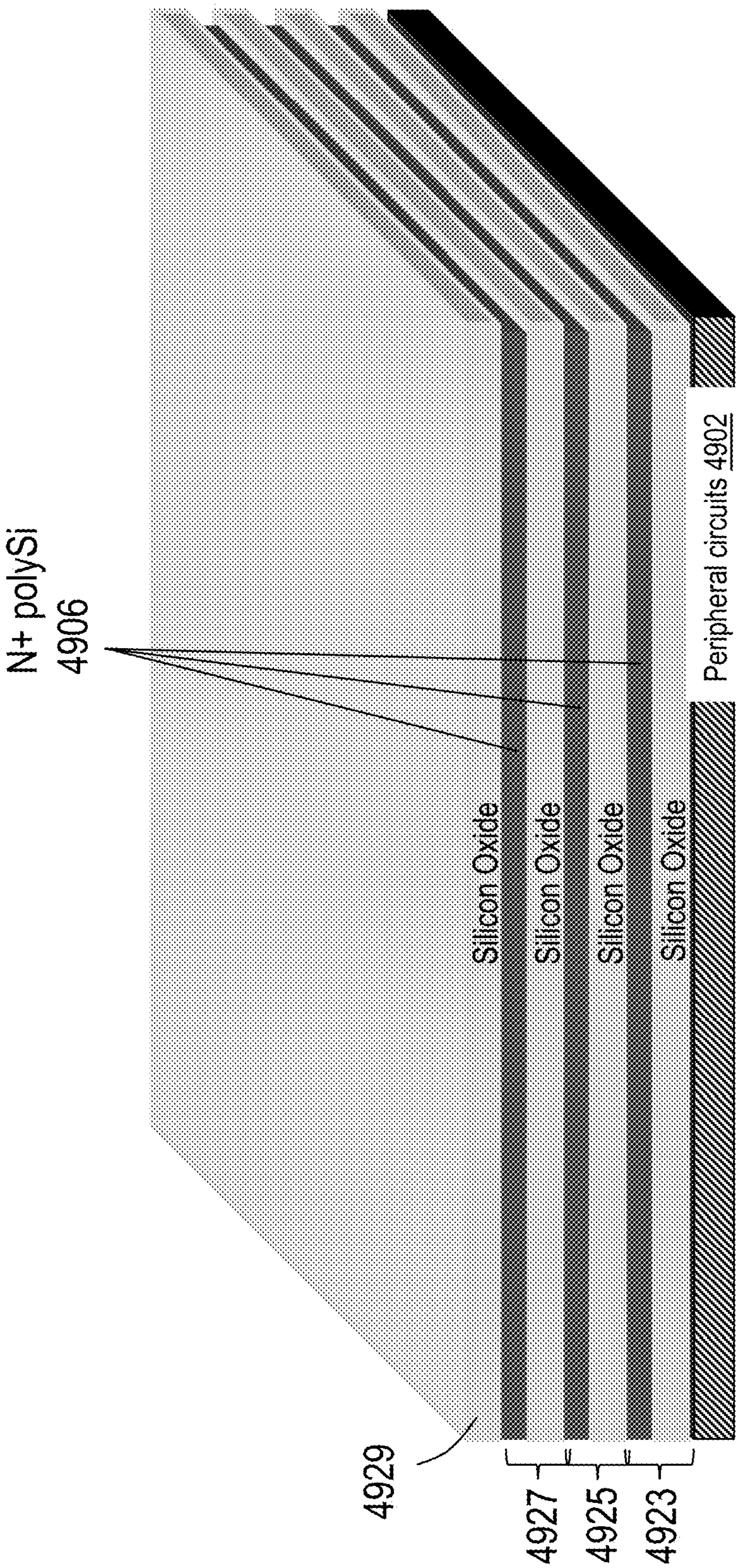

As illustrated in FIG. 49C, additional Si/SiO2 layers, such as, for example, second Si/SiO2 layer 4925 and third Si/SiO2 layer 4927, may each be formed as described in FIG. 49B. Oxide layer 4929 may be deposited to electrically isolate the top N+ doped poly-crystalline or amorphous silicon layer.

Figure 49D:
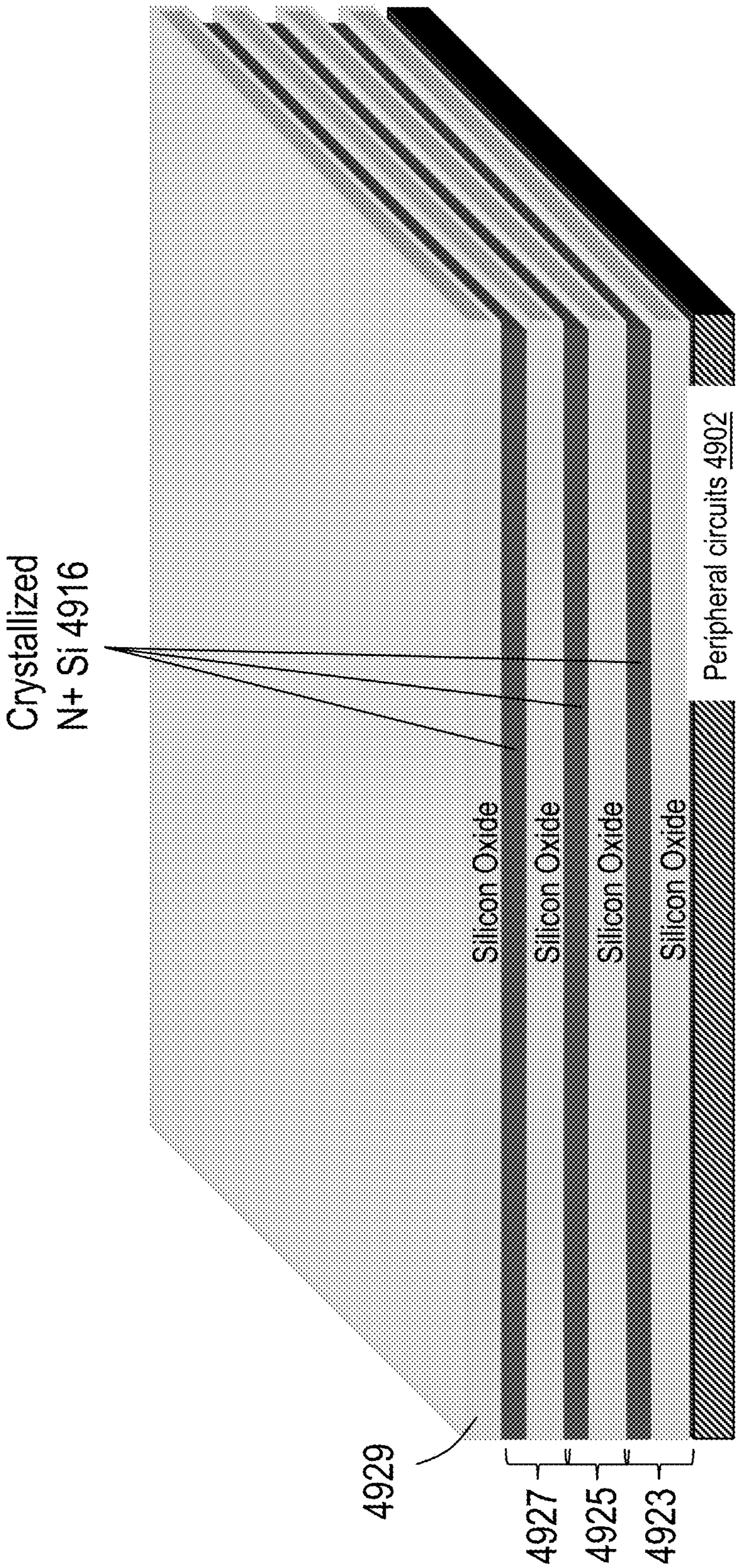

As illustrated in FIG. 49D, a Rapid Thermal Anneal (RTA) is conducted to crystallize the N+ doped poly-crystalline silicon or amorphous silicon layers 4906 of first Si/SiO2 layer 4923, second Si/SiO2 layer 4925, and third Si/SiO2 layer 4927, forming crystallized N+ silicon layers 4916. Temperatures during this RTA may be as high as approximately 800° C. Alternatively, an optical anneal, such as, for example, a laser anneal, could be performed alone or in combination with the RTA or other annealing processes.

Figure 49E:
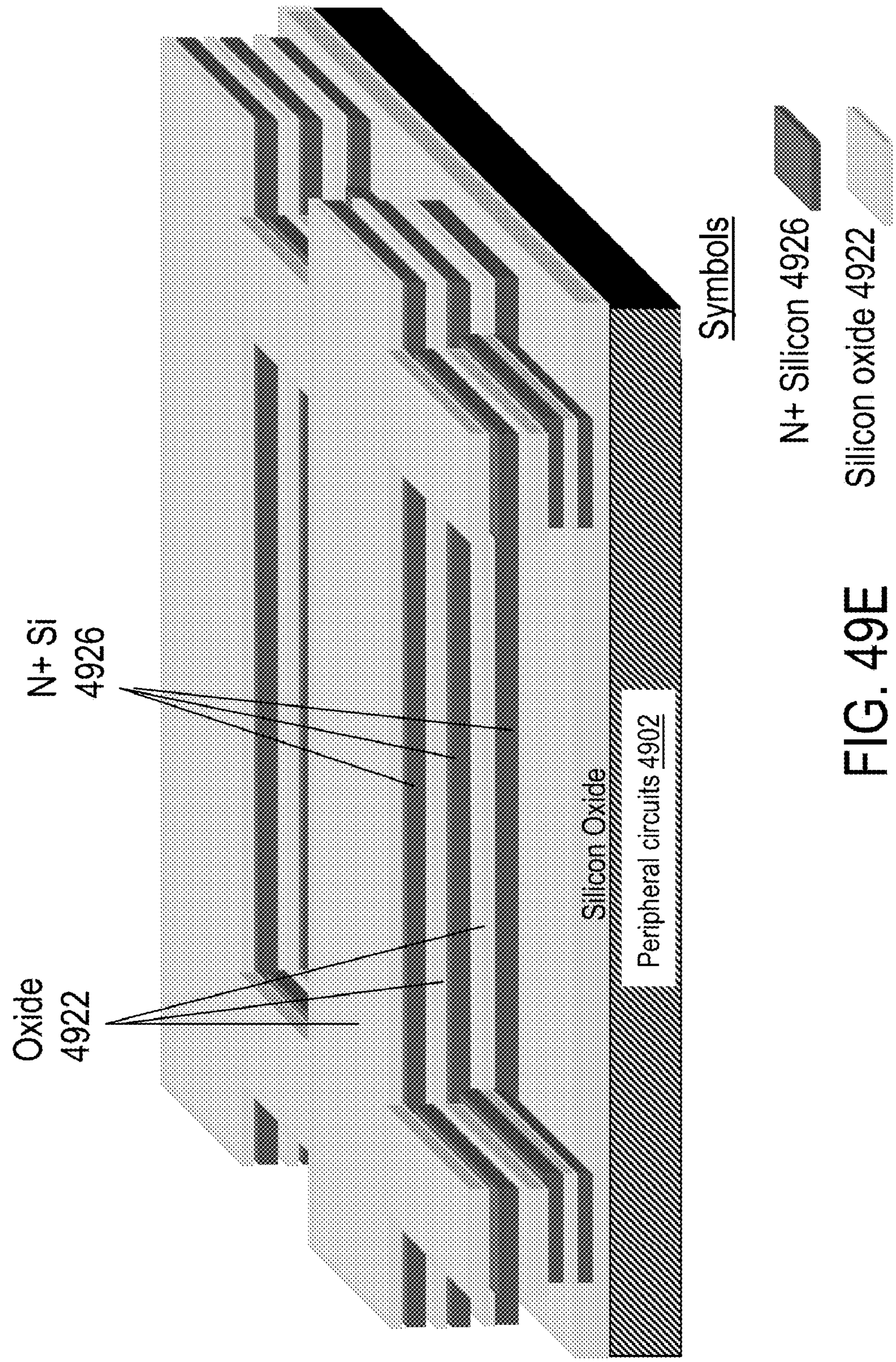

As illustrated in FIG. 49E, oxide 4929, third Si/SiO2 layer 4927, second Si/SiO2 layer 4925 and first Si/SiO2 layer 4923 may be lithographically defined and plasma/RIE etched to form a portion of the memory cell structure, which now includes multiple layers of regions of crystallized N+ silicon 4926 (previously crystallized N+ silicon layers 4916) and oxide 4922.

Figure 49F:
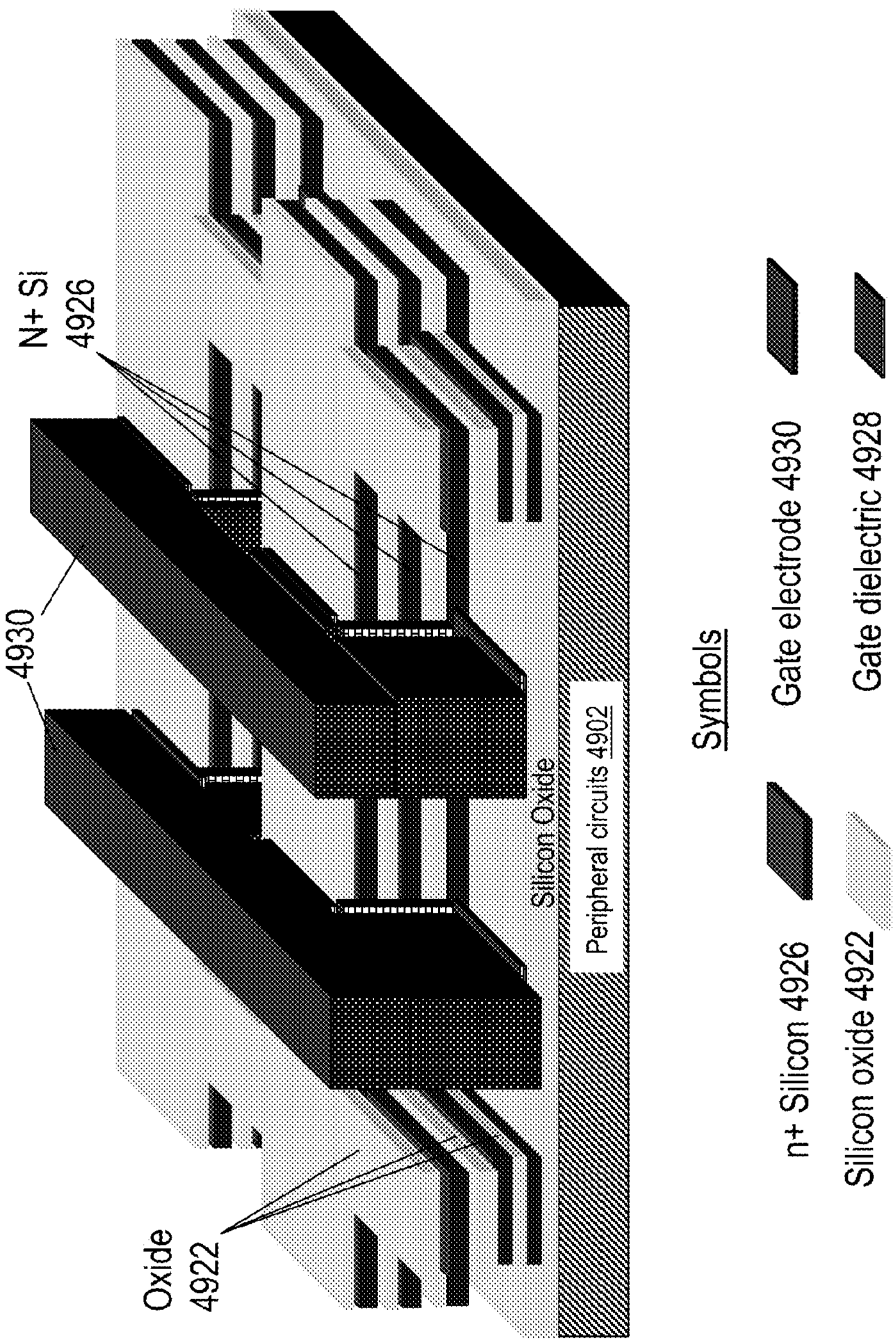

As illustrated in FIG. 49F, a gate dielectric and gate electrode material may be deposited, planarized with a chemical mechanical polish (CMP), and then lithographically defined and plasma/RIE etched to form gate dielectric regions 4928 which may either be self aligned to and substantially covered by gate electrodes 4930 (shown), or substantially cover the entire crystallized N+ silicon regions 4926 and oxide regions 4922 multi-layer structure. The gate stack comprised of gate electrode 4930 and gate dielectric 4928 may be formed with a gate dielectric, such as, for example, thermal oxide, and a gate electrode material, such as, for example, poly-crystalline silicon. Alternatively, the gate dielectric may be an atomic layer deposited (ALD) material that is paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 49G:
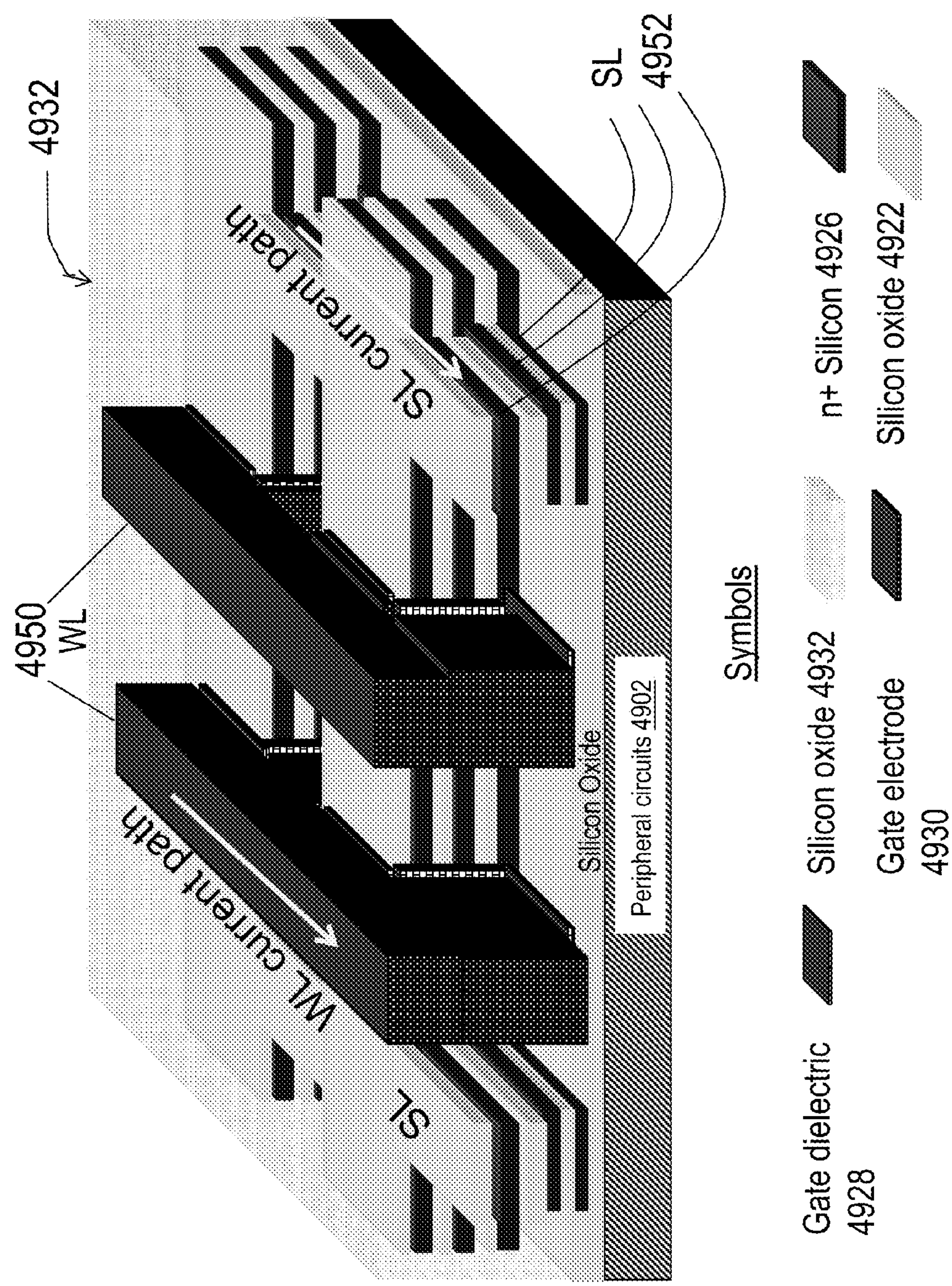

As illustrated in FIG. 49G, the entire structure may be substantially covered with a gap fill oxide 4932, which may be planarized with chemical mechanical polishing. The oxide 4932 is shown transparently in the figure for clarity. Word-line regions (WL) 4950, coupled with and composed of gate electrodes 4930, and source-line regions (SL) 4952, composed of crystallized N+ silicon regions 4926, are shown.

Figure 49H:
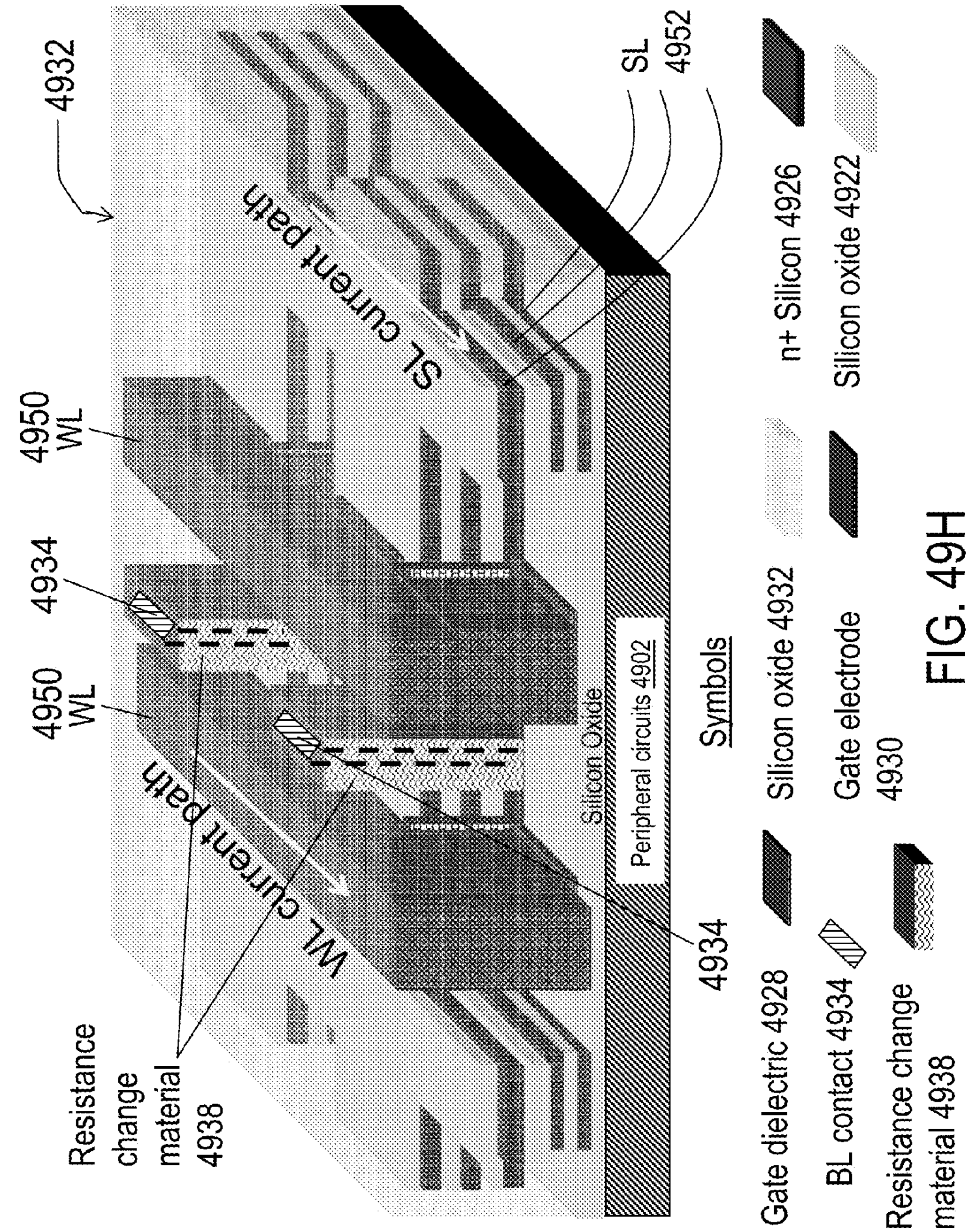

As illustrated in FIG. 49H, bit-line (BL) contacts 4934 may be lithographically defined, etched with plasma/RIE through oxide 4932, the three crystallized N+ silicon regions 4926, and associated oxide vertical isolation regions to connect substantially all memory layers vertically, and photoresist removed. Resistance change memory material 4938, such as, for example, hafnium oxides or titanium oxides, may then be deposited, preferably with atomic layer deposition (ALD). The electrode for the resistance change memory element may then be deposited by ALD to form the electrode/BL contact 4934. The excess deposited material may be polished to planarity at or below the top of oxide 4932. Each BL contact 4934 with resistive change material 4938 may be shared among substantially all layers of memory, shown as three layers of memory in FIG. 49H.

Figure 49I:
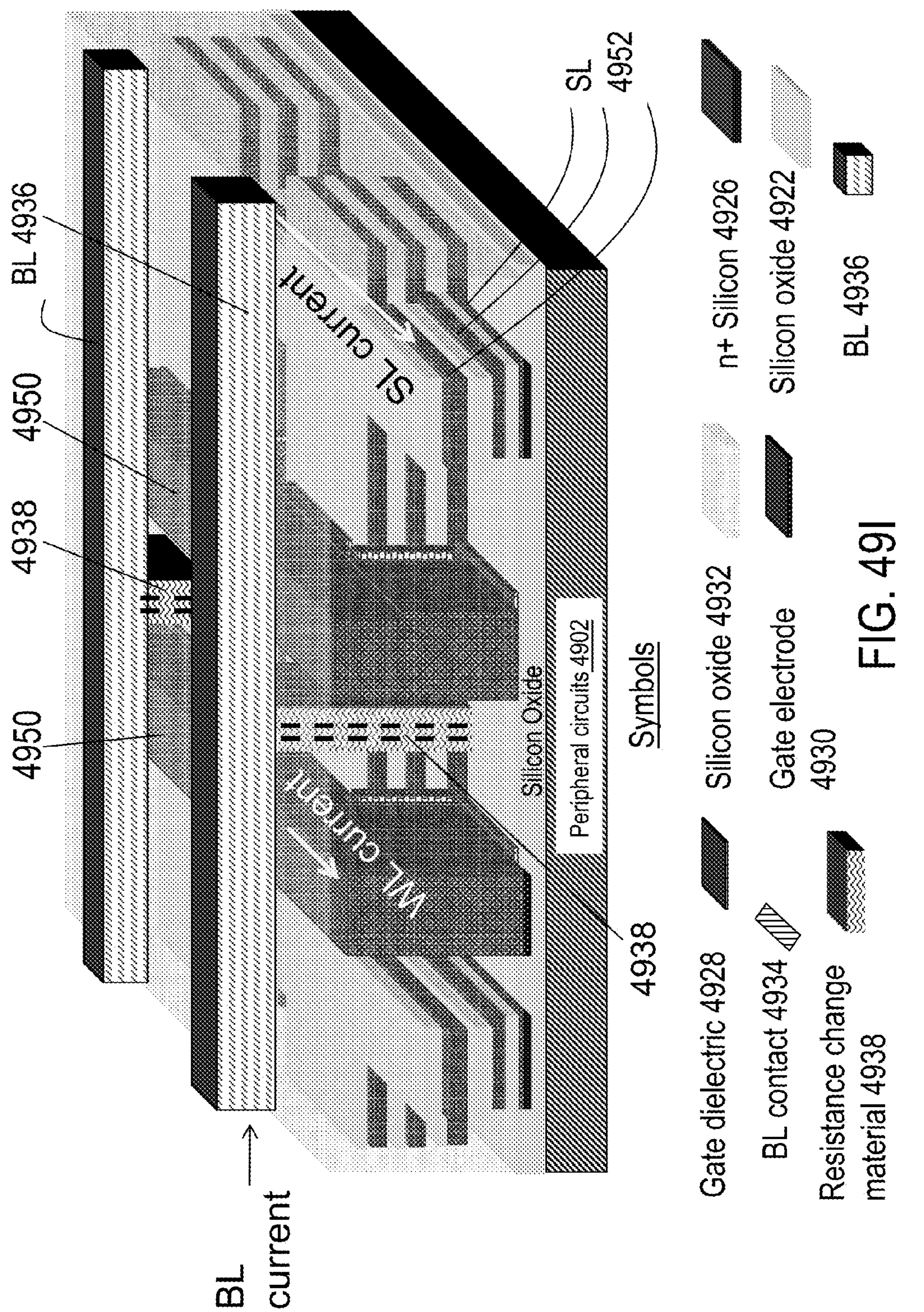

As illustrated in FIG. 49I, BL metal lines 4936 may be formed and connect to the associated BL contacts 4934 with resistive change material 4938. Contacts and associated metal interconnect lines (not shown) may be formed for the WL and SL at the memory array edges. A thru layer via 4960 (not shown) may be formed to electrically couple the BL, SL, and WL metallization to the acceptor substrate peripheral circuitry via an acceptor wafer metal connect pad 4980 (not shown).

Figure 49J:
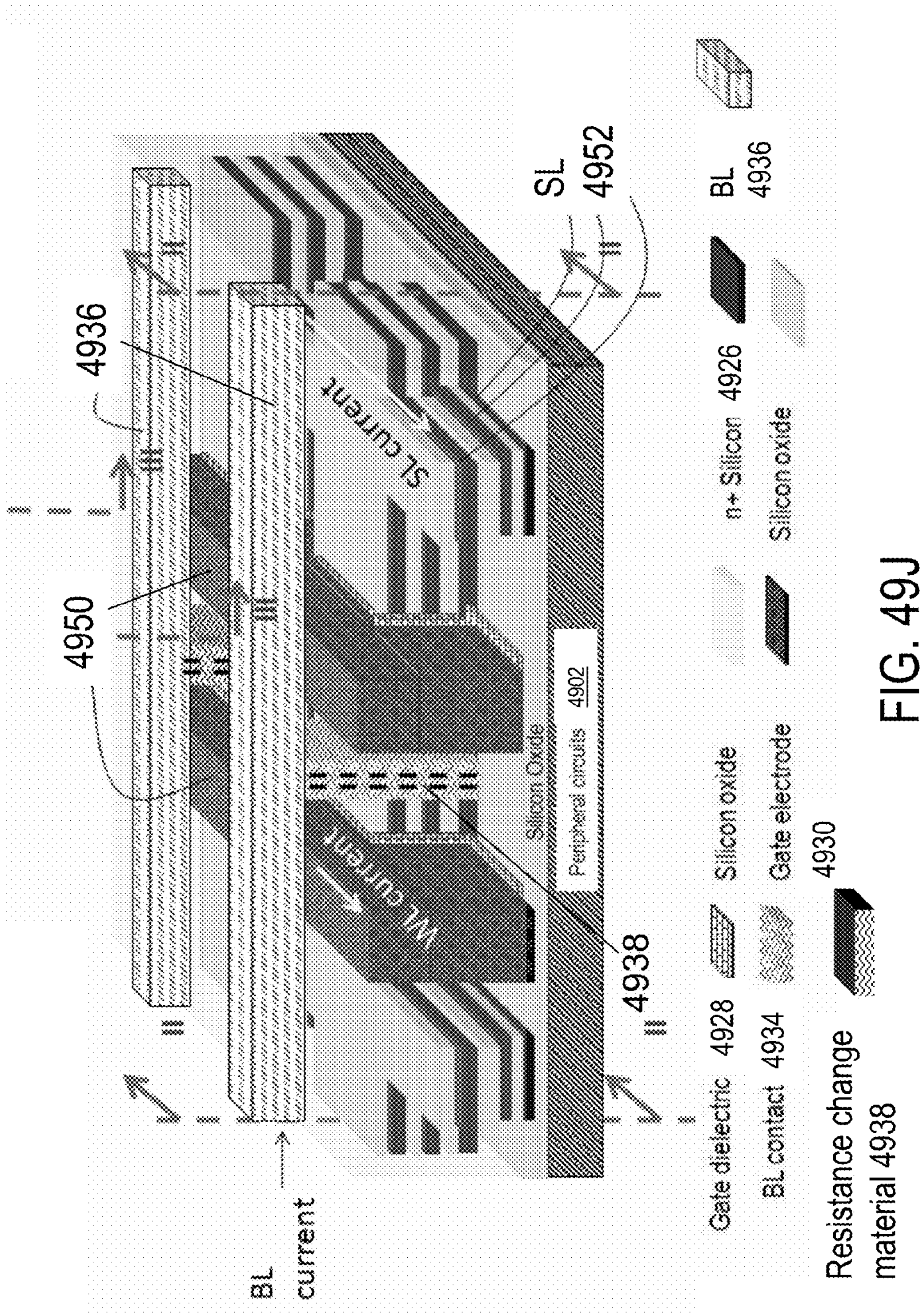
Figure 49K:
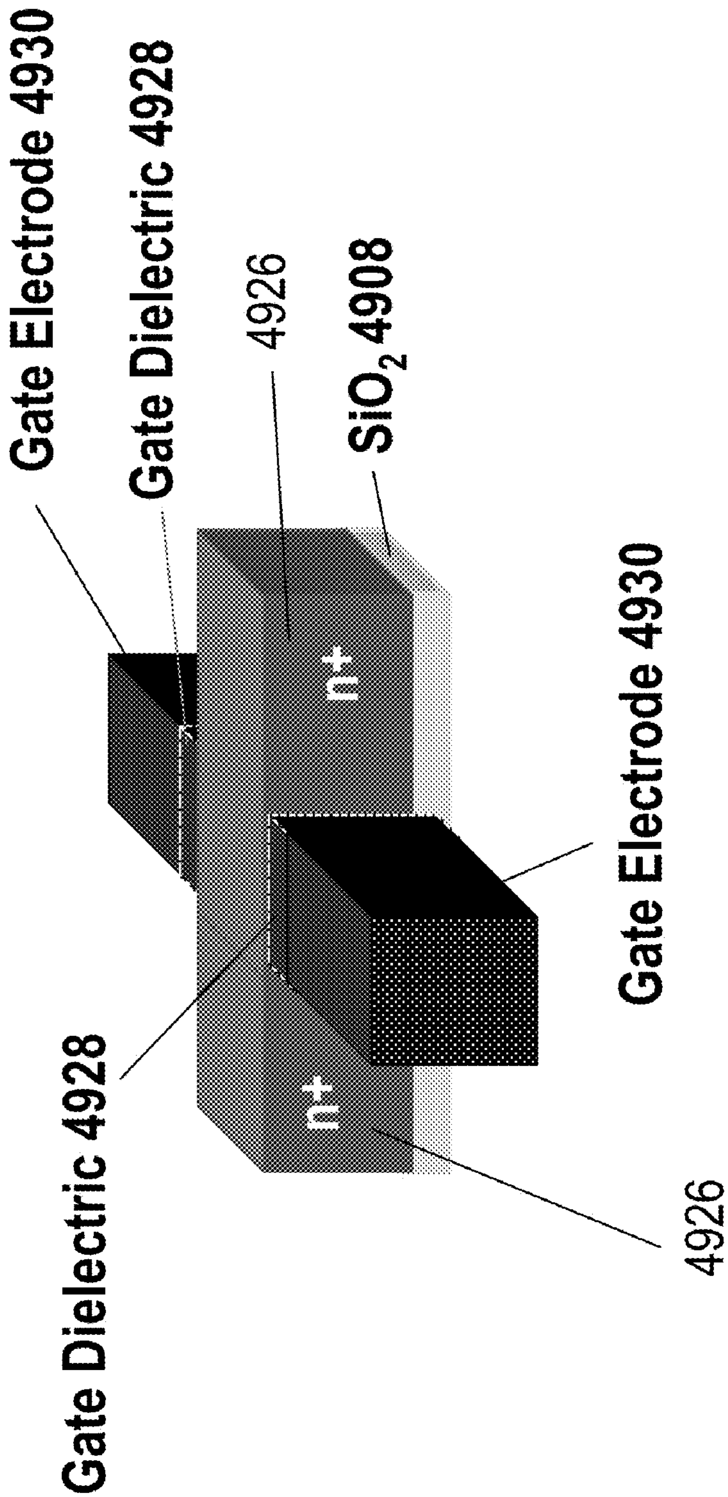

As illustrated in FIG. 49J, 49J1 and 49J2, cross section cut II of FIG. 49J is shown in FIG. 49J1, and cross section cut III of FIG. 49J is shown in FIG. 49J2. BL metal line 4936, oxide 4932, BL contact/electrode 4934, resistive change material 4938, WL regions 4950, gate dielectric 4928, crystallized N+ silicon regions 4926, and peripheral circuits substrate 4902 are shown in FIG. 49K1. The BL contact/electrode 4934 couples to one side of the three levels of resistive change material 4938. The other side of the resistive change material 4938 is coupled to crystallized N+ regions 4926. BL metal lines 4936, oxide 4932, gate electrode 4930, gate dielectric 4928, crystallized N+ silicon regions 4926, interlayer oxide region ('ox'), and peripheral circuits substrate 4902 are shown in FIG. 49K2. The gate electrode 4930 is common to substantially all six crystallized N+ silicon regions 4926 and forms six two-sided gated junction-less transistors as memory select transistors.

As illustrated in FIG. 49K, a single exemplary two-sided gated junction-less transistor on the first Si/SiO2 layer 4923 may be comprised of crystallized N+ silicon region 4926 (functioning as the source, drain, and transistor channel), and two gate electrodes 4930 with associated gate dielectrics 4928. The transistor is electrically isolated from beneath by oxide layer 4908.

This flow enables the formation of a resistance-based multi-layer or 3D memory array with zero additional masking steps per memory layer, which utilizes poly-crystalline silicon junction-less transistors and has a resistance-based memory element in series with a select transistor, and is constructed by layer transfers of wafer sized doped poly-crystalline silicon layers, and this 3D memory array may be connected to an underlying multi-metal layer semiconductor device.

Persons of ordinary skill in the art will appreciate that the illustrations in FIGS. 49A through 49K are exemplary only and are not drawn to scale. Such skilled persons will further appreciate that many variations are possible such as, for example, the RTAs and/or optical anneals of the N+ doped poly-crystalline or amorphous silicon layers 4906 as described for FIG. 49D may be performed after each Si/SiO2 layer is formed in FIG. 49C. Additionally, N+ doped poly-crystalline or amorphous silicon layer 4906 may be doped P+, or with a combination of dopants and other polysilicon network modifiers to enhance the RTA or optical annealing and subsequent crystallization and lower the N+ silicon layer 4916 resistivity. Moreover, the doping of each crystallized N+ layer may be slightly different to compensate for interconnect resistances. Further, each gate of the double gated 3D resistance based memory may be independently controlled for better control of the memory cell. Many other modifications within the scope of the invention will suggest themselves to such skilled persons after reading this specification. Thus the invention is to be limited only by the appended claims.

As illustrated in FIGS. 50A to 50J, an alternative embodiment of a resistance-based 3D memory with zero additional masking steps per memory layer may be constructed with methods that are suitable for 3D IC manufacturing. This 3D memory utilizes poly-crystalline silicon junction-less transistors that may have either a positive or a negative threshold voltage, a resistance-based memory element in series with a select or access transistor, and may have the periphery circuitry layer formed or layer transferred on top of the 3D memory array.

Figure 50A:
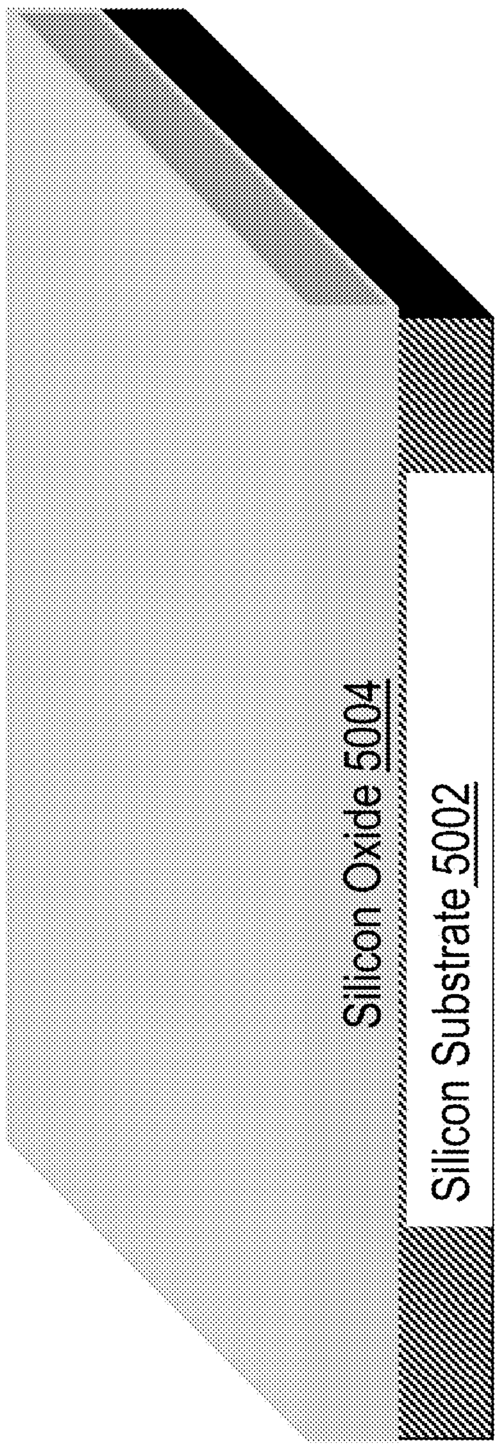
FIGS. 50A-J are exemplary drawing illustrations of the formation of a resistive memory transistor with periphery on top.

As illustrated in FIG. 50A, a silicon oxide layer 5004 may be deposited or grown on top of silicon substrate 5002.

Figure 50B:
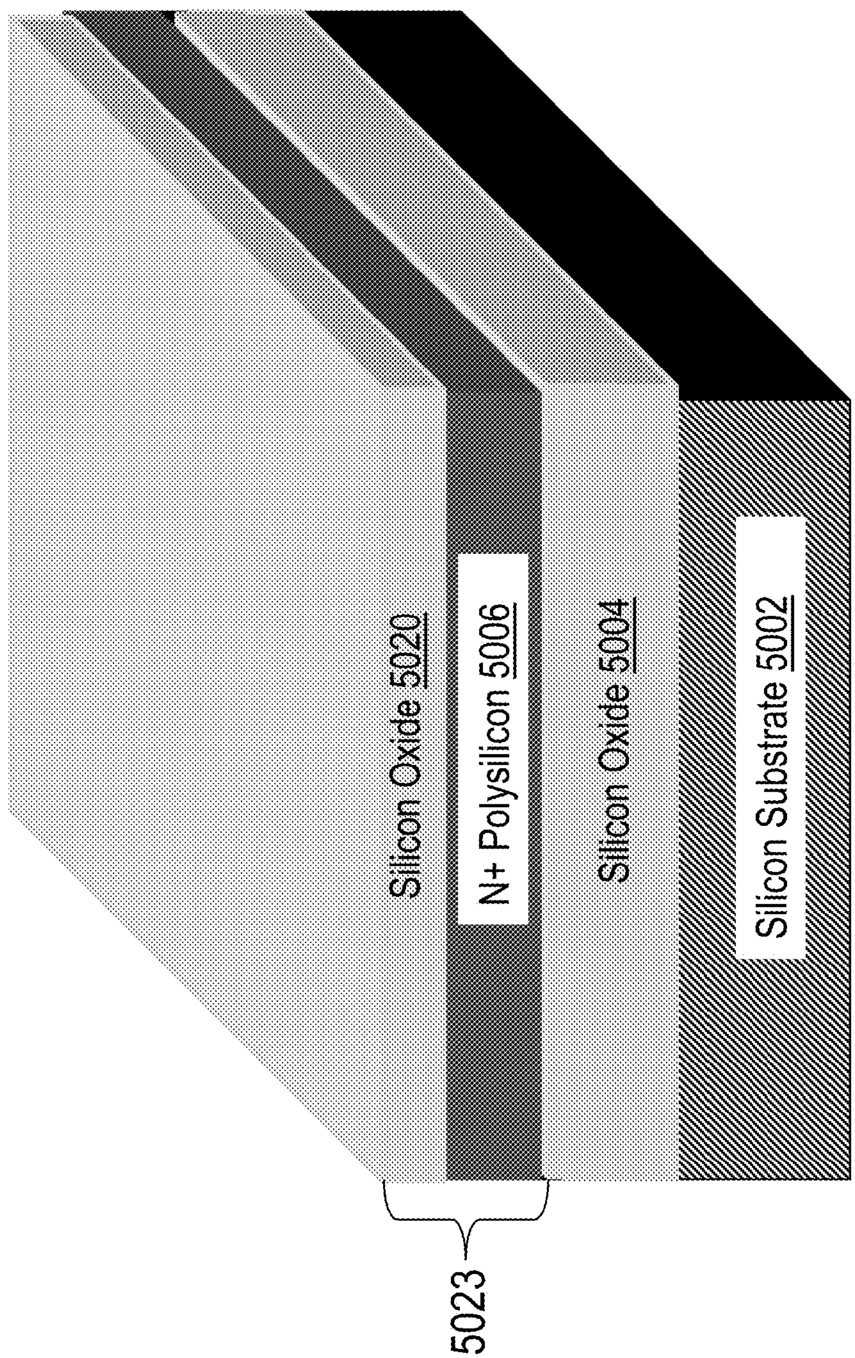

As illustrated in FIG. 50B, a layer of N+ doped poly-crystalline or amorphous silicon 5006 may be deposited. The amorphous silicon or poly-crystalline silicon layer 5006 may be deposited using a chemical vapor deposition process, such as, for example, LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 5020 may then be deposited or grown. This now forms the first Si/SiO2 layer 5023 which includes N+ doped poly-crystalline or amorphous silicon layer 5006 and silicon oxide layer 5020.

Figure 50C:
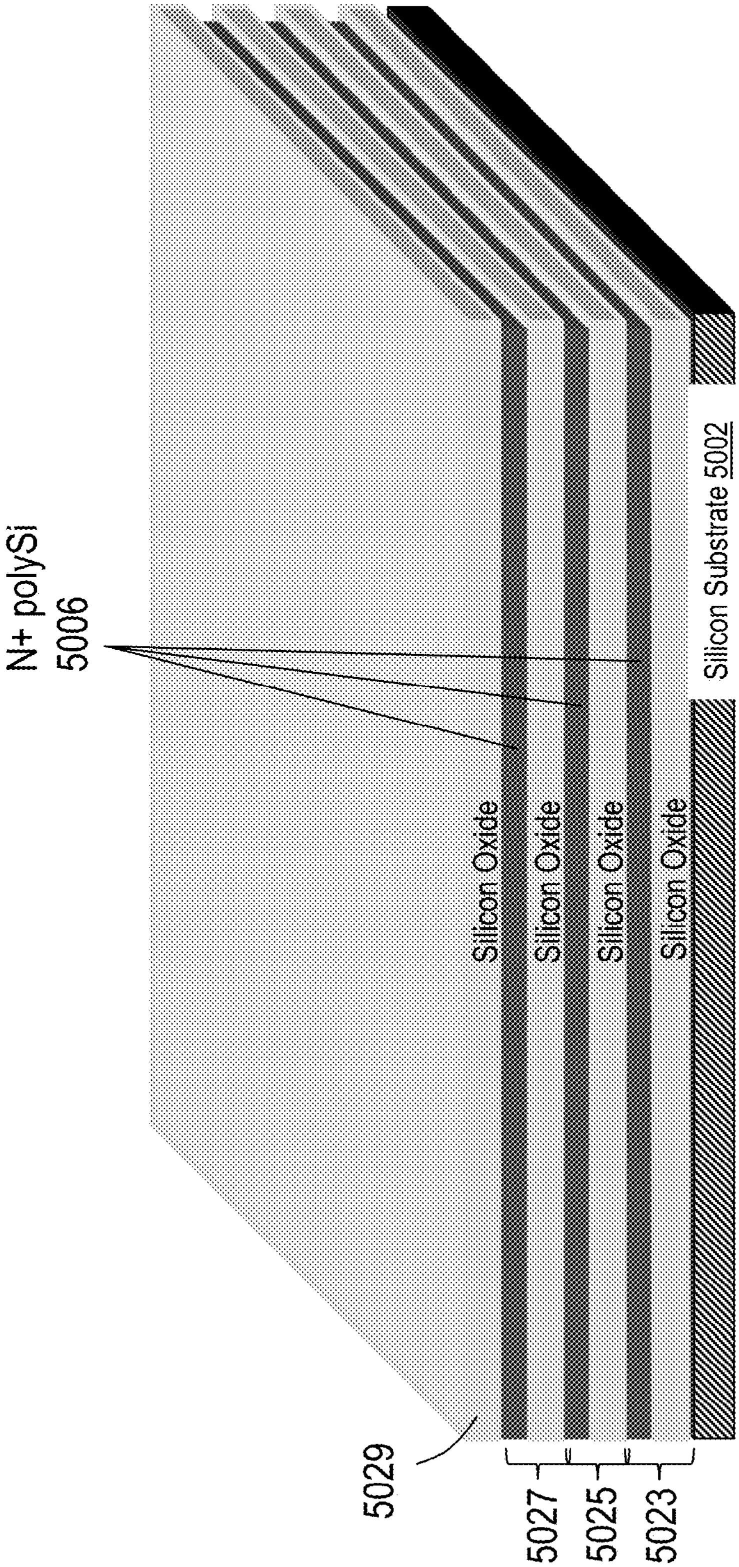

As illustrated in FIG. 50C, additional Si/SiO2 layers, such as, for example, second Si/SiO2 layer 5025 and third Si/SiO2 layer 5027, may each be formed as described in FIG. 50B. Oxide layer 5029 may be deposited to electrically isolate the top N+ doped poly-crystalline or amorphous silicon layer.

Figure 50D:
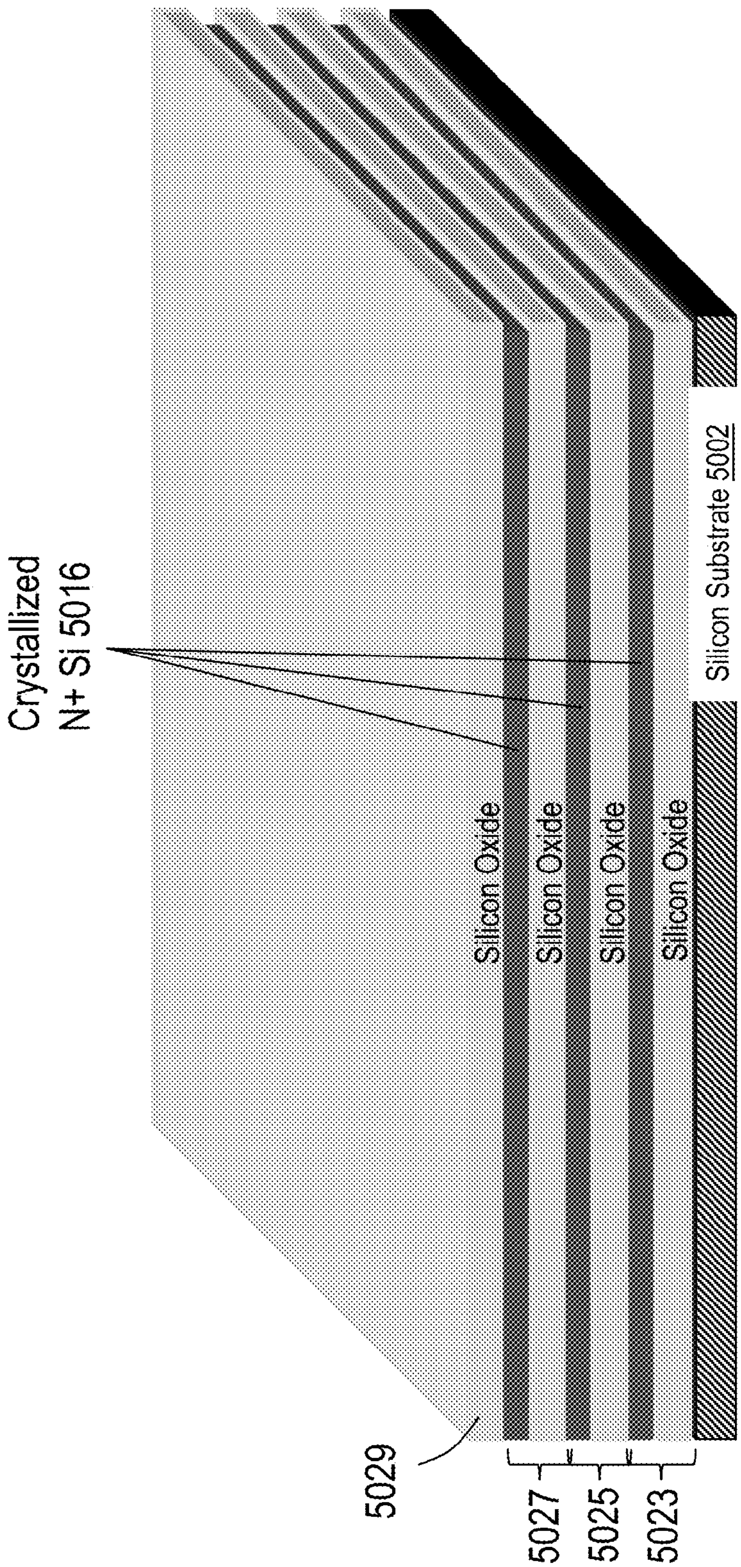

As illustrated in FIG. 50D, a Rapid Thermal Anneal (RTA) is conducted to crystallize the N+ doped poly-crystalline silicon or amorphous silicon layers 5006 of first Si/SiO2 layer 5023, second Si/SiO2 layer 5025, and third Si/SiO2 layer 5027, forming crystallized N+ silicon layers 5016. Alternatively, an optical anneal, such as, for example, a laser anneal, could be performed alone or in combination with the RTA or other annealing processes. Temperatures during this step could be as high as approximately 700° C., and could even be as high as 1400° C. Since there are no circuits or metallization underlying these layers of crystallized N+ silicon, very high temperatures (such as 1400° C.) can be used for the anneal process, leading to very good quality poly-crystalline silicon with few grain boundaries and very high carrier mobility approaching that of mono-crystalline silicon.

Figure 50E:
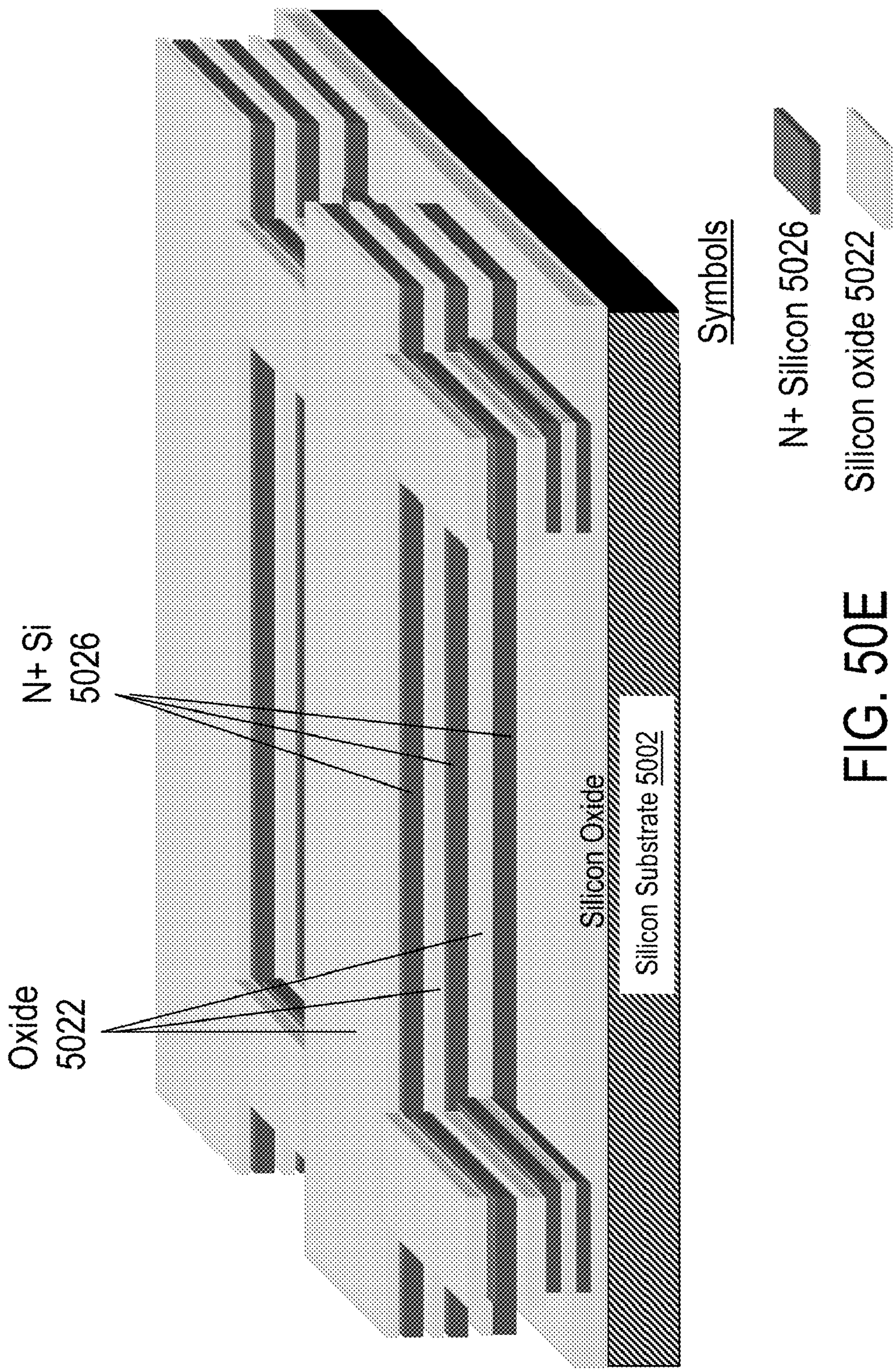

As illustrated in FIG. 50E, oxide 5029, third Si/SiO2 layer 5027, second Si/SiO2 layer 5025 and first Si/SiO2 layer 5023 may be lithographically defined and plasma/RIE etched to form a portion of the memory cell structure, which now comprises multiple layers of regions of crystallized N+ silicon 5026 (previously crystallized N+ silicon layers 5016) and oxide 5022.

Figure 50F:
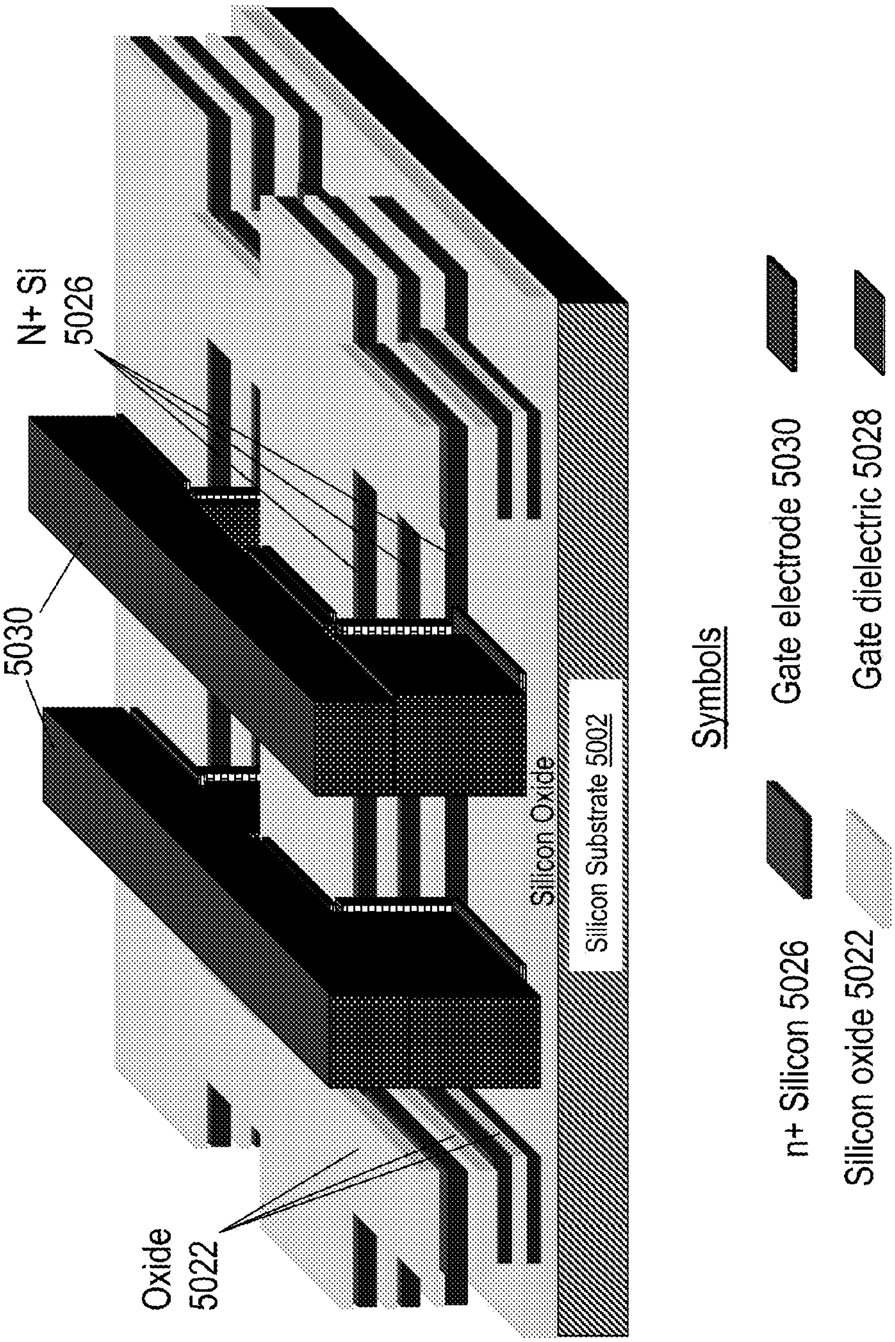

As illustrated in FIG. 50F, a gate dielectric and gate electrode material may be deposited, planarized with a chemical mechanical polish (CMP), and then lithographically defined and plasma/RIE etched to form gate dielectric regions 5028 which may either be self aligned to and substantially covered by gate electrodes 5030 (shown), or substantially cover the entire crystallized N+ silicon regions 5026 and oxide regions 5022 multi-layer structure. The gate stack comprised of gate electrode 5030 and gate dielectric 5028 may be formed with a gate dielectric, such as, for example, thermal oxide, and a gate electrode material, such as, for example, poly-crystalline silicon. Alternatively, the gate dielectric may be an atomic layer deposited (ALD) material that is paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 50G:
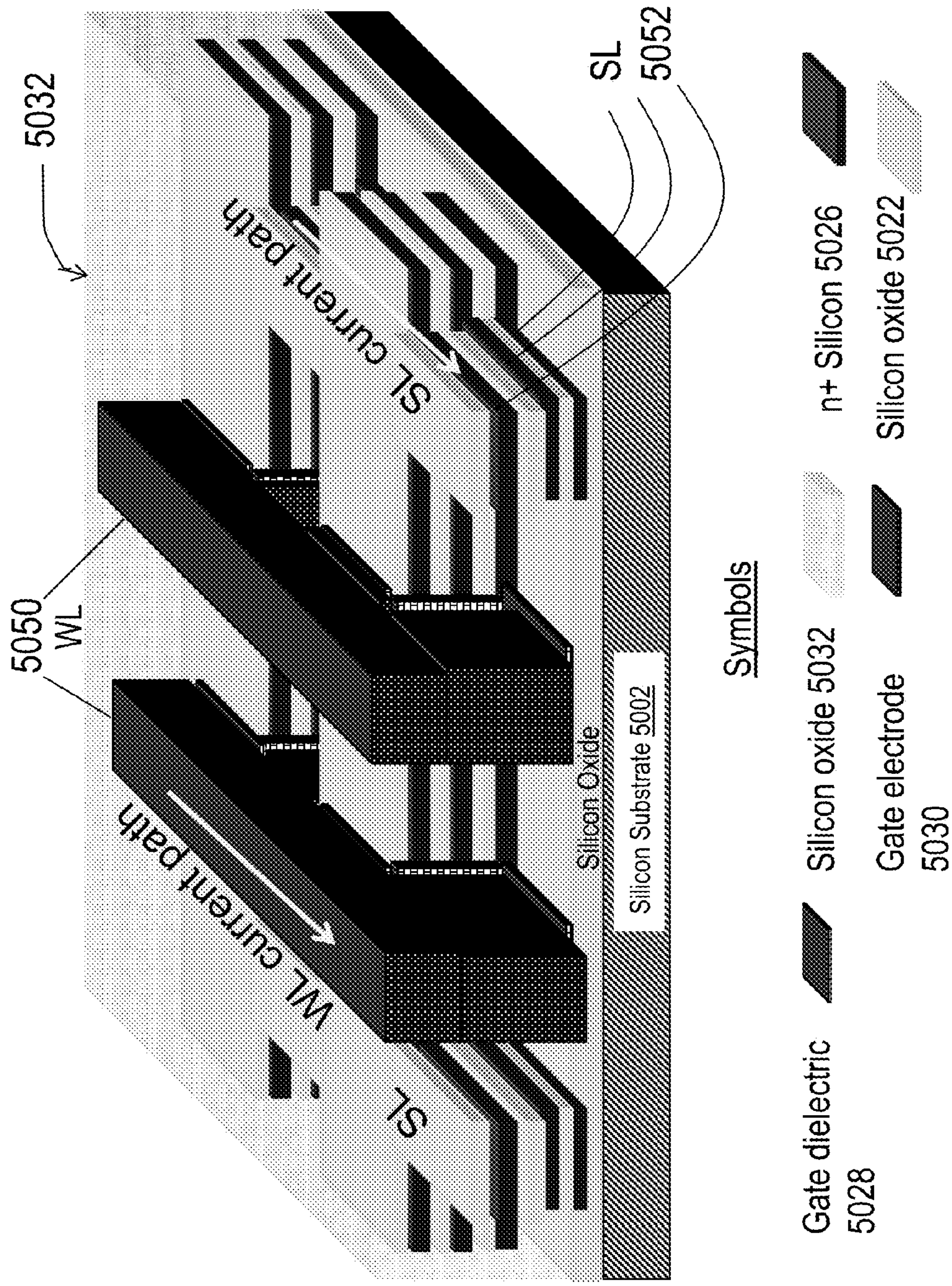

As illustrated in FIG. 50G, the entire structure may be substantially covered with a gap fill oxide 5032, which may be planarized with chemical mechanical polishing. The oxide 5032 is shown transparently in the figure for clarity. Word-line regions (WL) 5050, coupled with and composed of gate electrodes 5030, and source-line regions (SL) 5052, composed of crystallized N+ silicon regions 5026, are shown.

Figure 50H:
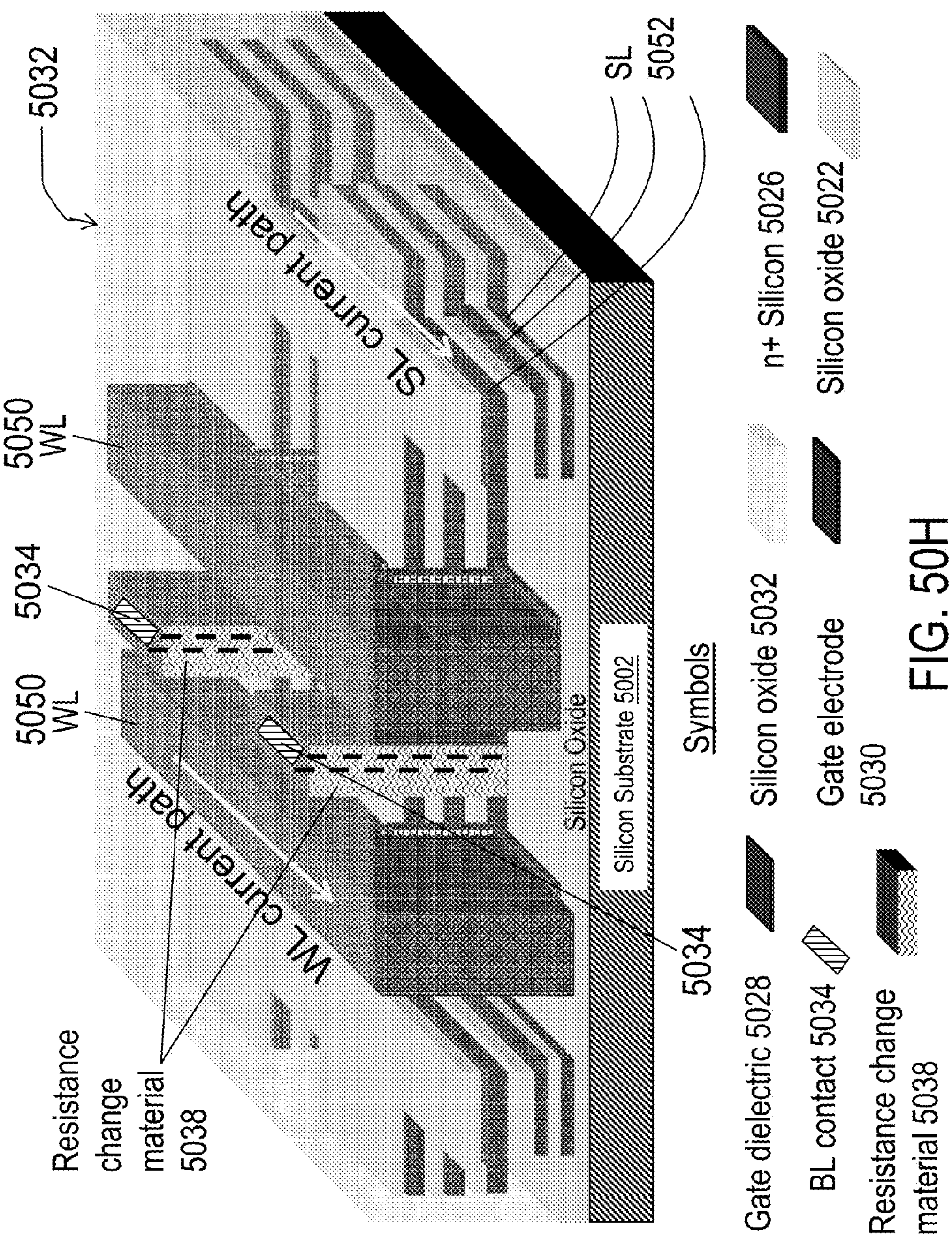

As illustrated in FIG. 50H, bit-line (BL) contacts 5034 may be lithographically defined, etched with plasma/RIE through oxide 5032, the three crystallized N+ silicon regions 5026, and associated oxide vertical isolation regions to connect substantially all memory layers vertically, and photoresist removed. Resistance change memory material 5038, such as, for example, hafnium oxides or titanium oxides, may then be deposited, preferably with atomic layer deposition (ALD). The electrode for the resistance change memory element may then be deposited by ALD to form the electrode/BL contact 5034. The excess deposited material may be polished to planarity at or below the top of oxide 5032. Each BL contact 5034 with resistive change material 5038 may be shared among substantially all layers of memory, shown as three layers of memory in FIG. 50H.

Figure 50I:
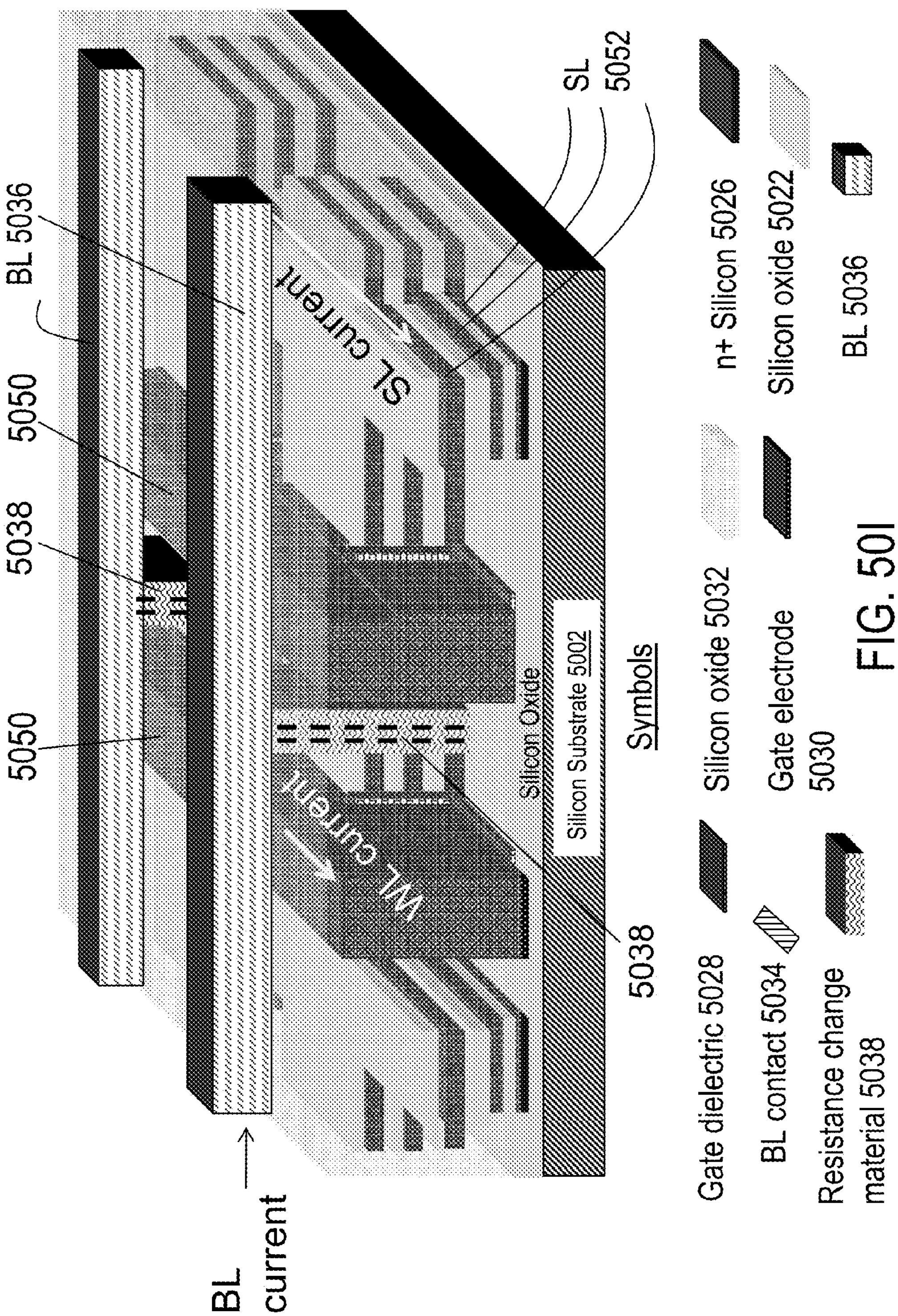

As illustrated in FIG. 50I, BL metal lines 5036 may be formed and connect to the associated BL contacts 5034 with resistive change material 5038. Contacts and associated metal interconnect lines (not shown) may be formed for the WL and SL at the memory array edges.

Figure 50J:
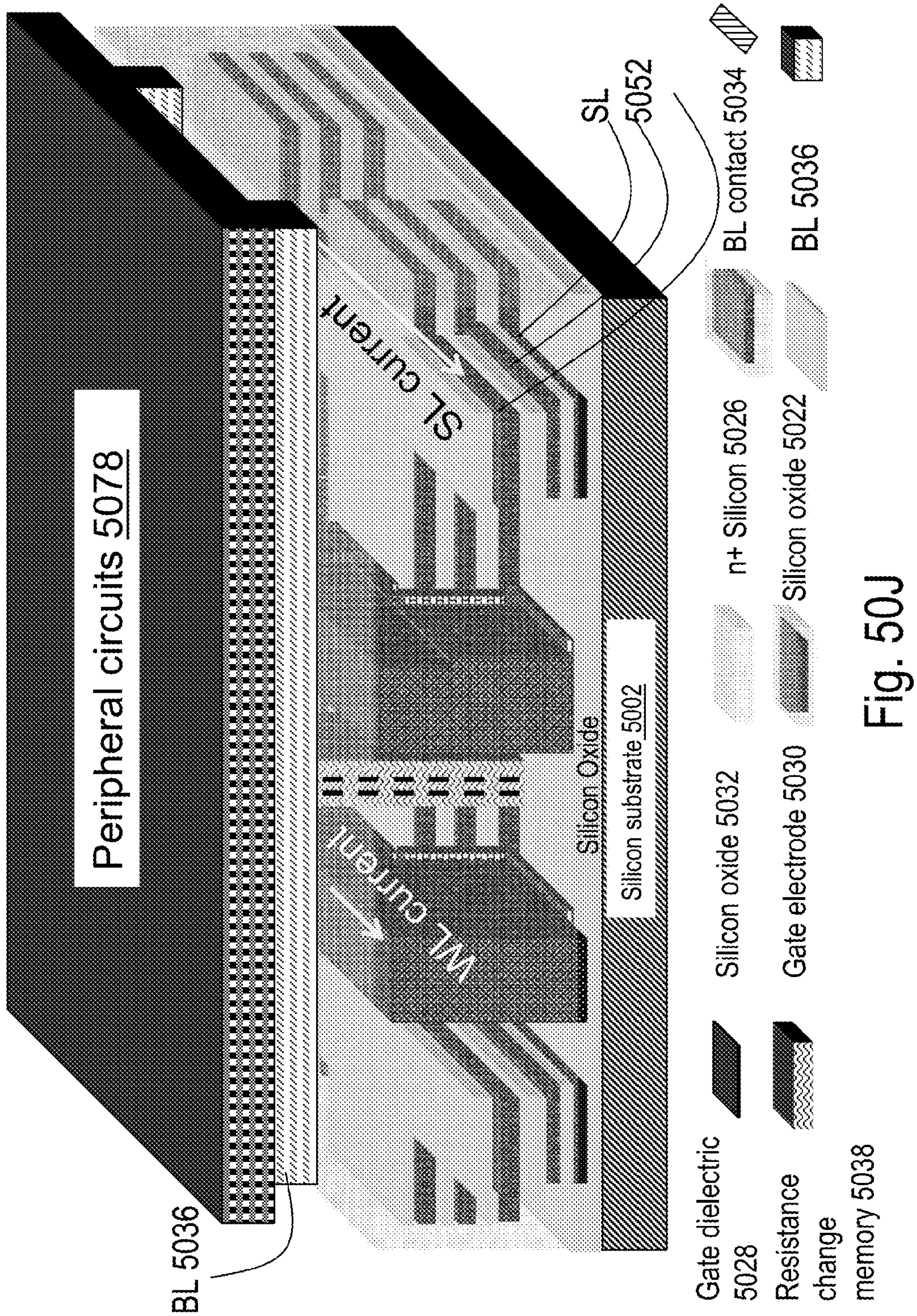

As illustrated in FIG. 50J, peripheral circuits 5078 may be constructed and then layer transferred, using methods described previously such as, for example, ion-cut with replacement gates, to the memory array, and then thru layer vias (not shown) may be formed to electrically couple the periphery circuitry to the memory array BL, WL, SL and other connections such as, for example, power and ground. Alternatively, the periphery circuitry may be formed and directly aligned to the memory array and silicon substrate 5002 utilizing the layer transfer of wafer sized doped layers and subsequent processing, for example, such as, for example, the junction-less, RCAT, V-groove, or bipolar transistor formation flows as previously described.

This flow enables the formation of a resistance-based multi-layer or 3D memory array with zero additional masking steps per memory layer, which utilizes poly-crystalline silicon junction-less transistors and has a resistance-based memory element in series with a select transistor, and is constructed by depositions of wafer sized doped poly-crystalline silicon and oxide layers, and this 3D memory array may be connected to an overlying multi-metal layer semiconductor device or periphery circuitry.

Persons of ordinary skill in the art will appreciate that the illustrations in FIGS. 50A through 50J are exemplary only and are not drawn to scale. Such skilled persons will further appreciate that many variations are possible such as, for example, the RTAs and/or optical anneals of the N+ doped poly-crystalline or amorphous silicon layers 5006 as described for FIG. 50D may be performed after each Si/SiO2 layer is formed in FIG. 50C. Additionally, N+ doped poly-crystalline or amorphous silicon layer 5006 may be doped P+, or with a combination of dopants and other polysilicon network modifiers to enhance the RTA or optical annealing crystallization and subsequent crystallization, and lower the N+ silicon layer 5016 resistivity. Moreover, the doping of each crystallized N+ layer may be slightly different to compensate for interconnect resistances. Further, each gate of the double gated 3D resistance based memory can be independently controlled for better control of the memory cell. Additionally, by proper choice of materials for memory layer transistors and memory layer wires (eg. by using tungsten and other materials that withstand high temperature processing for wiring), standard CMOS transistors may be processed at high temperatures (>700° C.) to form the periphery circuitry 5078. Many other modifications within the scope of the invention will suggest themselves to such skilled persons after reading this specification. Thus the invention is to be limited only by the appended claims.

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm employ nickel silicides to improve deep sub-micron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et. al., IMEC ESS Circuits, 2003; and "65 and 45-nm Devices—an Overview", D. James, Semicon West, July 2008, ctr 024377. To achieve the lowest nickel silicide contact and source/drain resistances, the nickel on silicon must be heated to at least 450° C.

Thus it may be desirable to enable low resistances for process flows in this document where the post layer transfer temperature exposures must remain under approximately 400° C. due to metallization, such as, for example, copper and aluminum, and low-k dielectrics being present. The example process flow forms a Recessed Channel Array Transistor (RCAT), but this or similar flows may be applied to other process flows and devices, such as, for example, S-RCAT, JLT, V-groove, JFET, bipolar, and replacement gate flows.

Figure 53A:
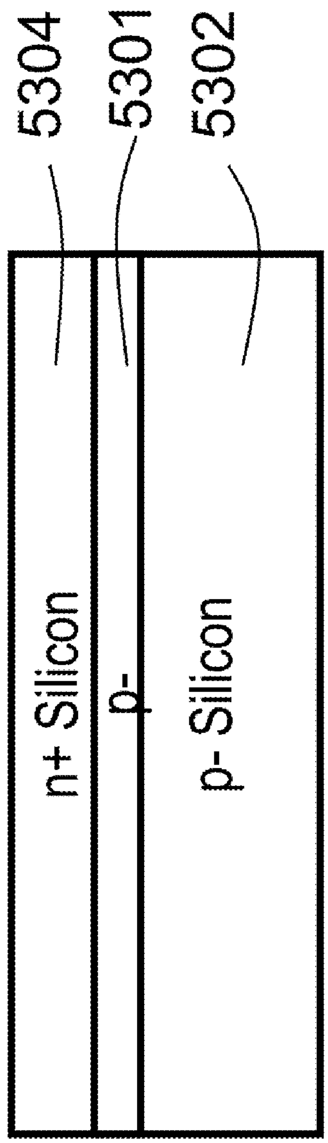
FIGS. 53A-I are exemplary drawing illustrations of the formation of a recessed channel array transistor with source and drain silicide.

A planar n-channel Recessed Channel Array Transistor (RCAT) with metal silicide source & drain contacts suitable for a 3D IC may be constructed. As illustrated in FIG. 53A, a P− substrate donor wafer 5302 may be processed to include wafer sized layers of N+ doping 5304, and P− doping 5301 across the wafer. The N+ doped layer 5304 may be formed by ion implantation and thermal anneal. In addition, P− doped layer 5301 may have additional ion implantation and anneal processing to provide a different dopant level than P− substrate 5302. P− doped layer 5301 may also have graded P− doping to mitigate transistor performance issues, such as, for example, short channel effects, after the RCAT is formed. The layer stack may alternatively be formed by successive epitaxially deposited doped silicon layers of P− doping 5301 and N+ doping 5304, or by a combination of epitaxy and implantation Annealing of implants and doping may utilize optical annealing techniques or types of Rapid Thermal Anneal (RTA or spike).

Figure 53B:
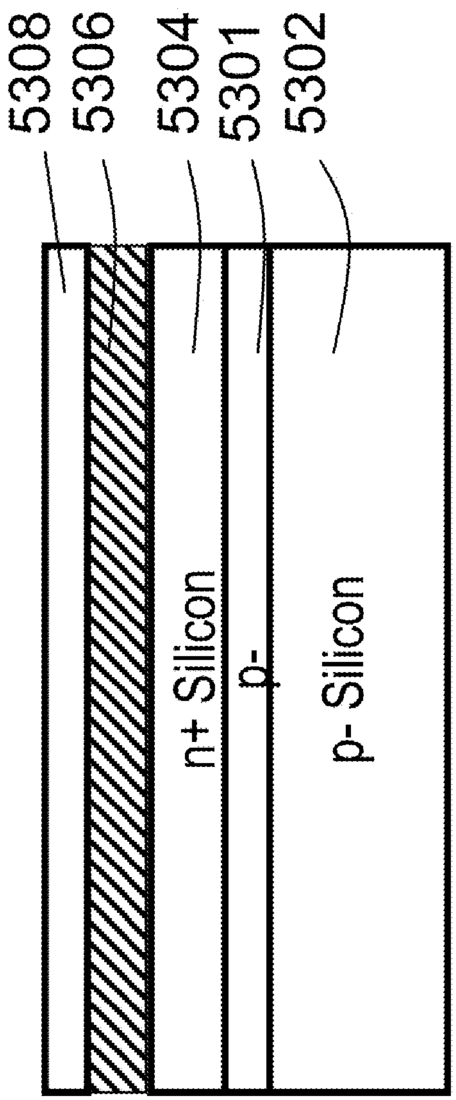

As illustrated in FIG. 53B, a silicon reactive metal, such as, for example, Nickel or Cobalt, may be deposited onto N+ doped layer 5304 and annealed, utilizing anneal techniques such as, for example, RTA, thermal, or optical, thus forming metal silicide layer 5306. The top surface of donor wafer 5301 may be prepared for oxide wafer bonding with a deposition of an oxide to form oxide layer 5308.

Figure 53C:
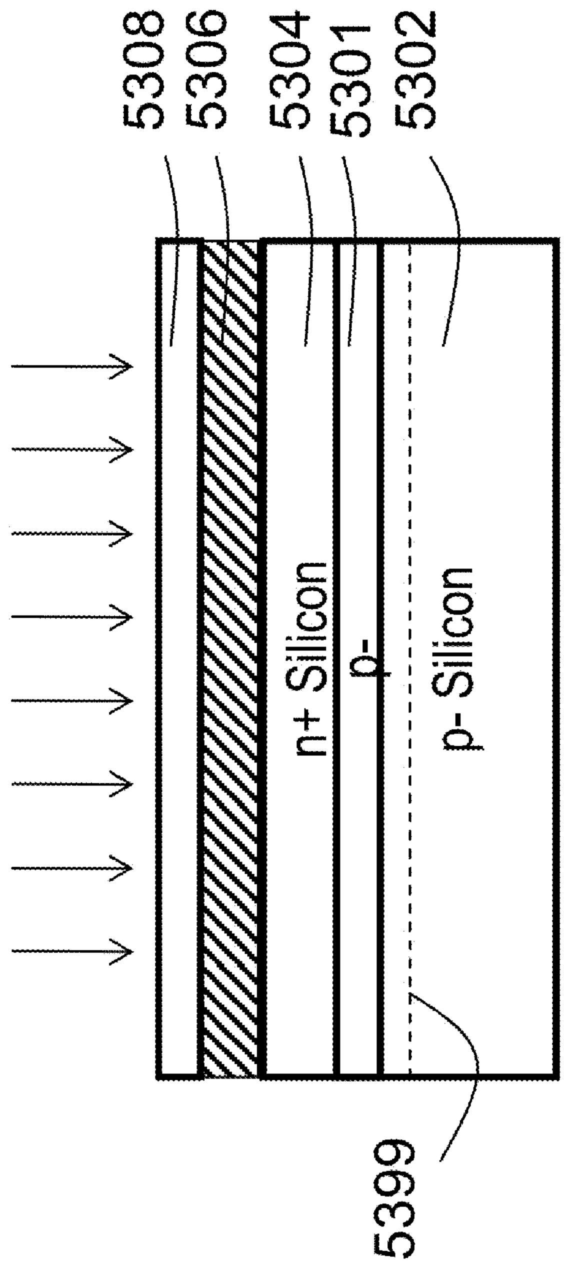

As illustrated in FIG. 53C, a layer transfer demarcation plane (shown as dashed line) 5399 may be formed by hydrogen implantation or other methods as previously described.

Figure 53D:
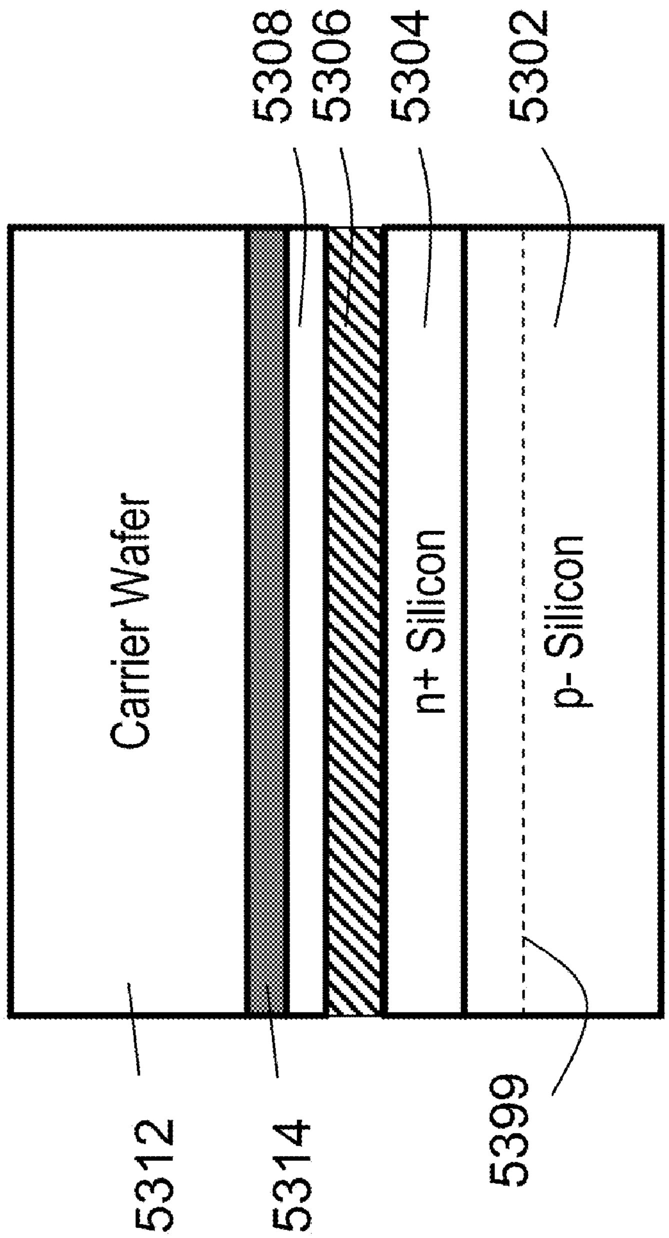
Figure 53E:
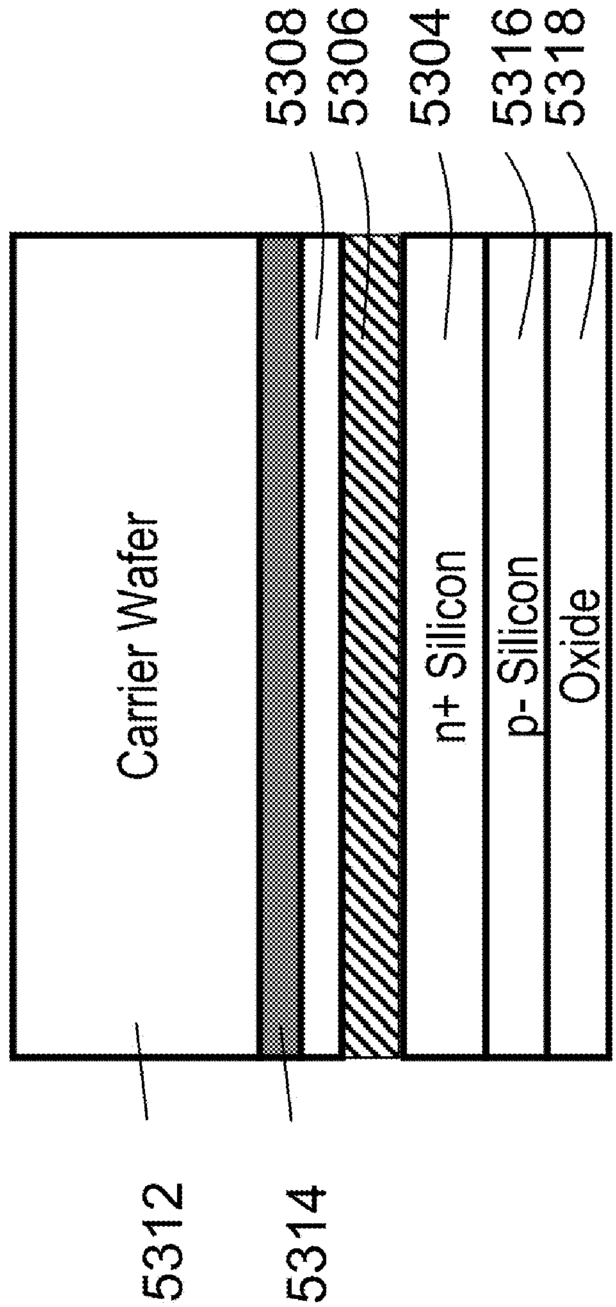

As illustrated in FIG. 53D donor wafer 5302 with layer transfer demarcation plane 5399, P− doped layer 5301, N+ doped layer 5304, metal silicide layer 5306, and oxide layer 5308 may be temporarily bonded to carrier or holder substrate 5312 with a low temperature process that may facilitate a low temperature release. The carrier or holder substrate 5312 may be a glass substrate to enable state of the art optical alignment with the acceptor wafer. A temporary bond between the carrier or holder substrate 5312 and the donor wafer 5302 may be made with a polymeric material, such as, for example, polyimide DuPont HD3007, which can be released at a later step by laser ablation, Ultra-Violet radiation exposure, or thermal decomposition, shown as adhesive layer 5314. Alternatively, a temporary bond may be made with uni-polar or bi-polar electrostatic technology such as, for example, the Apache tool from Beam Services Inc.

As illustrated in FIG. 133E, the portion of the donor wafer 5302 that is below the layer transfer demarcation plane 5399 may be removed by cleaving or other processes as previously described, such as, for example, ion-cut or other methods. The remaining donor wafer P− doped layer 5301 may be thinned by chemical mechanical polishing (CMP) so that the P− layer 5316 may be formed to the desired thickness. Oxide 5318 may be deposited on the exposed surface of P− layer 5316.

Figure 53F:
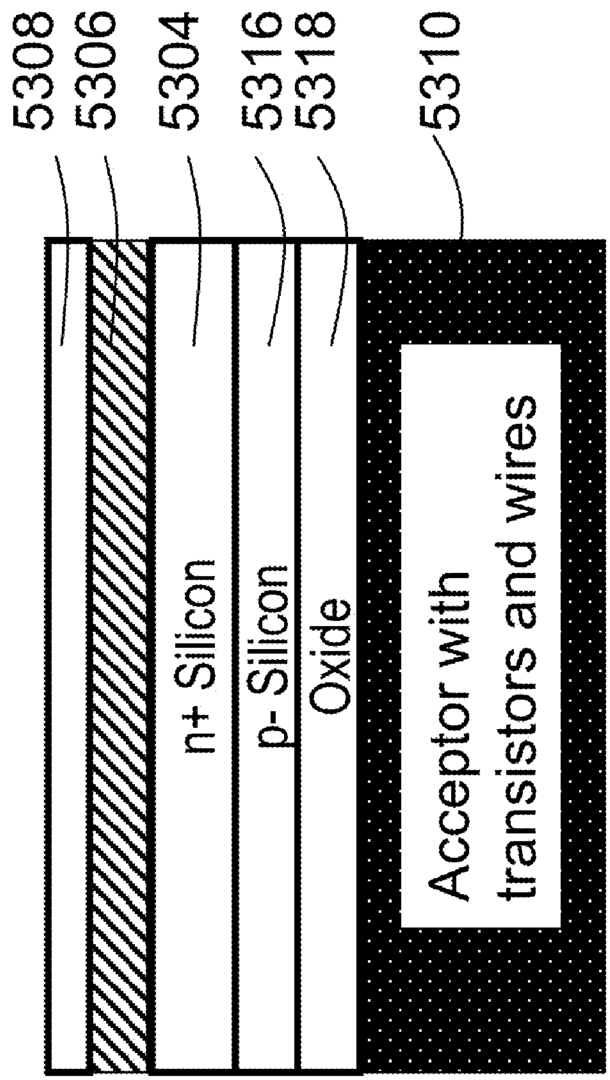

As illustrated in FIG. 53F, both the donor wafer 5302 and acceptor substrate or wafer 5310 may be prepared for wafer bonding as previously described and then low temperature (less than approximately 400° C.) aligned and oxide to oxide bonded. Acceptor substrate 5310, as described previously, may include, for example, transistors, circuitry, metal, such as, for example, aluminum or copper, interconnect wiring, and thru layer via metal interconnect strips or pads. The carrier or holder substrate 5312 may then be released using a low temperature process such as, for example, laser ablation. Oxide layer 5318, P− layer 5316, N+ doped layer 5304, metal silicide layer 5306, and oxide layer 5308 have been layer transferred to acceptor wafer 5310. The top surface of oxide 5308 may be chemically or mechanically polished. Now RCAT transistors are formed with low temperature (less than approximately 400° C.) processing and aligned to the acceptor wafer 5310 alignment marks (not shown).

Figure 53G:
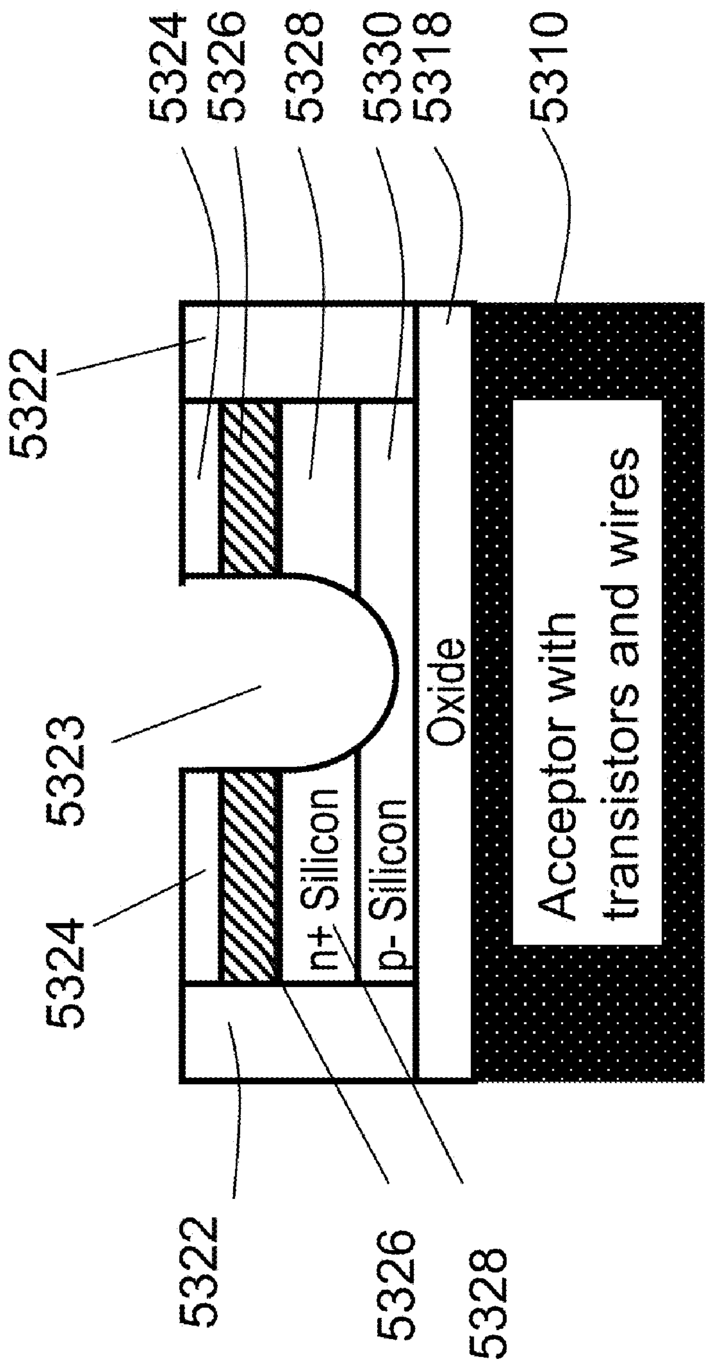

As illustrated in FIG. 53G, the transistor isolation regions 5322 may be formed by mask defining and then plasma/RIE etching oxide layer 5308, metal silicide layer 5306, N+ doped layer 5304, and P− layer 5316 to the top of oxide layer 5318. Then a low-temperature gap fill oxide may be deposited and chemically mechanically polished, with the oxide remaining in isolation regions 5322. Then the recessed channel 5323 may be mask defined and etched. The recessed channel surfaces and edges may be smoothed by wet chemical or plasma/RIE etching techniques to mitigate high field effects. These process steps form oxide regions 5324, metal silicide source and drain regions 5326, N+ source and drain regions 5328 and P− channel region 5330.

Figure 53H:
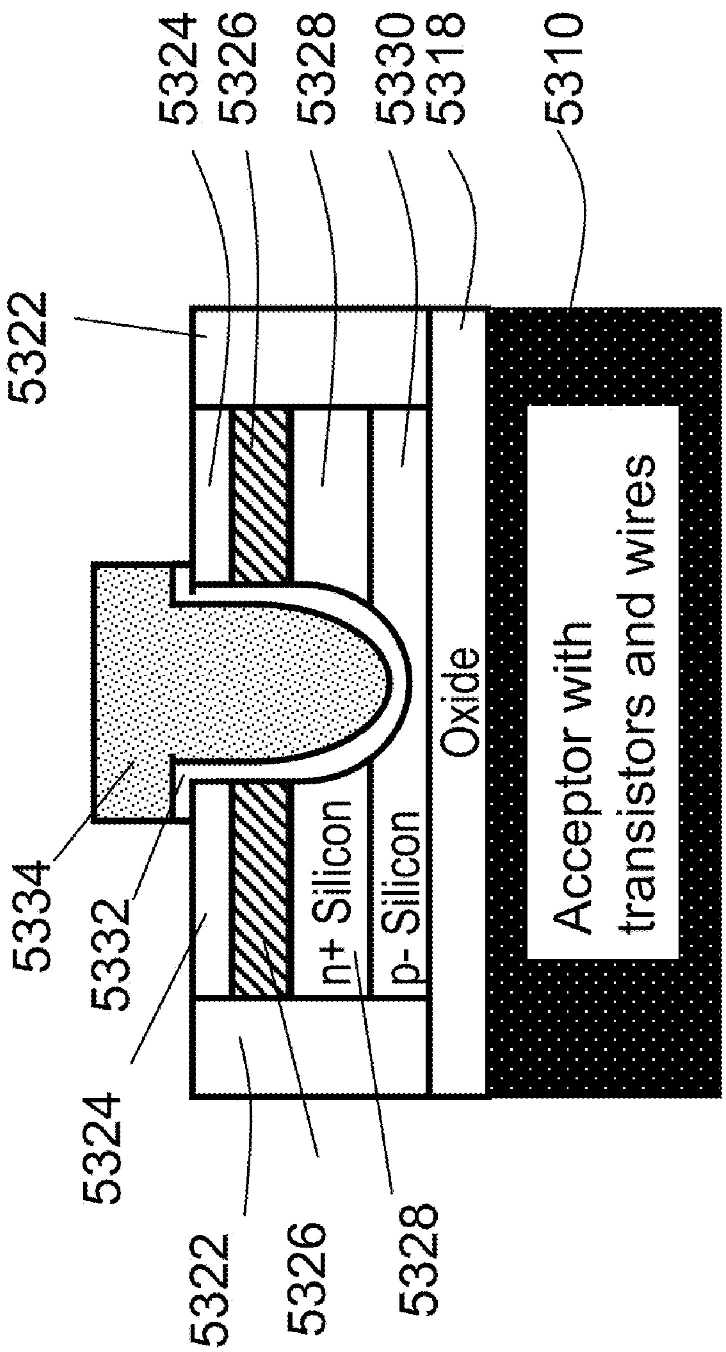

As illustrated in FIG. 53H, a gate dielectric 5332 may be formed and a gate metal material may be deposited. The gate dielectric 5332 may be an atomic layer deposited (ALD) gate dielectric that is paired with a work function specific gate metal in the industry standard high k metal gate process schemes described previously. Or the gate dielectric 5332 may be formed with a low temperature oxide deposition or low temperature microwave plasma oxidation of the silicon surfaces and then a gate material such as, for example, tungsten or aluminum may be deposited. Then the gate material may be chemically mechanically polished, and the gate area defined by masking and etching, thus forming gate electrode 5334.

Figure 53I:
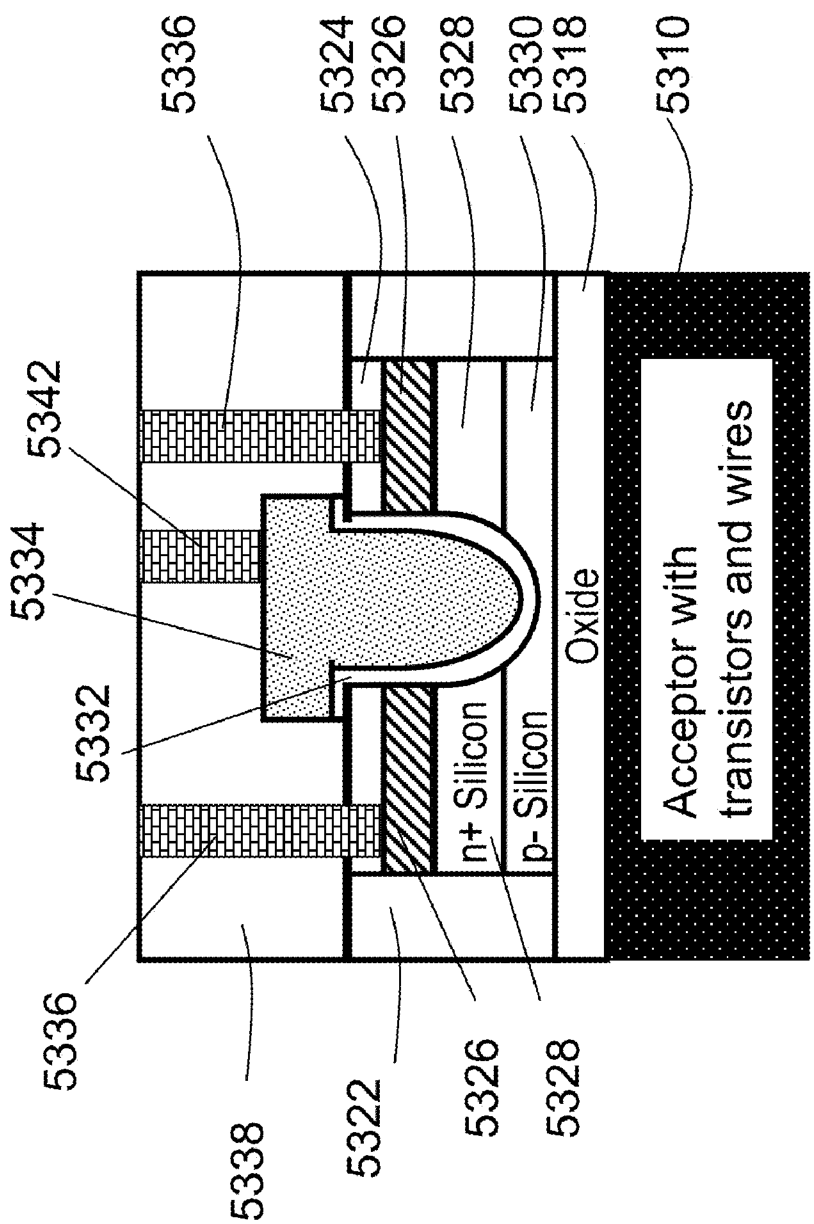

As illustrated in FIG. 53I, a low temperature thick oxide 5338 is deposited and source, gate, and drain contacts, and thru layer via (not shown) openings are masked and etched preparing the transistors to be connected via metallization. Thus gate contact 5342 connects to gate electrode 5334, and source & drain contacts 5336 connect to metal silicide source and drain regions 5326.

Persons of ordinary skill in the art will appreciate that the illustrations in FIGS. 53A through 53I are exemplary only and are not drawn to scale. Such skilled persons will further appreciate that many variations are possible such as, for example, the temporary carrier substrate may be replaced by a carrier wafer and a permanently bonded carrier wafer flow such as, for example, as described in FIG. 40 may be employed. Many other modifications within the scope of the invention will suggest themselves to such skilled persons after reading this specification. Thus the invention is to be limited only by the appended claims.

With the high density of layer to layer interconnection and the formation of memory devices & transistors that are enabled by some embodiments in this document, novel FPGA (Field Programmable Gate Array) programming architectures and devices may be employed to create cost, area, and performance efficient 3D FPGAs. The pass transistor, or switch, and the memory device that controls the ON or OFF state of the pass transistor may reside in separate layers and may be connected by thru layer vias (TLVs) to each other and the routing network metal lines, or the pass transistor and memory devices may reside in the same layer and TLVs may be utilized to connect to the network metal lines.

Figure 54A:
FIGS. 54A-F are exemplary drawing illustrations of a 3D IC FPGA process flow.

As illustrated in FIG. 54A, acceptor wafer 5400 may be processed to include logic circuits, analog circuits, and other devices, with metal interconnection and a metal configuration network to form the base FPGA. Acceptor wafer 5400 may also include configuration elements such as, for example, switches, pass transistors, memory elements, programming transistors, and may contain a foundation layer or layers as described previously.

Figure 54B:
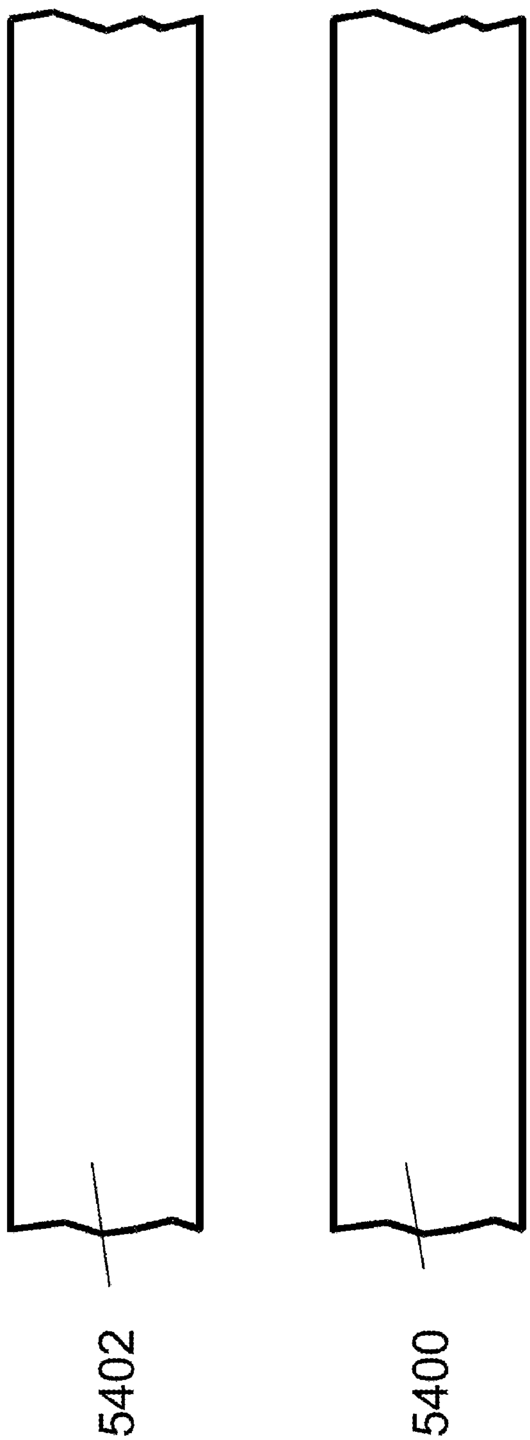

As illustrated in FIG. 54B, donor wafer 5402 may be preprocessed with a layer or layers of pass transistors or switches or partially formed pass transistors or switches. The pass transistors may be constructed utilizing the partial transistor process flows described previously, such as, for example, RCAT or JLT or others, or may utilize the replacement gate techniques, such as, for example, CMOS or CMOS N over P or gate array, with or without a carrier wafer, as described previously. Donor wafer 5402 and acceptor substrate 5400 and associated surfaces may be prepared for wafer bonding as previously described.

Figure 54C:
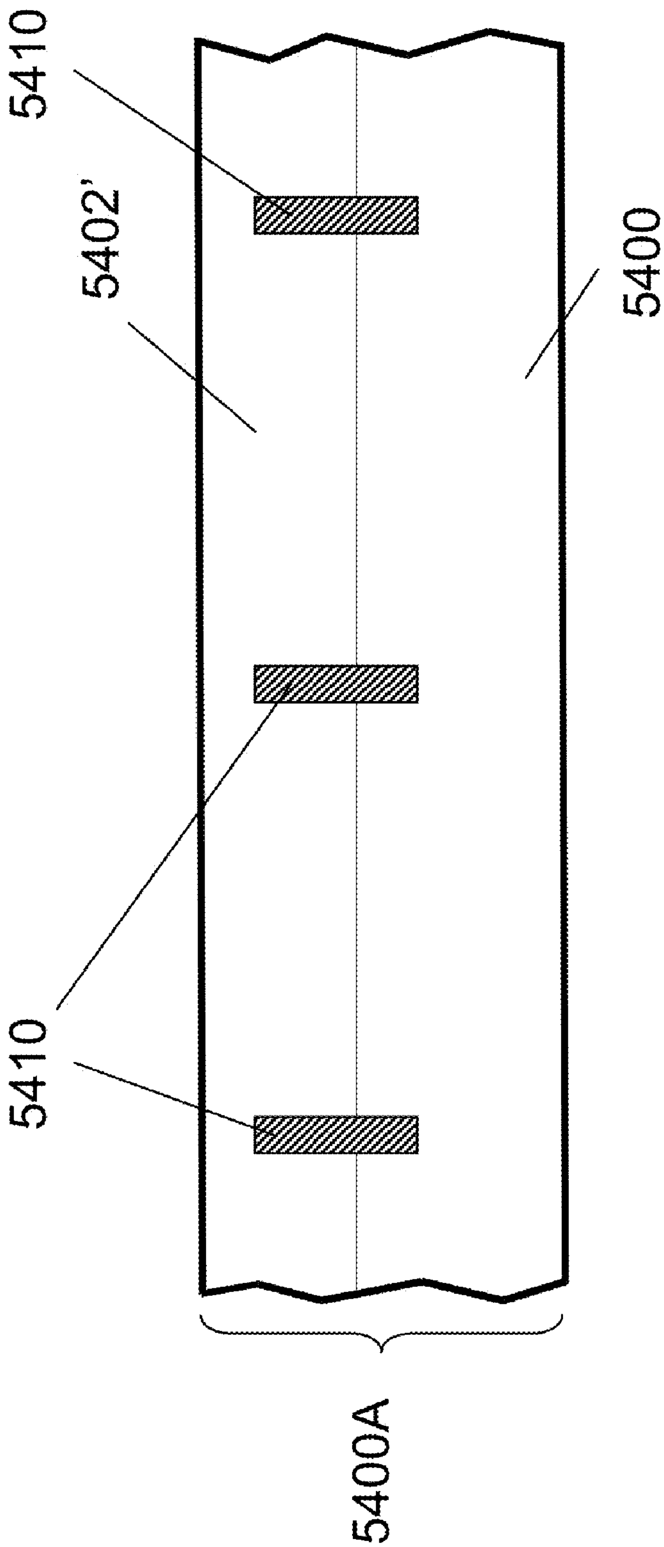

As illustrated in FIG. 54C, donor wafer 5402 and acceptor substrate 5400 may be bonded at a low temperature (less than approximately 400° C.) and a portion of donor wafer 5402 may be removed by cleaving and polishing, or other processes as previously described, such as, for example, ion-cut or other methods, thus forming the remaining pass transistor layer 5402'. Now transistors or portions of transistors may be formed or completed and may be aligned to the acceptor substrate 5400 alignment marks (not shown) as described previously. Thru layer vias (TLVs) 5410 may be formed as described previously and as well as interconnect and dielectric layers. Thus acceptor substrate with pass transistors 5400A may be formed, which may include acceptor substrate 5400, pass transistor layer 5402', and TLVs 5410.

Figure 54D:
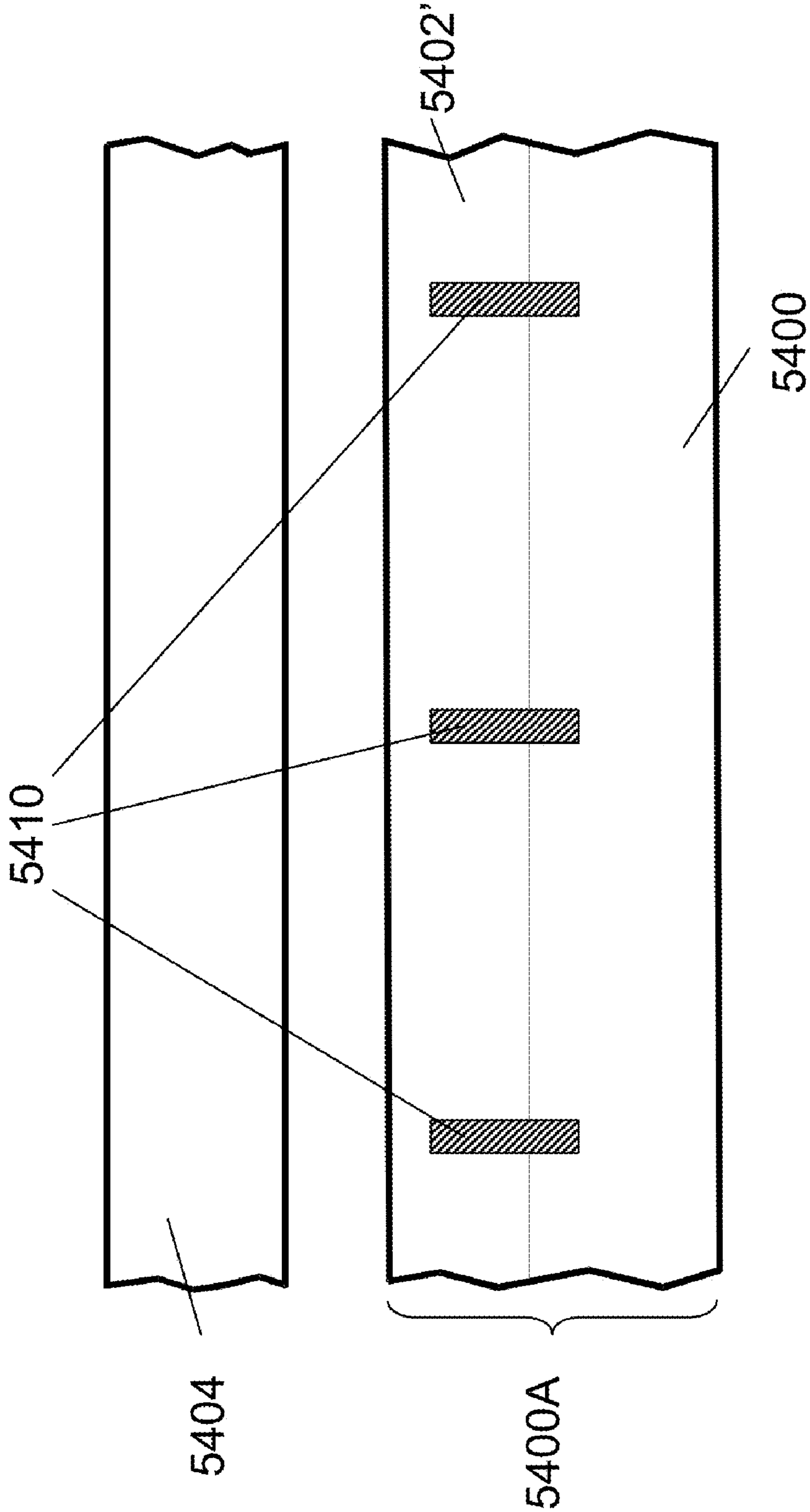

As illustrated in FIG. 54D, memory element donor wafer 5404 may be preprocessed with a layer or layers of memory elements or partially formed memory elements. The memory elements may be constructed utilizing the partial memory process flows described previously, such as, for example, RCAT DRAM, JLT, or others, or may utilize the replacement gate techniques, such as, for example, CMOS gate array to form SRAM elements, with or without a carrier wafer, as described previously, or may be constructed with non-volatile memory, such as, for example, R-RAM or FG Flash as described previously. Memory element donor wafer 5404 and acceptor substrate 5400A and associated surfaces may be prepared for wafer bonding as previously described.

Figure 54E:
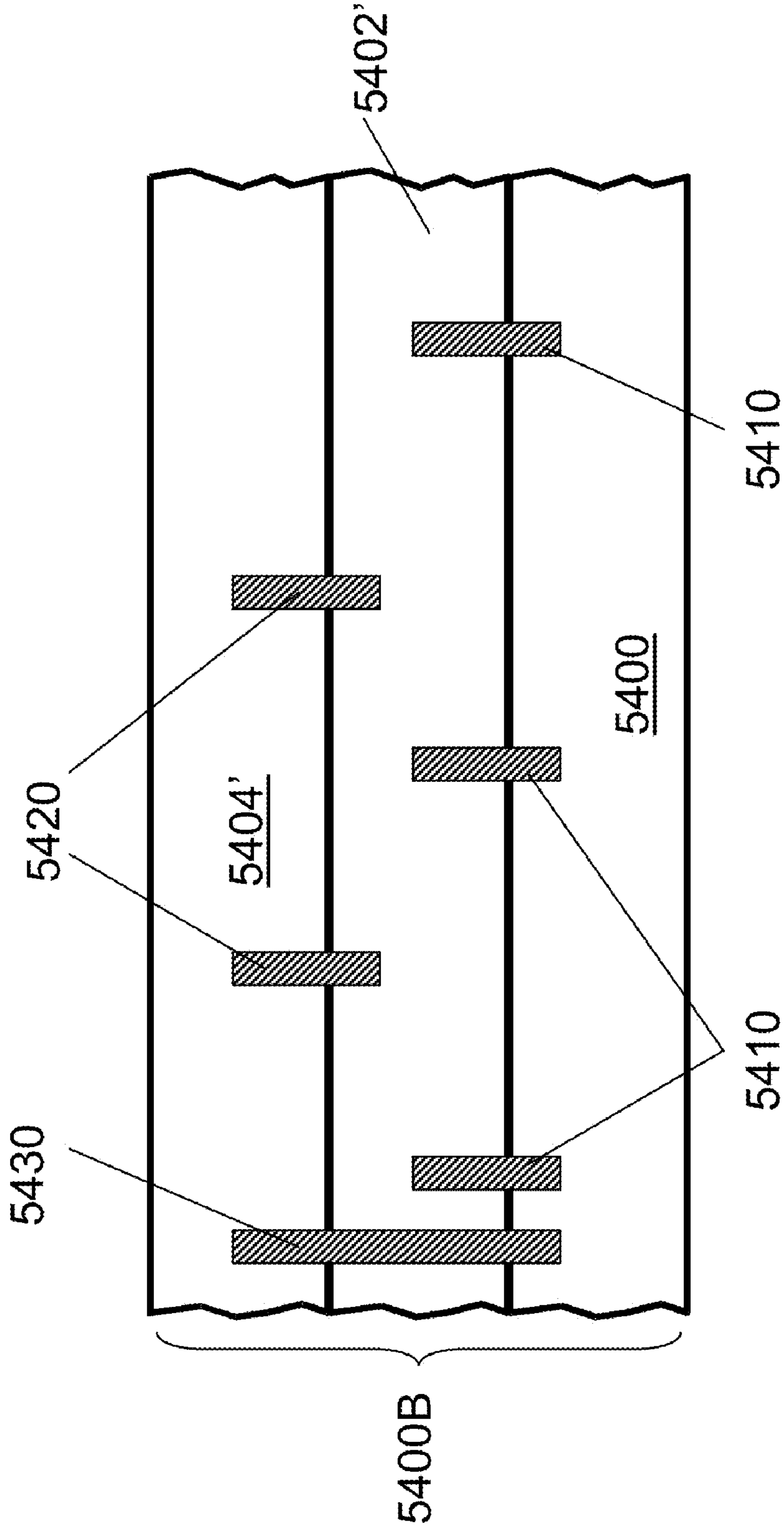

As illustrated in FIG. 54E, memory element donor wafer 5404 and acceptor substrate 5400A may be bonded at a low temperature (less than approximately 400° C.) and a portion of memory element donor wafer 5404 may be removed by cleaving and polishing, or other processes as previously described, such as, for example, ion-cut or other methods, thus forming the remaining memory element layer 5404'. Now memory elements & transistors or portions of memory elements & transistors may be formed or completed and may be aligned to the acceptor substrate 5400A alignment marks (not shown) as described previously. Memory to switch thru layer vias 5420 and memory to acceptor thru layer vias 5430 as well as interconnect and dielectric layers may be formed as described previously. Thus acceptor substrate with pass transistors and memory elements 5400B is formed, which may include acceptor substrate 5400, pass transistor layer 5402', TLVs 5410, memory to switch thru layer vias 5420, memory to acceptor thru layer vias 5430, and memory element layer 5404'.

Figure 54F:
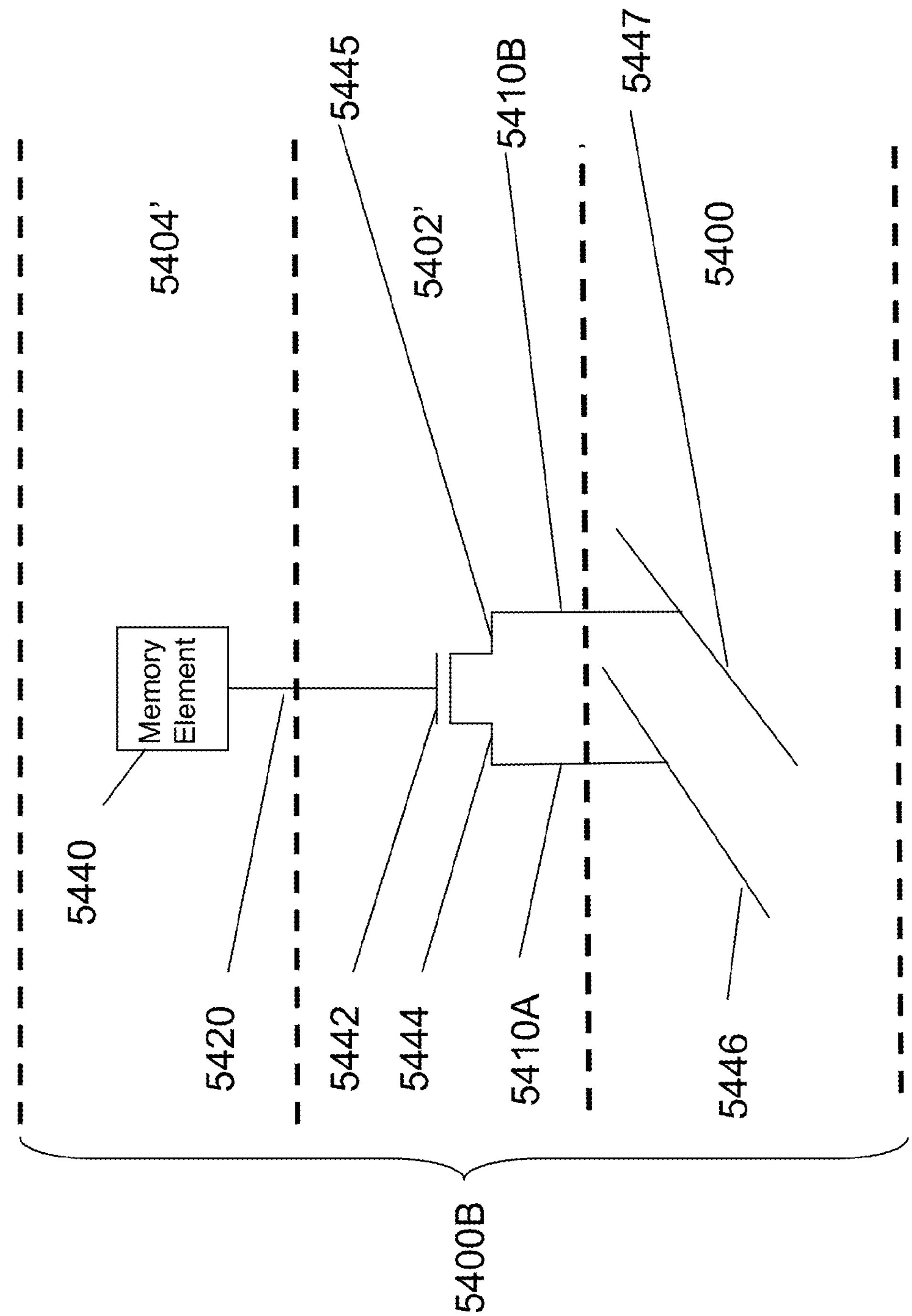

As illustrated in FIG. 54F, a simple schematic of important elements of acceptor substrate with pass transistors and memory elements 5400B is shown. An exemplary memory element 5440 residing in memory element layer 5404' may be electrically coupled to exemplary pass transistor gate 5442, residing in pass transistor layer 5402', with memory to switch thru layer vias 5420. The pass transistor source 5444, residing in pass transistor layer 5402', may be electrically coupled to FPGA configuration network metal line 5446, residing in acceptor substrate 5400, with TLV 5410A. The pass transistor drain 5445, residing in pass transistor layer 5402', may be electrically coupled to FPGA configuration network metal line 5447, residing in acceptor substrate 5400, with TLV 5410B. The memory element 5440 may be programmed with signals from off chip, or above, within, or below the memory element layer 5404'. The memory element 5440 may also include an inverter configuration, wherein one memory cell, such as, for example, a FG Flash cell, may couple the gate of the pass transistor to power supply Vcc if turned on, and another FG Flash device may couple the gate of the pass transistor to ground if turned on. Thus, FPGA configuration network metal line 5446, which may be carrying the output signal from a logic element in acceptor substrate 5400, may be electrically coupled to FPGA configuration network metal line 5447, which may route to the input of a logic element elsewhere in acceptor substrate 5430.

Persons of ordinary skill in the art will appreciate that the illustrations in FIGS. 54A through 54F are exemplary only and are not drawn to scale. Such skilled persons will further appreciate that many variations are possible such as, for example, the memory element layer 5404' may be constructed below pass transistor layer 5402'. Additionally, the pass transistor layer 5402' may include control and logic circuitry in addition to the pass transistors or switches. Moreover, the memory element layer 5404' may include control and logic circuitry in addition to the memory elements. Further, that the pass transistor element may instead be a transmission gate, or may be an active drive type switch. Many other modifications within the scope of the invention will suggest themselves to such skilled persons after reading this specification. Thus the invention is to be limited only by the appended claims.

Figure 55A:
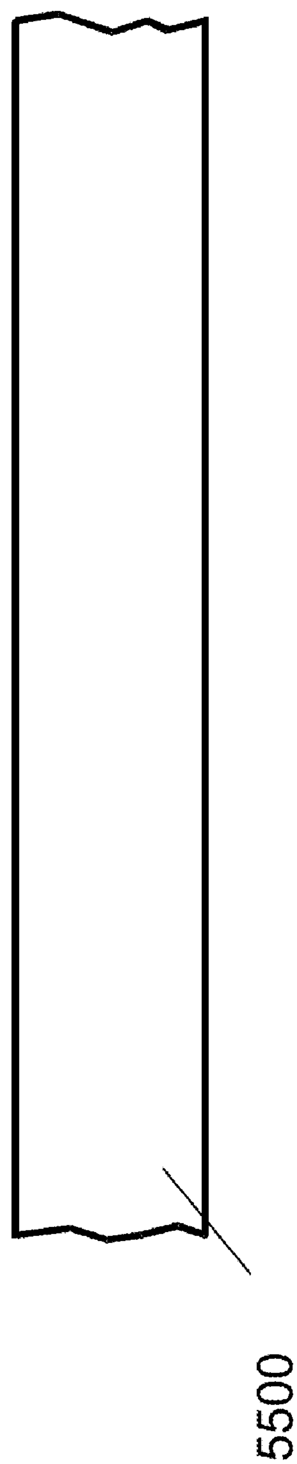
FIGS. 55A-D are exemplary drawing illustrations of an alternative 3D IC FPGA process flow.

The pass transistor, or switch, and the memory device that controls the ON or OFF state of the pass transistor may reside in the same layer and TLVs may be utilized to connect to the network metal lines. As illustrated in FIG. 55A, acceptor wafer 5500 may be processed to include logic circuits, analog circuits, and other devices, with metal interconnection and a metal configuration network to form the base FPGA. Acceptor wafer 5500 may also include configuration elements such as, for example, switches, pass transistors, memory elements, programming transistors, and may contain a foundation layer or layers as described previously.

Figure 55B:
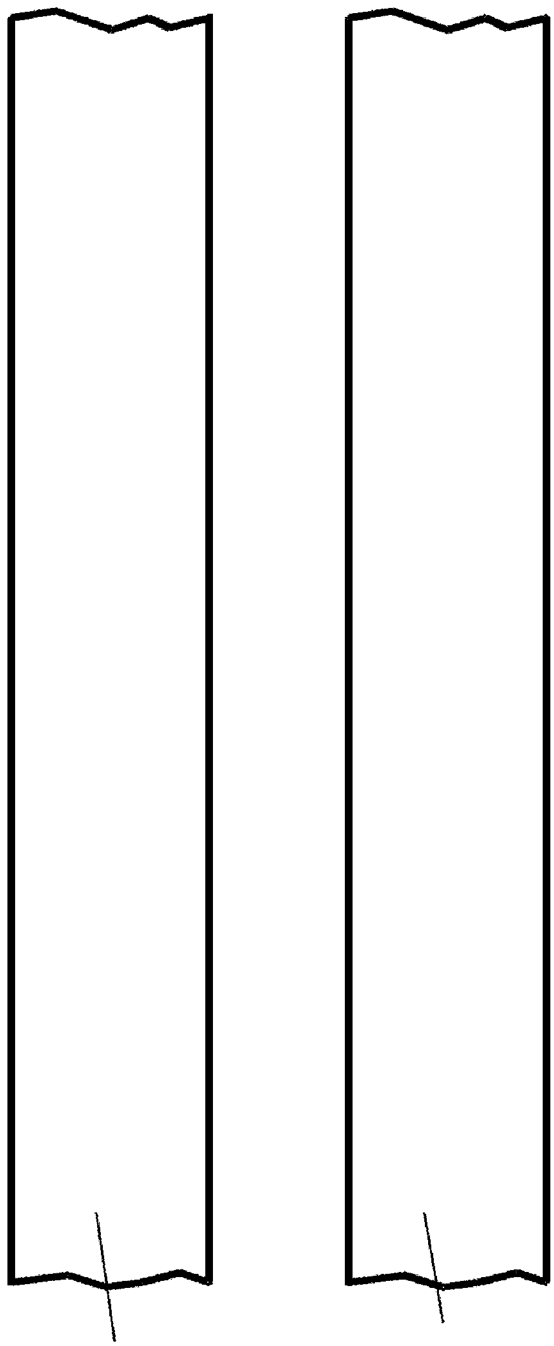

As illustrated in FIG. 55B, donor wafer 5502 may be preprocessed with a layer or layers of pass transistors or switches or partially formed pass transistors or switches. The pass transistors may be constructed utilizing the partial transistor process flows described previously, such as, for example, RCAT or JLT or others, or may utilize the replacement gate techniques, such as, for example, CMOS or CMOS N over P or CMOS gate array, with or without a carrier wafer, as described previously. Donor wafer 5502 may be preprocessed with a layer or layers of memory elements or partially formed memory elements. The memory elements may be constructed utilizing the partial memory process flows described previously, such as, for example, RCAT DRAM or others, or may utilize the replacement gate techniques, such as, for example, CMOS gate array to form SRAM elements, with or without a carrier wafer, as described previously. The memory elements may be formed simultaneously with the pass transistor, for example, such as, for example, by utilizing a CMOS gate array replacement gate process where a CMOS pass transistor and an SRAM memory element, such as a 6-transistor memory cell, may be formed, or an RCAT pass transistor formed with an RCAT DRAM memory. Donor wafer 5502 and acceptor substrate 5500 and associated surfaces may be prepared for wafer bonding as previously described.

Figure 55C:
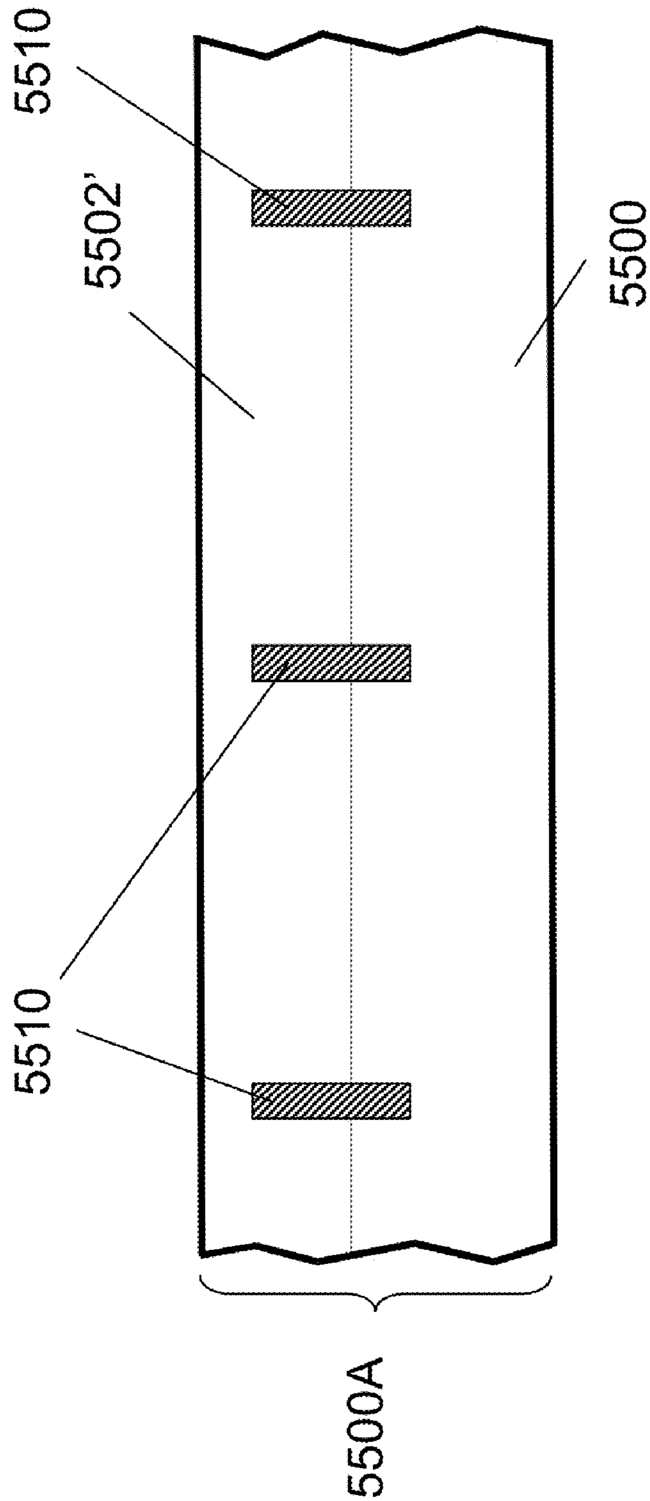

As illustrated in FIG. 55C, donor wafer 5502 and acceptor substrate 5500 may be bonded at a low temperature (less than approximately 400° C.) and a portion of donor wafer 5502 may be removed by cleaving and polishing, or other processes as previously described, such as, for example, ion-cut or other methods, thus forming the remaining pass transistor & memory layer 5502'. Now transistors or portions of transistors and memory elements may be formed or completed and may be aligned to the acceptor substrate 5500 alignment marks (not shown) as described previously. Thru layer vias (TLVs) 5510 may be formed as described previously. Thus acceptor substrate with pass transistors & memory elements 5500A is formed, which may include acceptor substrate 5500, pass transistor & memory element layer 5502', and TLVs 5510.

Figure 55D:
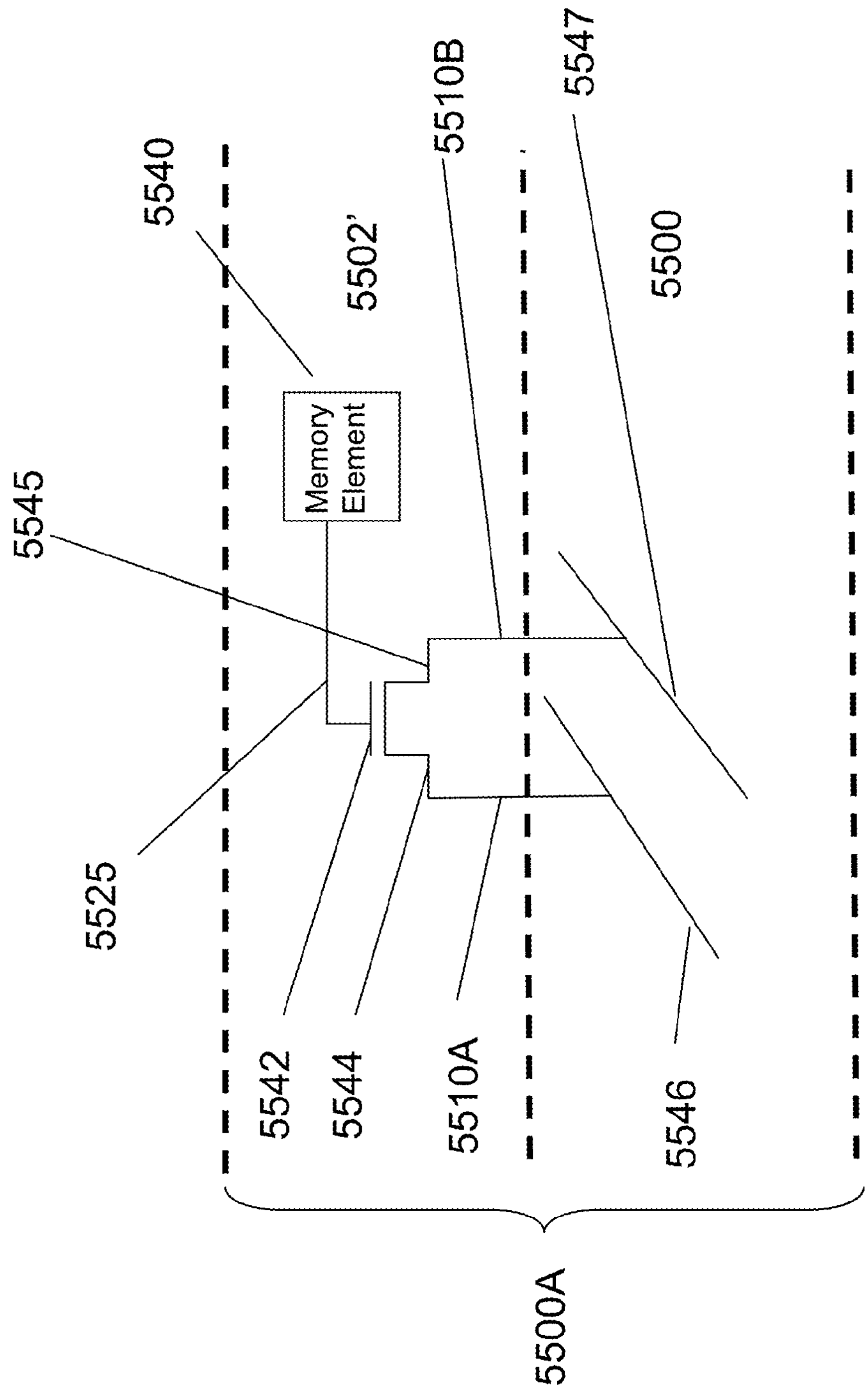

As illustrated in FIG. 55D, a simple schematic of important elements of acceptor substrate with pass transistors & memory elements 5500A is shown. An exemplary memory element 5540 residing in pass transistor & memory layer 5502' may be electrically coupled to exemplary pass transistor gate 5542, also residing in pass transistor & memory layer 5502', with pass transistor & memory layer interconnect metallization 5525. The pass transistor source 5544, residing in pass transistor & memory layer 5502', may be electrically coupled to FPGA configuration network metal line 5546, residing in acceptor substrate 5500, with TLV 5510A. The pass transistor drain 5545, residing in pass transistor & memory layer 5502', may be electrically coupled to FPGA configuration network metal line 5547, residing in acceptor substrate 5500, with TLV 5510B. The memory element 5540 may be programmed with signals from off chip, or above, within, or below the pass transistor & memory layer 5502'. The memory element 5540 may also include an inverter configuration, wherein one memory cell, such as, for example, a FG Flash cell, may couple the gate of the pass transistor to power supply Vcc if turned on, and another FG Flash device may couple the gate of the pass transistor to ground if turned on. Thus, FPGA configuration network metal line 5546, which may be carrying the output signal from a logic element in acceptor substrate 5500, may be electrically coupled to FPGA configuration network metal line 5547, which may route to the input of a logic element elsewhere in acceptor substrate 5530.

Persons of ordinary skill in the art will appreciate that the illustrations in FIGS. 55A through 55D are exemplary only and are not drawn to scale. Such skilled persons will further appreciate that many variations are possible such as, for example, the pass transistor & memory layer 5502' may include control and logic circuitry in addition to the pass transistors or switches and memory elements. Additionally, that the pass transistor element may instead be a transmission gate, or may be an active drive type switch. Many other modifications within the scope of the invention will suggest themselves to such skilled persons after reading this specification. Thus the invention is to be limited only by the appended claims.

Figure 56:
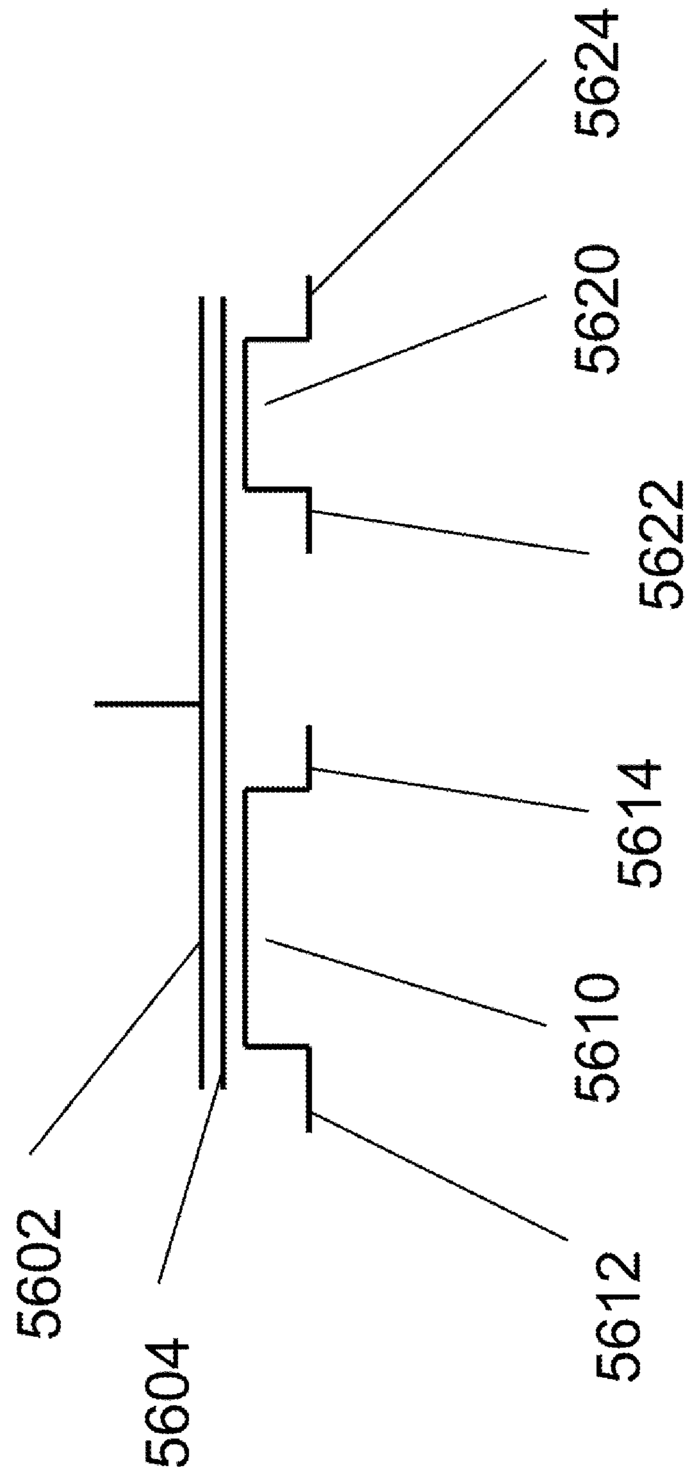
FIG. 56 is an exemplary drawing illustration of an NVM FPGA configuration cell.

As illustrated in FIG. 56, a non-volatile configuration switch with integrated floating gate (FG) Flash memory is shown. The control gate 5602 and floating gate 5604 are common to both the sense transistor channel 5620 and the switch transistor channel 5610. Switch transistor source 5612 and switch transistor drain 5614 may be coupled to the FPGA configuration network metal lines. The sense transistor source 5622 and the sense transistor drain 5624 may be coupled to the program, erase, and read circuits. This integrated NVM switch has been utilized by FPGA maker Actel Corporation and is manufactured in a high temperature (greater than approximately 400° C.) 2D embedded FG flash process technology.

As illustrated in FIGS. 57A to 57G, a 1T NVM FPGA cell may be constructed with a single layer transfer of wafer sized doped layers and post layer transfer processing with a process flow that is suitable for 3D IC manufacturing. This cell may be programmed with signals from off chip, or above, within, or below the cell layer.

Figures 57A, 57B:
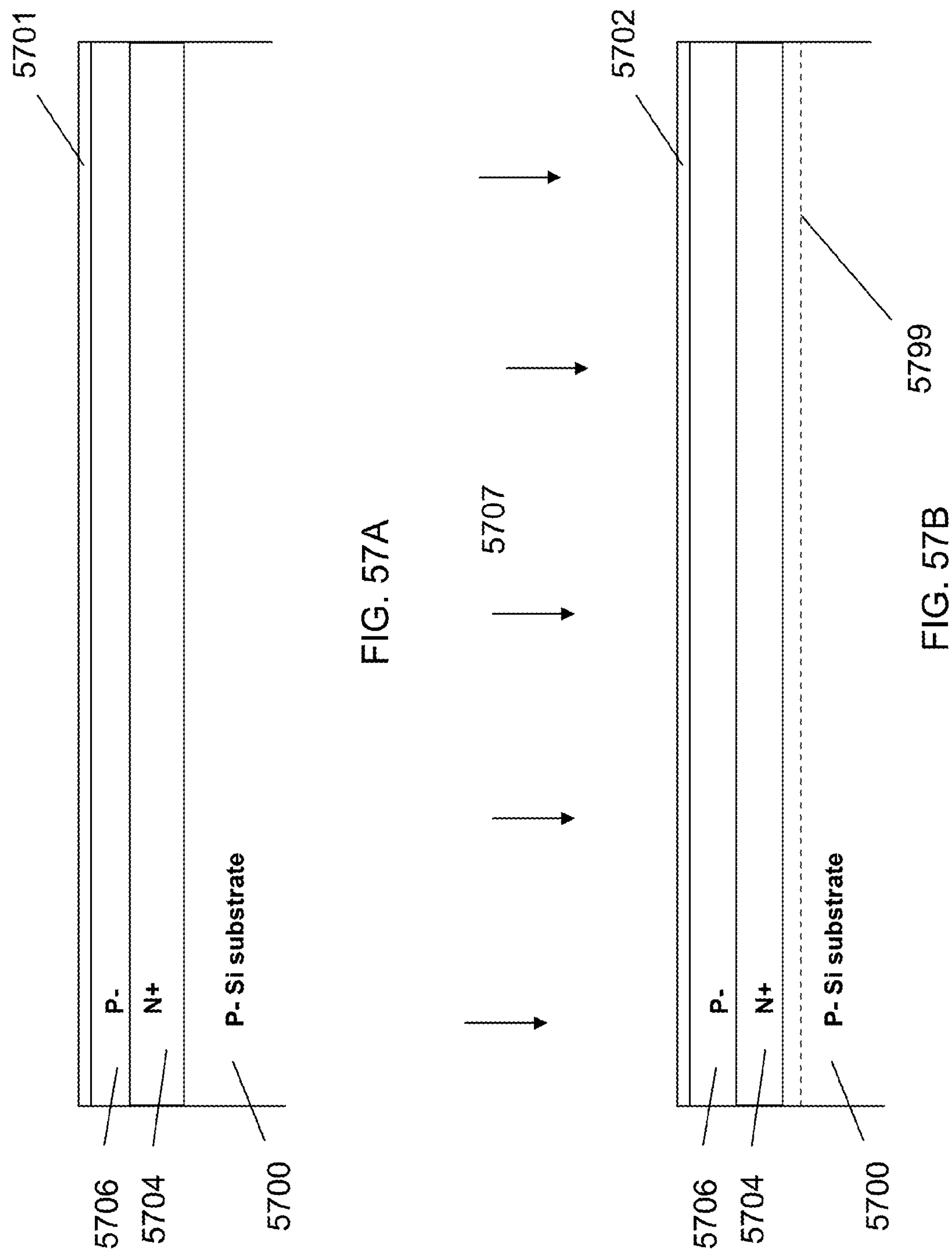
FIGS. 57A-G are exemplary drawing illustrations of a 3D IC NVM FPGA configuration cell process flow.

As illustrated in FIG. 57A, a P− substrate donor wafer 5700 may be processed to include two wafer sized layers of N+ doping 5704 and P− doping 5706. The P− doped layer 5706 may have the same or a different dopant concentration than the P− substrate 5700. The doped layers may be formed by ion implantation and thermal anneal. The layer stack may alternatively be formed by successive epitaxially deposited doped silicon layers or by a combination of epitaxy and implantation and anneals. P− doped layer 5706 and N+ doped layer 5704 may also have graded doping to mitigate transistor performance issues, such as, for example, short channel effects, and enhance programming and erase efficiency. A screen oxide 5701 may be grown or deposited before an implant to protect the silicon from implant contamination and to provide an oxide surface for later wafer to wafer bonding. These processes may be done at temperatures above 400° C. as the layer transfer to the processed substrate with metal interconnects has yet to be done.

As illustrated in FIG. 57B, the top surface of donor wafer 5700 may be prepared for oxide wafer bonding with a deposition of an oxide 5702 or by thermal oxidation of the P− doped layer 5706 to form oxide layer 5702, or a re-oxidation of implant screen oxide 5701. A layer transfer demarcation plane 5799 (shown as a dashed line) may be formed in donor wafer 5700 (shown) or N+ doped layer 5704 by hydrogen implantation 5707 or other methods as previously described. Both the donor wafer 5700 and acceptor wafer 5710 may be prepared for wafer bonding as previously described and then low temperature (less than approximately 400° C.) bonded. The portion of the P− donor wafer substrate 5700 that is above the layer transfer demarcation plane 5799 may be removed by cleaving and polishing, or other low temperature processes as previously described. This process of an ion implanted atomic species, such as, for example, Hydrogen, forming a layer transfer demarcation plane, and subsequent cleaving or thinning, may be called 'ion-cut'.

Figure 57C:
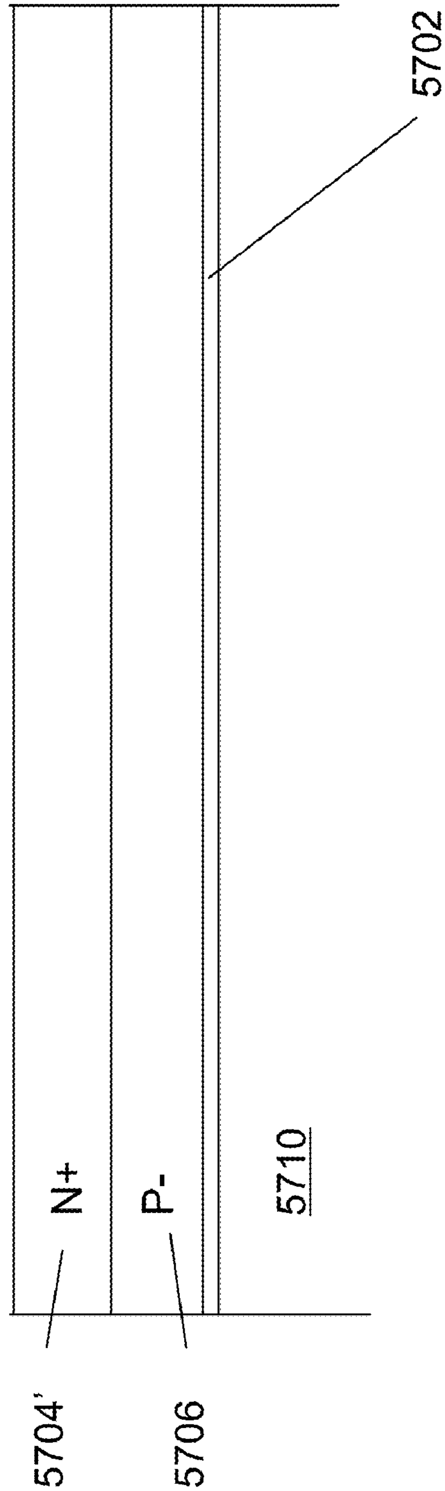

As illustrated in FIG. 57C, the remaining N+ doped layer 5704' and P− doped layer 5706, and oxide layer 5702 have been layer transferred to acceptor wafer 5710. The top surface of N+ doped layer 5704' may be chemically or mechanically polished smooth and flat. Now FG and other transistors may be formed with low temperature (less than approximately 400° C.) processing and aligned to the acceptor wafer 5710 alignment marks (not shown). For illustration clarity, the oxide layers, such as, for example, 5702, used to facilitate the wafer to wafer bond are not shown in subsequent drawings.

Figure 57D:
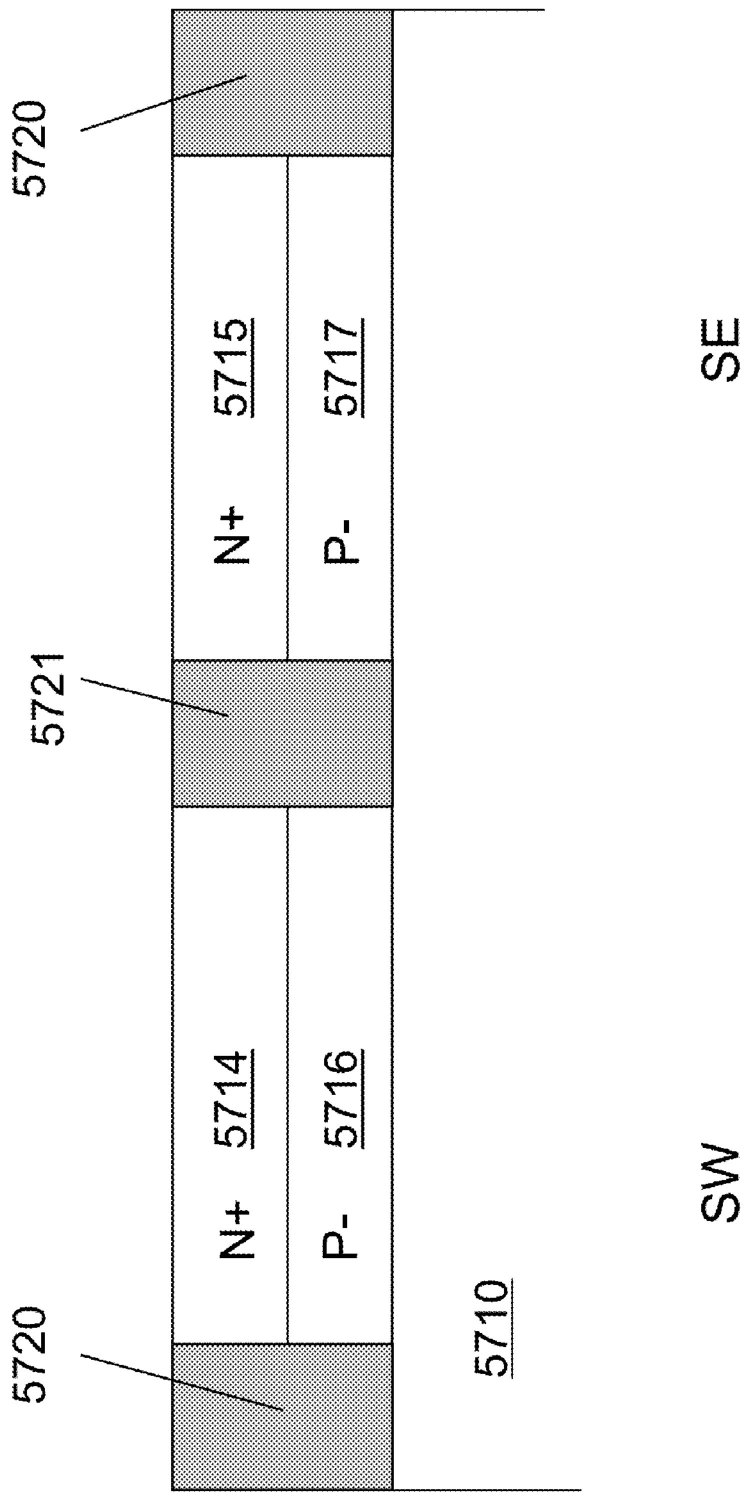

As illustrated in FIG. 57D, the transistor isolation regions may be lithographically defined and then formed by plasma/RIE etch removal of portions of N+ doped layer 5704' and P− doped layer 5706 to at least the top oxide of acceptor substrate 5710. Then a low-temperature gap fill oxide may be deposited and chemically mechanically polished, remaining in transistor isolation regions 5720 and SW-to-SE isolation region 5721. "SW" in the FIG. 57 illustrations denotes that portion of the illustration where the switch transistor will be formed, and 'SE' denotes that portion of the illustration where the sense transistor will be formed. Thus formed are future SW transistor regions N+ doped 5714 and P− doped 5716, and future SE transistor regions N+ doped 5715, and P− doped 5717.

Figure 57E:
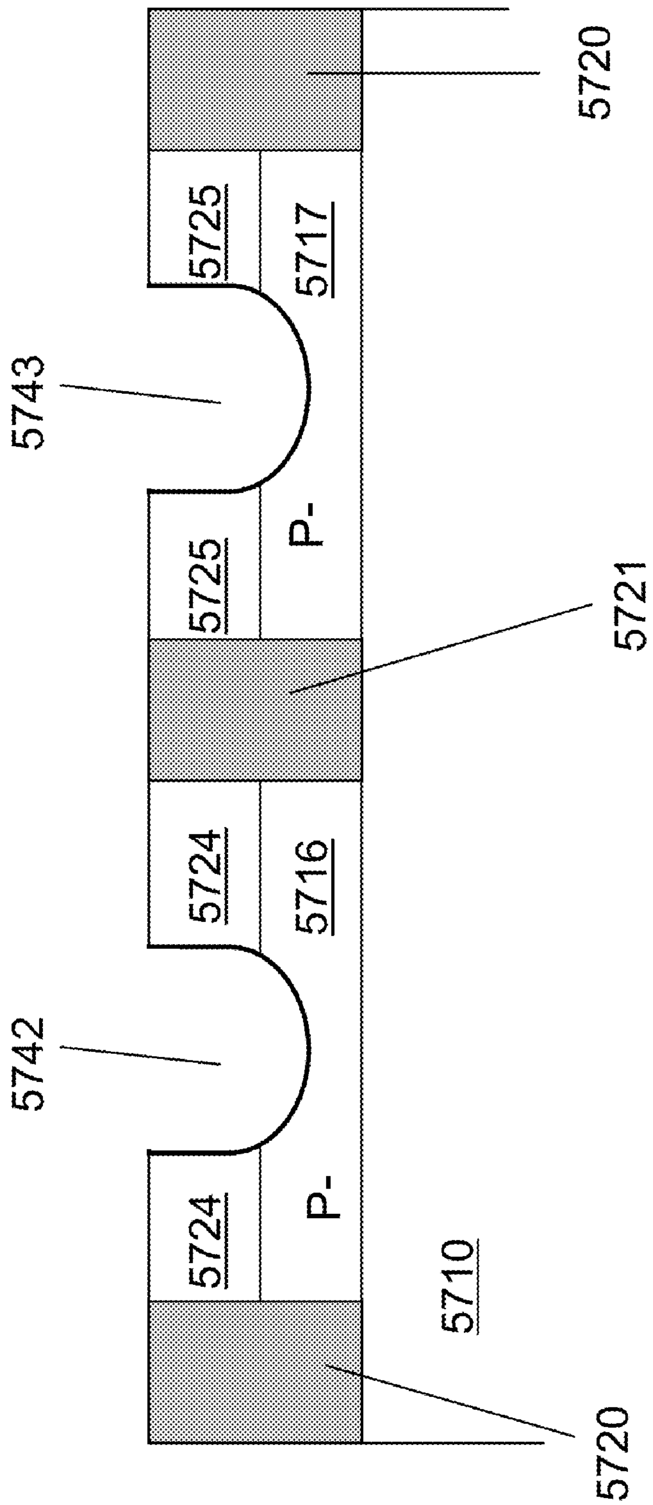

As illustrated in FIG. 57E, the SW recessed channel 5742 and SE recessed channel 5743 may be lithographically defined and etched, removing portions of future SW transistor regions N+ doped 5714 and P− doped 5716, and future SE transistor regions N+ doped 5715, and P− doped 5717. The recessed channel surfaces and edges may be smoothed by wet chemical or plasma/RIE etching techniques to mitigate high field effects. The SW recessed channel 5742 and SE recessed channel 5743 may be mask defined and etched separately or at the same step. The SW channel width may be larger than the SE channel width. These process steps form SW source and drain regions 5724, SE source and drain regions 5725, SW transistor channel region 5716 and SE transistor channel region 5717.

Figure 57F:
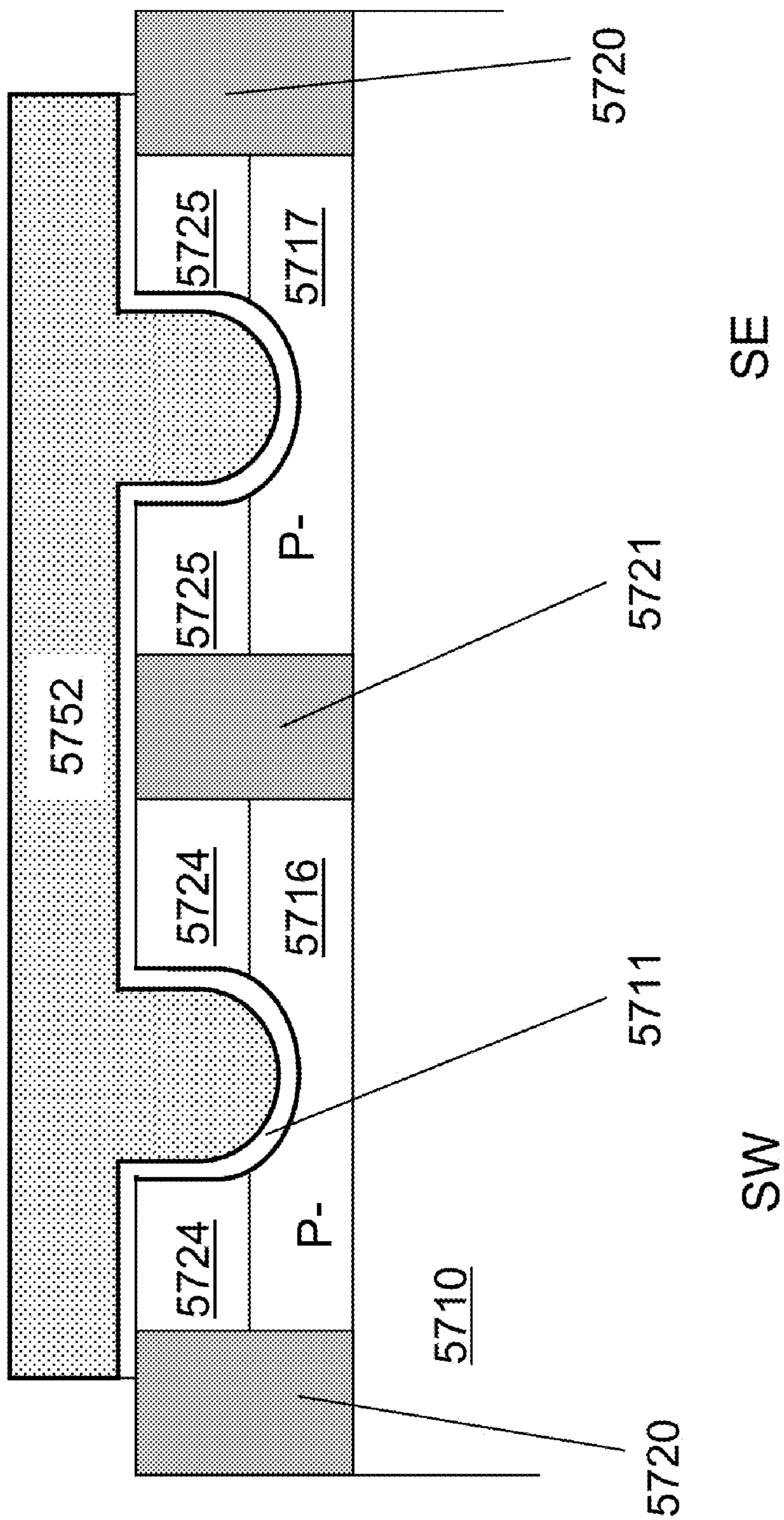

As illustrated in FIG. 57F, a tunneling dielectric 5711 may be formed and a floating gate material may be deposited. The tunneling dielectric 5711 may be an atomic layer deposited (ALD) dielectric. Or the tunneling dielectric 5711 may be formed with a low temperature oxide deposition or low temperature microwave plasma oxidation of the silicon surfaces. Then a floating gate material, such as, for example, doped poly-crystalline or amorphous silicon, may be deposited. Then the floating gate material may be chemically mechanically polished, and the floating gate 5752 may be partially or fully formed by lithographic definition and plasma/RIE etching.

Figure 57G:
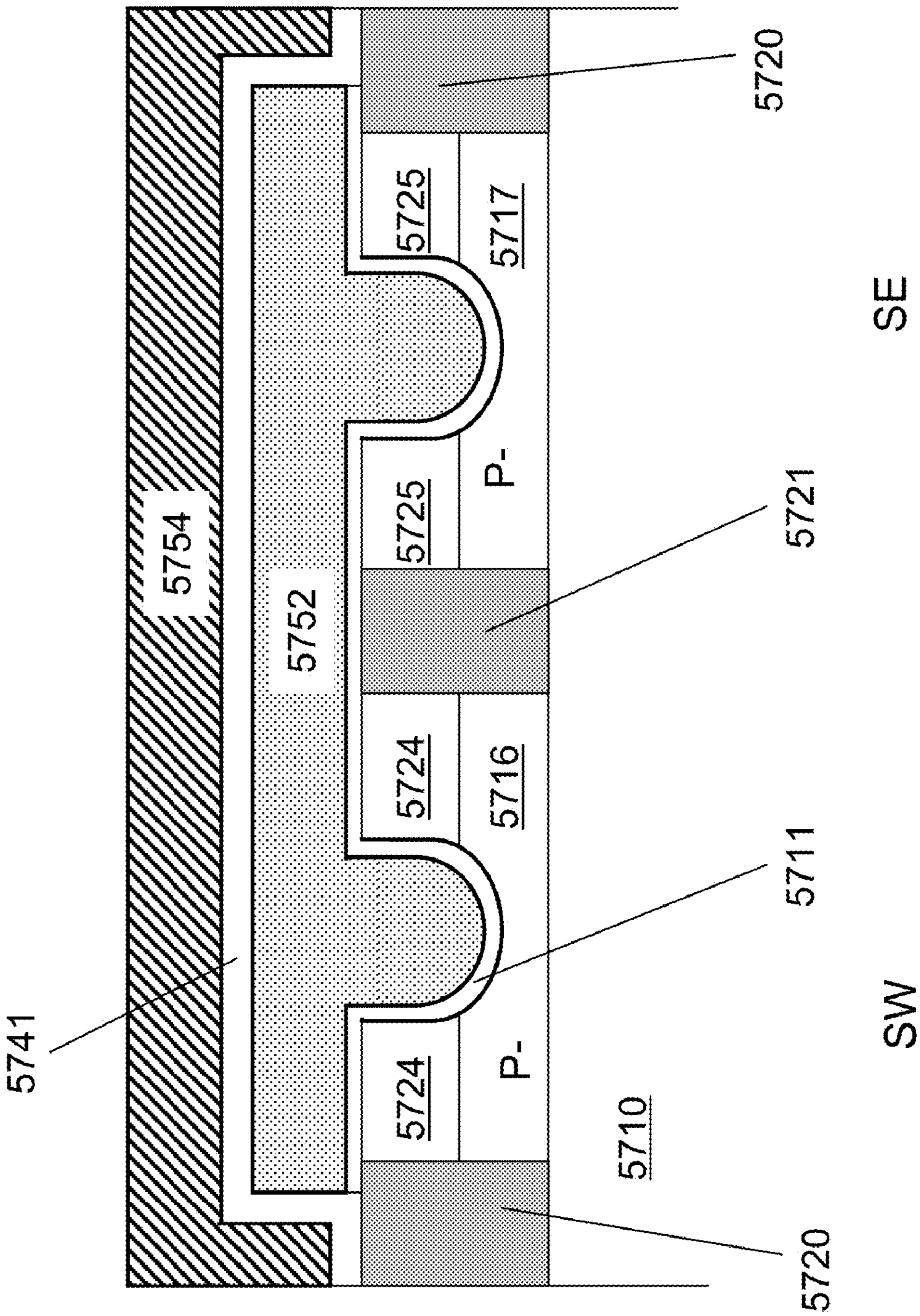

As illustrated in FIG. 57G, an inter-poly dielectric 5741 may be formed by low temperature oxidation and depositions of a dielectric or layers of dielectrics, such as, for example, oxide-nitride-oxide (ONO) layers, and then a control gate material, such as, for example, doped poly-crystalline or amorphous silicon, may be deposited. The control gate material may be chemically mechanically polished, and the control gate 5754 may be formed by lithographic definition and plasma/RIE etching. The etching of control gate 5754 may also include etching portions of the inter-poly dielectric and portions of the floating gate 5752 in a self-aligned stack etch process. Logic transistors for control functions may be formed (not shown) utilizing 3D IC compatible methods described in the document, such as, for example, RCAT, V-groove, and contacts, including thru layer vias, and interconnect metallization may be constructed. This flow enables the formation of a mono-crystalline silicon 1T NVM FPGA configuration cell constructed in a single layer transfer of prefabricated wafer sized doped layers, which may be formed and connected to the underlying multi-metal layer semiconductor device without exposing the underlying devices to a high temperature.

Persons of ordinary skill in the art will appreciate that the illustrations in FIGS. 57A through 57G are exemplary only and are not drawn to scale. Such skilled persons will further appreciate that many variations are possible such as, for example, the floating gate may include nano-crystals of silicon or other materials. Additionally, that a common well cell may be constructed by removing the SW-to-SE isolation 5721. Moreover, that the slope of the recess of the channel transistor may be from zero to 180 degrees. Further, that logic transistors and devices may be constructed by using the control gate as the device gate. Additionally, that the logic device gate may be made separately from the control gate formation. Moreover, the 1T NVM FPGA configuration cell may be constructed with a charge trap technique NVM, a resistive memory technique, and may also have a junction-less SW or SE transistor construction. Many other modifications within the scope of the invention will suggest themselves to such skilled persons after reading this specification. Thus the invention is to be limited only by the appended claims.

The potential dicing streets, or scribe-lines, of 3D ICs may represent some loss of silicon area. The narrower the street the lower the loss is, and therefore, it may be advantageous to use advanced dicing techniques that can create and work with narrow streets.

One such advanced dicing technique may be the use of lasers for dicing the 3D IC wafers. Laser dicing techniques, including the use of water jets to cool the substrate and remove debris, may be employed to minimize damage to the 3D IC structures. Laser dicing techniques may also be utilized to cut sensitive layers in the 3D IC, and then a conventional saw finish may be used.

Some embodiments of the present invention may include alternative techniques to build IC (Integrated Circuit) devices including techniques and methods to construct 3D IC systems. Some embodiments of the present invention may enable device solutions with far less power consumption than prior art. These device solutions could be very useful for the growing application of mobile electronic devices such as mobile phones, smart phone, cameras and the like. For example, incorporating the 3D IC semiconductor devices according to some embodiments of the present invention within these mobile electronic devices could provide superior mobile units that could operate much more efficiently and for a much longer time than with prior art technology.

3D ICs according to some embodiments of the current invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the present invention could far exceed what was practical with the prior art technology. These advantages could lead to more powerful computer systems and improved systems that have embedded computers.

Some embodiments of the current invention may also enable the design of state of the art electronic systems at a greatly reduced non-recurring engineering (NRE) cost by the use of high density 3D FPGAs or various forms of 3D array based ICs with reduced custom masks. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system, including using multiple devices wherein more than one device incorporates elements of the invention. An end system could benefits from memory device utilizing the invention 3D memory together with high performance 3D FPGA together with high density 3D logic and so forth. Using devices that use one or multiple elements of the invention would allow for better performance and or lower power and other advantages resulting from the inventions to provide the end system with a competitive edge. Such end system could be electronic based products or other type of systems that include some level of embedded electronics, such as, for example, cars, remote controlled vehicles, etc.

It will also be appreciated by persons of ordinary skill in the art that the present invention is not limited to what has been particularly shown and described hereinabove. Rather, the scope of the present invention includes both combinations and sub-combinations of the various features described hereinabove as well as modifications and variations which would occur to such skilled persons upon reading the foregoing description. Thus the invention is to be limited only by the appended claims.

What is claimed is:

1. An Integrated Circuit device, comprising:

a first layer of single crystal including a plurality of first transistors;

at least one metal layer providing interconnection between said first transistors, a second layer of less than 2 micron thin single crystal having a plurality of second transistors, and a plurality of through-layer-vias (TLV) conducting power to said plurality of second transistors;

wherein said plurality of through-layer-vias comprise a thermal conducting path to a heat sink.

2. A device according to claim 1 wherein said device is part of a mobile system.

3. A device according to claim 1, wherein at least one of said second transistors is a horizontally oriented transistor and wherein said metal layer comprises aluminum or copper.

4. A device according to claim 1, wherein at least one of said second transistors comprises a high-K-Metal gate (HKMG) formed using a gate last process.

5. A device according to claim 1, wherein said second layer is constructed by an ion-cut layer transfer process.

6. A device according to claim 1 wherein said thermal conducting path comprises an electrically non-conducting path.

7. A device according to claim 1, wherein said thermal conducting path comprises a heat spreader layer.

8. A device according to claim 1, wherein said thermal conducting path has a thermal conductivity of at least 400 W/m-K.

9. An Integrated Circuit device, comprising:

a first layer of single crystal including a plurality of first transistors;

a plurality of metal layers providing interconnection between said first transistors, wherein said metal layers comprises copper or aluminum;

a second layer of less than 2 micron thin single crystal including a plurality of second transistors overlaying said metal layers, and a thermal conducting path from said second layer to a heat sink wherein said thermal conducting path has a thermal conductivity of at least 400 W/m-K.

10. An Integrated Circuit device according to claim 9, wherein said second transistors comprises a horizontally oriented transistor.

11. A device according to claim 9 wherein said device is part of a mobile system.

12. A device according to claim 9, wherein at least one of said second transistors is defined by etching.

13. A device according to claim 9, wherein at least one of said second transistors is a high-K-Metal gate (HKMG) transistor.

14. A device according to claim 13, wherein at least one of said second transistors is formed by a gate replacement process.

15. A device according to claim 9, wherein said second layer is constructed by an ion-cut layer transfer process.

16. A device according to claim 9 wherein said thermal conducting path comprises an electrically non-conducting path.

17. A device according to claim 9 wherein said thermal conducting path comprises a power conduction path to at least one of said second transistors.

18. A device according to claim 9, wherein said thermal conducting path comprises a heat spreader layer.

19. An Integrated Circuit device, comprising:

a first layer of single crystal comprising a plurality of first transistors;

a plurality of metal layers providing interconnection between said first transistors, wherein said metal layers comprise copper or aluminum;

a second layer of single crystal comprising a plurality of second transistors, wherein said second layer is less than 2 microns thick;

a layer of heat spreader in between said first layer and said second layer of single crystal; and a thermal conducting path from said second layer to a heat sink.

20. A device according to claim 19, wherein at least one of said second transistors has a side gate.

21. A device according to claim 19 wherein said device is part of a mobile system.

22. A device according to claim 19, wherein said second layer is constructed by an ion-cut layer transfer process.

23. A device according to claim 19, wherein said thermal conducting path has a thermal conductivity of at least 400 W/m-K.

24. A device according to claim 19 wherein said thermal conducting path comprises an electrically non-conducting path.

25. A device according to claim 19 further comprising a thermal conducting path from said second layer to said heat spreader.

26. A device according to claim 25, wherein said thermal conducting path has a thermal conductivity of at least 400 W/m-K.

27. A device according to claim 25, wherein said thermal conducting path comprises a power conduction path to at least one of said second transistors.

28. A device according to claim 25 wherein said thermal conducting path comprises an electrically non-conducting path.

* * * * *